United States Patent
Johnson et al.

(10) Patent No.: US 7,379,515 B2
(45) Date of Patent: May 27, 2008

(54) PHASED ARRAY ANTENNA APPLICATIONS OF UNIVERSAL FREQUENCY TRANSLATION

(75) Inventors: Martin R Johnson, Salt Lake City, UT (US); Jonathan S Jensen, Salt Lake City, UT (US); Robert T Short, Salt Lake City, UT (US); Jamison L Young, Woods Cross, UT (US); David F Sorrells, Middleburg, FL (US); Michael J Bultman, Jacksonville, FL (US); Robert W Cook, Switzerland, FL (US); Richard C Looke, Jacksonville, FL (US); Charley D Moses, Jr., Jacksonville, FL (US)

(73) Assignee: ParkerVision, Inc., Jacksonville, FL (US)

( * ) Notice: Subject to any disclaimer, the term of this patent is extended or adjusted under 35 U.S.C. 154(b) by 873 days.

(21) Appl. No.: 09/796,824

(22) Filed: Mar. 2, 2001

(65) Prior Publication Data
US 2001/0038318 A1 Nov. 8, 2001

Related U.S. Application Data

(63) Continuation of application No. 09/590,955, filed on Jun. 9, 2000.
(60) Provisional application No. 60/209,042, filed on Jun. 2, 2000, provisional application No. 60/177,380, filed on Jan. 24, 2000, provisional application No. 60/171,584, filed on Dec. 23, 1999, provisional application No. 60/170,767, filed on Dec. 15, 1999, provisional application No. 60/167,704, filed on Nov. 24, 1999.

(51) Int. Cl.
*H04B 7/10* (2006.01)
*H04L 1/02* (2006.01)
(52) U.S. Cl. ..................................... 375/347
(58) Field of Classification Search ......... 375/316–352
See application file for complete search history.

(56) References Cited

U.S. PATENT DOCUMENTS 2,057,613 A 10/1936 Gardner (Continued)

FOREIGN PATENT DOCUMENTS

DE 1936252 1/1971

(Continued)

OTHER PUBLICATIONS

English Translation of German Patent Publication No. DE 196 48 915 A1, 10 pages.

(Continued)

*Primary Examiner*—Stephen Chin
*Assistant Examiner*—Curtis Odom
(74) *Attorney, Agent, or Firm*—Sterne, Kessler, Goldstein & Fox PLLC

(57) ABSTRACT

A universal frequency translation module (UFT) frequency translates an electromagnetic (EM) input signal by sampling the EM input signal according to a periodic control signal (also called an aliasing signal). By controlling the relative sampling time, the UFT module implements a relative phase shift during frequency translation. In other words, a relative phase shift can be introduced in the output signal by sampling the input signal at one point in time relative to another point in time. As such, the UFT module can be configured as an integrated frequency translator and phase-shifter. This includes the UFT module as an integrated down-converter and phase shifter, and the UFT module as an integrated up-converter and phase shifter. Applications of universal frequency translation and phase shifting include phased array antennas that utilize integrated frequency translation and phase shifting technology to steer the one or more main beams of the phased array antenna.

33 Claims, 168 Drawing Sheets

U.S. PATENT DOCUMENTS

| | | |
|---|---|---|
| 2,241,078 A | 5/1941 | Vreeland |
| 2,270,385 A | 1/1942 | Skillman |
| 2,283,575 A | 5/1942 | Roberts |
| 2,358,152 A | 9/1944 | Earp |
| 2,410,350 A | 10/1946 | Labin et al. |
| 2,451,430 A | 10/1948 | Barone |
| 2,462,069 A | 2/1949 | Chatterjea et al. |
| 2,462,181 A | 2/1949 | Grosselfinger |
| 2,472,798 A | 6/1949 | Fredendall |
| 2,497,859 A | 2/1950 | Boughtwood et al. |
| 2,499,279 A | 2/1950 | Peterson |
| 2,530,824 A | 11/1950 | King |
| 2,802,208 A | 8/1957 | Hobbs |
| 2,985,875 A | 5/1961 | Grisdale et al. |
| 3,023,309 A | 2/1962 | Foulkes |
| 3,069,679 A | 12/1962 | Sweeney et al. |
| 3,104,393 A | 9/1963 | Vogelman |
| 3,114,106 A | 12/1963 | McManus |
| 3,118,117 A | 1/1964 | King et al. |
| 3,226,643 A | 12/1965 | McNair |
| 3,246,084 A | 4/1966 | Kryter |
| 3,258,694 A | 6/1966 | Shepherd |
| 3,383,598 A | 5/1968 | Sanders |
| 3,384,822 A | 5/1968 | Miyagi |
| 3,454,718 A | 7/1969 | Perreault |
| 3,523,291 A | 8/1970 | Pierret |
| 3,548,342 A | 12/1970 | Maxey |
| 3,555,428 A | 1/1971 | Perrault |
| 3,614,627 A | 10/1971 | Runyan et al. |
| 3,614,630 A | 10/1971 | Rorden |
| 3,617,892 A | 11/1971 | Hawley et al. |
| 3,617,898 A | 11/1971 | Janning, Jr. |
| 3,621,402 A | 11/1971 | Gardner |
| 3,622,885 A | 11/1971 | Oberdorf et al. |
| 3,623,160 A | 11/1971 | Giles et al. |
| 3,626,417 A | 12/1971 | Gilbert |
| 3,629,696 A | 12/1971 | Bartelink |
| 3,641,442 A | 2/1972 | Boucher |
| 3,662,268 A | 5/1972 | Gans et al. |
| 3,689,841 A | 9/1972 | Bello et al. |
| 3,694,754 A | 9/1972 | Baltzer |
| 3,702,440 A | 11/1972 | Moore |
| 3,714,577 A | 1/1973 | Hayes |
| 3,716,730 A | 2/1973 | Cerny, Jr. |
| 3,717,844 A | 2/1973 | Barret et al. |
| 3,719,903 A | 3/1973 | Goodson |
| 3,735,048 A | 5/1973 | Tomsa et al. |
| 3,736,513 A | 5/1973 | Wilson |
| 3,737,778 A | 6/1973 | Van Gerwen et al. |
| 3,739,282 A | 6/1973 | Bruch et al. |
| 3,764,921 A | 10/1973 | Huard |
| 3,767,984 A | 10/1973 | Shinoda et a. |
| 3,806,811 A | 4/1974 | Thompson |
| 3,852,530 A | 12/1974 | Shen |
| 3,868,601 A | 2/1975 | MacAfee |
| 3,940,697 A | 2/1976 | Morgan |
| 3,949,300 A | 4/1976 | Sadler |
| 3,967,202 A | 6/1976 | Batz |
| 3,980,945 A | 9/1976 | Bickford |
| 3,987,280 A | 10/1976 | Bauer |
| 3,991,277 A | 11/1976 | Hirata |
| 4,003,002 A | 1/1977 | Snijders et al. |
| 4,013,966 A | 3/1977 | Campbell |
| 4,016,366 A | 4/1977 | Kurata |
| 4,017,798 A | 4/1977 | Gordy et al. |
| 4,019,140 A | 4/1977 | Swerdlow |
| 4,032,847 A | 6/1977 | Unkauf |
| 4,035,732 A | 7/1977 | Lohrmann |
| 4,045,740 A | 8/1977 | Baker |
| 4,047,121 A | 9/1977 | Campbell |
| 4,051,475 A | 9/1977 | Campbell |
| 4,066,841 A | 1/1978 | Young |
| 4,066,919 A | 1/1978 | Huntington |
| 4,080,573 A | 3/1978 | Howell |
| 4,081,748 A | 3/1978 | Batz |
| 4,115,737 A | 9/1978 | Hongu et al. |
| 4,130,765 A | 12/1978 | Arakelian et al. |
| 4,130,806 A | 12/1978 | Van Gerwen et al. |
| 4,132,952 A | 1/1979 | Hongu et al. |
| 4,142,155 A | 2/1979 | Adachi |
| 4,143,322 A | 3/1979 | Shimamura |
| 4,158,149 A | 6/1979 | Otofuji |
| 4,170,764 A | 10/1979 | Salz et al. |
| 4,204,171 A | 5/1980 | Sutphin, Jr. |
| 4,210,872 A | 7/1980 | Gregorian |
| 4,220,977 A | 9/1980 | Yamanaka |
| 4,241,451 A * | 12/1980 | Maixner et al. ............ 455/202 |
| 4,245,355 A | 1/1981 | Pascoe et al. |
| 4,250,458 A | 2/1981 | Richmond et al. |
| 4,253,066 A | 2/1981 | Fisher et al. |
| 4,253,067 A | 2/1981 | Caples et al. |
| 4,253,069 A | 2/1981 | Nossek |
| 4,286,283 A | 8/1981 | Clemens |
| 4,308,614 A | 12/1981 | Fisher et al. |
| 4,320,361 A | 3/1982 | Kikkert |
| 4,320,536 A | 3/1982 | Dietrich |
| 4,334,324 A | 6/1982 | Hoover |
| 4,346,477 A | 8/1982 | Gordy |
| 4,355,401 A | 10/1982 | Ikoma et al. |
| 4,356,558 A | 10/1982 | Owen et al. |
| 4,360,867 A | 11/1982 | Gonda |
| 4,363,132 A | 12/1982 | Collin |
| 4,365,217 A | 12/1982 | Berger et al. |
| 4,369,522 A | 1/1983 | Cerny, Jr. et al. |
| 4,370,572 A | 1/1983 | Cosand et al. |
| 4,380,828 A | 4/1983 | Moon |
| 4,384,357 A | 5/1983 | deBuda et al. |
| 4,389,579 A | 6/1983 | Stein |
| 4,392,255 A | 7/1983 | Del Giudice |
| 4,393,395 A | 7/1983 | Hacke et al. |
| 4,430,629 A | 2/1984 | Betzl et al. |
| 4,439,787 A | 3/1984 | Mogi et al. |
| 4,441,080 A | 4/1984 | Saari |
| 4,446,438 A | 5/1984 | Chang et al. |
| 4,456,990 A | 6/1984 | Fisher et al. |
| 4,470,145 A | 9/1984 | Williams |
| 4,472,785 A | 9/1984 | Kasuga |
| 4,479,226 A | 10/1984 | Prabhu et al. |
| 4,481,490 A | 11/1984 | Huntley |
| 4,481,642 A | 11/1984 | Hanson |
| 4,483,017 A | 11/1984 | Hampel et al. |
| 4,484,143 A | 11/1984 | French et al. |
| 4,485,347 A | 11/1984 | Hirasawa et al. |
| 4,485,488 A | 11/1984 | Houdart |
| 4,488,119 A | 12/1984 | Marshall |
| 4,504,803 A | 3/1985 | Lee et al. |
| 4,510,467 A | 4/1985 | Chang et al. |
| 4,517,519 A | 5/1985 | Mukaiyama |
| 4,517,520 A | 5/1985 | Ogawa |
| 4,518,935 A | 5/1985 | van Roermund |
| 4,521,892 A | 6/1985 | Vance et al. |
| 4,562,414 A | 12/1985 | Linder et al. |
| 4,563,773 A | 1/1986 | Dixon, Jr. et al. |
| 4,577,157 A | 3/1986 | Reed |
| 4,583,239 A | 4/1986 | Vance |
| 4,591,736 A | 5/1986 | Hirao et al. |
| 4,591,930 A | 5/1986 | Baumeister |
| 4,602,220 A | 7/1986 | Kurihara |
| 4,603,300 A | 7/1986 | Welles, II et al. |
| 4,612,464 A | 9/1986 | Ishikawa et al. |
| 4,612,518 A | 9/1986 | Gans et al. |
| 4,616,191 A | 10/1986 | Galani et al. |
| 4,621,217 A | 11/1986 | Saxe et al. |
| 4,628,517 A | 12/1986 | Schwarz et al. |

| | | |
|---|---|---|
| 4,633,510 A | 12/1986 | Suzuki et al. |
| 4,634,998 A | 1/1987 | Crawford |
| 4,648,021 A | 3/1987 | Alberkrack |
| 4,651,034 A | 3/1987 | Sato |
| 4,653,117 A | 3/1987 | Heck |
| 4,660,164 A | 4/1987 | Leibowitz |
| 4,675,882 A | 6/1987 | Lillie et al. |
| 4,688,253 A | 8/1987 | Gumm |
| 4,716,376 A | 12/1987 | Daudelin |
| 4,716,388 A | 12/1987 | Jacobs |
| 4,718,113 A | 1/1988 | Rother et al. |
| 4,726,041 A | 2/1988 | Prohaska et al. |
| 4,733,403 A | 3/1988 | Simone |
| 4,734,591 A | 3/1988 | Ichitsubo |
| 4,737,969 A | 4/1988 | Steel et al. |
| 4,740,675 A | 4/1988 | Brosnan et al. |
| 4,740,792 A | 4/1988 | Sagey et al. |
| 4,743,858 A | 5/1988 | Everard |
| 4,745,463 A | 5/1988 | Lu |
| 4,751,468 A | 6/1988 | Agoston |
| 4,757,538 A | 7/1988 | Zink |
| 4,761,798 A | 8/1988 | Griswold, Jr. et al. |
| 4,768,187 A | 8/1988 | Marshall |
| 4,769,612 A | 9/1988 | Tamakoshi et al. |
| 4,772,853 A | 9/1988 | Hart |
| 4,785,463 A | 11/1988 | Janc et al. |
| 4,789,837 A | 12/1988 | Ridgers |
| 4,791,584 A | 12/1988 | Greivenkamp, Jr. |
| 4,801,823 A | 1/1989 | Yokoyama |
| 4,806,790 A | 2/1989 | Sone |
| 4,810,904 A | 3/1989 | Crawford |
| 4,810,976 A | 3/1989 | Cowley et al. |
| 4,811,362 A | 3/1989 | Yester, Jr. et al. |
| 4,811,422 A | 3/1989 | Kahn |
| 4,814,649 A | 3/1989 | Young |
| 4,816,704 A | 3/1989 | Fiori, Jr. |
| 4,819,252 A | 4/1989 | Christopher |
| 4,833,445 A | 5/1989 | Buchele |
| 4,841,265 A | 6/1989 | Watanabe et al. |
| 4,845,389 A | 7/1989 | Pyndiah et al. |
| 4,855,894 A | 8/1989 | Asahi et al. |
| 4,857,928 A | 8/1989 | Gailus et al. |
| 4,862,121 A | 8/1989 | Hochschild et al. |
| 4,866,441 A | 9/1989 | Conway et al. |
| 4,868,654 A | 9/1989 | Juri et al. |
| 4,870,659 A | 9/1989 | Oishi et al. |
| 4,871,987 A | 10/1989 | Kawase |
| 4,873,492 A | 10/1989 | Myer |
| 4,885,587 A | 12/1989 | Wiegand et al. |
| 4,885,671 A | 12/1989 | Peil |
| 4,885,756 A | 12/1989 | Fontanes et al. |
| 4,888,557 A | 12/1989 | Puckette, IV et al. |
| 4,890,302 A | 12/1989 | Muilwijk |
| 4,893,316 A | 1/1990 | Janc et al. |
| 4,893,341 A | 1/1990 | Gehring |
| 4,894,766 A | 1/1990 | De Agro |
| 4,896,152 A | 1/1990 | Tiemann |
| 4,902,979 A | 2/1990 | Puckette, IV |
| 4,908,579 A | 3/1990 | Tawfik et al. |
| 4,910,752 A | 3/1990 | Yester, Jr. et al. |
| 4,914,405 A | 4/1990 | Wells |
| 4,920,510 A | 4/1990 | Senderowicz et al. |
| 4,922,452 A | 5/1990 | Larsen et al. |
| 4,931,716 A | 6/1990 | Jovanovic et al. |
| 4,931,921 A | 6/1990 | Anderson |
| 4,943,974 A | 7/1990 | Motamedi |
| 4,944,025 A | 7/1990 | Gehring et al. |
| 4,955,079 A | 9/1990 | Connerney et al. |
| 4,965,467 A | 10/1990 | Bilterijst |
| 4,967,160 A | 10/1990 | Quievy et al. |
| 4,970,703 A | 11/1990 | Hariharan et al. |
| 4,972,436 A | 11/1990 | Halim et al. |
| 4,982,353 A | 1/1991 | Jacob et al. |
| 4,984,077 A | 1/1991 | Uchida |
| 4,995,055 A | 2/1991 | Weinberger et al. |
| 5,003,621 A | 3/1991 | Gailus |
| 5,005,169 A | 4/1991 | Bronder et al. |
| 5,006,810 A | 4/1991 | Popescu |
| 5,010,585 A | 4/1991 | Garcia |
| 5,012,245 A | 4/1991 | Scott et al. |
| 5,014,130 A | 5/1991 | Heister et al. |
| 5,014,304 A | 5/1991 | Nicollini et al. |
| 5,015,963 A | 5/1991 | Sutton |
| 5,016,242 A | 5/1991 | Tang |
| 5,017,924 A | 5/1991 | Guiberteau et al. |
| 5,020,149 A | 5/1991 | Hemmie |
| 5,020,154 A | 5/1991 | Zierhut |
| 5,052,050 A | 9/1991 | Collier et al. |
| 5,058,107 A | 10/1991 | Stone et al. |
| 5,062,122 A | 10/1991 | Pham et al. |
| 5,063,387 A | 11/1991 | Mower |
| 5,065,409 A | 11/1991 | Hughes et al. |
| 5,083,050 A | 1/1992 | Vasile |
| 5,091,921 A | 2/1992 | Minami |
| 5,095,533 A | 3/1992 | Loper et al. |
| 5,095,536 A | 3/1992 | Loper |
| 5,111,152 A | 5/1992 | Makino |
| 5,113,094 A | 5/1992 | Grace et al. |
| 5,113,129 A | 5/1992 | Hughes |
| 5,115,409 A | 5/1992 | Stepp |
| 5,122,765 A | 6/1992 | Pataut |
| 5,124,592 A | 6/1992 | Hagino |
| 5,126,682 A | 6/1992 | Weinberg et al. |
| 5,131,014 A | 7/1992 | White |
| 5,136,267 A | 8/1992 | Cabot |
| 5,140,699 A | 8/1992 | Kozak |
| 5,140,705 A | 8/1992 | Kosuga |
| 5,150,124 A | 9/1992 | Moore et al. |
| 5,151,661 A | 9/1992 | Caldwell et al. |
| 5,157,687 A | 10/1992 | Tymes |
| 5,159,710 A | 10/1992 | Cusdin |
| 5,164,985 A | 11/1992 | Nysen et al. |
| 5,170,414 A | 12/1992 | Silvian |
| 5,172,019 A | 12/1992 | Naylor et al. |
| 5,172,070 A | 12/1992 | Hiraiwa et al. |
| 5,179,731 A | 1/1993 | Tränkle et al. |
| 5,191,459 A | 3/1993 | Thompson et al. |
| 5,196,806 A | 3/1993 | Ichihara |
| 5,204,642 A | 4/1993 | Ashgar et al. |
| 5,212,827 A | 5/1993 | Meszko et al. |
| 5,214,787 A | 5/1993 | Karkota, Jr. |
| 5,218,562 A | 6/1993 | Basehore et al. |
| 5,220,583 A | 6/1993 | Solomon |
| 5,220,680 A | 6/1993 | Lee |
| 5,222,144 A | 6/1993 | Whikehart |
| 5,230,097 A | 7/1993 | Currie et al. |
| 5,239,496 A | 8/1993 | Vancraeynest |
| 5,239,686 A | 8/1993 | Downey |
| 5,239,687 A | 8/1993 | Chen |
| 5,241,561 A | 8/1993 | Barnard |
| 5,249,203 A | 9/1993 | Loper |
| 5,251,218 A | 10/1993 | Stone et al. |
| 5,251,232 A | 10/1993 | Nonami |
| 5,260,970 A | 11/1993 | Henry et al. |
| 5,260,973 A | 11/1993 | Watanabe |
| 5,263,194 A | 11/1993 | Ragan |
| 5,263,196 A | 11/1993 | Jasper |
| 5,263,198 A | 11/1993 | Geddes et al. |
| 5,267,023 A | 11/1993 | Kawasaki |
| 5,278,826 A | 1/1994 | Murphy et al. |
| 5,282,023 A | 1/1994 | Scarpa |
| 5,282,222 A | 1/1994 | Fattouche et al. |
| 5,287,516 A | 2/1994 | Schaub |
| 5,293,398 A | 3/1994 | Hamao et al. |
| 5,303,417 A | 4/1994 | Laws |
| 5,307,517 A | 4/1994 | Rich |

| | | | | | |
|---|---|---|---|---|---|
| 5,315,583 A | 5/1994 | Murphy et al. | 5,513,389 A | 4/1996 | Reeser et al. |
| 5,317,799 A | 6/1994 | Morita | 5,515,014 A | 5/1996 | Troutman |
| 5,321,852 A | 6/1994 | Seong | 5,517,688 A | 5/1996 | Fajen et al. |
| 5,325,204 A | 6/1994 | Scarpa | 5,519,890 A | 5/1996 | Pinckley |
| 5,337,014 A | 8/1994 | Najle et al. | 5,523,719 A | 6/1996 | Longo et al. |
| 5,339,054 A | 8/1994 | Taguchi | 5,523,726 A | 6/1996 | Kroeger et al. |
| 5,339,459 A | 8/1994 | Schiltz et al. | 5,523,760 A | 6/1996 | McEwan |
| 5,345,239 A | 9/1994 | Madni et al. | 5,535,402 A | 7/1996 | Leibowitz et al. |
| 5,353,306 A | 10/1994 | Yamamoto | 5,539,770 A | 7/1996 | Ishigaki |
| 5,355,114 A | 10/1994 | Sutterlin et al. | 5,551,076 A | 8/1996 | Bonn |
| 5,361,408 A | 11/1994 | Watanabe et al. | 5,552,789 A | 9/1996 | Schuermann |
| 5,369,404 A | 11/1994 | Galton | 5,555,453 A | 9/1996 | Kajimoto et al. |
| 5,369,789 A | 11/1994 | Kosugi et al. | 5,557,641 A | 9/1996 | Weinberg |
| 5,369,800 A | 11/1994 | Takagi et al. | 5,557,642 A | 9/1996 | Williams |
| 5,375,146 A | 12/1994 | Chalmers | 5,563,550 A | 10/1996 | Toth |
| 5,379,040 A | 1/1995 | Mizomoto et al. | 5,564,097 A | 10/1996 | Swanke |
| 5,379,141 A | 1/1995 | Thompson et al. | 5,574,755 A | 11/1996 | Persico |
| 5,388,063 A | 2/1995 | Takatori et al. | 5,579,341 A | 11/1996 | Smith et al. |
| 5,389,839 A | 2/1995 | Heck | 5,579,347 A | 11/1996 | Lindquist et al. |
| 5,390,215 A | 2/1995 | Antia et al. | 5,584,068 A | 12/1996 | Mohindra |
| 5,390,364 A | 2/1995 | Webster et al. | 5,589,793 A | 12/1996 | Kassapian |
| 5,400,084 A | 3/1995 | Scarpa | 5,592,131 A | 1/1997 | Labreche et al. |
| 5,404,127 A | 4/1995 | Lee et al. | 5,600,680 A | 2/1997 | Mishima et al. |
| 5,410,195 A | 4/1995 | Ichihara | 5,602,847 A | 2/1997 | Pagano et al. |
| 5,410,270 A | 4/1995 | Rybicki et al. | 5,602,868 A | 2/1997 | Wilson |
| 5,410,541 A | 4/1995 | Hotto | 5,604,592 A | 2/1997 | Kotidis et al. |
| 5,410,743 A | 4/1995 | Seely et al. | 5,604,732 A | 2/1997 | Kim et al. |
| 5,412,352 A | 5/1995 | Graham | 5,606,731 A | 2/1997 | Pace et al. |
| 5,416,449 A | 5/1995 | Joshi | 5,608,531 A | 3/1997 | Honda et al. |
| 5,416,803 A | 5/1995 | Janer | 5,610,946 A | 3/1997 | Tanaka et al. |
| 5,422,909 A | 6/1995 | Love et al. | RE35,494 E | 4/1997 | Nicollini |
| 5,422,913 A | 6/1995 | Wilkinson | 5,617,451 A | 4/1997 | Mimura et al. |
| 5,423,082 A | 6/1995 | Cygan et al. | 5,619,538 A | 4/1997 | Sempel et al. |
| 5,428,638 A | 6/1995 | Cioffi et al. | 5,621,455 A | 4/1997 | Rogers et al. |
| 5,428,640 A | 6/1995 | Townley | 5,628,055 A | 5/1997 | Stein |
| 5,434,546 A | 7/1995 | Palmer | 5,630,227 A | 5/1997 | Bella et al. |
| 5,438,329 A | 8/1995 | Gastouniotis et al. | 5,633,610 A | 5/1997 | Maekawa et al. |
| 5,438,692 A | 8/1995 | Mohindra | 5,633,815 A | 5/1997 | Young |
| 5,440,311 A | 8/1995 | Gallagher et al. | 5,634,207 A | 5/1997 | Yamaji et al. |
| 5,444,415 A | 8/1995 | Dent et al. | 5,636,140 A | 6/1997 | Lee et al. |
| 5,444,416 A | 8/1995 | Ishikawa et al. | 5,638,396 A | 6/1997 | Klimek |
| 5,444,865 A | 8/1995 | Heck et al. | 5,640,415 A | 6/1997 | Pandula |
| 5,446,421 A | 8/1995 | Kechkaylo | 5,640,424 A | 6/1997 | Banavong et al. |
| 5,446,422 A | 8/1995 | Mattila et al. | 5,640,428 A | 6/1997 | Abe et al. |
| 5,448,602 A | 9/1995 | Ohmori et al. | 5,640,698 A | 6/1997 | Shen et al. |
| 5,451,899 A | 9/1995 | Lawton | 5,642,071 A | 6/1997 | Sevenhans et al. |
| 5,454,007 A | 9/1995 | Dutta | 5,648,985 A | 7/1997 | Bjerede et al. |
| 5,454,009 A | 9/1995 | Fruit et al. | 5,650,785 A | 7/1997 | Rodal |
| 5,463,356 A | 10/1995 | Palmer | 5,661,424 A | 8/1997 | Tang |
| 5,463,357 A | 10/1995 | Hobden | 5,663,878 A | 9/1997 | Walker |
| 5,465,071 A | 11/1995 | Kobayashi et al. | 5,663,986 A | 9/1997 | Striffler |
| 5,465,410 A | 11/1995 | Hiben et al. | 5,668,836 A | 9/1997 | Smith et al. |
| 5,465,415 A | 11/1995 | Bien | 5,675,392 A | 10/1997 | Nayebi et al. |
| 5,465,418 A | 11/1995 | Zhou et al. | 5,678,220 A | 10/1997 | Fournier |
| 5,471,162 A | 11/1995 | McEwan | 5,678,226 A | 10/1997 | Li et al. |
| 5,471,665 A | 11/1995 | Pace et al. | 5,680,078 A | 10/1997 | Ariie |
| 5,479,120 A | 12/1995 | McEwan | 5,680,418 A | 10/1997 | Croft et al. |
| 5,479,447 A | 12/1995 | Chow et al. | 5,682,099 A | 10/1997 | Thompson et al. |
| 5,481,570 A | 1/1996 | Winters | 5,689,413 A | 11/1997 | Jaramillo et al. |
| 5,483,193 A | 1/1996 | Kennedy et al. | 5,694,096 A | 12/1997 | Ushiroku et al. |
| 5,483,549 A | 1/1996 | Weinberg et al. | 5,697,074 A | 12/1997 | Makikallio et al. |
| 5,483,600 A | 1/1996 | Werrbach | 5,699,006 A | 12/1997 | Zele et al. |
| 5,483,691 A | 1/1996 | Heck et al. | 5,703,584 A | 12/1997 | Hill |
| 5,483,695 A | 1/1996 | Pardoen | 5,705,949 A | 1/1998 | Alelyunas et al. |
| 5,490,173 A | 2/1996 | Whikehart et al. | 5,705,955 A | 1/1998 | Freeburg et al. |
| 5,490,176 A | 2/1996 | Peltier | 5,710,992 A | 1/1998 | Sawada et al. |
| 5,493,581 A | 2/1996 | Young et al. | 5,710,998 A | 1/1998 | Opas |
| 5,493,721 A | 2/1996 | Reis | 5,714,910 A | 2/1998 | Skoczen et al. |
| 5,495,200 A | 2/1996 | Kwan et al. | 5,715,281 A | 2/1998 | Bly et al. |
| 5,495,202 A | 2/1996 | Hsu | 5,721,514 A | 2/1998 | Crockett et al. |
| 5,495,500 A | 2/1996 | Jovanovich et al. | 5,724,002 A | 3/1998 | Hulick |
| 5,499,267 A | 3/1996 | Ohe et al. | 5,724,041 A | 3/1998 | Inoue et al. |
| 5,500,758 A | 3/1996 | Thompson et al. | 5,724,653 A | 3/1998 | Baker et al. |

| | | | | | |
|---|---|---|---|---|---|
| 5,729,577 A | 3/1998 | Chen | 5,903,187 A | 5/1999 | Claverie et al. |
| 5,729,829 A | 3/1998 | Talwar et al. | 5,903,196 A | 5/1999 | Salvi et al. |
| 5,732,333 A | 3/1998 | Cox et al. | 5,903,421 A | 5/1999 | Furutani et al. |
| 5,734,683 A | 3/1998 | Hulkko et al. | 5,903,553 A | 5/1999 | Sakamoto et al. |
| 5,736,895 A | 4/1998 | Yu et al. | 5,903,595 A | 5/1999 | Suzuki |
| 5,737,035 A | 4/1998 | Rotzoll | 5,903,609 A | 5/1999 | Kool et al. |
| 5,742,189 A * | 4/1998 | Yoshida et al. ............. 327/113 | 5,903,827 A | 5/1999 | Kennan et al. |
| 5,745,846 A | 4/1998 | Myer et al. | 5,903,854 A | 5/1999 | Abe et al. |
| 5,748,683 A | 5/1998 | Smith et al. | 5,905,433 A | 5/1999 | Wortham |
| 5,751,154 A | 5/1998 | Tsugai | 5,905,449 A | 5/1999 | Tsubouchi et al. |
| 5,757,858 A | 5/1998 | Black et al. | 5,907,149 A | 5/1999 | Marckini |
| 5,757,870 A | 5/1998 | Miya et al. | 5,907,197 A | 5/1999 | Faulk |
| RE35,829 E | 6/1998 | Sanderford, Jr. | 5,909,447 A | 6/1999 | Cox et al. |
| 5,760,629 A | 6/1998 | Urabe et al. | 5,911,116 A | 6/1999 | Nosswitz |
| 5,760,632 A | 6/1998 | Kawakami et al. | 5,911,123 A | 6/1999 | Shaffer et al. |
| 5,760,645 A | 6/1998 | Comte et al. | 5,914,622 A | 6/1999 | Inoue |
| 5,764,087 A | 6/1998 | Clark | 5,915,278 A | 6/1999 | Mallick |
| 5,767,726 A | 6/1998 | Wang | 5,918,167 A | 6/1999 | Tiller et al. |
| 5,768,118 A | 6/1998 | Faulk et al. | 5,920,199 A | 7/1999 | Sauer |
| 5,768,323 A | 6/1998 | Kroeger et al. | 5,926,065 A | 7/1999 | Wakai et al. |
| 5,770,985 A | 6/1998 | Ushiroku et al. | 5,926,513 A | 7/1999 | Suominen et al. |
| 5,771,442 A | 6/1998 | Wang et al. | 5,933,467 A | 8/1999 | Sehier et al. |
| 5,777,692 A | 7/1998 | Ghosh | 5,937,013 A | 8/1999 | Lam et al. |
| 5,777,771 A | 7/1998 | Smith | 5,943,370 A | 8/1999 | Smith |
| 5,778,022 A | 7/1998 | Walley | 5,945,660 A | 8/1999 | Nakasuji et al. |
| 5,784,689 A | 7/1998 | Kobayashi | 5,949,827 A | 9/1999 | DeLuca et al. |
| 5,786,844 A | 7/1998 | Rogers et al. | 5,952,895 A | 9/1999 | McCune, Jr. et al. |
| 5,787,125 A | 7/1998 | Mittel | 5,953,642 A | 9/1999 | Feldtkeller et al. |
| 5,790,587 A | 8/1998 | Smith et al. | 5,955,992 A | 9/1999 | Shattil |
| 5,793,801 A | 8/1998 | Fertner | 5,959,850 A | 9/1999 | Lim |
| 5,793,817 A | 8/1998 | Wilson | 5,960,033 A | 9/1999 | Shibano et al. |
| 5,793,818 A | 8/1998 | Claydon et al. | 5,970,053 A | 10/1999 | Schick et al. |
| 5,801,654 A | 9/1998 | Traylor | 5,982,315 A | 11/1999 | Bazarjani et al. |
| 5,802,463 A | 9/1998 | Zuckerman | 5,982,329 A | 11/1999 | Pittman et al. |
| 5,805,460 A | 9/1998 | Greene et al. | 5,986,600 A | 11/1999 | McEwan |
| 5,809,060 A | 9/1998 | Cafarella et al. | 5,994,689 A | 11/1999 | Charrier |
| 5,812,546 A | 9/1998 | Zhou et al. | 5,995,030 A | 11/1999 | Cabler |
| 5,818,582 A | 10/1998 | Fernandez et al. | 5,999,561 A | 12/1999 | Naden et al. |
| 5,818,869 A | 10/1998 | Miya et al. | 6,005,506 A | 12/1999 | Bazarjani et al. |
| 5,825,254 A | 10/1998 | Lee | 6,005,903 A | 12/1999 | Mendelovicz |
| 5,825,257 A | 10/1998 | Klymyshyn et al. | 6,011,435 A | 1/2000 | Takeyabu et al. |
| 5,834,979 A | 11/1998 | Yatsuka | 6,014,176 A | 1/2000 | Nayebi et al. |
| 5,834,985 A | 11/1998 | Sundegård | 6,014,551 A | 1/2000 | Pesola et al. |
| 5,834,987 A | 11/1998 | Dent | 6,018,262 A | 1/2000 | Noro et al. |
| 5,841,324 A | 11/1998 | Williams | 6,018,553 A | 1/2000 | Sanielevici et al. |
| 5,841,811 A | 11/1998 | Song | 6,026,286 A | 2/2000 | Long |
| 5,844,449 A | 12/1998 | Abeno et al. | 6,028,887 A | 2/2000 | Harrison et al. |
| 5,844,868 A | 12/1998 | Takahashi et al. | 6,031,217 A | 2/2000 | Aswell et al. |
| 5,847,594 A | 12/1998 | Mizuno | 6,034,566 A | 3/2000 | Ohe |
| 5,859,878 A | 1/1999 | Phillips et al. | 6,041,073 A | 3/2000 | Davidovici et al. |
| 5,864,754 A | 1/1999 | Hotto | 6,047,026 A | 4/2000 | Chao et al. |
| 5,870,670 A | 2/1999 | Ripley et al. | 6,049,573 A | 4/2000 | Song |
| 5,872,446 A | 2/1999 | Cranford, Jr. et al. | 6,049,706 A | 4/2000 | Cook et al. |
| 5,878,088 A | 3/1999 | Knutson et al. | 6,054,889 A | 4/2000 | Kobayashi |
| 5,881,375 A | 3/1999 | Bonds | 6,057,714 A | 5/2000 | Andrys et al. |
| 5,883,548 A | 3/1999 | Assard et al. | 6,061,551 A | 5/2000 | Sorrells et al. |
| 5,884,154 A | 3/1999 | Sano et al. | 6,061,555 A | 5/2000 | Bultman et al. |
| 5,887,001 A | 3/1999 | Russell | 6,064,054 A | 5/2000 | Waczynski et al. |
| 5,892,380 A | 4/1999 | Quist | 6,067,329 A | 5/2000 | Kato et al. |
| 5,894,239 A | 4/1999 | Bonaccio et al. | 6,073,001 A | 6/2000 | Sokoler |
| 5,894,496 A | 4/1999 | Jones | 6,076,015 A | 6/2000 | Hartley et al. |
| 5,896,304 A | 4/1999 | Tiemann et al. | 6,078,630 A | 6/2000 | Prasanna |
| 5,896,562 A | 4/1999 | Heinonen | 6,081,691 A | 6/2000 | Renard et al. |
| 5,898,912 A | 4/1999 | Heck et al. | 6,084,465 A | 7/2000 | Dasgupta |
| 5,900,746 A | 5/1999 | Sheahan | 6,084,922 A | 7/2000 | Zhou et al. |
| 5,900,747 A | 5/1999 | Brauns | 6,085,073 A | 7/2000 | Palermo et al. |
| 5,901,054 A | 5/1999 | Leu et al. | 6,091,289 A | 7/2000 | Song et al. |
| 5,901,187 A | 5/1999 | Iinuma | 6,091,939 A | 7/2000 | Banh |
| 5,901,344 A | 5/1999 | Opas | 6,091,940 A | 7/2000 | Sorrells et al. |
| 5,901,347 A | 5/1999 | Chambers et al. | 6,091,941 A | 7/2000 | Moriyama et al. |
| 5,901,348 A | 5/1999 | Bang et al. | 6,094,084 A | 7/2000 | Abou-Allam et al. |
| 5,901,349 A | 5/1999 | Guegnaud et al. | 6,098,046 A | 8/2000 | Cooper et al. |
| 5,903,178 A | 5/1999 | Miyatsuji et al. | 6,098,886 A | 8/2000 | Swift et al. |

| Patent | Date | Inventor |
|---|---|---|
| 6,121,819 A | 9/2000 | Traylor |
| 6,125,271 A | 9/2000 | Rowland et al. |
| 6,144,236 A | 11/2000 | Vice et al. |
| 6,144,331 A | 11/2000 | Jiang |
| 6,144,846 A | 11/2000 | Durec |
| 6,147,340 A | 11/2000 | Levy |
| 6,147,763 A | 11/2000 | Steinlechner |
| 6,150,890 A | 11/2000 | Damgaard et al. |
| 6,151,354 A | 11/2000 | Abbey |
| 6,160,280 A | 12/2000 | Bonn et al. |
| 6,169,733 B1 | 1/2001 | Lee |
| 6,175,728 B1 | 1/2001 | Mitama |
| 6,178,319 B1 | 1/2001 | Kashima |
| 6,182,011 B1 | 1/2001 | Ward |
| 6,204,789 B1 | 3/2001 | Nagata |
| 6,208,636 B1 | 3/2001 | Tawil et al. |
| RE37,138 E | 4/2001 | Dent |
| 6,211,718 B1 | 4/2001 | Souetinov |
| 6,212,369 B1 | 4/2001 | Avasarala |
| 6,215,475 B1 | 4/2001 | Meyerson et al. |
| 6,215,828 B1 | 4/2001 | Signell et al. |
| 6,225,848 B1 | 5/2001 | Tilley et al. |
| 6,230,000 B1 | 5/2001 | Tayloe |
| 6,246,695 B1 | 6/2001 | Seazholtz et al. |
| 6,266,518 B1 | 7/2001 | Sorrells et al. |
| 6,298,065 B1 | 10/2001 | Dombkowski et al. |
| 6,307,894 B2 | 10/2001 | Eidson et al. |
| 6,308,058 B1 | 10/2001 | Souetinov et al. |
| 6,313,685 B1 | 11/2001 | Rabii |
| 6,313,700 B1 | 11/2001 | Nishijima et al. |
| 6,314,279 B1 | 11/2001 | Mohindra |
| 6,317,589 B1 | 11/2001 | Nash |
| 6,321,073 B1 | 11/2001 | Luz et al. |
| 6,327,313 B1 | 12/2001 | Traylor et al. |
| 6,330,244 B1 | 12/2001 | Swartz et al. |
| 6,335,656 B1 | 1/2002 | Goldfarb et al. |
| 6,353,735 B1 | 3/2002 | Sorrells et al. |
| 6,363,262 B1 | 3/2002 | McNicol |
| 6,366,622 B1 | 4/2002 | Brown et al. |
| 6,370,371 B1 | 4/2002 | Sorrells et al. |
| 6,385,439 B1 | 5/2002 | Hellberg |
| 6,393,070 B1 | 5/2002 | Reber |
| 6,400,963 B1 | 6/2002 | Glöckler et al. |
| 6,404,758 B1 | 6/2002 | Wang |
| 6,404,823 B1 | 6/2002 | Grange et al. |
| 6,421,534 B1 | 7/2002 | Cook et al. |
| 6,437,639 B1 | 8/2002 | Nguyen et al. |
| 6,438,366 B1 | 8/2002 | Lindfors et al. |
| 6,441,659 B1 | 8/2002 | Demone |
| 6,441,694 B1 | 8/2002 | Turcotte et al. |
| 6,445,726 B1 | 9/2002 | Gharpurey |
| 6,459,721 B1 | 10/2002 | Mochizuki et al. |
| 6,509,777 B2 | 1/2003 | Razavi et al. |
| 6,512,544 B1 | 1/2003 | Merrill et al. |
| 6,512,785 B1 | 1/2003 | Zhou et al. |
| 6,516,185 B1 | 2/2003 | MacNally |
| 6,531,979 B1 | 3/2003 | Hynes |
| 6,542,722 B1 | 4/2003 | Sorrells et al. |
| 6,560,301 B1 | 5/2003 | Cook et al. |
| 6,560,451 B1 | 5/2003 | Somayajula |
| 6,567,483 B1 | 5/2003 | Dent et al. |
| 6,580,902 B1 | 6/2003 | Sorrells et al. |
| 6,591,310 B1 | 7/2003 | Johnson |
| 6,597,240 B1 | 7/2003 | Walburger et al. |
| 6,600,795 B1 | 7/2003 | Ohta et al. |
| 6,600,911 B1 | 7/2003 | Morishige et al. |
| 6,608,647 B1 | 8/2003 | King |
| 6,611,569 B1 | 8/2003 | Schier et al. |
| 6,618,579 B1 | 9/2003 | Smith et al. |
| 6,628,328 B1 | 9/2003 | Yokouchi et al. |
| 6,633,194 B2 | 10/2003 | Arnborg et al. |
| 6,634,555 B1 | 10/2003 | Sorrells et al. |
| 6,639,939 B1 | 10/2003 | Naden et al. |
| 6,647,250 B1 | 11/2003 | Bultman et al. |
| 6,647,270 B1 | 11/2003 | Himmelstein |
| 6,686,879 B2 | 2/2004 | Shattil |
| 6,687,493 B1 | 2/2004 | Sorrells et al. |
| 6,690,232 B2 | 2/2004 | Ueno et al. |
| 6,694,128 B1 | 2/2004 | Sorrells et al. |
| 6,697,603 B1 | 2/2004 | Lovinggood et al. |
| 6,704,549 B1 | 3/2004 | Sorrells et al. |
| 6,704,558 B1 | 3/2004 | Sorrells et al. |
| 6,741,139 B2 | 5/2004 | Pleasant et al. |
| 6,741,650 B1 | 5/2004 | Painchaud et al. |
| 6,775,684 B1 | 8/2004 | Toyoyama et al. |
| 6,798,351 B1 | 9/2004 | Sorrells et al. |
| 6,801,253 B1 | 10/2004 | Yonemoto et al. |
| 6,813,485 B2 | 11/2004 | Sorrells et al. |
| 6,823,178 B2 | 11/2004 | Pleasant et al. |
| 6,836,650 B2 | 12/2004 | Sorrells et al. |
| 6,850,742 B2 | 2/2005 | Fayyaz |
| 6,853,690 B1 | 2/2005 | Sorrells et al. |
| 6,865,399 B2 | 3/2005 | Fujioka et al. |
| 6,873,836 B1 | 3/2005 | Sorrells et al. |
| 6,879,817 B1 | 4/2005 | Sorrells et al. |
| 6,882,194 B2 | 4/2005 | Belot et al. |
| 6,892,057 B2 | 5/2005 | Nilsson |
| 6,892,062 B2 | 5/2005 | Lee et al. |
| 6,909,739 B1 | 6/2005 | Eerola et al. |
| 6,910,015 B2 | 6/2005 | Kawai |
| 6,917,796 B2 | 7/2005 | Setty et al. |
| 6,920,311 B2 | 7/2005 | Rofougaran et al. |
| 6,959,178 B2 | 10/2005 | Macedo et al. |
| 6,963,626 B1 | 11/2005 | Shaeffer et al. |
| 6,963,734 B2 | 11/2005 | Sorrells et al. |
| 6,973,476 B1 | 12/2005 | Naden et al. |
| 6,975,848 B2 | 12/2005 | Rawlins et al. |
| 6,999,747 B2 | 2/2006 | Su |
| 7,006,805 B1 | 2/2006 | Sorrells et al. |
| 7,010,286 B2 | 3/2006 | Sorrells et al. |
| 7,010,559 B2 | 3/2006 | Rawlins et al. |
| 7,016,663 B2 | 3/2006 | Sorrells et al. |
| 7,027,786 B1 | 4/2006 | Smith et al. |
| 7,039,372 B1 | 5/2006 | Sorrells et al. |
| 7,050,058 B2 | 5/2006 | Sorrells et al. |
| 7,054,296 B1 | 5/2006 | Sorrells et al. |
| 7,065,162 B1 | 6/2006 | Sorrells et al. |
| 7,072,390 B1 | 7/2006 | Sorrells et al. |
| 7,072,427 B2 | 7/2006 | Rawlins et al. |
| 7,072,433 B2 | 7/2006 | Bell |
| 7,076,011 B2 | 7/2006 | Cook et al. |
| 7,082,171 B1 | 7/2006 | Johnson et al. |
| 7,085,335 B2 | 8/2006 | Rawlins et al. |
| 7,107,028 B2 | 9/2006 | Sorrells et al. |
| 7,110,435 B1 | 9/2006 | Sorrells et al. |
| 7,110,444 B1 | 9/2006 | Sorrells et al. |
| 7,190,941 B2 | 3/2007 | Sorrells et al. |
| 7,194,044 B2 | 3/2007 | Birkett et al. |
| 7,194,246 B2 | 3/2007 | Sorrells et al. |
| 7,209,725 B1 | 4/2007 | Sorrells et al. |
| 7,212,581 B2 | 5/2007 | Birkett et al. |
| 7,218,899 B2 | 5/2007 | Sorrells et al. |
| 7,218,907 B2 | 5/2007 | Sorrells et al. |
| 7,224,749 B2 | 5/2007 | Sorrells et al. |
| 7,233,969 B2 | 6/2007 | Rawlins et al. |
| 7,236,754 B2 | 6/2007 | Sorrells et al. |
| 7,245,886 B2 | 7/2007 | Sorrells et al. |
| 2001/0015673 A1 | 8/2001 | Yamashita et al. |
| 2001/0036818 A1 | 11/2001 | Dobrovolny |
| 2002/0037706 A1 | 3/2002 | Ichihara |
| 2002/0080728 A1 | 6/2002 | Sugar et al. |
| 2002/0132642 A1 | 9/2002 | Hines et al. |
| 2002/0163921 A1 | 11/2002 | Ethridge et al. |
| 2003/0045263 A1 | 3/2003 | Wakayama et al. |
| 2003/0081781 A1 | 5/2003 | Jensen et al. |
| 2003/0149579 A1 | 8/2003 | Begemann et al. |

| | | |
|---|---|---|
| 2003/0193364 A1 | 10/2003 | Liu et al. |
| 2004/0125879 A1 | 7/2004 | Jaussi et al. |
| 2006/0039449 A1 | 2/2006 | Fontana et al. |

FOREIGN PATENT DOCUMENTS

| | | |
|---|---|---|
| DE | 35 41 031 A1 | 5/1986 |
| DE | 42 37 692 C1 | 3/1994 |
| DE | 196 27 640 A1 | 1/1997 |
| DE | 196 48 915 A1 | 6/1998 |
| DE | 197 35 798 C1 | 7/1998 |
| EP | 0 035 166 A1 | 9/1981 |
| EP | 0 087 336 A1 | 8/1983 |
| EP | 0 099 265 A1 | 1/1984 |
| EP | 0 087 336 B1 | 7/1986 |
| EP | 0 254 844 A2 | 2/1988 |
| EP | 0 276 130 A2 | 7/1988 |
| EP | 0 276 130 A3 | 7/1988 |
| EP | 0 193 899 B1 | 6/1990 |
| EP | 0 380 351 A2 | 8/1990 |
| EP | 0 380 351 A3 | 2/1991 |
| EP | 0 411 840 A2 | 2/1991 |
| EP | 0 423 718 A2 | 4/1991 |
| EP | 0 411 840 A3 | 7/1991 |
| EP | 0 486 095 A1 | 5/1992 |
| EP | 0 423 718 A3 | 8/1992 |
| EP | 0 512 748 A2 | 11/1992 |
| EP | 0 529 836 A1 | 3/1993 |
| EP | 0 548 542 A1 | 6/1993 |
| EP | 0 512 748 A3 | 7/1993 |
| EP | 0 560 228 A1 | 9/1993 |
| EP | 0 632 288 A2 | 1/1995 |
| EP | 0 632 577 A1 | 1/1995 |
| EP | 0 643 477 42 | 3/1995 |
| EP | 0 643 477 A3 | 3/1995 |
| EP | 0 411 840 B1 | 10/1995 |
| EP | 0 696 854 A1 | 2/1996 |
| EP | 0 632 288 A3 | 7/1996 |
| EP | 0 732 803 A1 | 9/1996 |
| EP | 0 486 095 B1 | 2/1997 |
| EP | 0 782 275 A2 | 7/1997 |
| EP | 0 785 635 A1 | 7/1997 |
| EP | 0 789 449 A2 | 8/1997 |
| EP | 0 789 449 A3 | 8/1997 |
| EP | 0 795 955 A2 | 9/1997 |
| EP | 0 795 955 A3 | 9/1997 |
| EP | 0 795 978 A2 | 9/1997 |
| EP | 0 817 369 A2 | 1/1998 |
| EP | 0 817 369 A3 | 1/1998 |
| EP | 0 837 565 A1 | 4/1998 |
| EP | 0 862 274 A1 | 9/1998 |
| EP | 0 874 499 A2 | 10/1998 |
| EP | 0 512 748 B1 | 11/1998 |
| EP | 0 877 476 A1 | 11/1998 |
| EP | 0 977 351 A1 | 2/2000 |
| FR | 2 245 130 | 4/1975 |
| FR | 2 669 787 A1 | 5/1992 |
| FR | 2 743 231 A1 | 7/1997 |
| GB | 2 161 344 A | 1/1986 |
| GB | 2 215 945 A | 9/1989 |
| GB | 2 324 919 A | 11/1998 |
| JP | 47-2314 | 2/1972 |
| JP | 55-66057 | 5/1980 |
| JP | 56-114451 | 9/1981 |
| JP | 58-7903 | 1/1983 |
| JP | 58-133004 | 8/1983 |
| JP | 59-144249 | 8/1984 |
| JP | 60-58705 | 4/1985 |
| JP | 60-130203 | 7/1985 |
| JP | 61-30821 | 2/1986 |
| JP | 61-232706 | 10/1986 |
| JP | 62-12381 | 1/1987 |
| JP | 63-54002 | 3/1988 |
| JP | 63-65587 | 3/1988 |
| JP | 63-153691 | 6/1988 |
| JP | 2-39632 | 2/1990 |
| JP | 2-131629 | 5/1990 |
| JP | 2-276351 | 11/1990 |
| JP | 4-123614 | 4/1992 |
| JP | 4-127601 | 4/1992 |
| JP | 4-154227 | 5/1992 |
| JP | 5-175730 | 7/1993 |
| JP | 5-175734 | 7/1993 |
| JP | 5-327356 | 12/1993 |
| JP | 6-237276 | 8/1994 |
| JP | 6-284038 | 10/1994 |
| JP | 7-154344 | 6/1995 |
| JP | 7-307620 | 11/1995 |
| JP | 8-23359 | 1/1996 |
| JP | 8-32556 | 2/1996 |
| JP | 8-139524 | 5/1996 |
| JP | 9-36664 | 2/1997 |
| JP | 9-171399 | 6/1997 |
| JP | 10-41860 | 2/1998 |
| JP | 10-96778 | 4/1998 |
| JP | 10-173563 | 6/1998 |
| JP | 11-98205 | 4/1999 |
| WO | WO 80/01633 A1 | 8/1980 |
| WO | WO 91/18445 A1 | 11/1991 |
| WO | WO 94/05087 A1 | 3/1994 |
| WO | WO 95/01006 A1 | 1/1995 |
| WO | WO 96/02977 A1 | 2/1996 |
| WO | WO 96/08078 A1 | 3/1996 |
| WO | WO 96/39750 A1 | 12/1996 |
| WO | WO 97/08839 A2 | 3/1997 |
| WO | WO 97/08839 A3 | 3/1997 |
| WO | WO 97/38490 A1 | 10/1997 |
| WO | WO 98/00953 A1 | 1/1998 |
| WO | WO 98/242201 A1 | 6/1998 |
| WO | WO 98/40968 A2 | 9/1998 |
| WO | WO 98/40968 A3 | 9/1998 |
| WO | WO 98/53556 A2 | 11/1998 |
| WO | WO 99/23755 A1 | 5/1999 |
| WO | WO 00/31659 A1 | 6/2000 |

OTHER PUBLICATIONS

Deboo, Gordon J., *Integrated Circuits and Semiconductor Devices*, 2nd Edition, McGraw-Hill, Inc., pp. 41-45 (1977).

U.S. Appl. No. 09/590,955, filed Jun. 9, 2000, Johnson et al.

Aghvami, H. et al., "Land Mobile Satellites Using the Highly Elliptic Orbits- The UK T-SAT Mobile Payload," *Fourth International Conference on Satellite Systems for Mobile Communications and Navigation*, IEE, pp. 147-153 (Oct. 17-19, 1988).

Akers, N.P. et al., "RF Sampling Gates: a Brief Review," *IEE Proceedings*, IEE, vol. 133, Part A, No. 1, pp. 45-49 (Jan. 1986).

Al-Ahmad, H.A.M. et al., "Doppler Frequency Correction for a Non-Geostationary Communications Satellite. Techniques for CERS and T-SAT," *Electronics Division Colloquium on Low Noise Oscillators and Synthesizers*, IEE, pp. 4/1-4/5 (Jan. 23, 1986).

Ali, I. et al., "Doppler Characterization for LEO Satellites," *IEEE Transactions on Communications*, IEEE, vol. 46, No. 3, pp. 309-313 (Mar. 1998).

Allan, D.W., "Statistics of Atomic Frequency Standards," *Proceedings Of The IEEE Special Issue on Frequency Stability*, IEEE, pp. 221-230 (Feb. 1966).

Allstot, D.J. et al., "MOS Switched Capacitor Ladder Filters," *IEEE Journal of Solid-State Circuits*, IEEE, vol. SC-13, No. 6, pp. 806-814 (Dec. 1978).

Allstot, D.J. and Black Jr. W.C., "Technological Design Considerations for Monolithic MOS Switched-Capacitor Filtering Systems," *Proceedings of the IEEE*, IEEE, vol. 71, No. 8, pp. 967-986 (Aug. 1983).

Alouini, M. et al., "Channel Characterization and Modeling for Ka-Band Very Small Aperture Terminals," *Proceedings Of the IEEE*, IEEE, vol. 85, No. 6, pp. 981-997 (Jun. 1997).

Andreyev, G.A. and Ogarev, S.A., "Phase Distortions of Keyed Millimeter-Wave Signals in the Case of Propagation in a Turbulent Atmosphere," *Telecommunications and Radio Engineering*, Scripta Technica, vol. 43, No. 12, pp. 87-90 (Dec. 1988).

Antonetti, A. et al., "Optoelectronic Sampling in the Picosecond Range," *Optics Communications*, North-Holland Publishing Company, vol. 21, No. 2, pp. 211-214 (May 1977).

Austin, J. et al., "Doppler Correction of the Telecommunication Payload Oscillators in the UK T-SAT," *18th European Microwave Conference*, Microwave Exhibitions and Publishers Ltd., pp. 851-857 (Sep. 12-15, 1988).

Auston, D.H., "Picosecond optoelectronic switching and gating in silicon," *Applied Physics Letters*, American Institute of Physics, vol. 26, No. 3, pp. 101-103 (Feb. 1, 1975).

Baher, H., "Transfer Functions for Switched-Capacitor and Wave Digital Filters," *IEEE Transactions on Circuits and Systems*, IEEE Circuits and Systems Society, vol. CAS-33, No. 11, pp. 1138-1142 (Nov. 1986).

Baines, R., "The DSP Bottleneck," *IEEE Communications Magazine*, IEEE Communications Society, pp. 46-54 (May 1995).

Banjo, O.P. and Vilar, E., "Binary Error Probabilities on Earth-Space Links Subject to Scintillation Fading," *Electronics Letters*, IEE, vol. 21, No. 7, pp. 296-297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277-280 (Mar. 30-Apr. 2, 1987).

Banjo, O.P. and Vilar, E. "Measurement and Modeling of Amplitude Scintillations on Low-Elevation Earth-Space Paths and Impact on Communication Systems," *IEEE Transactions on Communications*, IEEE Communications Society, vol. COM-34, No. 8, pp. 774-780 (Aug. 1986).

Banjo, O.P. et al., "Tropospheric Amplitude Spectra Due to Absorption and Scattering in Earth-Space Paths," *Fourth International Conference on Antennas and Propagation (ICAP 85)*, IEE, pp. 77-82 (Apr. 16-19, 1985).

Basili,P. et al., "Case Study of Intense Scintillation Events on the OTS Path," *IEEE Transactions on Antennas and Propagation*, IEEE, vol. 38, No. 1, pp. 107-113 (Jan. 1990).

Basili, P. et al., "Observation of High $C^2$ and Turbulent Path Length on OTS Space-Earth Link," *Electronics Letters*, IEE, vol. 24, No. 17, pp. 1114-1116 (Aug. 18, 1988).

Blakey, J.R. et al., "Measurement of Atmospheric Millimetre-Wave Phase Scintillations in an Absorption Region," *Electronics Letters*, IEE, vol. 21, No. 11, pp. 486-487 (May 23, 1985).

Burgueño, A. et al., "Influence of rain gauge integration time on the rain rate statistics used in microwave communications," *annales des télécommunications*, International Union of Radio Science, pp. 522-527 (Sep./Oct. 1988).

Burgueño, A. et al., "Long-Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198-201 (Mar. 30-Apr. 2, 1987).

Burgueño, A. et al., "Long Term Statistics of Precipitation Rate Return Periods in the Context of Microwave Communications," *Sixth International Conference on Antennas and Propagation (ICAP 89) Part 2: Propagation*, IEE, pp. 297-301 (Apr. 4-7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359-1366 (Sep. 1990).

Catalan, C. and Vilar, E., "Approach for satellite slant path remote sensing," *Electronics Letters*, IEE, vol. 34, No. 12, pp. 1238-1240 (Jun. 11, 1998).

Chan, P. et al., "A Highly Linear 1-GHz CMOS Downconversion Mixer," *European Solid State Circuits Conference*, IEEE Communication Society, pp. 210-213 (Sep. 22-24, 1993).

Declaration of Michael J. Bultman filed in U.S. Appl. No. 09/176,022, which is directed to related subject matter, 2 pages.

Declaration of Robert W. Cook filed in U.S. Appl. No. 09/176,022, which is directed to related subject matter, 2 pages.

Declaration of Alex Holtz filed in U.S. Appl. No. 09/176,022, which is directed to related subject matter, 3 pages.

Declaration of Richard C. Looke filed in U.S. Appl. No. 09/176,022, which is directed to related subject matter, 2 pages.

Declaration of Charley D. Moses, Jr. filed in U.S. Appl. No. 09/176,022, which is directed to related subject matter, 2 pages.

Declaration of Jeffrey L. Parker and David F. Sorrells, with attachment Exhibit 1, filed in U.S. Appl. No. 09/176,022, which is directed to related subject matter, 130 pages.

Dewey, R.J. and Collier, C.J., "Multi-Mode Radio Receiver," *Electronics Division Colloquium on Digitally Implemented Radios*, IEE, pp. 3/1-3/5 (Oct. 18, 1985).

Dialog file 347 (JAPIO) English Language Patent Abstract for JP 2-276351, 1 page (Nov. 13, 1990—Date of publication of application).

Dialog File 347 (JAPIO) English Language Patent Abstract for JP 2-131629, 1 page (May 21, 1990—Date of publication of application).

Dialog File 347 (JAPIO) English Language Patent Abstract for JP 2-39632, 1 page (Feb. 8, 1990—Date of publication of application).

Dialog File 348 (European Patents) English Language Patent Abstract for EP 0 785 635 A1, 3 pages (Dec. 26, 1996—Date of publication of application).

Dialog File 348 (European Patents) English Language Patent Abstract for EP 35166 A1, 2 pages (Feb. 18, 1981—Date of publication of application).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET-Less Sample-and-Hold with High Charge-to-Droop Current Ratio," *IEEE Journal of Solid-State Circuits*, IEEE, vol. SC-13, No. 6, pp. 864-873 (Dec. 1978).

Faulkner, N.D. and Vilar, E., "Subharmonic Sampling for the Measurement of Short Term Stability of Microwave Oscillators," *IEEE Transactions on Instrumentation and Measurement*, IEEE, vol. IM-32, No. 1, pp. 208-213 (Mar. 1983).

Faulkner, N.D. et al., "Sub-Harmonic Sampling for the Accurate Measurement of Frequency Stability of Microwave Oscillators," *CPEM 82 Digest: Conference on Precision Electromagnetic Measurements*, IEEE, pp. M-10 and M-11 (1982).

Faulkner, N.D. and Vilar, E., "Time Domain Analysis of Frequency Stability Using Non-Zero Dead-Time Counter Techniques," *CPEM 84 Digest Conference on Precision Electromagnetic Measurements*, IEEE, pp. 81-82 (1984).

Filip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958-1965 (Nov. 1990).

Fukahori, K., "A CMOS Narrow-Band Signaling Filter with Q Reduction," *IEEE Journal of Solid-State Circuits*, IEEE, vol. SC-19, No. 6, pp. 926-932 (Dec. 1984).

Fukuchi, H. and Otsu, Y., "Available time statistics of rain attenuation on earth-space path," *IEE Proceedings-H: Microwave, Antennas and Propagation*, IEE, vol. 135, Pt. H, No. 6, pp. 387-390 (Dec. 1988).

Gibbins, C.J. and Chadha, R., "Millimetre-wave propagation through hydrocarbon flame," *IEE Proceedings*, IEE, vol. 134, Pt. H, No. 2, pp. 169-173 (Apr. 1987).

Gilchrist, B. et al., "Sampling hikes performance of frequency synthesizers," *Microwaves & RF*, Hayden Publishing, vol. 23, No. 1, pp. 93-94 and 110 (Jan. 1984).

Gossard, E.E., "Clear weather meteorological effects on propagation at frequencies above 1 Ghz," *Radio Science*, American Geophysical Union, vol. 16, No. 5, pp. 589-608 (Sep.-Oct. 1981).

Gregorian, R. et al., "Switched-Capacitor Circuit Design," *Proceedings of the IEEE*, IEEE, vol. 71, No. 8, pp. 941-966 (Aug. 1983).

Groshong et al., "Undersampling Techniques Simplify Digital Radio," *Electronic Design*, Penton Publishing, pp. 67-68, 70, 73-75 and 78 (May 23, 1991).

Grove, W.M., "Sampling for Oscilloscopes and Other RF Systems: Dc through X-Band," *IEEE Transactions on Microwave Theory and Techniques*, IEEE, pp. 629-635 (Dec. 1966).

Haddon, J. et al., "Measurement of Microwave Scintillations on a Satellite Down-Link at X-Band," *Antennas and Propagation*, IEE, pp. 113-117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP-34, No. 5, pp. 646-657 (May 1986).

Hafdallah, H. et al., "2-4 Ghz MESFET Sampler," *Electronics Letters*, IEE, vol. 24, No. 3, pp. 151-153 (Feb. 4, 1988).

Herben, M.H.A.J., "Amplitude and Phase Scintillation Measurements on 8-2 km Line-Of-Sight Path at 30 Ghz," *Electronics Letters*, IEE, vol. 18, No. 7, pp. 287-289 (Apr. 1, 1982).

Hewitt, A. et al., "An 18 Ghz Wideband LOS Multipath Experiment," *International Conference on Measurements for Telecommunication Transmission Systems—MTTS 85*, IEE, pp. 112-116 (Nov. 27-28, 1985).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136-1143 (Nov. 1989).

Hewitt, A. and Vilar, E., "Selective fading on LOS Microwave Links: Classical and Spread-Spectrum Measurement Techniques," *IEEE Transactions on Communications*, IEEE Communications Society, vol. 36, No. 7, pp. 789-796 (Jul. 1988).

Hospitalier, E., "Instruments for Recording and Observing Rapidly Varying Phenomena," *Science Abstracts*, IEE, vol. VII, pp. 22-23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115-121 (Sep. 18-20, 1990).

Hu, X., *A Switched-Current Sample-and-Hold Amplifier for FM Demodulation*, Thesis for Master of Applied Science, Dept. of Electrical and Computer Engineering, University of Toronto, UMI Dissertation Services, pp. 1-64 (1995).

Hung, H-L. A. et al., "Characterization of Microwave Integrated Circuits Using An Optical Phase-Locking and Sampling System," *IEEE MTT-S Digest*, IEEE, pp. 507-510 (1991).

Hurst, P.J., "Shifting the Frequency Response of Switched-Capacitor Filters by Nonuniform Sampling," *IEEE Transactions on Circuits and Systems*, IEEE Circuits and Systems Society, vol. 38, No. 1, pp. 12-19 (Jan. 1991).

Itakura, T., "Effects of the sampling pulse width on the frequency characteristics of a sample-and-hold circuit," *IEE Proceedings Circuits, Devices and Systems*, IEE, vol. 141, No. 4, pp. 328-336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52-59 (Aug. 1950).

Janssen, J.M.L. and Michels, A.J., "An Experimental 'Stroboscopic' Oscilloscope for Frequencies up to about 50 Mc/s: II. Electrical Build-Up," *Philips Technical Review*, Philips Research Laboratories, vol. 12, No. 3, pp. 73-82 (Sep. 1950).

Jondral, V.F. et al., "Doppler Profiles for Communication Satellites," *Frequenz*, Herausberger, pp. 111-116 (May-Jun. 1996).

Kaleh, G.K., "A Frequency Diversity Spread Spectrum System for Communication in the Presence of In-band Interference," *1995 IEEE Globecom*, IEEE Communications Society, pp. 66-70 (1995).

Karasawa, Y. et al., "A New Prediction Method for Tropospheric Scintillation on Earth-Space Paths," *IEEE Transactions on Antennas and Propagation*, IEEE Antennas and Propagation Society, vol. 36, No. 11, pp. 1608-1614 (Nov. 1988).

Kirsten, J. and Fleming, J., "Undersampling reduces data-acquisition costs for select applications," *EDN*, Cahners Publishing, vol. 35, No. 13, pp. 217-222, 224, 226-228 (Jun. 21, 1990).

Lam, W.K. et al., "Measurement of the Phase Noise Characteristics of an Unlocked Communications Channel Identifier," *Proceedings Of the 1993 IEEE International Frequency Control Symposium*, IEEE, pp. 283-288 (Jun. 2-4, 1993).

Lam, W.K. et al., "Wideband sounding of 11.6 Ghz transhorizon channel," *Electronics Letters*, IEE, vol. 30, No. 9, pp. 738-739 (Apr. 28, 1994).

Larkin, K.G., "Efficient demodulator for bandpass sampled AM signals," *Electronics Letters*, IEE, vol. 32, No. 2, pp. 101-102 (Jan. 18, 1996).

Lau, W.H. et al., "Analysis of the Time Variant Structure of Microwave Line-of-sight Multipath Phenomena," *IEEE Global Telecommunication Conference & Exhibition*, IEEE, pp. 1707-1711 (Nov. 28-Dec. 1, 1988).

Lau, W.H. et al., "Improved Prony Algorithm to Identify Multipath Components," *Electronics Letters*, IEE, vol. 23, No. 20, pp. 1059-1060 (Sep. 24, 1987).

Lesage, P. and Audoin, C., "Effect of Dead-Time on the Estimation of the Two-Sample Variance," *IEEE Transactions on Instrumentation and Measurement*, IEEE Instrumentation and Measurement Society, vol. IM-28, No. 1, pp. 6-10 (Mar. 1979).

Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, vol. MTT-23, No. 6, pp. 461-469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS-26, No. 4, pp. 4443-4449 (Aug. 1979).

Liou, M.L., "A Tutorial on Computer-Aided Analysis of Switched-Capacitor Circuits," *Proceedings of the IEEE*, IEEE, vol. 71, No. 8, pp. 987-1005 (Aug. 1983).

Lo, P. et al., "Coherent Automatic Gain Control," *IEE Colloquium on Phase Locked Techniques*, IEE, pp. 2/1-2/6 (Mar. 26, 1980).

Lo, P. et al., "Computation of Rain Induced Scintillations on Satellite Down-Links at Microwave Frequencies," *Third International Conference on Antennas and Propagation (ICAP 83)*, pp. 127-131 (Apr. 12-15, 1983).

Lo, P.S.L.O. et al., "Observations of Amplitude Scintillations on a Low-Elevation Earth-Space Path," *Electronics Letters*, IEE, vol. 20, No. 7, pp. 307-308 (Mar. 29, 1984).

Madani, K. and Aithison, C.S., "A 20 Ghz Microwave Sampler," *IEEE Transactions on Microwave Theory and Techniques*, IEEE Microwave Theory and Techniques Society, vol. 40, No. 10, pp. 1960-1963 (Oct. 1992).

Marsland, R.A. et al., "130 Ghz GaAs monolithic integrated circuit sampling head," *Appl. Phys. Lett.*, American Institute of Physics, vol. 55, No. 6, pp. 592-594 (Aug. 7, 1989).

Martin, K. and Sedra, A.S., "Switched-Capacitor Building Blocks for Adaptive Systems," *IEEE Transactions on Circuits and Systems*, IEEE Circuits and Systems Society, vol. CAS-28, No. 6, pp. 576-584 (Jun. 1981).

Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, vol. 46, No. 10, pp. 1506-1518 (Oct. 1998).

Matricciani, E., "Prediction of fade durations due to rain in satellite communications systems," *Radio Science*, American Geophysical Union, vol. 32, No. 3, pp. 935-941 (May-Jun. 1997).

McQueen, J.G., "The Monitoring of High-Speed Waveforms," *Electronic Engineering*, Morgan Brothers Limited, vol. XXIV, No. 296, pp. 436-441 (Oct. 1952).

Merkelo, J. and Hall, R.D., "Broad-Band Thin-Film Signal Sampler," *IEEE Journal of Solid-State Circuits*, IEEE, vol. SC-7, No. 1, pp. 50-54 (Feb. 1972).

Merlo, U. et al., "Amplitude Scintillation Cycles in a Sirio Satellite-Earth Link," *Electronics Letters*, IEE, vol. 21, No. 23, pp. 1094-1096 (Nov. 7, 1985).

Morris, D., "Radio-holographic reflector measurement of the 30-m millimeter radio telescope at 22 Ghz with a cosmic signal source," *Astronomy and Astrophysics*, Springer-Verlag, vol. 203, No. 2, pp. 399-406 (Sep. 2, 1988).

Moulsley, T.J. et al., "The efficient acquisition and processing of propagation statistics," *Journal of the Institution of Electronic and Radio Engineers*, IERE, vol. 55, No. 3, pp. 97-103 (Mar. 1985).

Ndzi, D. et al., "Wide-Band Statistical Characterization of an Over-the-Sea Experimental Transhorizon Link," *IEE Colloquium on Radio Communications at Microwave and Millimetre Wave Frequencies*, IEE, pp. 1/1-1/6 (Dec. 16, 1996).

Ndzi, D. et al., "Wideband Statistics of Signal Levels and Doppler Spread on an Over-The-Sea Transhorizon Link," *IEE Colloquium on Propagation Characteristics and Related System Techniques for Beyond Line-of-Sight Radio*, IEE, pp. 9/1-9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130-135 (Apr. 12, 1979).

Oppenheim, A.V. et al., *Signals and Systems*, Prentice-Hall, pp. 527-531 and 561-562 (1983).

Ortgies, G., "Experimental Parameters Affecting Amplitude Scintillation Measurements on Satellite Links," *Electronics Letters*, IEE, vol. 21, No. 17, pp. 771-772 (Aug. 15, 1985).

Pärssinen et al., "A 2-GHz Subharmonic Sampler for Signal Downconversion," *IEEE Transactions on Microwave Theory and Techniques*, IEEE, vol. 45, No. 12, 7 pages (Dec. 1997).

Peeters, G. et al., "Evaluation of Statistical Models for Clear-Air Scintillation Prediction Using Olympus Satellite Measurements," *International Journal of Satellite Communications*, John Wiley and Sons, vol. 15, No. 2, pp. 73-88 (Mar.-Apr. 1997).

Perrey, A.G. and Schoenwetter, H.K., *NBS Technical Note 1121: A Schottky Diode Bridge Sampling Gate*, U.S. Dept. of Commerce, pp. 1-14 (May 1980).

Poulton, K. et al., "A 1-Ghz 6-bit ADC System," *IEEE Journal of Solid-State Circuits*, IEEE, vol. SC-22, No. 6, pp. 962-969 (Dec. 1987).

Press Release, "Parkervision, Inc. Announces Fiscal 1993 Results," Lippert/Heilshorn and Associates, 2 Pages (Apr. 6, 1994).

Press Release, "Parkervision, Inc. Announces the Appointment of Michael Baker to the New Position of National Sales Manager," Lippert/Heilshorn and Associates, 1 Page (Apr. 7, 1994).

Press Release, "Parkervision's Cameraman Well-Received By Distance Learning Market," Lippert/Heilshorn and Associates, 2 Pages (Apr. 8, 1994).

Press Release, "Parkervision, Inc. Announces First Quarter Financial Results," Lippert/Heilshorn and Associates, 2 Pages (Apr. 26, 1994).

Press Release, "Parkervision, Inc. Announces The Retirement of William H. Fletcher, Chief Financial Officer," Lippert/Heilshorn and Associates, 1 Page (May 11, 1994).

Press Release, "Parkervision, Inc. Announces New Cameraman System II™ At Infocomm Trade Show," Lippert/Heilshorn and Associates, 3 Pages (Jun. 9, 1994).

Press Release, "Parkervision, Inc. Announces Appointments to its National Sales Force," Lippert/Heilshorn and Associates, 2 Pages (Jun. 17, 1994).

Press Release, "Parkervision, Inc. Announces Second Quarter and Six Months Financial Results," Lippert/Heilshorn and Associates, 3 Pages (Aug. 9, 1994).

Press Release, "Parkervision, Inc. Announces Third Quarter and Nine Months Financial Results," Lippert/Heilshorn and Associates, 3 Pages (Oct. 28, 1994).

Press Release, "Parkervision, Inc. Announces First Significant Dealer Sale of Its *Cameraman®* System II," Lippert/Heilshorn and Associates, 2 Pages (Nov. 7, 1994).

Press Release, "Parkervision, Inc. Announces Fourth Quarter and Year End Results," Lippert/Heilshorn and Associates, 2 Pages (Mar. 1, 1995).

Press Release, "Parkervision, Inc. Announces Joint Product Developments With VTEL," Lippert/Heilshorn and Associates, 2 Pages (Mar. 21, 1995).

Press Release, "Parkervision, Inc. Announces First Quarter Financial Results," Lippert/Heilshorn and Associates, 3 Pages (Apr. 28, 1995).

Press Release, "Parkervision Wins Top 100 Product Districts' Choice Award," Parkervision Marketing and Manufacturing Headquarters, 1 Page (Jun. 29, 1995).

Press Release, "Parkervision National Sales Manager Next President of USDLA," Parkervision Marketing and Manufacturing Headquarters, 1 Page (Jul. 6, 1995).

Press Release, "Parkervision Granted New Patent," Parkervision Marketing and Manufacturing Headquarters, 1 Page (Jul. 21, 1995).

Press Release, "Parkervision, Inc. Announces Second Quarter and Six Months Financial Results," Parkervision Marketing and Manufacturing Headquarters, 2 Pages (Jul. 31, 1995).

Press Release, "Parkervision, Inc. Expands Its Cameraman System II Product Line," Parkervision Marketing and Manufacturing Headquarters, 2 Pages (Sep. 22, 1995).

Press Release, "Parkervision Announces New Camera Control Technology," Parkervision Marketing and Manufacturing Headquarters, 2 Pages (Oct. 25, 1995).

Press Release, "Parkervision, Inc. Announces Completion of VTEL/Parkervision Joint Product Line," Parkervision Marketing and Manufacturing Headquarters, 2 Pages (Oct. 30, 1995).

Press Release, "Parkervision, Inc. Announces Third Quarter and Nine Months Financial Results," Parkervision Marketing and Manufacturing Headquarters, 2 Pages (Oct. 30, 1995).

Press Release, "Parkervision's Cameraman Personal Locator Camera System Wins Telecon XV Award," Parkervision Marketing and Manufacturing Headquarters, 2 Pages (Nov. 1, 1995).

Press Release, "Parkervision, Inc. Announces Purchase Commitment From VTEL Corporation," Parkervision Marketing and Manufacturing Headquarters, 1 Page (Feb. 26, 1996).

Press Release, "ParkerVision, Inc. Announces Fourth Quarter and Year End Results," Parkervision Marketing and Manufacturing Headquarters, 2 Pages (Feb. 27, 1996).

Press Release, "ParkerVision, Inc. Expands its Product Line," Parkervision Marketing and Manufacturing Headquarters, 2 Pages (Mar. 7, 1996).

Press Release, "ParkerVision Files Patents for its Research of Wireless Technology," Parkervision Marketing and Manufacturing Headquarters, 1 Page (Mar. 28, 1996).

Press Release, "Parkervision, Inc. Announces First Significant Sale of Its Cameraman® Three-Chip System," Parkervision Marketing and Manufacturing Headquarters, 2 pages (Apr. 12, 1996).

Press Release, "Parkervision, Inc. Introduces New Product Line For Studio Production Market," Parkervision Marketing and Manufacturing Headquarters, 2 Pages (Apr. 15, 1996).

Press Release, "Parkervision, Inc. Announces Private Placement of 800,000 Shares," Parkervision Marketing and Manufacturing Headquarters, 1 Page (Apr. 15, 1996).

Press Release, "Parkervision, Inc. Announces First Quarter Financial Results," Parkervision Marketing and Manufacturing Headquarters, 3 Pages (Apr. 30, 1996).

Press Release, "ParkerVision's New Studio Product Wins Award," Parkervision Marketing and Manufacturing Headquarters, 2 Pages (Jun. 5, 1996).

Press Release, "Parkervision, Inc. Announces Second Quarter and Six Months Financial Results," Parkervision Marketing and Manufacturing Headquarters, 3 Pages (Aug. 1, 1996).

Press Release, "Parkervision, Inc. Announces Third Quarter and Nine Months Financial Results," Parkervision Marketing and Manufacturing Headquarters, 2 Pages (Oct. 29, 1996).

Press Release, "PictureTel and ParkerVision Sign Reseller Agreement," Parkervision Marketing and Manufacturing Headquarters, 2 Pages (Oct. 30, 1996).

Press Release, "CLI and ParkerVision Bring Enhanced Ease-of-Use to Videoconferencing," CLI/Parkervision, 2 Pages (Jan. 20, 1997).

Press Release, "Parkervision, Inc. Announces Fourth Quarter and Year End Results," Parkervision Marketing and Manufacturing Headquarters, 3 Pages (Feb. 27, 1997).

Press Release, "Parkervision, Inc. Announces First Quarter Financial Results," Parkervision Marketing and Manufacturing Headquarters, 3 Pages (Apr. 29, 1997).

Press Release, "NEC and Parkervision Make Distance Learning Closer," NEC America, 2 Pages (Jun. 18, 1997).

Press Release, "Parkervision Supplies JPL with Robotic Cameras, Cameraman Shot Director for Mars Mission," Parkervision Marketing and Manufacturing Headquarters, 2 pages (Jul. 8, 1997).

Press Release, "ParkerVision and IBM Join Forces to Create Wireless Computer Peripherals," Parkervision Marketing and Manufacturing Headquarters, 2 Pages (Jul. 23, 1997).

Press Release, "ParkerVision, Inc. Announces Second Quarter and Six Months Financial Results," Parkervision Marketing and Manufacturing Headquarters, 3 Pages (Jul. 31, 1997).

Press Release, "Parkervision, Inc. Announces Private Placement of 990,000, Shares," Parkervision Marketing and Manufacturing Headquarters, 2 Pages (Sep. 8, 1997).

Press Release, "Wal-Mart Chooses Parkervision for Broadcast Production," Parkervision Marketing and Manufacturing Headquarters, 2 Pages (Oct. 24, 1997).

Press Release, "Parkervision, Inc. Announces Third Quarter Financial Results," Parkervision Marketing and Manufacturing Headquarters, 3 Pages (Oct. 30, 1997).

Press Release, "ParkerVision Announces Breakthrough in Wireless Radio Frequency Technology," Parkervision Marketing and Manufacturing Headquarters, 3 Pages (Dec. 10, 1997).

Press Release, "Parkervision, Inc. Announces the Appointment of Joseph F. Skovron to the Position of Vice President, Licensing—Wireless Technologies," Parkervision Marketing and Manufacturing Headquarters, 2 Pages (Jan. 9, 1998).

Press Release, "Parkervision Announces Existing Agreement with IBM Terminates—Company Continues with Strategic Focus Announced in December," Parkervision Marketing and Manufacturing Headquarters, 2 Pages (Jan. 27, 1998).

Press Release, "Laboratory Tests Verify Parkervision Wireless Technology," Parkervision Marketing and Manufacturing Headquarters, 2 Pages (Mar. 3, 1998).

Press Release, "Parkervision, Inc. Announces Fourth Quarter and Year End Financial Results," Parkervision Marketing and Manufacturing Headquarters, 3 Pages (Mar. 5, 1998).

Press Release, "Parkervision Awarded Editor's Pick of Show for NAB 98," Parkervision Marketing and Manufacturing Headquarters, 2 Pages (Apr. 15, 1998).

Press Release, "Parkervision Announces First Quarter Financial Results," Parkervision Marketing and Manufacturing Headquarters, 3 Pages (May 4, 1998).

Press Release, "Parkervision 'DIRECT2DATA' Introduced in Response to Market Demand," Parkervision Marketing and Manufacturing Headquarters, 3 Pages (Jul. 9, 1998).

Press Release, "Parkervision Expands Senior Management Team," Parkervision Marketing and Manufacturing Headquarters, 2 Pages (Jul. 29, 1998).

Press Release, "Parkervision Announces Second Quarter and Six Month Financial Results," Parkervision Marketing and Manufacturing Headquarters, 4 Pages (Jul. 30, 1998).

Press Release, "Parkervision Announces Third Quarter and Nine Month Financial Results," Parkervision Marketing and Manufacturing Headquarters, 3 Pages (Oct. 30, 1998).

Press Release, "Questar Infocomm, Inc. Invests $5 Million in Parkervision Common Stock," Parkervision Marketing and Manufacturing Headquarters, 3 Pages (Dec. 2, 1998).

Press Release, "Parkervision Adds Two New Directors," Parkervision Marketing and Manufacturing Headquarters, 2 Pages (Mar. 5, 1999).

Press Release, "Parkervision Announces Fourth Quarter and Year End Financial Results," Parkervision Marketing and Manufacturing Headquarters, 3 Pages (Mar. 5, 1999).

Press Release, "Joint Marketing Agreement Offers New Automated Production Solution," Parkervision Marketing and Manufacturing Headquarters, 2 Pages (Apr. 13, 1999).

"Project Cost 205: Scintillations in Earth-satellite links," *Alta Frequenza: Scientific Review in Electronics*, AEI, vol. LIV, No. 3, pp. 209-211 (May-Jun. 1985).

Razavi, B., *RF Microelectronics*, Prentice-Hall, pp. 147-149 (1998).

Reeves, R.J.D., "The Recording and Collocation of Waveforms (Part 1)," *Electronic Engineering*, Morgan Brothers Limited, vol. 31, No. 373, pp. 130-137 (Mar. 1959).

Reeves, R.J.D., "The Recording and Collocation of Waveforms (Part 2)," *Electronic Engineering*, Morgan Brothers Limited, vol. 31, No. 374, pp. 204-212 (Apr. 1959).

Rein, H.M. and Zahn, M., "Subnanosecond-Pulse Generator with Variable Pulsewidth Using Avalanche Transistors," *Electronics Letters*, IEE, vol. 11, No. 1, pp. 21-23 (Jan. 9, 1975).

Riad, S.M. and Nahman, N.S., "Modeling of the Feed-through Wideband (DC to 12.4 Ghz) Sampling-Head," *IEEE MTT-S International Microwave Symposium Digest*, IEEE, pp. 267-269 (Jun. 27-29, 1978).

Rizzoli, V. et al., "Computer-Aided Noise Analysis of MESFET and HEMT Mixers," *IEEE Transactions on Microwave Theory and Techniques*, IEEE, vol. 37, No. 9, pp. 1401-1410 (Sep. 1989).

Rowe, H.E., *Signals and Noise in Communication Systems*, D. Van Nostrand Company, Inc., Princeton, New Jersey, including, for example, Chapter V, Pulse Modulation Systems (1965).

Rücker, F. and Dintelmann, F., "Effect of Antenna Size on OTS Signal Scintillations and Their Seasonal Dependence," *Electronics Letters*, IEE, vol. 19, No. 24, pp. 1032-1034 (Nov. 24, 1983).

Russell, R. and Hoare, L., "Millimeter Wave Phase Locked Oscillators," *Military Microwaves '78 Conference Proceedings*, Microwave Exhibitions and Publishers, pp. 238-242 (Oct. 25-27, 1978).

Sabel, L.P., "A DSP Implementation of a Robust Flexible Receiver/Demultiplexer for Broadcast Data Satellite Communications," *The Institution of Engineers Australia Communications Conference*, Institute of Engineers, Australia, pp. 218-223 (Oct. 16-18, 1990).

Salous, S., "IF digital generation of FMCW waveforms for wideband channel characterization," *IEE Proceedings-I*, IEE, vol. 139, No. 3, pp. 281-288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched-Capacitor Biquad," *Proceedings of the IEEE*, IEEE, vol. 71, No. 8, pp. 1008-1009 (Aug. 1983).

Saul, P.H., "A GaAs MESFET Sample and Hold Switch," *Fifth European Solid State Circuits Conference—ESSCIRC 79*, IEE, pp. 5-7 (1979).

Shen, D.H. et al., "A 900-MHZ RF Front-End with Integrated Discrete-Time Filtering," *IEEE Journal of Solid-State Circuits*, IEEE Solid-State Circuits Council, vol. 31, No. 12, pp. 1945-1954 (Dec. 1996).

Shen, X.D. and Vilar, E., "Anomalous transhorizon propagation and meteorological processes of a multilink path," *Radio Science*, American Geophysical Union, vol. 30, No. 5, pp. 1467-1479 (Sep.-Oct. 1995).

Shen, X. and Tawfik, A.N., "Dynamic Behaviour of Radio Channels Due to Trans-Horizon Propagation Mechanisms," *Electronics Letters*, IEE, vol. 29, No. 17, pp. 1582-1583 (Aug. 19, 1993).

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1-4/7 (Mar. 8, 1996).

Shen, X. and Vilar, E., "Path loss statistics and mechanisms of transhorizon propagation over a sea path," *Electronics Letters*, IEE, vol. 32, No. 3, pp. 259-261 (Feb. 1, 1996).

Shen, D. et al., "A 900 MHZ Integrated Discrete-Time Filtering RF Front-End," *IEEE International Solid State Circuits Conference*, IEEE, vol. 39, pp. 54-55 and 417 (Feb. 1996).

Spillard, C. et al., "X-Band Tropospheric Transhorizon Propagation Under Differing Meteorological Conditions," *Sixth International Conference on Antennas and Propagation (ICAP 89) Part 2: Propagation*, IEE, pp. 451-455 (Apr. 4-7, 1989).

Stafford, K.R. et al., "A Complete Monolithic Sample/Hold Amplifier," *IEEE Journal of Solid-State Circuits*, IEEE, vol. SC-9, No. 6, pp. 381-387 (Dec. 1974).

Staruk, W. Jr. et al., "Pushing HF Data Rates," *Defense Electronics*, EW Communications, vol. 17, No. 5, pp. 211, 213, 215, 217, 220 and 222 (May 1985).

Stephenson, A.G., "Digitizing multiple RF signals requires an optimum sampling rate," *Electronics*, McGraw-Hill, pp. 106-110 (Mar. 27, 1972).

Sugarman, R., "Sampling Oscilloscope for Statistically Varying Pulses," *The Review of Scientific Instruments*, American Institute of Physics, vol. 28, No. 11, pp. 933-938 (Nov. 1957).

Sylvain, M., "Experimental probing of multipath microwave channels," *Radio Science*, American Geophysical Union, vol. 24, No. 2, pp. 160-178 (Mar.-Apr. 1989).

Takano, T., "Novel GaAs Pet Phase Detector Operable To Ka Band," *IEEE MT-S Digest*, IEEE, pp. 381-383 (1984).

Tan, M.A., "Biquadratic Transconductance Switched-Capacitor Filters," *IEEE Transactions on Circuits and Systems-1: Fundamental Theory and Applications*, IEEE Circuits and Systems Society, vol. 40, No. 4, pp. 272-275 (Apr. 1993).

Tanaka, K. et al., "Single Chip Multisystem AM Stereo Decoder IC," *IEEE Transactions on Consumer Electronics*, IEEE Consumer Electronics Society, vol. CE-32, No. 3, pp. 482-496 (Aug. 1986).

Tawfik, A.N., "Amplitude, Duration and Predictability of Long Hop Trans-Horizon X-band Signals Over the Sea," *Electronics Letters*, IEE, vol. 28, No. 6, pp. 571-572 (Mar. 12, 1992).

Tawfik, A.N. and Vilar, E., "Correlation of Transhorizon Signal Level Strength with Localized Surface Meteorological Parameters," *Eighth International Conference on Antennas and Propagation*, Electronics Division of the IEE, pp. 335-339 (Mar. 30-Apr. 2, 1993).

Tawfik, A.N. and Vilar, E., "Dynamic Structure of a Transhorizon Signal at X-band Over a Sea Path," *Sixth International Conference on Antennas and Propagation (ICAP 89) Part 2: Propagation*, IEE, pp. 446-450 (Apr. 4-7, 1989).

Tawfik, A.N. and Vilar, E., "Statistics of Duration and Intensity of Path Loss in a Microwave Transhorizon Sea-Path," *Electronics Letters*, IEE, vol. 26, No. 7, pp. 474-476 (Mar. 29, 1990).

Tawfik, A.N. and Vilar, E., "X-Band Transhorizon Measurements of CW Transmissions Over the Sea- Part 1: Path Loss, Duration of Events, and Their Modeling," *IEEE Transactions on Antennas and Propagation*, IEEE Antennas and Propagation Society, vol. 41, No. 11, pp. 1491-1500 (Nov. 1993).

Temes, G.C. and Tsividis, T., "The Special Section on Switched-Capacitor Circuits," *Proceedings of the IEEE*, IEEE, vol. 71, No. 8, pp. 915-916 (Aug. 1983).

Thomas, G.B., *Calculus and Analytic Geometry*, Third Edition, Addison-Wesley Publishing, pp. 119-133 (1960).

Tomassetti, Q., "An Unusual Microwave Mixer," $16^{th}$ *European Microwave Conference*, Microwave Exhibitions and Publishers, pp. 754-759 (Sep. 8-12, 1986).

Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1-3 (Jan. 1984).

Tsividis, Y. and Antognetti, P. (Ed.), *Design of MOS VLSI Circuits for Telecommunications*, Prentice-Hall, p. 304 (1985).

Tsividis, Y., "Principles of Operation and Analysis of Switched-Capacitor Circuits," *Proceedings of the IEEE*, IEEE, vol. 71, No. 8, pp. 926-940 (Aug. 1983).

Tsurumi, H. and Maeda, T., "Design Study on a Direct Conversion Receiver Front-End for 280 MHZ, 900 MHZ, and 2.6 Ghz Band Radio Communication Systems," $41^{st}$ *IEEE Vehicular Technology Conference*, IEEE Vehicular Technology Society, pp. 457-462 (May 19-22, 1991).

Valdmanis, J.A. et al., "Picosecond and Subpicosend Optoelectronics for Measurements of Future High Speed Electronic Devices," *IEDM Technical Digest*, IEEE, pp. 597-600 (Dec. 5-7, 1983).

van de Kamp, M.M.J.L., "Asymmetric signal level distribution due to tropospheric scintillation," *Electronics Letters*, IEE, vol. 34, No. 11, pp. 1145-1146 (May 28, 1998).

Vasseur, H. and Vanhoenacker, D., "Characterization of tropospheric turbulent layers from radiosonde data," *Electronics Letters*, IEE, vol. 34, No. 4, pp. 318-319 (Feb. 19, 1998).

Verdone, R., "Outage Probability Analysis for Short-Range Communication Systems at 60 Ghz in ATT Urban Environments," *IEEE Transactions on Vehicular Technology*, IEEE Vehicular Technology Society, vol. 46, No. 4, pp. 1027-1039 (Nov. 1997).

Vierira-Ribeiro, S.A., *Single-IF DECT Receiver Architecture using a Quadrature Sub-Sampling Band-Pass Sigma-Delta Modulator*, Thesis for Degree of Master's of Engineering, Carleton University, UMI Dissertation Services, pp. 1-180 (Apr. 1995).

Vilar, E. et al., "A Comprehensive/Selective MM-Wave Satellite Downlink Experiment on Fade Dynamics," *Tenth International Conference on Antennas and Propagation*, Electronics Division of the IEE, pp. 2.98-2.101 (Apr. 14-17, 1997).

Vilar, E. et al., "A System to Measure LOS Atmospheric Transmittance at 19 Ghz," *AGARD Conference Proceedings* No. 346: *Characterisitics of the Lower Atmosphere Influencing Radio Wave Propagation*, Agard, pp. 8-1-8-16 (Oct. 4-7, 1983).

Vilar, E. and Smith, H., "A Theoretical and Experimental Study of Angular Scintillations in Earth Space Paths," *IEEE Transactions on Antennas and Propagation*, IEEE, vol. AP-34, No. 1, pp. 2-10 (Jan. 1986).

Vilar, E. et al., "A Wide Band Transhorizon Experiment at 11.6 Ghz," *Eighth International Conference on Antennas and Propagation*, Electronics Division of the IEE, pp. 441-445 (Mar. 30-Apr. 2, 1993).

Vilar, E. and Matthews, P.A., "Amplitude Dependence of Frequency in Oscillators," *Electronics Letters*, IEE, vol. 8, No. 20, pp. 509-511 (Oct. 5, 1972).

Vilar, E. et al., "An experimental mm-wave receiver system for measuring phase noise due to atmospheric turbulence," *Proceedings of the $25^{th}$ European Microwave Conference*, Nexus House, pp. 114-119 (1995).

Vilar, E. and Burgueño, A., "Analysis and Modeling of Time Intervals Between Rain Rate Exceedances in the Context of Fade Dynamics," *IEEE Transactions on Communications*, IEEE Communications Society, vol. 39, No. 9, pp. 1306-1312 (Sep. 1991).

Vilar, E. et al., "Angle of Arrival Fluctuations in High and Low Elevation Earth Space Paths," *Fourth International Conference on Antennas and Propagation (ICAP 85)*, Electronics Division of the IEE, pp. 83-88 (Apr. 16-19, 1985).

Vilar, E., "Antennas and Propagation: A Telecommunications Systems Subject," *Electronics Division Colloquium on Teaching Antennas and Propagation to Undergraduates*, IEE, pp. 7/1-7/6 (Mar. 8, 1988).

Vilar, E. et al., "CERS* Millimetre-Wave Beacon Package and Related Payload Doppler Correction Strategies," *Electronics Division Colloquium on CERS- Communications Engineering Research Satellite*, IEE, pp. 10/1-10/10 (Apr. 10, 1984).

Vilar, E. and Moulsley, T.J., "Comment and Reply: Probability Density Function of Amplitude Scintillations," *Electronics Letters*, IEE, vol. 21, No. 14, pp. 620-622 (Jul. 4, 1985).

Vilar, E. et al., "Comparison of Rainfall Rate Duration Distributions for ILE-IFE and Barcelona," *Electronics Letters*, IEE, vol. 28, No. 20, pp. 1922-1924 (Sep. 24, 1992).

Vilar, E., "Depolarization and Field Transmittances in Indoor Communications," *Electronics Letters*, IEE, vol. 27, No. 9, pp. 732-733 (Apr. 25, 1991).

Vilar, E. and Larsen, J.R., "Elevation Dependence of Amplitude Scintillations on Low Elevation Earth Space Paths," *Sixth International Conference on Antennas and Propagation (ICAP 89) Part 2: Propagation*, IEE, pp. 150-154 (Apr. 4-7, 1989).

Vilar, E. et al., "Experimental System and Measurements of Transhorizon Signal Levels at 11 Ghz," $18^{th}$ *European Microwave Conference*, Microwave Exhibitions and Publishers Ltd., pp. 429-435 (Sep. 12-15, 1988).

Vilar, E. and Matthews, P.A., "Importance of Amplitude Scintillations in Millimetric Radio Links," *Proceedings of the $4^{th}$ European Microwave Conference*, Microwave Exhibitions and Publishers, pp. 202-206 (Sep. 10-13, 1974).

Vilar, E. and Haddon, J., "Measurement and Modeling of Scintillation Intensity to Estimate Turbulence Parameters in an Earth-Space Path," *IEEE Transactions on Antennas and Propagation*, IEEE Antennas and Propagation Society, vol. AP-32, No. 4, pp. 340-346 (Apr. 1984).

Vilar, E. and Matthews, P.A., "Measurement of Phase Fluctuations on Millimetric Radiowave Propagation," *Electronics Letters*, IEE, vol. 7, No. 18, pp. 566-568 (Sep. 9, 1971).

Vilar, E. and Wan, K.W., "Narrow and Wide Band Estimates of Field Strength for Indoor Communications in the Millimetre Band,"

*Electronics Division Colloquium on Radiocommunications in the Range 30-60 Ghz*, IEE, pp. 5/1-5/8 (Jan. 17, 1991).

Vilar, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).

Vilar, E. and Senin, S., "Propagation phase noise identified using 40 Ghz satellite downlink," *Electronics Letters*, IEE, vol. 33, No. 22, pp. 1901-1902 (Oct. 23, 1997).

Vilar, E. et al., "Scattering and Extinction: Dependence Upon Raindrop Size Distribution in Temperate (Barcelona) and Tropical (Belem) Regions," *Tenth International Conference on Antennas and Propagation*, Electronic Division of the IEE, pp. 2.230-2.233 (Apr. 14-17, 1997).

Vilar, E. and Haddon, J., "Scintillation Modeling and Measurement—A Tool for Remote-Sensing Slant Paths," *AGARD Conference Proceedings No. 332: Propagation Aspects of Frequency Sharing, Interference And System Diversity*, AGARD, pp. 27-1-27-13 (Oct. 18-22, 1982).

Vilar, E., "Some Limitations on Digital Transmission Through Turbulent Atmosphere," *International Conference on Satellite Communication Systems Technology*, Electronics Division of the IEE, pp. 169-187 (Apr. 7-10, 1975).

Vilar, E. and Matthews, P.A., "Summary of Scintillation Observations in a 36 Ghz Link Across London," *International Conference on Antennas and Propagation Part 2: Propagation*, IEE, pp. 36-40 (Nov. 28-30, 1978).

Vilar, E. et al., "Wideband Characterization of Scattering Channels," *Tenth International Conference on Antennas and Propagation*, Electronics Division of the IEE, pp. 2.353-2.358 (Apr. 14-17, 1997).

Vollmer, A., "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1-11 (Nov. 1986).

Wan, K.W. et al., "A Novel Approach to the Simultaneous Measurement of Phase and Amplitude Noises in Oscillator," *Proceedings of the 19th European Microwave Conference*, Microwave Exhibitions and Publishers Ltd., pp. 809-813 (Sep. 4-7, 1989).

Wan, K.W. et al., "Extended Variances and Autoregressive/Moving Average Algorithm for the Measurement and Synthesis of Oscillator Phase Noise," *Proceedings Of the 43rd Annual Symposium on Frequency Control*, IEEE, pp. 331-335 (1989).

Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1-3/5 (Dec. 3, 1993).

Wang, H., "A 1-V Multigigahertz RF Mixer Core in 0.5—μm CMOS," *IEEE Journal of Solid-State Circuits*, IEEE Solid-State Circuits Society, vol. 33, No. 12, pp. 2265-2267 (Dec. 1998).

Watson, A.W.D. et al., "Digital Conversion and Signal Processing for High Performance Communications Receivers," *Digital Processing of Signals in Communications*, Institution of Electronic and Radio Engineers, pp. 367-373 (Apr. 22-26, 1985).

Weast, R.C. et al. (Ed.), *Handbook of Mathematical Tables*, Second Edition, The Chemical Rubber Co., pp. 480-485 (1964).

Wiley, R.G., "Approximate FM Demodulation Using Zero Crossings," *IEEE Transactions on Communications*, IEEE, vol. COM-29, No. 7, pp. 1061-1065 (Jul. 1981).

Worthman, W., "Convergence . . . Again," *RF Design*, Primedia, p. 102 (Mar. 1999).

Young, I.A. and Hodges, D.A., "MOS Switched-Capacitor Analog Sampled-Data Direct-Form Recursive Filters," *IEEE Journal of Solid-State Circuits*, IEEE, vol. SC-14, No. 6, pp. 1020-1033 (Dec. 1979).

Translation of Specification and Claims of FR Patent No. 2245130, 3 pages.

Fest, Jean-Pierre, "Le Convertisseur A/N Revolutionne Le Recepteur Radio," *Electronique*, JMJ (Publisher), No. 54, pp. 40-42 (Dec. 1995).

Translation of DE Patent No. 35 41 031 A1, 22 pages.

Translation of EP Patent No. 0 732 803 A1, 9 pages.

Fest, Jean-Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages.

Miki, S. and Nagahama, R., *Modulation System II*, Common Edition 7, Kyoritsu Publishing Co., Ltd., pp. 146-154 (Apr. 30, 1956).

Miki, S. and Nagahama, R., *Modulation System II*, Common Edition 7, Kyoritsu Publishing Co., Ltd., pp. 146-149 (Apr. 30, 1956). (Partial Translation of Doc. AQ51).

Rabiner, L.R. and Gold, B., *Theory And Application Of Digital Signal Processing*, Prentice-Hall, Inc., pp. xiii-xii and 40-46 (1975).

English-language Abstract of Japanese Patent Publication No. 08-032556, from http://www1.ipdl.jpo.go.jp, 2 Pages (Feb. 2, 1996—Date of publication of application).

English-language Abstract of Japanese Patent Publication No. 08-139524, from http://www1.ipdl.jpo.go.jp, 2 Pages (May 31, 1996—Date of publication of application).

English-language Abstract of Japanese Patent Publication No. 59-144249, from http://www1.ipdl.jpo.go.jp, 2 Pages (Aug. 18, 1984—Date of publication of application).

English-language Abstract of Japanese Patent Publication No. 63-054002, from http://www1.ipdl.jpo.go.jp, 2 Pages (Mar. 8, 1988—Date of publication of application).

English-language Abstract of Japanese Patent Publication No. 06-237276, from http://www1.ipdl.jpo.go.jp, 2 Pages (Aug. 23, 1994—Date of publication of application).

English-language Abstract of Japanese Patent Publication No. 08-023359, from http://www1.ipdl.jpo.go.jp, 2 Pages (Jan. 23, 1996—Date of publication of application).

Translation of Japanese Patent Publication No. 47-2314, 7 pages.

Partial Translation of Japanese Patent Publication No. 58-7903, 3 pages.

English-language Abstract of Japanese Patent Publication No. 58-133004, from http://www1.ipdl.jpo.go.jp, 2 Pages (Aug. 8, 1993—Date of publication of application).

English-language Abstract of Japanese Patent Publication No. 60-058705, from http://www1.ipdl.jpo.go.jp, 2 Pages (Apr. 4, 1985—Date of publication of application).

English-language Abstract of Japanese Patent Publication No. 04-123614, from http://www1.ipdl.jpo.go.jp, 2 Pages (Apr. 23, 1992—Date of publication of application).

English-language Abstract of Japanese Patent Publication No. 04-127601, from http://www1.ipdl.jpo.go.jp, 2 Pages (Apr. 28, 1992—Date of publication of application).

English-language Abstract of Japanese Patent Publication No. 05-175730, from http://www1.ipdl.jpo.go.jp, 2 Pages (Jul. 13, 1993—Date of publication of application).

English-language Abstract of Japanese Patent Publication No. 05-175734, from http://www1.ipdl.jpo.go.jp, 2 Pages (Jul. 13, 1993—Date of publication of application).

English-language Abstract of Japanese Patent Publication No. 07-154344, from http://www1.ipdl.jpo.go.jp, 2 Pages (Jun. 16, 1995—Date of publication of application).

English-language Abstract of Japanese Patent Publication No. 07-307620, from http://www1.ipdl.jpo.go.jp, 2 Pages (Nov. 21, 1995—Date of publication of application).

Oppenheim, A.V. and Schafer, R.W., *Digital Signal Processing*, Prentice-Hall, pp. vii-x, 6-35, 45-78, 87-121 and 136-165 (1975).

English-language Abstract of Japanese Patent Publication No. 55-066057, from http://www1.ipdl.jpo.go.jp, 1 Page (May 19, 1980—Date of publication of application).

English-language Abstract of Japanese Patent Publication No. 63-065587, from http://www1.ipdl.jpo.go.jp, 1 Page (Mar. 24, 1988—Date of publication of application).

English-language Abstract of Japanese Patent Publication No. 63-153691, from http://www1.ipdl.jpo.go.jp, 1 Page (Jun. 27, 1988—Date of publication of application).

English-language Abstract of Japanese Patent Publication No. 60-130203, from http://www1.ipdl.jpo.go.jp, 1 Page Jul. 11, 1985—Date of publication of application).

Razavi, B., "A 900-MHz/1.8-Ghz CMOS Transmitter for Dual-Band Applications," *Symposium on VLSI Circuits Digest of Technical Papers*, IEEE, pp. 128-131 (1998).

Ritter, G.M., "SDA, A New Solution for Transceivers," *16th European Microwave Conference*, Microwave Exhibitions and Publishers, pp. 729-733 (Sep. 8 , 1986).

Dialog File 351 (Derwent WPI) English Language Patent Abstract for FR 2 669 787, 1 page (May 29, 1992- Date of publication of application).

Akos, D.M. et al., "Direct Bandpass Sampling of Multiple Distinct RF Signals," *IEEE Transactions on Communications*, IEEE, vol. 47, No. 7, pp. 983-988 (Jul. 1999).

Patel, M. et al., "Bandpass Sampling for Software Radio Receivers, and the Effect of Oversampling on Aperture Jitter," *VTC 2002*, IEEE, pp. 1901-1905 (2002).

English-language Abstract of Japanese Patent Publication No. 61-030821, from http://www1.ipdl.jpo.go.jp, 2 Pages (Feb. 13, 1986—Date of publication of application).

English-language Abstract of Japanese Patent Publication No. 05-327356, from http://www1.ipdl.jpo.go.jp, 2 Pages (Dec. 10, 1993—Date of publication of application).

Tayloe, D., "A Low-noise, High-performance Zero IF Quadrature Detector/Preamplifier," *RF Design*, Primedia Business Magazines & Media, Inc., pp. 58, 60, 62, and 69 (Mar. 2003).

Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117-120 (Apr. 1996).

Simoni, A. et al., "A Digital Camera for Machine Vision," *20th International Conference on Industrial Electronics, Control and Instrumentation*, IEEE, pp. 879-883 (Sep. 1994).

Stewart, R.W. and Pfann, E., "Oversampling and sigma-delta strategies for data conversion," *Electronics & Communication Engineering Journal*, IEEE, pp. 37-47 (Feb. 1998).

Rudell, J.C. et al., "A 1.9-Ghz Wide-Band IF Double Conversion CMOS Receiver for Cordless Telephone Applications," *IEEE Journal of Solid-State Circuits*, IEEE, vol. 32, No. 12, pp. 2071-2088 (Dec. 1997).

English-language Abstract of Japanese Patent Publication No. 09-036664, from http://www1.ipdl.jpo.go.jp, 2 Pages (Feb. 7, 1997—Date of publication of application).

Simoni, A. et al., "A Single-Chip Optical Sensor with Analog Memory for Motion Detection," *IEEE Journal of Solid-State Circuits*, IEEE, vol. 30, No. 7, pp. 800-806 (Jul. 1995).

English-language Computer Translation of Japanese Patent Publication No. JP 10-173563, provided by the JPO, 10 pages (Jun. 26, 1998—Date of publication of application) and cited in U.S. Appl. No. 10/305,299, directed to related subject matter.

*What is I/Q Data?*, printed Sep. 16, 2006, from http://zone.ni.com, 8 pages (Copyright 2003).

English-language Abstract of Japanese Patent Publication No. JP 61-232706, data supplied by the espacenet, 1 Page (Oct. 17, 1986—Date of publication of application).

English-language Abstract of Japanese Patent Publication No. JP 9-171399, data supplied by the espacenet, 1 Page (Jun. 30, 1997—Date of publication of application).

English-language Abstract of Japanese Patent Publication No. JP 10-41860, data supplied by the espacenet, 1 Page (Feb. 13, 1998—Date of publication of application).

English-language Translation of German Patent Publication No. DT 1936252, translation provided by Transperfect Translations, 12 pages (Jan. 28, 1971—Date of publication of application).

English-language Abstract of Japanese Patent Publication No. JP 62-12381, data supplied by the espacenet, 1 page (Jan. 21, 1987—Date of publication of application).

English-language Abstract of Japanese Patent Publication No. JP 4-154227, data supplied by the espacenet, 1 page (May 27, 1992—Date of publication of application).

English-language Abstract of Japanese Patent Publication No. JP 6-284038, data supplied by the espacenet, 1 page (Oct. 7, 1994—Date of publication of application).

English-language Abstract of Japanese Patent Publication No. JP 10-96778, data supplied by the espacenet, 1 page (Apr. 14, 1998—Date of publication of application).

English-language Abstract of Japanese Patent Publication No. JP 11-98205, data supplied by the espacenet, 1 page (Apr. 9, 1999—Date of publication of application).

Gaudiosi, J., "Retailers will bundle Microsoft's Xbox with games and peripherals," *Video Store Magazine*, vol. 23, Issue 36, p. 8, 2 pages (Sep. 2-8, 2001).

Hellwarth, G.A. and Jones, G.D, "Automatic Conditioning of Speech Signals," *IEEE Transactions on Audio and Electroacoustics*, vol. AU-16, No. 2, pp. 169-179 (Jun. 1968).

* cited by examiner

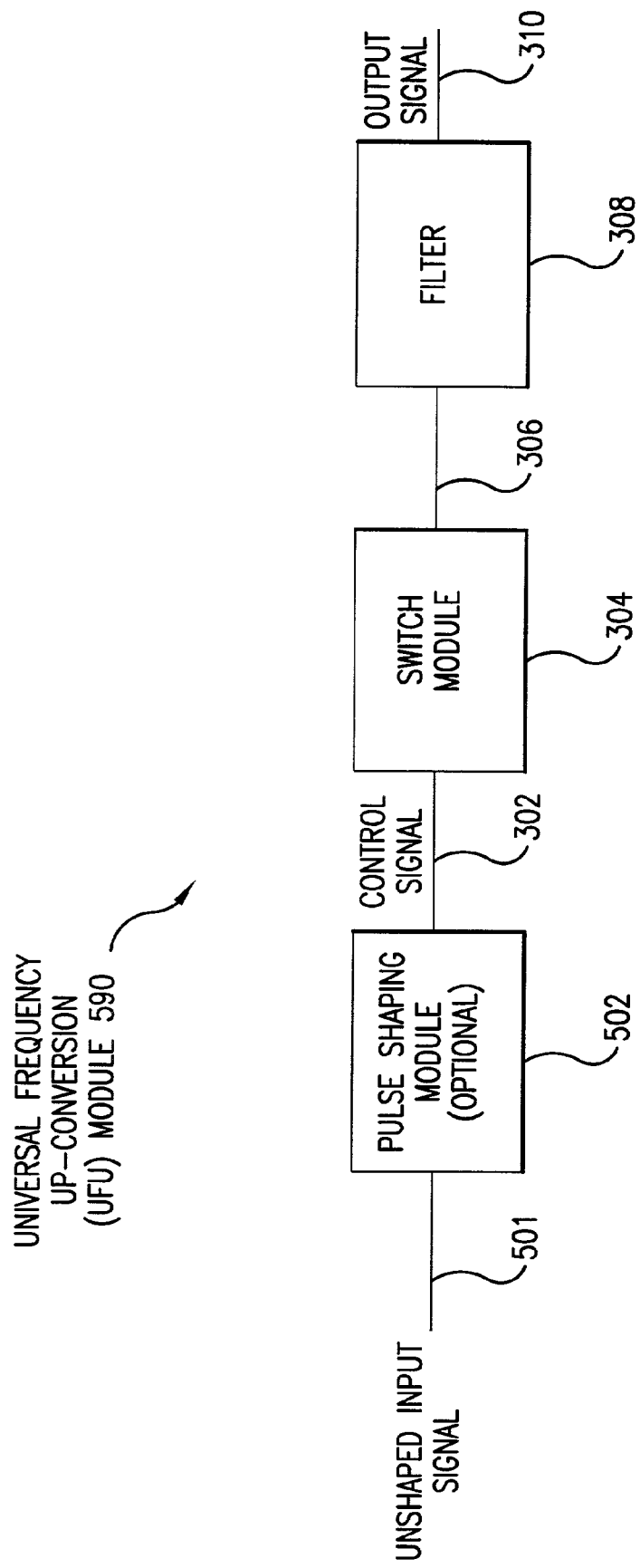

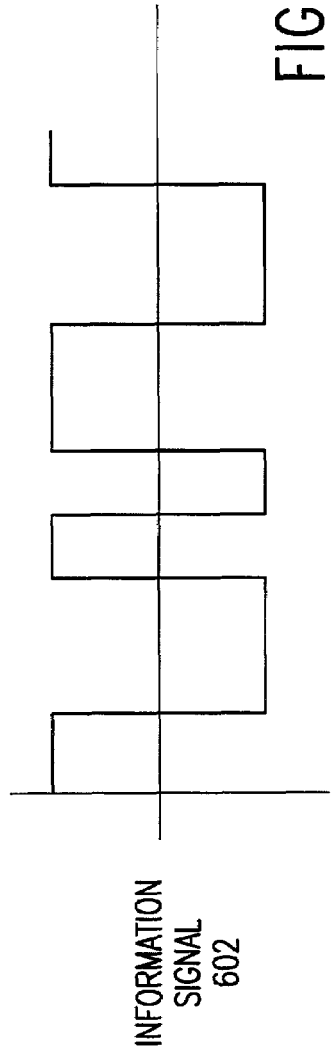
FIG. 6A
INFORMATION SIGNAL 602
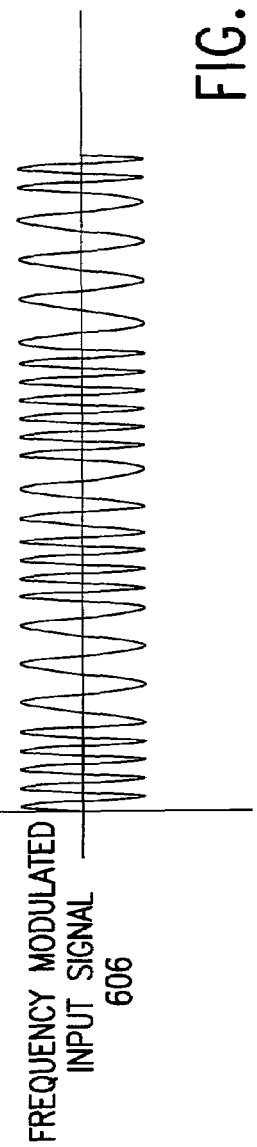
FIG. 6B
OSCILLATING SIGNAL 604
FIG. 6C
FREQUENCY MODULATED INPUT SIGNAL 606
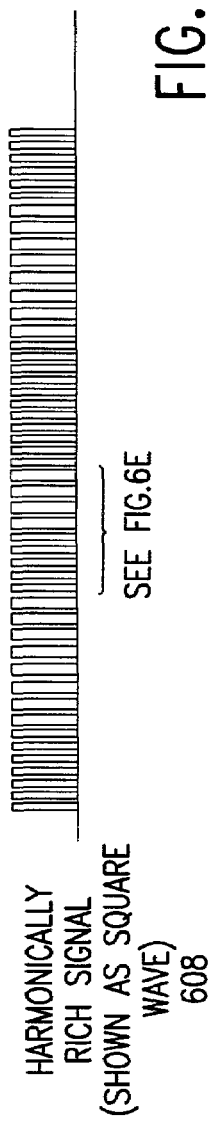
FIG. 6D
SEE FIG.6E
HARMONICALLY RICH SIGNAL (SHOWN AS SQUARE WAVE) 608

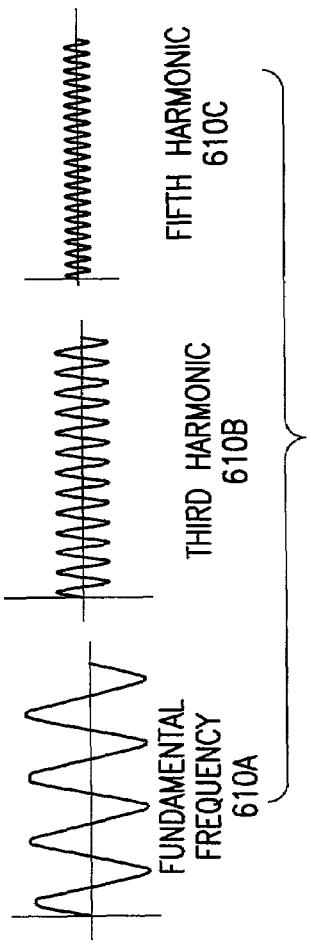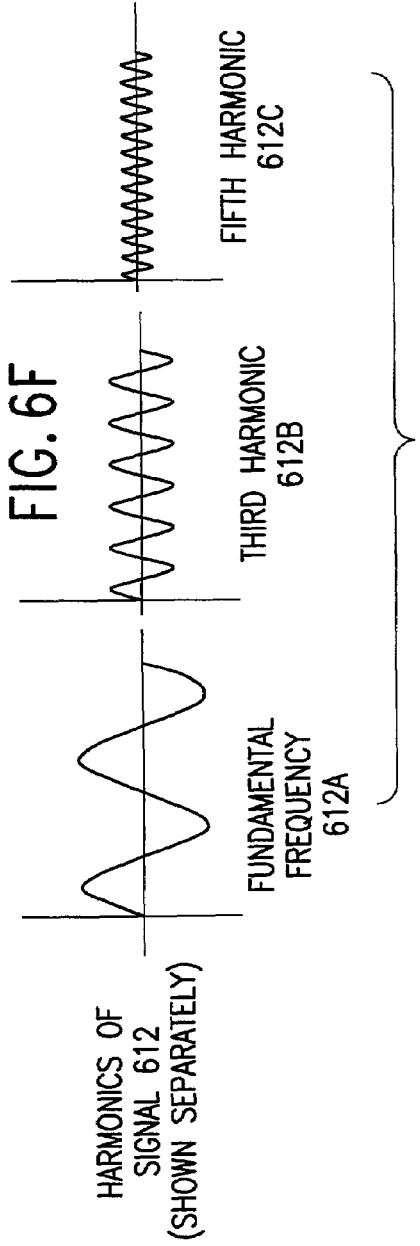

HARMONICS OF SIGNALS 610 AND 612 (SHOWN SIMULTANEOUSLY BUT NOT SUMMED)

FILTERED OUTPUT SIGNAL 614

| TIME / NODE | t-1 (RISING EDGE OF φ1) | t-1 (RISING EDGE OF φ2) | t (RISING EDGE OF φ1) | t (RISING EDGE OF φ2) | t+1 (RISING EDGE OF φ1) |
|---|---|---|---|---|---|
| 1902 | $vi_{t-1}$ 1804 | $vi_{t-1}$ 1808 | $vi_t$ 1816 | $vi_t$ 1826 | $vi_{t+1}$ 1838 |
| 1904 | — | $vi_{t-1}$ 1810 | $vi_{t-1}$ 1818 | $vi_t$ 1828 | $vi_t$ 1840 |
| 1906 | $vo_{t-1}$ 1806 | $vo_{t-1}$ 1812 | $vo_t$ 1820 | $vo_t$ 1830 | $vo_{t+1}$ 1842 |
| 1908 | — | $vo_{t-1}$ 1814 | $vo_{t-1}$ 1822 | $vo_t$ 1832 | $vo_t$ 1844 |
| 1910 | 1807 | — | $vo_{t-1}$ 1824 | $vo_{t-1}$ 1834 | $vo_t$ 1846 |
| 1912 | — | 1815 | — | $vo_{t-1}$ 1836 | $vo_{t-1}$ 1848 |
| 1918 | — | — | — | — | $vi_t - 0.1*vo_{t-1} - 0.8*vo_{t-1}$ 1850 |

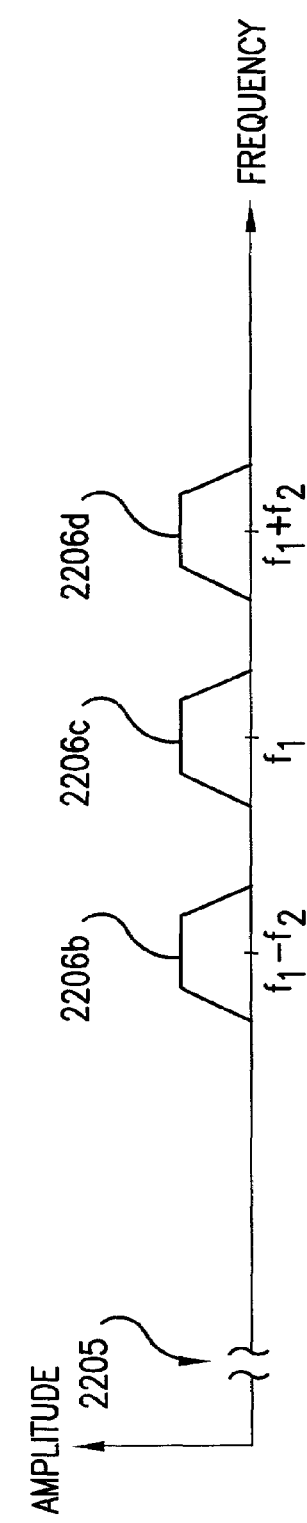
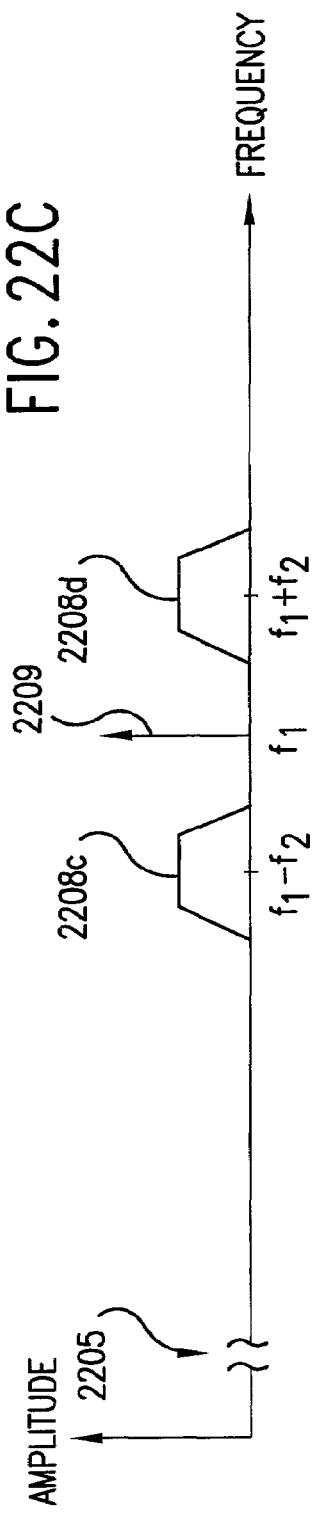

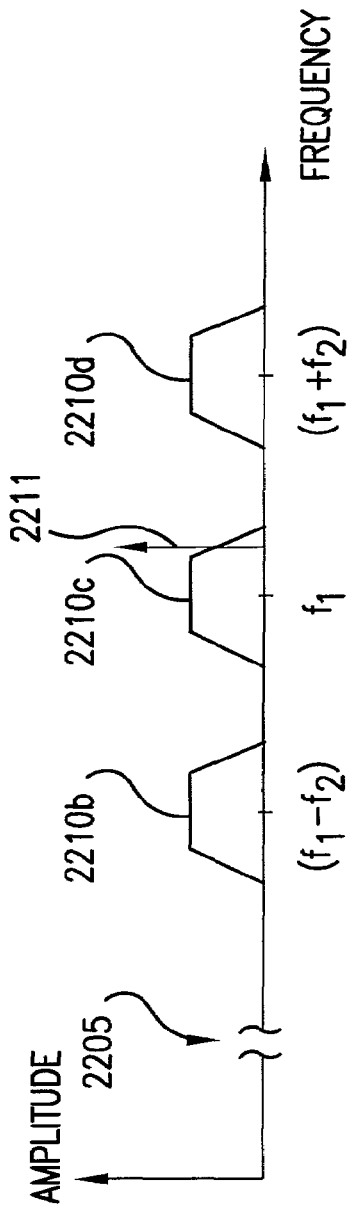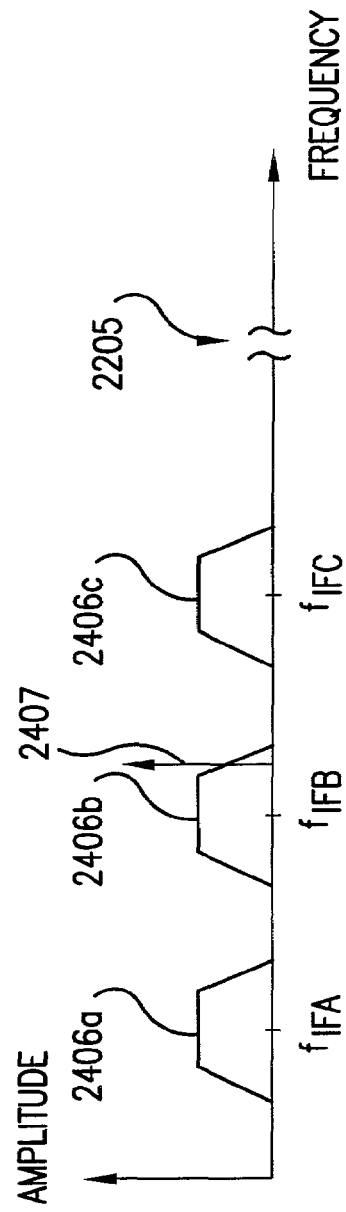

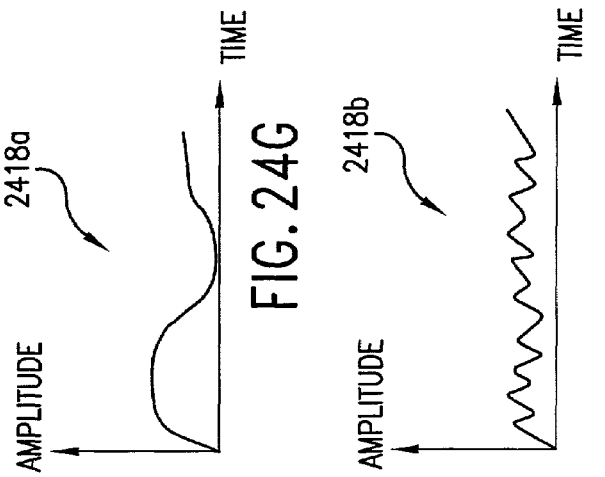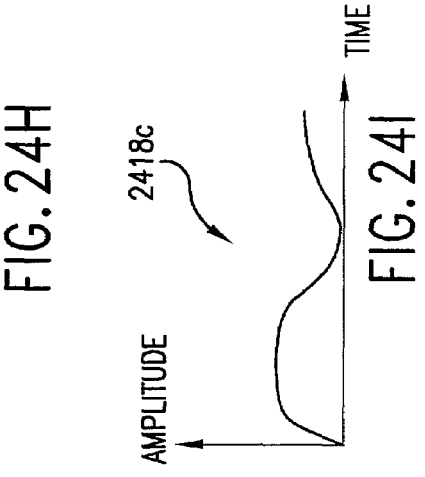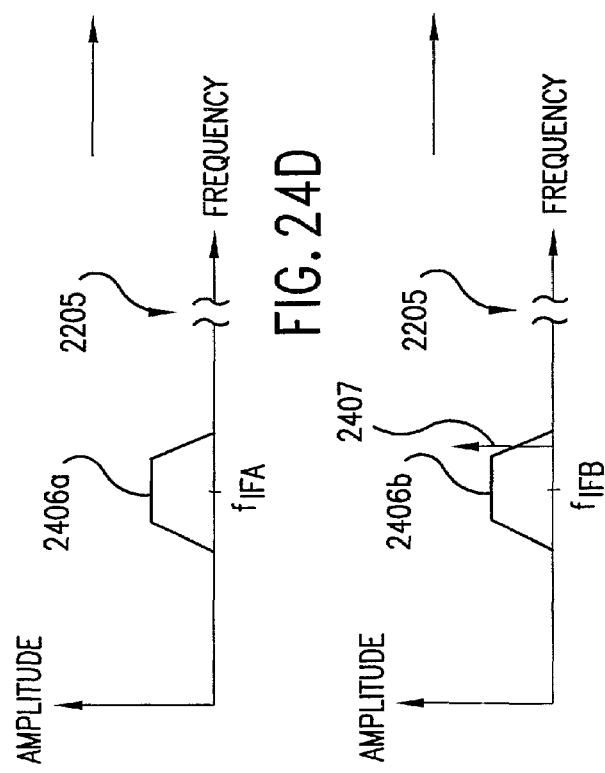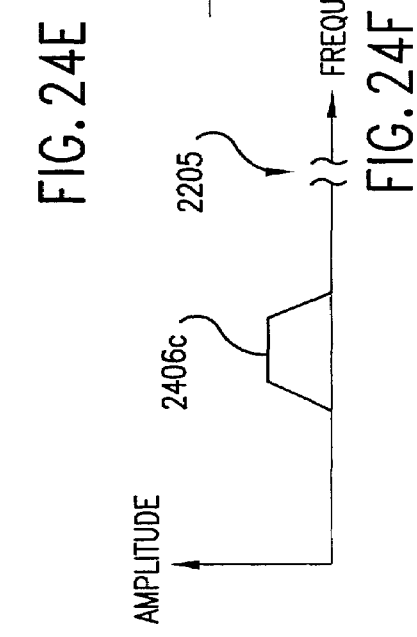

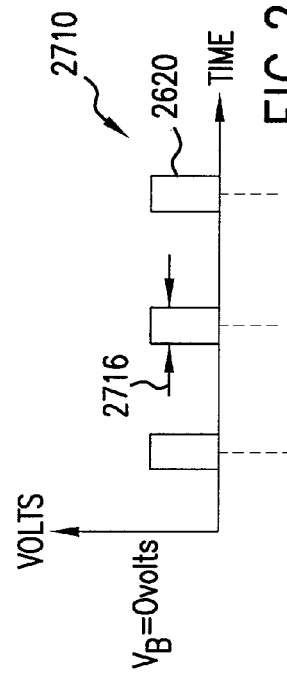
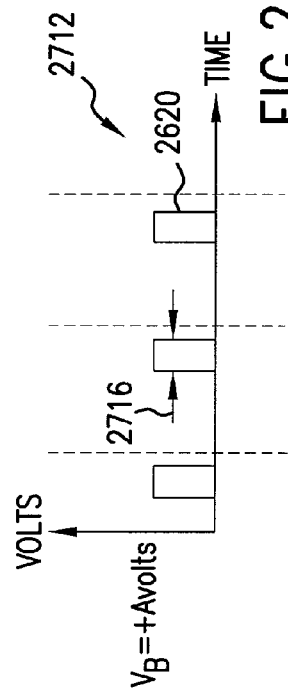
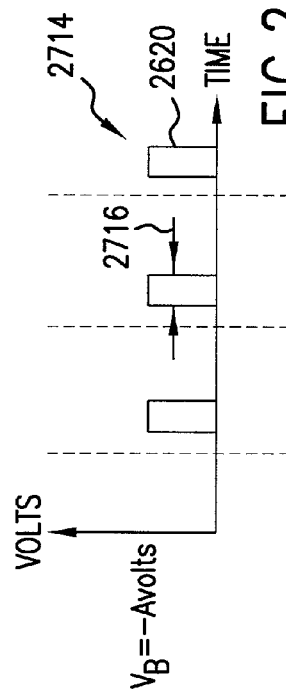
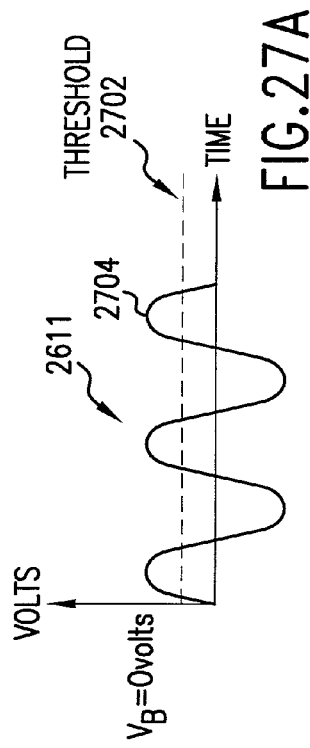
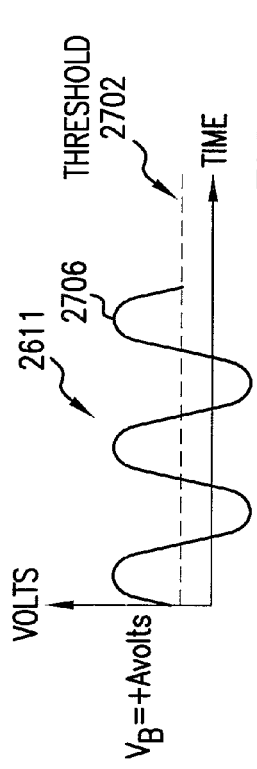
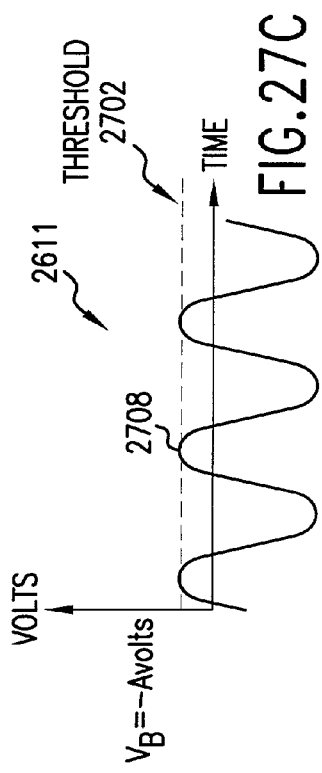

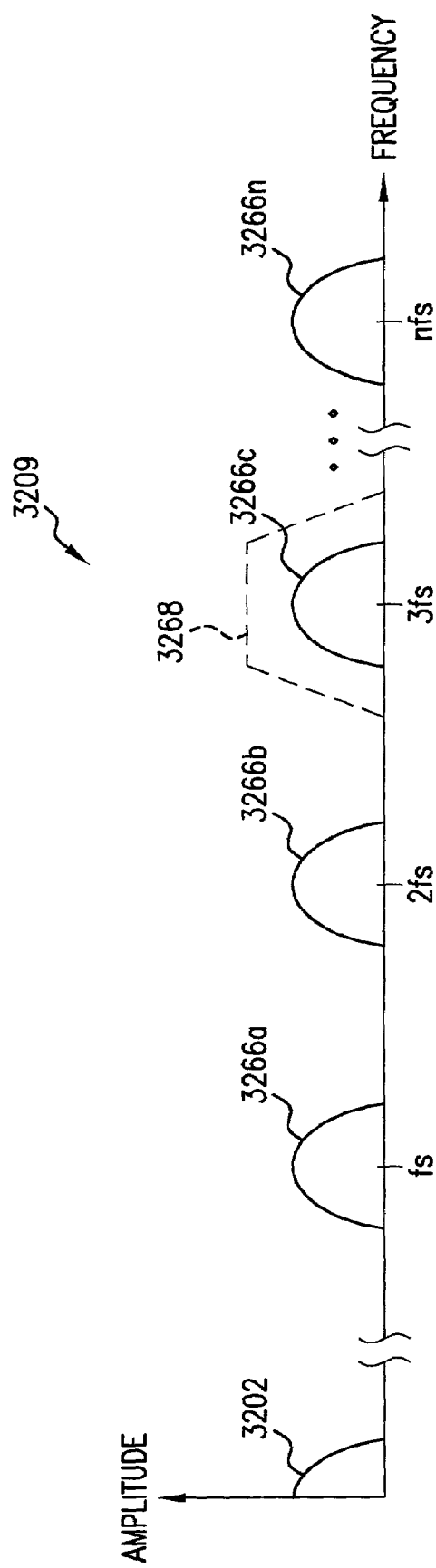

AN N-ELEMENT LINEAR ANTENNA ARRAY.

A LINEAR ARRAY OF FIVE HALF WAVE DIPOLES.

RADIATION PATTERN FOR THE LINEAR ARRAY.

ARRAY FACTOR FOR THE LINEAR ARRAY.

$\phi(\beta_{LO}) = 194.23 Ln(\beta_{LO}) - 138.33$ $fo(\beta_{LO}) = 67.142 e^{-1.5393 \rho_{LO}}$ $p(\beta_{LO}) = 3.591 Ln(\beta_{LO}) - 2.2856$

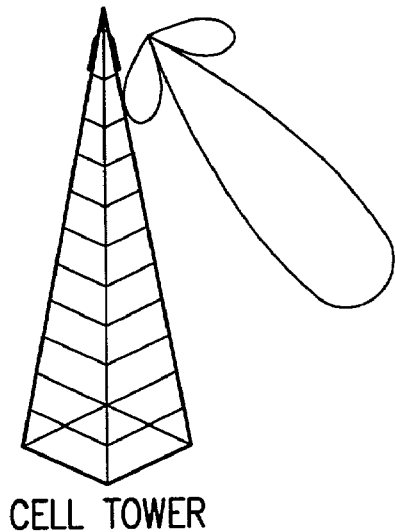
WHEN THE USER IS CLOSE TO THE TOWER, THEN THE MAIN BEAM CAN BE STEERED DOWNWARD.
CELL TOWER
FIG.80A
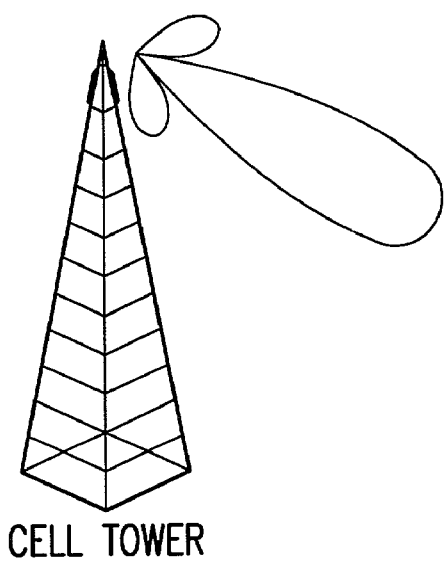
WHEN THE USER IS FAR FROM THE TOWER, THEN THE MAIN BEAM CAN BE STEERED UPWARD.
CELL TOWER
FIG.80B

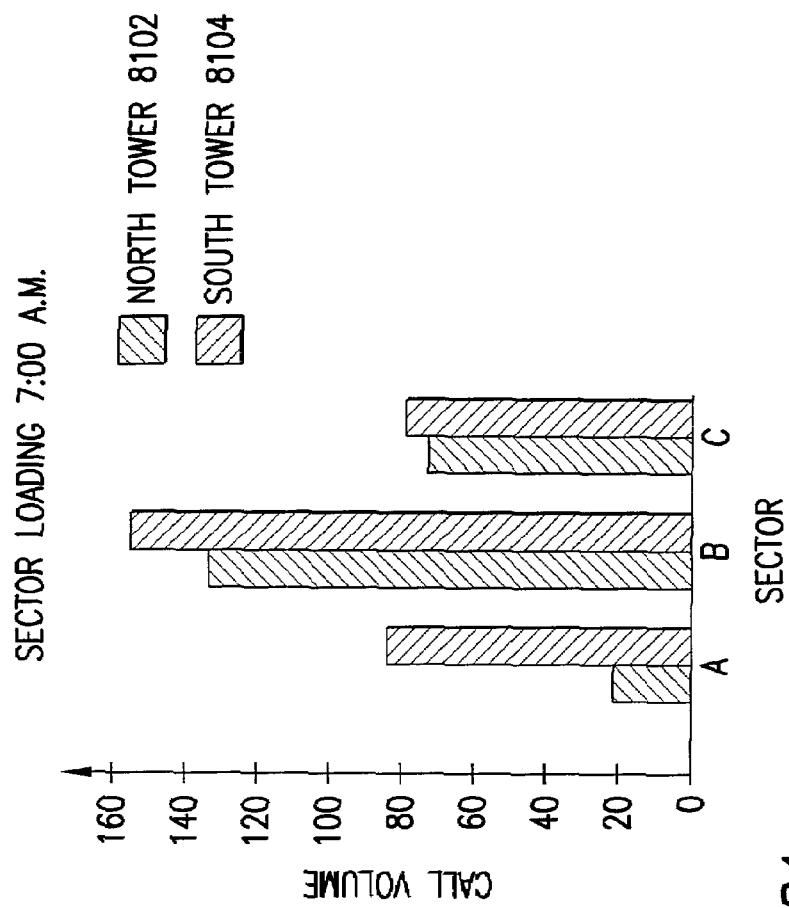
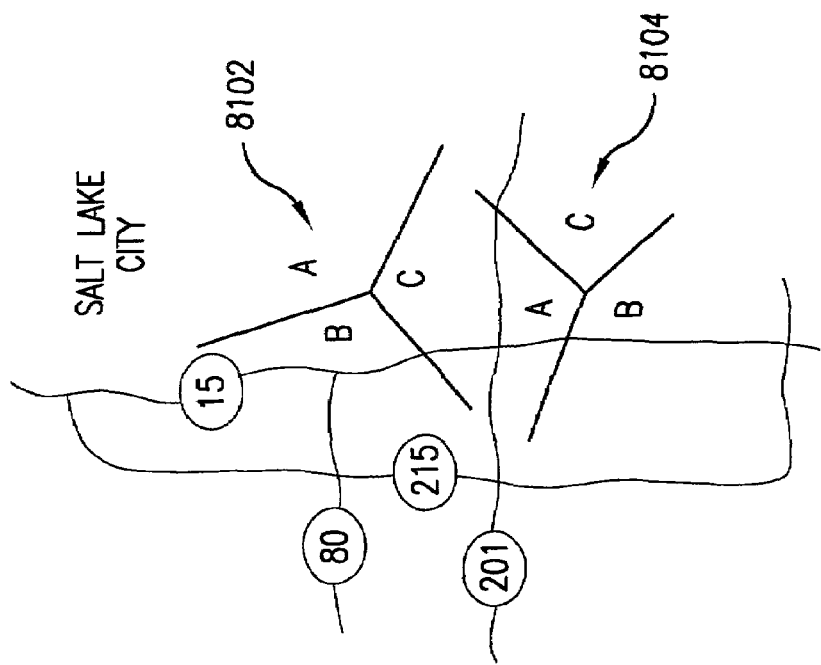
FIG. 81

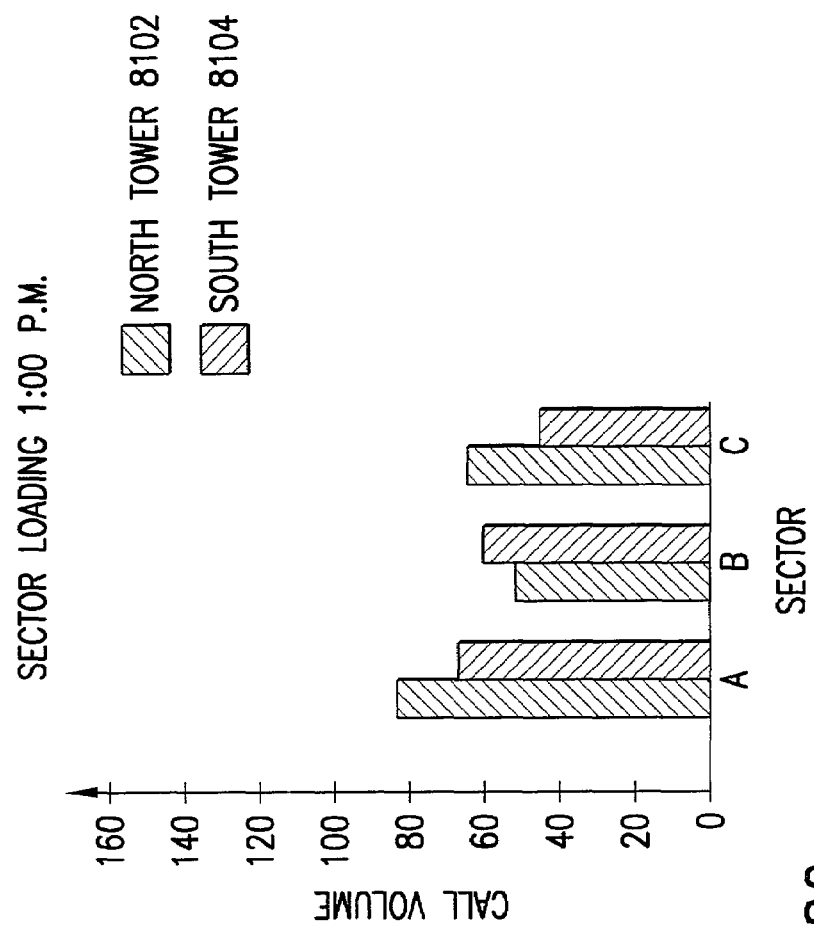
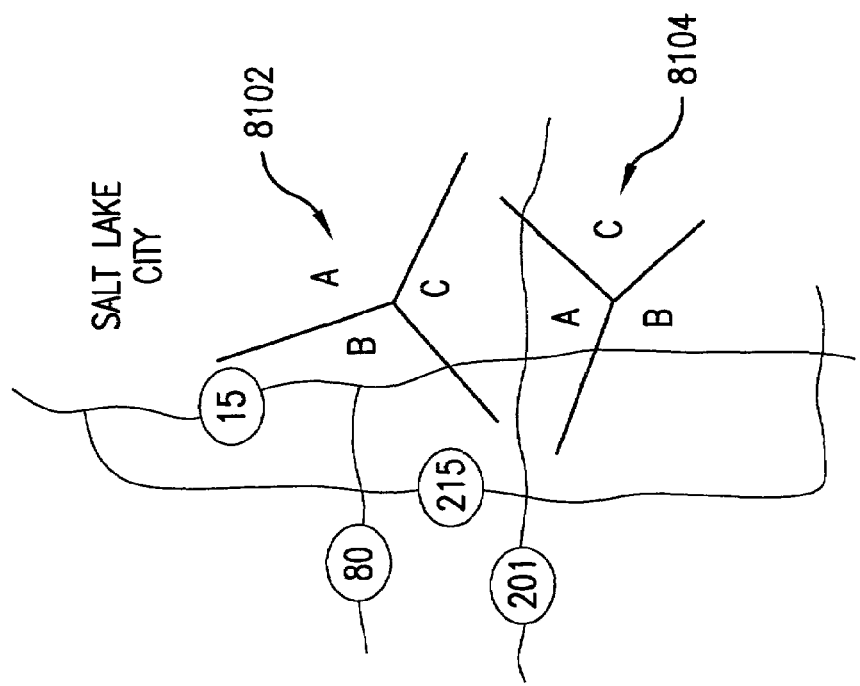
FIG.82

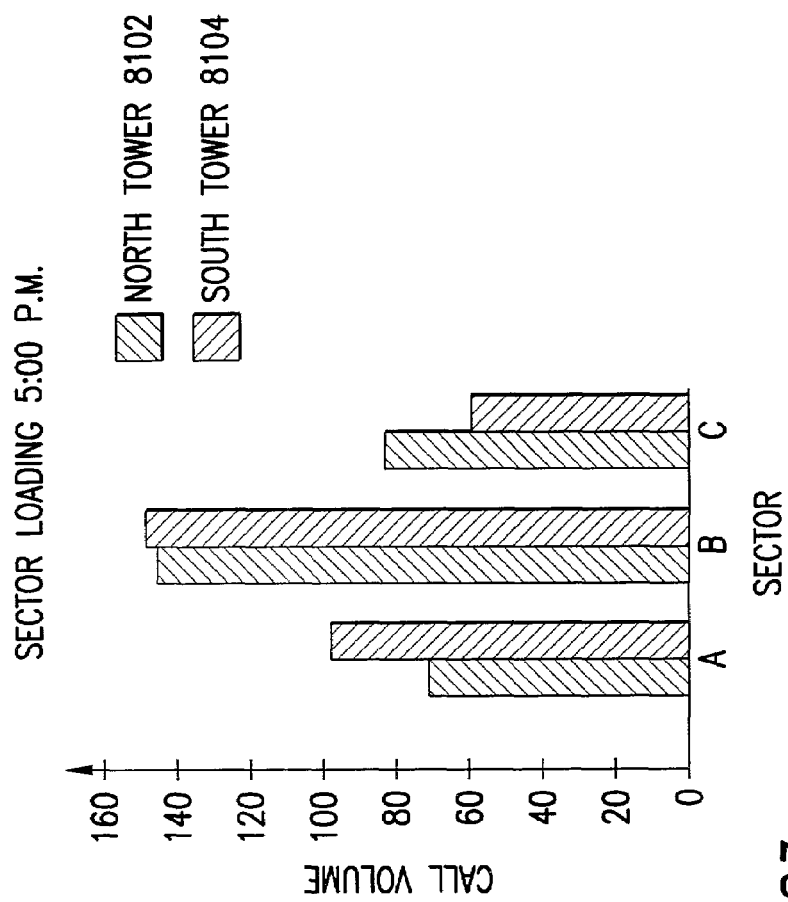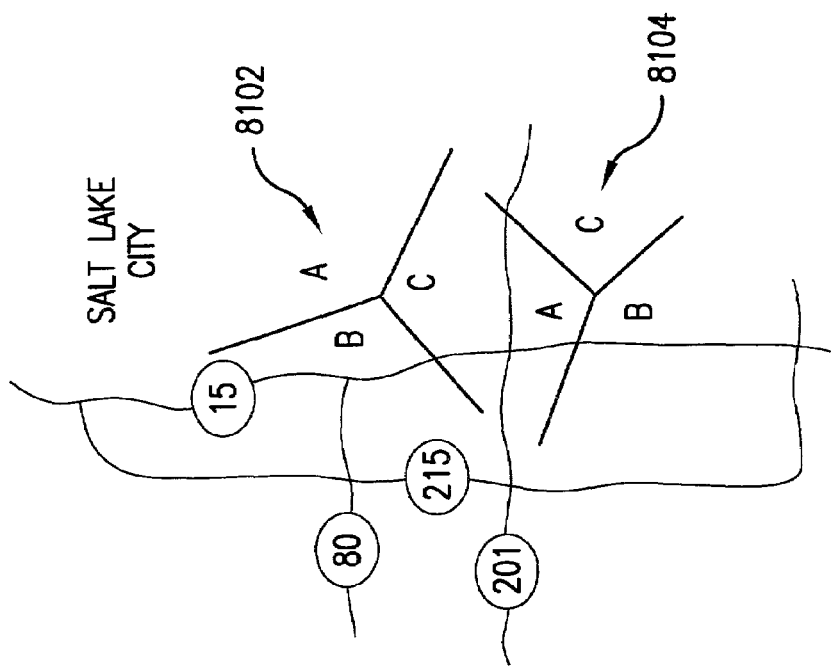
FIG.83

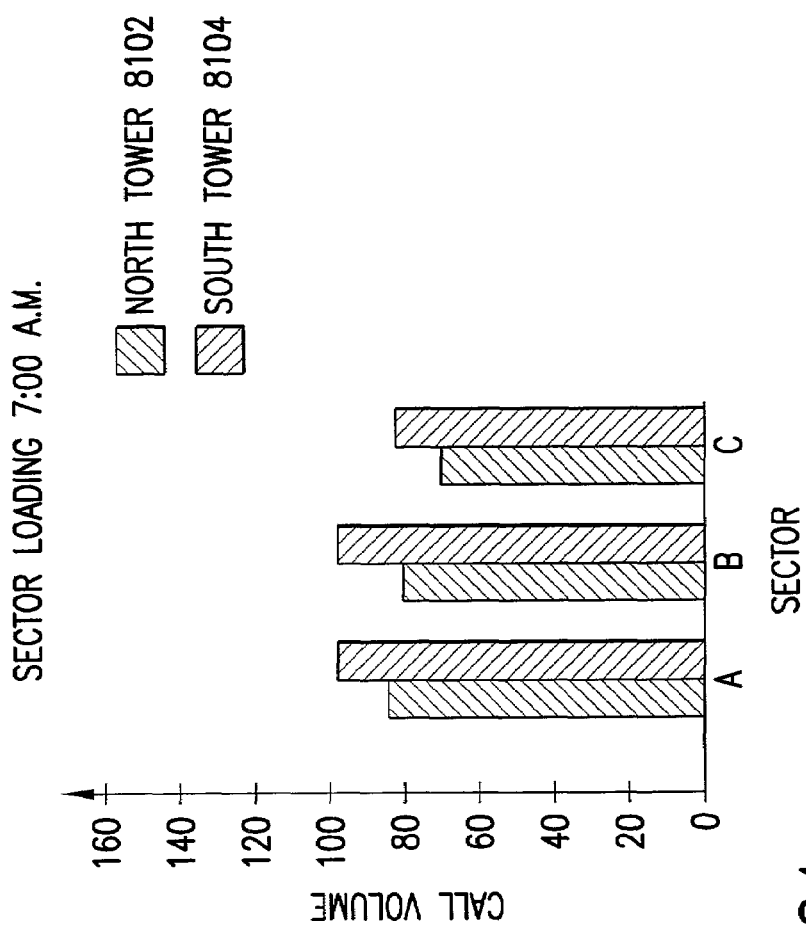
FIG. 84
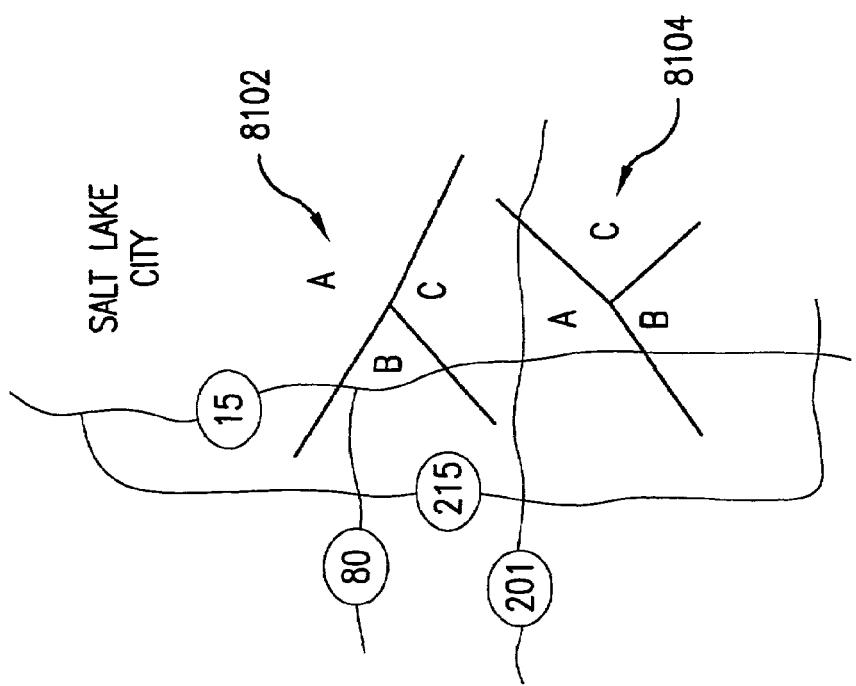

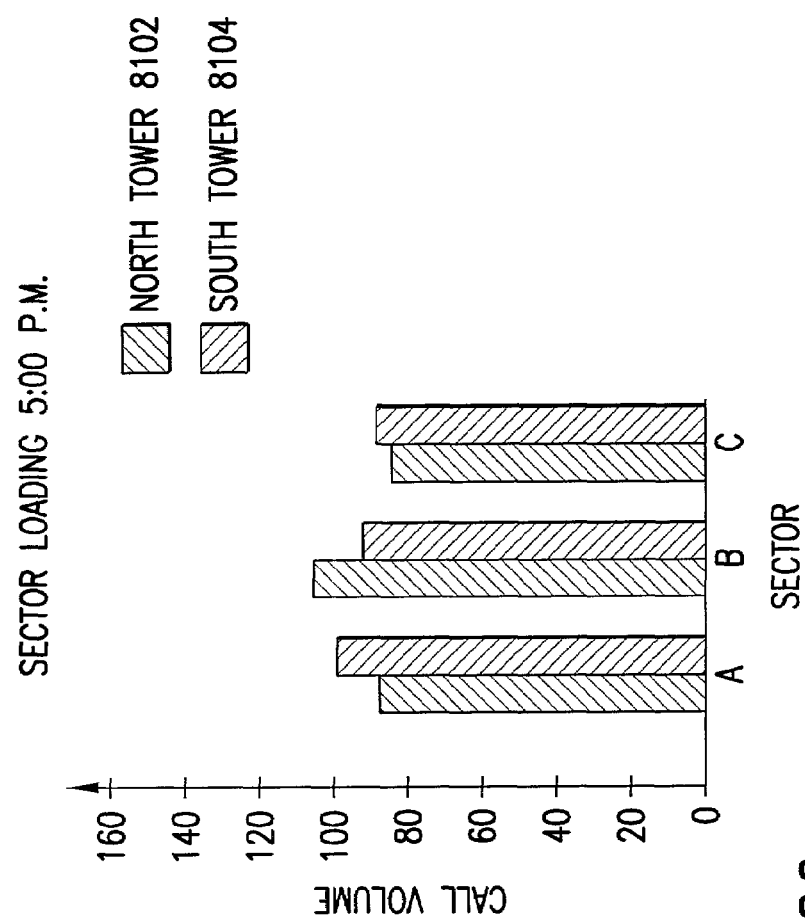
FIG.86
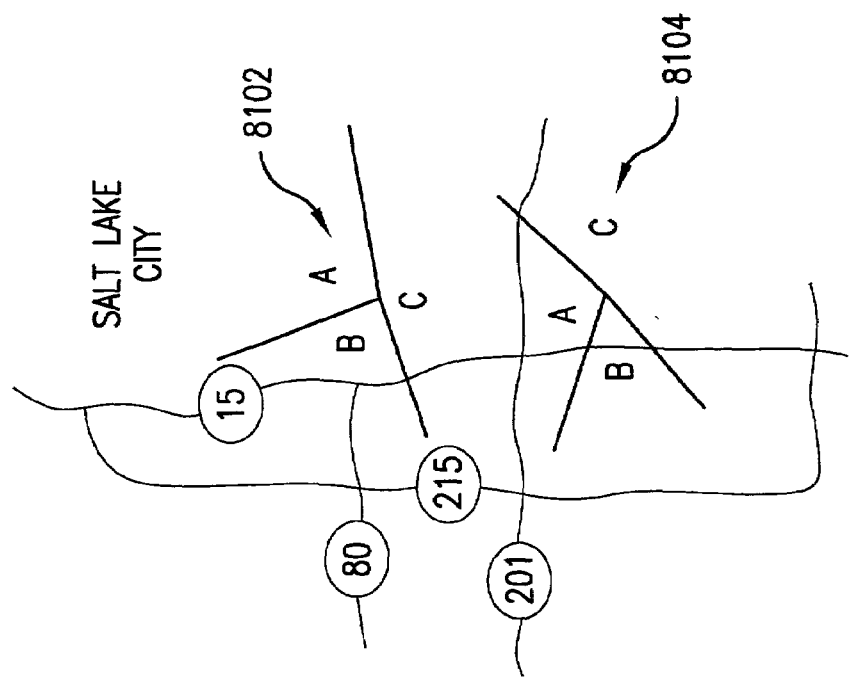

PHASED ARRAY WITH MULTIPLE TRACKING MAIN BEAMS

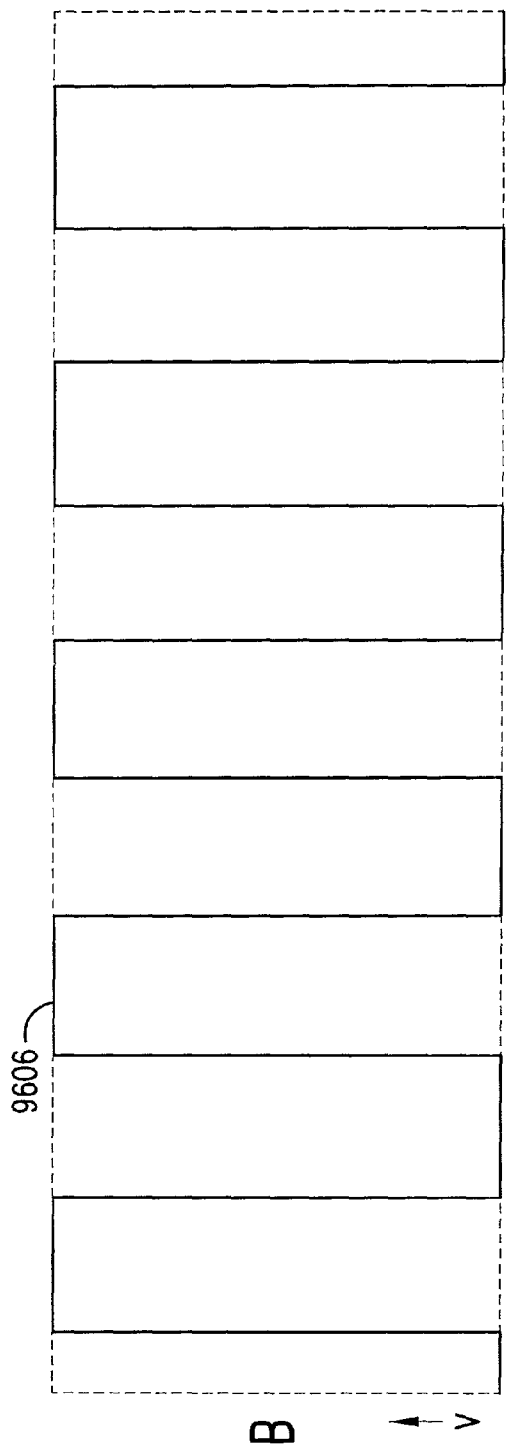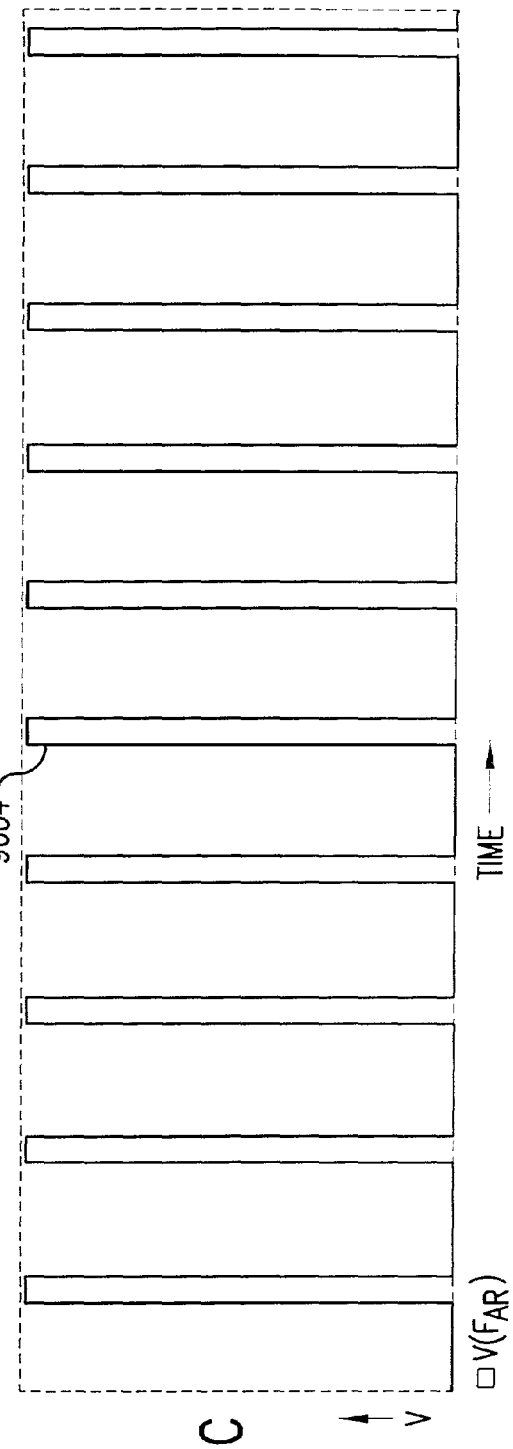

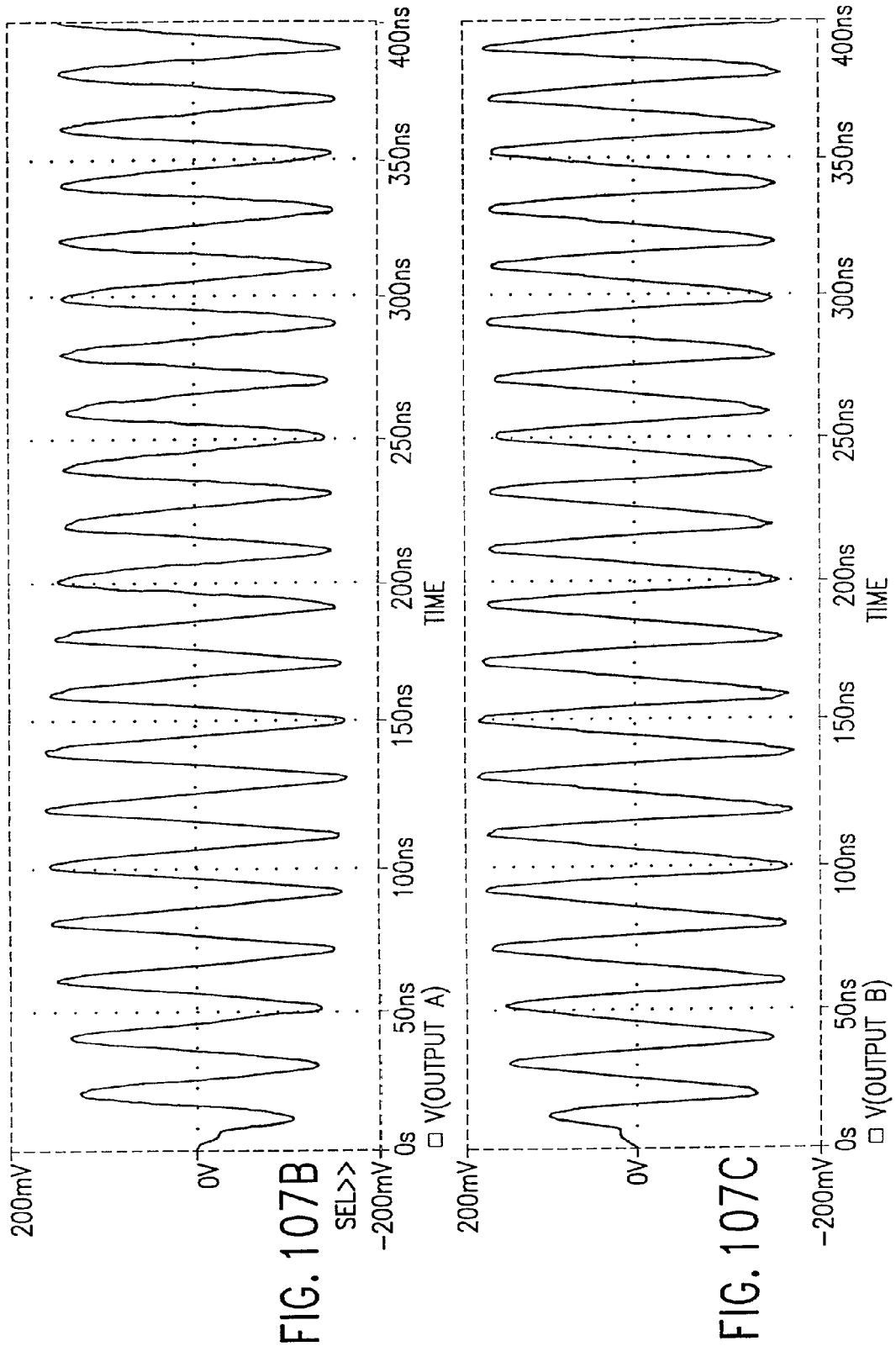

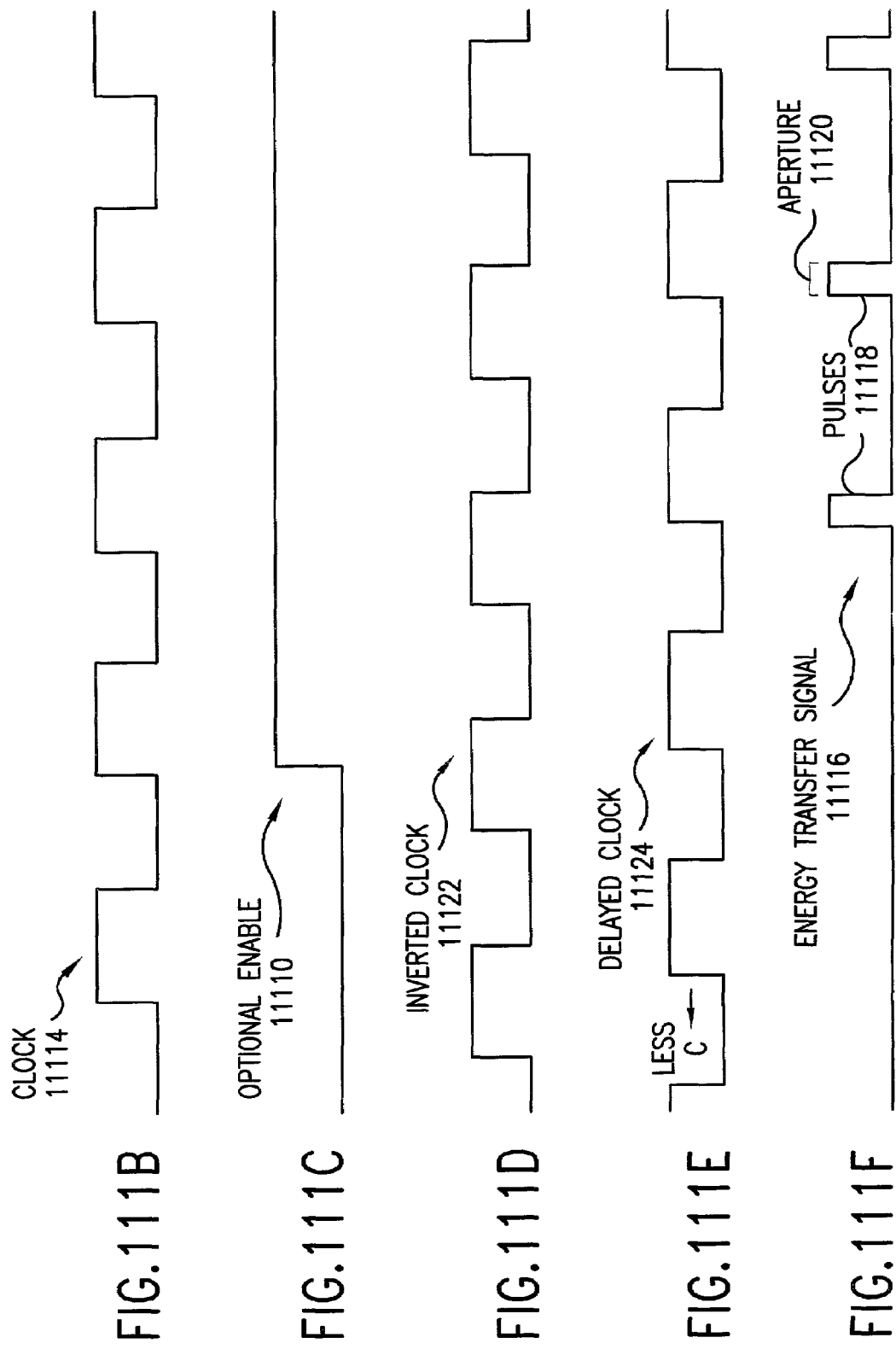

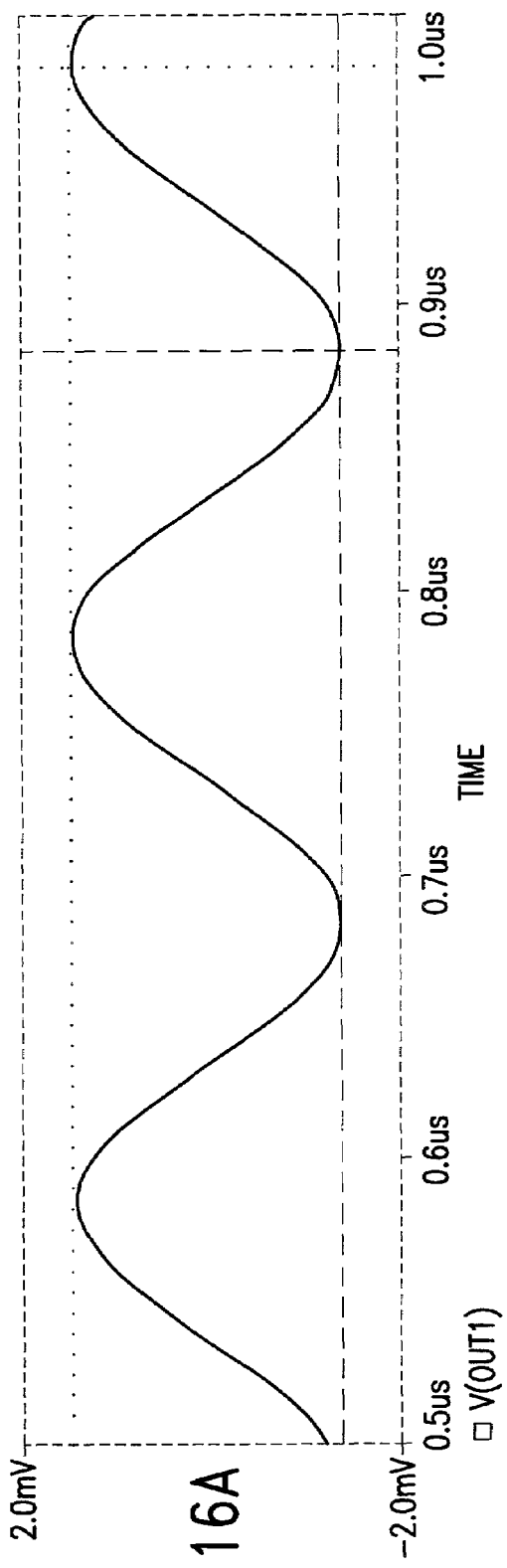
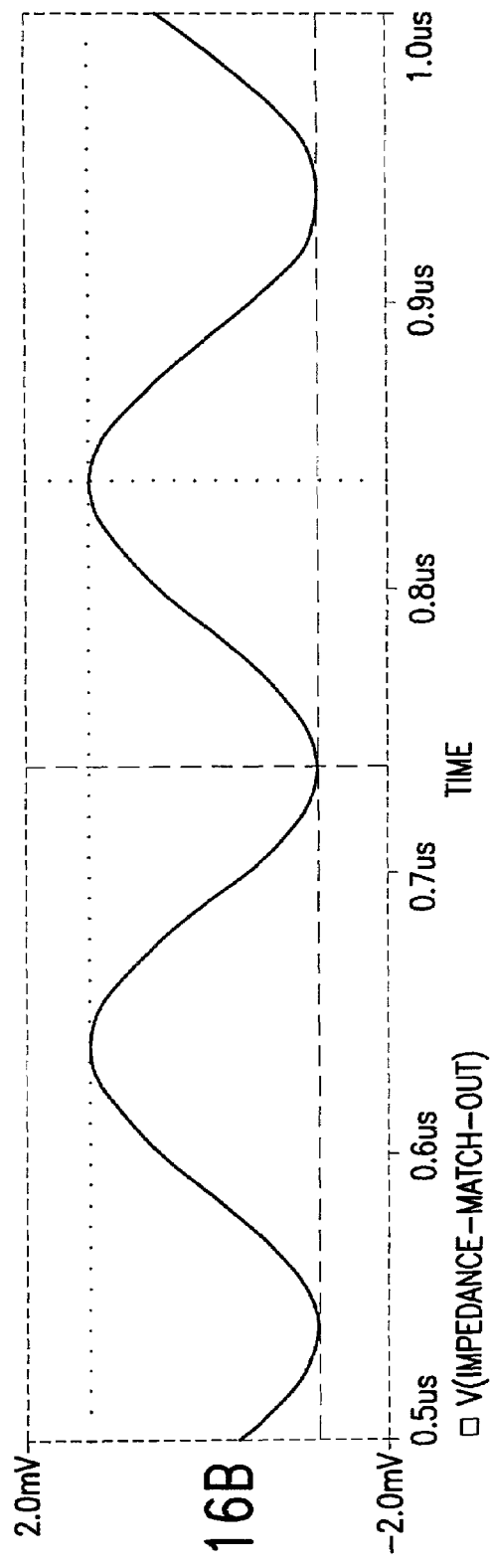
FIG. 116A
FIG. 116B $$q = C \cdot V \quad \text{EQ.A}$$

$$V = A \cdot \sin(t) \quad \text{EQ.B}$$

$$q(t) = C \cdot A \cdot \sin(t) \quad \text{EQ.C}$$

$$\Delta q(t) = C \cdot A \cdot \sin(t) - C \cdot A \cdot \sin(t-T) \quad \text{EQ.D}$$

$$\Delta q(t) = C \cdot A \cdot (\sin(t) - \sin(t-T)) \quad \text{EQ.14}$$

$$\sin(\alpha) - \sin(\beta) = 2 \cdot \sin\left(\frac{\alpha-\beta}{2}\right) \cdot \cos\left(\frac{\alpha+\beta}{2}\right) \quad \text{EQ. F}$$

$$\Delta q(t) = 2 \cdot C \cdot A \cdot \sin\left[\frac{t-(t-T)}{2}\right] \cdot \cos\left[\frac{t+(t-T)}{2}\right] \quad \text{EQ.G}$$

$$\Delta q(t) = 2 \cdot C \cdot A \cdot \sin\left(\frac{1}{2} \cdot T\right) \cdot \cos\left(t - \frac{1}{2} \cdot T\right) \quad \text{EQ.H}$$

$$q(t) = \int C \cdot A \cdot (\sin(t) - \sin(t-T)) dt \quad \text{EQ.I}$$

$$q(t) = -\cos(t) \cdot C \cdot A + \cos(t-T) \cdot C \cdot A \quad \text{EQ.J}$$

$$q(t) = C \cdot A \cdot (\cos(t-T) - \cos(t)) \quad \text{EQ.K}$$

FIG. 118B

POWER-CHARGE RELATIONSHIP $$q = C \cdot V \quad \text{EQ.L}$$

$$V = \frac{q}{C} \quad \text{EQ.M}$$

$$V = \frac{J}{C} \quad \text{EQ.N}$$

$$J = \frac{q^2}{C} \quad \text{EQ.O}$$

$$P = \frac{J}{S} \quad \text{EQ.P}$$

$$P = \frac{q^2}{C \cdot S} \quad \text{EQ.Q}$$

FIG. 118E

INSERTION LOSS

Insertion loss in dB is expressed by:

$$ILdB = 10 \cdot \log\left(\frac{Pin}{Pout}\right)$$

or $$ILdB = 10 \cdot \log\left[\frac{\left(\frac{Vin^2}{Rin}\right)}{\left(\frac{Vout^2}{Rout}\right)}\right]$$

FIG. 118F

PHASED ARRAY ANTENNA APPLICATIONS OF UNIVERSAL FREQUENCY TRANSLATION

CROSS-REFERENCE TO OTHER APPLICATIONS

This application is a continuation of U.S. patent application Ser. No. 09/590,955, filed on Jun. 9, 2000, which claims the benefit of the following: U.S. Provisional Application No. 60/167,704, filed on Nov. 24, 1999; and U.S. Provisional Application No. 60/170,767, filed on Dec. 15, 1999; and U.S. Provisional Application No. 60/171,584, filed on Dec. 23, 1999; and U.S. Provisional Application No. 60/177,380, filed on Jan. 24, 2000; and U.S. Provisional Application No. 60/209,042, filed Jun. 2, 2000, all of which are incorporated by reference herein in its entirety.

The following applications of common assignee are related to the present application, and are herein incorporated by reference in their entireties:

"Method and System for Down-Converting Electromagnetic Signals," Ser. No. 09/176,022, filed Oct. 21, 1998, issued as U.S. Pat. No. 6,061,551 on May 9, 2000;

"Method and System for Frequency Up-Conversion," Ser. No. 09/176,154, filed Oct. 21, 1998;

"Method and System for Ensuring Reception of a Communications Signal," Ser. No. 09/176,415, filed Oct. 21, 1998, issued as U.S. Pat. No. 6,061,555 on May 9, 2000;

"Integrated Frequency Translation And Selectivity," Ser. No. 09/175,966, filed Oct. 21, 1998, issued as U.S. Pat. No. 6,049,706 on Apr. 11, 2000;

"Integrated Frequency Translation and Selectivity with a Gain Control Functionality, and Applications thereof," Ser. No. 09/566,188, filed May 5, 2000;

"Applications of Universal Frequency Translation," filed Mar. 3, 1999, Ser 09/176,027, filed on Mar. 3, 1999.

"Method and System for Down-converting Electromagnetic Signals Having Optimized Switch Structures," Ser. No. 09/293,095, filed on Apr. 16, 1999;

"Method and System for Down-converting Electromagnetic Signals Including Resonant Structures for Enhanced Energy Transfer", Ser. No. 09/293,342, filed on Apr. 16, 1999;

"Matched Filter Characterization and Implementation of Universal Frequency Translation Method and Apparatus," Ser. No. 09/521,828, filed on Mar. 9, 2000; and "Method and System for Down-Converting an Electromagnetic Signal, Transforms for same, and Aperture Relationships," Ser. No. 09/550,644, filed Apr. 14, 2000.

BACKGROUND OF THE INVENTION

1. Field of the Invention

The present invention is generally related to frequency translation, phase-shifting, and applications of the same, including but not limited to antenna applications.

2. Related Art

Various communication components exist for performing frequency down-conversion, frequency up-conversion, phase shifting and filtering. Also, schemes exist for signal reception in the face of potential jamming signals.

SUMMARY OF THE INVENTION

The present invention is related to integrated frequency translation and phase shifting, and applications of same. Such applications include, but are not limited to: integrated frequency down-conversion and phase shifting, integrated frequency up-conversion and phase shifting, and phased array antennas that utilize integrated frequency translation and phase shifting.

A universal frequency translation module (UFT) frequency translates an electromagnetic (EM) input signal by sampling the EM input signal according to a periodic control signal (also called an aliasing signal). By controlling the relative sampling time, the UFT module implements a relative phase shift during frequency translation. In other words, a relative phase shift can be introduced in the output signal by sampling the input signal at one point in time relative to another point in time. As such, the UFT module can be configured as an integrated frequency translator and phase-shifter. This includes the UFT module as an integrated down-converter and phase shifter, and the UFT module as an integrated up-converter and phase shifter.

As used herein, the word "integrated" refers to functionality, and generally means that certain functions are performed in a unified or collective or combined manner. This term does not necessarily refer to implementation, and the invention need not be implemented as an integrated circuit (IC), although an implementation of the invention includes IC implementation.

In embodiments, the control signal includes a plurality of pulses, and the relative sampling time of UFT module is controlled by introducing a relative phase shift in the pulses of the control signal. Additionally, the pulse width of the control signal is established to improve energy transfer from the input signal to the frequency translated signal.

In embodiments, a pulse generator generates the control signal, and is triggered according to a local oscillator (LO) signal. More specifically, the pulse generator triggers and produces a pulse when the amplitude of the LO signal exceeds a threshold that is associated with the pulse generator. As such, the relative phase shift of the control signal is determined by the relative time that the LO signal exceeds the threshold of the pulse generator. In embodiments, the LO signal is level-shifted with a bias voltage to change the trigger time of the pulse generator, resulting in a phase shift of the control signal, and a phase shift of the output signal. Alternatively, the LO signal is delayed by variable amount to change the trigger time of the pulse generator, resulting in a phase shift of the control signal, and a phase shift of the output signal. Alternatively, the shape of the LO signal is changed to vary the trigger time of the pulse generator, resulting in a phase shift in the control signal, and a phase shift in the output signal.

Additionally, the frequency of the LO signal substantially determines the frequency of the control signal. For down-conversion directly to baseband, the LO signal frequency is preferably a sub-harmonic of the EM input signal. For down-conversion to an IF, the frequency of the LO signal is approximately equal to the frequency of the EM input signal plus or minus the frequency of the IF signal divided by n, where n represents a harmonic or sub-harmonic. For up-conversion, the frequency of the LO signal is a sub-harmonic of the desired output signal frequency.

Applications of universal frequency translation and phase shifting include phased array antennas that utilize integrated frequency translation and phase shifting technology to steer the one or more main beams of the phased array antenna.

For example, two or more UFT modules are incorporated in a phased array antenna to steer an antenna beam and frequency translate an EM signal that corresponds to the antenna beam. Assuming receive mode in a two element phased array antenna, a first UFT module samples a first EM signal that is received by a first antenna element to generate a first down-converted signal. A second UFT module samples a second EM signal that is received by a second antenna element to generate a second down-converted signal. The first EM signal is sampled according to a first control signal and the second EM signal is sampled according to a second control signal. The second control signal is phase shifted with respect to the first control signal, which phase shifts the second down-converted signal relative to the first down-converted signal, and thereby steers the antenna beam of the phased array antenna after summing the first and second down-converted signals. In embodiments, the pulse widths of the first and second control signals are established to improve energy transfer to the first and second down-converted signals.

Antennas radiation patterns are reciprocal so that the invention also applies to an up-conversion/transmit antenna.

Further features and advantages of the invention, as well as the structure and operation of various embodiments of the invention, are described in detail below with reference to the accompanying drawings. The drawing in which an element first appears is typically indicated by the leftmost character(s) and/or digit(s) in the corresponding reference number.

BRIEF DESCRIPTION OF THE FIGURES

The present invention will be described with reference to the accompanying drawings, wherein:

FIG. 5 is a block diagram of a universal frequency up-conversion (UFU) module according to an alternative embodiment of the invention;

FIGS. 6A-6I illustrate example waveforms used to describe the operation of the UFU module;

FIG. 18 is a table of example values at nodes in the UDF module of FIG. 19;

FIGS. 22A-22F are example waveforms used to describe the system of FIG. 21;

FIGS. 24B-24J are example waveforms and spectra used to further describe the enhanced signal reception system according to an embodiment of the invention;

FIGS. 27A-F illustrate various biased LO signals and corresponding phase shifted control signals according to embodiments of the invention;

FIGS. 32A-C illustrates an up-converter/phase-shifter having a variable LO bias to control the phase shift according to embodiments of the invention;

FIGS. 80A-B illustrate a cell phone application of an embodiment of the present invention;

FIGS. 81-86 illustrate cellular phone applications that utilize an electrically steerable antenna beam, according to embodiments of the present invention;

FIGS. 96B and C illustrate example waveforms related to the pulse generator of FIG. 96A;

FIG. 105 shows simulation waveforms for the circuit of FIG. 104 according to an embodiment of the present invention;

Figure 100:
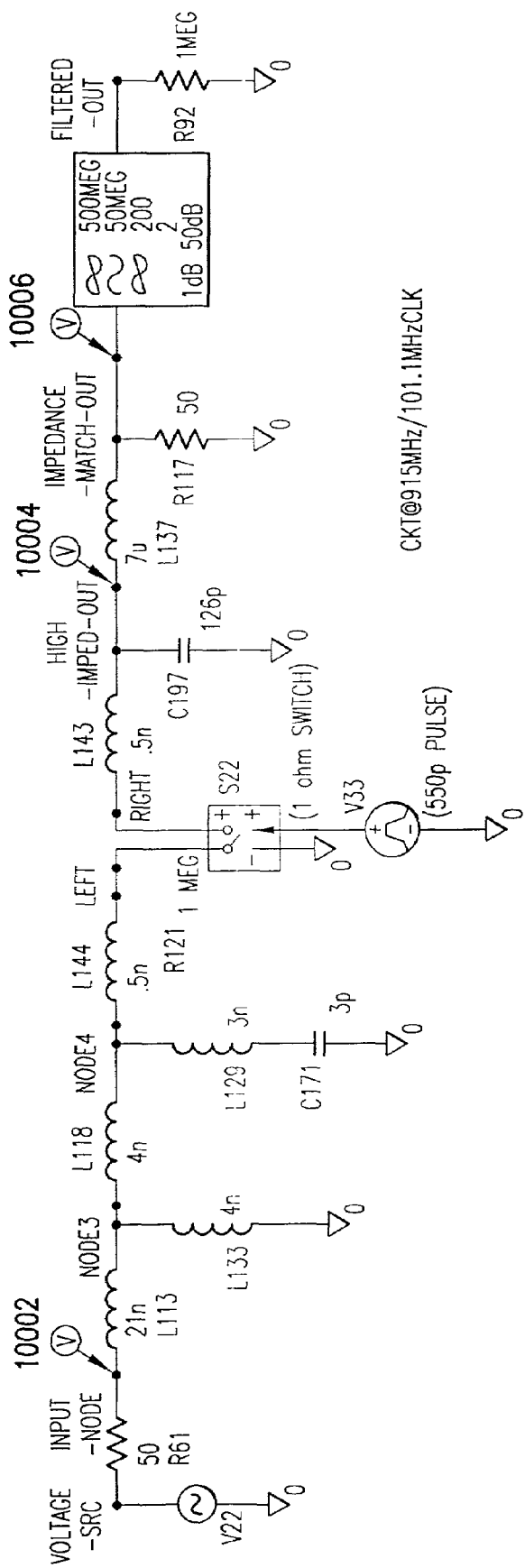
FIG. 100 is a schematic diagram of a circuit to down-convert a 915 MHZ signal to a 5 MHZ signal using a 101.1 MHZ clock according to an embodiment of the present invention.
Figure 106A:
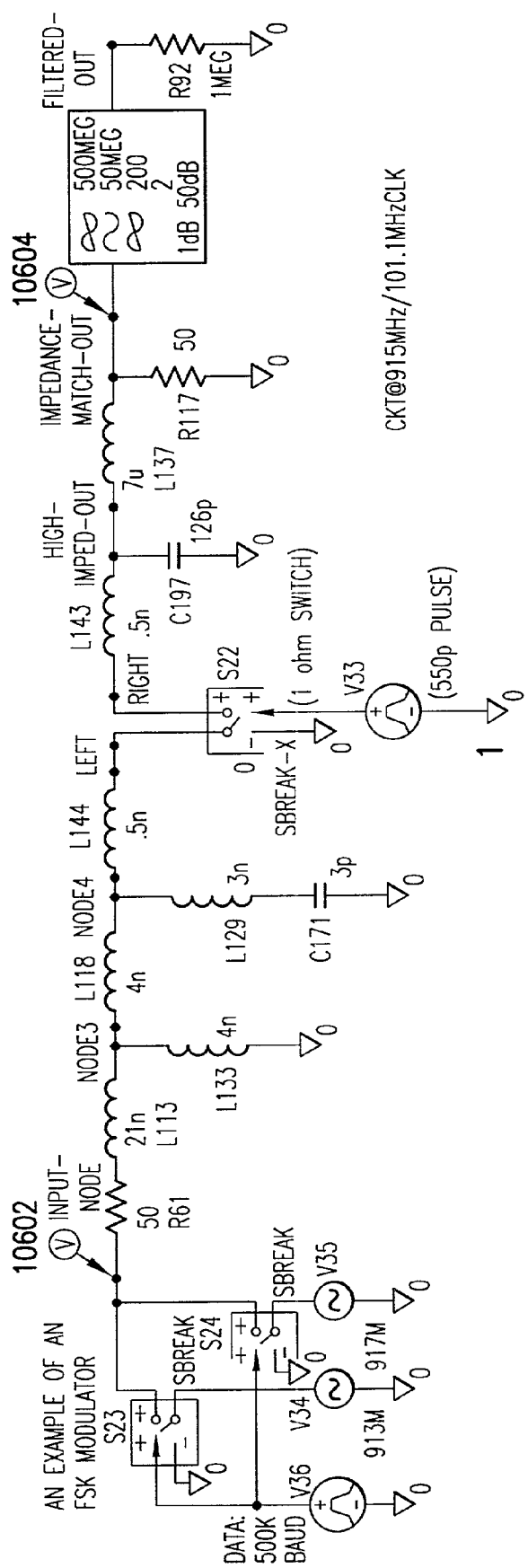
Figure 106B:
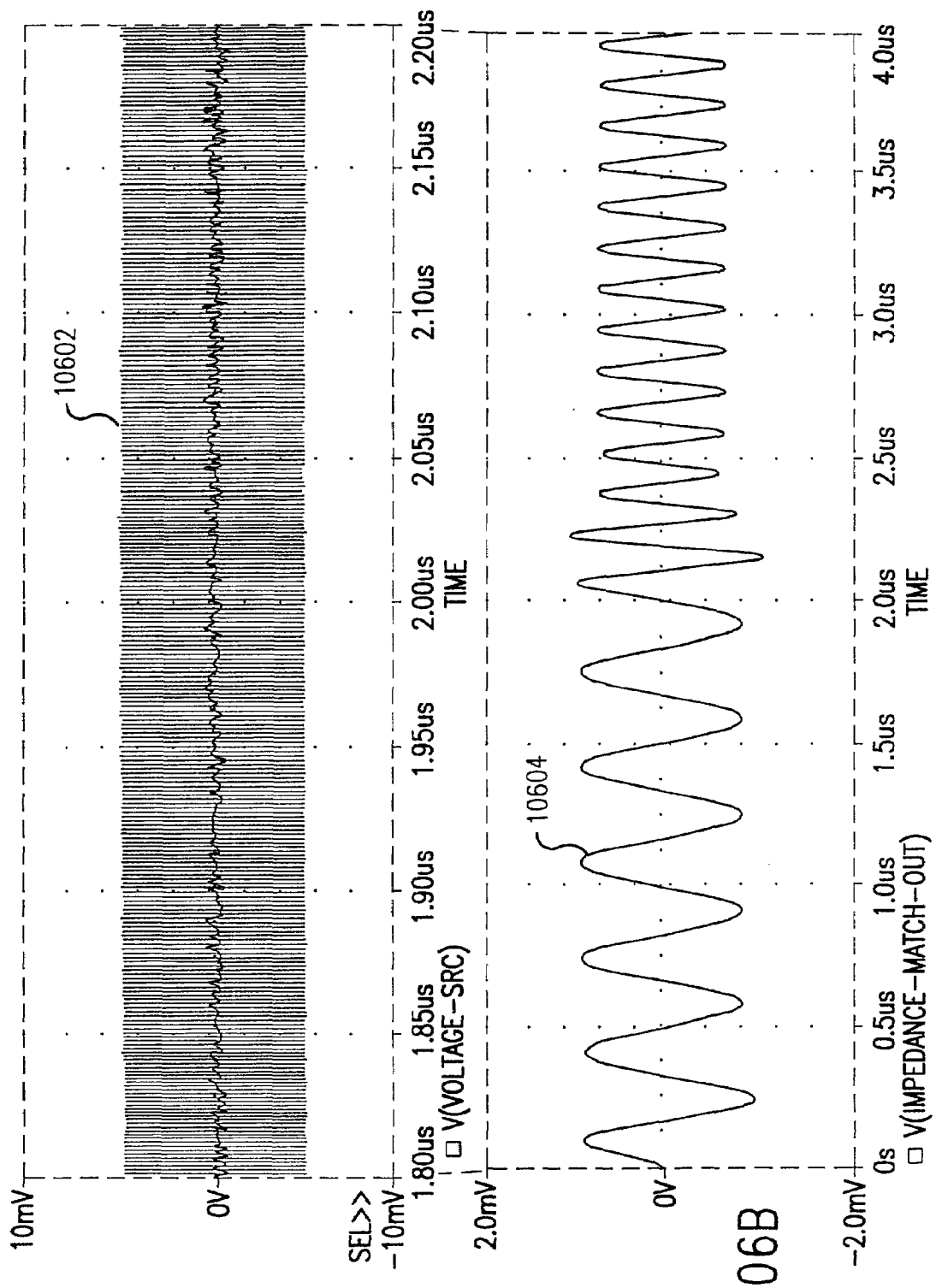
Figure 107A:
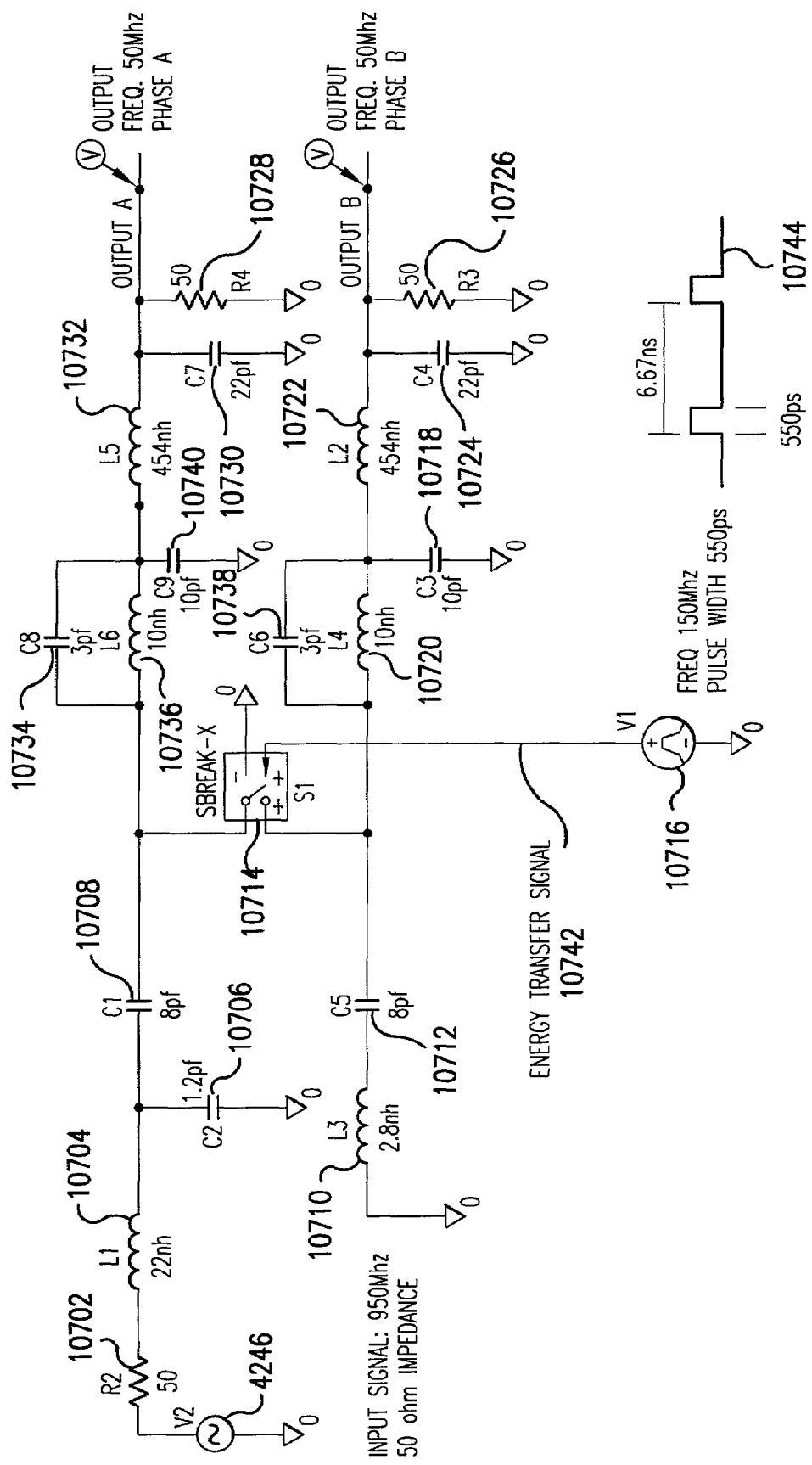
Figure 108:
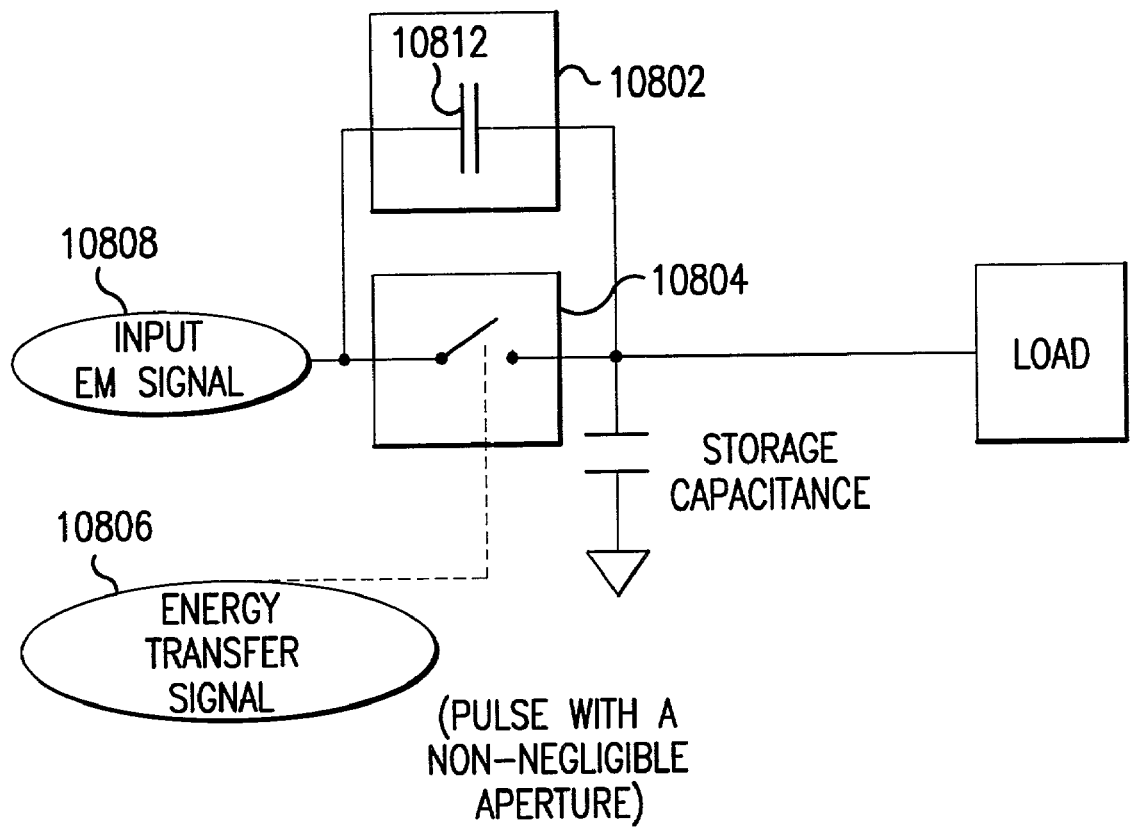
Figure 109:
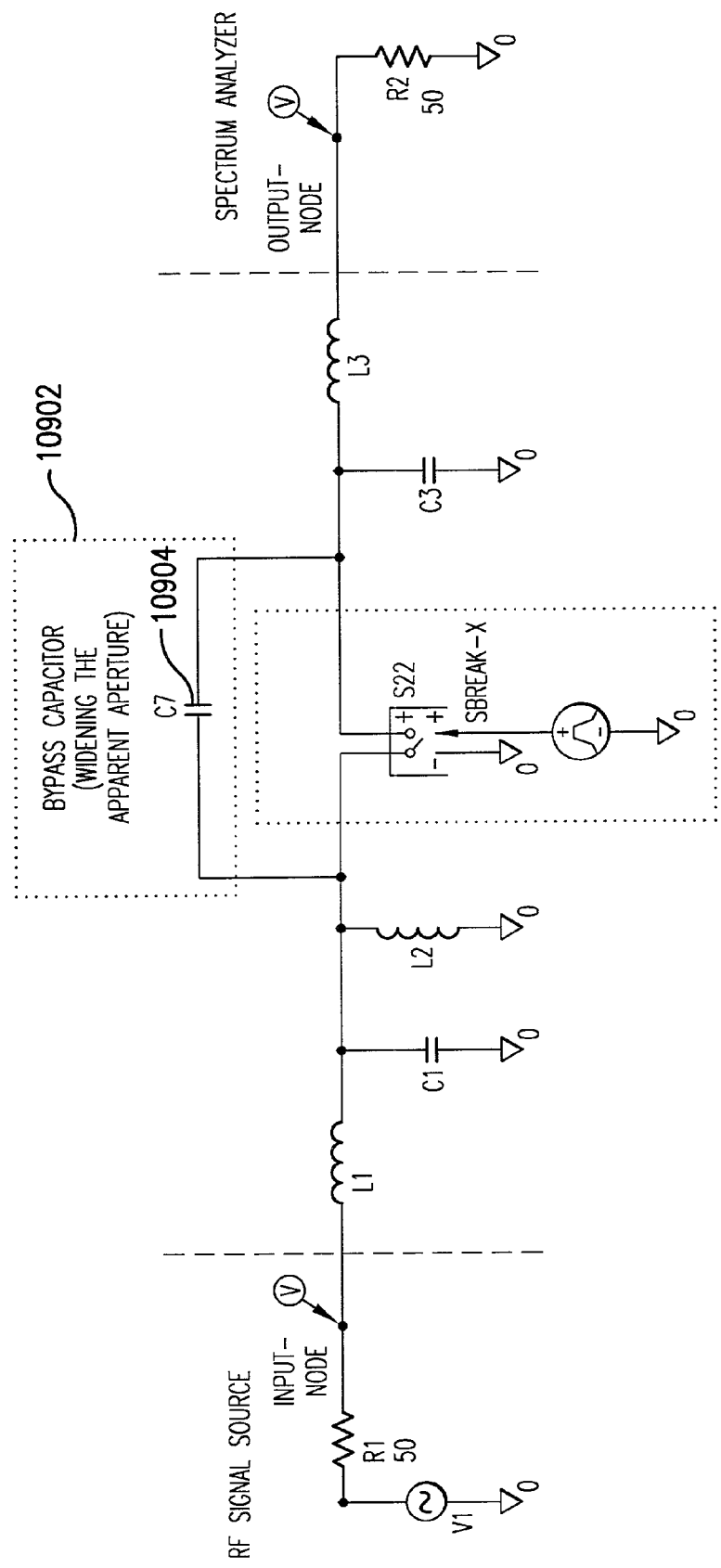
Figure 110:
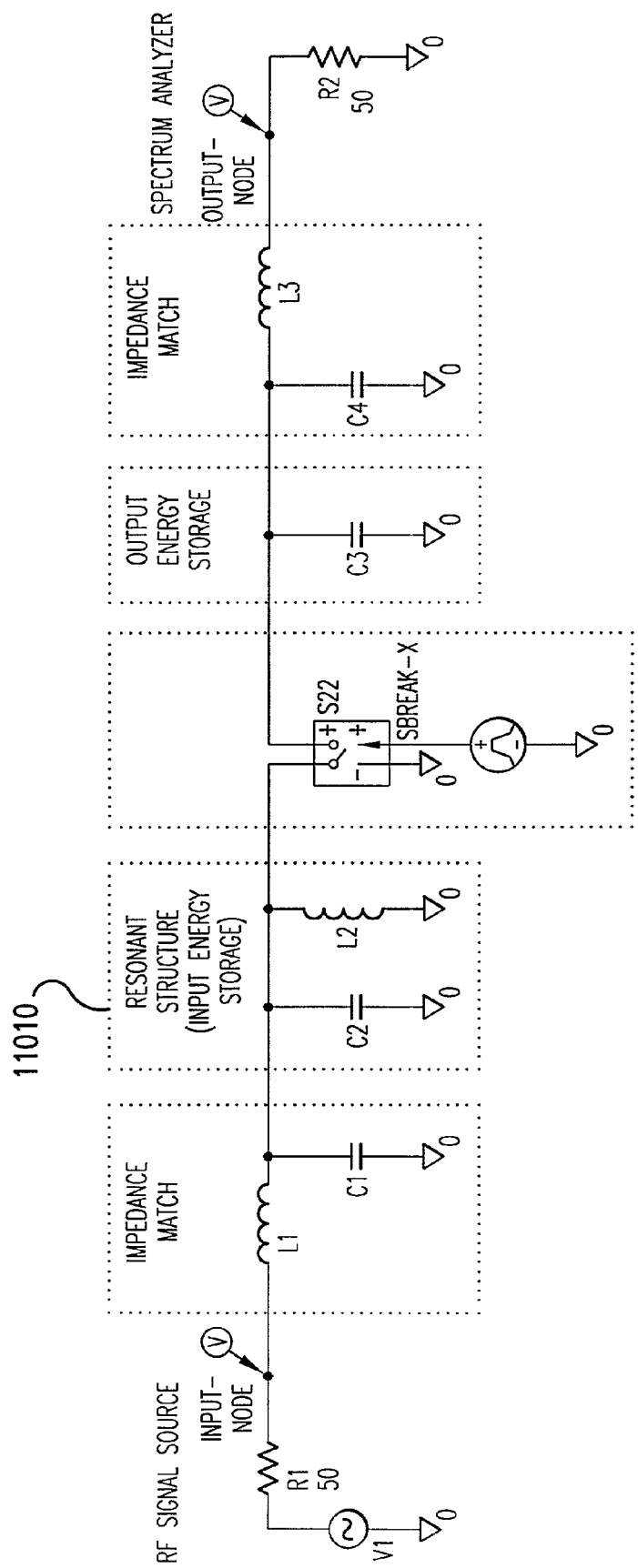
Figure 111A:
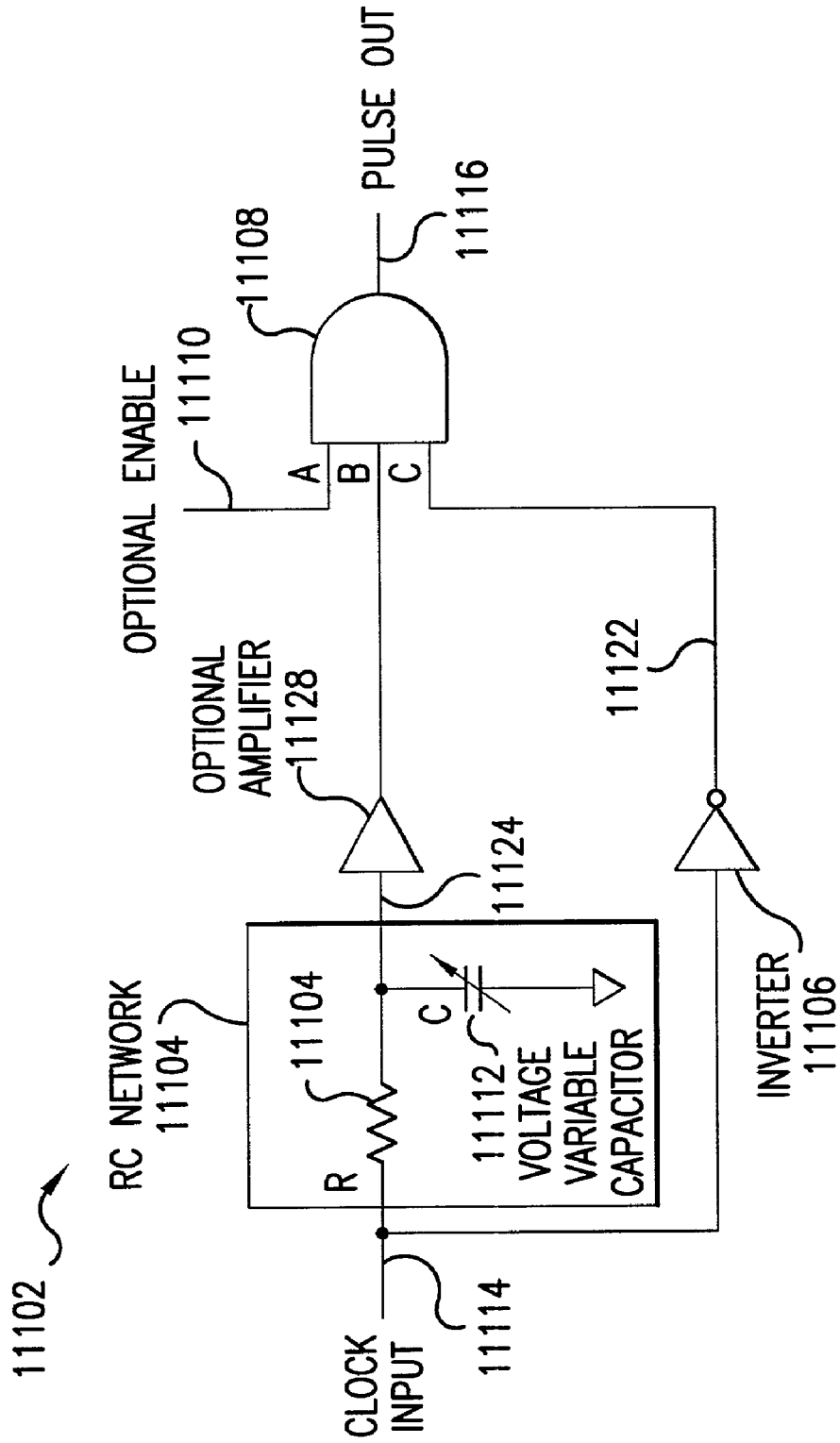
Figure 112:
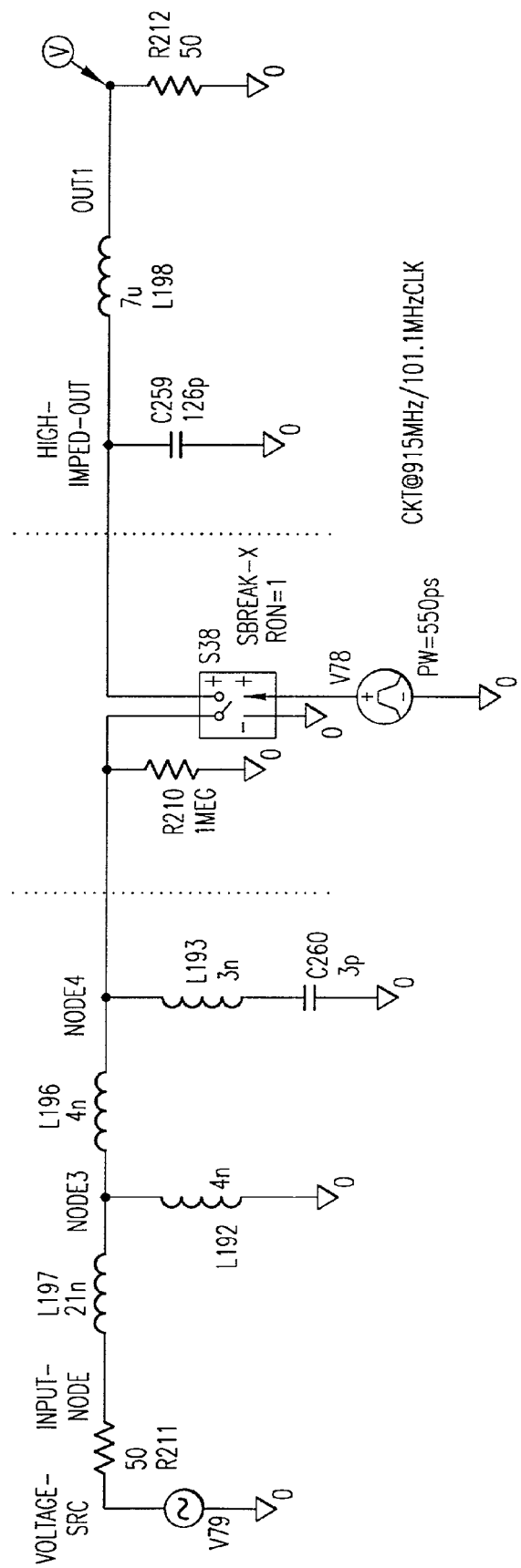
Figure 113:
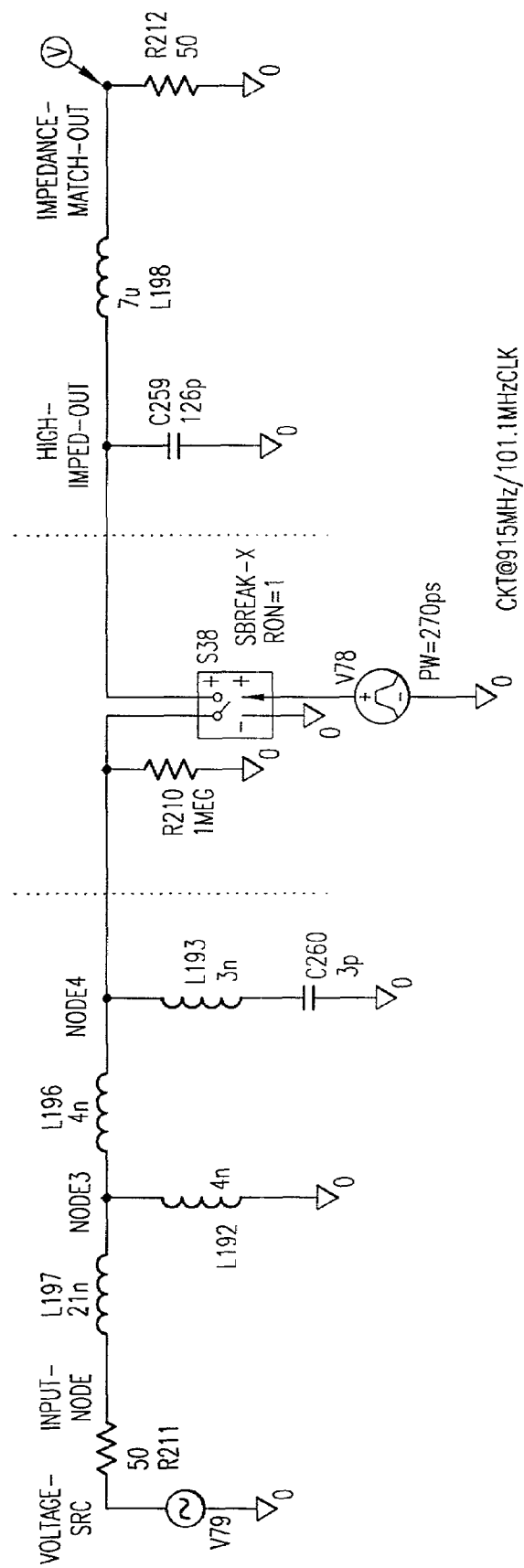
Figure 114:
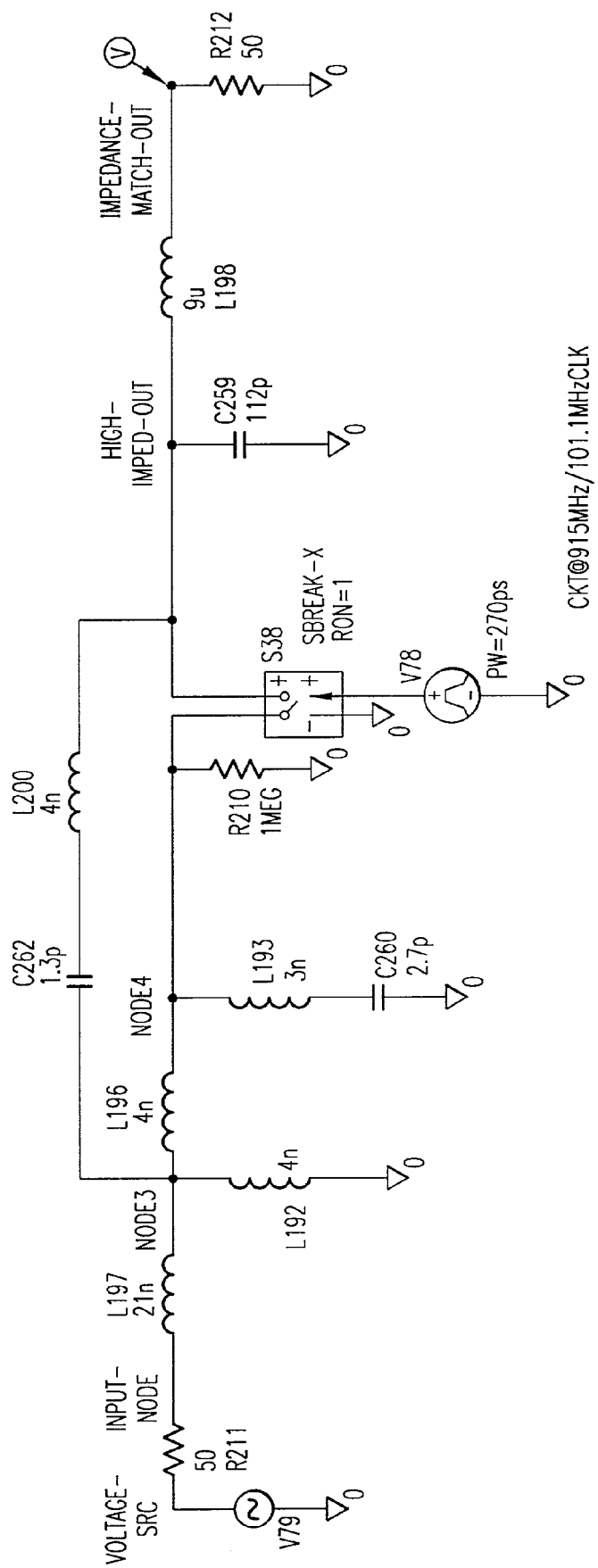
Figure 115:
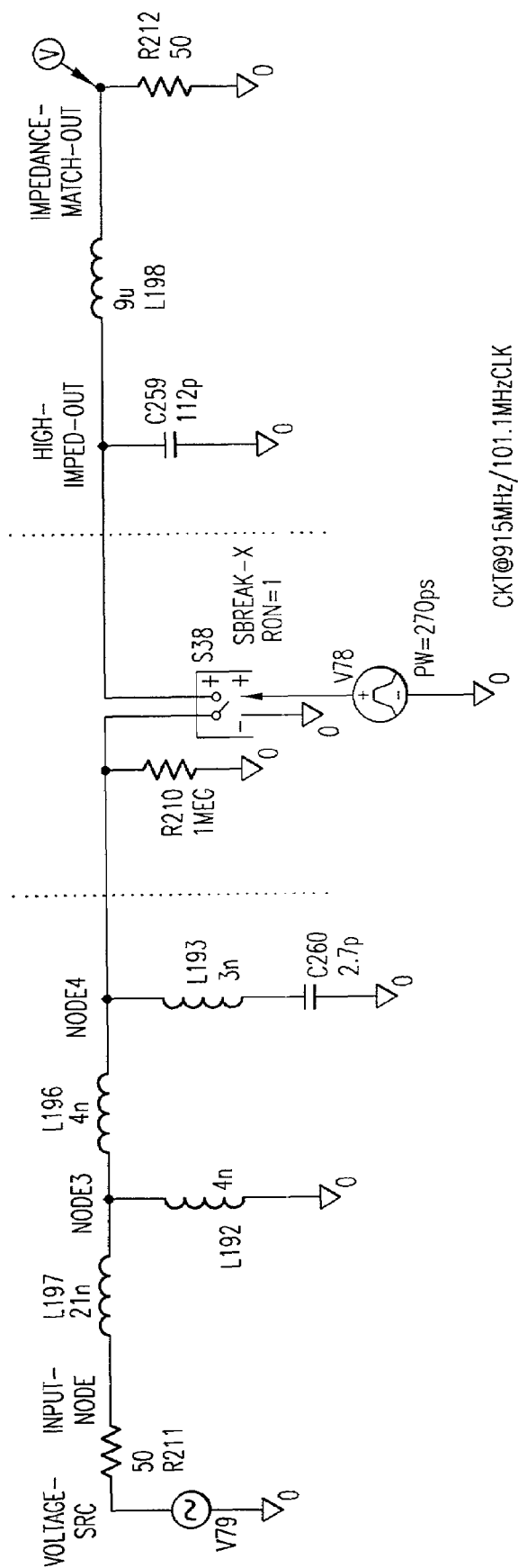
Figure 117A:
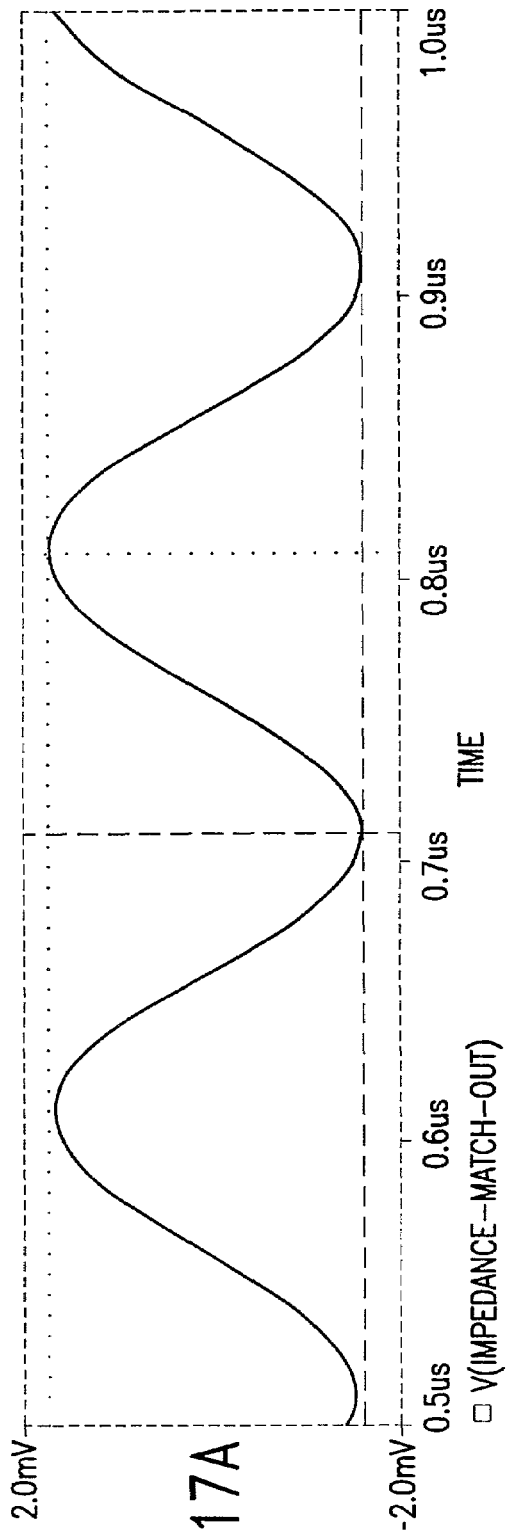
Figure 117B:
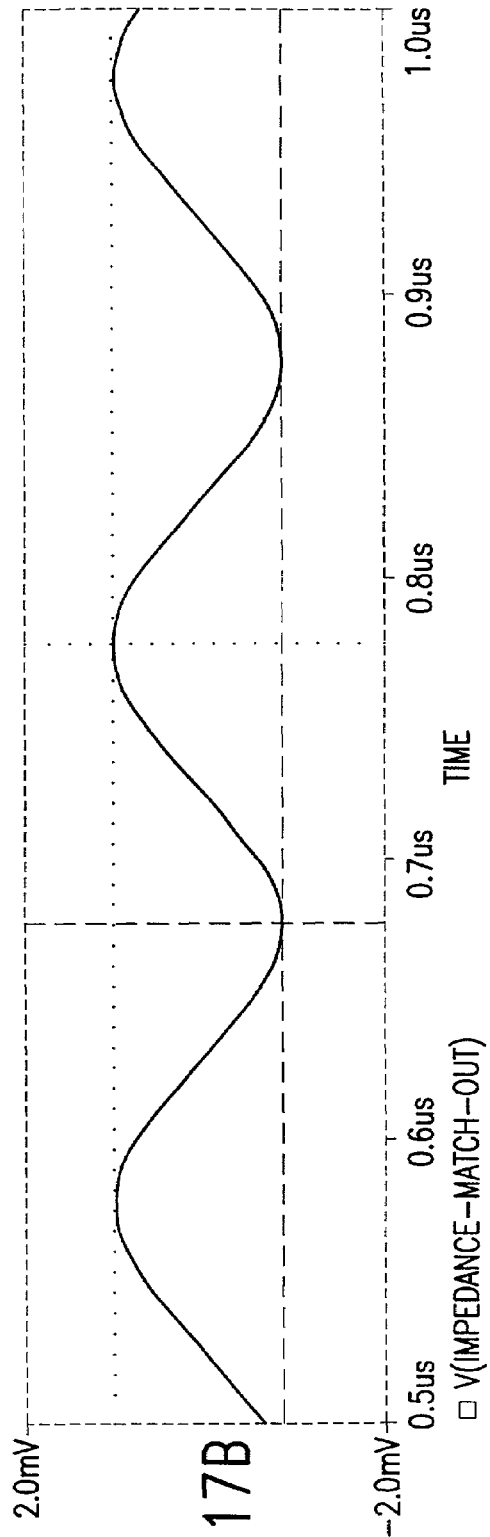
Figure 118A:
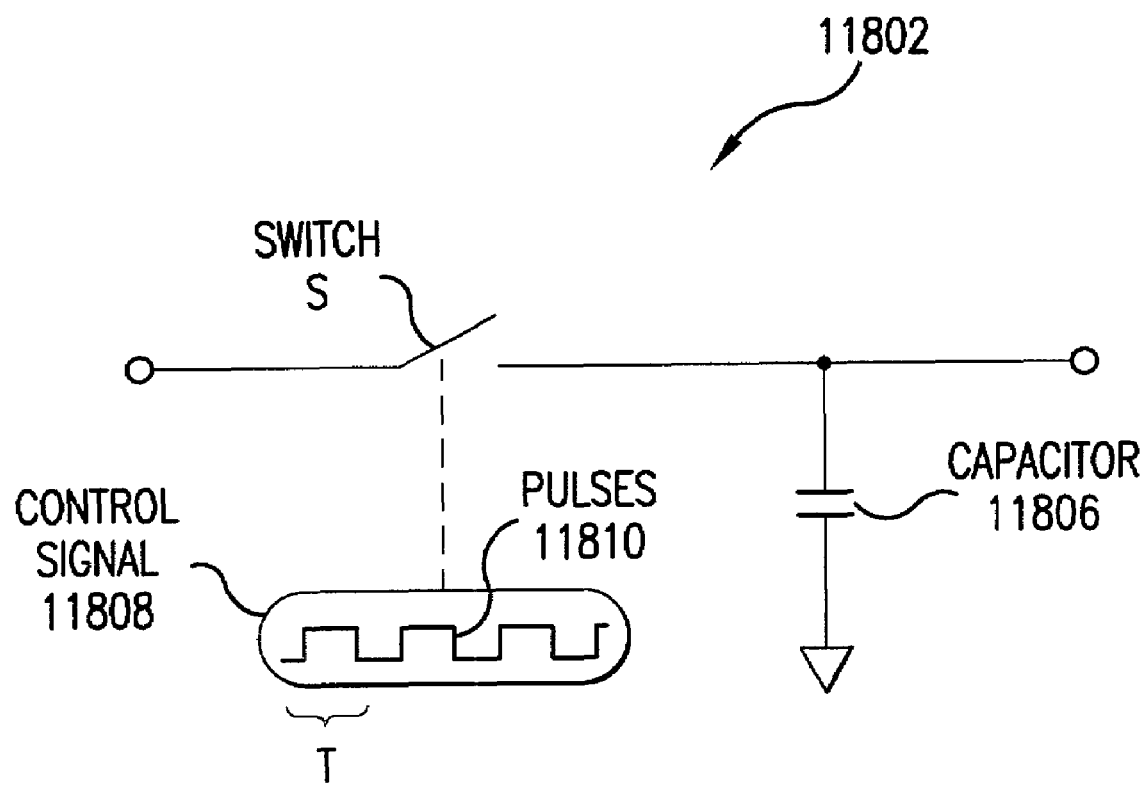
Figure 118C:
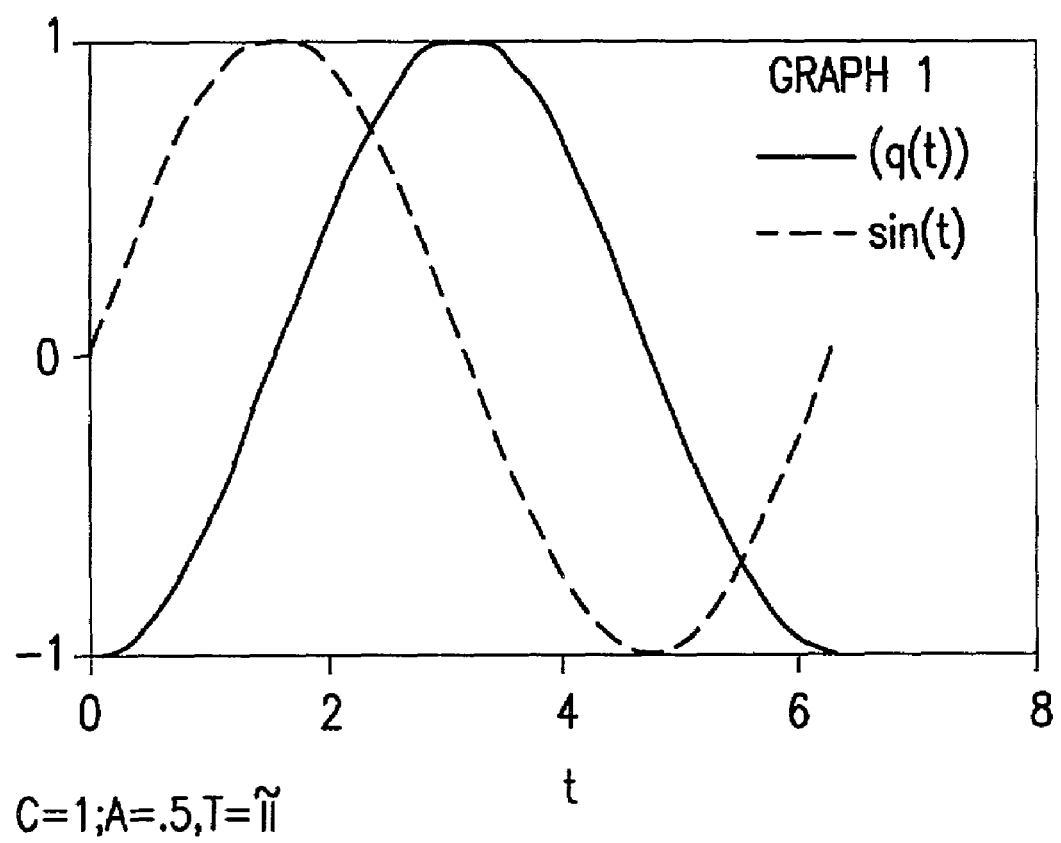
Figure 118D:
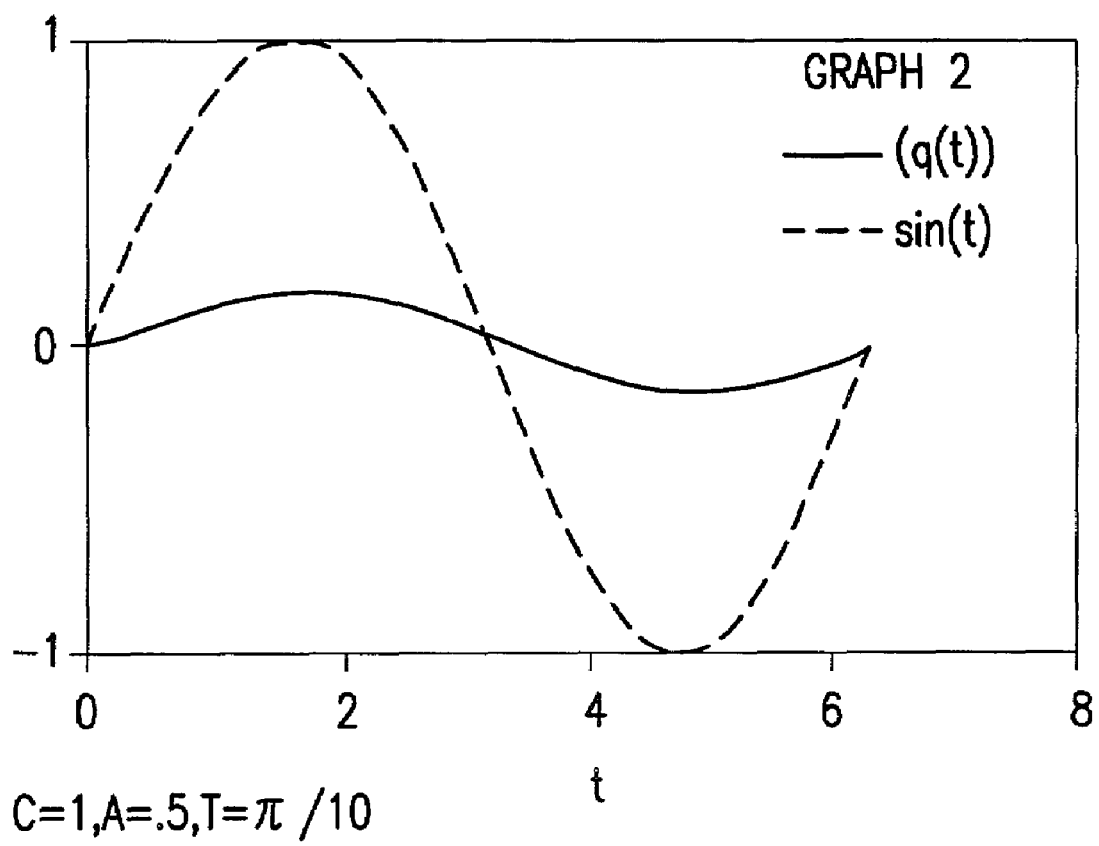
Figure 119:
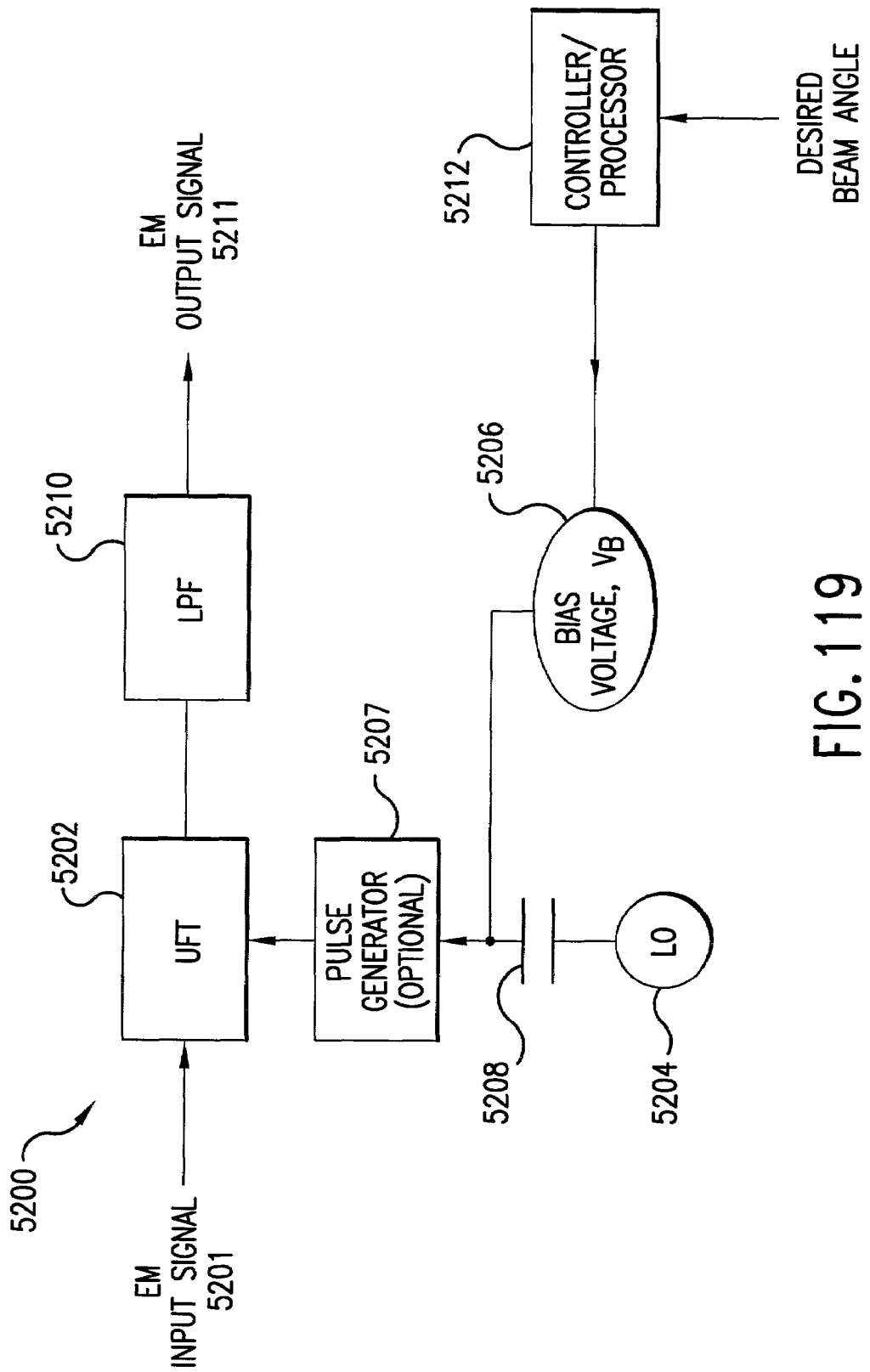

FIG. 106A-B shows a schematic of the circuit in FIG. 100 connected to an FSK source that alternates between 913 and 917 MHZ at a baud rate of 500 Kbaud according to an embodiment of the present invention;

FIG. 107A illustrates an example energy transfer system according to an embodiment of the invention;

FIGS. 107B-C illustrate example timing diagrams for the example system of FIG. 94A;

FIG. 108 illustrates an example bypass network according to an embodiment of the invention;

FIG. 109 illustrates an example bypass network according to an embodiment of the invention;

FIG. 110 illustrates an example embodiment of the invention;

FIG. 111A illustrates an example real time aperture control circuit according to an embodiment of the invention;

FIG. 111B illustrates a timing diagram of an example clock signal for real time aperture control, according to an embodiment of the invention;

FIG. 111C illustrates a timing diagram of an example optional enable signal for real time aperture control, according to an embodiment of the invention;

FIG. 111D illustrates a timing diagram of an inverted clock signal for real time aperture control, according to an embodiment of the invention;

FIG. 111E illustrates a timing diagram of an example delayed clock signal for real time aperture control, according to an embodiment of the invention;

FIG. 111F illustrates a timing diagram of an example energy transfer including pulses having apertures that are controlled in real time, according to an embodiment of the invention;

FIG. 112 illustrates an example embodiment of the invention;

FIG. 113 illustrates an example embodiment of the invention;

FIG. 114 illustrates an example embodiment of the invention;

FIG. 115 illustrates an example embodiment of the invention;

FIG. 116A is a timing diagram for the example embodiment of FIG. 112;

FIG. 116B is a timing diagram for the example embodiment of FIG. 113;

FIG. 117A is a timing diagram for the example embodiment of FIG. 114;

FIG. 117B is a timing diagram for the example embodiment of FIG. 115;

FIG. 118A illustrates and example embodiment of the invention;

FIG. 118B illustrates equations for determining charge transfer, in accordance with the present invention;

FIG. 118C illustrates relationships between capacitor charging and aperture, in accordance with the present invention;

FIG. 118D illustrates relationships between capacitor charging and aperture, in accordance with the present invention;

FIG. 118E illustrates power-charge relationship equations, in accordance with the present invention;

FIG. 118F illustrates insertion loss equations, in accordance with the present invention; and FIG. 119 illustrates a computer controlled phase shifter according to embodiments of the invention.

DETAILED DESCRIPTION OF THE PREFERRED EMBODIMENTS

Table of Contents

1. Universal Frequency Translation
2. Frequency Down-conversion
   2.1 Optional Energy Transfer Signal Module
   2.2 Smoothing the Down-Converted Signal
   2.3 Impedance Matching 2.4 Tanks and Resonant Structures
2.5 Charge and Power Transfer Concepts
2.6 Optimizing and Adjusting the Non-Negligible Aperture Width
   2.6.1 Varying Input and Output Impedances
   2.6.2 Real Time Aperture Control
2.7 Adding a Bypass Network
2.8 Modifying the Energy Transfer Signal Utilizing Feedback
2.9 Other Implementations
2.10. Example Energy Transfer Down-Converters
3. Frequency Up-conversion
4. Enhanced Signal Reception
5. Unified Down-conversion and Filtering
6. Example Application Embodiments of the Invention
7. Specific Phase Shifter Embodiments Using Universal Frequency Translation
   7.1 High Level Description
   7.2 Specific Phase Shifting Embodiments
      7.2.1 Changing a Bias Voltage of the LO Signal
         7.2.1.1 Down-Conversion
         7.2.1.2 Up-Conversion
      7.2.2 Changing the Delay of the LO Signal
         7.2.2.1 Down-Conversion
         7.2.2.2 Up-Conversion
         7.2.2.3 Dual Feed Structure
      7.2.3 Changing the Shape of the LO Signal
         7.2.3.1 Down-Conversion
         7.2.3.2 Up-Conversion
      7.2.4 Phase Shifting Without Using a Pulse Generator
   7.3 Antenna Applications of Universal Frequency Translation
      7.3.1 Overview of Adaptive Beam Forming
      7.3.2 UFT Module Transmission Phase Characteristics
      7.3.3. Two-Element Antenna Design Example using UFT modules as Phase Shifters
      7.3.4 Phased Array Embodiments including 2-D Antenna Arrays
      7.3.5 Generating Elliptical and Circular Polarization Using UFT Modules
      7.3.6 Intelligent Adaptive Beam Forming using UFT Modules
      7.3.7 Example Antenna Applications of the Present Invention
8. Conclusion

1.0 Universal Frequency Translation

The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
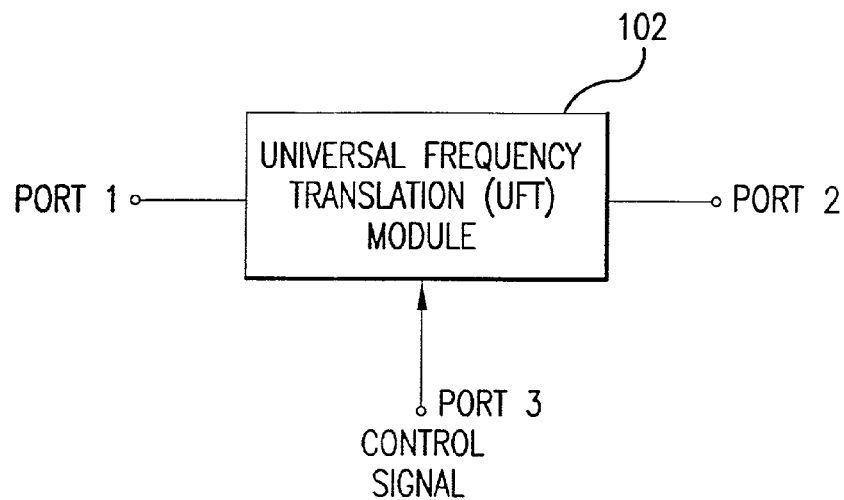
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
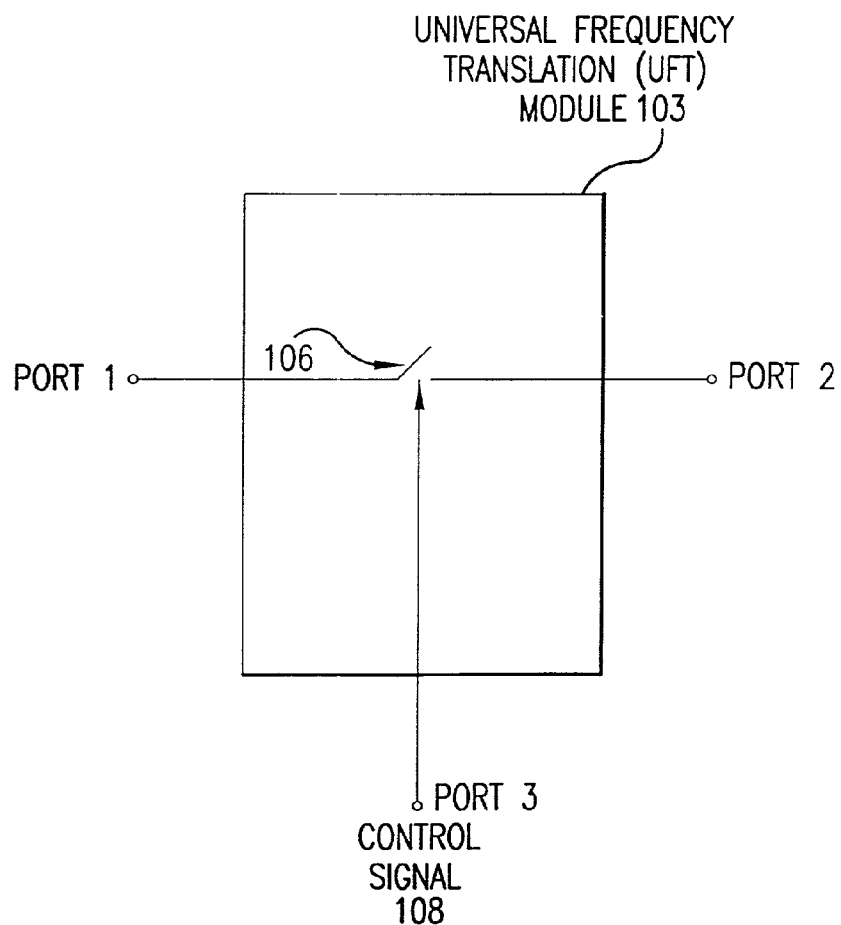
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2A:
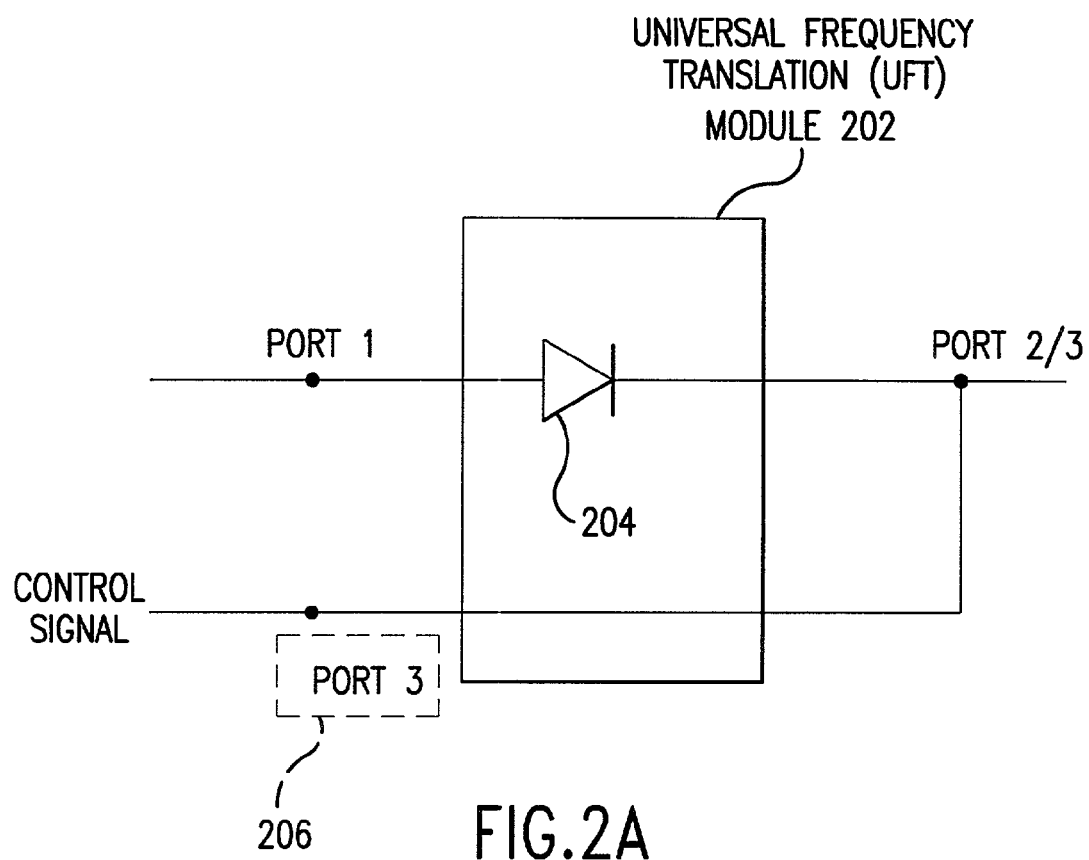
FIG. 2A is a diagram of a universal frequency translation (UFT) module according to embodiments of the invention.
Figure 2B:
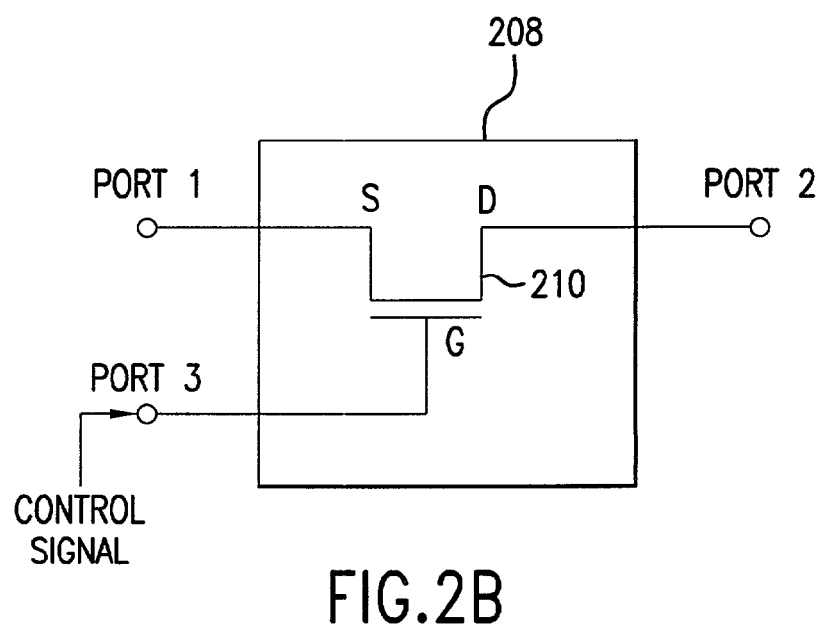
FIG. 2B is a diagram of a universal frequency translation (UFT) module according to embodiments of the invention.

As noted above, some UFT embodiments include other than three ports. For example, and without limitation, FIG. 2A illustrates an example UFT module 202. The example UFT module 202 includes a diode 204 having two ports, designated as Port 1 and Port 2/3. This embodiment does not include a third port, as indicated by the dotted line around the "Port 3" label. FIG. 2B illustrates a second example UFT module 208 having a FET 210 whose gate is controlled by the control signal.

The UFT module is a very powerful and flexible device. Its flexibility is illustrated, in part, by the wide range of applications in which it can be used. Its power is illustrated, in part, by the usefulness and performance of such applications.

Figure 1C:
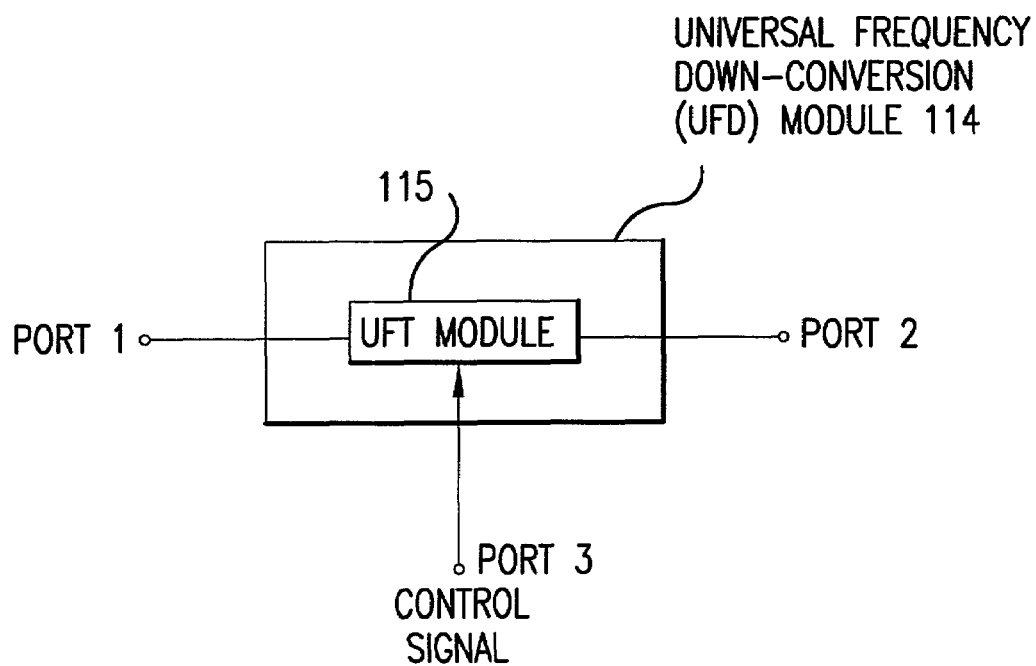
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
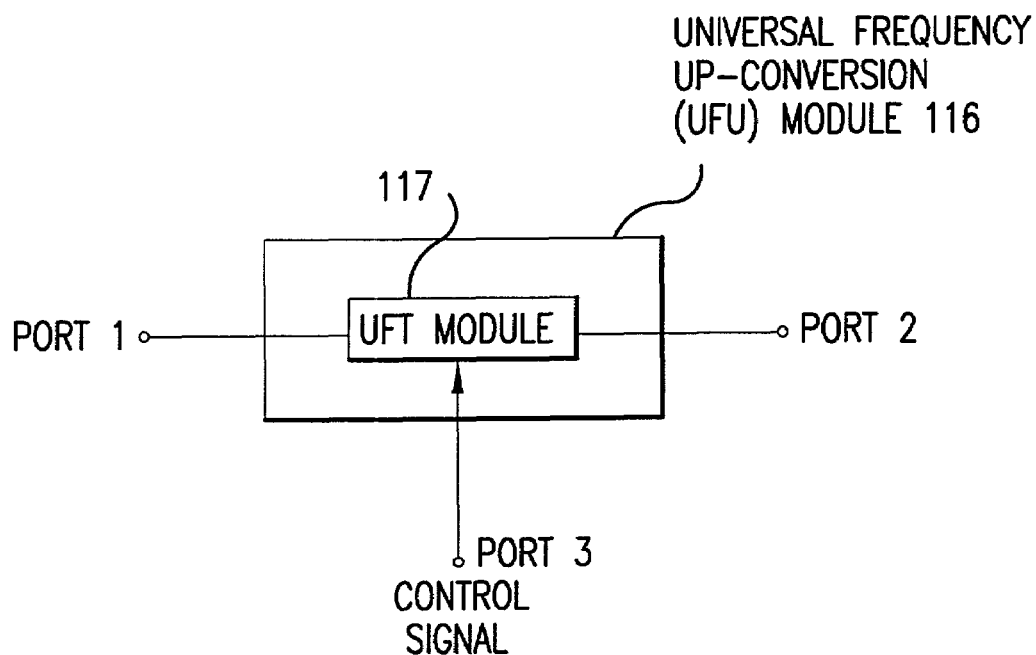
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2.0 Frequency Down-conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in U.S. Patent Application entitled "Method and System for Down-Converting Electromagnetic Signals," Ser. No. 09/176,022, filed Oct. 21, 1998, issued as U.S. Pat. No. 6,061,551 on May 10, 2000, the full disclosure of which is incorporated herein by reference. A relevant portion of the above mentioned patent application is summarized below to describe down-converting an input signal to produce a down-converted signal that exists at a lower frequency or a baseband signal.

Figure 20A:
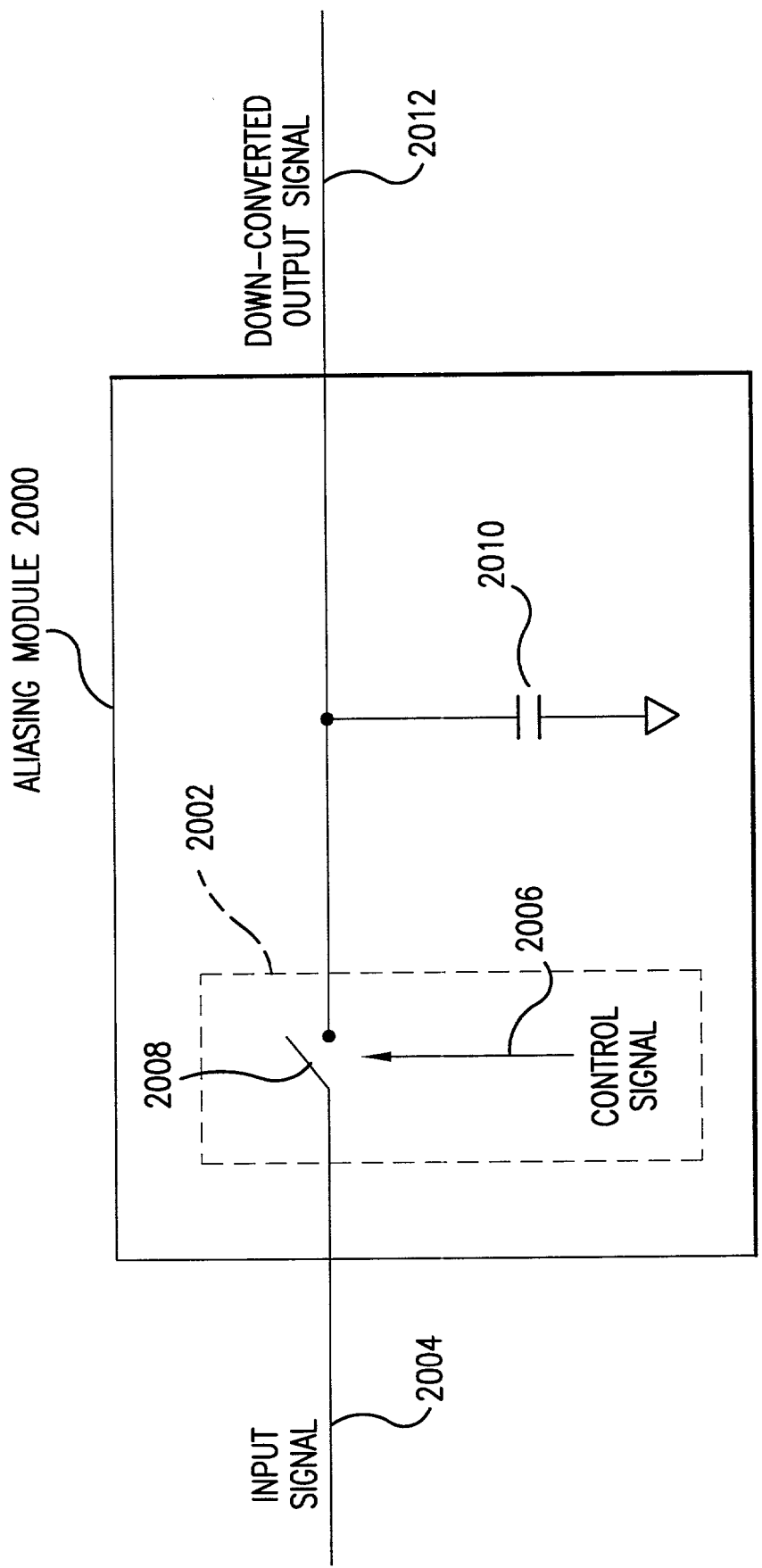
FIGS. 20A and 20A-1 are example aliasing modules according to embodiments of the invention.
Figures 1, 20A:
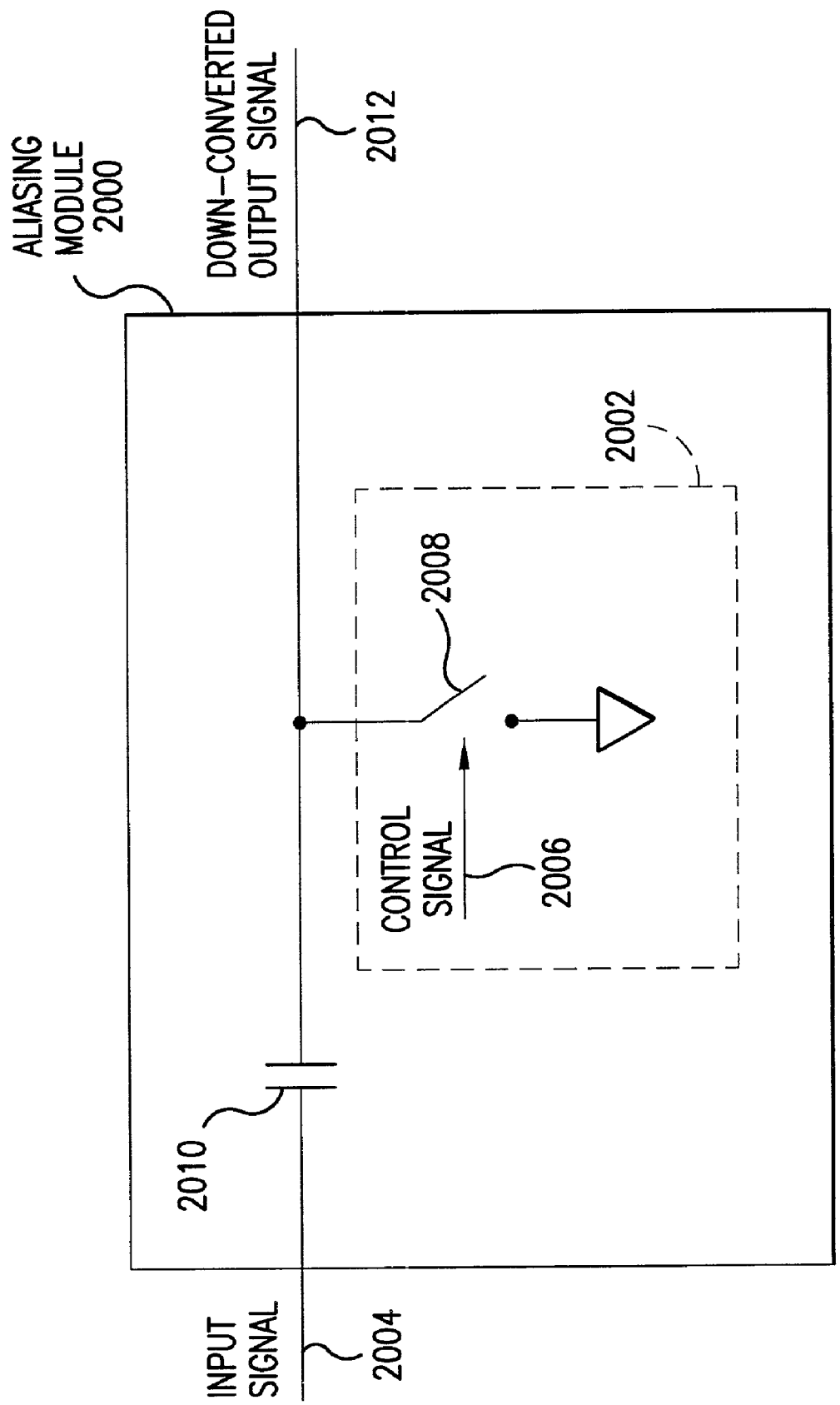

FIG. 20A illustrates an aliasing module 2000 (one embodiment of a UFD module) for down-conversion using a universal frequency translation (UFT) module 2002, which down-converts an EM input signal 2004. In particular embodiments, aliasing module 2000 includes a switch 2008 and a capacitor 2010. The electronic alignment of the circuit components is flexible. That is, in one implementation, the switch 2008 is in series with input signal 2004 and capacitor 2010 is shunted to ground (although it may be other than ground in configurations such as differential mode). In a second implementation (see FIG. 20A-1), the capacitor 2010 is in series with the input signal 2004 and the switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of the EM input signal 2004.

In one implementation, aliasing module 2000 down-converts the input signal 2004 to an intermediate frequency (IF) signal. In another implementation, the aliasing module 2000 down-converts the input signal 2004 to a demodulated baseband signal. In yet another implementation, the input signal 2004 is a frequency modulated (FM) signal, and the aliasing module 2000 down-converts it to a non-FM signal, such as a phase modulated (PM) signal or an amplitude modulated (AM) signal. Each of the above implementations is described below.

In an embodiment, the control signal 2006 includes a train of pulses that repeat at an aliasing rate that is equal to, or less than, twice the frequency of the input signal 2004. In this embodiment, the control signal 2006 is referred to herein as an aliasing signal because it is below the Nyquist rate for the frequency of the input signal 2004. Preferably, the frequency of control signal 2006 is much less than the input signal 2004.

Figure 20B:
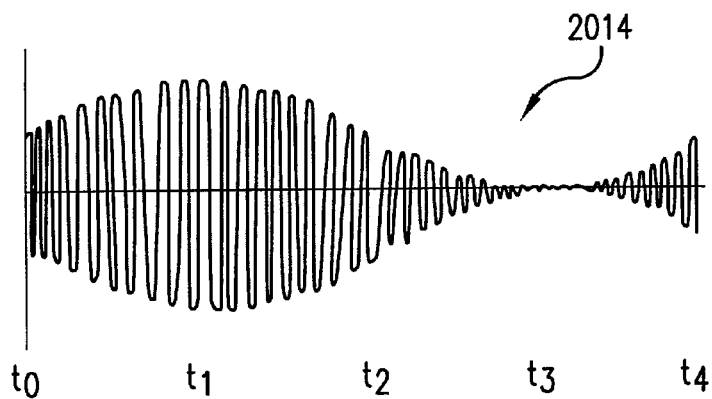
FIGS. 20B-20F are example waveforms used to describe the operation of the aliasing modules of FIGS. 20A and 20A-1.
Figure 20C:
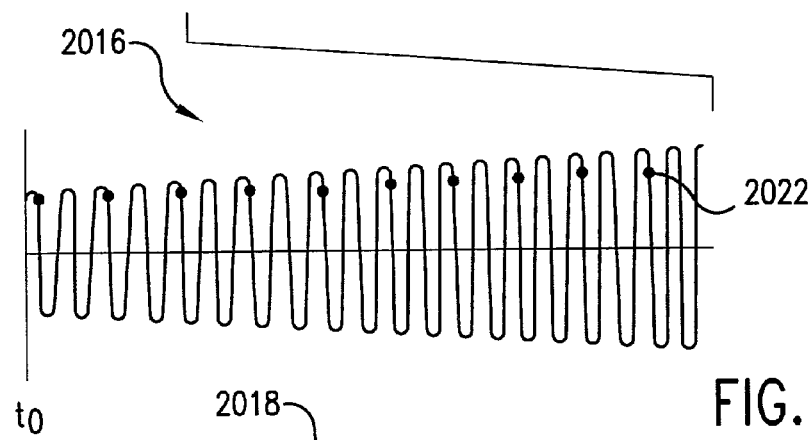
Figure 20D:
Figure 20E:
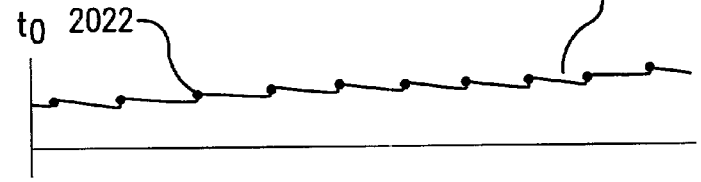

A train of pulses 2018 as shown in FIG. 20D controls the switch 2008 to alias the input signal 2004 with the control signal 2006 to generate a down-converted output signal 2012. More specifically, in an embodiment, switch 2008 closes on a first edge of each pulse 2020 of FIG. 20D and opens on a second edge of each pulse. When the switch 2008 is closed, the input signal 2004 is coupled to the capacitor 2010, and charge is transferred from the input signal to the capacitor 2010. The charge stored during successive pulses forms down-converted output signal 2012.

Exemplary waveforms are shown in FIGS. 20B-20F.

FIG. 20B illustrates an analog amplitude modulated (AM) carrier signal 2014 that is an example of input signal 2004. For illustrative purposes, in FIG. 20C, an analog AM carrier signal portion 2016 illustrates a portion of the analog AM carrier signal 2014 on an expanded time scale. The analog AM carrier signal portion 2016 illustrates the analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as the analog AM carrier signal portion 2016. In the example shown in FIG. 20D, the aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). The pulses 2020 repeat at an aliasing rate, or pulse repetition rate of aliasing signal 2018. The aliasing rate is determined as described below, and further described in the U.S. patent application entitled "Method and System for Down-converting Electromagnetic Signals," Ser. No. 09/176,022, filed Oct. 21, 1998, issued as U.S. Pat. No. 6,061,551 on May 10, 2000.

Figure 20F:
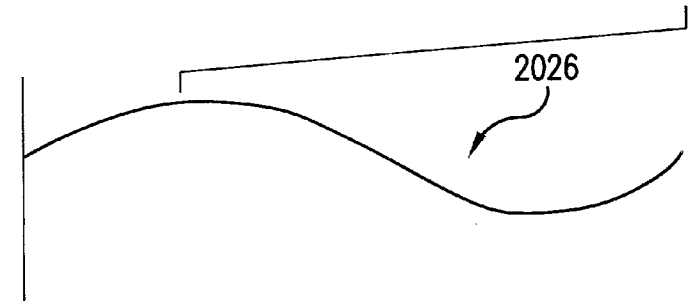

As noted above, the train of pulses 2020 (i.e., control signal 2006) control the switch 2008 to alias the analog AM carrier signal 2016 (i.e., input signal 2004) at the aliasing rate of the aliasing signal 2018. Specifically, in this embodiment, the switch 2008 closes on a first edge of each pulse and opens on a second edge of each pulse. When the switch 2008 is closed, input signal 2004 is coupled to the capacitor 2010, and charge is transferred from the input signal 2004 to the capacitor 2010. The charge transferred during a pulse is referred to herein as an under-sample. Exemplary under-samples 2022 form down-converted signal portion 2024 (FIG. 20E) that corresponds to the analog AM carrier signal portion 2016 (FIG. 20C) and the train of pulses 2020 (FIG. 20D). The charge stored during successive under-samples of AM carrier signal 2014 form the down-converted signal 2024 (FIG. 20E) that is an example of down-converted output signal 2012 (FIG. 20A). In FIG. 20F, a demodulated baseband signal 2026 represents the demodulated baseband signal 2024 after filtering on a compressed time scale. As illustrated, down-converted signal 2026 has substantially the same "amplitude envelope" as AM carrier signal 2014. Therefore, FIGS. 20B-20F illustrate down-conversion of AM carrier signal 2014.

The waveforms shown in FIGS. 20B-20F are discussed herein for illustrative purposes only, and are not limiting. Additional exemplary time domain and frequency domain drawings, and exemplary methods and systems of the invention relating thereto, are disclosed in U.S. patent application entitled "Method and System for Down-converting Electromagnetic Signals," Ser. No. 09/176,022, filed Oct. 21, 1998, issued as U.S. Pat. No. 6,061,551 on May 10, 2000.

The aliasing rate of control signal 2006 determines whether the input signal 2004 is down-converted to an IF signal, down-converted to a demodulated baseband signal, or down-converted from an FM signal to a PM or an AM signal. Generally, relationships between the input signal 2004, the aliasing rate of the control signal 2006, and the down-converted output signal 2012 are illustrated below:

(Freq. of input signal 2004)=$n$·(Freq. of control signal 2006)±(Freq. of down-converted output signal 2012)

For the examples contained herein, only the "+" condition will be discussed. The value of n represents a harmonic or sub-harmonic of input signal 2004 (e.g., n=0.5, 1, 2, 3, ... ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If the input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 2006 would be calculated as follows:

(Freq$_{input}$−Freq$_{IF}$)/$n$=Freq$_{control}$ (901 MHZ−1 MHZ)/$n$=900/$n$

For n=0.5, 1, 2, 3, 4, etc., the frequency of the control signal 2006 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in U.S. Patent Application entitled "Method and System for Down-converting Electromagnetic Signals," Ser. No.09/176,022, filed Oct. 21, 1998, issued as U.S. Pat. No. 6,061,551 on May 10, 2000.

Alternatively, when the aliasing rate of the control signal 2006 is substantially equal to the frequency of the input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of the input signal 2004. As a result, the under-samples form a constant output baseband signal. If the input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 2006 would be calculated as follows:

(Freq$_{input}$=Freq$_{IF}$)/$n$=Freq$_{control}$ (900 MHZ−0 MHZ)/$n$=900 MHZ/$n$ For n=0.5, 1, 2, 3, 4, etc., the frequency of the control signal 2006 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in the U.S. patent application entitled "Method and System for Down-converting Electromagnetic Signals," Ser. No. 09/176,022, filed Oct. 21, 1998, issued as U.S. Pat. No. 6,061,551 on May 10, 2000.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 2006 would be calculated as follows:

$$\text{Frequency of the input} = (F_1 + F_2) \div 2$$
$$= (899 \text{ MHZ} + 901 \text{ MHZ}) \div 2$$
$$= 900 \text{ MHZ}$$

Frequency of the down-converted signal=0 (i.e., baseband)

(Freq$_{input}$−Freq$_{IF}$)/$n$=Freq$_{control}$ (900 MHZ−0 MHZ)/$n$=900 MHZ/$n$ For n=0.5, 1, 2, 3, etc., the frequency of the control signal 2006 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 2006 should be substantially equal to:

(900 MHZ−0 MHZ)/$n$=900 MHZ/$n$, or (901 MHZ−0 MHZ)/$n$=901 MHZ/$n$.

For the former case of 900 MHZ/$n$, and for n=0.5, 1, 2, 3, 4, etc., the frequency of the control signal 2006 should be substantially equal to 1.8 GHz, 900 MHZ, 450 MHZ, 300 MHZ, 225 MHZ, etc. For the latter case of 901 MHZ/$n$, and for n=0.5, 1, 2, 3, 4, etc., the frequency of the control signal 2006 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in the U.S. patent application entitled "Method and System for Down-converting Electromagnetic Signals," Ser. No. 09/176,022, filed Oct. 21, 1998, issued as U.S. Pat. No. 6,061,551 on May 10, 2000.

In an embodiment, the pulses of the control signal 2006 have negligible apertures that tend towards zero. This makes the UFT module 2002 a high input impedance device. This configuration is useful for situations where minimal disturbance of the input signal may be desired.

In another embodiment, the pulses of the control signal 2006 have non-negligible apertures that tend away from zero. This makes the UFT module 2002 a lower input impedance device. This allows the lower input impedance of the UFT module 2002 to be substantially matched with a source impedance of the input signal 2004. This also improves the energy transfer from the input signal 2004 to the down-converted output signal 2012, and hence the efficiency and signal to noise (s/n) ratio of UFT module 2002.

Exemplary systems and methods for generating and optimizing the control signal 2006 and for otherwise improving energy transfer and s/n ratio, are disclosed in the U.S. patent application entitled "Method and System for Down-converting Electromagnetic Signals," Ser. No. 09/176,022, filed Oct. 21, 1998, issued as U.S. Pat. No. 6,061,551 on May 10, 2000.

When the pulses of the control signal 2006 have non-negligible apertures, the aliasing module 2000 is referred to interchangeably herein as an energy transfer module or a gated transfer module, and the control signal 2006 is referred to as an energy transfer signal. Exemplary systems and methods for generating and optimizing the control signal 2006 and for otherwise improving energy transfer and/or signal to noise ratio in an energy transfer module are described below.

2.1 Optional Energy Transfer Signal Module

Figure 94:
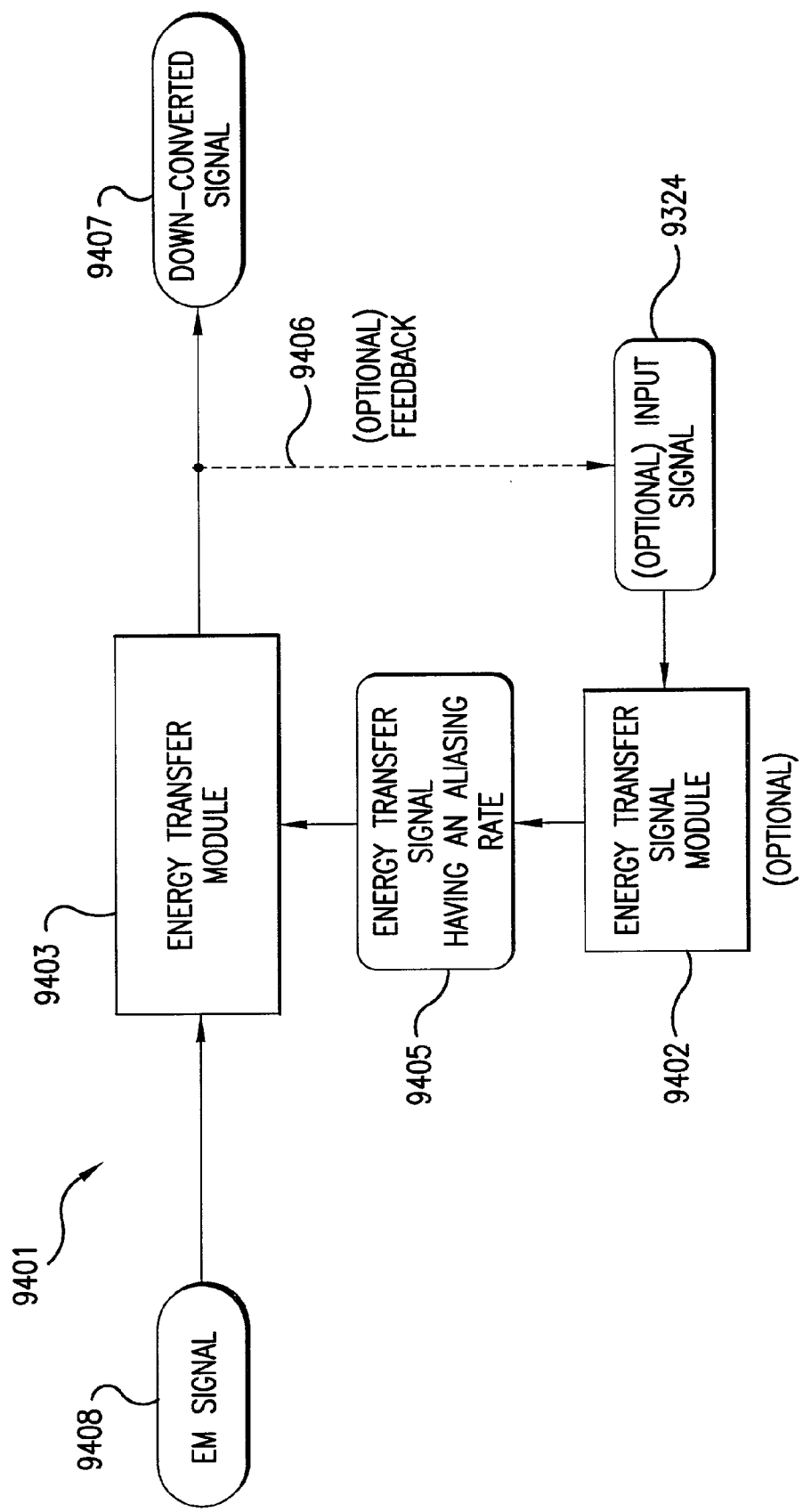
FIG. 94 illustrates an energy transfer system with an optional energy transfer signal module according to an embodiment of the invention.

FIG. 94 illustrates an energy transfer system 9401 that includes an optional energy transfer signal module 9402, which can perform any of a variety of functions or combinations of functions including, but not limited to, generating the energy transfer signal 9405.

Figure 93A:
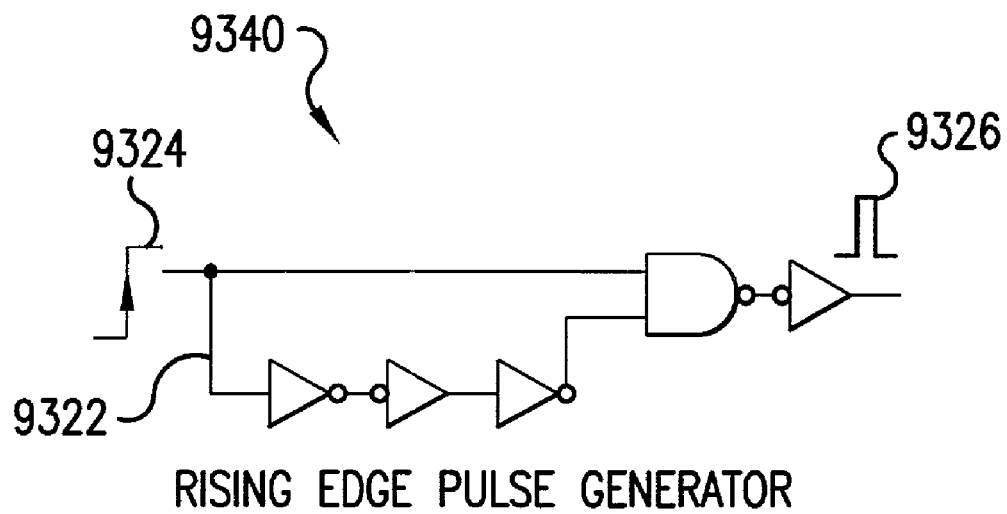
FIGS. 93A-D illustrate example pulse generators.
Figure 93B:
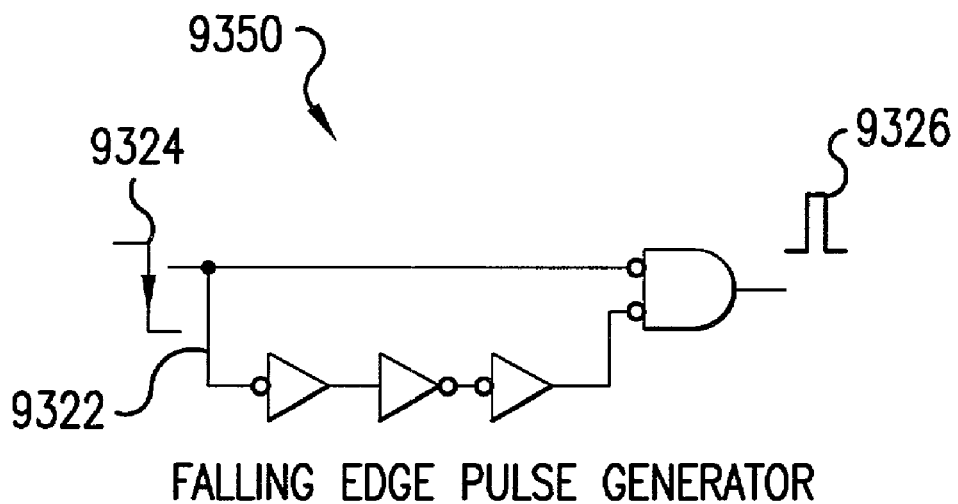
Figure 93C:
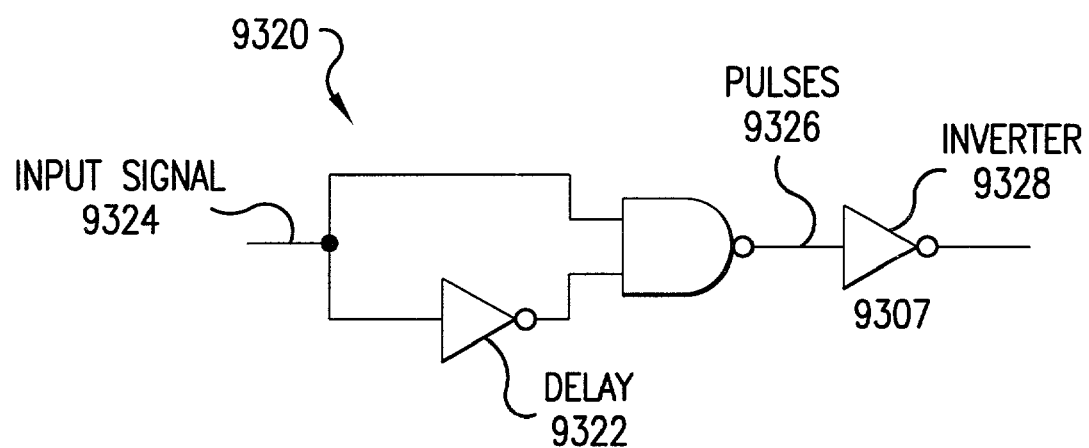

In an embodiment, the optional energy transfer signal module 9402 includes an aperture generator, an example of which is illustrated in FIG. 93C as an aperture generator 9320. The aperture generator 9320 generates non-negligible aperture pulses 9326 from an input signal 9324. The input signal 9324 can be any type of periodic signal, including, but not limited to, a sinusoid, a square wave, a saw-tooth wave, etc. Systems for generating the input signal 9324 are described below.

The width or aperture of the pulses 9326 is determined by delay through the branch 9322 of the aperture generator 9320. Generally, as the desired pulse width increases, the difficulty in meeting the requirements of the aperture generator 9320 decrease. In other words, to generate non-negligible aperture pulses for a given EM input frequency, the components utilized in the example aperture generator 9320 do not require as fast reaction times as those that are required in an under-sampling system operating with the same EM input frequency.

The example logic and implementation shown in the aperture generator 9320 are provided for illustrative purposes only, and are not limiting. The actual logic employed can take many forms. The example aperture generator 9320 includes an optional inverter 9328, which is shown for polarity consistency with other examples provided herein.

Figure 93E:
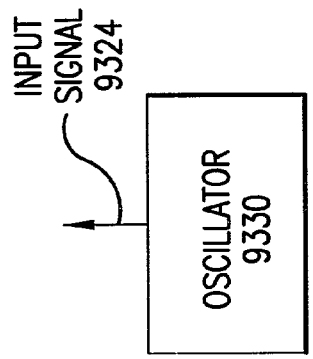
FIG. 93E illustrates an oscillator according to an embodiment of the present invention.
Figure 93D:
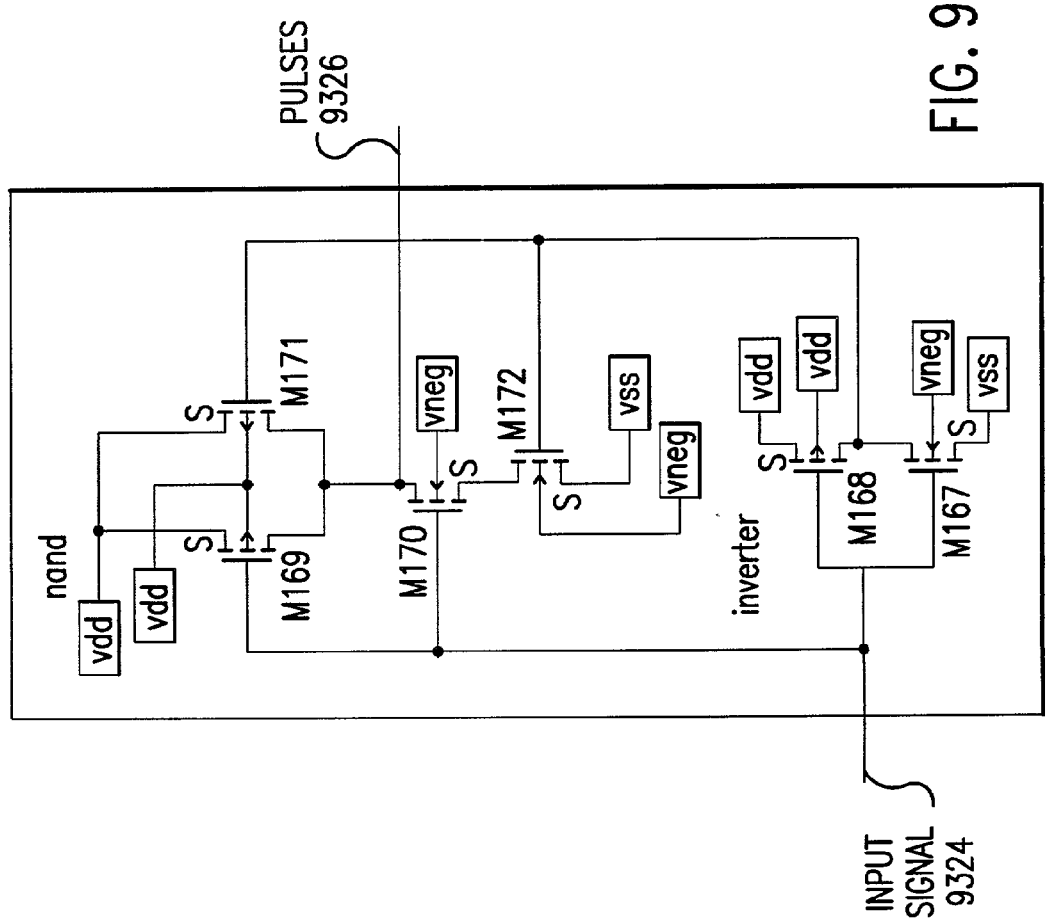

An example implementation of the aperture generator 9320 is illustrated in FIG. 93D. Additional examples of aperture generation logic are provided in FIGS. 93A and 93B. FIG. 93A illustrates a rising edge pulse generator 9340, which generates pulses 9326 on rising edges of the input signal 9324. FIG. 93B illustrates a falling edge pulse generator 9350, which generates pulses 9326 on falling edges of the input signal 9324.

In an embodiment, the input signal 9324 is generated externally of the energy transfer signal module 9402, as illustrated in FIG. 94. Alternatively, the input signal 9324 is generated internally by the energy transfer signal module 9402. The input signal 9324 can be generated by an oscillator, as illustrated in FIG. 93E by an oscillator 9330. The oscillator 9330 can be internal to the energy transfer signal module 9402 or external to the energy transfer signal module 9402. The oscillator 3930 can be external to the energy transfer system 9401. The output of the oscillator 3930 may be any periodic waveform.

The type of down-conversion performed by the energy transfer system 9401 depends upon the aliasing rate of the energy transfer signal 9405, which is determined by the frequency of the pulses 9326. The frequency of the pulses 9326 is determined by the frequency of the input signal 9324. For example, when the frequency of the input signal 9324 is substantially equal to a harmonic or a sub-harmonic of the EM signal 9408, the EM signal 9408 is directly down-converted to baseband (e.g. when the EM signal is an AM signal or a PM signal), or converted from FM to a non-FM signal. When the frequency of the input signal 9324 is substantially equal to a harmonic or a sub-harmonic of a difference frequency, the EM signal 9408 is down-converted to an intermediate signal.

The optional energy transfer signal module 9402 can be implemented in hardware, software, firmware, or any combination thereof.

2.2. Smoothing the Down-Converted Signal

Referring back to FIG. 20A, the down-converted output signal 2012 may be smoothed by filtering as desired.

2.3. Impedance Matching

The energy transfer module 2000 has input and output impedances generally defined by (1) the duty cycle of the switch module (i.e., UFT 2002), and (2) the impedance of the storage module (e.g., capacitor 2010), at the frequencies of interest (e.g. at the EM input, and intermediate/baseband frequencies).

Starting with an aperture width of approximately ½ the period of the EM signal being down-converted as a preferred embodiment, this aperture width (e.g. the "closed time") can be decreased. As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Figure 95:
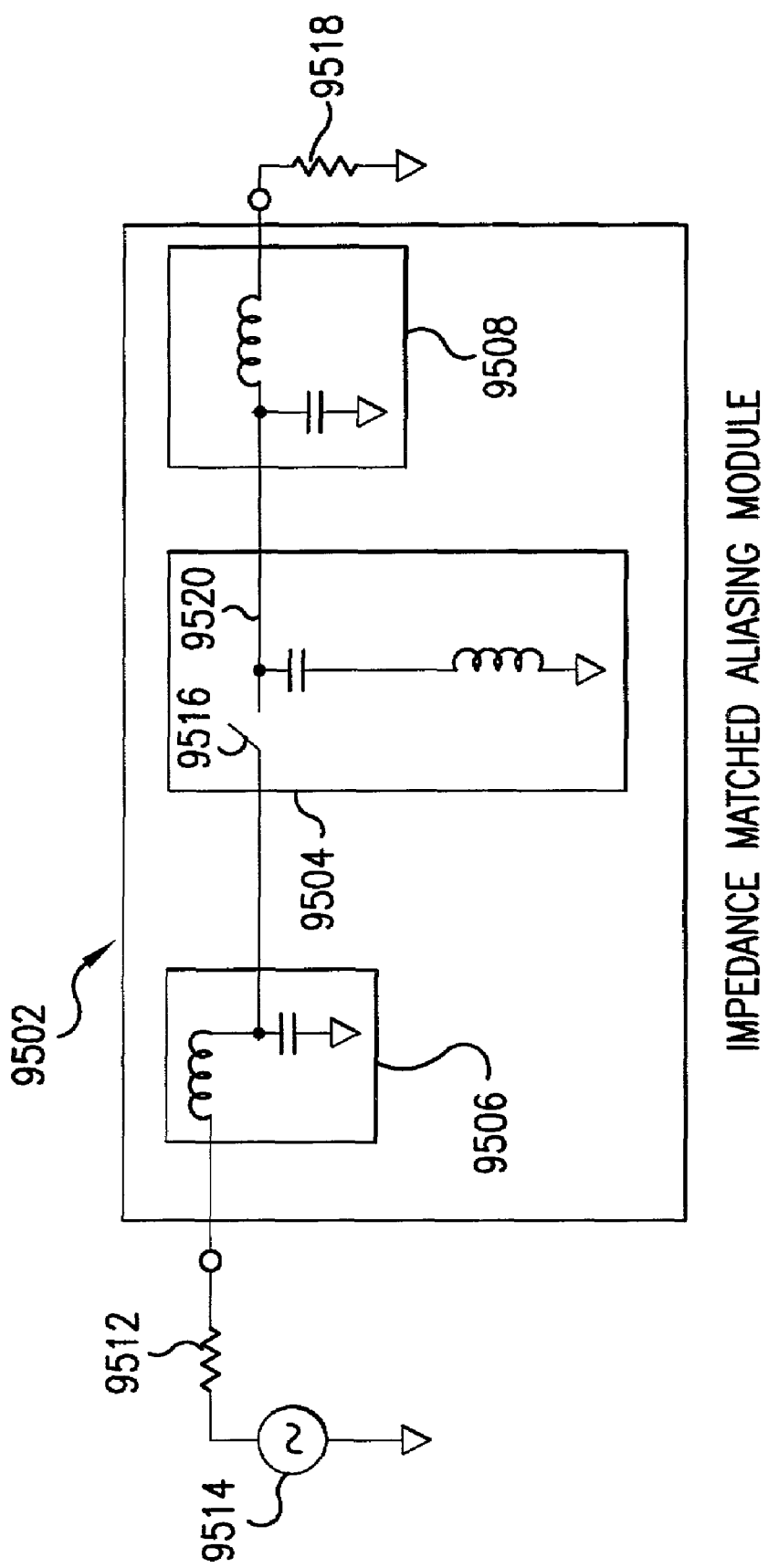
FIG. 95 illustrates an aliasing module with input and output impedance match according to an embodiment of the invention.
Figure 97:
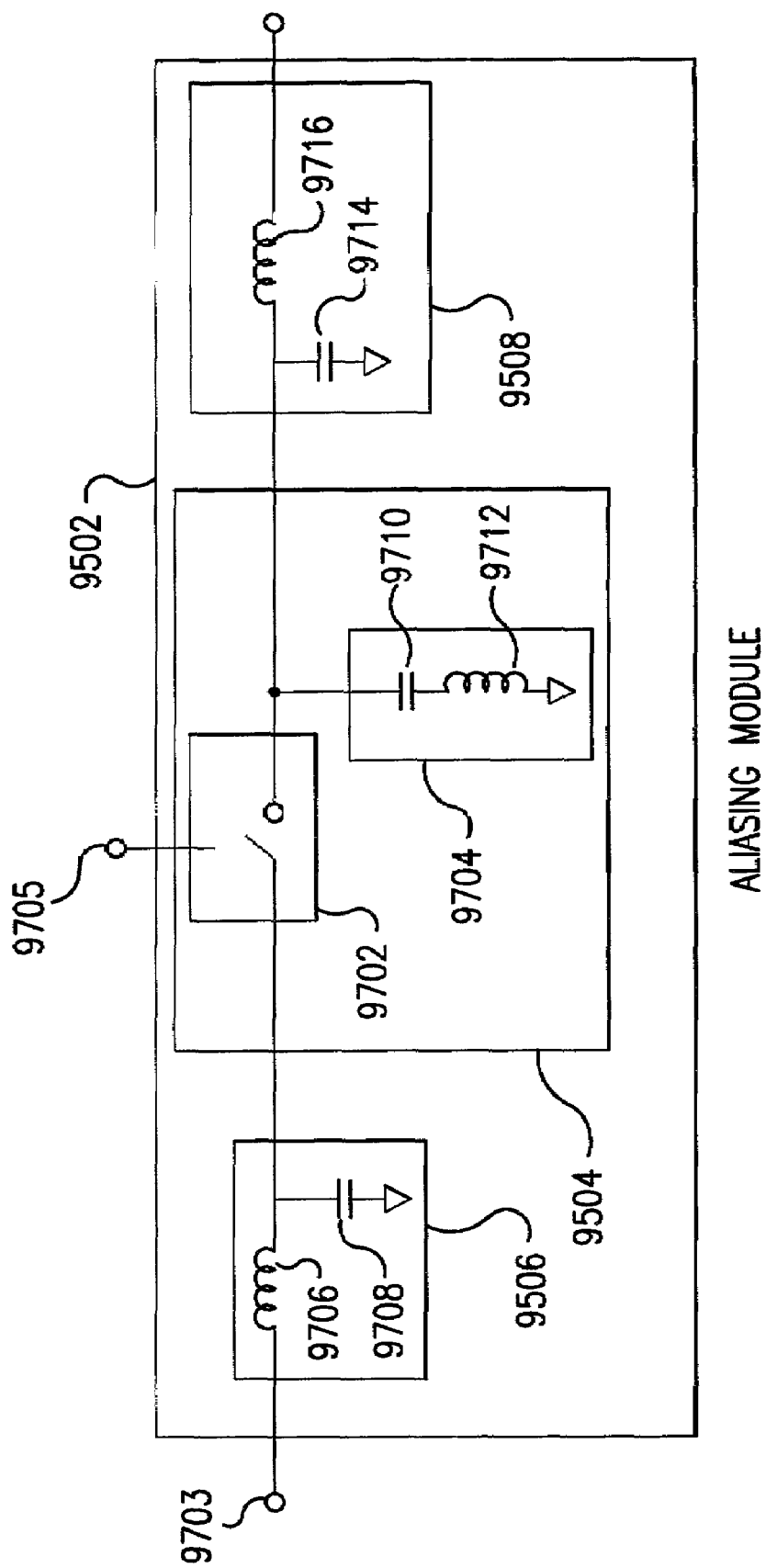
FIG. 97 illustrates an example energy transfer module with a switch module and a reactive storage module according to an embodiment of the invention.

Referring to FIG. 95, a specific embodiment using an RF signal as an input, assuming that the impedance 9512 is a relatively low impedance of approximately 50 Ohms, for example, and the input impedance 9516 is approximately 300 Ohms, an initial configuration for the input impedance match module 9506 can include an inductor 9706 and a capacitor 9708, configured as shown in FIG. 97. The configuration of the inductor 9706 and the capacitor 9708 is a possible configuration when going from a low impedance to a high impedance. Inductor 9706 and the capacitor 9708 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 9714 and an inductor 9716 can be configured for the output impedance match 9508, as shown in FIG. 97. The capacitor 9714 and the inductor 9716 constitute an L match, the calculation of the component values being well known to those skilled in the relevant arts.

The configuration of the input impedance match module 9506 and the output impedance match module 9508 are considered to be initial starting points for impedance matching, in accordance with the present invention. In some situations, the initial designs may be suitable without further optimization. In other situations, the initial designs can be optimized in accordance with other various design criteria and considerations.

As other optional optimizing structures and/or components are utilized, their affect on the characteristic impedance of the energy transfer module should be taken into account in the match along with their own original criteria.

2.4 Tanks and Resonant Structures

Resonant tank and other resonant structures can be used to further optimize the energy transfer characteristics of the invention. For example, resonant structures, resonant about the input frequency, can be used to store energy from the input signal when the switch is open, a period during which one may conclude that the architecture would otherwise be limited in its maximum possible efficiency. Resonant tank and other resonant structures can include, but are not limited to, surface acoustic wave (SAW) filters, dielectric resonators, diplexers, capacitors, inductors, etc.

An example embodiment is shown in FIG. 107A. Two additional embodiments are shown in FIG. 112 and FIG. 110. Alternate implementations will be apparent to persons skilled in the relevant art(s) based on the teachings contained herein. Alternate implementations fall within the scope and spirit of the present invention. These implementations take advantage of properties of series and parallel (tank) resonant circuits.

FIG. 107A illustrates parallel tank circuits in a differential implementation. A first parallel resonant or tank circuit consists of a capacitor 10738 and an inductor 10720 (tank1). A second tank circuit consists of a capacitor 10734 and an inductor 10736 (tank2).

As is apparent to one skilled in the relevant art(s), parallel tank circuits provide:
low impedance to frequencies below resonance;
low impedance to frequencies above resonance; and
high impedance to frequencies at and near resonance.

In the illustrated example of FIG. 107A, the first and second tank circuits resonate at approximately 920 Mhz. At and near resonance, the impedance of these circuits is relatively high. Therefore, in the circuit configuration shown in FIG. 107A, both tank circuits appear as relatively high impedance to the input frequency of 950 MHZ, while simultaneously appearing as relatively low impedance to frequencies in the desired output range of 50 Mhz.

An energy transfer signal 10742 controls a switch 10714. When the energy transfer signal 10742 controls the switch 10714 to open and close, high frequency signal components are not allowed to pass through tank1 or tank2. However, the lower signal components (50Mhz in this embodiment) generated by the system are allowed to pass through tank1 and tank2 with little attenuation. The effect of tank1 and tank2 is to further separate the input and output signals from the same node thereby producing a more stable input and output impedance. Capacitors 10718 and 10740 act to store the 50 MHZ output signal energy between energy transfer pulses.

Further energy transfer optimization is provided by placing an inductor 10710 in series with a storage capacitor 10712 as shown. In the illustrated example, the series resonant frequency of this circuit arrangement is approximately 1 GHz. This circuit increases the energy transfer characteristic of the system. The ratio of the impedance of inductor 10710 and the impedance of the storage capacitor 10712 is preferably kept relatively small so that the majority of the energy available will be transferred to storage capacitor 10712 during operation. Exemplary output signals A and B are illustrated in FIGS. 107B and 107C, respectively.

In FIG. 107A, circuit components 10704 and 10706 form an input impedance match. Circuit components 10732 and 10730 form an output impedance match into a 50 ohm resistor 10728. Circuit components 10722 and 10724 form a second output impedance match into a 50 ohm resistor 10726. Capacitors 10708 and 10712 act as storage capacitors for the embodiment. Voltage source 10746 and resistor 10702 generate a 950 MHZ signal with a 50 ohm output impedance, which are used as the input to the circuit. Circuit element 10716 includes a 150 MHZ oscillator and a pulse generator, which are used to generate the energy transfer signal 10742.

Figure 102:
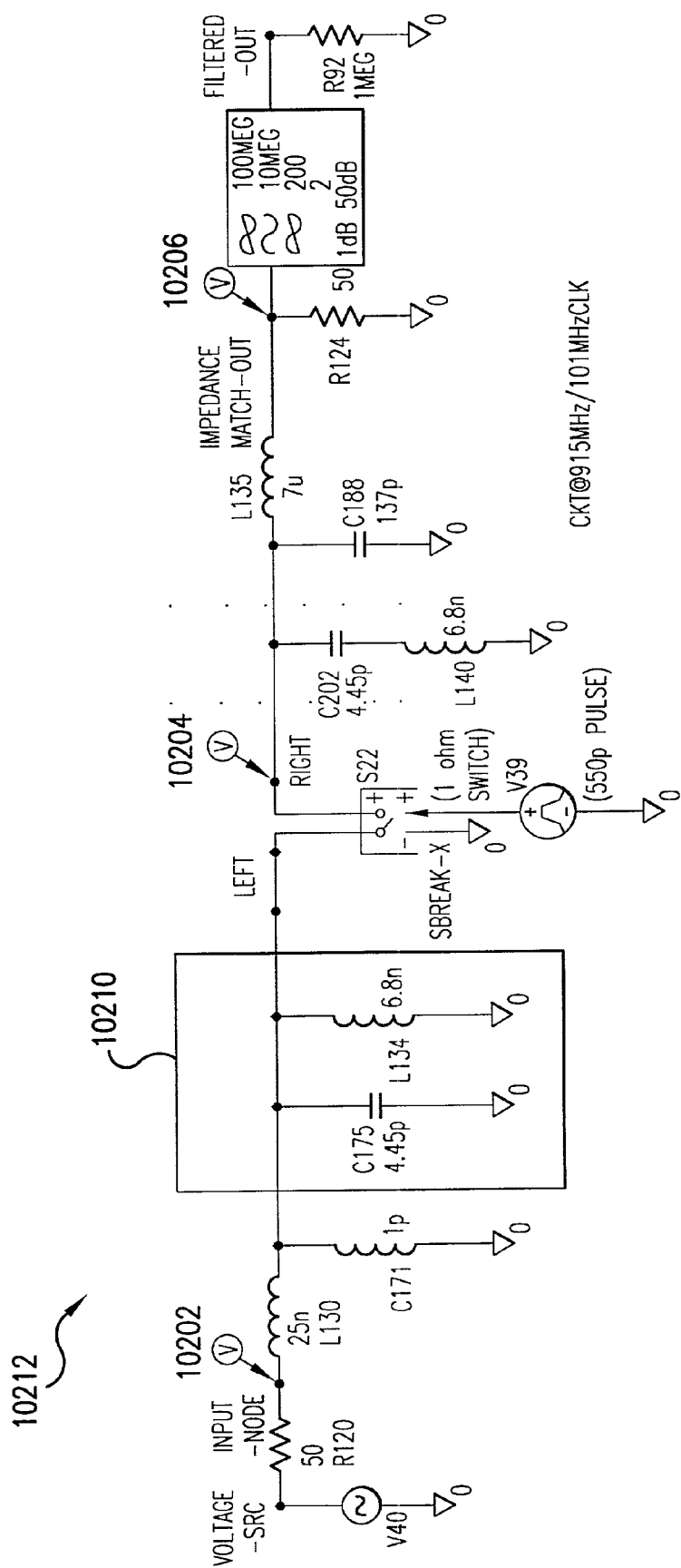
FIG. 102 is a schematic diagram of a circuit to down-convert a 915 MHZ signal to a 5 MHZ signal using a 101 MHZ clock according to an embodiment of the present invention.

FIG. 102 illustrates a shunt tank circuit 10210 in a single-ended to-single-ended system 10212. Similarly, FIG. 110 illustrates a shunt tank circuit 11010 in a system 11012. The tank circuits 10210 and 11010 lower driving source impedance, which improves transient response. The tank circuits 10210 and 11010 are able store the energy from the input signal and provide a low driving source impedance to transfer that energy throughout the aperture of the closed switch. The transient nature of the switch aperture can be viewed as having a response that, in addition to including the input frequency, has large component frequencies above the input frequency, (i.e. higher frequencies than the input frequency are also able to effectively pass through the aperture). Resonant circuits or structures, for example resonant tanks 10210 or 11010, can take advantage of this by being able to transfer energy throughout the switch's transient frequency response (i.e. the capacitor in the resonant tank appears as a low driving source impedance during the transient period of the aperture).

The example tank and resonant structures described above are for illustrative purposes and are not limiting. Alternate configurations can be utilized. The various resonant tanks and structures discussed can be combined or utilized independently as is now apparent.

2.5 Charge and Power Transfer Concepts

Concepts of charge transfer are now described with reference to FIGS. 118A-F. FIG. 118A illustrates a circuit 11802, including a switch S and a capacitor 11806 having a capacitance C. The switch S is controlled by a control signal 11808, which includes pulses 11810 having apertures T.

In FIG. 118B, Equation A illustrates that the charge q on a capacitor having a capacitance C, such as the capacitor 11806, is proportional to the voltage V across the capacitor, where:

q=Charge in Coulombs

C=Capacitance in Farads

V=Voltage in Volts

A=Input Signal Amplitude

Where the voltage V is represented by Equation B, Equation A can be rewritten as Equation C. The change in charge Δq over time t is illustrated as in Equation D as Δq(t), which can be rewritten as Equation E. Using the sum-to-product trigonometric identity of Equation F, Equation E can be rewritten as Equation G, which can be rewritten as equation H.

Note that the sin term in Equation B is a function of the aperture T only. Thus, Δq(t) is at a maximum when T is equal to an odd multiple of π (i.e., π, 3π, 5π, . . . ). Therefore, the capacitor 10906 experiences the greatest change in charge when the aperture T has a value of π or a time interval representative of 180 degrees of the input sinusoid. Conversely, when T is equal to 2π, 4π, 6π, . . . , minimal charge is transferred.

Equations I, J, and K solve for q(t) by integrating Equation A, allowing the charge on the capacitor 11806 with respect to time to be graphed on the same axis as the input sinusoid sin(t), as illustrated in the graph of FIG. 118C. As the aperture T decreases in value or tends toward an impulse, the phase between the charge on the capacitor C or q(t) and sin(t) tend toward zero. This is illustrated in the graph of FIG. 118D, which indicates that the maximum impulse charge transfer occurs near the input voltage maxima. As this graph indicates, considerably less charge is transferred as the value of T decreases.

Power/charge relationships are illustrated in Equations L-Q of FIG. 118E, where it is shown that power is proportional to charge, and transferred charge is inversely proportional to insertion loss.

Concepts of insertion loss are illustrated in FIG. 118F. Generally, the noise figure of a lossy passive device is numerically equal to the device insertion loss. Alternatively, the noise figure for any device cannot be less that its insertion loss. Insertion loss can be expressed by the equations in FIG. 118F. From the above discussion, it is observed that as the aperture T increases, more charge is transferred from the input to the capacitor 11806, which increases power transfer from the input to the output. It has been observed that it is not necessary to accurately reproduce the input voltage at the output because relative modulated amplitude and phase information is retained in the transferred power.

2.6 Optimizing and Adjusting the Non-Negligible Aperture Width/Duration 2.6.1 Varying Input and Output Impedances In an embodiment of the invention, the energy transfer signal (i.e., control signal 2006 in FIG. 20A), is used to vary the input impedance seen by the EM Signal 2004 and to vary the output impedance driving a load. An example of this embodiment is described below using a gated transfer module 9803 shown in FIG. 98A. The method described below is not limited to the gated transfer module 9803.

Figure 98A:
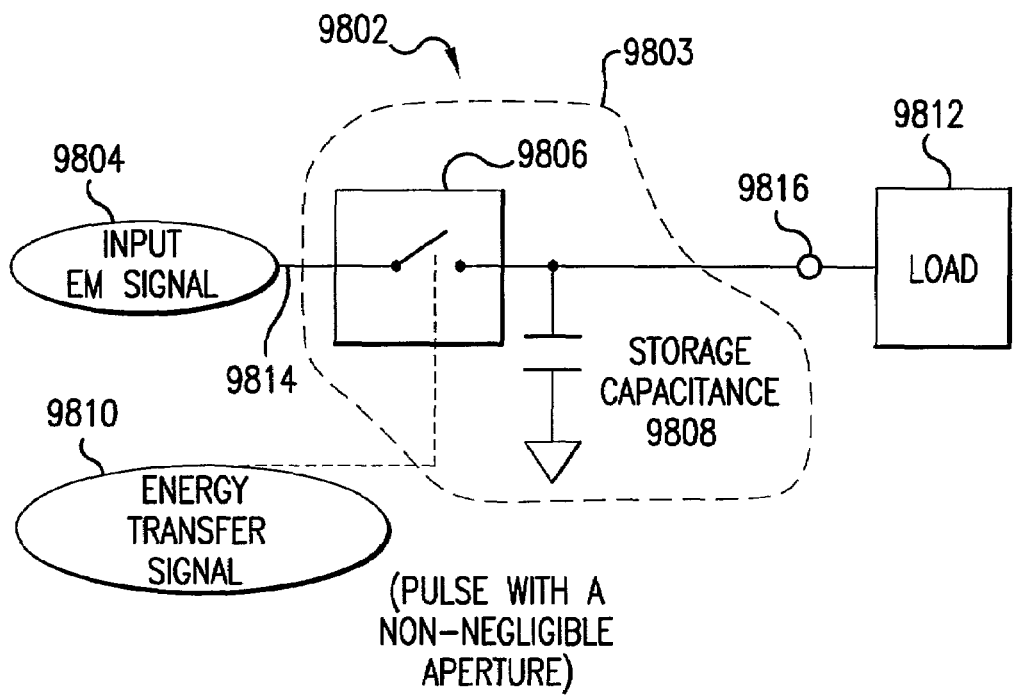
FIGS. 98A-B illustrate example energy transfer systems according to embodiments of the invention.
Figure 98B:
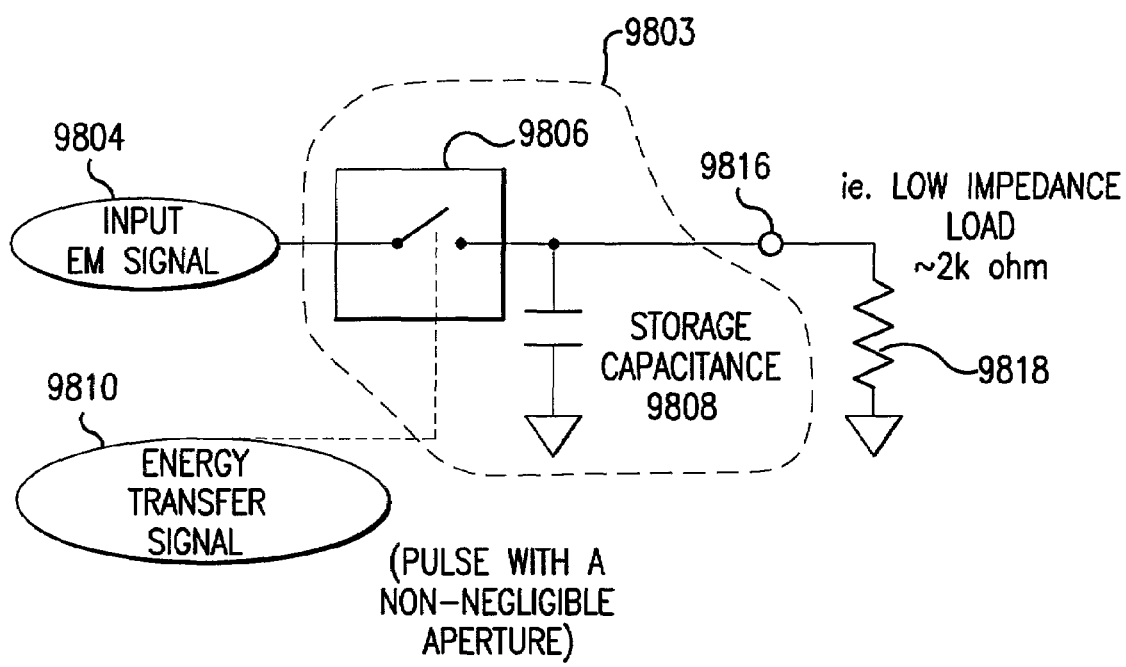

In FIG. 98A, when switch 9806 is closed, the impedance looking into circuit 9802 is substantially the impedance of a storage module, illustrated here as a storage capacitance 9808, in parallel with the impedance of a load 9812. When the switch 9806 is open, the impedance at point 9814 approaches infinity. It follows that the average impedance at point 9814 can be varied from the impedance of the storage module illustrated in parallel with the load 9812, to the highest obtainable impedance when switch 9806 is open, by varying the ratio of the time that switch 9806 is open to the time switch 9806 is closed. The switch 9806 is controlled by an energy transfer signal 9810. Thus the impedance at point 9814 can be varied by controlling the aperture width of the energy transfer signal in conjunction with the aliasing rate.

Figure 96A:
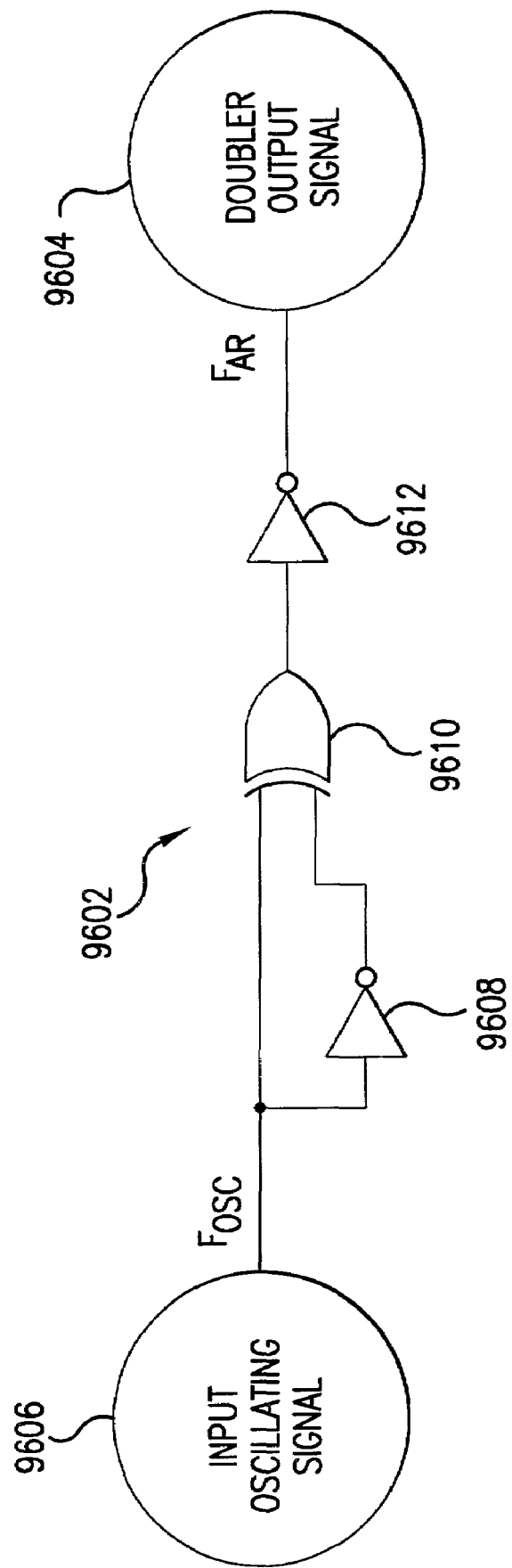
FIG. 96A illustrates an example pulse generator.

An example method of altering the energy transfer signal 9810 of FIG. 98A is now described with reference to FIG. 96A, where a circuit 9602 receives an input oscillating signal 9606 (FIG. 96C) and outputs a pulse train shown as doubler output signal 9604. The circuit 9602 can be used to generate the energy transfer signal 9810. Example waveforms of 9604 are shown on FIG. 96C.

It can be shown that by varying the delay of the signal propagated by the inverter 9608, the width of the pulses in the doubler output signal 9604 can be varied. Increasing the delay of the signal propagated by inverter 9608, increases the width of the pulses. The signal propagated by inverter 9608 can be delayed by introducing a R/C low pass network in the output of inverter 9608. Other means of altering the delay of the signal propagated by inverter 9608 will be well known to those skilled in the art.

2.6.2 Real Time Aperture Control

In an embodiment, the aperture width/duration is adjusted in real time. For example, referring to the timing diagrams in FIGS. 111B-F, a clock signal 11114 (FIG. 111B) is utilized to generate an energy transfer signal 11116 (FIG. 111F), which includes energy transfer pluses 11118, having variable apertures 11120. In an embodiment, the clock signal 11114 is inverted as illustrated by inverted clock signal 11122 (FIG. 111D). The clock signal 11114 is also delayed, as illustrated by delayed clock signal 11124 (FIG. 111E). The inverted clock signal 11114 and the delayed clock signal 11124 are then ANDed together, generating an energy transfer signal 11116, which is active—energy transfer pulses 11118—when the delayed clock signal 11124 and the inverted clock signal 11122 are both active. The amount of delay imparted to the delayed clock signal 11124 substantially determines the width or duration of the apertures 11120. By varying the delay in real time, the apertures are adjusted in real time.

In an alternative implementation, the inverted clock signal 11122 is delayed relative to the original clock signal 11114, and then ANDed with the original clock signal 11114. Alternatively, the original clock signal 11114 is delayed then inverted, and the result ANDed with the original clock signal 11114.

FIG. 111A illustrates an exemplary real time aperture control system 11102 that can be utilized to adjust apertures in real time. The example real time aperture control system 11102 includes an RC circuit 11104, which includes a voltage variable capacitor 11112 and a resistor 11126. The real time aperture control system 11102 also includes an inverter 11106 and an AND gate 11108. The AND gate 11108 optionally includes an enable input 11110 for enabling/disabling the AND gate 11108. The RC circuit 11104. The real time aperture control system 11102 optionally includes an amplifier 11128.

Operation of the real time aperture control circuit is described with reference to the timing diagrams of FIGS. 111B-F. The real time control system 11102 receives the input clock signal 11114, which is provided to both the inverter 11106 and to the RC circuit 11104. The inverter 11106 outputs the inverted clock signal 11122 and presents it to the AND gate 11108. The RC circuit 11104 delays the clock signal 11114 and outputs the delayed clock signal 11124. The delay is determined primarily by the capacitance of the voltage variable capacitor 11112. Generally, as the capacitance decreases, the delay decreases.

The delayed clock signal 11124 is optionally amplified by the optional amplifier 11128, before being presented to the AND gate 11108. Amplification is desired, for example, where the RC constant of the RC circuit 11104 attenuates the signal below the threshold of the AND gate 11108.

The AND gate 11108 ANDs the delayed clock signal 11124, the inverted clock signal 11122, and the optional Enable signal 11110, to generate the energy transfer signal 11116. The apertures 11120 are adjusted in real time by varying the voltage to the voltage variable capacitor 11112.

In an embodiment, the apertures 11120 are controlled to optimize power transfer. For example, in an embodiment, the apertures 11120 are controlled to maximize power transfer. Alternatively, the apertures 11120 are controlled for variable gain control (e.g. automatic gain control—AGC). In this embodiment, power transfer is reduced by reducing the apertures 11120.

As can now be readily seen from this disclosure, many of the aperture circuits presented, and others, can be modified as in circuits illustrated in FIGS. 93A-E. Modification or selection of the aperture can be done at the design level to remain a fixed value in the circuit, or in an alternative embodiment, may be dynamically adjusted to compensate for, or address, various design goals such as receiving RF signals with enhanced efficiency that are in distinctively different bands of operation, e.g. RF signals at 900 MHZ and 1.8 GHz.

2.7 Adding a Bypass Network

In an embodiment of the invention, a bypass network is added to improve the efficiency of the energy transfer module. Such a bypass network can be viewed as a means of synthetic aperture widening. Components for a bypass network are selected so that the bypass network appears substantially lower impedance to transients of the switch module (i.e., frequencies greater than the received EM signal) and appears as a moderate to high impedance to the input EM signal (e.g., greater that 100 Ohms at the RF frequency).

The time that the input signal is now connected to the opposite side of the switch module is lengthened due to the shaping caused by this network, which in simple realizations may be a capacitor or series resonant inductor-capacitor. A network that is series resonant above the input frequency would be a typical implementation. This shaping improves the conversion efficiency of an input signal that would otherwise, if one considered the aperture of the energy transfer signal only, be relatively low in frequency to be optimal.

Figure 104:
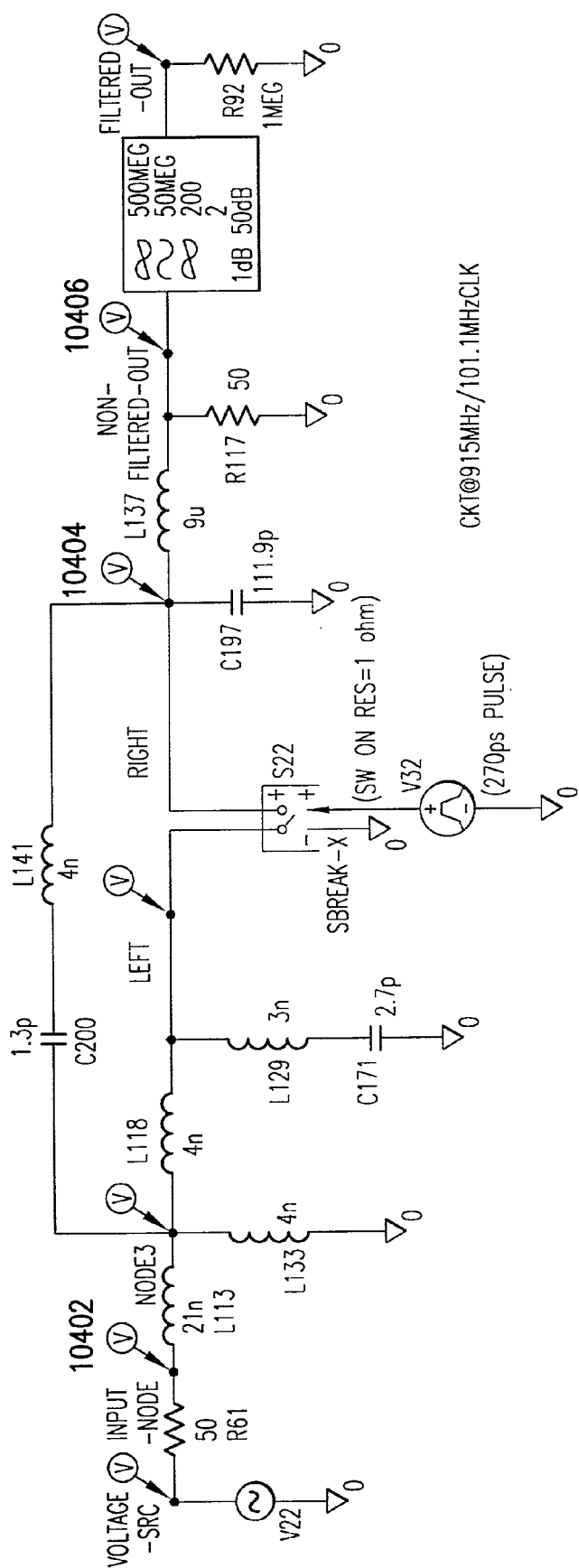
FIG. 104 is a schematic diagram of a circuit to down-convert a 915 MHZ signal to a 5 MHZ signal using a 101.1 MHZ clock according to an embodiment of the present invention.

For example, referring to FIG. 108 a bypass network 10802 shown in this instance as capacitor 10812), is shown bypassing switch module 10804. In this embodiment the bypass network increases the efficiency of the energy transfer module when, for example, less than optimal aperture widths were chosen for a given input frequency on the energy transfer signal 10806. The bypass network 10802 could be of different configurations than shown in FIG. 108. Such an alternate is illustrated in FIG. 104. Similarly, FIG. 109 illustrates another example bypass network 10902, including a capacitor 10904.

The following discussion will demonstrate the effects of a minimized aperture and the benefit provided by a bypassing network. Beginning with an initial circuit having a 550 ps aperture in FIG. 112, its output is seen to be 2.8mVpp applied to a 50 ohm load in FIG. 116A. Changing the aperture to 270 ps as shown in FIG. 113 results in a diminished output of 2.5Vpp applied to a 50 ohm load as shown in FIG. 116B. To compensate for this loss, a bypass network may be added, a specific implementation is provided in FIG. 114. The result of this addition is that 3.2Vpp can now be applied to the 50 ohm load as shown in FIG. 117A. The circuit with the bypass network in FIG. 114 also had three values adjusted in the surrounding circuit to compensate for the impedance changes introduced by the bypass network and narrowed aperture. FIG. 115 verifies that those changes added to the circuit, but without the bypass network, did not themselves bring about the increased efficiency demonstrated by the embodiment in FIG. 114 with the bypass network. FIG. 117B shows the result of using the circuit in FIG. 115 in which only 1.88Vpp was able to be applied to a 50 ohm load.

2.8 Modifying the Energy Transfer Signal Utilizing Feedback

As discussed herein, FIG. 94 shows an embodiment of a system 9401 which uses down-converted signal 9407 as feedback 9406 to control various characteristics of the energy transfer module 9403 to modify the down-converted signal 9407.

Generally, the amplitude of the down-converted signal 9407 varies as a function of the frequency and phase differences between the EM signal 9408 and the energy transfer signal 9405. In an embodiment, the down-converted signal 9407 is used as the feedback 9406 to control the frequency and phase relationship between the EM signal 9408 and the energy transfer signal 9405. This can be accomplished using the example logic in FIG. 99A. The example circuit in FIG. 99A can be included in the energy transfer signal module 9402. Alternate implementations will be apparent to persons skilled in the relevant art(s) based on the teachings contained herein. Alternate implementations fall within the scope and spirit of the present invention. In this embodiment a state-machine is used as an example.

Figure 99A:
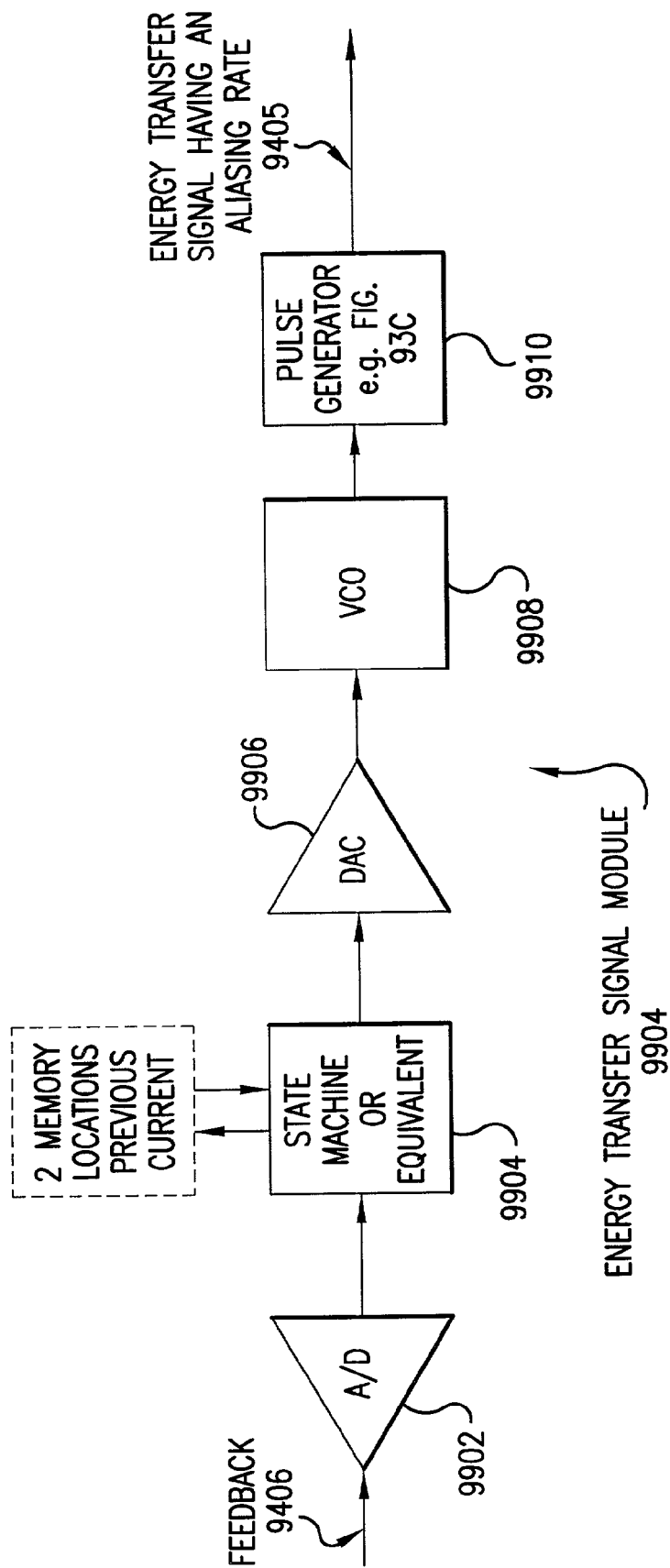
FIG. 99A illustrates an example energy transfer signal module according to an embodiment of the present invention.

In the example of FIG. 99A, a state machine 9904 reads an analog to digital converter, A/D 9902, and controls a digital to analog converter, DAC 9906. In an embodiment, the state machine 9904 includes 2 memory locations, Previous and Current, to store and recall the results of reading A/D 9902. In an embodiment, the state machine 9904 utilizes at least one memory flag.

The DAC 9906 controls an input to a voltage controlled oscillator, VCO 9908. VCO 9908 controls a frequency input of a pulse generator 9910, which, in an embodiment, is substantially similar to the pulse generator shown in FIG. 93C. The pulse generator 9910 generates energy transfer signal 9405.

Figure 99B:
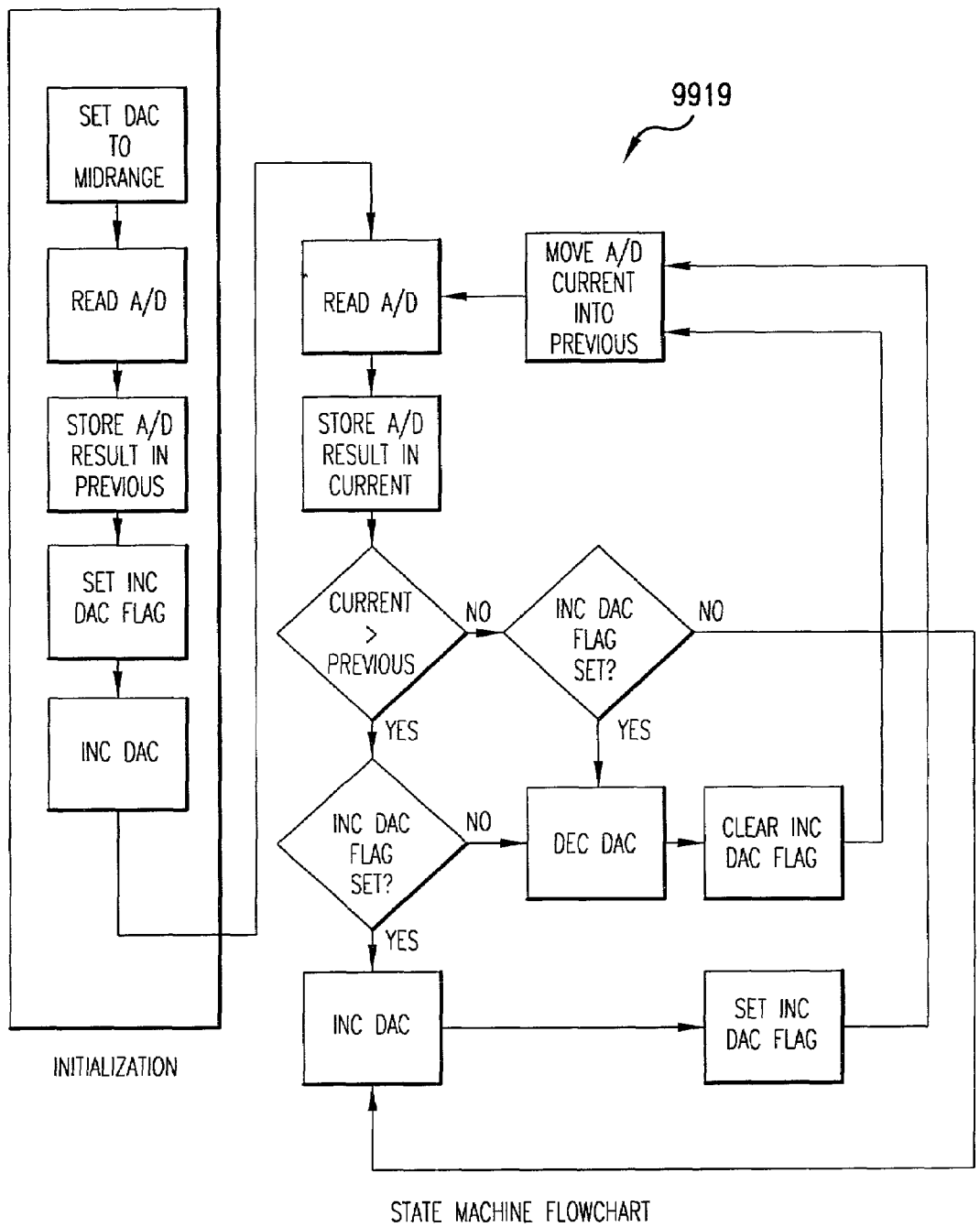
FIG. 99B illustrates a flowchart of state machine operation according to an embodiment of the present invention.

In an embodiment, the state machine 9904 operates in accordance with a state machine flowchart 9919 in FIG. 99B. The result of this operation is to modify the frequency and phase relationship between the energy transfer signal 9405 and the EM signal 9408, to substantially maintain the amplitude of the down-converted signal 9407 at an optimum level.

Figure 92A:
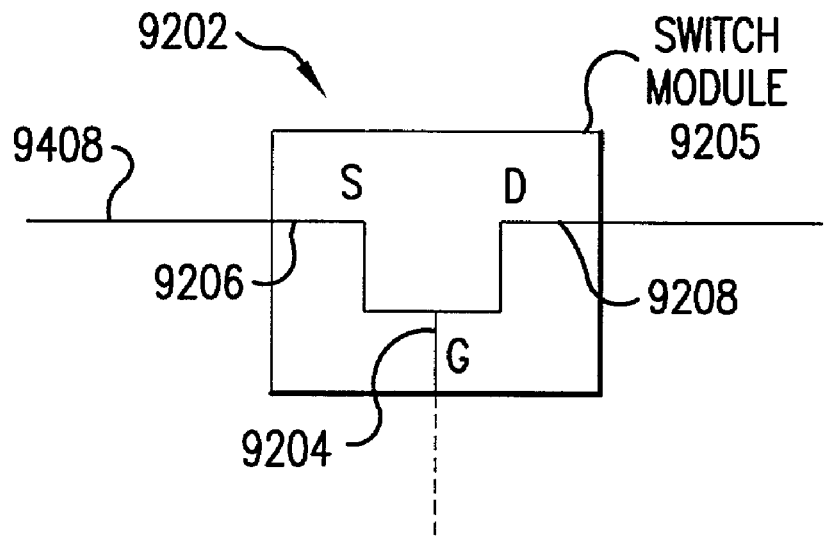
FIGS. 92A-D illustrate example implementations of a switch module according to embodiments of the invention.
Figure 92B:
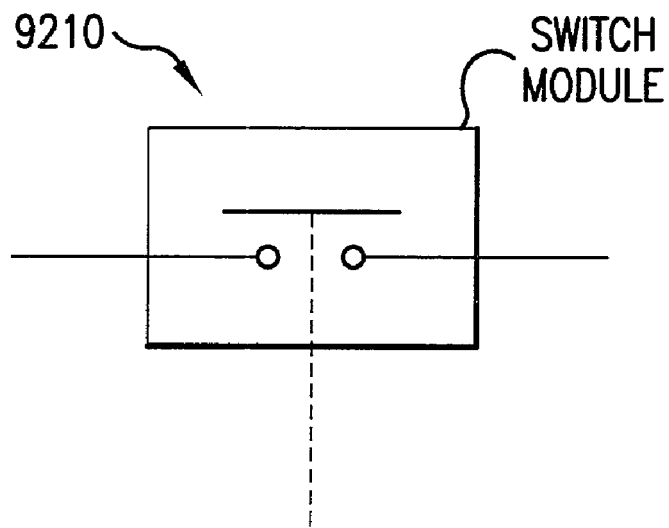
Figure 92C:
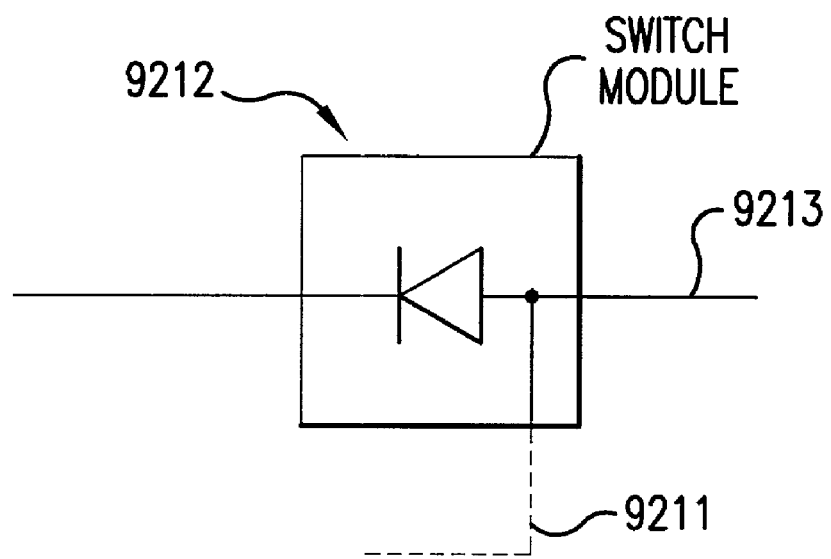
Figure 92D:
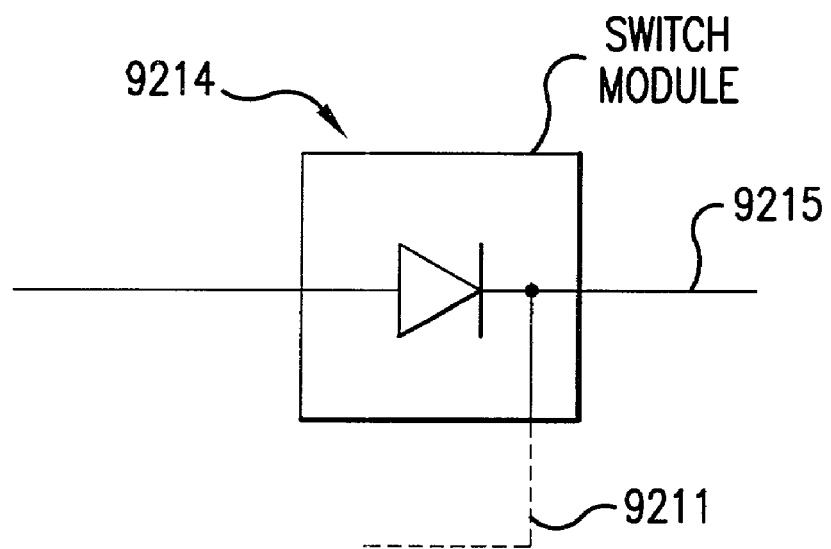
Figure 99C:
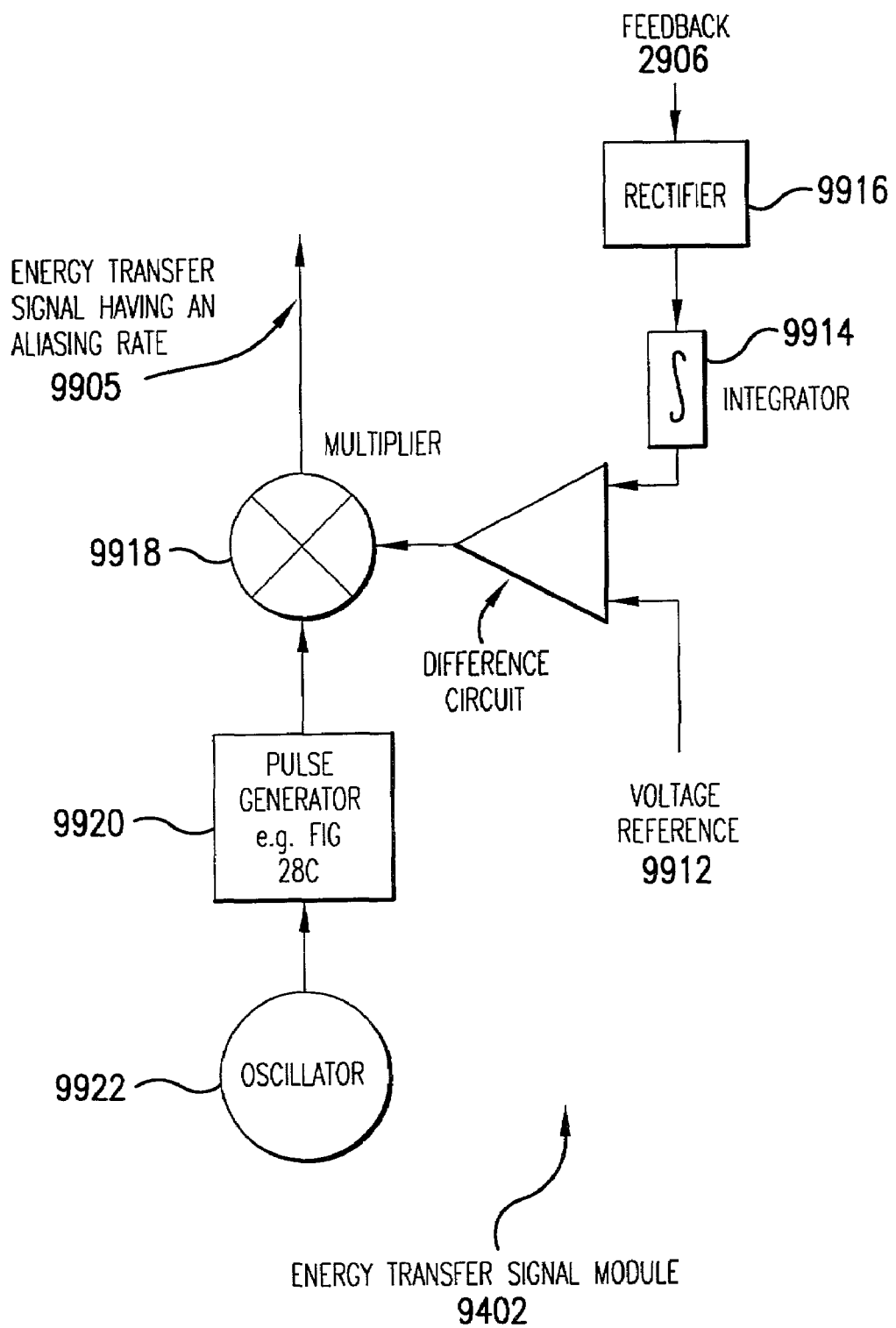
FIG. 99C is an example energy transfer signal module.

The amplitude of the down-converted signal 9407 can be made to vary with the amplitude of the energy transfer signal 9405. In an embodiment where the energy transfer module 9403 is a switch module 9205 is a FET as shown in FIG. 92A, wherein the gate 9204 receives the energy transfer signal 9405, the amplitude of the energy transfer signal 9405 can determine the "on" resistance of the FET, which affects the amplitude of the down-converted signal 9407. The energy transfer signal module 9402, as shown in FIG. 99C, can be an analog circuit that enables an automatic gain control function. Alternate implementations will be apparent to persons skilled in the relevant art(s) based on the teachings contained herein. Some alternate implementations for the switch module 9205 are shown in FIGS. 92B-92D. Alternate implementations fall within the scope and spirit of the present invention.

2.9 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

2.10 Example Energy Transfer Down-Converters

Example implementations are described below for illustrative purposes. The invention is not limited to these examples.

FIG. 100 is a schematic diagram of an exemplary circuit to down convert a 915 MHZ signal to a 5 MHZ signal using a 101.1 MHZ clock.

Figure 101:
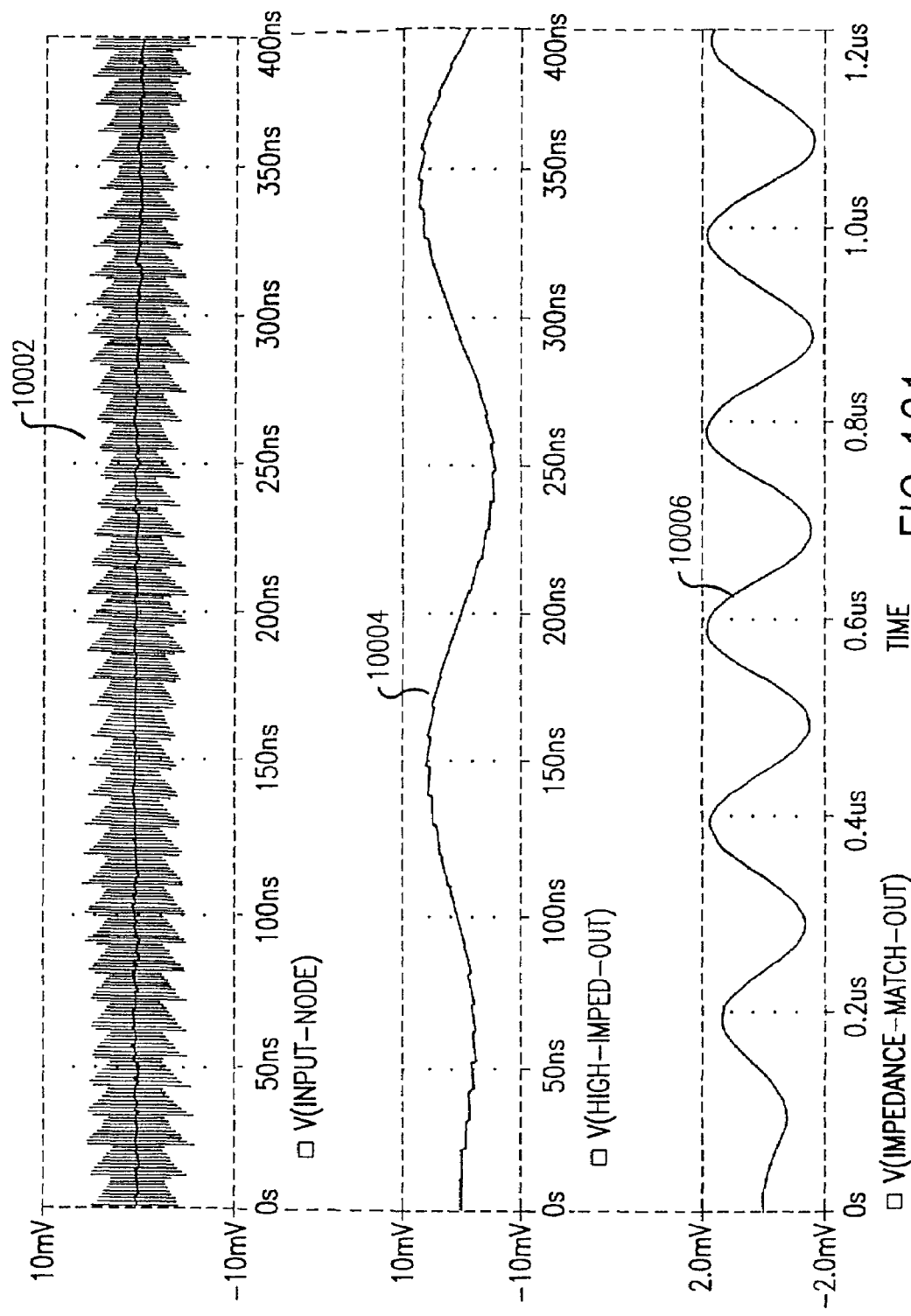
FIG. 101 shows simulation waveforms for the circuit of FIG. 100 according to embodiments of the present invention.

FIG. 101 shows example simulation waveforms for the circuit of FIG. 100. Waveform 10002 is the input to the circuit showing the distortions caused by the switch closure. Waveform 14 is the unfiltered output at the storage unit. Waveform 10006 is the impedance matched output of the down-converter on a different time scale.

FIG. 102 is a schematic diagram of an exemplary circuit to down-convert a 915 MHZ signal to a 5 MHZ signal using a 101.1 MHZ clock. The circuit has additional tank circuitry to improve conversion efficiency.

Figure 103:
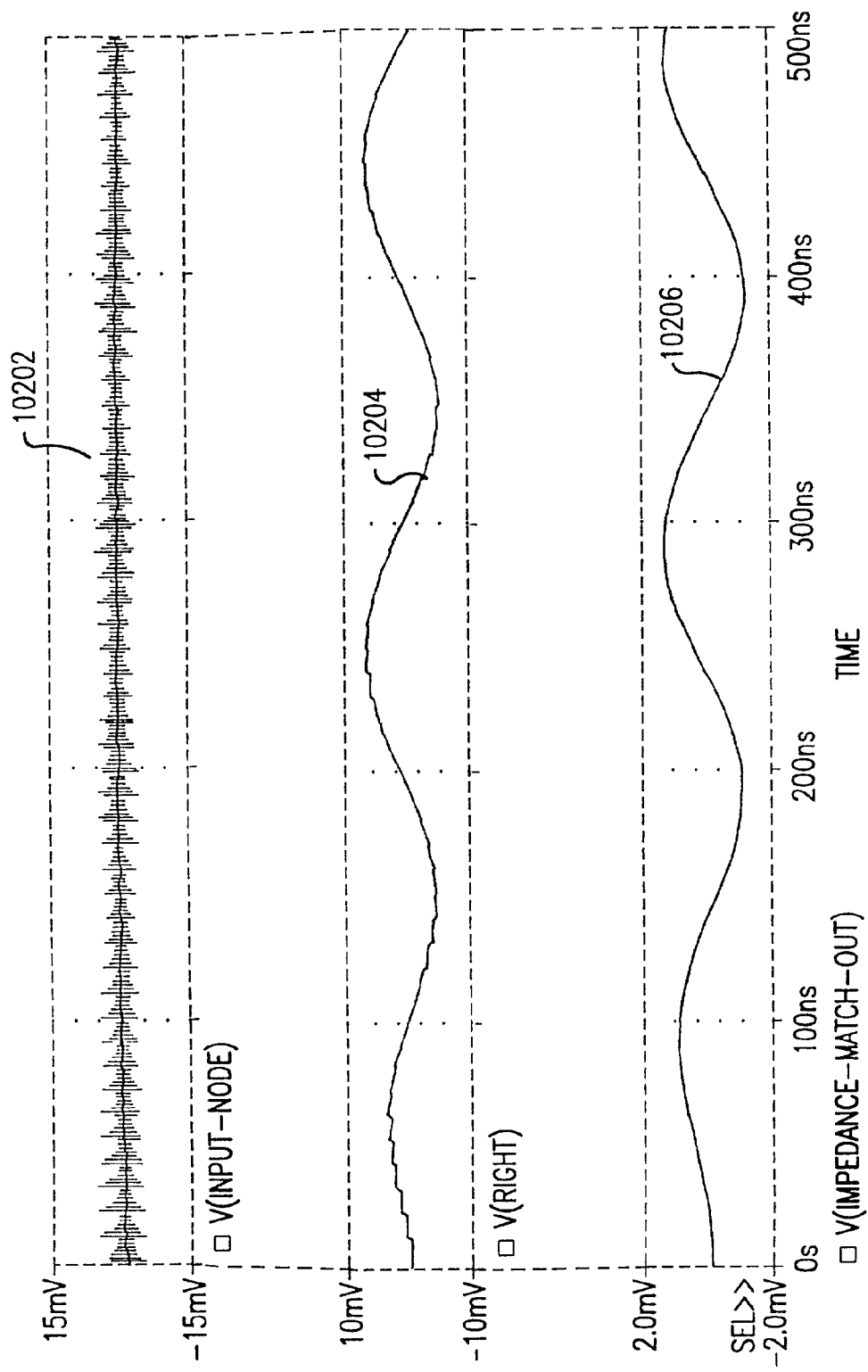
FIG. 103 shows simulation waveforms for the circuit of FIG. 102 according to embodiments of the present invention.

FIG. 103 shows example simulation waveforms for the circuit of FIG. 102. Waveform 10202 is the input to the circuit showing the distortions caused by the switch closure.

Waveform 10204 is the unfiltered output at the storage unit. Waveform 10206 is the output of the down-converter after the impedance match circuit.

FIG. 104 is a schematic diagram of an exemplary circuit to down-convert a 915 MHZ signal to a 5 MHZ signal using a 101.1 MHZ clock. The circuit has switch bypass circuitry to improve conversion efficiency.

Figure 105:
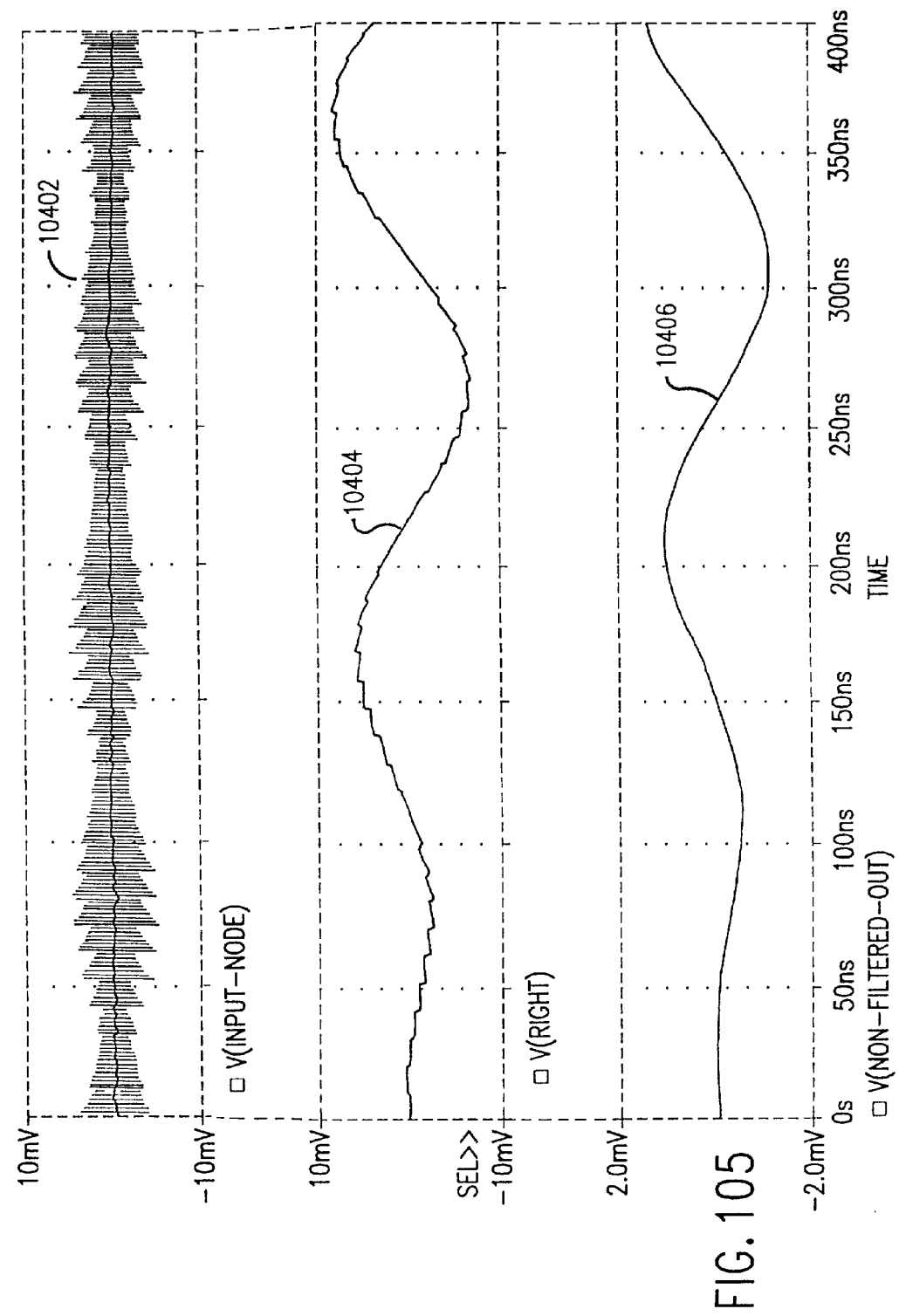

FIG. 105 shows example simulation waveforms for the circuit of FIG. 104. Waveform 10402 is the input to the circuit showing the distortions caused by the switch closure. Waveform 10404 is the unfiltered output at the storage unit. Waveform 10406 is the output of the down-converter after the impedance match circuit.

FIG. 106 shows a schematic of the example circuit in FIG. 100 connected to an FSK source that alternates between 913 and 917 MHZ, at a baud rate of 500 Kbaud. FIG. 93 shows the original FSK waveform 9202 and the down-converted waveform 9204 at the output of the load impedance match circuit.

3.0 Frequency Up-conversion

The present invention is directed to systems and methods of frequency up-conversion, and applications of same.

Figure 3:
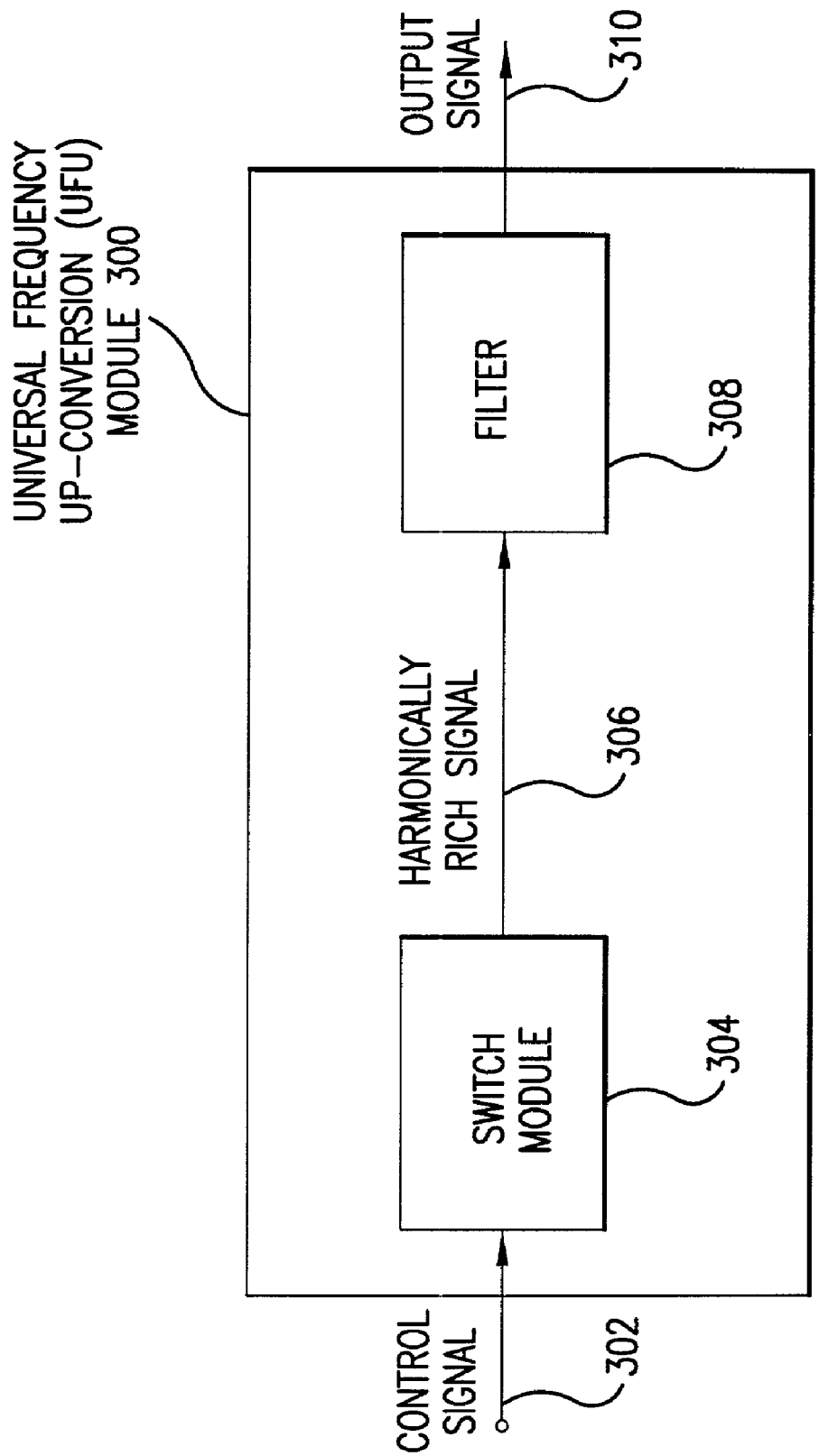
FIG. 3 is a block diagram of a universal frequency up-conversion (UFU) module according to an embodiment of the invention.

An example frequency up-conversion system 300 is illustrated in FIG. 3. The frequency up-conversion system 300 is now described.

An input signal 302 (designated as "Control Signal" in FIG. 3) is accepted by a switch module 304. For purposes of example only, assume that the input signal 302 is a FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. The information signal 602 can be analog, digital, or any combination thereof, and any modulation scheme can be used.

The output of switch module 304 is a harmonically rich signal 306, shown for example in FIG. 6D as a harmonically rich signal 608. The harmonically rich signal 608 has a continuous and periodic waveform.

FIG. 6E is an expanded view of two sections of harmonically rich signal 608, section 610 and section 612. The harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 6H:
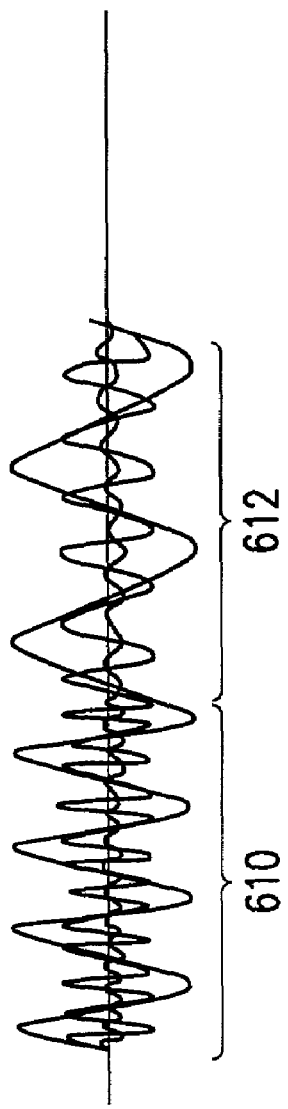

Harmonically rich signal 608 is comprised of a plurality of sinusoidal waves whose frequencies are integer multiples of the fundamental frequency of the waveform of the harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, the input signal 606 may be shaped to ensure that the amplitude of the desired harmonic is sufficient for its intended use (e.g., transmission).

Figure 6I:
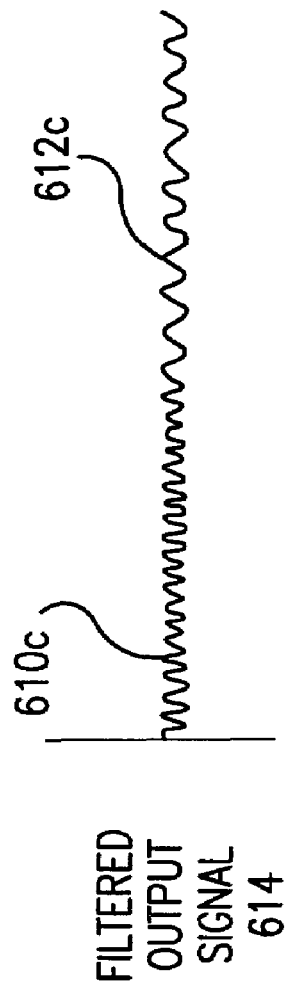

A filter 308 filters out any undesired frequencies (harmonics), and outputs an electromagnetic (EM) signal at the desired harmonic frequency or frequencies as an output signal 310, shown for example as a filtered output signal 614 in FIG. 6I.

Figure 4:
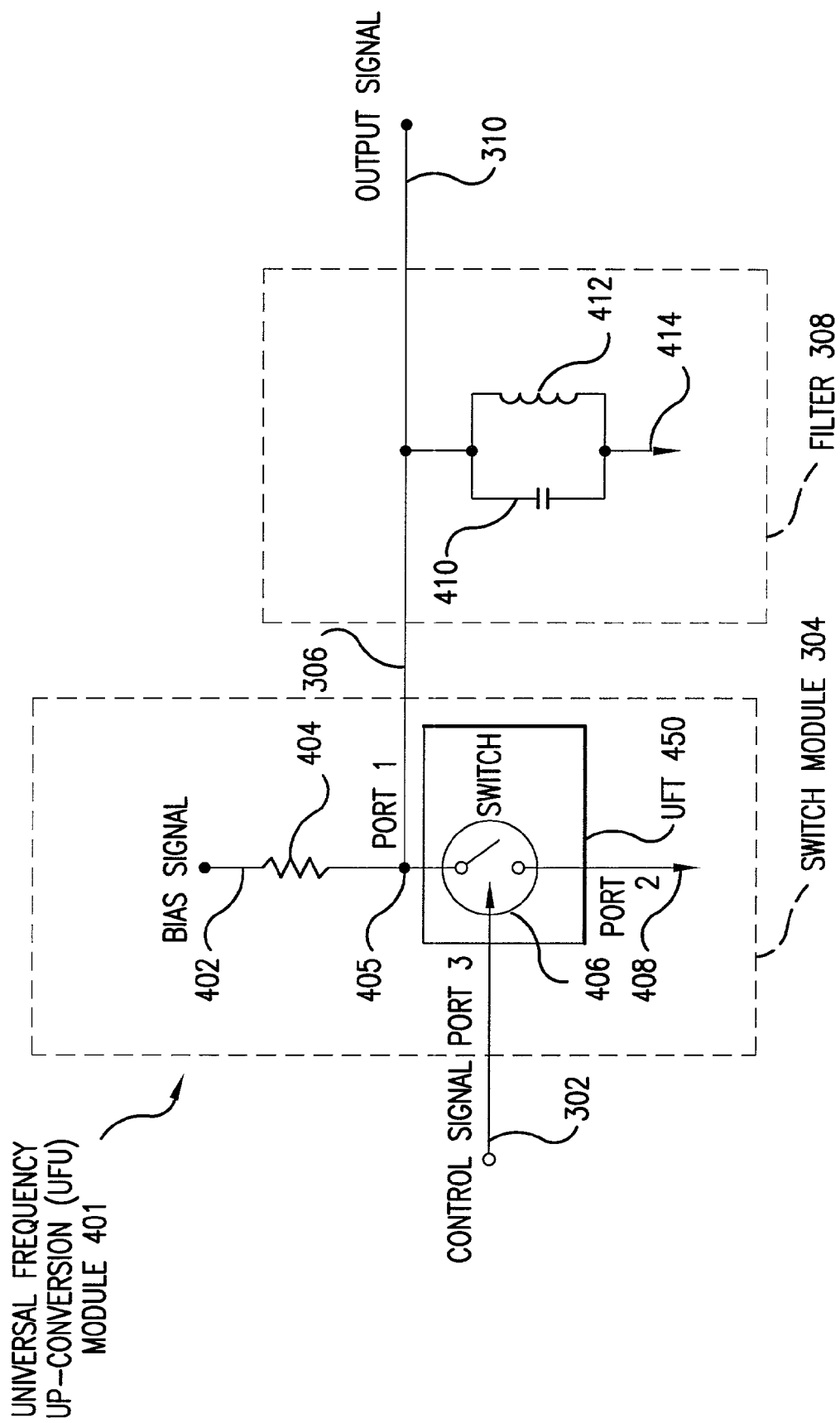
FIG. 4 is a more detailed diagram of a universal frequency up-conversion (UFU) module according to an embodiment of the invention.

FIG. 4 illustrates an example universal frequency up-conversion (UFU) module 401. The UFU module 401 includes an example switch module 304, which comprises a bias signal 402, a resistor or impedance 404, a universal frequency translator (UFT) 450, and a ground 408. The UFT 450 includes a switch 406. The input signal 302 (designated as "Control Signal" in FIG. 4) controls the switch 406 in the UFT 450, and causes it to close and open. Harmonically rich signal 306 is generated at a node 405 located between the resistor or impedance 404 and the switch 406.

Also in FIG. 4, it can be seen that an example filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

For example, in an alternate embodiment shown in FIG. 5, an unshaped input signal 501 is routed to a pulse shaping module 502. The pulse shaping module 502 modifies the unshaped input signal 501 to generate a (modified) input signal 302 (designated as the "Control Signal" in FIG. 5). The input signal 302 is routed to the switch module 304, which operates in the manner described above. Also, the filter 308 of FIG. 5 operates in the manner described above.

The purpose of the pulse shaping module 502 is to define the pulse width of the input signal 302. Recall that the input signal 302 controls the opening and closing of the switch 406 in switch module 304. During such operation, the pulse width of the input signal 302 establishes the pulse width of the harmonically rich signal 306. As stated above, the relative amplitudes of the harmonics of the harmonically rich signal 306 are a function of at least the pulse width of the harmonically rich signal 306. As such, the pulse width of the input signal 302 contributes to setting the relative amplitudes of the harmonics of harmonically rich signal 306.

Further details of up-conversion as described in this section are presented in pending U.S. application "Method and System for Frequency Up-Conversion," Ser. No. 09/176,154, filed Oct. 21, 1998, incorporated herein by reference in its entirety.

4. Enhanced Signal Reception

The present invention is directed to systems and methods of enhanced signal reception (ESR), and applications of same.

Figure 21:
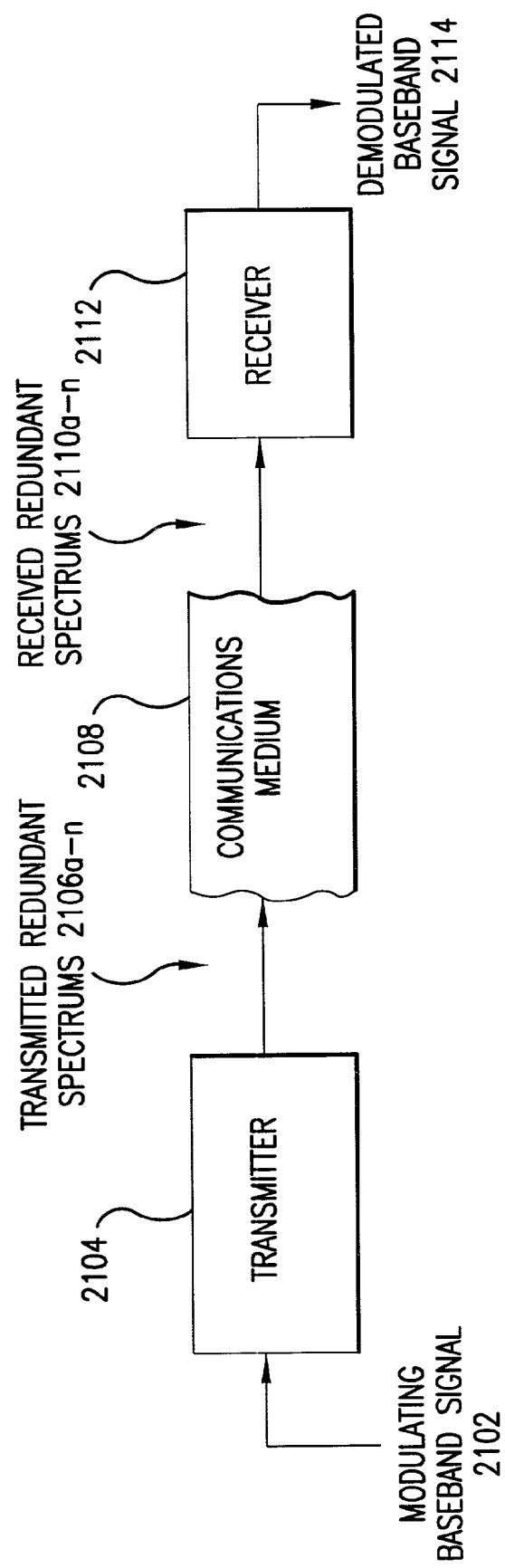
FIG. 21 illustrates an enhanced signal reception system according to an embodiment of the invention.

Referring to FIG. 21, transmitter 2104 accepts a modulating baseband signal 2102 and generates (transmitted) redundant spectrums 2106a-n, which are sent over communications medium 2108. Receiver 2112 recovers a demodulated baseband signal 2114 from (received) redundant spectrums 2110a-n. Demodulated baseband signal 2114 is representative of the modulating baseband signal 2102, where the level of similarity between the modulating baseband signal 2114 and the modulating baseband signal 2102 is application dependent.

Modulating baseband signal 2102 is preferably any information signal desired for transmission and/or reception. An example modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22a, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106a-n contains the necessary information to substantially reconstruct the modulating baseband signal 2102. In other words, each redundant spectrum 2106a-n contains the necessary amplitude, phase, and frequency information to reconstruct the modulating baseband signal 2102.

FIG. 22C illustrates example transmitted redundant spectrums 2206b-d. Transmitted redundant spectrums 2206b-d are illustrated to contain three redundant spectrums for illustration purposes only. Any number of redundant spectrums could be generated and transmitted as will be explained in following discussions.

Transmitted redundant spectrums 2206b-d are centered at $f_1$, with a frequency spacing $f_2$ between adjacent spectrums. Frequencies $f_1$ and $f_2$ are dynamically adjustable in real-time as will be shown below. FIG. 22D illustrates an alternate embodiment, where redundant spectrums 2208c, d are centered on unmodulated oscillating signal 2209 at $f_1$ (Hz). Oscillating signal 2209 may be suppressed if desired using, for example, phasing techniques or filtering techniques. Transmitted redundant spectrums are preferably above baseband frequencies as is represented by break 2205 in the frequency axis of FIGS. 22C and 22D.

Figure 22E:
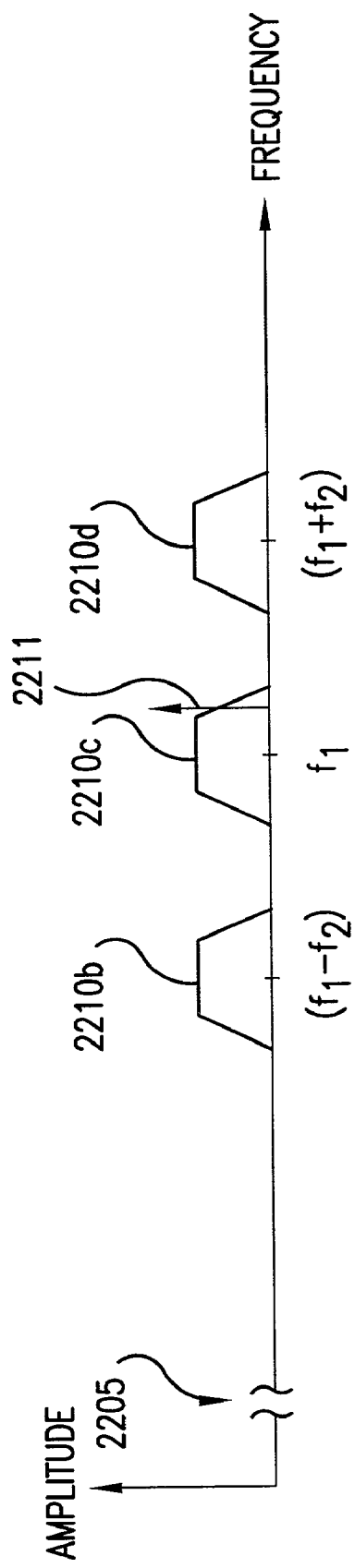

Received redundant spectrums 2100a-n are substantially similar to transmitted redundant spectrums 2106a-n, except for the changes introduced by the communications medium 2108. Such changes can include but are not limited to signal attenuation, and signal interference. FIG. 22E illustrates example received redundant spectrums 2210b-d. Received redundant spectrums 2210b-d are substantially similar to transmitted redundant spectrums 2206b-d, except that redundant spectrum 2210c includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

Figure 22F:
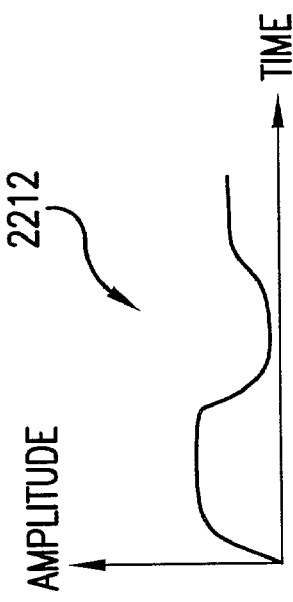

As stated above, demodulated baseband signal 2114 is extracted from one or more of received redundant spectrums 2210b-d. FIG. 22F illustrates example demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectrums are transmitted, where each redundant spectrum carries the necessary information to reconstruct the baseband signal. At the destination, the redundant spectrums are isolated from each other so that the baseband signal can be recovered even if one or more of the redundant spectrums are corrupted by a jamming signal.

Figure 23A:
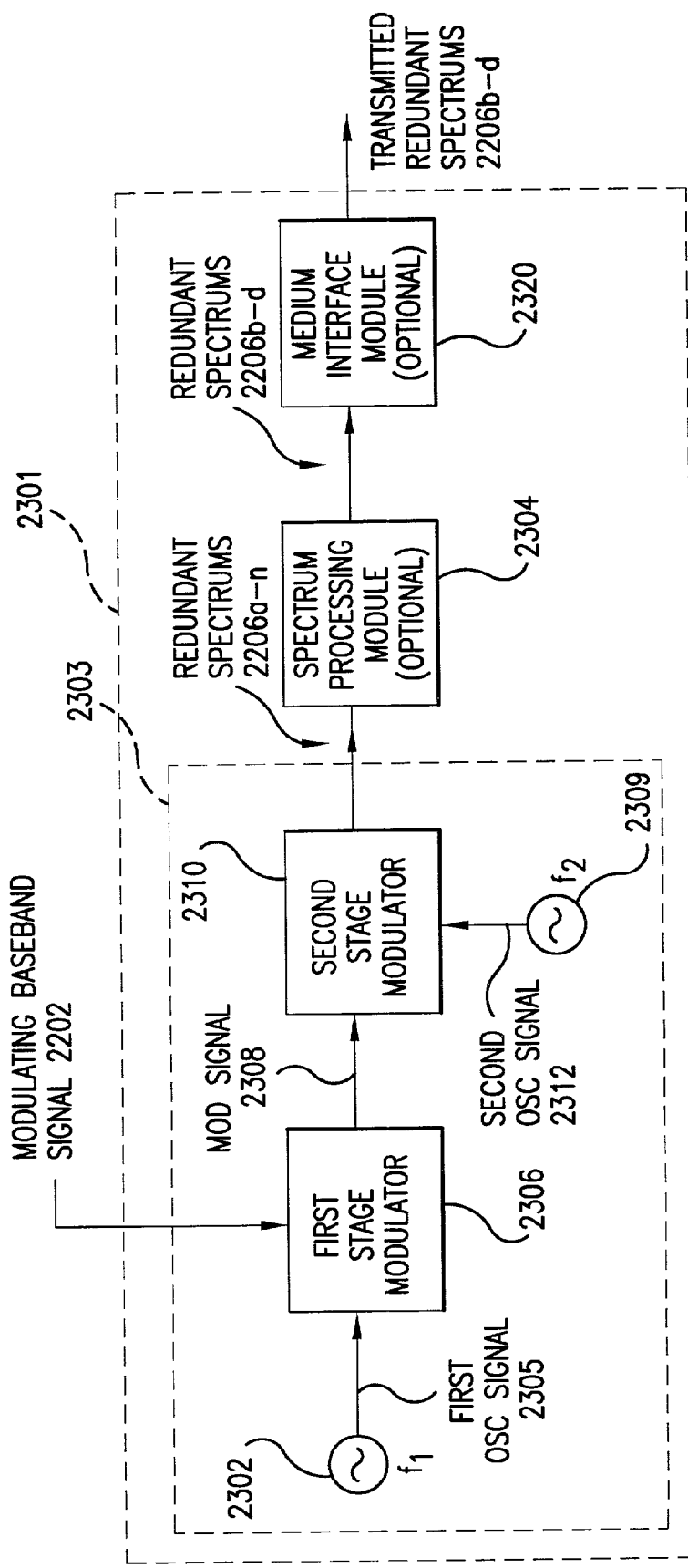
FIG. 23A illustrates an example transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectrums configured similar to redundant spectrums 2206b-d. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Figure 23B:
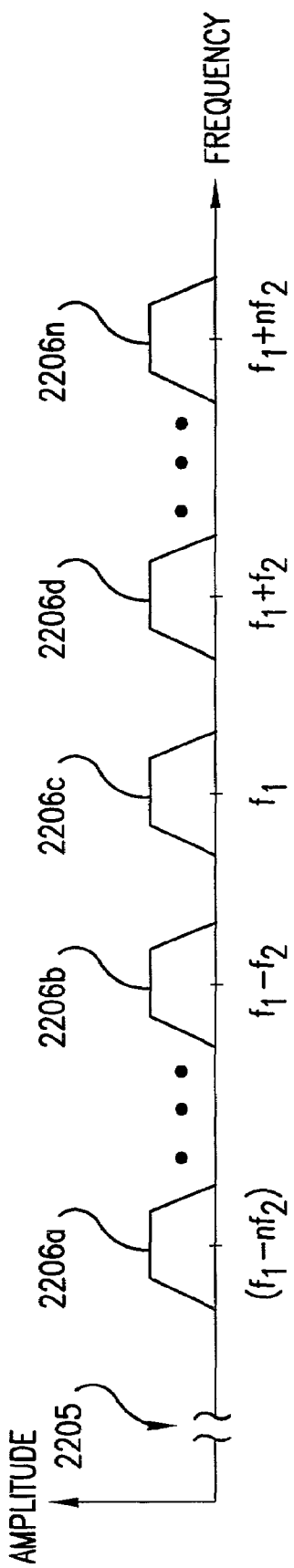
FIGS. 23B and 23C are example waveforms used to further describe the enhanced signal reception system according to an embodiment of the invention.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectrums 2206a-n shown in FIG. 23B. Second stage modulator 2310 is preferably a phase modulator, or a frequency modulator, although other types of modulation may be implemented including but not limited to amplitude modulation. Each redundant spectrum 2206a-n contains the necessary amplitude, phase, and frequency information to substantially reconstruct the modulating baseband signal 2202.

Redundant spectrums 2206a-n are substantially centered around $f_1$, which is the characteristic frequency of first oscillating signal 2305. Also, each redundant spectrum 2206a-n (except for 2206c) is offset from $f_1$ by approximately a multiple of $f_2$ (Hz), where $f_2$ is the frequency of the second oscillating signal 2312. Thus, each redundant spectrum 2206a-n is offset from an adjacent redundant spectrum by $f_2$ (Hz). This allows the spacing between adjacent redundant spectrums to be adjusted (or tuned) by changing $f_2$ that is associated with second oscillator 2309. Adjusting the spacing between adjacent redundant spectrums allows for dynamic real-time tuning of the bandwidth occupied by redundant spectrums 2206a-n.

In one embodiment, the number of redundant spectrums 2206a-n generated by transmitter 2301 is arbitrary and may be unlimited as indicated by the "a-n" designation for redundant spectrums 2206a-n. However, a typical communications medium will have a physical and/or administrative limitations (i.e. FCC regulations) that restrict the number of redundant spectrums that can be practically transmitted over the communications medium. Also, there may be other reasons to limit the number of redundant spectrums transmitted. Therefore, preferably, the transmitter 2301 will include an optional spectrum processing module 2304 to process the redundant spectrums 2206a-n prior to transmission over communications medium 2108.

Figure 23C:
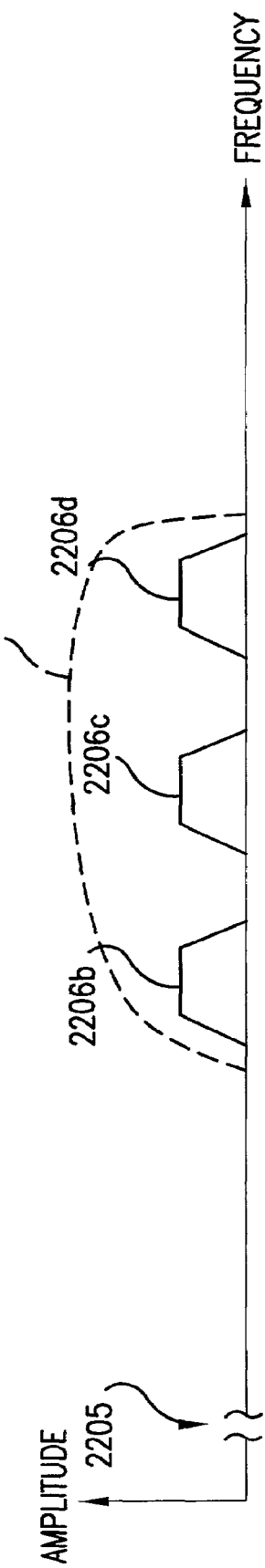

In one embodiment, spectrum processing module 2304 includes a filter with a passband 2207 (FIG. 23C) to select redundant spectrums 2206b-d for transmission. This will substantially limit the frequency bandwidth occupied by the redundant spectrums to the passband 2207. In one embodiment, spectrum processing module 2304 also up converts redundant spectrums and/or amplifies redundant spectrums prior to transmission over the communications medium 2108. Finally, medium interface module 2320 transmits redundant spectrums over the communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
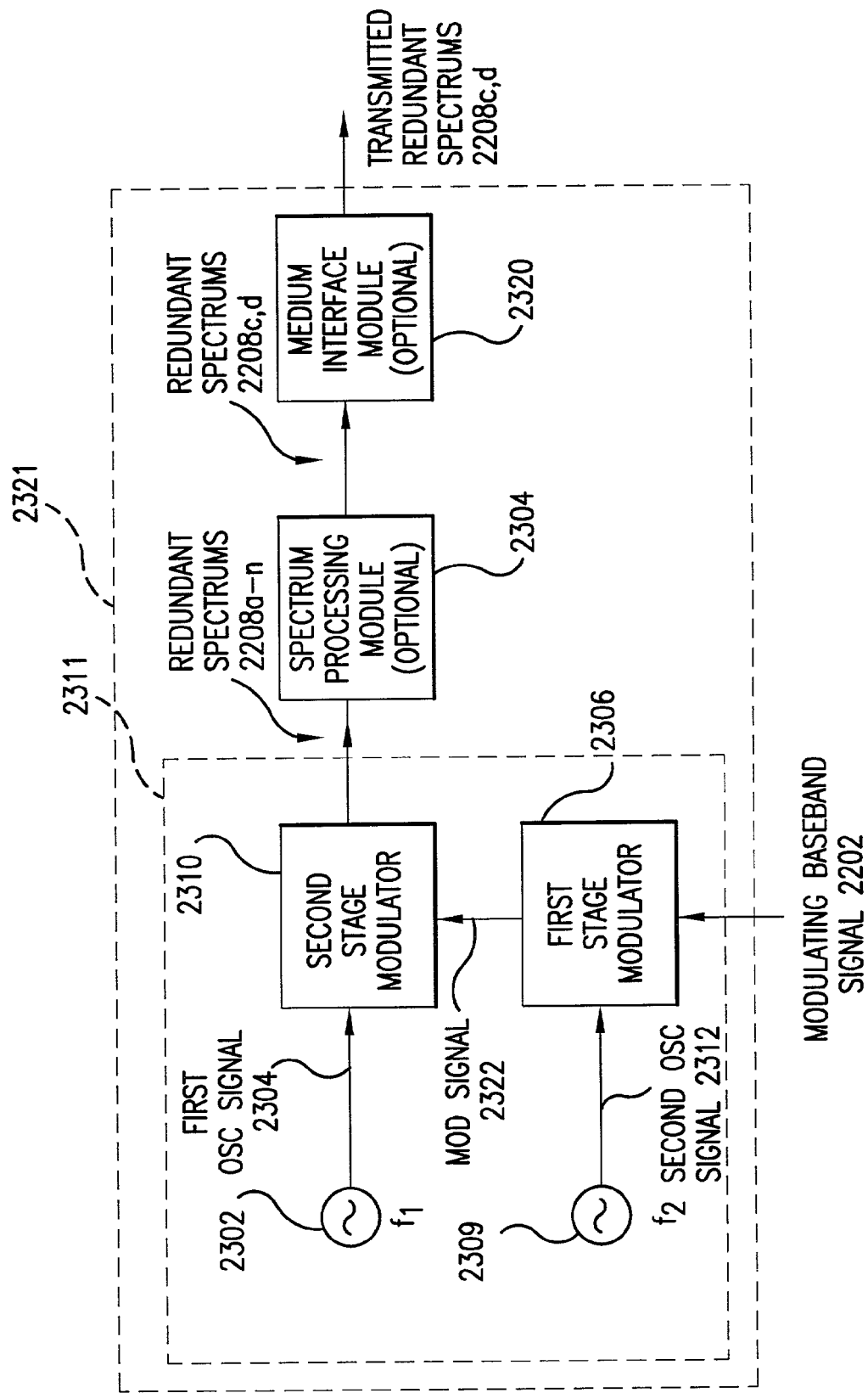
FIG. 23D illustrates another example transmitter in an enhanced signal reception system according to an embodiment of the invention.

FIG. 23D illustrates transmitter 2321, which is one embodiment of transmitter 2104 that generates redundant spectrums configured similar to redundant spectrums 2208c-d and unmodulated spectrum 2209. Transmitter 2321 includes generator 2311, (optional) spectrum processing module 2304, and (optional) medium interface module 2320. Generator 2311 includes: first oscillator 2302, second oscillator 2309, first stage modulator 2306, and second stage modulator 2310.

Figures 23E, 23F:
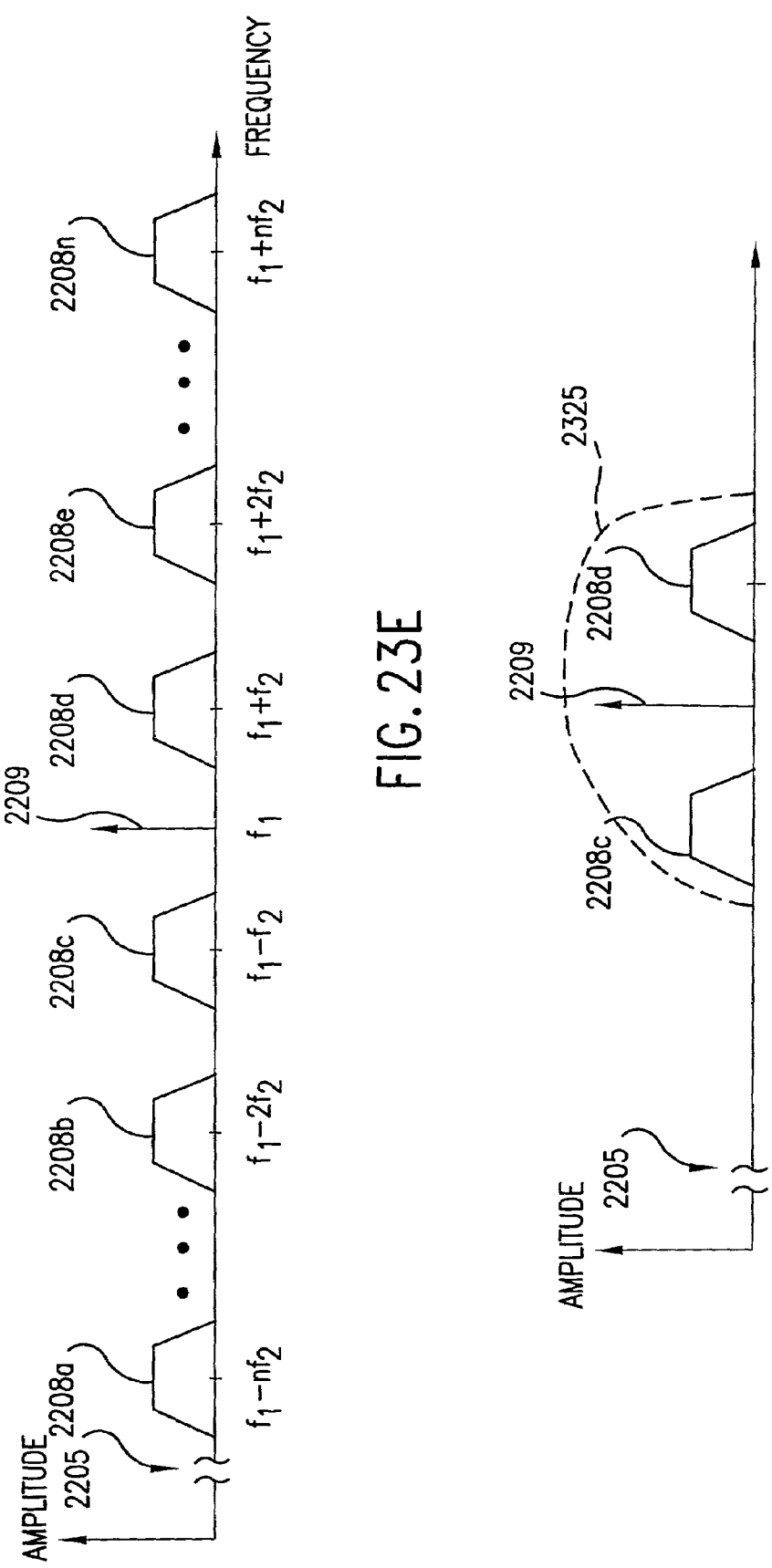
FIGS. 23E and 23F are example waveforms used to further describe the enhanced signal reception system according to an embodiment of the invention.

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to: amplitude modulation frequency modulation, combinations thereof, or any other type of modulation. Second stage modulator 2310 modulates first oscillating signal 2304 with modulated signal 2322, resulting in redundant spectrums 2208a-n, as shown in FIG. 23E. Second stage modulator 2310 is preferably a phase or frequency modulator, although other modulators could used including but not limited to an amplitude modulator.

Redundant spectrums 2208a-n are centered on unmodulated spectrum 2209 (at $f_1$ Hz), and adjacent spectrums are separated by $f_2$ Hz. The number of redundant spectrums 2208a-n generated by generator 2311 is arbitrary and unlimited, similar to spectrums 2206a-n discussed above. Therefore, optional spectrum processing module 2304 may also include a filter with passband 2325 to select, for example, spectrums 2208c, d for transmission over communications medium 2108. In addition, optional spectrum processing module 2304 may also include a filter (such as a bandstop filter) to attenuate unmodulated spectrum 2209. Alternatively, unmodulated spectrum 2209 may be attenuated by using phasing techniques during redundant spectrum generation. Finally, (optional) medium interface module 2320 transmits redundant spectrums 2208c, d over communications medium 2108.

Figure 24A:
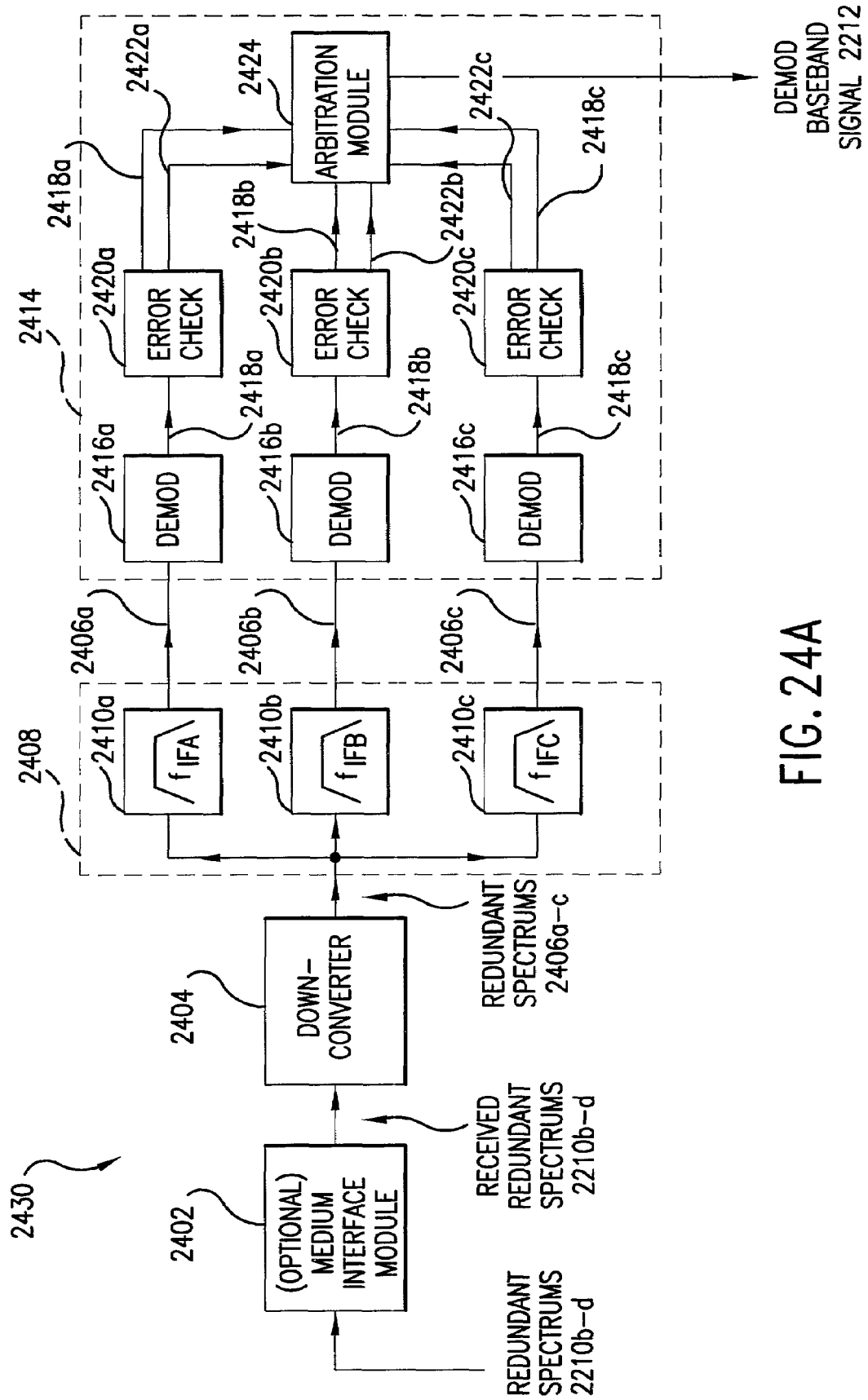
FIG. 24A illustrates an example receiver in an enhanced signal reception system according to an embodiment of the invention.

Receiver 2112 will now be explored in greater detail to illustrate recovery of a demodulated baseband signal from received redundant spectrums. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410a-c. Data extraction module 2414 includes demodulators 2416a-c, error check modules 2420a-c, and arbitration module 2424. Receiver 2430 will be discussed in relation to the signal diagrams in FIGS. 24B-24J.

Figure 24J:
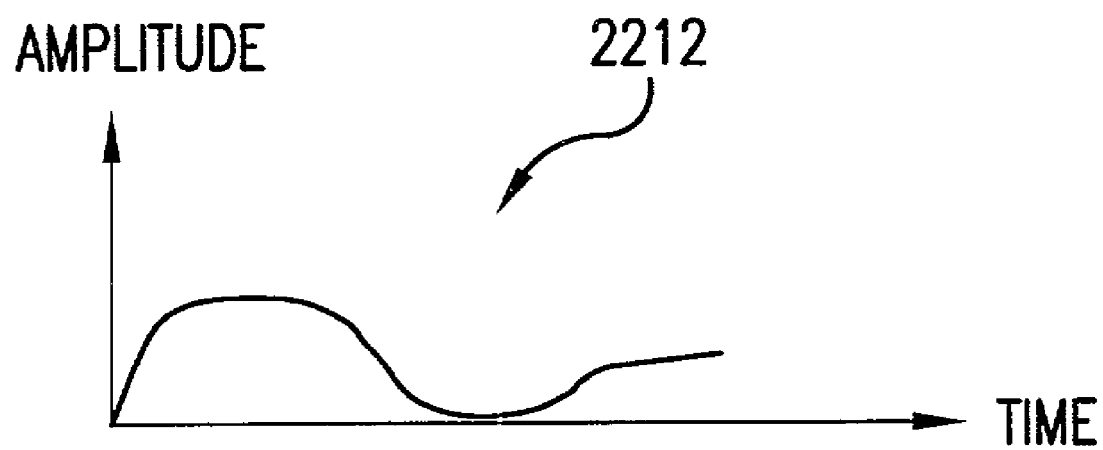

In one embodiment, optional medium interface module 2402 receives redundant spectrums 2210b-d (FIG. 22E, and FIG. 24B). Each redundant spectrum 2210b-d includes the necessary amplitude, phase, and frequency information to substantially reconstruct the modulating baseband signal used to generated the redundant spectrums. However, in the present example, spectrum 2210c also contains jamming signal 2211, which may interfere with the recovery of a baseband signal from spectrum 2210c. Down-converter 2404 down-converts received redundant spectrums 2210b-d to lower intermediate frequencies, resulting in redundant spectrums 2406a-c (FIG. 24C). Jamming signal 2211 is also down-converted to jamming signal 2407, as it is contained within redundant spectrum 2406b. Spectrum isolation module 2408 includes filters 2410a-c that isolate redundant spectrums 2406a-c from each other (FIGS. 24D-24F, respectively). Demodulators 2416a-c independently demodulate spectrums 2406a-c, resulting in demodulated baseband signals 2418a-c, respectively (FIGS. 24G-24I). Error check modules 2420a-c analyze the demodulated baseband signals 2418a-c to detect any errors. In one embodiment, each error check module 2420a-c sets an error flag 2422a-c whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectrums, where the degree of similarity is application dependent.

Referring to FIGS. 24G-I, arbitration module 2424 will select either demodulated baseband signal 2418a or 2418c, because error check module 2420b will set the error flag 2422b that is associated with demodulated baseband signal 2418b.

The error detection schemes implemented by the error detection modules include but are not limited to: cyclic redundancy check (CRC) and parity check for digital signals, and various error detections schemes for analog signal.

Further details of enhanced signal reception as described in this section are presented in pending U.S. application "Method and System for Ensuring Reception of a Communications Signal," Ser. No. 09/176,415, filed Oct. 21, 1998, issued as U.S. Pat. No. 6,061,555 on May 9, 2000, incorporated herein by reference in its entirety.

5. Unified Down-conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
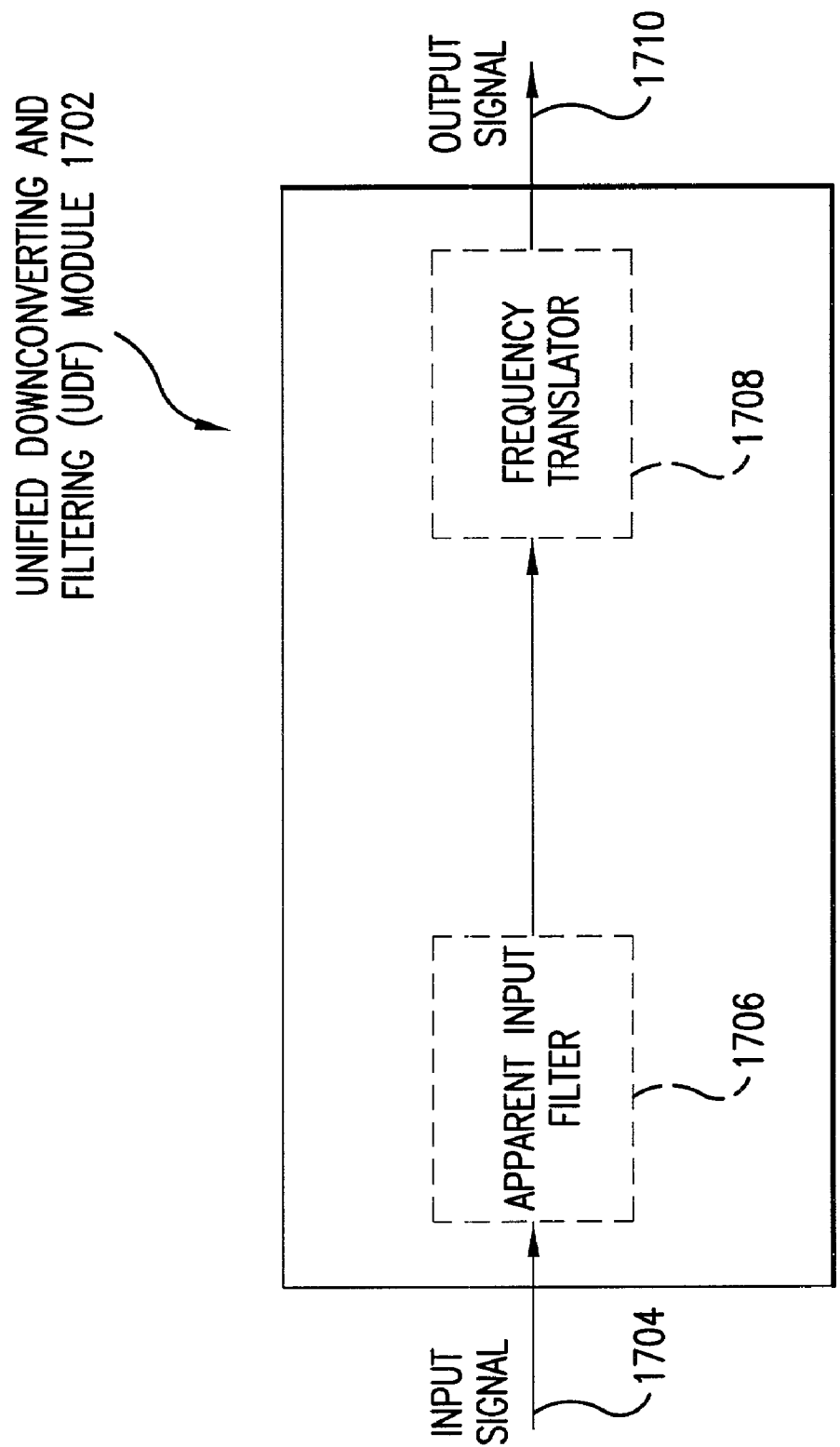
FIG. 17 illustrates a unified down-converting and filtering (UDF) module according to an embodiment of the invention.

FIG. 17 is a conceptual block diagram of a UDF module 1702 according to an embodiment of the present invention. The UDF module 1702 performs at least frequency translation and frequency selectivity.

The effect achieved by the UDF module 1702 is to perform the frequency selectivity operation prior to the performance of the frequency translation operation. Thus, the UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by the UDF module 1702 are at radio frequencies. The UDF module 1702 effectively operates to input filter these RF input signals 1704. Specifically, in these embodiments, the UDF module 1702 effectively performs input, channel select filtering of the RF input signal 1704. Accordingly, the invention achieves high selectivity at high frequencies.

The UDF module 1702 effectively performs various types of filtering, including but not limited to bandpass filtering, low pass filtering, high pass filtering, notch filtering, all pass filtering, band stop filtering, etc., and combinations thereof.

Conceptually, the UDF module 1702 includes a frequency translator 1708. The frequency translator 1708 conceptually represents that portion of the UDF module 1702 that performs frequency translation (down conversion).

The UDF module 1702 also conceptually includes an apparent input filter 1706 (also sometimes called an input filtering emulator). Conceptually, the apparent input filter 1706 represents that portion of the UDF module 1702 that performs input filtering.

In practice, the input filtering operation performed by the UDF module 1702 is integrated with the frequency translation operation. The input filtering operation can be viewed as being performed concurrently with the frequency translation operation. This is a reason why the input filter 1706 is herein referred to as an "apparent" input filter 1706.

The UDF module 1702 of the present invention includes a number of advantages. For example, high selectivity at high frequencies is realizable using the UDF module 1702. This feature of the invention is evident by the high Q factors that are attainable. For example, and without limitation, the UDF module 1702 can be designed with a filter center frequency $f_c$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_c$ of the UDF module 1702 can be electrically adjusted, either statically or dynamically.

Also, the UDF module 1702 can be designed to amplify input signals.

Further, the UDF module 1702 can be implemented without large resistors, capacitors, or inductors. Also, the UDF module 1702 does not require that tight tolerances be maintained on the values of its individual components, i.e., its resistors, capacitors, inductors, etc. As a result, the architecture of the UDF module 1702 is friendly to integrated circuit design techniques and processes.

The features and advantages exhibited by the UDF module 1702 are achieved at least in part by adopting a new technological paradigm with respect to frequency selectivity and translation. Specifically, according to the present invention, the UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19:
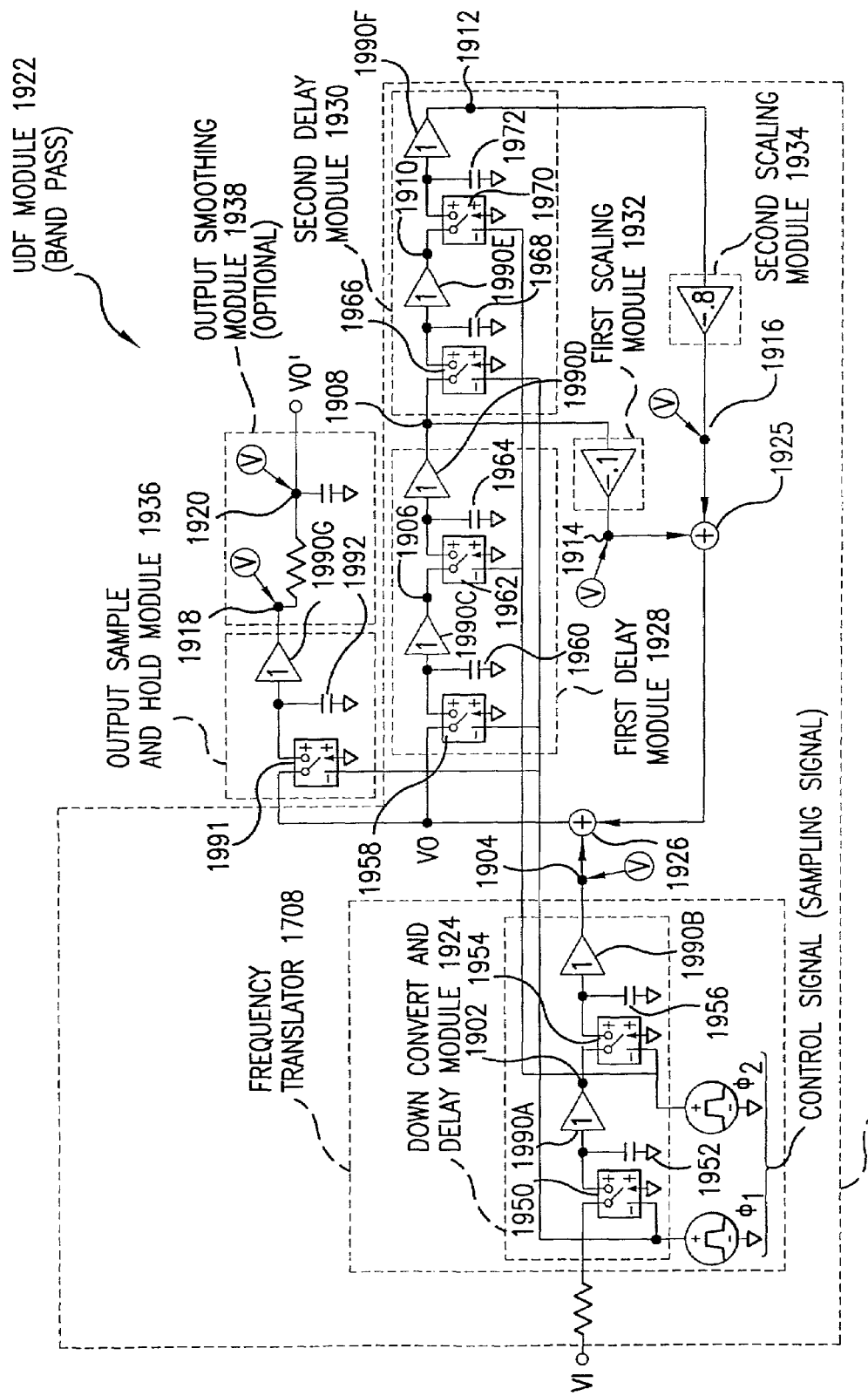
FIG. 19 is a detailed diagram of an example UDF module according to an embodiment of the invention.

FIG. 19 illustrates an example implementation of the unified down-converting and filtering (UDF) module 1922. The UDF module 1922 performs the frequency translation operation and the frequency selectivity operation in an integrated, unified manner as described above, and as further described below.

In the example of FIG. 19, the frequency selectivity operation performed by the UDF module 1922 comprises a band-pass filtering operation according to the equation that follows, which is an example representation of a band-pass filtering transfer function.

$$VO = \alpha_1 z^{-1} VI - \beta_1 z^{-1} VO - \beta_0 z^{-2} VO$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, the equation above is referred to herein for illustrative purposes only, and is not limiting.

The UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, the output smoothing module 1938 is optional.

As further described below, in the example of FIG. 19, the down-convert and delay module 1924 and the first and second delay modules 1928 and 1930 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 19, it is assumed that $\alpha_1$ is equal to one. Thus, the output of the down-convert and delay module 1924 is not scaled. As evident from the embodiments described above, however, the invention is not limited to this example.

The example UDF module 1922 has a filter center frequency of 900.2 MHZ and a filter bandwidth of 570 KHz. The pass band of the UDF module 1922 is on the order of 899.915 MHZ to 900.485 MHZ. The Q factor of the UDF module 1922 is approximately 1879 (i.e., 900.2 MHZ divided by 570 KHz).

The operation of the UDF module 1922 shall now be described with reference to a Table 1802 (FIG. 18) that indicates example values at nodes in the UDF module 1922 at a number of consecutive time increments. It is assumed in Table 1802 that the UDF module 1922 begins operating at time t−1. As indicated below, the UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 in the down-convert and delay module 1924 closes. This allows a capacitor 1952 to charge to the current value of an input signal, $V_{t-1}$, such that node 1902 is at $V_{t-1}$. This is indicated by cell 1804 in FIG. 18. In effect, the combination of the switch 1950 and the capacitor 1952 in the down-convert and delay module 1924 operates to translate the frequency of the input signal VI to a desired lower frequency, such as IF or baseband. Thus, the value stored in the capacitor 1952 represents an instance of a down-converted image of the input signal VI.

The manner in which the down-convert and delay module 1924 performs frequency down-conversion is further described elsewhere in this application, and is additionally described in U.S. application "Method and System for Down-Converting Electromagnetic Signals," Ser. No. 09/176,022, filed Oct. 21, 1998, issued as U.S. Pat. No. 6,061,551 on May 9, 2000, which is herein incorporated by reference in its entirety.

Also at the rising edge of $\phi_1$ at time t−1, a switch 1958 in the first delay module 1928 closes, allowing a capacitor 1960 to charge to $VO_{t-1}$, such that node 1906 is at $VO_{t-1}$. This is indicated by cell 1806 in Table 1802. (In practice, $VO_{t-1}$ is undefined at this point. However, for ease of understanding, $VO_{t-1}$ shall continue to be used for purposes of explanation.)

Also at the rising edge of $\phi_1$ at time t−1, a switch 1966 in the second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\phi_2$ at time t−1, a switch 1954 in the down-convert and delay module 1924 closes, allowing a capacitor 1956 to charge to the level of the capacitor 1952. Accordingly, the capacitor 1956 charges to $VI_{t-1}$, such that node 1904 is at $VI_{t-1}$. This is indicated by cell 1810 in Table 1802.

The UDF module 1922 may optionally include a unity gain module 1990A between capacitors 1952 and 1956. The unity gain module 1990A operates as a current source to enable capacitor 1956 to charge without draining the charge from capacitor 1952. For a similar reason, the UDF module 1922 may include other unity gain modules 1990B-1990G. It should be understood that, for many embodiments and applications of the invention, these unity gain modules 1990A-1990G are optional. The structure and operation of the unity gain modules 1990 will be apparent to persons skilled in the relevant art(s).

Also at the rising edge of $\phi_2$ at time t−1, a switch 1962 in the first delay module 1928 closes, allowing a capacitor 1964 to charge to the level of the capacitor 1960. Accordingly, the capacitor 1964 charges to $VO_{t-1}$, such that node 1908 is at $VO_{t-1}$. This is indicated by cell 1814 in Table 1802.

Also at the rising edge of $\phi_2$ at time t−1, a switch 1970 in the second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, the switch 1950 in the down-convert and delay module 1924 closes. This allows the capacitor 1952 to charge to $VI_t$, such that node 1902 is at $VI_t$. This is indicated in cell 1816 of Table 1802.

Also at the rising edge of $\phi_2$ at time t, the switch 1958 in the first delay module 1928 closes, thereby allowing the capacitor 1960 to charge to $VO_t$. Accordingly, node 1906 is at $VO_t$. This is indicated in cell 1820 in Table 1802.

Further at the rising edge of $\phi_1$ at time t, the switch 1966 in the second delay module 1930 closes, allowing a capacitor 1968 to charge to the level of the capacitor 1964. Therefore, the capacitor 1968 charges to $VO_{t-1}$, such that node 1910 is at $VO_{t-1}$. This is indicated by cell 1824 in Table 1802.

At the rising edge of $\phi_2$ at time t, the switch 1954 in the down-convert and delay module 1924 closes, allowing the capacitor 1956 to charge to the level of the capacitor 1952. Accordingly, the capacitor 1956 charges to $VI_t$, such that node 1904 is at $VI_t$. This is indicated in cell 1828 in Table 1802.

Also at the rising edge of $\phi_2$ at time t, the switch 1962 in the first delay module 1928 closes, allowing the capacitor 1964 to charge to the level in the capacitor 1960. Therefore, the capacitor 1964 charges to $VO_t$, such that node 1908 is at $VO_t$. This is indicated by cell 1832 in Table 1802.

Further at the rising edge of $\phi_2$ at time t, the switch 1970 in the second delay module 1930 closes, allowing the capacitor 1972 in the second delay module 1930 to charge to the level of the capacitor 1968 in the second delay module 1930. Therefore, the capacitor 1972 charges to $VO_{t-1}$, such that node 1912 is at $VO_{t-1}$. This is indicated in cell 1836 of FIG. 18.

At time t+1, at the rising edge of $\phi_1$, the switch 1950 in the down-convert and delay module 1924 closes, allowing the capacitor 1952 to charge to $VI_{t+1}$. Therefore, node 1902 is at $V_{t+1}$, as indicated by cell 1838 of Table 1802.

Also at the rising edge of $\phi_1$ at time t+1, the switch 1958 in the first delay module 1928 closes, allowing the capacitor 1960 to charge to $VO_{t+1}$. Accordingly, node 1906 is at $VO_{t+1}$, as indicated by cell 1842 in Table 1802.

Further at the rising edge of $\phi_2$ at time t+1, the switch 1966 in the second delay module 1930 closes, allowing the capacitor 1968 to charge to the level of the capacitor 1964. Accordingly, the capacitor 1968 charges to $VO_t$, as indicated by cell 1846 of Table 1802.

In the example of FIG. 19, the first scaling module 1932 scales the value at node 1908 (i.e., the output of the first delay module 1928) by a scaling factor of −0.1. Accordingly, the value present at node 1914 at time t+1 is $-0.1*VO_t$. Similarly, the second scaling module 1934 scales the value present at node 1912 (i.e., the output of the second scaling module 1930) by a scaling factor of −0.8. Accordingly, the value present at node 1916 is $-0.8*VO_{t-1}$ at time t+1.

At time t+1, the values at the inputs of the summer 1926 are: $VI_t$ at node 1904, $-0.1*VO_t$ at node 1914, and $-0.8*VO_{t-1}$ at node 1916 (in the example of FIG. 19, the values at nodes 1914 and 1916 are summed by a second summer 1925, and this sum is presented to the summer 1926). Accordingly, at time t+1, the summer generates a signal equal to $VI_t - 0.1*VO_t - 0.8*VO_{t-1}$.

At the rising edge of $\phi_1$ at time t+1, a switch 1991 in the output sample and hold module 1936 closes, thereby allowing a capacitor 1992 to charge to $VO_{+1}$. Accordingly, the capacitor 1992 charges to $VO_{t+1}$, which is equal to the sum generated by the adder 1926. As just noted, this value is equal to: $VI_t - 0.1*VO_t - 0.8*VO_{t-1}$. This is indicated in cell 1850 of Table 1802. This value is presented to the optional output smoothing module 1938, which smooths the signal to thereby generate the instance of the output signal $VO_{t+1}$. It is apparent from inspection that this value of $VO_{t+1}$ is consistent with the band pass filter transfer function of EQ. 1.

Further details of unified down-conversion and filtering as described in this section are presented in pending U.S. application "Integrated Frequency Translation And Selectivity," Ser. No. 09/175,966, filed Oct. 21, 1998, issued as U.S. Pat. No. 6,049,706 on Apr. 11, 2000, incorporated herein by reference in its entirety.

6. Example Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Example applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these example applications. Additional applications of the UFT module will be apparent to persons skilled in the relevant art(s), based on the teachings contained herein.

Figure 7:
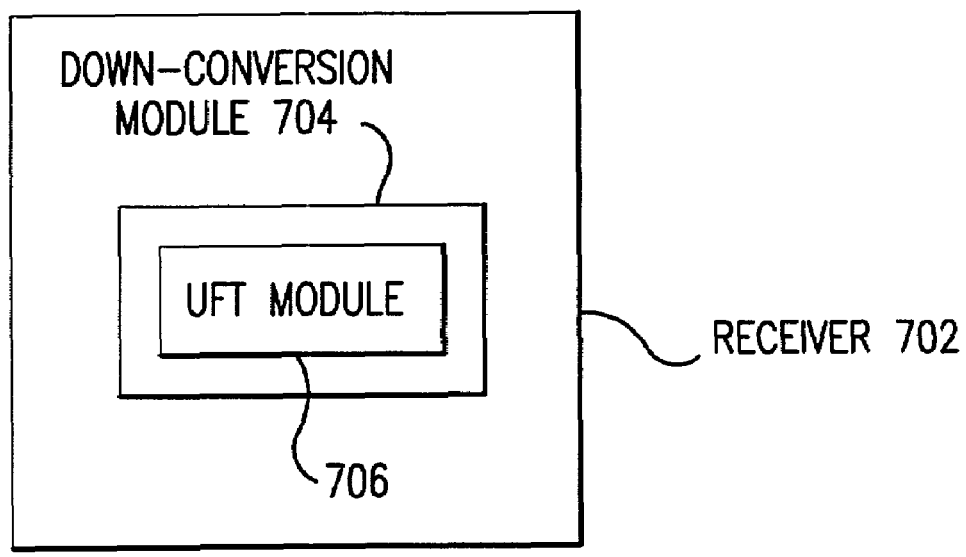
FIG. 7 illustrates a UFT module used in a receiver according to an embodiment of the invention.

For example, the present invention can be used in applications that involve frequency down-conversion. This is shown in FIG. 1C, for example, where an example UFT module 115 is used in a down-conversion module 114. In this capacity, the UFT module 115 frequency down-converts an input signal to an output signal. This is also shown in FIG. 7, for example, where an example UFT module 706 is part of a down-conversion module 704, which is part of a receiver 702.

Figure 8:
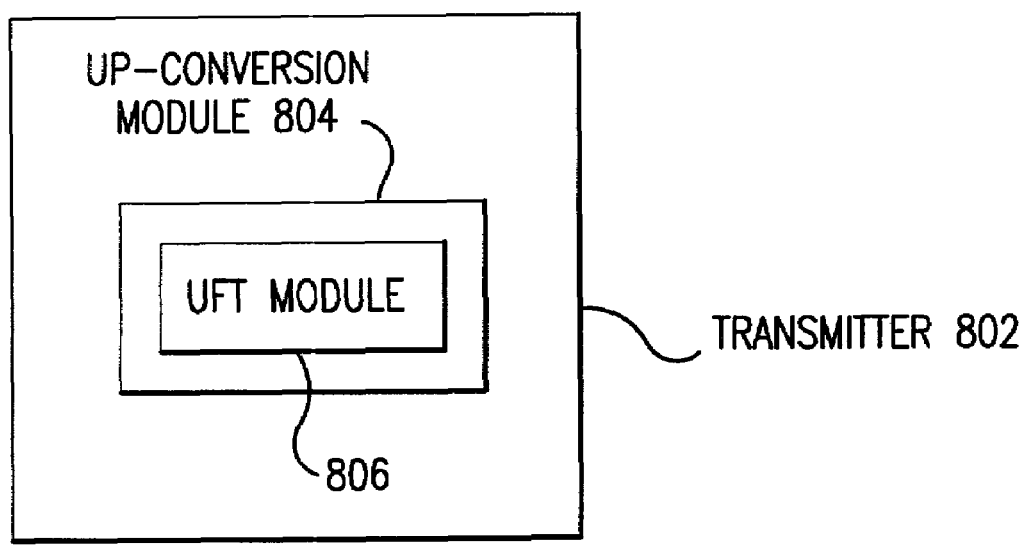
FIG. 8 illustrates a UFT module used in a transmitter according to an embodiment of the invention.

The present invention can be used in applications that involve frequency up-conversion. This is shown in FIG. 1D, for example, where an example UFT module 117 is used in a frequency up-conversion module 116. In this capacity, the UFT module 117 frequency up-converts an input signal to an output signal. This is also shown in FIG. 8, for example, where an example UFT module 806 is part of up-conversion module 804, which is part of a transmitter 802.

Figure 9:
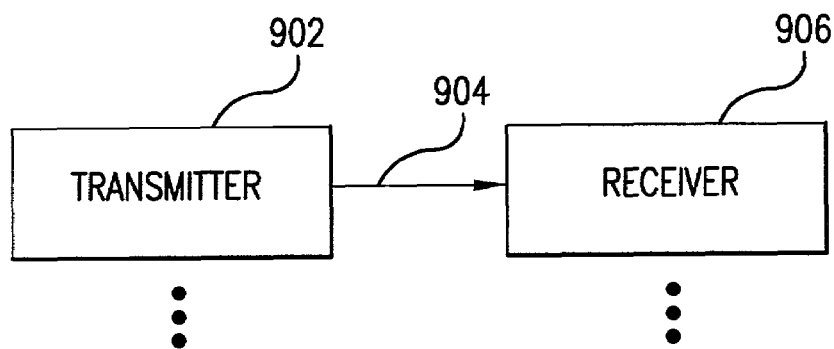
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more of the transmitters 902 may be implemented using a UFT module, as shown for example in FIG. 8. Also, one or more of the receivers 906 may be implemented using a UFT module, as shown for example in FIG. 7.

Figure 10:
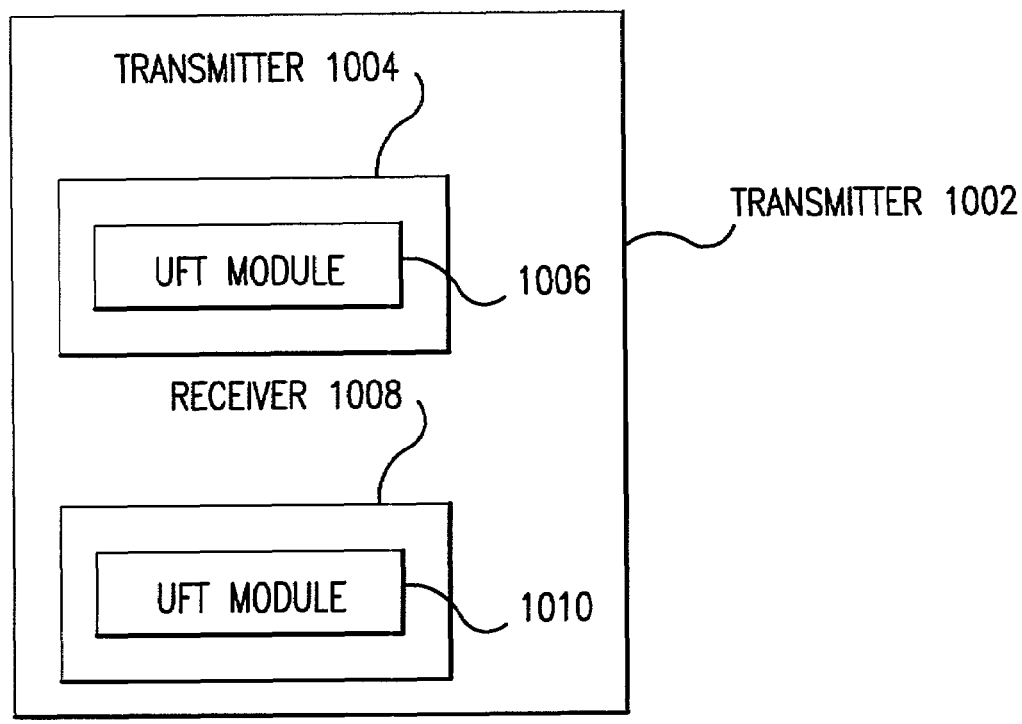
FIG. 10 illustrates a transceiver according to an embodiment of the invention.

The invention can be used to implement a transceiver. An example transceiver 1002 is illustrated in FIG. 10. The transceiver 1002 includes a transmitter 1004 and a receiver 1008. Either the transmitter 1004 or the receiver 1008 can be implemented using a UFT module. Alternatively, the transmitter 1004 can be implemented using a UFT module 1006, and the receiver 1008 can be implemented using a UFT module 1010. This embodiment is shown in FIG. 10.

Figure 11:
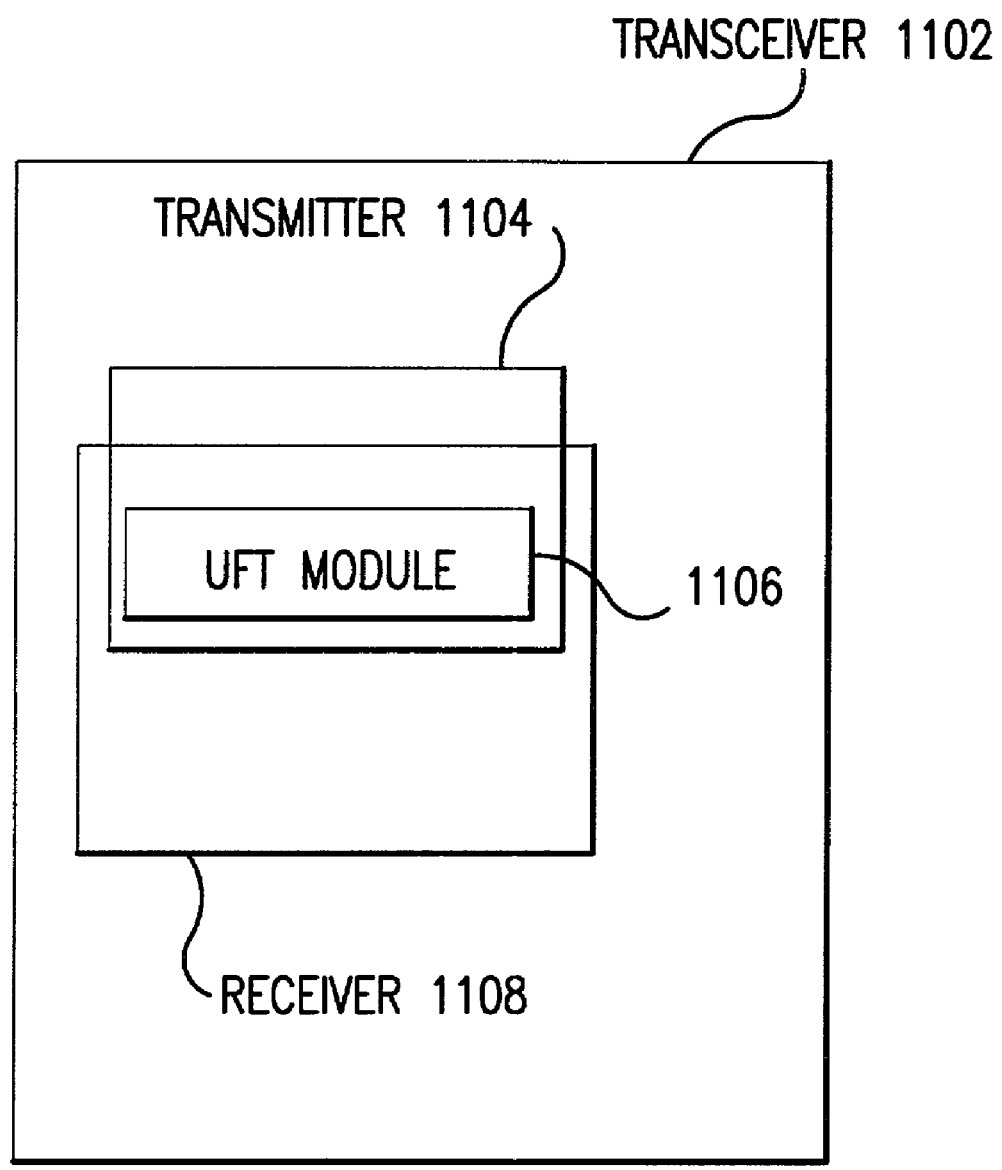
FIG. 11 illustrates a transceiver according to an alternative embodiment of the invention.

Another transceiver embodiment according to the invention is shown in FIG. 11. In this transceiver 1102, the transmitter 1104 and the receiver 1108 are implemented using a single UFT module 1106. In other words, the transmitter 1104 and the receiver 1108 share a UFT module 1106.

Figure 12:
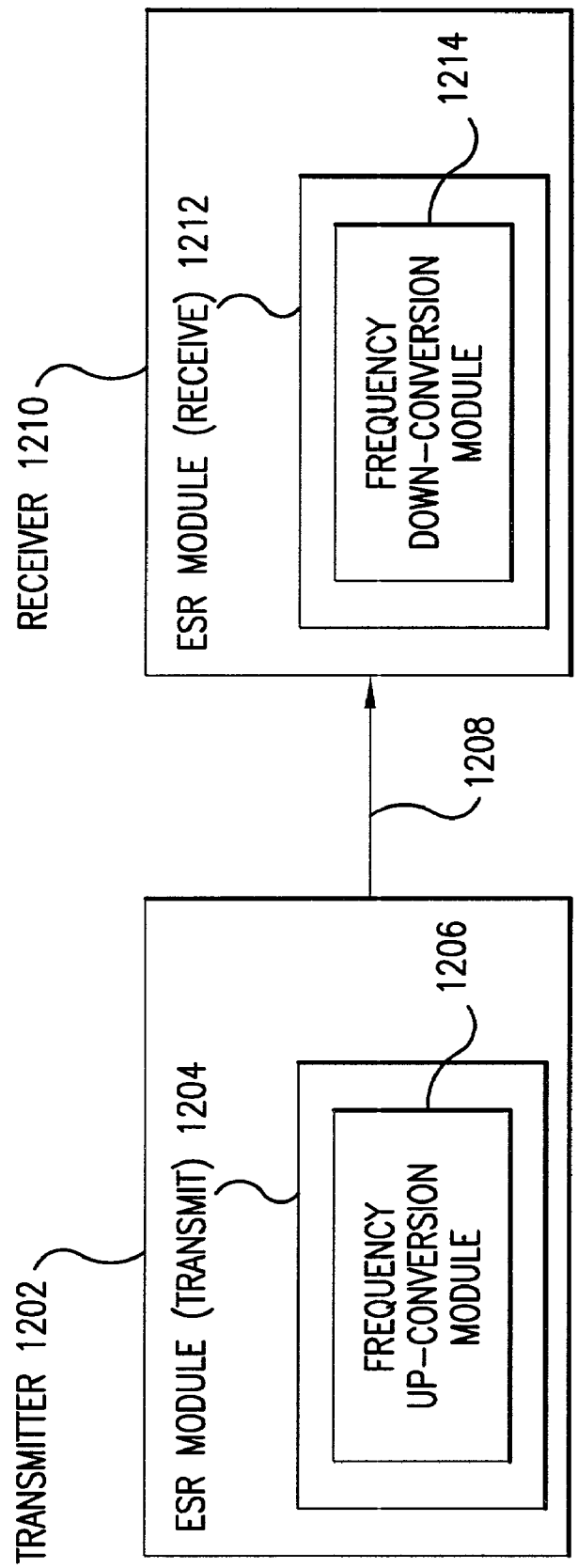
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) in a transmitter 1202, and an ESR module (receive) in a receiver 1210. An example ESR embodiment configured in this manner is illustrated in FIG. 12.

The ESR module (transmit) 1204 includes a frequency up-conversion module 1206. Some embodiments of this frequency up-conversion module 1206 may be implemented using a UFT module, such as that shown in FIG. 1D.

The ESR module (receive) 1212 includes a frequency down-conversion module 1214. Some embodiments of this frequency down-conversion module 1214 may be implemented using a UFT module, such as that shown in FIG. 1C.

Figure 13:
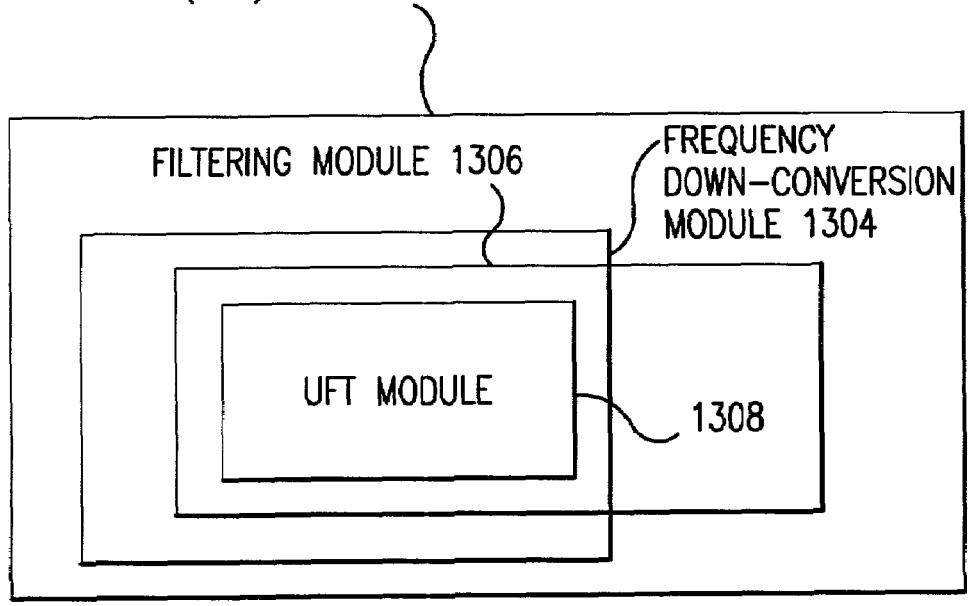
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An example unified down-conversion and filtering module 1302 is illustrated in FIG. 13. The unified down-conversion and filtering module 1302 includes a frequency down-conversion module 1304 and a filtering module 1306. According to the invention, the frequency down-conversion module 1304 and the filtering module 1306 are implemented using a UFT module 1308, as indicated in FIG. 13.

Figure 15A:
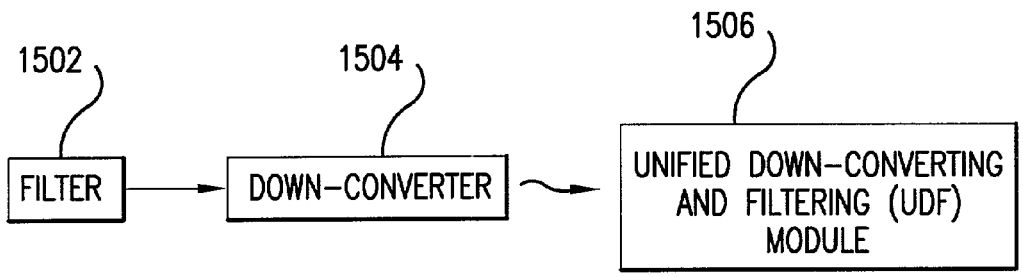
FIGS. 15A-15F illustrate example applications of the UDF module according to embodiments of the invention.
Figure 15B:
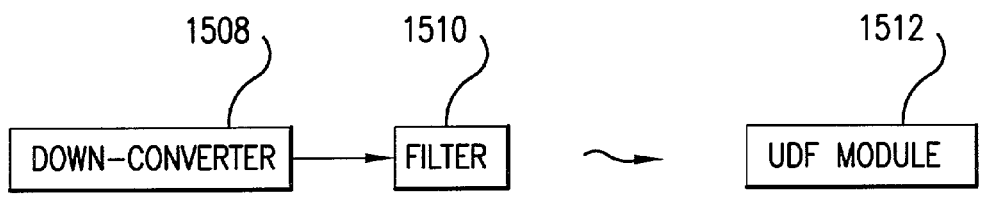
Figure 15C:
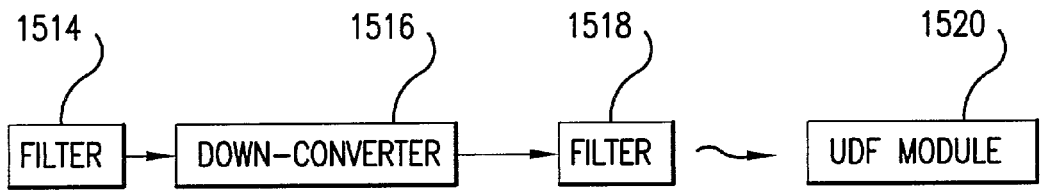
Figure 15D:
Figure 15E:
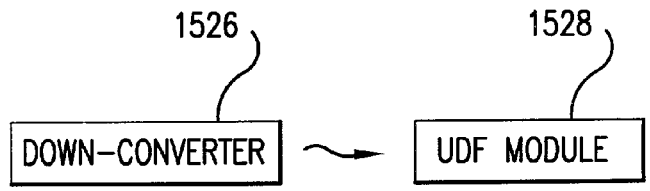
Figure 15F:
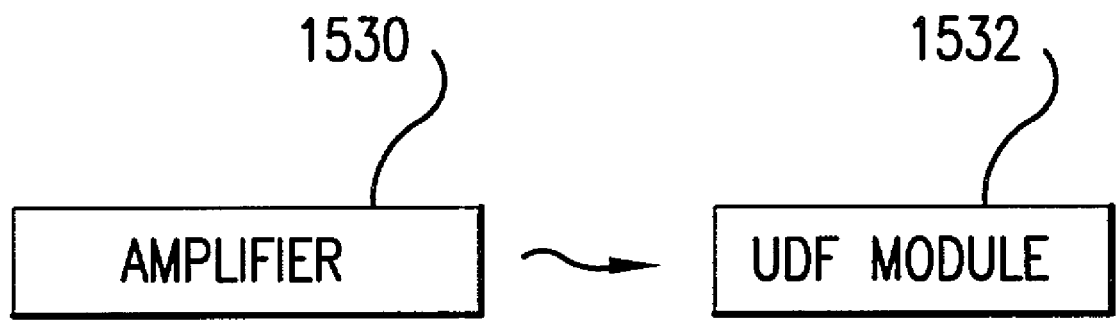

Unified down-conversion and filtering according to the invention is useful in applications involving filtering and/or frequency down-conversion. This is depicted, for example, in FIGS. 15A-15F. FIGS. 15A-15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be utilized as a filter 1522 (i.e., where the extent of frequency down-conversion by the down-converter in the unified down-conversion and filtering module 1524 is minimized). FIG. 15E indicates that a unified down-conversion and filtering module 1528 according to the invention can be utilized as a down-converter 1526 (i.e., where the filter in the unified down-conversion and filtering module 1528 passes substantially all frequencies). FIG. 15F illustrates that the unified down-conversion and filtering module 1532 can be used as an amplifier. It is noted that one or more UDF modules can be used in applications that involve at least one or more of filtering, frequency translation, and amplification.

Figure 14:
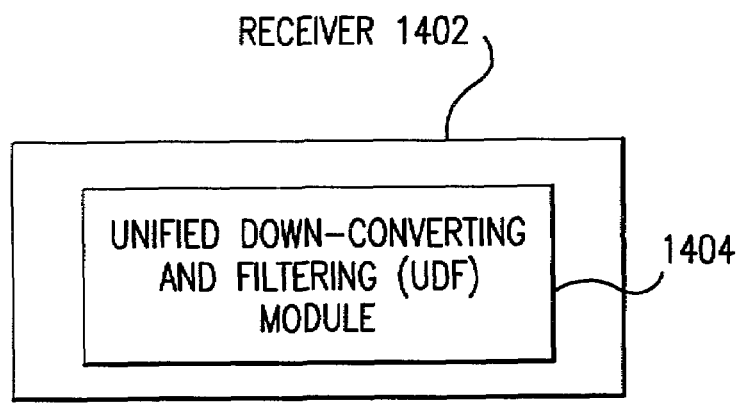
FIG. 14 illustrates an example receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
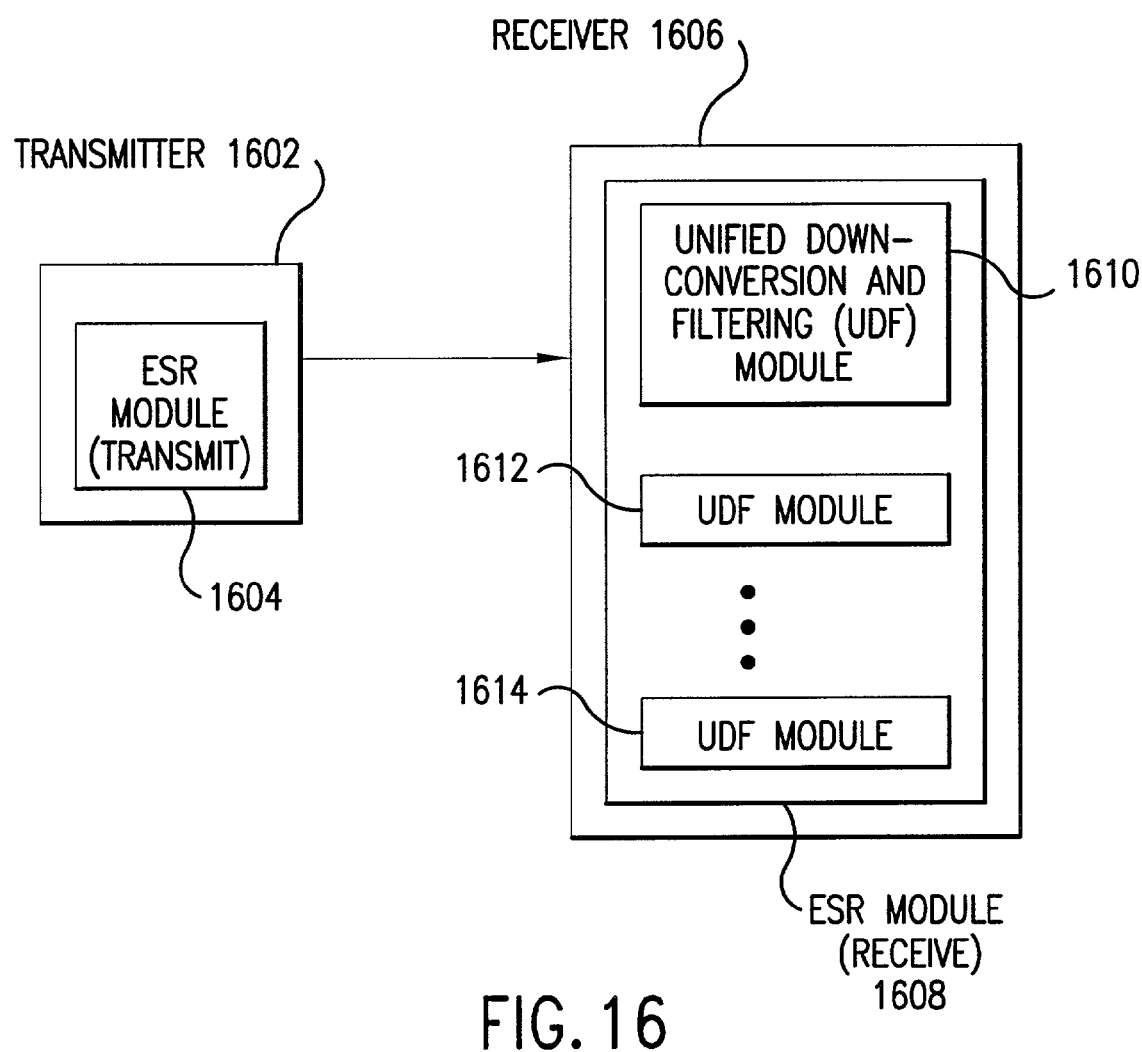
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectrums. The ESR module (receive) also operates to isolate the spectrums in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of the UDF modules 1610, 1612, 1614 operates to down-convert a received signal. The UDF modules 1610, 1612, 1614 also operate to filter the down-converted signal so as to isolate the spectrum(s) contained therein. As noted above, the UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the example applications of the UFT module discussed herein. Also, the invention is not limited to the example combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional example applications are described below.

7. Phase Shifting Using Universal Frequency Translation 7.1 High Level Description Universal Frequency Translation is described herein and is described in the above referenced applications including U.S. patent application Ser. Nos. 09/176,022, 09/293,095, 09/293,342, 09/176,154, and 09/521,878, and incorporated herein by reference in their entireties.

Figure 25A:
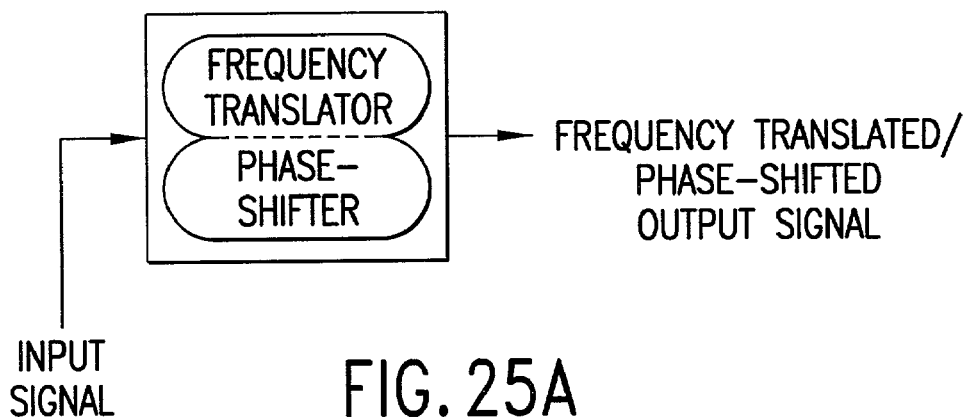
FIGS. 25A-C illustrate conceptual representations of the invention including frequency translation and phase shifting according to embodiments of the invention.
Figure 25B:
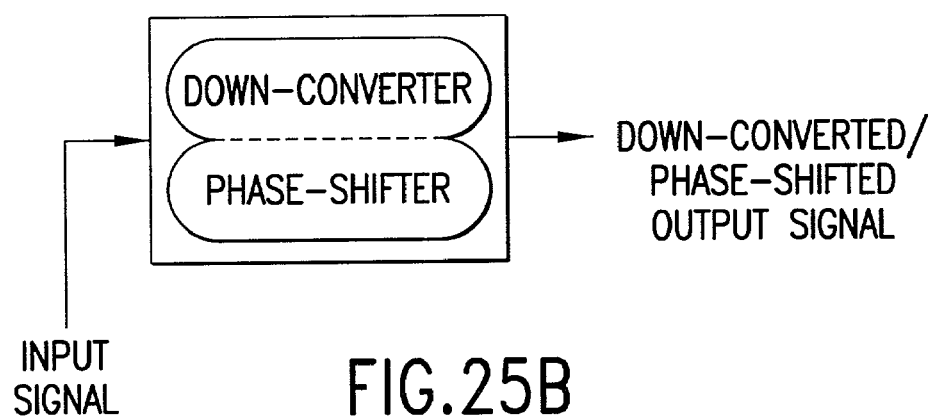
Figure 25C:
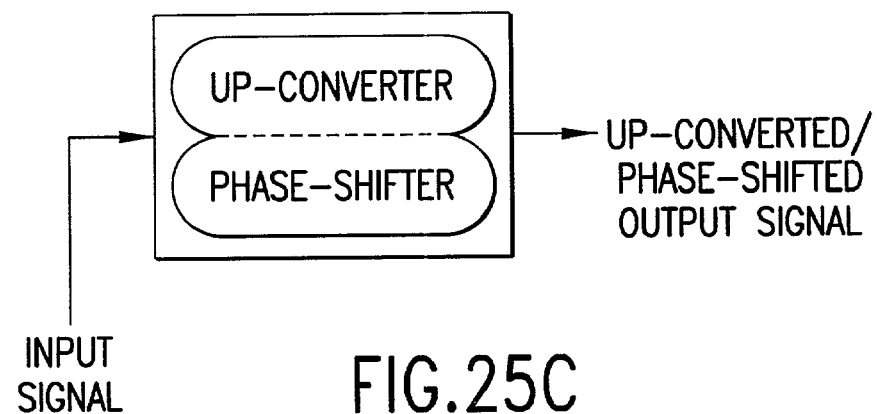

As stated herein and in the above referenced applications, a Universal Frequency Translation (UFT) module can be configured to down-convert an input signal to an IF signal or a baseband signal by sampling the input signal according to a periodic control signal (also called an aliasing signal). Similarly, a UFT module can be configured to up-convert a baseband signal by sampling the baseband signal according to the control signal. By controlling the relative sampling time, the UFT module implements a relative phase shift during the down-conversion or up-conversion. In other words, a relative phase shift can be introduced in the output signal by sampling the input signal at one point in time relative to another point in time. As such, the UFT module can be configured as an integrated frequency translator and phase-shifter as shown in FIG. 25A. This includes the UFT module as an integrated down-converter and phase-shifter as shown in FIG. 25B, and the UFT module as an integrated up-converter and phase-shifter as shown in FIG. 25C.

Figure 25D:
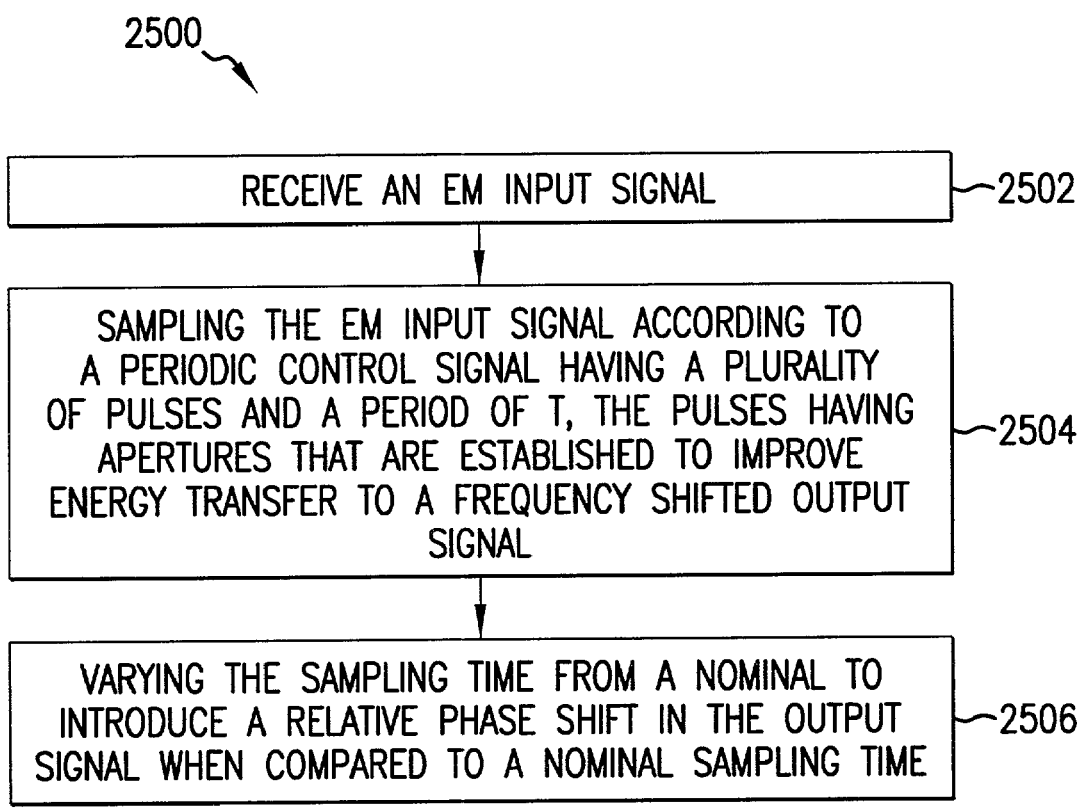
FIG. 25D illustrates a flowchart 2500 according to embodiments of the invention.

FIG. 25D illustrates a flowchart 2500 that further describes phase shifting and frequency translation according to embodiments of the present invention. Flowchart 2500 is discussed in terms of general frequency translation, and is applicable to both down-conversion and up-conversion. Specific embodiments that are directed to down-conversion and up-conversion are also discussed herein in following sections.

In step 2502, an EM input signal is received.

In step 2504, the EM input signal is sampled according to a periodic control signal having a nominal period of T, resulting in a frequency translated output signal. In other words, the EM signal is periodically sampled T seconds apart. In embodiments of the invention, the control signal comprises a plurality of pulses having apertures (or pulse widths) that are established to transfer non-negligible amounts of energy to the output signal. In other words, the apertures of the control signal can be varied to improve (and optimize) energy transfer to the frequency translated output signal. In further embodiments the shape of the sampling pulses may be modified to emulate a matched filter that corresponds to the shape of the input EM signal. For example, given a sinusoidal input, the corners of the pulses may be "rounded-off" to better match the input signal, thereby further improving energy transfer to the frequency translated output signal.

For down-conversion, the output signal is a down-converted image of the EM input signal. As discussed in the patent applications cited above, the EM input signal can be down-converted directly to baseband or can be down-converted to an IF frequency. For direct baseband conversion, the frequency of the control signal is preferably a sub-harmonic of the EM input signal. For IF conversion, the frequency of the control signal is preferably offset from a sub-harmonic of the EM input signal as represented by the following equation:

$$\text{Freq}_{CNTL} = (\text{Freq}_{input} +/- \text{Freq}_{IF})/n$$

where: $\text{Freq}_{CNTL}$=frequency of pulses in the control signal
$\text{Freq}_{input}$=frequency of the EM input signal
$\text{Freq}_{IF}$=frequency of the output signal
n=harmonic number For up-conversion, the EM input signal is preferably a baseband signal or lower frequency signal that is up-converted to a higher frequency output signal. As discussed in the patent applications cited above, the periodic sampling of the EM input signal generates a harmonically rich signal, which contains multiple harmonics images of the baseband input signal that repeat at harmonics of the frequency of the control signal. Each harmonic image contains the necessary amplitude, frequency, and phase information to reconstruct the baseband signal. A bandpass filter can be utilized to select a harmonic (or harmonics) of interest for transmission.

In step 2506, the sampling time of the EM signal is varied (or adjusted) from the nominal sampling time to implement a relative phase shift in the output signal. In other words, the phase of the pulses in the control signal is varied so that the EM signal is sampled earlier (or later) than a nominal sampling time to implement the desired phase shift in the output signal.

Figure 25E:
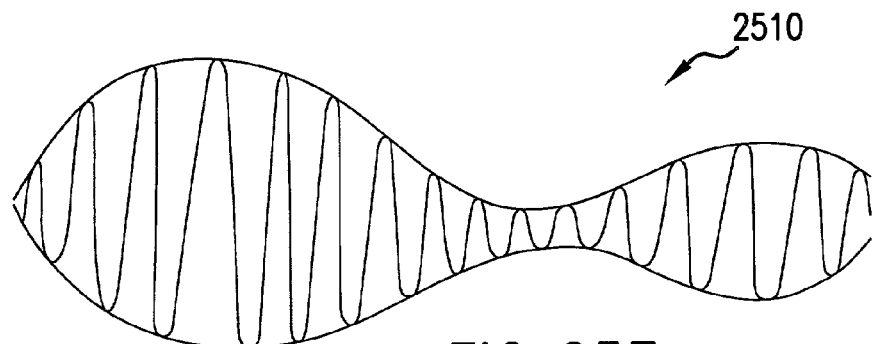
FIGS. 25E-K illustrate various signal diagrams according to embodiments of the invention.
Figure 25F:
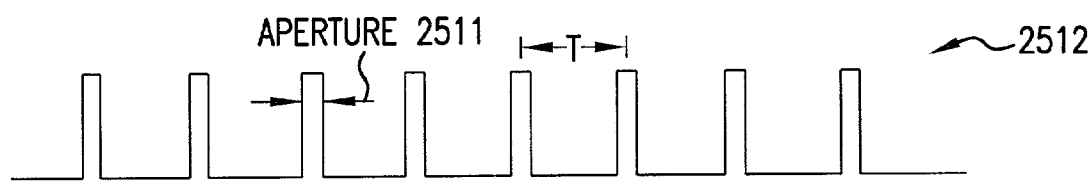
Figure 25G:
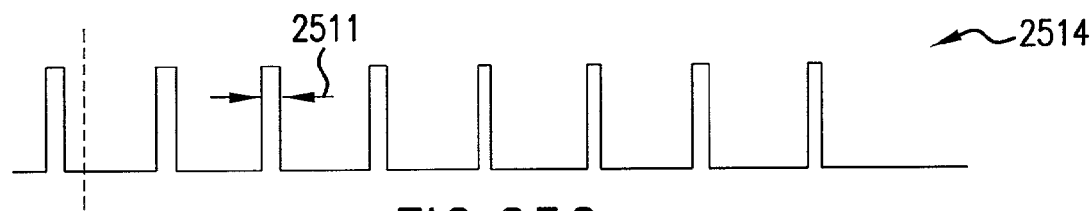
Figure 25H:
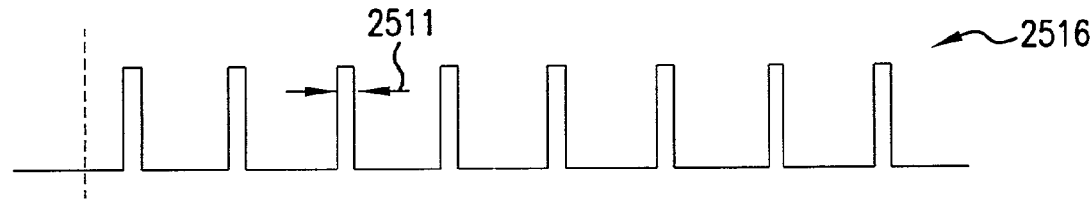
Figure 25I:
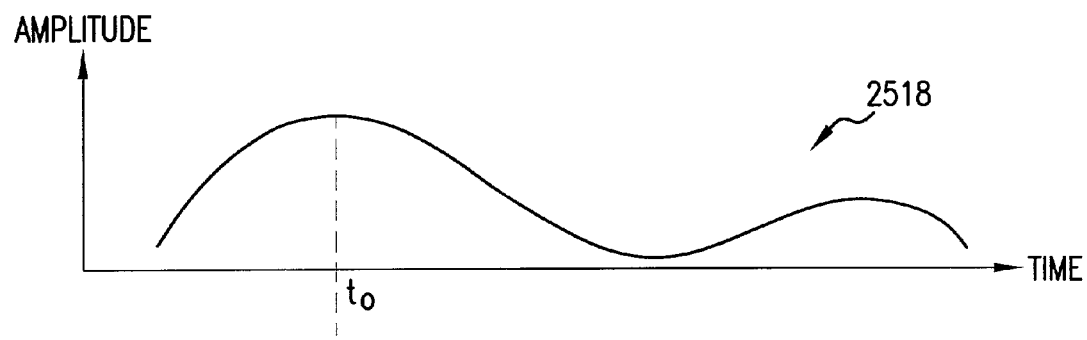
Figure 25J:
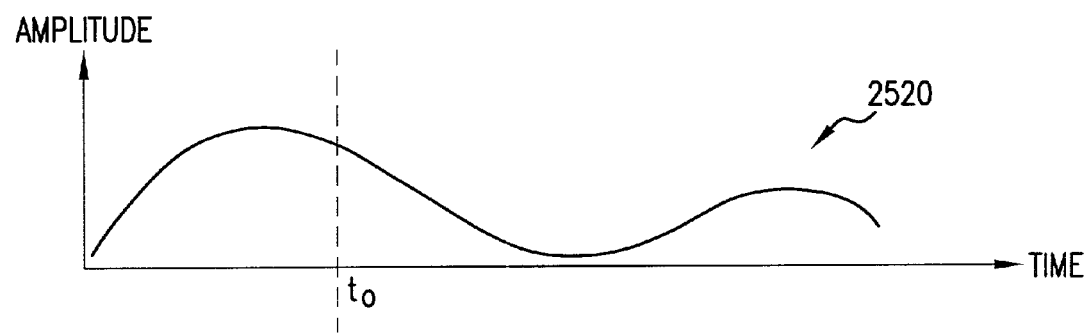

FIGS. 25E-K further illustrate variable sampling times of an EM signal to generate a frequency translated/phase-shifted output signal. FIG. 25E illustrates an example EM input signal 2510, which is an AM modulated RF signal that is to be down-converted directly to baseband, so as to strip off the AM modulation. EM input signal 2510 is sampled according to control signals in FIGS. 25F-H. FIG. 25F illustrates a reference control signal 2512 having a plurality of pulses with period T, and an aperture width 2511. FIG. 25G illustrates a control signal 2514 that leads the reference control signal 2512, as shown. FIG. 25J illustrates a control signal 2516 that lags the reference control signal 2512, as shown.

Figure 25K:
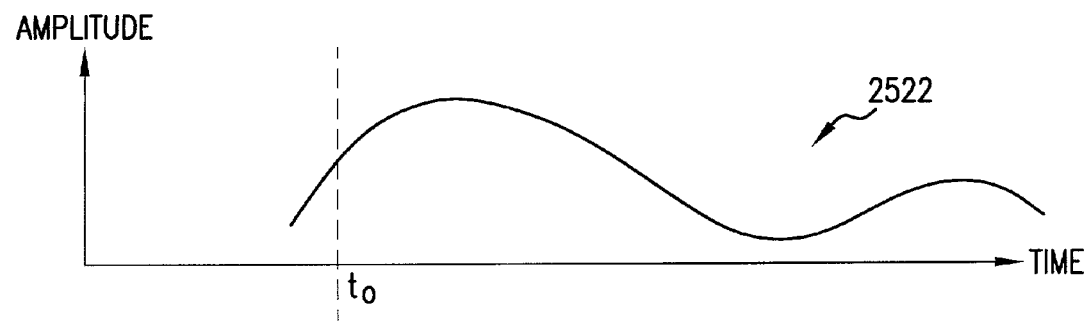

Still referring to FIGS. 25E-K, when the EM signal 2510 is sampled by a UFT module according to the reference control signal 2512, the result is a down-converted output signal 2518 that is shown in FIG. 25H. When the (leading) control signal 2514 is used to control the sampling times, the result is an output signal 2520 that is shown in FIG. 25J. When the (lagging) control signal 2516 is used to control the sampling times, the result is an output signal 2522 that is shown in FIG. 25K. By comparing the three output signals at time $t_0$, the relative phase shift can be observed. In other words, the output signal 2520 leads the reference output signal 2518 as shown, and the output signal 2522 lags the reference output signal 2518 as shown.

As illustrated in FIGS. 25E-K, the control signals include a train of pulses having a non-negligible pulse widths 2511 that tend away from zero time duration. The duration of the pulse width may vary in embodiments of the invention. For down-conversion embodiments, the pulse widths 2511 can be approximately 1/10, 1/4, 1/2, 3/4, etc., or any other fraction of the period of the EM input signal. Alternatively, the pulse widths 2511 can be approximately equal to one or more periods of the EM input signal plus 1/10, 1/4, 1/2, 3/4, etc., or any other fraction of a period of the EM signal. In a preferred embodiment, the pulse widths are approximately 1/2 of a period of the EM signal that is to be down-converted, or one or more periods plus 1/2 of a period of the EM signal. For up-conversion embodiments, the pulse widths are set to 1/2 of a period of the harmonic of interest in a preferred embodiment. The variation of pulse width and the effects of energy transfer are further described in the above referenced patent applications. Additionally, matched filter techniques can be incorporated with the present invention to improve energy transfer to the frequency translated signal. These matched filter techniques include shaping the control signal to improve or optimize energy transfer from the input signal to the output signal, and is also discussed in the above referenced patent applications.

7.2 Specific Phase Shifter Embodiments Using a UFT Module

Various specific embodiments for implementing integrated frequency translation and phase shifting using a UFT module are discussed as follows. These embodiments include but are not limited to the following: varying the DC bias of a local oscillator (LO) signal, delaying the LO signal, and changing the shape of the LO signal. As will be shown, the LO signal triggers a pulse generator that generates a control signal, which controls the sampling of the UFT module. Each of these specific embodiments are discussed below.

7.2.1 Changing a Bias Voltage of the LO Signal

Figure 26A:
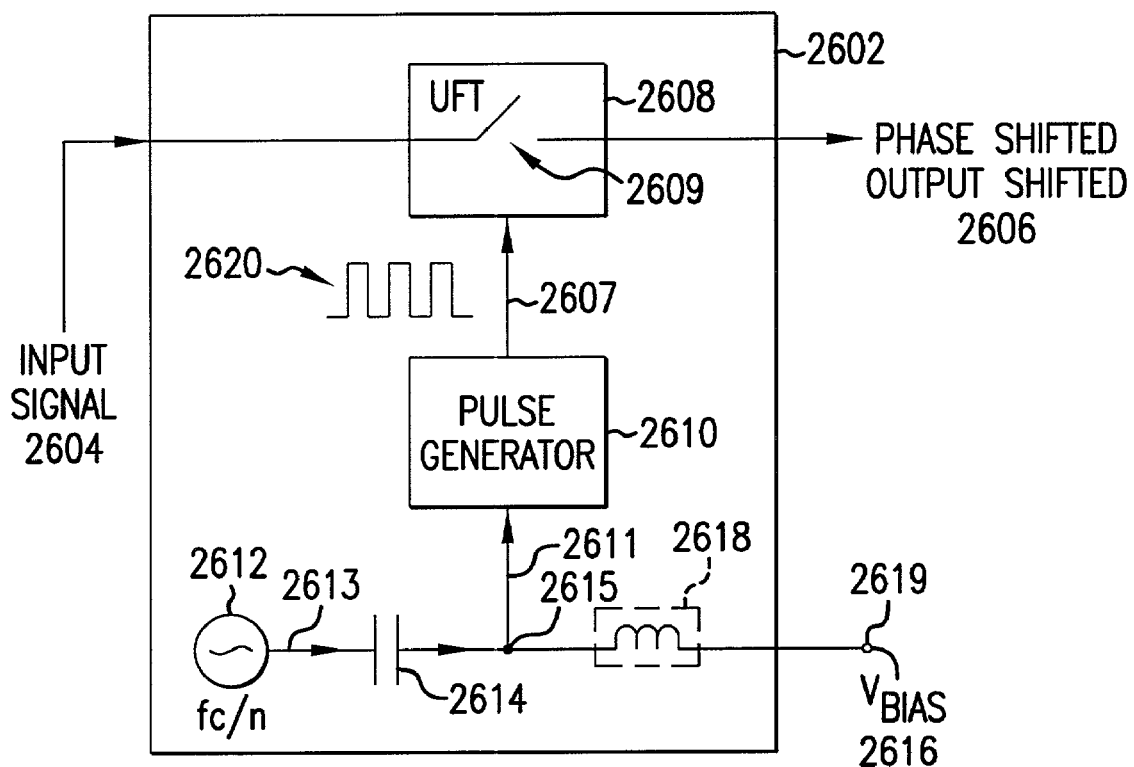
FIG. 26A illustrates a frequency translator/phase-shifter using variable bias voltage to implement the phase shift according to embodiments of the invention.

FIG. 26A illustrates an integrated frequency translator/phase-shifter 2602 according to embodiments of the invention. Frequency translator 2602 includes a UFT module 2608, a pulse generator 2610, a local oscillator 2612, a capacitor 2614, and an optional inductor 2618. Translator/shifter 2602 translates and phase shifts the input signal 2604 to generate the output signal 2606. The frequency translation and phase shift occur in an integrated (or unified, combined, simultaneous, etc.) manner, where the amount of relative phase shift is based on the relative bias voltage 2616.

Frequency translator 2602 performs frequency translation because of the periodic undersampling performed by the UFT module 2608. Frequency translator 2602 simultaneously implements a phase shift because the bias voltage 2616 changes the DC offset of the LO signal that triggers the pulse generator 2610. As will be shown, the bias voltage 2616 causes the pulse generator to trigger earlier (or later) in time relative to a reference bias voltage (e.g. 0 volts). In turn, this causes the UFT module 2608 to sample the input signal earlier (or later) in time, relative to the reference bias voltage. Since time is proportional to phase shift for electromagnetic signals, the variations in sampling time by the UFT module causes a phase shift in the output signal 2606.

Figure 26B:
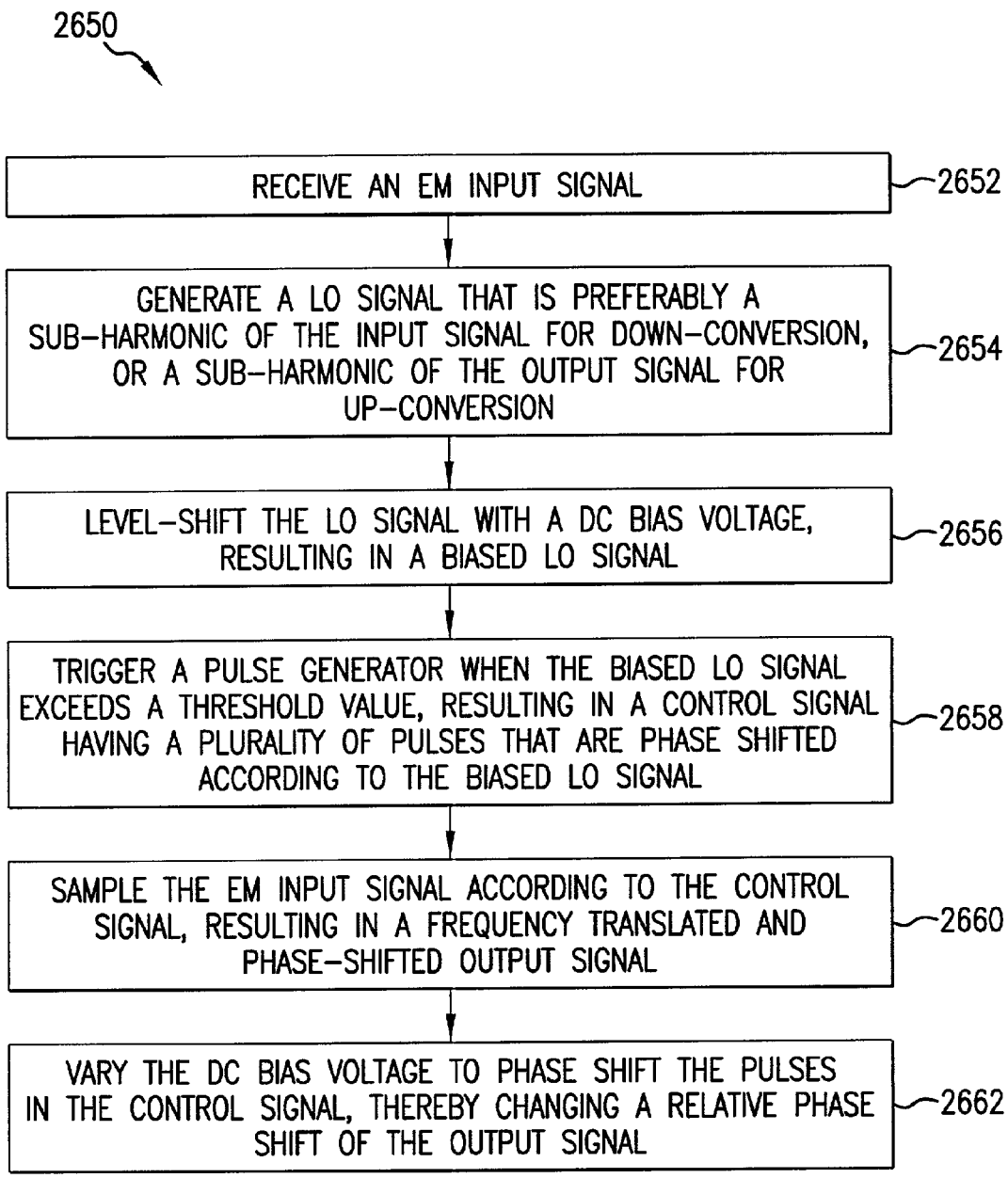
FIG. 26B illustrates a flowchart 2650 according to embodiments of the invention.

The frequency translator 2602 is described in detail as follows with reference to an operational flowchart 2650 that is shown in FIG. 26B. The discussion is applicable to both down-conversion and up-conversion. For down-conversion, the EM input signal is down-converted to baseband or an IF frequency. For up-conversion, the EM input signal is up-converted to a harmonic of the LO frequency. Specific embodiments that are directed to down-conversion and up-conversion will be discussed after the general frequency translation embodiment.

In step 2652, the UFT module 2608 receives the EM input signal.

In step 2654, the oscillator 2612 generates a LO signal 2613. LO signal 2613 is preferably (but not limited to) a sinewave having a frequency that is sub-harmonic relative to the input signal 2604 or the output signal 2606. More specifically, for down-conversion to baseband, the LO signal 2613 is preferably a sub-harmonic of the input signal 2604. For down-conversion to an IF frequency, the LO signal 2613 is preferably offset from a sub-harmonic of the input signal 2604. For up-conversion, the LO signal 2613 is preferably a sub-harmonic of the desired frequency of the output signal 2606. As stated, the LO signal 2613 is preferably a sinewave. However, other known waveforms could be used including triangle waves, square waves, etc.

In step 2656, the summing node 2615 adds a bias voltage 2616 to the LO signal 2613 to generate a biased LO signal 2611. Bias voltage 2616 is preferably a variable DC voltage so that it can be changed to implement any desired relative phase shift. As such, the bias voltage 2616 level-shifts the LO signal 2613 up or down in voltage. The capacitor 2614 prevents the voltage 2616 from shorting to the oscillator 2612. Optional choke inductor 2618 prevents the LO signal 2611 from shorting to RF ground at the terminal 2619.

FIGS. 27A-C further illustrate the effect of the bias voltage 2616 on the biased LO signal 2611. FIG. 27A illustrates a biased LO signal 2704 as an example of biased LO signal 2611 when the bias voltage 2616 is 0 volts. FIG. 27B illustrates a biased LO signal 2706 as an example of the biased LO signal 2611 when the bias voltage is+A volts. FIG. 27C illustrates a biased LO voltage 2708 as an example of the biased LO signal 2611 when the bias voltage is−A volts. As illustrated by comparing FIGS. 27A-C, the biased LO voltage 2611 is level shifted up (or down) based on the DC bias 2616. For example, biased LO signal 2706 (in FIG. 27B) is shifted up compared to biased LO signal 2704 (FIG. 27A). Biased LO signal 2708 (FIG. 27C) is shifted down compared to biased LO signal 2704 (FIG. 27A).

In step 2658, the pulse generator 2610 generates a control signal 2607 according to the biased LO signal 2611, where the control signal 2607 includes a plurality of pulses 2620. Pulse generator 2610 triggers and produces a pulse 2620 when the biased LO signal 2611 exceeds a threshold voltage (or trigger voltage), as represented by a threshold voltage 2702 in FIGS. 27A-C. By varying the DC level of the biased LO signal 2611, the pulse generator 2610 triggers earlier (or later) in time relative to the 0 volt bias condition. Therefore, the pulses 2620 of the control signal 2607 can be phase-shifted (in time) by varying the bias voltage 2616. This is further illustrated by FIGS. 27D-F that are discussed below. In embodiments of the invention, the plurality of pulses 2620 have pulse widths that tend away from zero, as represented by pulse width 2716 that is shown in FIGS. 27D-F.

FIGS. 27D-F further illustrate phase shifting of the control signal 2607 by varying the bias voltage of the LO signal. FIGS. 27D-F depict exemplary control signals 2710-2714 that correspond to the exemplary biased LO signals 2704-2708 (of FIGS. 27A-C), respectively. As such, control signal 2710 in FIG. 27D is a reference control signal since the bias voltage in FIG. 27A is 0 volts. Control signal 2712 in FIG. 27E leads the control signal 2710, as the corresponding biased LO signal 2706 is positively biased (by+A volts) relative to the biased LO 2704. Therefore, the biased LO signal 2706 crosses the threshold voltage 2702 before biased LO signal 2704, and causes the pulse generator 2610 to trigger and generate a pulse before the biased LO signal 2704. Control signal 2714 in FIG. 27F lags control signals 2710 (and also the control signal 2712) because the corresponding biased LO signal 2708 is negatively biased relative to the biased LO signal 2704. Therefore, the biased LO signal 2708 crosses the threshold voltage 2702 after the LO bias signal 2704, and causes the pulse generator 2610 to trigger later in time relative to that for the control signal 2704.

Returning to flowchart 2650, in step 2660, the UFT module 2608 samples the input signal 2604 according to the control signal 2607. More specifically, a controlled switch 2609 in the UFT module samples the input signal 2604 according to the control signal 2607, to generate the phase shifted and frequency translated output signal 2606. The frequency translation occurs because the UFT module sub-harmonically samples the input signal in a periodic manner, resulting in harmonic images of the input signal that repeat at harmonic of the sampling frequency. Frequency transla-tion by a UFT module has been described herein and in the above referenced patent applications, to which the reader is referred for further details. The phase shift occurs because any bias voltage variation causes the pulse generator 2610 to trigger earlier (or later) than nominal, which produces a time/phase shift in the pulses of control signal 2607 (relative to a reference bias condition), as illustrated in FIGS. 27D-F. By phase shifting the pulses in the control signal 2607, the controlled switch 2610 samples the input signal 2604 earlier (or later) in time relative to the nominal condition. In other words, a phase shifted-control signal 2607 causes a shift in the UFT sampling time, which results in a relative phase shift in the output signal 2606.

In embodiments of the invention, the pulse widths (also called apertures) of the pulses 2620 tend away from zero so that non-negligible amounts of energy are transferred from the input signal to the output signal during sampling in step 2660. During down-conversion, for example, the pulse widths can be approximately ⅒, ¼, ½, etc., or any other fraction of the period of the EM input signal. Alternatively for down-conversion, the pulse widths can be approximately equal to one or more periods of the EM input signal plus ⅒, ¼, ½, etc., or any other fraction of a period of the EM signal. In a preferred embodiment for down-conversion, the pulse width is approximately ½ of a period of the EM input signal. During up-conversion, the pulse widths can be approximately ⅒, ¼, ½, etc., or any other fraction of the period of the EM output signal. In a preferred embodiment for up-conversion, the pulse width is approximately ½ of a period associated with the EM output signal. The pulse widths of the pulses 2620 can be further optimized based on one or more of a variety of criteria. Exemplary systems and methods for generating and optimizing the control signal 2607 (and pulses 2620) for both down-conversion and up-conversion are disclosed in the above referenced patent applications.

In step 2662, the bias voltage 2616 is varied, which phase shifts the pulses of the control signal 2607 as described, and thereby varies the relative phase shift of the output signal 2606.

Figure 28A:
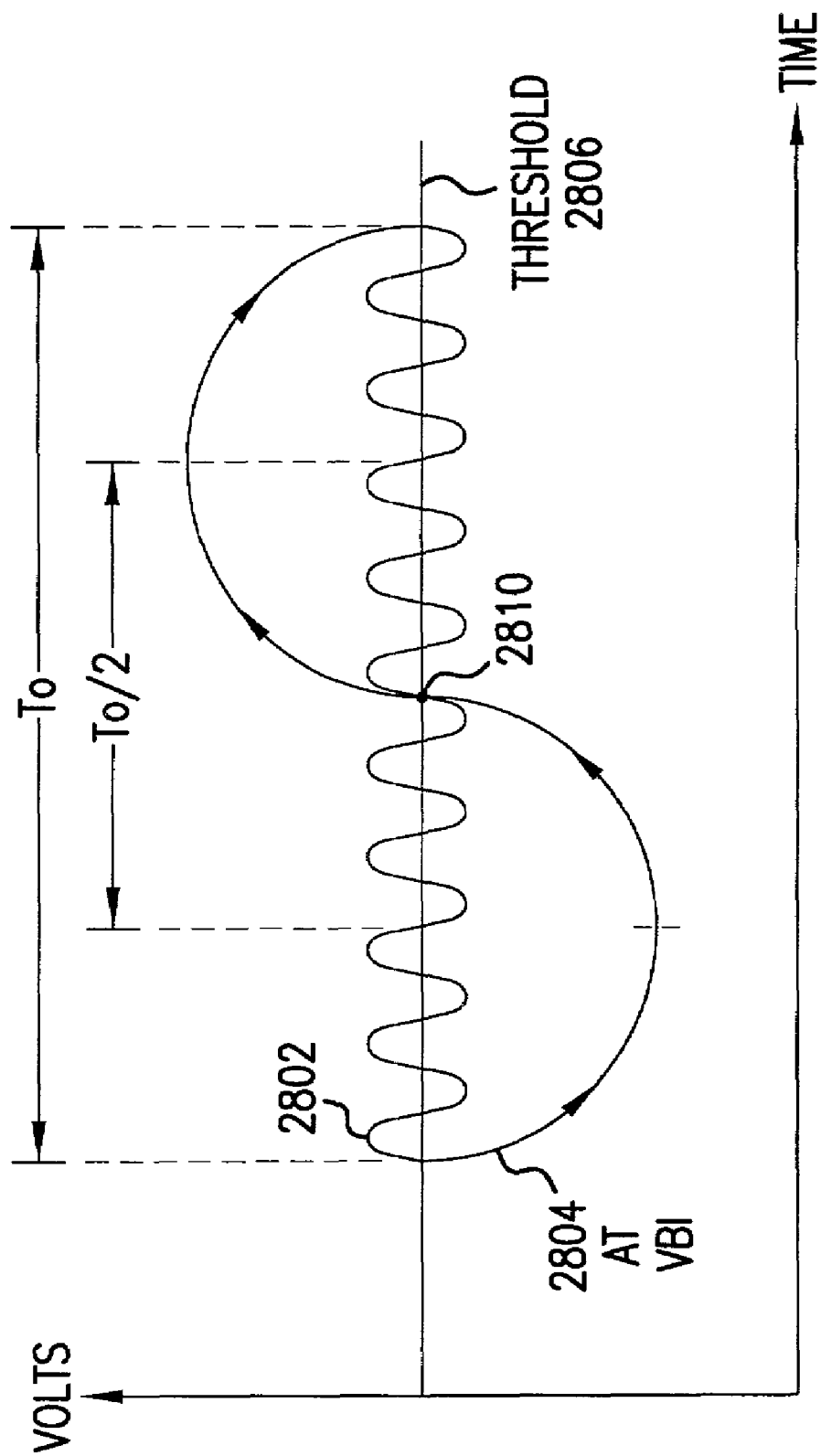
FIGS. 28A-28B illustrate various biased LO signal signals compared to the RF input signal.
Figure 28B:
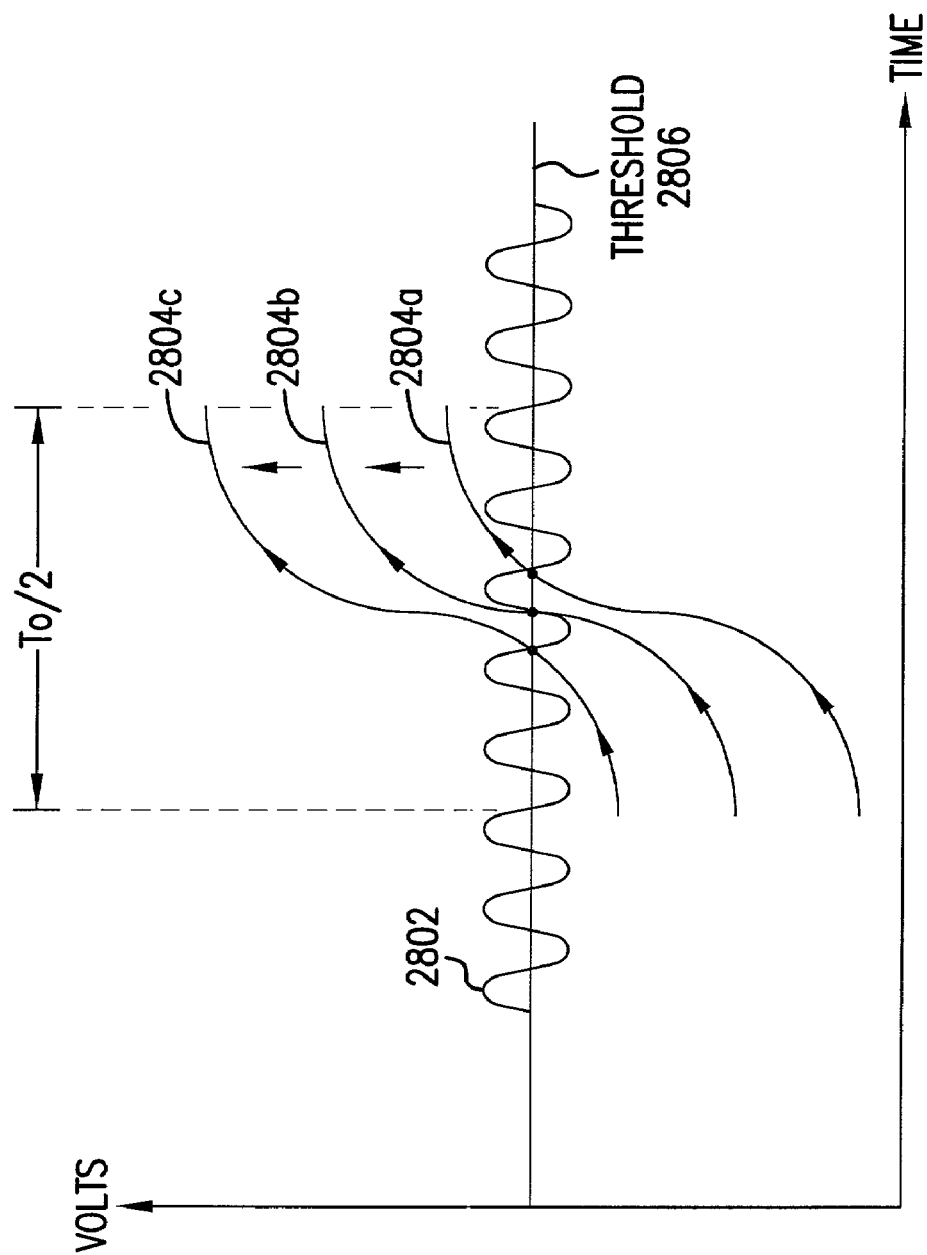

FIGS. 28A-28B further illustrates phase shifting by changing the sampling time of the UFT module using a variable bias voltage. FIG. 28A depicts an exemplary LO signal 2804 that is the 10th sub-harmonic of an exemplary input signal 2802. (This discussion presumes that the input signal 2802 is an RF input signal that is to be down-converted, but the discussion is applicable to up-conversion as well.) Therefore, there are exactly 10 cycles of input signal 2802 in the period of the LO signal 2804. As stated earlier, the pulse generator 2610 triggers and generates a pulse when the voltage level of the biased LO signal 2611 crosses the threshold voltage for the pulse generator 2610. The pulse generator 2610 preferably triggers only on the rising edge (or voltage) of the LO signal 2804, and not the falling edge. In FIG. 28A, the threshold voltage of the pulse generator 2610 is depicted as threshold 2806. As such, the pulse generator 2610 triggers at the timepoint 2810 because that is when the LO signal 2804 crosses the threshold 2806 on the rising edge. As such, the UFT module 2608 samples the input RF signal 2802 at the timepoint 2810.

The effect of varying the bias voltage of the LO signal on the sampling point will now be explored. As stated, the pulse generator 2610 preferably triggers only for rising voltages. As such, ½ the period of the LO cycle ($T_O/2$ in FIG. 28A) is useful for sampling the input signal 2802 using the UFT module 2608. Therefore, $T_O/2$ of the LO cycle can be shifted in voltage to change the sampling time of the RF input signal

2802. This is further illustrated in FIG. 28B, which depicts three different biased LO signals 2804a-c and the RF input signal 2802 (from FIG. 28A). LO signals 2804a-c have three different bias voltages where LO signal 2804b has a higher bias voltage than LO signal 2804a, and LO signal 2804c has a higher bias voltage than LO signal 2804b. As shown in FIG. 28B, the biased LO signals 2804a-c cross the threshold voltage 2806 at different points in time due to their differing bias voltages. Since, the pulse generator 2610 triggers when the LO signal 2804 crosses the threshold voltage, the RF input signal 2802 is sampled at different points in time based on the bias voltage. By sampling the RF signal at different time points based on bias voltage, an equivalent phase shift is implemented in the frequency translated output signal. In other words, the sampling point can be seen to "walk though" the RF signal input 2802 as the bias voltage is varied, which results in the phase shift in output signal.

As stated above, the FIGS. 28A-28B depict exactly 10 cycles of the input signal 2802 within the full period $T_O$ of the LO signal 2804. Therefore, exactly 5 cycles of the input signal 2802 fall within the rising edge window ($T_O/2$) of the LO signal 2804 that is useful for triggering the pulse generator 2610. In this example, since the rising edge window ($T_O/2$) can be shifted through the 5 RF cycles, a phase shift of 5*360 degrees=1800 degrees can be implemented by shifting the LO signal 2804 through an entire voltage range. In other words, if the bias voltage is set so the bottom of the LO signal 2804 sinewave crosses the threshold 2806, and then the bias voltage is adjusted so that the top of the LO signal 2804 sinewave crosses the threshold 2806, then the RF input signal 2802 will be sampled over a range of 1800 degrees.

As mentioned above, the discussion relating to FIGS. 28A-28B corresponds to a pulse generator that triggers on the rising edge of the biased LO signal. However, the invention is not limited to rising edge embodiments. Those skilled in the arts will recognize how to implement falling edge embodiments based on the discussion herein. These falling edge embodiments are within the scope and spirit of the present invention.

Furthermore, the discussion relating to FIGS. 28A-28B corresponds to a phase shifter where the biased LO signal had a characteristic frequency that is the $10_{th}$ subharmonic of the RF input signal. Other harmonic ratios could be utilized, as this discussion was for example purposes only. Additionally, the biased LO signal could have a frequency that is offset from a subharmonic of the RF input signal, as is used in IF down-conversion embodiments.

Furthermore, FIG. 28A-B depict the RF input signal 2802 as being biased at the threshold voltage 2806, and therefore symmetrical with the threshold voltage 2806. This is for convenience of illustration only. The invention is not limited to this configuration, as the RF input signal 2802 could be biased above or below the threshold voltage 2802, as will be understood by those skilled in the arts based on the discussion herein.

Figure 29:
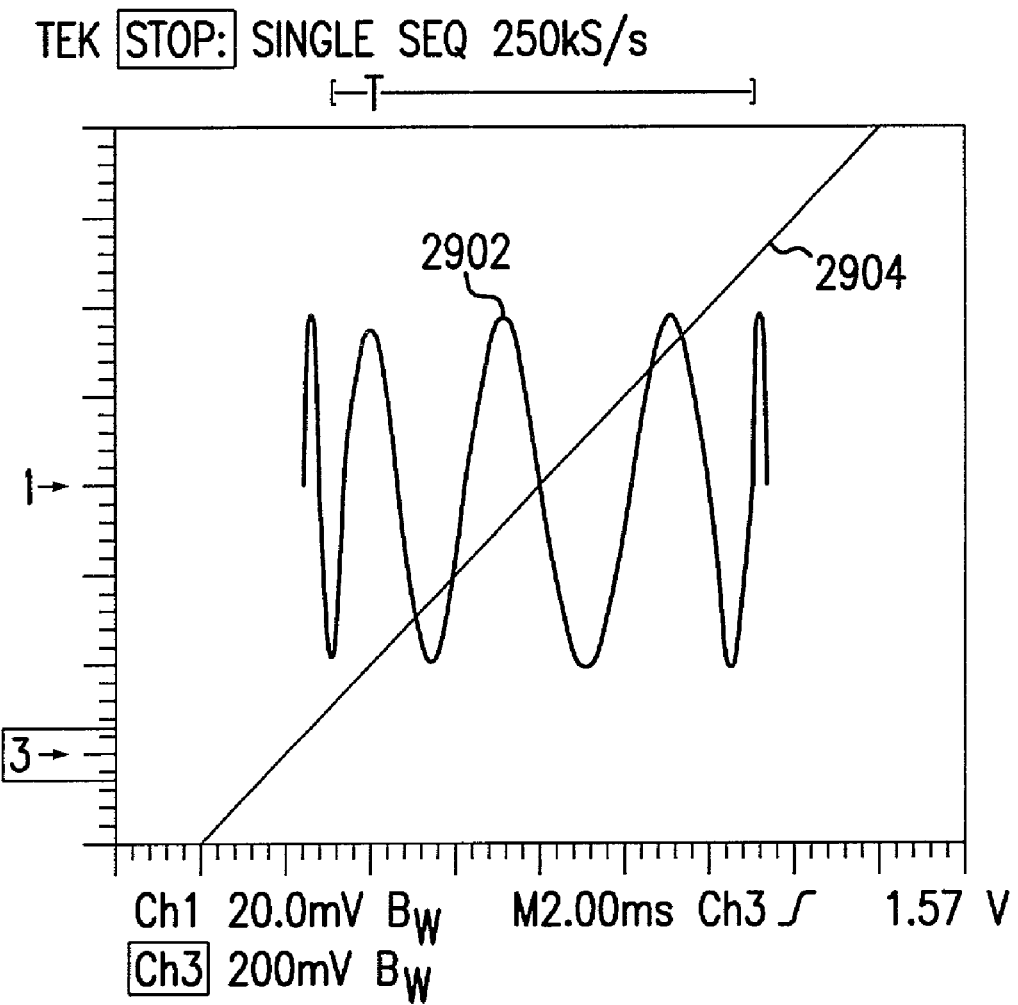
FIG. 29 illustrates the phase (or phase shift) at which the RF input signal is sampled vs ramp bias voltage, according to embodiments of the invention.
Figure 30A:
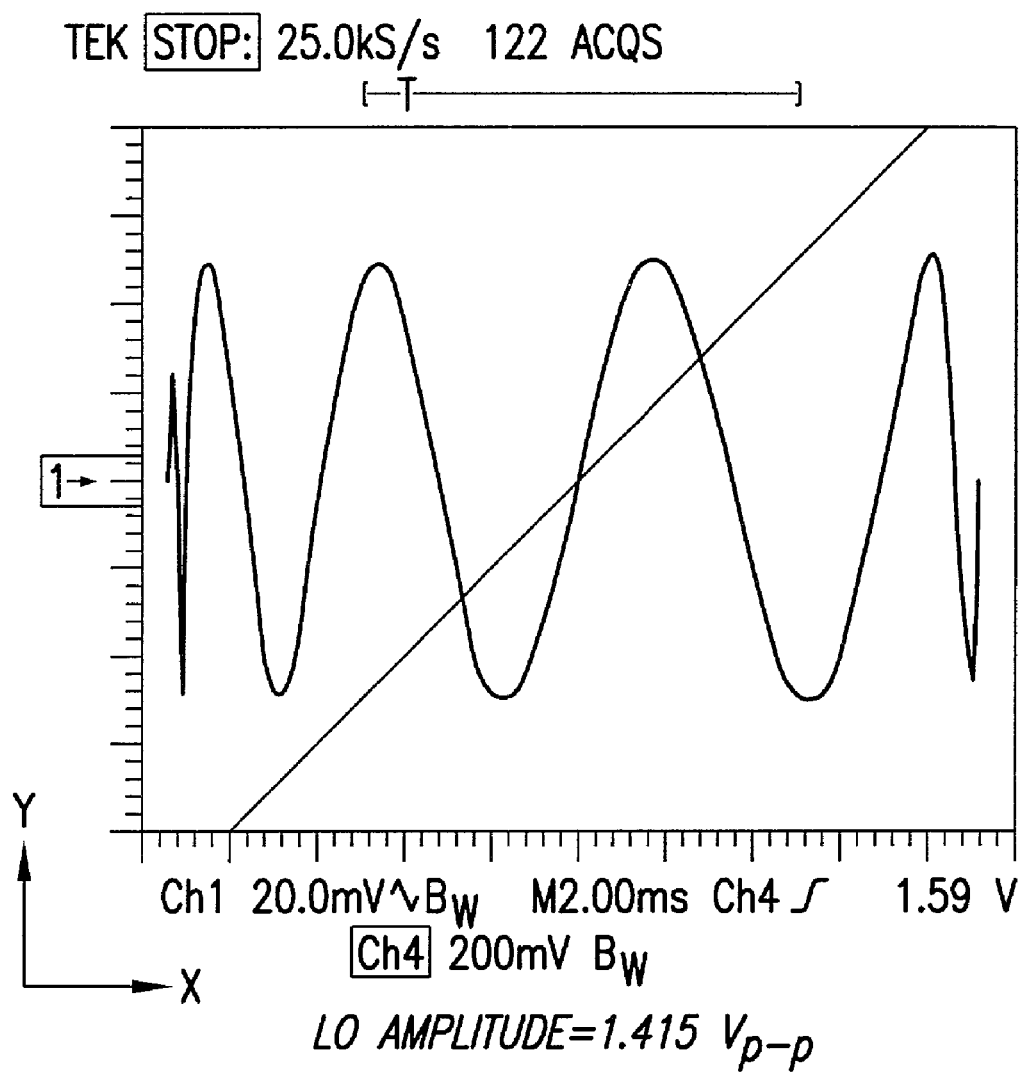
FIGS. 30A-30D illustrate the phase at which an RF signal is sampled vs. bias voltage for various LO signal amplitudes according to embodiments of the invention.
Figure 30B:
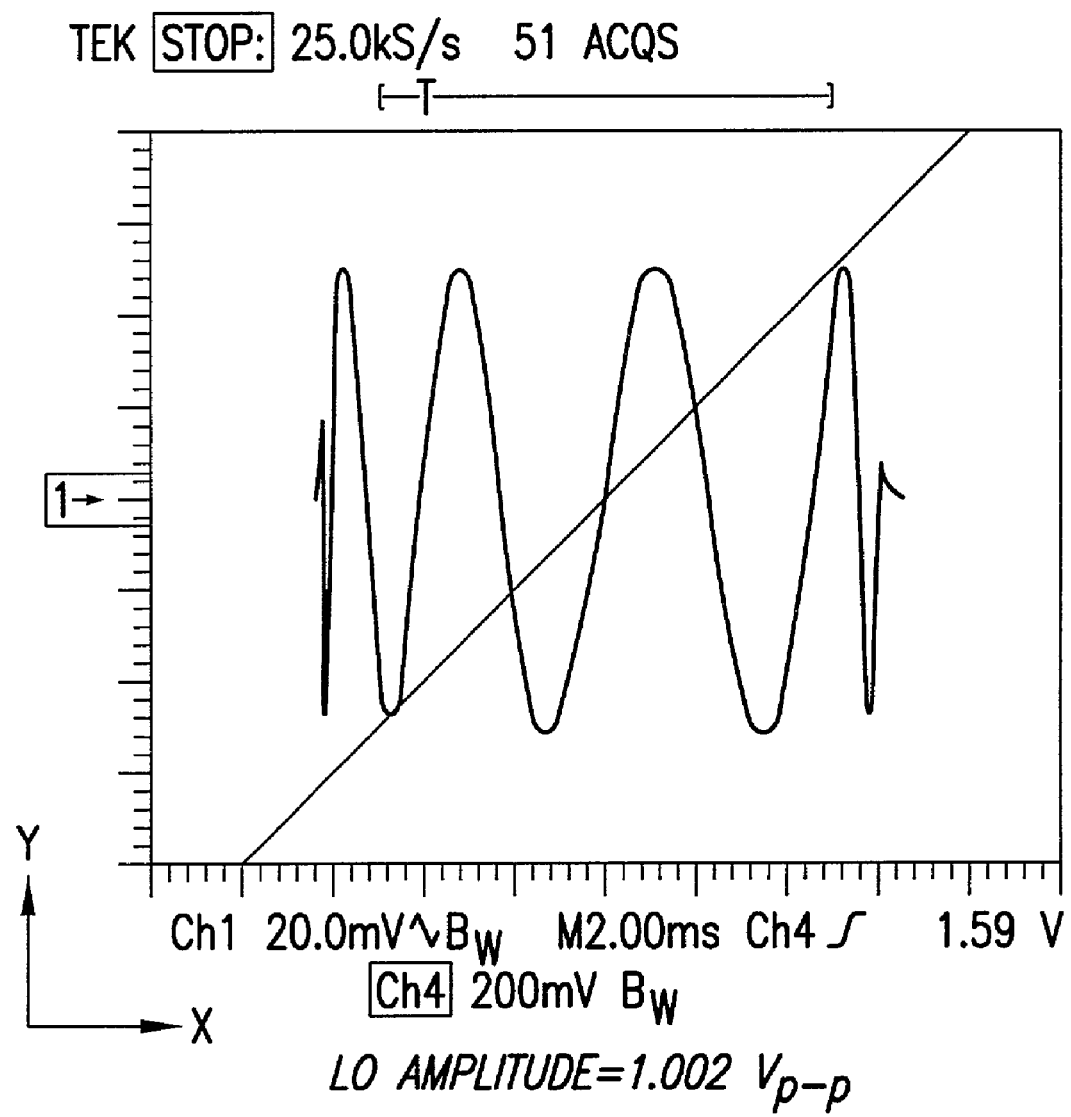
Figure 30C:
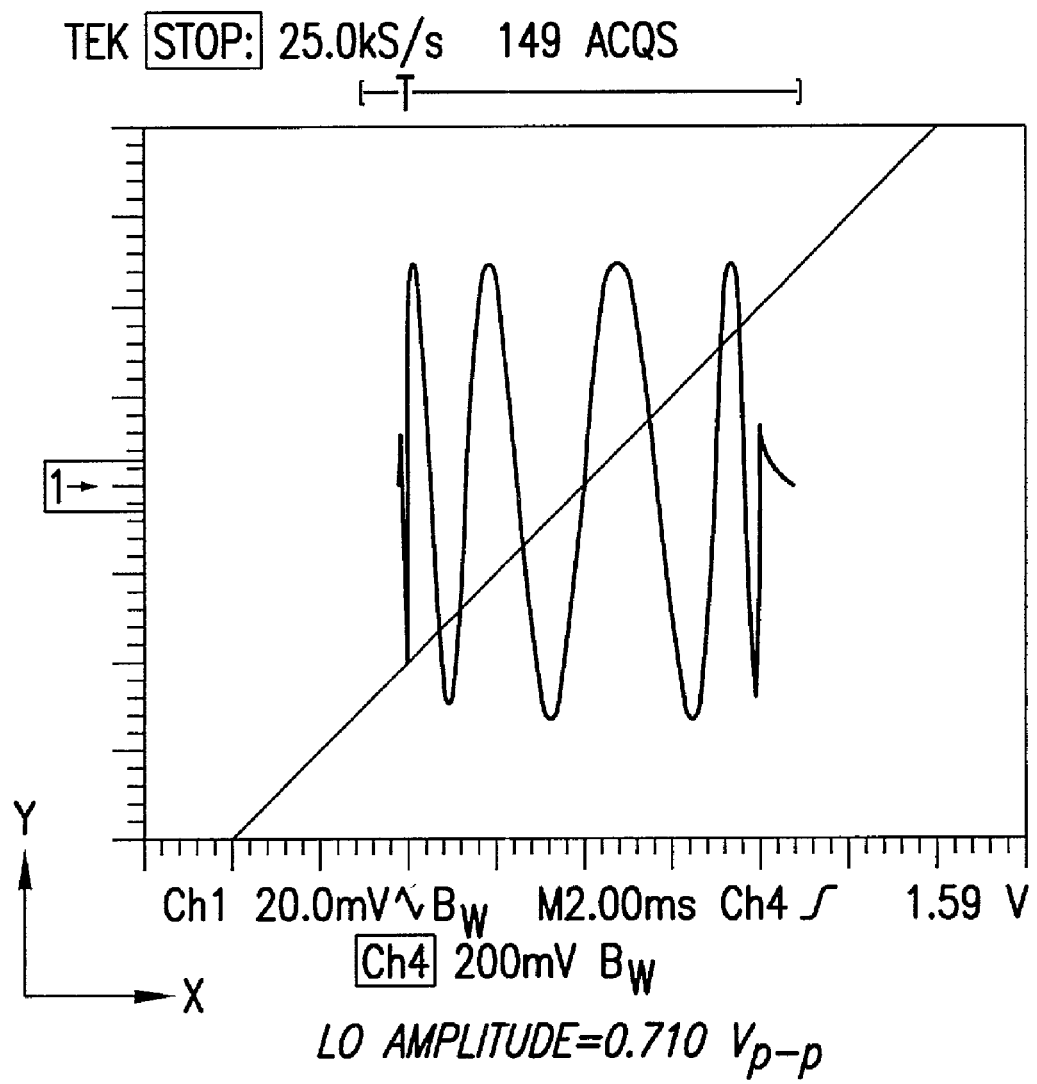
Figure 30D:
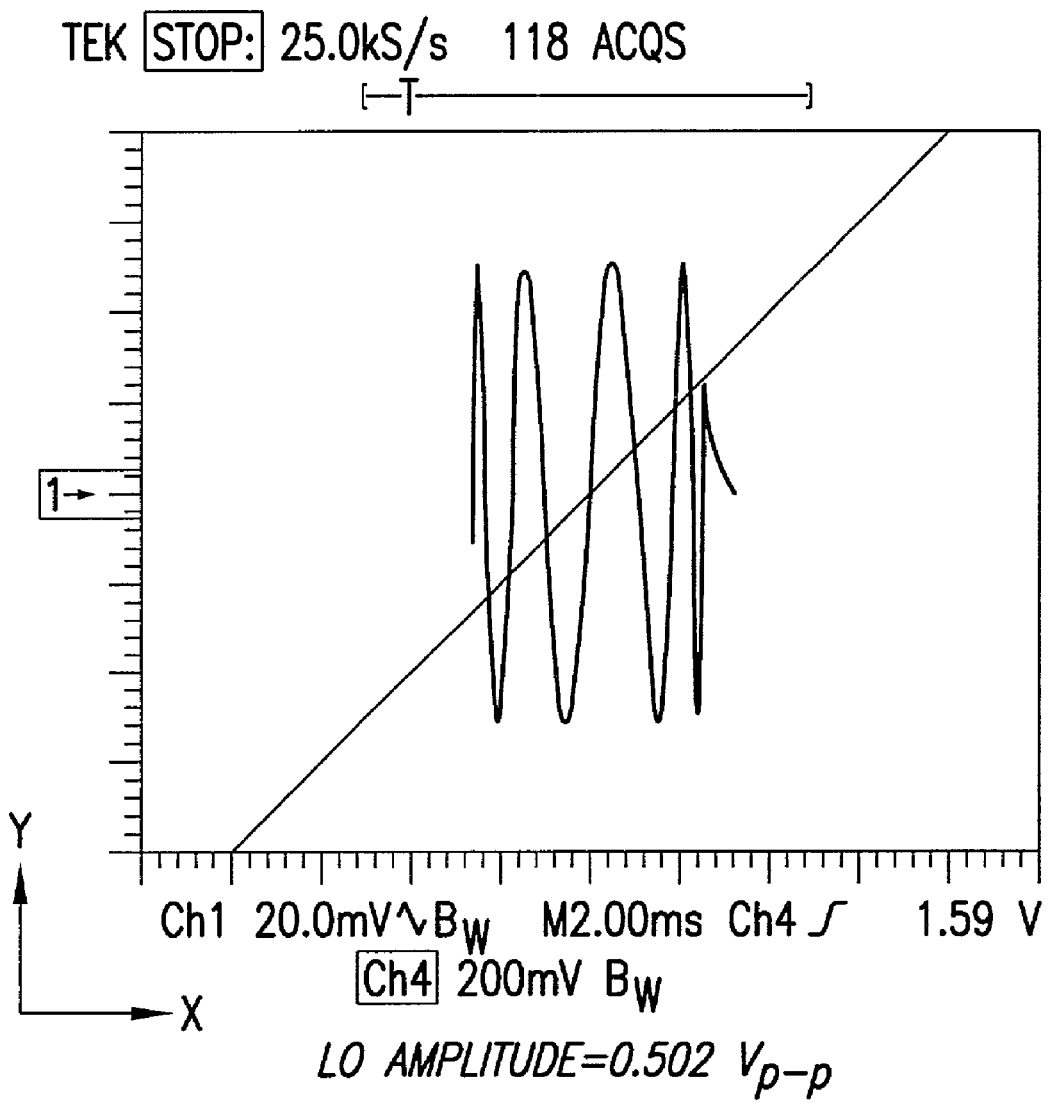

FIG. 29 illustrates an experimental result of the phase (or phase shift) at which the RF input signal 2604 (in FIG. 26A) is sampled (in a down-conversion embodiment) vs. the bias voltage 2616, where the bias voltage is steadily increasing in a (voltage) ramp fashion. FIG. 29 is meant for example purposes only, and is not meant to be limiting. In FIG. 29, the phase shift (or phase at which the RF is sampled) is represented by a curve 2902, and the bias voltage is represented by a ramp 2904. These experimental results are for an RF input signal 2604 of 915 MHZ, and a LO signal 2613 of 91.5 MHZ, so that the LO signal 2613 is the 10th subharmonic of the RF input signal. The LO signal in FIG. 29 is fixed with an amplitude of 1.415 volts peak-to-peak. FIG. 29 shows that the input signal is sampled over 1800 degrees or 5 RF cycles, similar to that described above. The resulting phase shift curve 2902 is sinusoidal, with a varying frequency over the life of the sinewave and the ramp voltage 2904.

FIGS. 30A-D illustrates graphs similar to that of FIG. 29, in that they depict the phase at which the RF input signal 2604 is sampled vs. bias voltage 2616, where the bias voltage is steadily increasing in a ramp like fashion. However, FIGS. 30A-D depict phase shift vs. bias voltage for varying LO signal amplitude. More specifically, the LO signal amplitude is varied from 0.502 $V_{p-p}$ to 1.415 $V_{p-p}$ in FIG. 30A-30D. As, shown, the curves in FIGS. 30A-D stretch in the "x" (or horizontal) direction with increasing LO signal amplitude. As such, relatively more phase shift verses a unit change in bias voltage is achieved for smaller LO signal amplitude. In other words, there is more phase shift "leverage" or sensitivity for smaller LO signal amplitudes than for larger LO signal amplitudes, per a unit change in bias voltage. FIGS. 30A-D are meant for example purposes only, and are not meant to be limiting.

As stated above, the phase-shifter/frequency translator 2602 and the related discussion is applicable to both up-conversion and down-conversion. Specific embodiments for down-conversion and up-conversion are discussed as follows.

7.2.1.1 Down-Conversion

Figure 31A:
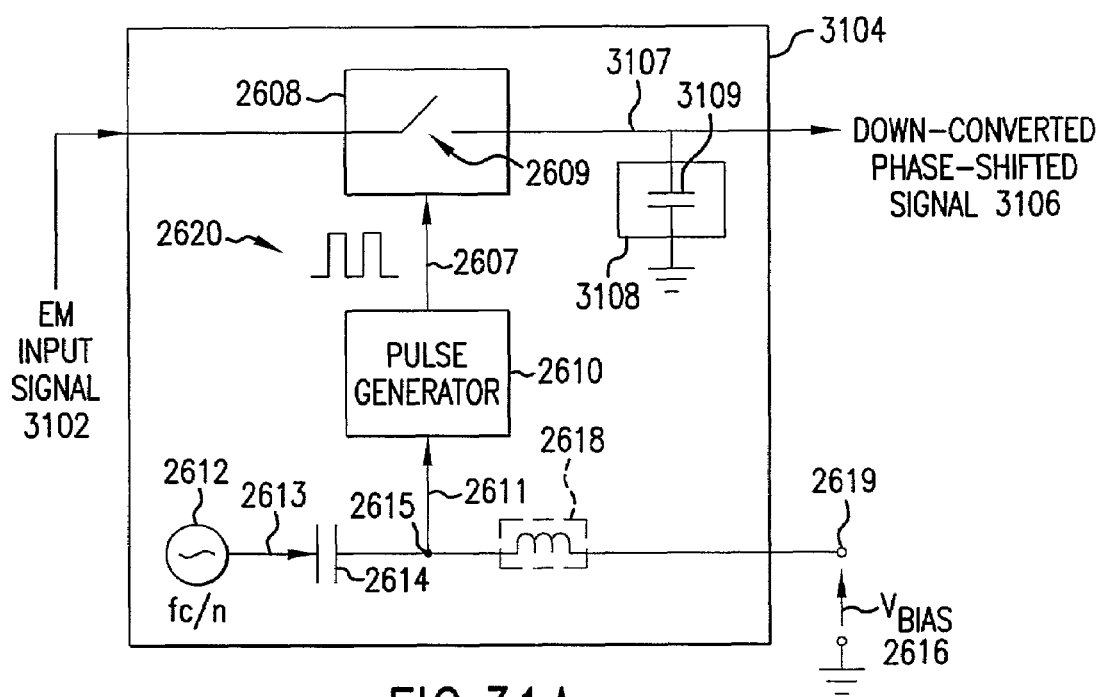
FIGS. 31A-C illustrate a down-converter/phase shifter having a variable LO bias to control the phase shift according to embodiments of the present invention.

FIG. 31A depicts a down-converter/phase-shifter 3104 for down-converting and phase shifting an EM input signal 3102 to a down-converted/phase-shifted signal 3106 according to an embodiment of the invention. Down-converter/phase shifter 3104 operates similar to frequency translator 2602 (FIG. 26A) that was described above. As such, the down-converter 3104 performs frequency down-conversion of the EM input signal 3102 by sampling the EM input signal 3102 according the periodic control signal 2607, resulting in undersamples 3107 that carry energy or charge from the EM input signal 3102. Down-converter/phase-shifter 3104 includes a storage module 3108 that stores (and integrates) the undersamples 3107. In embodiments, the storage module 3108 is a capacitor 3109, as shown. The charge stored during successive undersamples of the EM input signal 3102, forms the down-converted signal 3106. A relative phase shift is introduced in the down-converted signal 3106 by varying the bias voltage 2616, so that the pulses 2620 in the control signal 2607 are triggered earlier (or later) relative to a nominal sampling time.

Figure 31B:
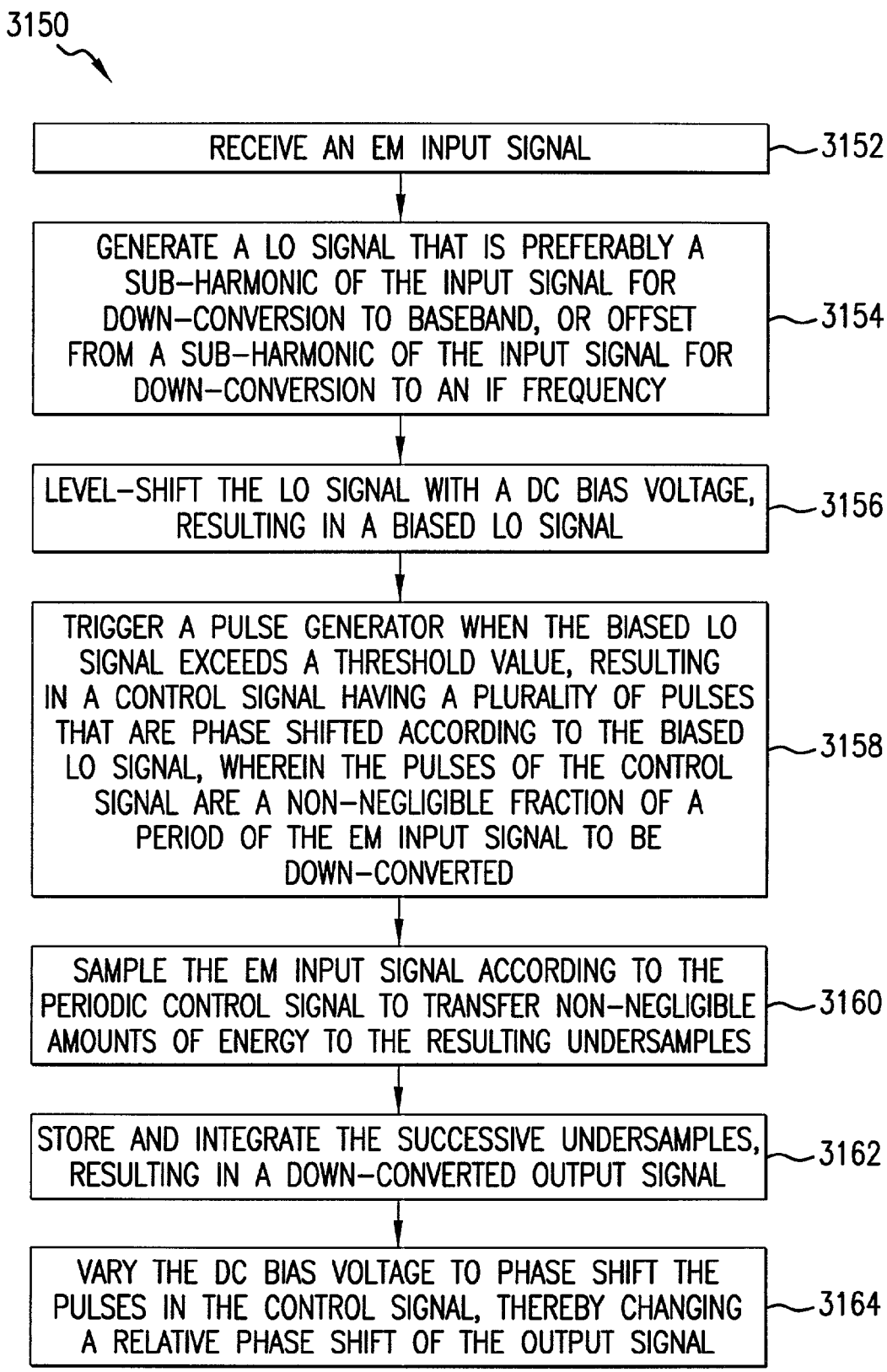

In embodiments, the down-converter/phase-shifter 3104 is further described with reference to the flowchart 3150 that is shown in FIG. 31B, which is described as follows.

In step 3152, the UFT module 2608 receives the EM input signal 3102 that is to be down-converted.

In step 3154, the oscillator 2612 generates a LO signal 2613. LO signal 2613 is preferably (but not limited to) a sinewave having a frequency that is sub-harmonic of the EM input signal 3102. For down-conversion to baseband, the LO signal 2613 is preferably a sub-harmonic of the EM input signal 3102. For down-conversion to an IF frequency, the LO signal 2613 can be offset from a sub-harmonic of the EM input signal 3102 according to the equation:

$$Freq_{LO}=(Freq_{input}+/-Freq_{IF})/n$$

where: $Freq_{LO}$=frequency of the local oscillator $Freq_{iput}$=frequency of the EM input signal Freq$_{IF}$=frequency of an IF output signal (could be baseband)

n=harmonic number

As stated, the LO signal 2613 is preferably a sinewave. However, other known waveforms could be used including triangle waves, square waves, etc.

In step 3156, the summing node 2615 adds the bias voltage 2616 to the LO signal 2613 to generate the biased LO signal 2611. In other words, the LO signal 2613 is level-shifted according to the bias voltage 2616, resulting in the biased LO signal 2611. Bias voltage 2616 is preferably a variable DC voltage so that it can be changed to implement any desired relative phase shift. As such, the bias voltage 2616 shifts the LO signal 2613 up or down in voltage. The capacitor 2614 prevents the voltage 2616 from shorting to the oscillator 2612. Optional choke inductor 2618 prevents the LO signal 2611 from shorting to RF ground at the terminal 2619.

In step 3158, the pulse generator 2610 generates the control signal 2607 according to the biased LO signal 2611, where the control signal 2607 includes a plurality of pulses 2620. In doing so, the pulse generator 2610 triggers and produces a pulse 2620 when the biased LO signal 2611 exceeds a threshold voltage (or trigger voltage), as represented by a threshold voltage 2702 in FIGS. 27A-C.

In down-conversion embodiments, the pulse width of the pulses 2620 in the control signal 2607 are a non-negligible fraction of a period associated with the EM input signal 3102 that is to be down-converted. For example and without limitation, the pulse-widths of the pulses 2620 can be approximately 1/10, 1/4, 1/2, 3/4, etc., or any other fraction of a period of the EM input signal 3102. In an embodiment, a pulse width of approximately 1/2 of a period of the EM input signal 3102 is desirable.

In step 3160, the UFT module 2608 samples the EM input signal 3102 according to the control signal 2607. More specifically, the switch 2609 closes during the pulses 2620 of the control signal 2607, resulting in the undersamples 3107. During sampling, non-negligible amounts of energy are transferred from the EM input signal 3102 to the undersamples 3107. This occurs because the pulse-widths of the control signal 2607 are widened to extend the time that the switch 2609 is closed during individual samples, resulting in increased energy transfer. Additionally, input and output impedances of the UFT module are reduced by widening the sampling pulse.

In step 3162, the storage module 3108 stores and integrates successive undersamples 3107, resulting in the down-converted signal 3106. In embodiments, the capacitor 3109 integrates the charge associated with successive undersamples 3107, resulting in the down-converted signal 3106. A relative phase shift is introduced in the down-converted signal 3106 by varying the bias voltage 2616. As described above, any variation in the bias voltage 2616 causes the pulse generator 2610 to trigger earlier (or later) relative to nominal, thereby phase shifting the pulses 2620 in the control signal 2607. Since the pulses 2620 determine the sampling time of the EM input signal 3102, a phase-shift is introduced in the down-converted output signal 3106, relative to the nominal or reference bias voltage.

In step 3164, the bias voltage 2616 is optionally varied, which phase shifts the pulses of the control signal 2607, and thereby varies the relative phase shift of the down-converted output signal 3106.

Down-conversion utilizing a UFT module (also called an aliasing module) is further described in a number of the above referenced applications, such as "Method and System for Down-converting Electromagnetic Signals," Ser. No. 09/176,022, now U.S. Pat. No. 6,061,551. As discussed herein and in the '551 patent, the pulse widths of the control signal 2607 can be adjusted to increase and/or optimize the energy transfer to the down-converted output signal 3106. Additionally, matched filter principles can be implemented to shape the sampling pulses and further improve energy transfer to the down-converted output signal 3106, as further described in a number of the above referenced applications, such as U.S. patent application titled, "Matched Filter Characterization and Implementation of Universal Frequency Translation Method and Apparatus," Ser. No. 09/521,828, filed on Mar. 9, 2000. A summary of matched filter principles utilized during down-conversion is illustrated in FIG. 31C, and is described as follows.

Figure 31C:
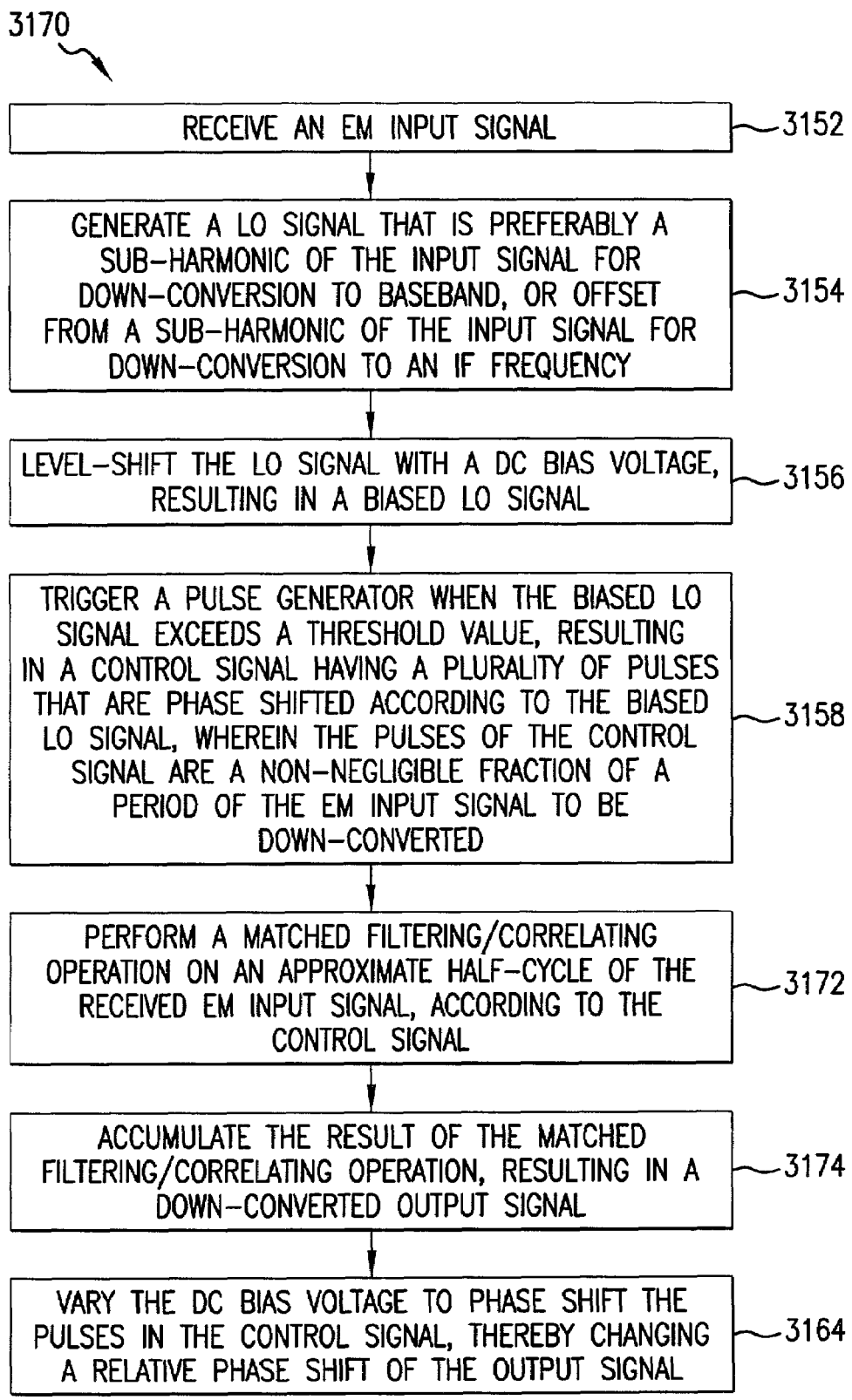

In embodiments, the flowchart 3170 in FIG. 31C further describes the down-converter/phase shifter 3104 according to matched filter principles. The steps 3152-3158 and step 3164 are the same as in flowchart 3150 of FIG. 31B, and are not repeated here for convenience.

In step 3172, a matched filtering/correlating operation is performed on an approximate half-cycle of the EM input signal 3102, based on the control signal 2607.

In step 3174, the result of the matched filtering/correlation operation in step 3172 is accumulated. Down-conversion utilizing matched filter principles is further described in co-pending U.S. patent application titled, "Matched Filter Characterization and Implementation of Universal Frequency Translation Method and Apparatus," Ser. No. 09/521,828, filed on Mar. 9, 2000.

7.2.1.2 Up-Conversion

Figure 32A:
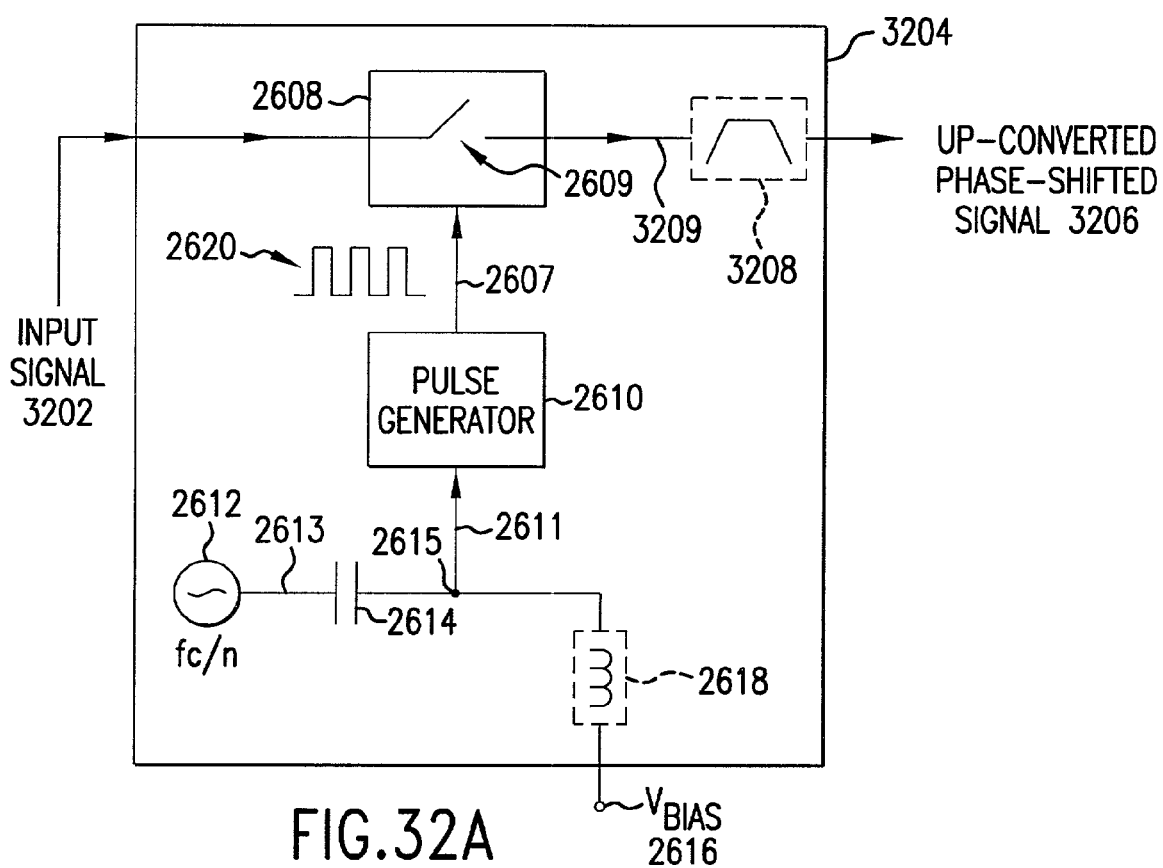

FIG. 32A depicts an up-converter/phase-shifter 3204 for up-converting and phase shifting an input signal 3202, to generate an up-converted and phase shifted signal 3206 according to an embodiment of the invention. Up-converter/phase-shifter 3204 includes a bandpass filter 3208 in addition to the components identified in the frequency translator 2602. The bandpass filter 3208 selects the harmonic of interest from a harmonically rich signal 3209 that is generated by the UFT module 2608. The harmonically rich signal 3209 contains multiple harmonic images that repeat at harmonics of the sampling frequency as determined by the LO signal. Each harmonic includes the necessary amplitude, phase, and frequency information to reconstruct the input signal 3202. In embodiments, the pulse widths of the control signal 2607 are adjusted to shift energy among the harmonics that make-up the harmonically rich signal 3209.

Figure 32B:
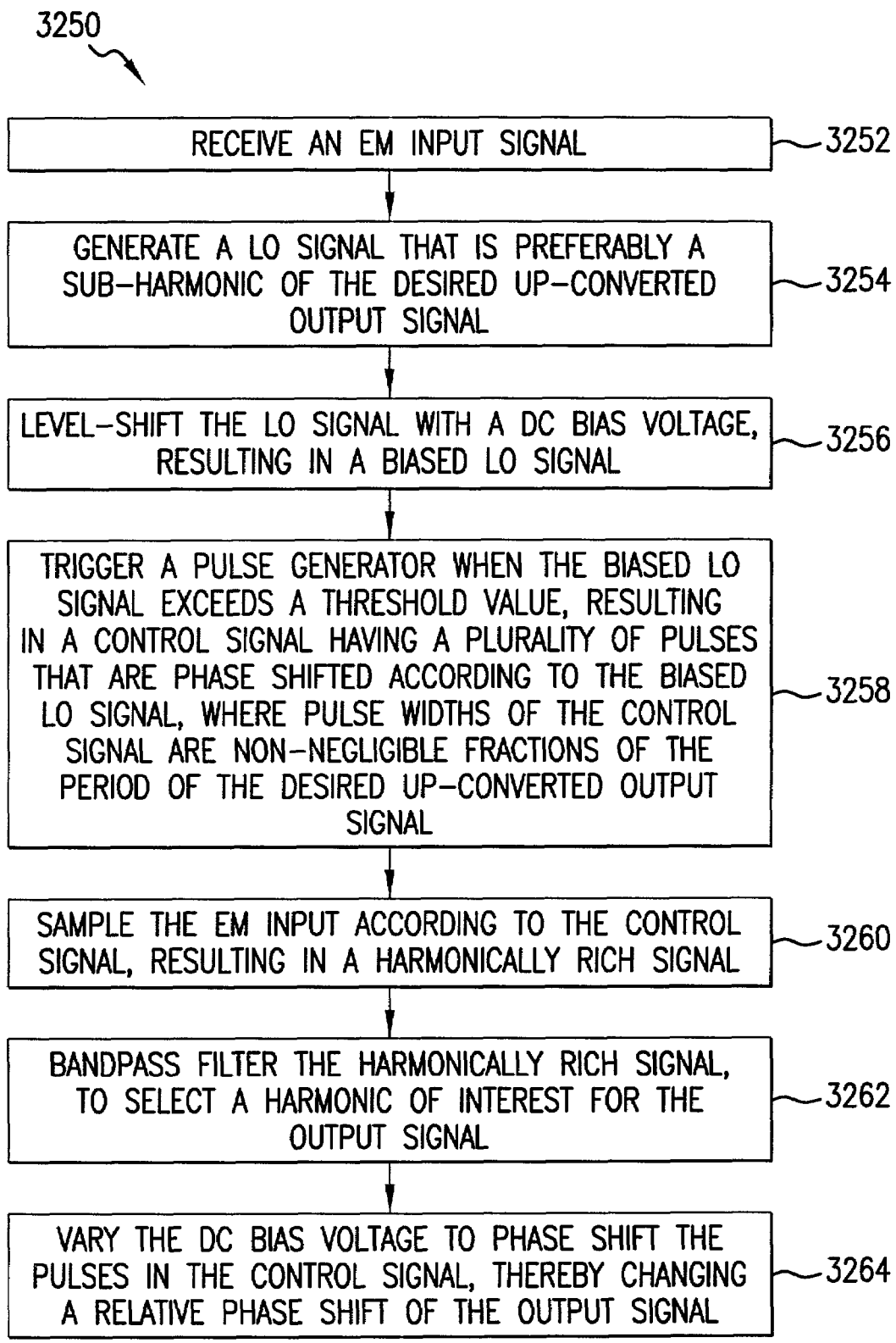

In embodiments, the up-converter/phase shifter 3204 is further described with reference to the flowchart 3250 that is shown in FIG. 32B, which is described as follows.

In step 3252, the UFT module 2608 receives the EM input signal 3102, which is preferably a baseband signal or lower frequency signal that is to be up-converted.

In step 3254, the oscillator 2612 generates a LO signal 2613. LO signal 2613 is preferably (but not limited to) a sinewave having a frequency that is sub-harmonic of the desired frequency of the up-converted output signal 3206. As stated, the LO signal 2613 is preferably a sinewave. However, other known waveforms could be used including triangle waves, square waves, etc.

In step 3256, the summing node 2615 adds the bias voltage 2616 to the LO signal 2613 to generate the biased LO signal 2611. In other words, the LO signal 2613 is level-shifted according to the bias voltage 2616, resulting in the biased LO signal 2611. Bias voltage 2616 is preferably a variable DC voltage so that it can be changed to implement any desired relative phase shift. As such, the bias voltage 2616 shifts the LO signal 2613 up or down in voltage. The capacitor 2614 prevents the voltage 2616 from shorting to the oscillator 2612. Optional choke inductor 2618 prevents the LO signal 2611 from shorting to RF ground at the terminal 2619.

In step 3258, the pulse generator 2610 generates the control signal 2607 according to the biased LO signal 2611, where the control signal 2607 includes a plurality of pulses 2620. In doing so, the pulse generator 2610 triggers and produces a pulse 2620 when the biased LO signal 2611 exceeds a threshold voltage (or trigger voltage) associated with the pulse generator, as represented by a threshold voltage 2702 in FIGS. 27A-C.

In up-conversion embodiments, the pulse width of the pulses in the control signal 2607 are a non-negligible fraction of a period associated with the up-converted EM output signal 3206. For example and without limitation, the pulse-widths of the control signal 2607 can be approximately 1/10, 1/4, 1/2, 3/4, etc., or any other fraction of a period of the up-converted EM output signal 3206, or one or more periods plus a fraction of a period. In an embodiment, a pulse width of approximately 1/2 of a period of the EM output signal 3206 is desirable.

In step 3260, the UFT module 2608 samples the EM input signal 3202, according to the control signal 2607. More specifically, the switch 2609 closes during the pulses 2620 of the control signal 2607, so that the periodic sampling produces a harmonically rich signal 3209. The harmonically rich signal 3209 includes multiple harmonic images that repeat at harmonics of the sampling frequency $f_s$, which is the frequency of the pulses 2620 of the control signal 2607. FIG. 32C illustrates an exemplary frequency spectrum of the harmonically rich signal 3209 having harmonics 3266a-n that repeat at harmonics of the sampling frequency $f_s$. Each harmonic 3266 in the harmonically rich signal 3209 includes the necessary amplitude, phase, and frequency information to reconstruct the input signal 3202. A relative phase shift is introduced in the harmonics 3266 by varying the bias voltage 2616, so that pulses 2620 in the control signal 2607 are triggered earlier (or later) relative to a nominal sampling time. Since the pulses 2620 determine the sampling time of the EM input signal 3202, a phase-shift is introduced in the harmonics 3266, relative to the nominal or reference bias voltage.

In embodiments of the invention, the pulse width of the pulses 2620 are established to shift energy among the various harmonics 3266 of the harmonically rich signal 3209. Generally, shorter pulse widths shift more energy into the higher frequency harmonics, and longer pulse widths shift energy into the lower frequency harmonics. In embodiments, the pulse width is approximately 1/2 a period of a harmonic frequency of interest. In other words, the pulse width of the control signal 2607 is established to be approximately X radians at the harmonic frequency of interest.

In step 3262, the filter 3208 selects the harmonic of interest from the harmonically rich signal 3209. In FIG. 32C, this is represented by a passband 3268 that selects the harmonic 3266c as the up-converted output signal 3206.

In step 3264, the bias voltage 2616 is optionally varied, which phase shifts the pulses of the control signal 2607, and thereby varies the relative phase shift of the up-converted output signal 3206.

Up-conversion of an input signal using a UFT module is further described in the above cited applications, such as "Method and System for Frequency Up-Conversion," application Ser. No. 09/176,154.

7.2.2 Changing the Delay of the LO Signal

As described above, the UFT module can be configured to provide integrated frequency translation and phase shifting by varying the sampling time that the UFT module samples the input signal. In section 7.2.1, this was accomplished by varying the bias voltage of the LO signal that triggers the pulse generator so that the pulse generator triggers earlier (or later) in time relative to a reference bias voltage. Alternatively, the LO signal that drives the pulse generator can be delayed by a variable amount to achieve the same effect of changing the UFT sampling time.

Figure 33A:
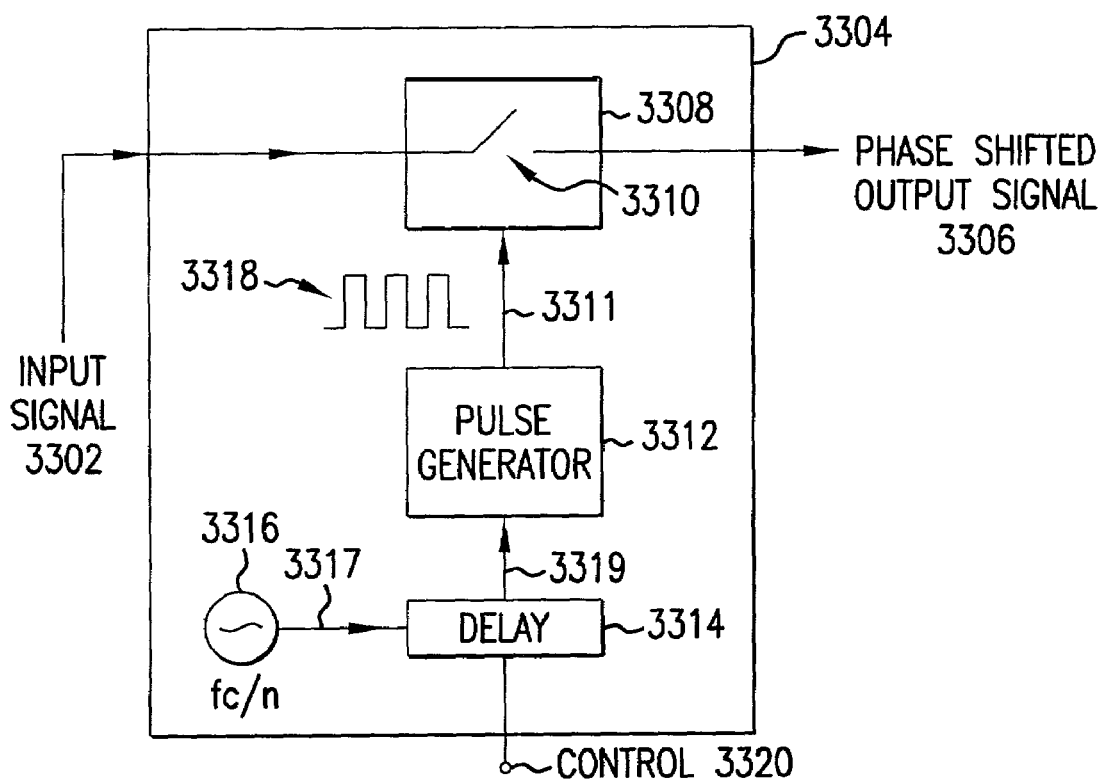
FIGS. 33A-D illustrate a frequency translator/phase-shifter using variable LO signal delay to implement the phase shift according to embodiments of the invention.

FIG. 33A illustrates an integrated frequency translator/phase-shifter 3304, according to an embodiment of the invention. Frequency translator/phase-shifter 3304 includes: a UFT module 3308 having a controlled switch 3310, a pulse generator 3312, a delay 3314, and a local oscillator 3316. Translator/shifter 3304 translates and phase shifts the input signal 3302 to generate a frequency translated and phase shifted output signal 3306. The frequency translation and phase shift occur in an integrated manner, where the amount of relative phase shift is based on the relative delay of the LO signal that drives the pulse generator 3312.

Figure 33B:
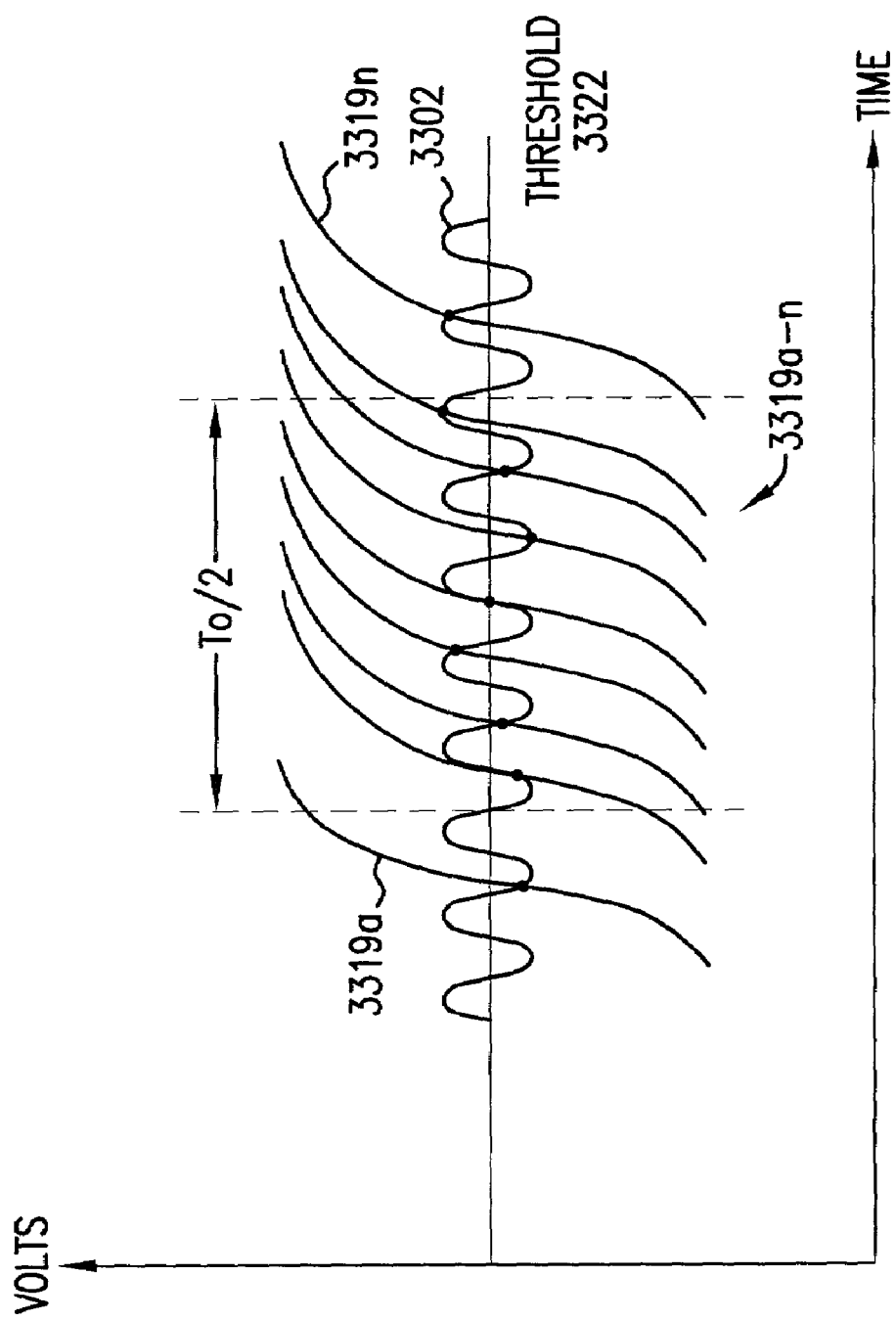
Figure 33C:
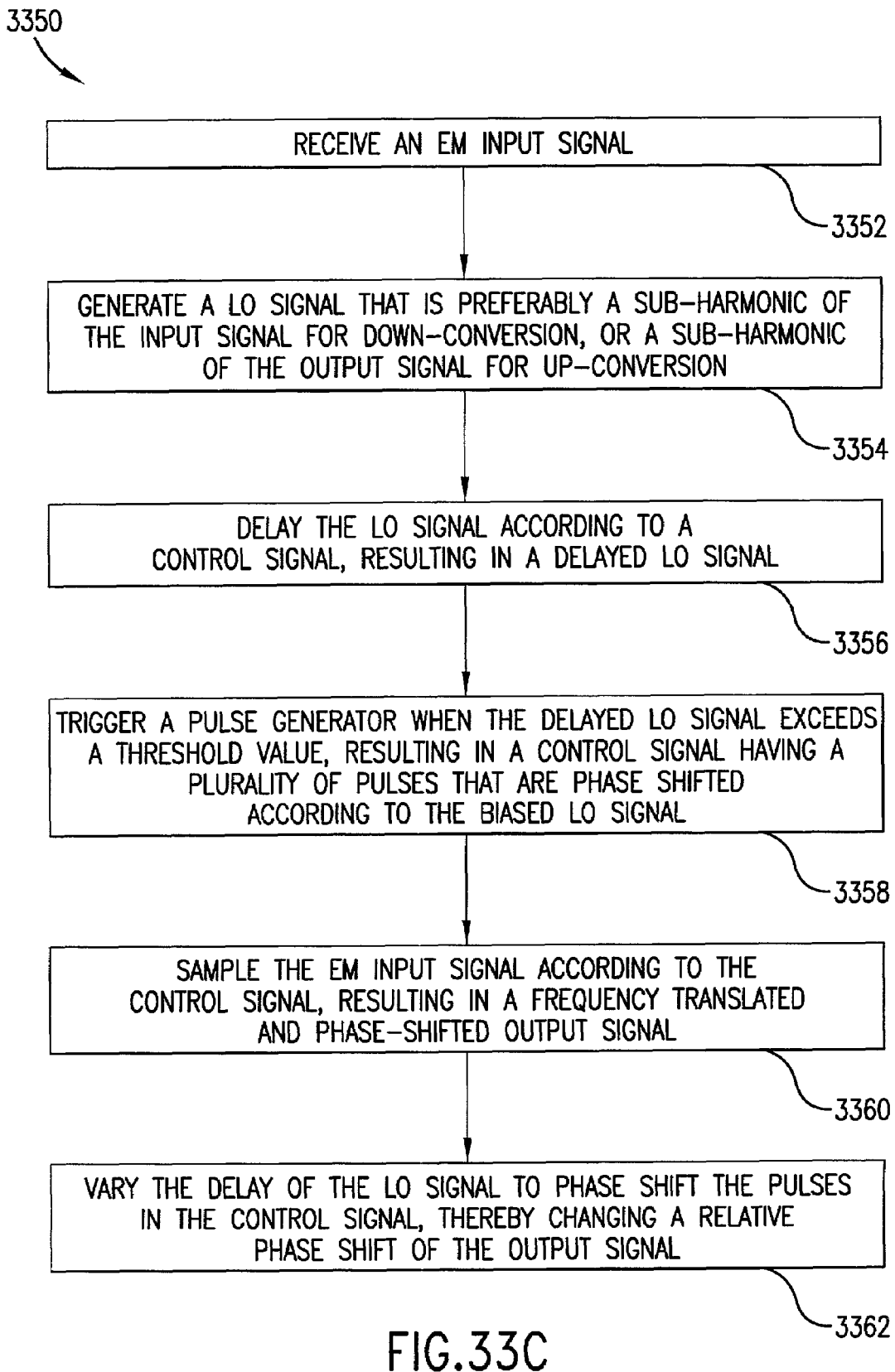

The frequency translator 3304 is described in detail as follows with reference to an operational flowchart 3350 that is shown in FIG. 33C. The discussion is applicable to both down-conversion and up-conversion. As mentioned earlier for down-conversion, the EM input signal 3202 can be down-converted to baseband or down-converted to an IF signal, depending on the LO frequency. For up-conversion, the EM input signal is up-converted to a harmonic of the LO frequency. Specific embodiments that are directed to down-conversion and up-conversion will be described after the general frequency translation and phase-shift embodiment that is described as follows.

In step 3352, the UFT module 3308 receives the EM input signal 3302.

In step 3354, the oscillator 3316 generates a LO signal 3317 that is preferably sinusoidal. More specifically, for down-conversion, the LO signal 3317 is preferably a subharmonic (or offset thereof) of the input signal. For upconversion, the LO signal 3317 is preferably a sub-harmonic of the output signal 3306. As stated, the LO signal 3317 is preferably a sinewave. However, other known waveforms could be used including triangle waves, square waves, etc.

In step 3356, the delay 3314 implements a variable time delay for the LO signal 3317, resulting in a LO signal 3319. The amount of delay that is implemented by the delay 3314 is determined according to the delay control 3320. Various types of tunable delays can used as will be understood by those skilled in the arts, including switchable delay lines, op-amp buffers, allpass filters, etc.

In step 3358, the pulse generator 3312 generates the control signal 3311 according to the delayed LO signal 3319, where the control signal 3311 includes a plurality of pulses 3318. The pulse generator 3312 triggers and produces a pulse 3318 when the delayed LO signal 3319 exceeds a threshold voltage that is associated with the pulse generator 3312. In embodiments of the invention, the plurality of pulses 2620 have pulse widths that tend away from zero, and cause non-negligible amounts of energy to be transferred from the input signal 2604 to the output signal 2606, as discussed above and in the above referenced patent applications.

In step 3360, the UFT module 3308 samples the input signal 3302 according to the control signal 3311. More specifically, the controlled switch 3310 in the UFT module samples the input signal 3302 according to the control signal 3311, resulting in the phase shifted and frequency translated output signal 3306. The frequency translation occurs because the UFT module sub-harmonically samples the input signal in a periodic manner, resulting in harmonic images of the input signal that repeat at harmonics of the sampling frequency. As mentioned above, frequency translation by a UFT module has been described herein and in the above referenced patent applications, to which the reader is referred for further details. The phase shift occurs because any relative delay in the LO signal 3319 causes the pulse generator 3312 to trigger earlier (or later) than nominal, which produces a time/phase shift in the pulses of control signal 3311. By phase shifting the pulses in the control signal 3311, the controlled switch 3310 samples the input signal 3302 earlier (or later) in time relative to the nominal condition. In other words, a phase shifted-control signal 3311 causes a shift in the UFT sampling time, which results in a relative phase shift in the output signal 3306.

In step 3362, the delay of the LO signal 3319 is varied according to the delay control 3320. This phase shifts the pulses in the control signal 3311, and thereby varies the relative phase shift of the output signal 3306. Phase shifting the output signal 3306 by adjusting the delay on the LO signal 3319 is discussed further in reference to FIG. 33B.

FIG. 33B illustrates an exemplary RF input signal 3302 and exemplary delayed LO signals 3319a-n, where each LO signal 3319 has an increasing time delay as shown. The exemplary RF input 3302 is a $10^{th}$ harmonic of the LO signal 3317 (and the delayed LO signals 3319a-n.) Therefore, there are 5 RF cycles within ½ period ($T_o/2$) of the LO signal, as illustrated. (Other harmonic ratios could be utilized as will be understood by those skilled in the arts.) FIG. 33B also illustrates a threshold 3322 for the pulse generator 3312, where the pulse generator 3312 triggers when the LO signal crosses the threshold 3322. As illustrated, the various delayed LO signals 3319a-n cross the threshold 3322 at different points in time, and thereby trigger the pulse generator 3312 at different points in time, causing a relative phase shift in the pulses 3318 of the control signal 3311. The phase-shifted control signal 3311 causes the RF input signal 3302 to be sampled at different time points, and thereby implements the desired phase shift in the frequency translated output signal 3306. In other words, the sampling point can be seen to "walk through" the RF input signal 3302, which results in a phase shift in the output signal 3306.

Additionally, unlike the phase shifter 2602 (in FIG. 26), the phase shifter 3302 is not limited to ½ of the LO cycle for triggering the pulse generator 3312. This is illustrated by LO signals 3319a and 3319n, which are outside the $T_o/2$ LO window. The ½ cycle limitation is removed because the delay 3314 is used to adjust the LO signal 3317 instead of a voltage level shift. The result is that there is no limit on the useful range of the LO signal that can be used to trigger the pulse generator 3312, and therefore there is no limit on the phase shift that can be achieved. For example and without limitation, the delay could be 27 RF cycles (which is 2.7 LO cycles when the RF is the $10^{th}$ harmonic of the LO signal), resulting in an exemplary phase shift of 9720 degrees.

Figure 33D:
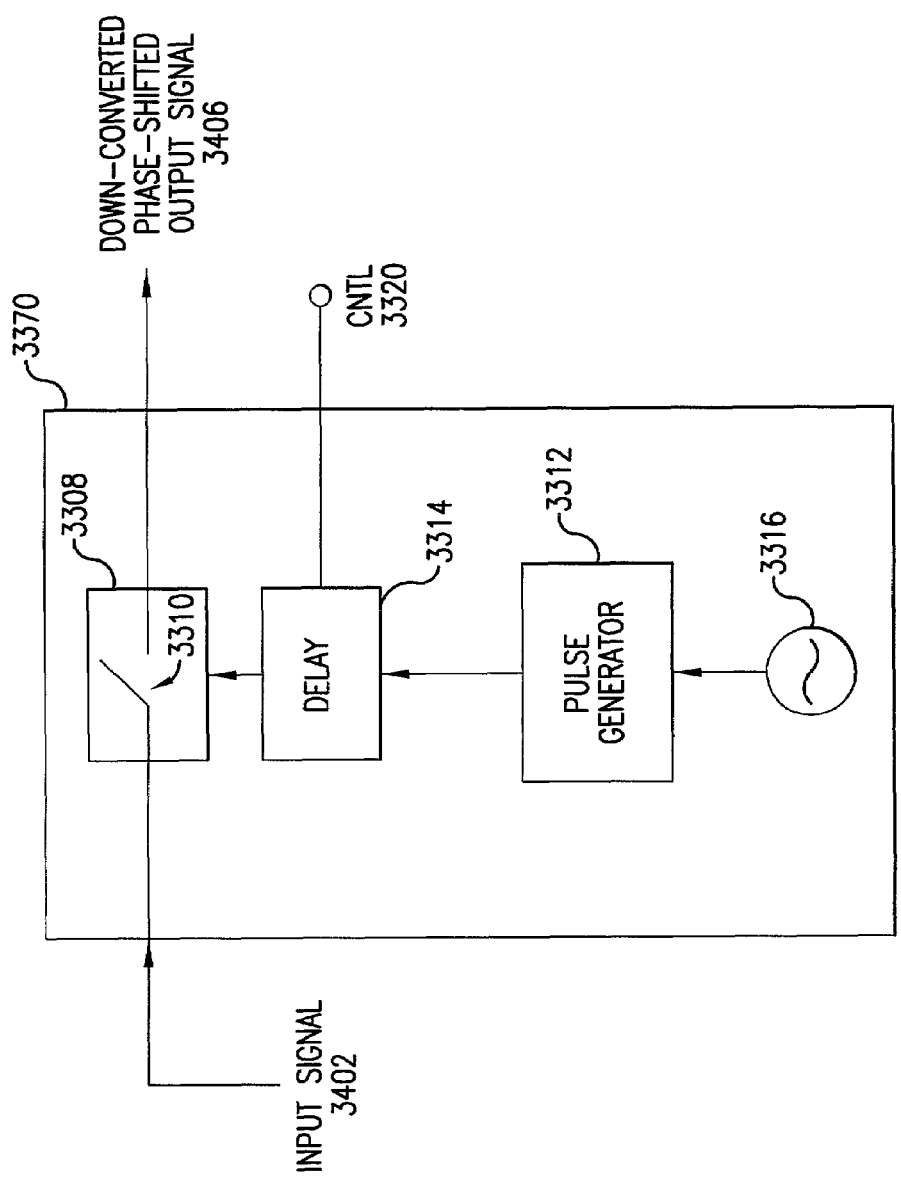

FIG. 33D illustrates a frequency translator/phase shifter 3370, where the variable delay 3314 is placed between the pulse generator 3312 and the UFT module 3308, instead of between the UFT module 3308 and the LO 3316. Therefore, the variable delay is directly applied to the pulses 3318, instead of through the LO signal 3319.

7.2.2.1 Down-Conversion

Figure 34A:
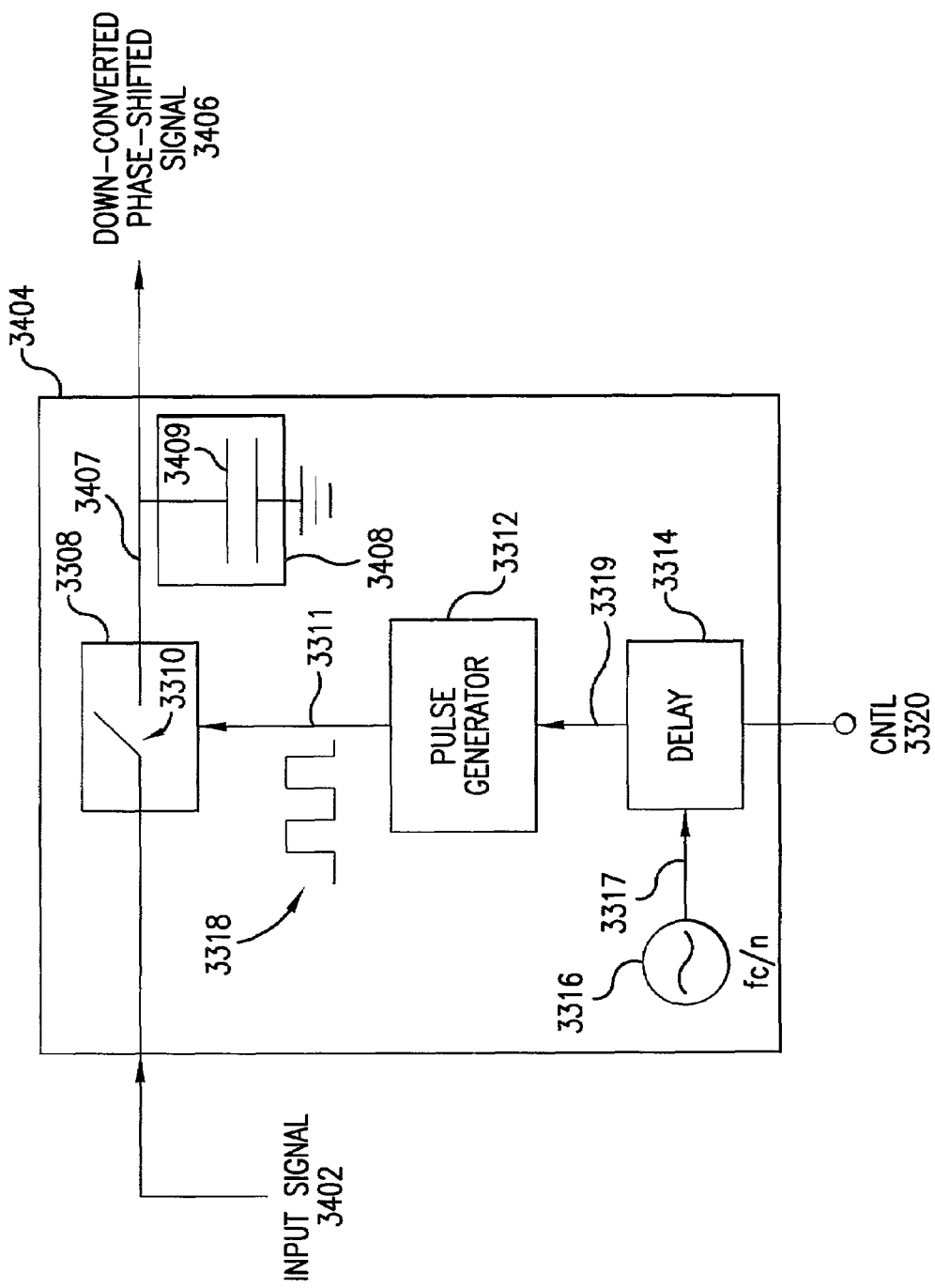
FIGS. 34A-B illustrate a down-converter/phase-shifter using a variable LO delay according to embodiments of the invention.

FIG. 34A depicts a down-converter/phase-shifter 3404 as an embodiment of the frequency translator/phase-shifter 3304. Down-converter/phase-shifter 3404 down-converts and phase shifts an input signal 3402 to a down-converted/phase shifted signal 3406. Down-converter/phase-shifter 3404 includes a storage module 3408 in addition to the components discussed in the frequency translator 3304. In embodiments, the storage module 3408 is a capacitor 3409 that stores/integrates energy transferred from the input signal 3402 when being sampled by the UFT module 3308.

Figure 34B:
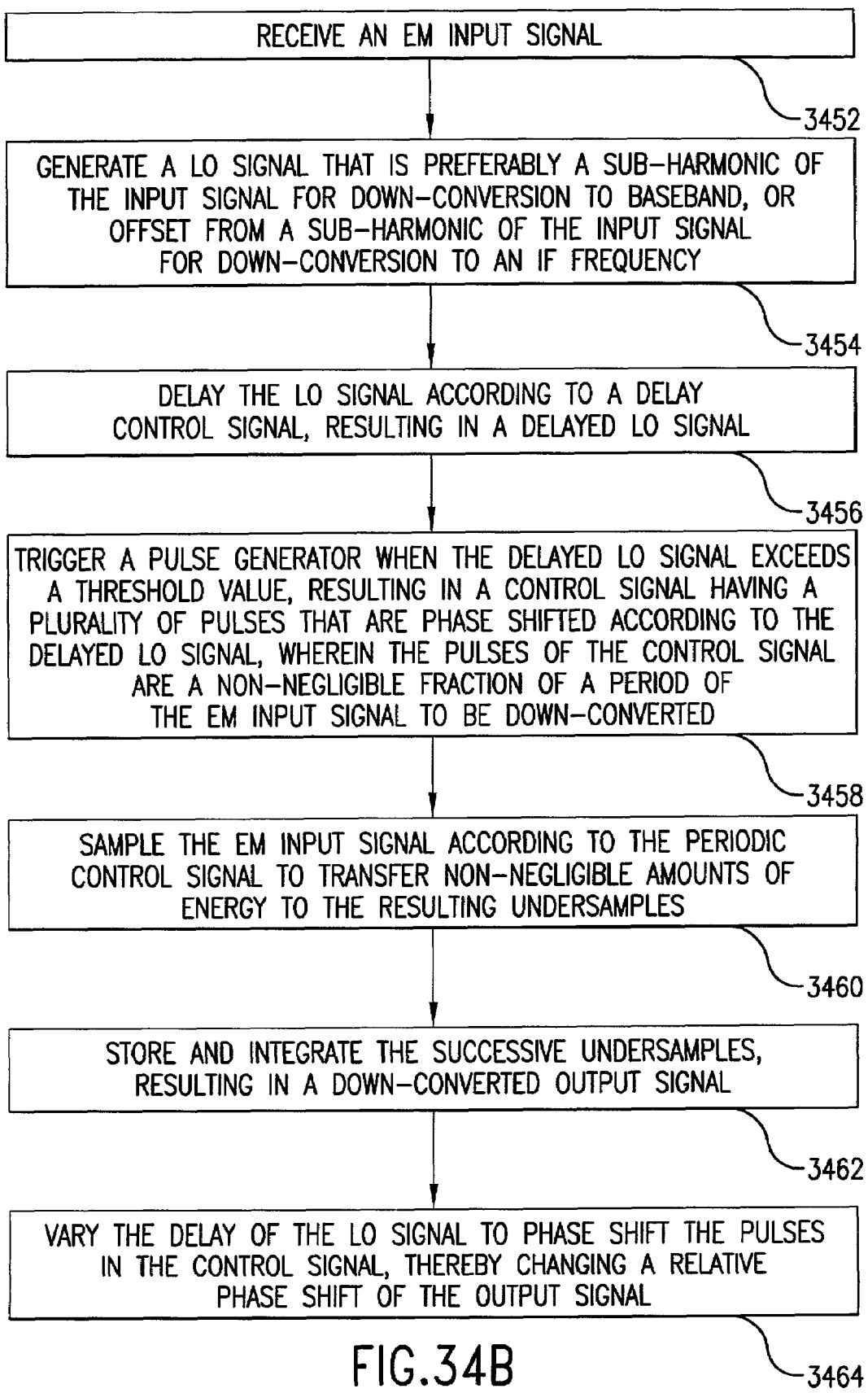

In embodiments, the down-converter/phase-shifter 3404 is further described with reference to the flowchart 3450 that is shown in FIG. 34B, which is described as follows.

In step 3452, the UFT module 3308 receives the EM input signal 3402 that is to be down-converted.

In step 3454, the oscillator 3316 generates a LO signal 3317. LO signal 3317 is preferably a sinewave having a frequency that is a sub-harmonic (or offset thereof) of the EM input signal 3402. For down-conversion to baseband, the LO signal 3317 is preferably a sub-harmonic of the EM input signal 3402. For down-conversion to an IF frequency, the LO signal 3317 can be offset from a sub-harmonic of the EM input signal 3402 according to the equation:

$$\text{Freq}_{LO} = (\text{Freq}_{input} +/- \text{Freq}_{IF})/n$$

where: $\text{Freq}_{Lo}$=frequency of the local oscillator
$\text{Freq}_{input}$=frequency of the EM input signal
$\text{Freq}_{IF}$=frequency of an IF output signal
n=harmonic number As stated, the LO signal 3317 is preferably a sinewave. However, other known waveforms could be used including triangle waves, square waves, etc.

In step 3456, the delay 3314 implements a variable time delay of the LO signal 3317, resulting in the delayed LO signal 3319. The amount of delay that is implemented by the delay 3314 is determined according to the delay control 3320. Various types of delays can used as will be understood by those skilled in the arts, including switchable delay lines, op-amp buffers, allpass filters, etc.

In step 3458, the pulse generator 3312 generates the control signal 3311 according to the LO signal 3319, where the control signal 3311 includes a plurality of pulses 3318. In doing so, the pulse generator 3312 triggers and produces a pulse 3318 when the delayed LO signal 3319 exceeds a threshold voltage (or trigger voltage), as represented by a threshold voltage 3322 in FIG. 33B.

In down-conversion embodiments, the pulse width of the pulses 3318 in the control signal 3311 are a non-negligible fraction of a period associated with the EM input signal 3402 that is to be down-converted. For example and without limitation, the pulse-widths of the pulses 3318 can be approximately 1/10, ¼, ½, ¾, etc., or any other fraction of a period of the EM input signal 3402 or one or more periods plus a fraction of a period. In an embodiment, a pulse width of approximately ½ of a period of the EM input signal 3402 is desirable.

In step 3460, the UFT module 3308 samples the EM input signal 3402 according to the control signal 3311. More specifically, the switch 3310 closes during the pulses 3318 of the control signal 3311, resulting in undersamples 3407. During sampling, in embodiments, non-negligible amounts of energy are transferred from the EM input signal 3402 to the undersamples 3407. This occurs because the pulse-widths of the pulses 3318 are widened to extend the time that the switch 3310 is closed during individual samples, resulting in increased energy transfer from the input signal 3402 to the undersamples 3407. Additionally, input and output impedances of the UFT module 3308 are reduced by widening the sampling pulse.

In step 3462, the storage module 3408 stores and integrates successive undersamples 3407, resulting in the down-converted signal 3406. In embodiments, the capacitor 3409 integrates the charge associated with successive undersamples 3407, resulting in the down-converted signal 3406. A relative phase shift is introduced in the down-converted signal 3406 by varying the delay 3314, according to the delay control 3320. As described above, changing the delay of the LO signal 3319 causes the pulse generator 3312 to trigger earlier (or later) compared to a reference delay, thereby phase shifting the pulses 3318 in the control signal 3311. Since the pulses 3318 determine the sampling time of the EM input signal 3402, a phase-shift is introduced in the down-converted output signal 3406, relative to a nominal or a reference delay.

In step 3464, the delay of the LO signal 3319 is varied according to the delay control 3320. This phase shifts the pulses in the control signal 3311, and thereby varies the relative phase shift of the output signal 3406.

Down-conversion utilizing a UFT module (also called an aliasing module) is further described in a number of applications cited above, such as "Method and System for Down-converting Electromagnetic Signals," application Ser. No. 09/176,022, now U.S. Pat. No. 6,061,551. As discussed herein and in the '551 patent, the pulse widths of the control signal 3311 can be adjusted to increase and/or optimize the energy transfer to the down-converted output signal 3406. Additionally, matched filter principles can be implemented to shape the sampling pulses and further improve energy transfer to the down-converted output signal 3406, as further described in co-pending U.S. patent application titled, "Matched Filter Characterization and Implementation of Universal Frequency Translation Method and Apparatus," Ser. No. 09/521,828, filed on Mar. 9, 2000.

7.2.2.2 Up-Conversion

Figure 35A:
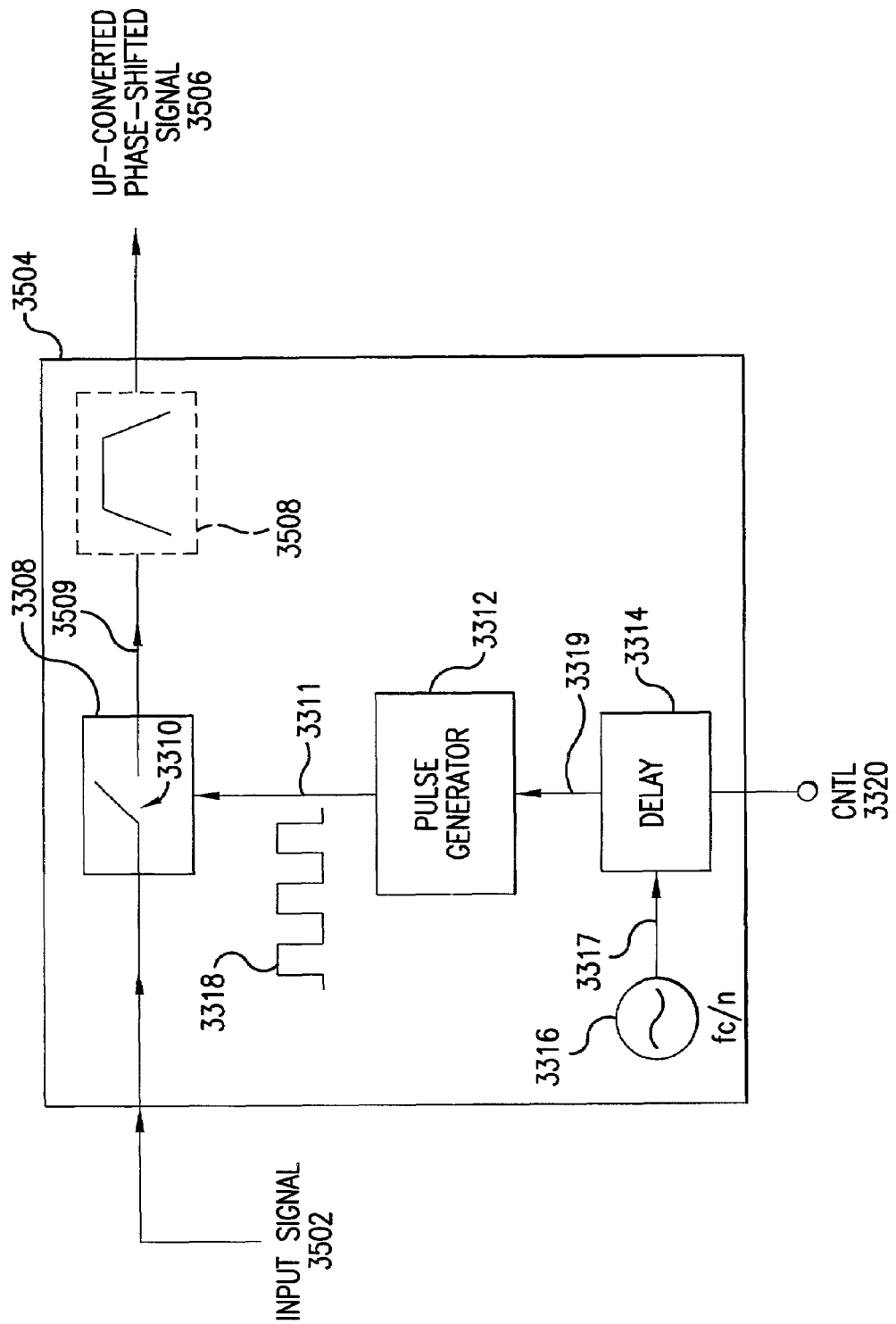
FIGS. 35A-C illustrate a up-converter/phase-shifter using a variable LO delay according to embodiments of the invention.

FIG. 35A depicts an up-converter/phase-shifter 3504 as an example embodiment of the frequency translator/phase-shifter 3304. Up-converter/phase-shifter 3504 up-converts and phase shifts an input signal 3502 to generate up-converted and phase shifted output signal 3506. Up-converter/phase-shifter 3504 includes a bandpass filter 3508 in addition to the components identified for the up-converter/phase-shifter 3304. The bandpass filter 3508 selects the harmonic of interest from a harmonically rich signal 3509 that is generated by the UFT module 3308. The harmonically rich signal 3509 contains multiple harmonic images that repeat at harmonics of the sampling frequency, as determined by the LO signal 3317. Each harmonic includes the necessary amplitude, phase, and frequency information to reconstruct the input signal 3502. In embodiments, the pulse widths for the control signal 3311 are adjusted to shift energy among the harmonics that make-up the harmonically rich signal 3509.

Figure 35B:
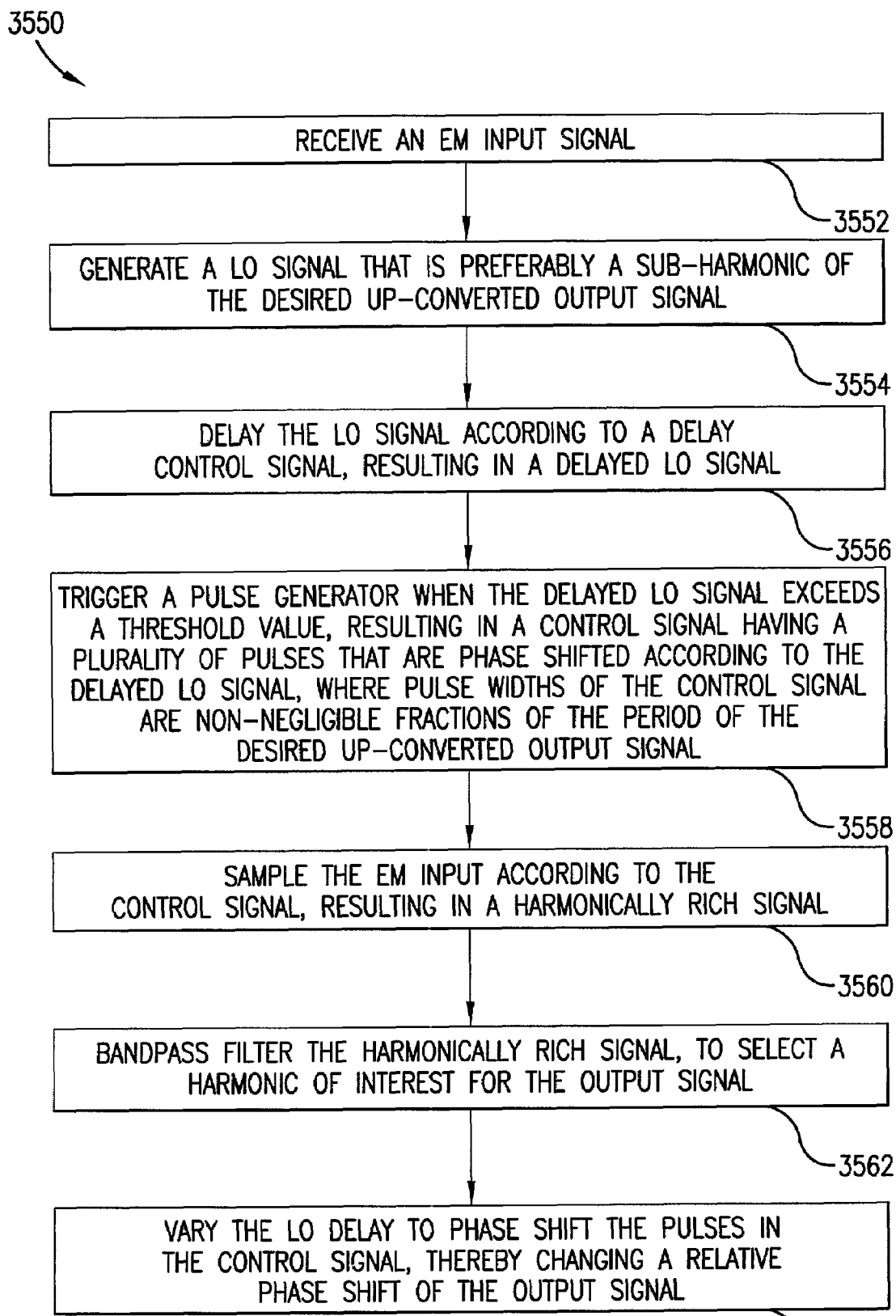

In embodiments, the up-converter/phase shifter 3504 is further described with reference to the flowchart 3550 that is shown in FIG. 35B, which is described as follows.

In step 3552, the UFT module 3308 receives the EM input signal 3502, which is preferably a baseband signal or lower frequency signal that is to be up-converted.

In step 3554, the oscillator 3316 generates a LO signal 3317. LO signal 3317 is preferably a sinewave having a frequency that is sub-harmonic of the desired frequency of the up-converted output signal 3506. As stated, the LO signal 3317 is preferably a sinewave. However, other known waveforms could be used including triangle waves, square waves, etc.

In step 3556, the delay 3314 implements a variable time delay for the LO signal 3317, resulting in a LO signal 3319. The amount of delay that is implemented by the delay 3314 is determined according to the delay control 3320. Various types of delays can used as will be understood by those skilled in the arts, including switchable delay lines, op-amp buffers, allpass filters, etc.

In step 3558, the pulse generator 3312 generates the control signal 3311 according to the delayed LO signal 3319, where the control signal 3311 includes a plurality of pulses 3318. In doing so, the pulse generator 3312 triggers and produces a pulse 3318 when the delayed LO signal 3319 exceeds a threshold voltage (or trigger voltage) associated with the pulse generator, as represented by a threshold voltage 3322 in FIGS. 33B.

In up-conversion embodiments, the pulse width of the pulses in the control signal 3311 are a non-negligible fraction of a period associated with the up-converted EM output signal 3506, or one or more periods plus a fraction of a period. For example and without limitation, the pulse-widths of the control signal 2607 can be approximately ⅒, ¼, ½, ¾, etc., or any other fraction of a period of the up-converted EM output signal 3506. In an embodiment, a pulse width of approximately ½ of a period of the EM output signal 3506 is desirable.

Figure 35C:
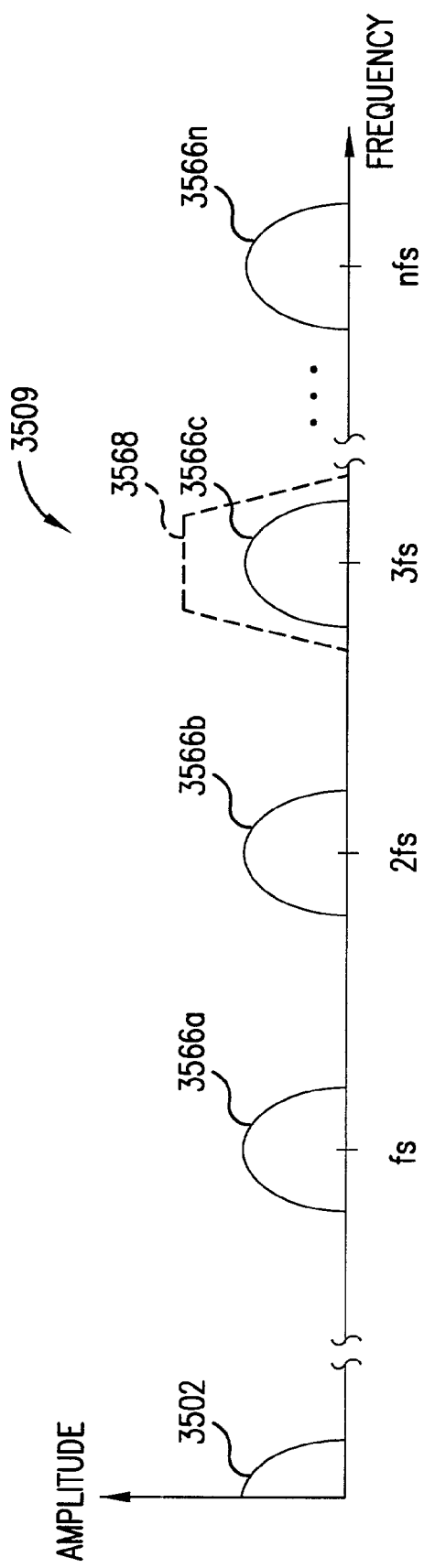

In step 3560, the UFT module 3308 samples the EM input signal 3502, according to the control signal 3311. More specifically, the switch 3310 closes during the pulses 3318 of the control signal 3311, so that the periodic sampling produces a harmonically rich signal 3509. The harmonically rich signal 3509 includes multiple harmonic images that repeat at harmonics of the sampling frequency $f_s$, which is the frequency of the pulses 3318 of the control signal 3311. FIG. 35C illustrates an exemplary frequency spectrum of the harmonically rich signal 3509 having harmonics 3566a-n that repeat at harmonics of the sampling frequency $f_s$. Each harmonic 3566 in the harmonically rich signal 3509 includes the necessary amplitude, phase, and frequency information to reconstruct the input signal 3502. A relative phase shift is introduced in each of the harmonics 3566 by varying the delay of the LO signal 3319, so that pulses 3318 in the control signal 3311 are triggered earlier (or later) relative to a reference sampling time. Since the pulses 3318 determine the sampling time of the EM input signal 3502, a phase-shift is introduced in the harmonics 3566, relative to a reference amount of LO delay.

In embodiments of the invention, the pulse width of the pulses 3318 are established to shift energy among the various harmonics 3566 of the harmonically rich signal 3209. Generally, shorter pulse widths shift more energy into the higher frequency harmonics, and longer pulse widths shift more energy into the lower frequency harmonics. In embodiments, the pulse width is approximately ½ a period of a harmonic frequency of interest. In other words, the pulse width is established to be approximately $\pi$ radians at the harmonic frequency of interest.

In step 3562, the filter 3508 selects the harmonic of interest from the harmonically rich signal 3509. In FIG. 32C, this is represented by a passband 3568 that selects the harmonic 3566c as the up-converted output signal 3506.

In step 3564, the delay of the LO signal 3319 is optionally varied according to the delay control 3320. This phase shifts the pulses of the control signal 3311, and thereby varies the relative phase shift of the up-converted output signal 3506.

Up-conversion of an input signal using a UFT module is further described in "Method and System for Frequency Up-Conversion," application Ser. No. 09/176,154.

7.2.2.3 Dual Feed Structure

Figure 78A:
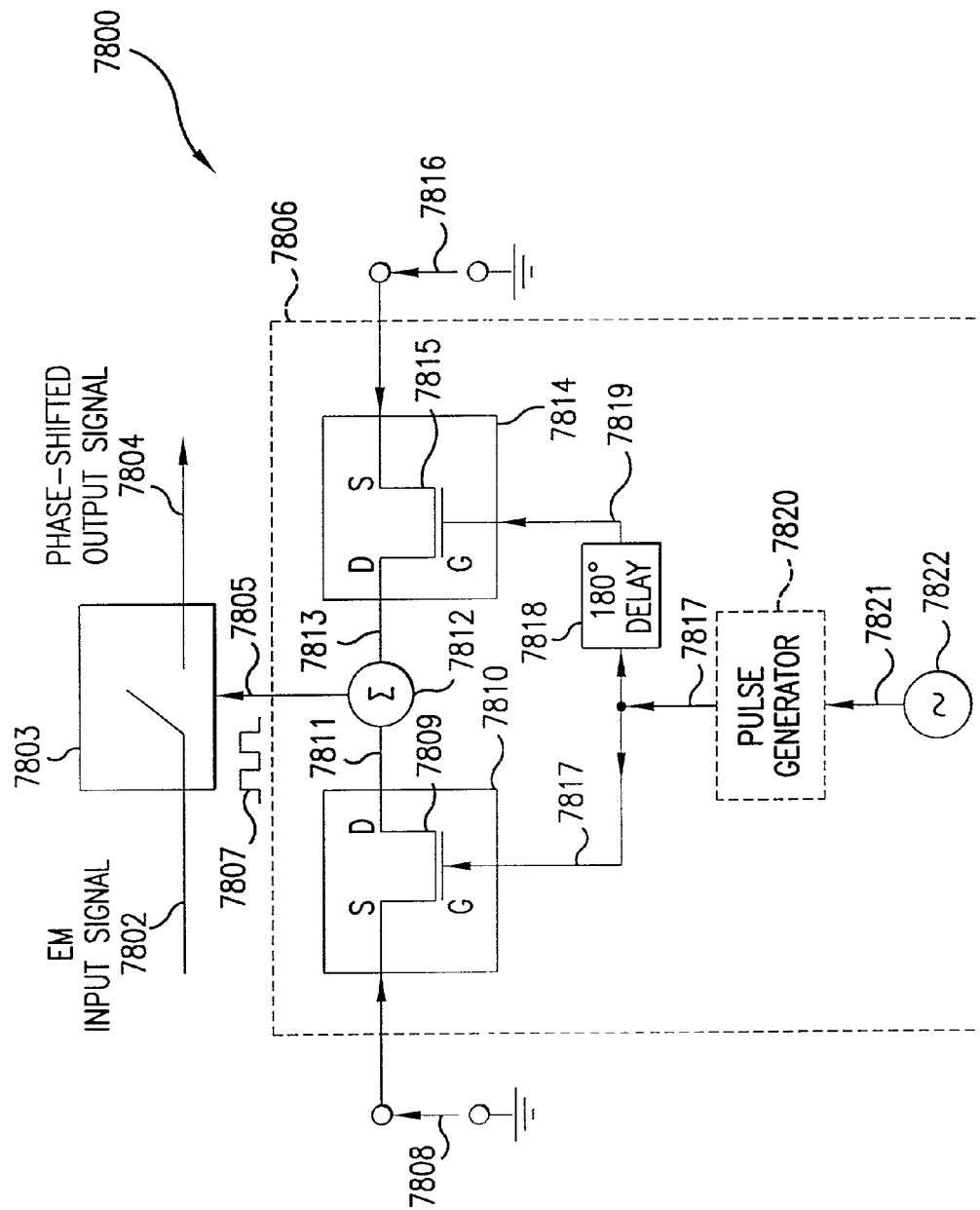
FIG. 78A illustrates a phase shifter 7800 according to embodiments of the present invention.

FIG. 78A illustrates a frequency translator/phase-shifter 7800 that is a second embodiment of frequency translation/phase shifting where the amount of phase shift is controlled by introducing a variable delay in the pulses of a control signal that operate the UFT module. Phase-shifter 7800 translates and phase shifts the input signal 7802 to generate a phase shifted output signal 7804. Phase-shifter 7800 includes: UFT module 7803 and control signal generator 7806. Control signal generator 7806 is a dual feed structure that generates the control signal 7805 according to the DC control voltages 7808 and 7816. Control signal generator 7806 includes: UFT module 7810, summer 7812, UFT module 7814, delay 7818, pulse generator 7820, and oscillator 7822. The UFT modules 7810 and 7814 are implemented as FET transistors 7809 and 7815, respectively.

Phase-shifter 7800 operates similar to phase-shifter 3304 (FIG. 33A), in that the UFT module 7803 samples the input signal 7802 according to a control signal 7805, resulting in a phase-shifted output signal 7804. The relative phase shift of the output signal 7804 is determined by the relative phase shift (or time shift) of pulses 7807 that comprise the control signal 7805. This occurs because the pulses 7807 trigger the sampling of the input signal 7802 by the UFT module 7803. As discussed below, the relative time shift of the pulses 7807 in the control signal 7805 are determined by the DC voltages 7808 and 7816.

Referring now to the control signal generator 7806, the oscillator 7822 generates a clock signal 7821 that is a sub-harmonically related to the input signal 7802 for down-conversion, or sub-harmonically related to the output signal 7804 for up-conversion. Clock signal 7822 can be a sine wave, a square wave, or another periodic waveform. Pulse generator 7820 generates an I clock signal 7817 comprising a pulse train having pulse width $T_A$. The UFT module 7810 samples the DC voltage 7808 according to the I clock signal 7817, resulting in an I control signal 7811. More specifically, the FET 7809 conducts to sample the DC voltage 7808 when triggered by the I clock signal 7817. The I control signal 7811 comprises a plurality of pulses that are substantially similar in frequency and phase to the clock signal 7817.

Still referring to control signal generator 7806, the delay 7818 delays the I clock signal 7817 by 180 degrees at the frequency of oscillator 7822 to generate a Q clock signal 7819. The UFT module 7814 samples the DC voltage 7816 according to the Q clock signal 7819 to generate a Q control signal 7813. More specifically, the FET 7815 conducts to sample the DC voltage 7816 according to the Q clock signal 7819.

The summer 7812 sums the signals 7811 and 7813 to generate the control signal 7805, that has frequency that is approximately 2X that of the I clock signal 7817. In other words, the pulses 7807 have a frequency that is 2X the frequency of the pulses in the I clock signal 7817.

In a reference scenario, both the DC voltages 7808 and 7816 are approximately equivalent, and the FET 7815 triggers 180 degrees later in time than the FET 7809 because of the 180 degree delay 7818. However, if the DC voltages are different, then the FET 7809 and/or the FET 7815 will trigger earlier (or later) in time than in the reference scenario, and thereby causing a phase shift in the control signal 7805. This occurs because the DC voltages 7808 and 7816 are connected to the source of FETs 7809 and 7815, respectively. Therefore, a change in the DC voltage 7808 alters the gate-to-source voltage for the FET 7809, and thereby cause the FET 7809 to trigger at a different time compared to a reference $V_{GS}$ for FET 7809. Likewise, a change in the DC voltage 7816 will cause a change in the $V_{GS}$ for the FET 7815, and thereby cause the FET 7815 to trigger at a different time compared to a reference $V_{GS}$.

Figure 78B:
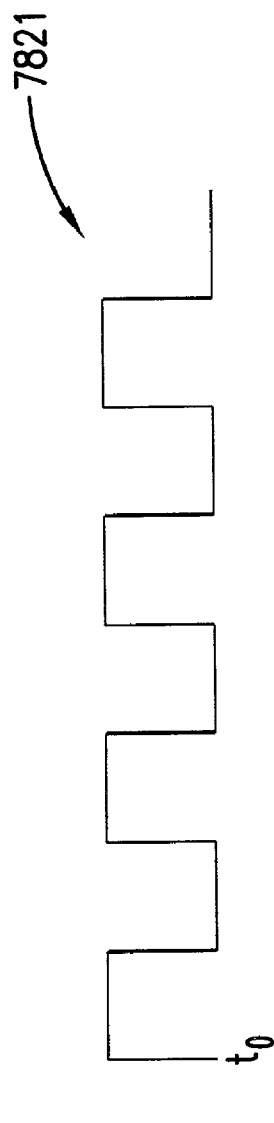
FIGS. 78B-D illustrate various signal diagrams associated with phase shifter 7800, according to embodiments of the present invention.
Figure 78C:
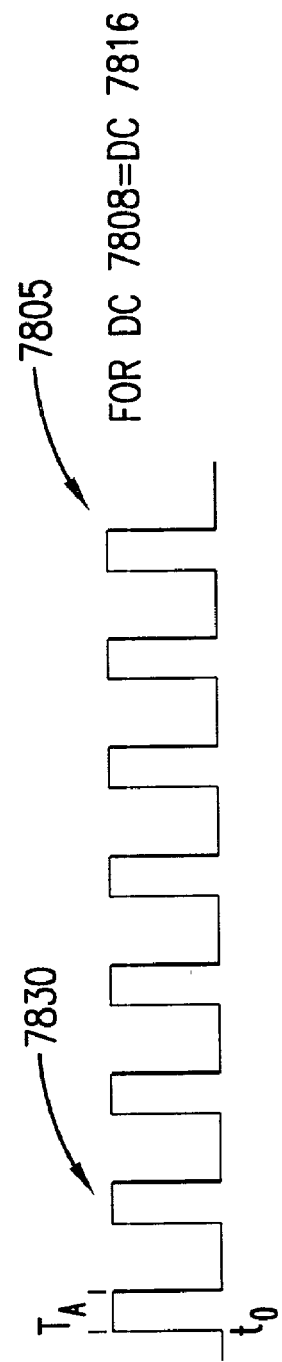
Figure 78D:
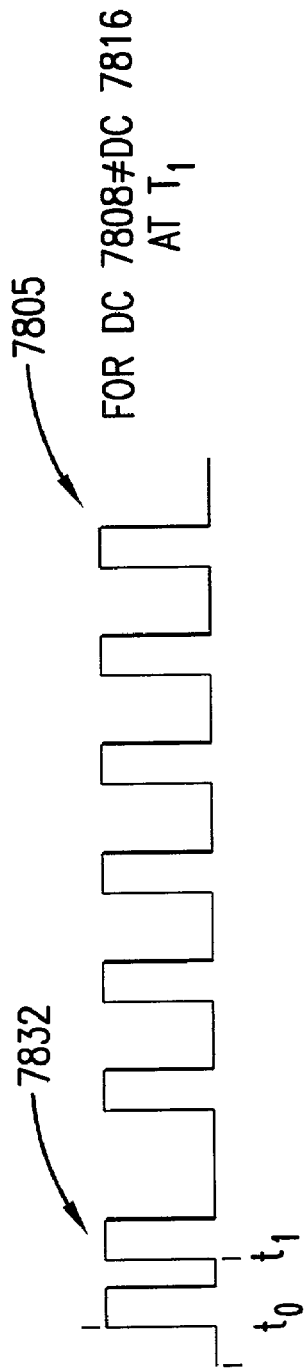

FIGS. 78B-D depict example signal diagrams that further illustrate the operation of the control signal generator 7806. FIGS. 78B-D are meant for example purposes only, and are not meant to be limiting. FIG. 78B illustrates the master clock signal 7821 that is generated by the oscillator 7822. FIG. 78C illustrates an example of the control signal 7805 for a reference scenario, where the DC voltage 7808 is equivalent to the DC voltage 7816 at time $t_0$. It is noted that the signal 7805 in FIG. 78C has a frequency of 2X that of the clock 7821, and has a pulse width of $T_A$. FIG. 78D illustrates an example of the control signal 7805 when the DC voltage 7808≠DC voltage 7816 at a time $t_1$. It is noted that pulse 7832 in FIG. 78D triggers earlier than the corresponding pulse 7830 in FIG. 78C. In other words, the non-equivalence of the DC voltages 7808 and 7816 at time $t_1$ causes the illustrated phase shift in the pulse 7832 at time $t_1$. Therefore, the pulses 7807 in the control signal 7805 can be phase-shifted by adjusting DC control voltages 7808 and 7816.

7.2.3 Changing the Shape or Phase of the LO waveform

As described above, the UFT module can be configured to provide integrated frequency translation and phase shifting by varying the sampling time that the UFT module samples the input signal. In section 7.2.1, the LO signal that drives the pulse generator is level shifted with a bias voltage so that pulse generator triggers earlier or later in time relative to a reference bias voltage (e.g. 0 volts). In section 7.2.2, the LO signal that drives the pulse generator is delayed by a variable amount to change the UFT sampling time. In another embodiment, the shape or form of the LO signal is changed so as to vary the phase shift (or time shift) of the LO signal that triggers the pulse generator.

Figure 36:
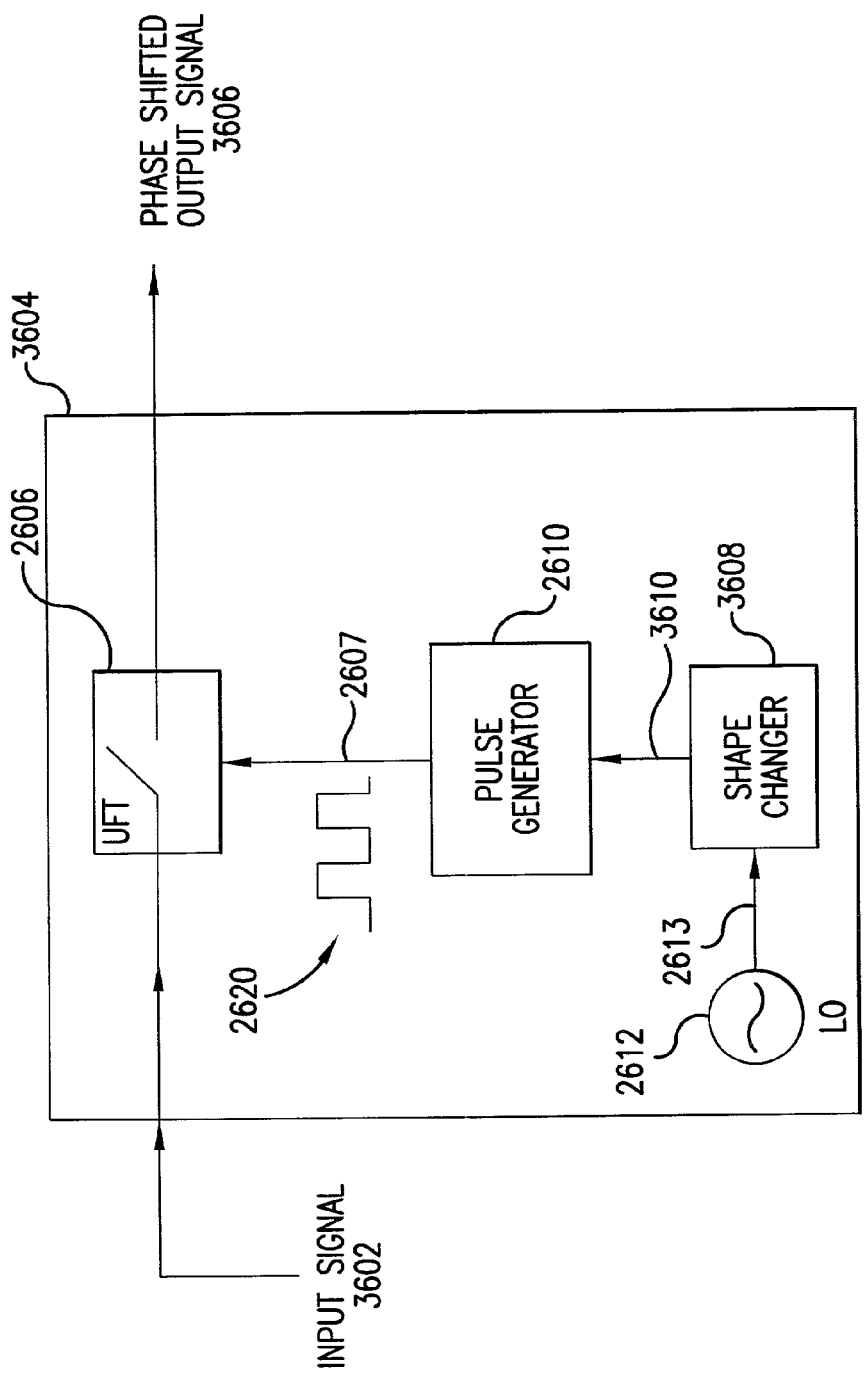
FIG. 36 illustrates a frequency translator/phase-shifter using a shape changer to implement the phase shift according to embodiments of the invention.

FIG. 36 illustrates an example frequency translator/phase-shifter 3604 that contains a LO shape changer 3608. Frequency translator/phase-shifter 3604 is similar to translator 2602 (in FIG. 26A). The difference being that the phase shift is implemented by changing the shape of the LO signal 2613 using the shape changer 3608, resulting in a shaped LO signal 3610. Shape changer 3608 changes the shape of the LO signal 2613 by inverting, filtering, distorting, or pulse shaping the LO signal 2613. For example and without limitation, the sinewave LO signal 2613 could be converted into a saw-tooth wave or a square wave to vary the trigger time-point of the pulse generator 2610 from nominal. It is noted that a saw-tooth wave has more phase controllability than a square wave because the saw-tooth wave has a longer rising edge linear region than a square wave. As discussed above, changing the trigger point of the pulse generator 2610 causes a phase shift in the pulses 2620 of the control signal 2607. Phase shifting the pulses 2620 causes a variance in the sampling time by the UFT module 2606, thereby causing a phase shift in the output signal 3606.

Figure 79:
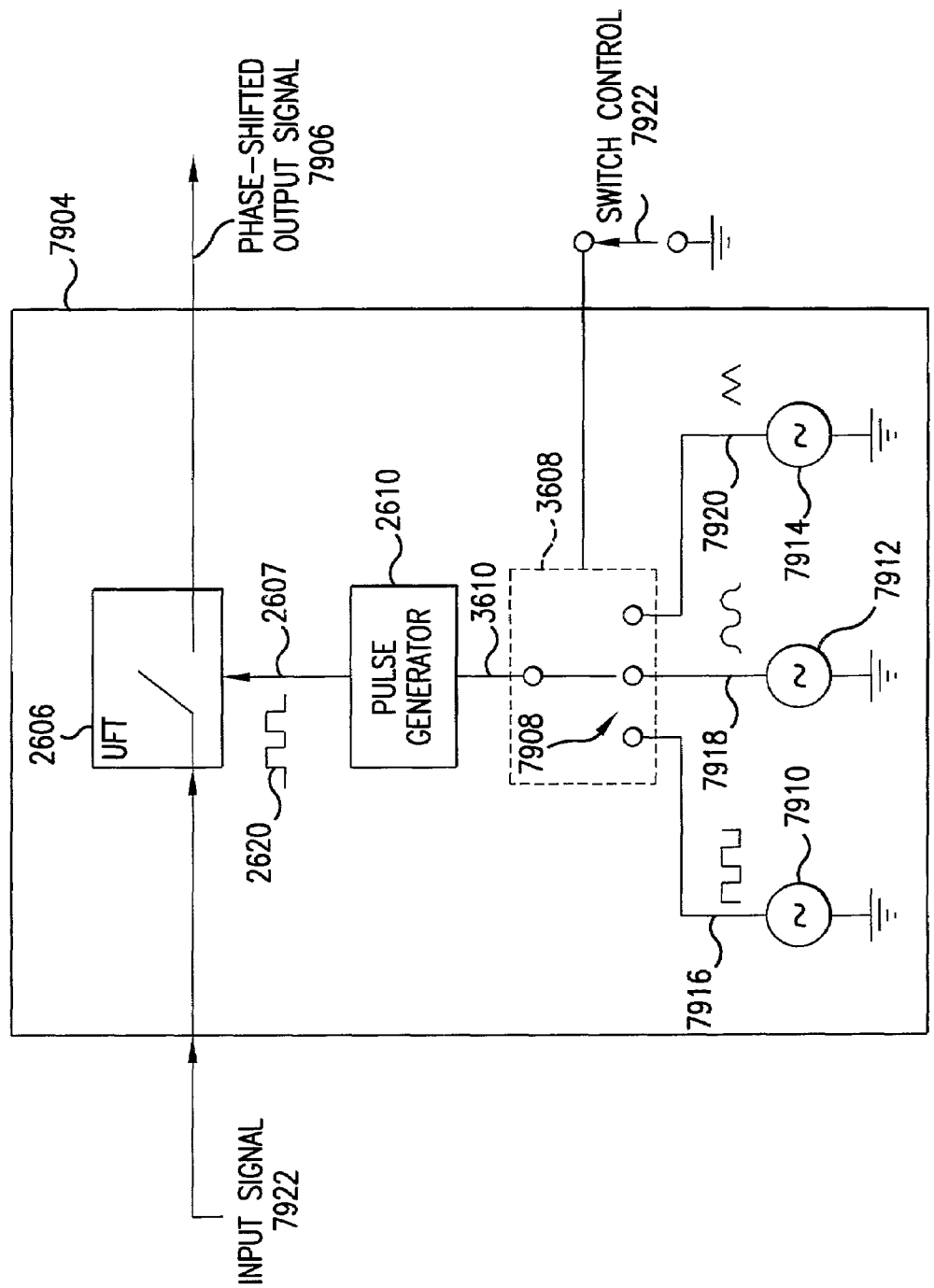
FIG. 79 illustrates a phase shifter 7904 that utilizes multiple sources, according to embodiments of the present invention.

FIG. 79 illustrates a frequency translator/phase-shifter 7904 that is an embodiment of the frequency translator 3604. In frequency translator 7904, the LO shape changer 3608 is embodied as a multi-pole switch 7908 that selects among multiple oscillators 7910-7914, where each oscillator generates a different type of periodic LO signal. More specifically, oscillator 7910 generates a square wave LO signal 7916. Oscillator 7912 generates a sine wave LO signal 7918. Finally, the oscillator 7914 generates a triangle wave LO signal 7920. The switch 7908 selects one of the oscillator signals 7916-7920, according to a switch control signal 7922.

During operation, one of the signals 7916-7920 can be chosen as a default reference for the LO signal 3610. For example and without limitation, the sine wave signal 7918 can be chosen as a reference for the LO signal 3610. The LO signal 3610 can then be shaped or modified by changing the settings of the switch 7908 to one of the other signal choices when a phase shift is desired. As mentioned above, changing the shape or form of the LO signal 3610 causes the pulse generator 2610 to trigger at different time point than nominal, and results in a phase shift in the output signal 7906.

7.2.3.1 Down-Conversion

Figure 37:
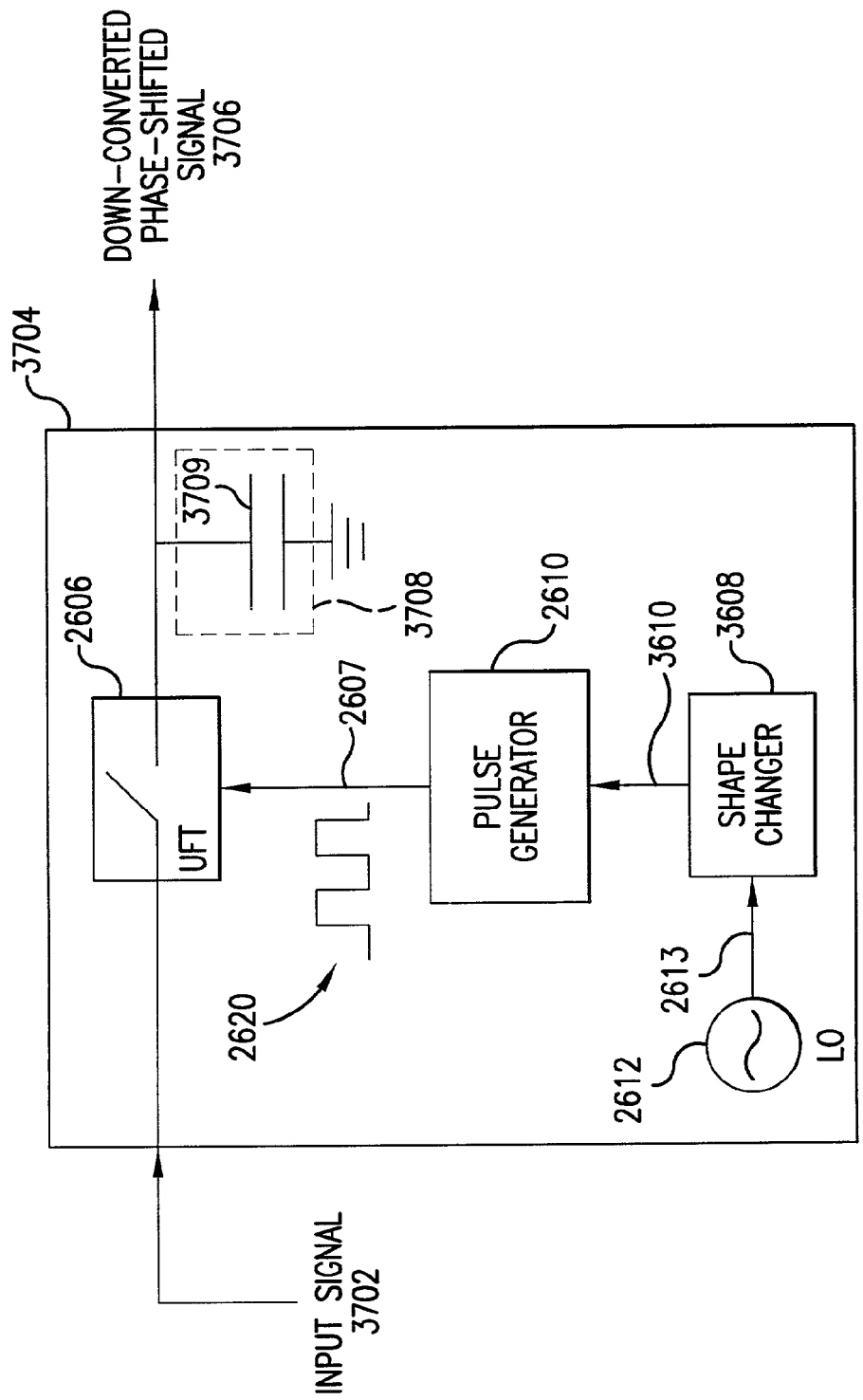
FIG. 37 illustrates a down-converter/phase shifter using a shape changer to implement the phase shift according to embodiments of the invention.

FIG. 37 depicts a down-converter/phase-shifter 3704 as an embodiment of the frequency translator/phase-shifter 3604. Down-converter/phase-shifter 3704 down-converts and phase shifts an input signal 3702 to a down-converted/ phase shifted signal 3706. Down-converter/phase-shifter 3704 includes a storage module 3708 in addition to the components discussed in the frequency translator 3604. In embodiments, the storage module 3708 includes a capacitor 3708 that stores/integrates the energy transferred from the input signal 3702 when being sampled by the UFT module 2606. Down-conversion of an EM input signal using a UFT module (also called an aliasing module) is further described in the above referenced applications, such as "Method and System for Down-converting Electromagnetic Signals," application Ser. No. 09/176,022, now U.S. Pat. No. 6,061, 551. As discussed in the '551 patent, the pulse widths of the control signal can be adjusted to increase and/or maximize the energy transfer to the down-converted/phase shifted output signal 3706. Additionally, matched filter principles can utilized to further improve energy transfer to the down-converted/phase-shifted output signal 3706.

7.2.3.2 Up-Conversion

Figure 38:
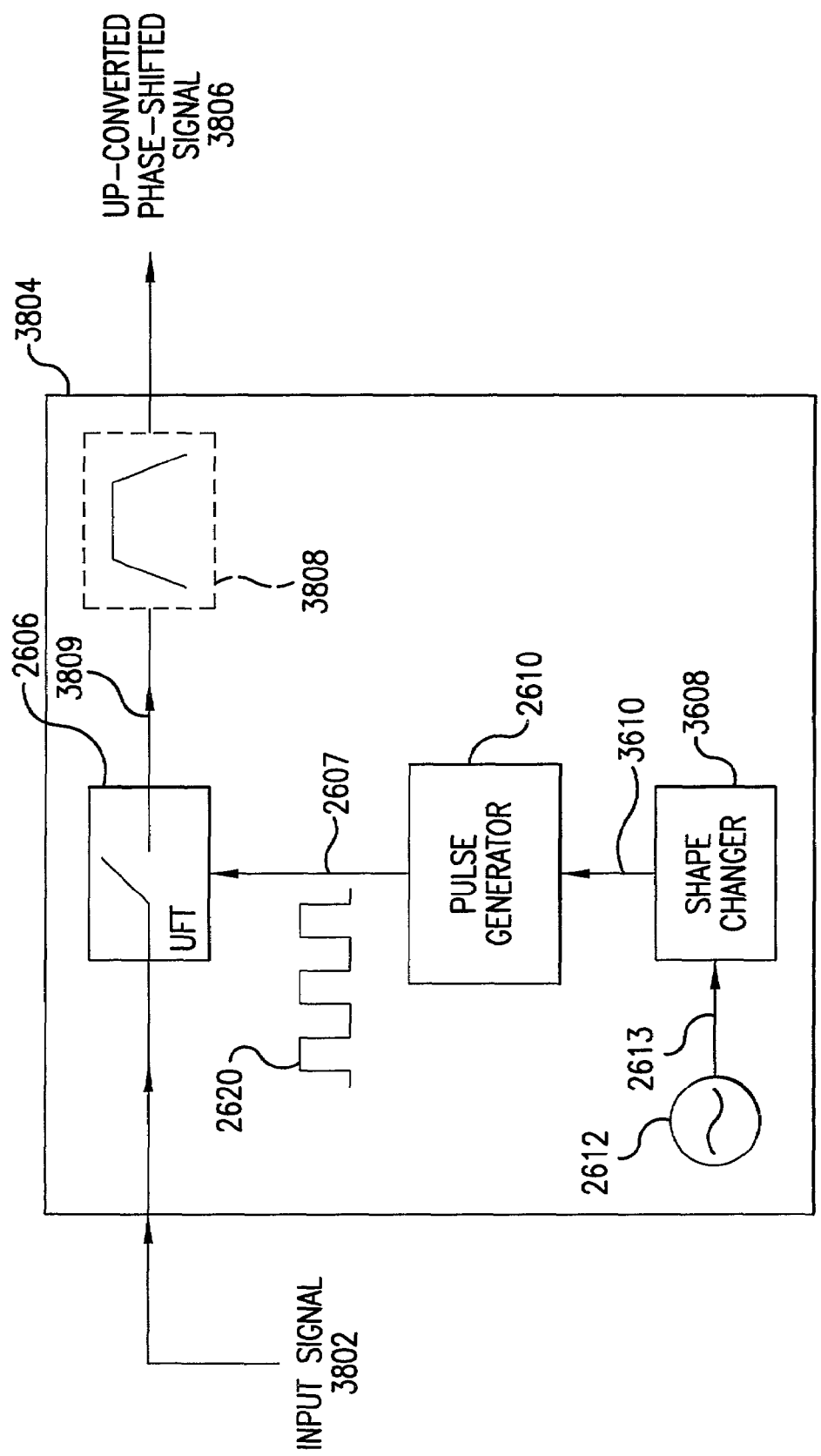
FIG. 38 illustrates an up-converter/phase shifter using a shape changer to implement the phase shift according to embodiments of the invention.

FIG. 38 depicts an up-converter/phase-shifter 3804 as an example embodiment of the frequency translator/phase-shifter 3604. Up-converter/phase-shifter 3804 up-converts and phase shifts an input signal 3802 to generate up-converted and phase shifted signal 3806. Up-converter/phase-shifter 3804 includes a bandpass filter 3808 in addition to the components identified for the frequency translator/phase-shifter 3604. The bandpass filter 3808 selects the harmonic of interest from a harmonically rich signal 3809 that is generated by the UFT module 2606. The harmonically rich signal 3809 contains multiple harmonic images that repeat at the sampling frequency determined by the LO signal 2613. Each harmonic image in the harmonically rich signal 3809 contains the necessary amplitude, phase, and frequency information to reconstruct the baseband signal 3802. Up-conversion of an input signal using a UFT module is further described in "Method and System for Frequency Up-Conversion," application Ser. No. 09/176,154.

7.2.4 Phase Shifting Without Using a Pulse Generator

In the embodiments described in sections 7.2.1-7.2.3, the phase shifting was implemented by varying the trigger point (in time) of the pulse generator by manipulating the sinusoidal LO signal that drives the pulse generator. Alternatively, the LO signal could be used to drive the UFT module directly without the using a pulse generator. This is illustrated in FIGS. 39-40.

Figure 39:
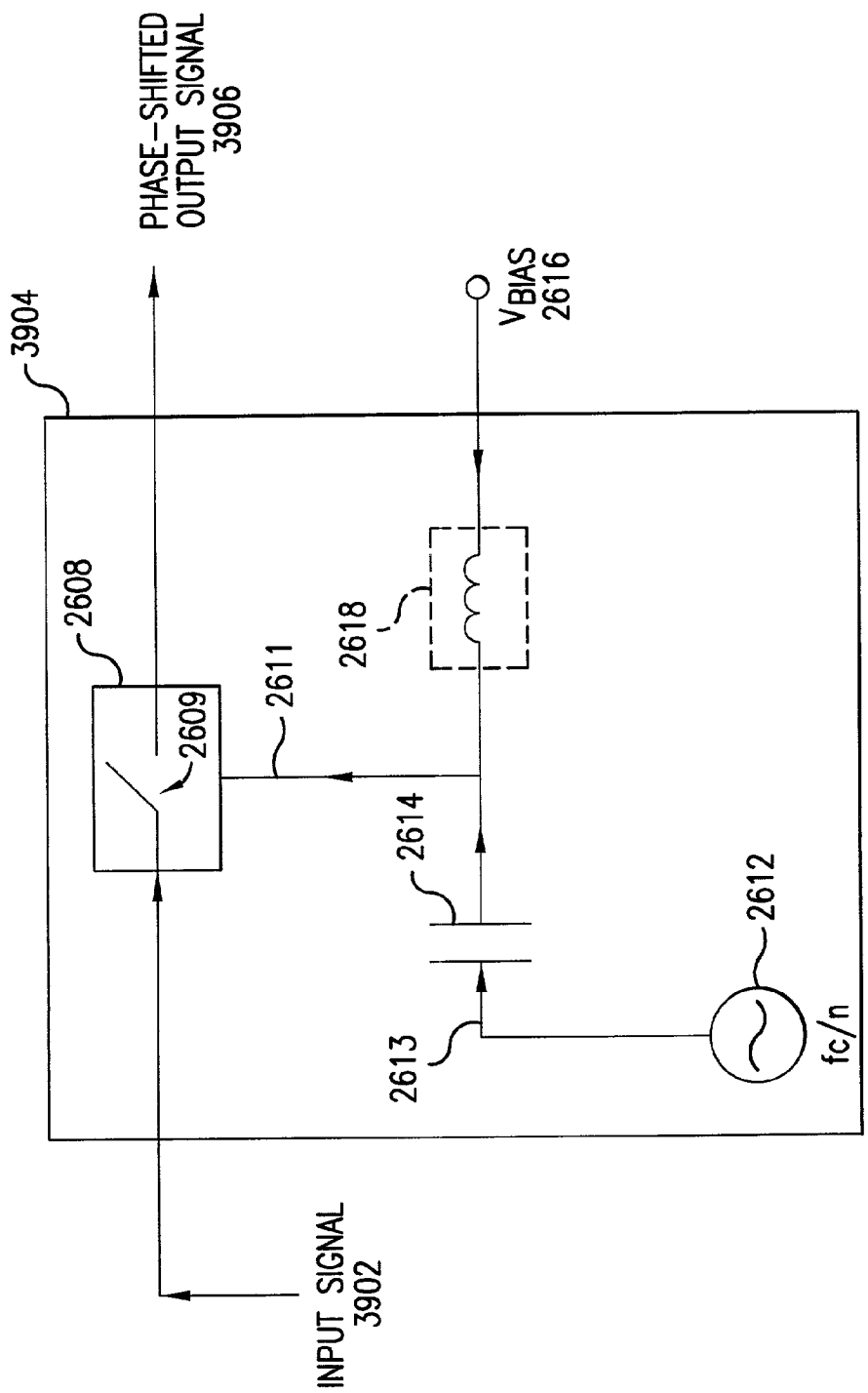
FIGS. 39-40 illustrate frequency translator/phase-shifters where the LO signal directly controls the UFT module according to embodiments of the invention.

FIG. 39 illustrates an example frequency translator/phase-shifter 3904 that operates similar to the frequency translator/ phase shifter 2602 (FIG. 26A). As such, the LO signal 2613 is raised or lowered using the bias voltage 2616, to generate the biased LO signal 2611 similar to that in phase-shifter 2602. However, in phase-shifter 3904, the biased LO signal 2611 directly operates the UFT module 2608, and controls the sampling of the input signal 3902 using the controlled switch 2609. By raising or lowering the bias voltage, the sampling point is changed in time, and the phase shift is implemented.

Figure 40:
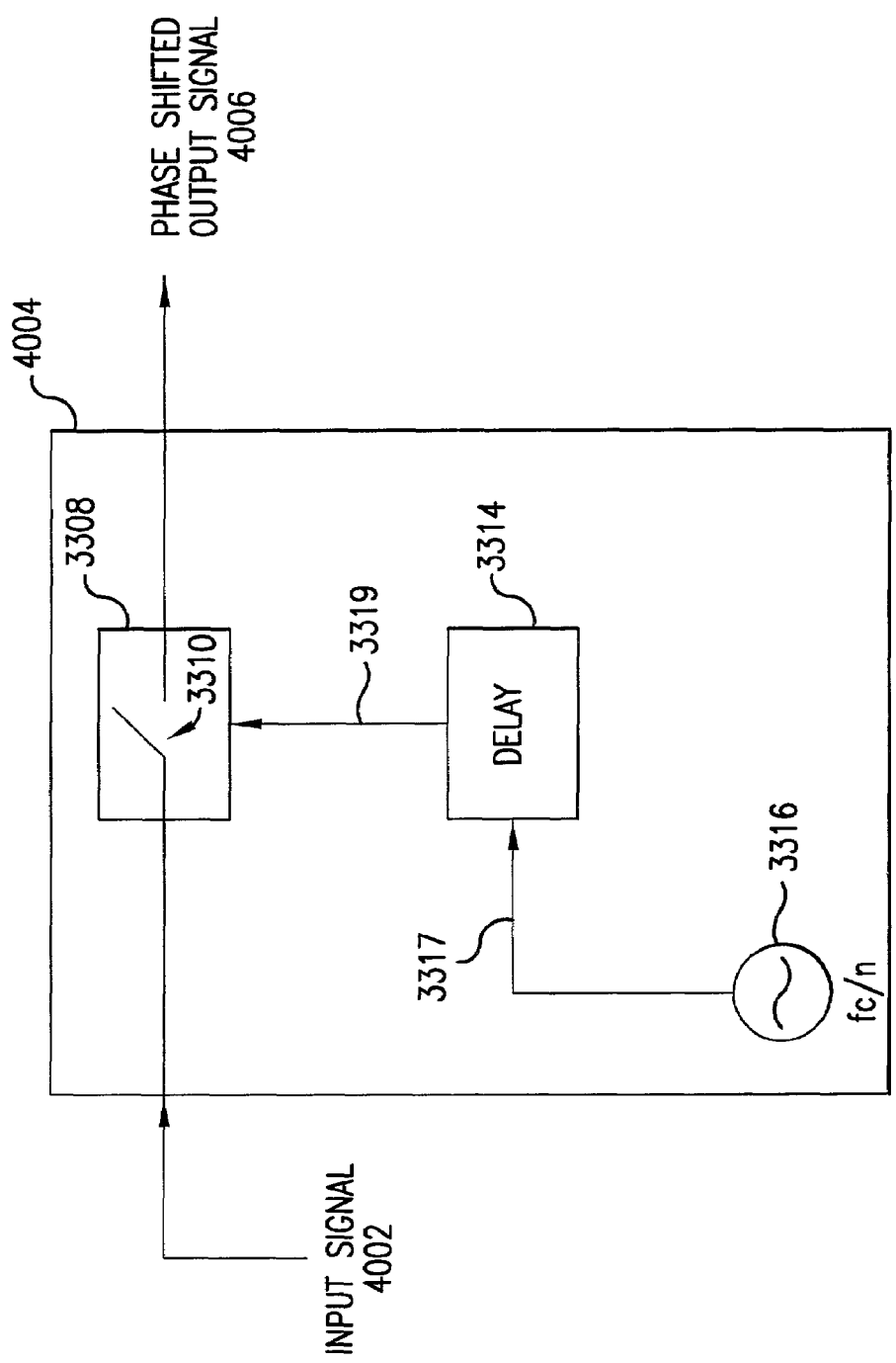

FIG. 40 illustrates an example frequency translator/phase-shifter 4004 that operates similar to the phase-shifter 3304 in FIG. 33A. However, in phase-shifter 4004, the delayed LO signal 3319 directly operates the UFT module 3308, and controls the sampling of the input signal 4002 using the controlled switch 3310. By changing the variable delay, the sampling point is changed in time, and the desired phase shift is implemented.

7.3 Antenna Applications of Universal Frequency Translation:

As described herein, the UFT module can be configured to perform frequency translation and phase shifting in an integrated manner. This makes the UFT module a very powerful and versatile antenna building block, as well as other applications. In particular, in embodiments and without limitation, the UFT module can be utilized in antenna array applications to frequency translate (including down-conversion and up-conversion) and phase shift signals for each individual antenna element (or groups of antenna elements) in a phased array antenna. Therefore, it is possible to simultaneously frequency translate a signal and steer the antenna beam of a phased array antenna utilizing UFT modules. Because UFT modules permit extremely fine control of RF phase, UFT modules can be used to finely control the beam of an antenna array. In the sections that follow, various antenna applications that utilize the UFT module are described. It should be understood that this phased array description is provided for illustrative purposes only, and therefore the invention is not limited to phased array applications.

7.3.1 Overview of Adaptive Beam Forming

It is known in the relevant art(s) that the output signals of two or more antennas or antenna elements can be combined. If the output signals of two or more antennas are combined such that the individual antenna output signals are added in-phase, the resulting output signal has a greater amplitude than either of the individual antenna output signals. This concept is illustrated in FIG. 41 and is at the heart of what is commonly know as adaptive beam forming or beam steering for multi-element phased array antennas.

Figure 41:
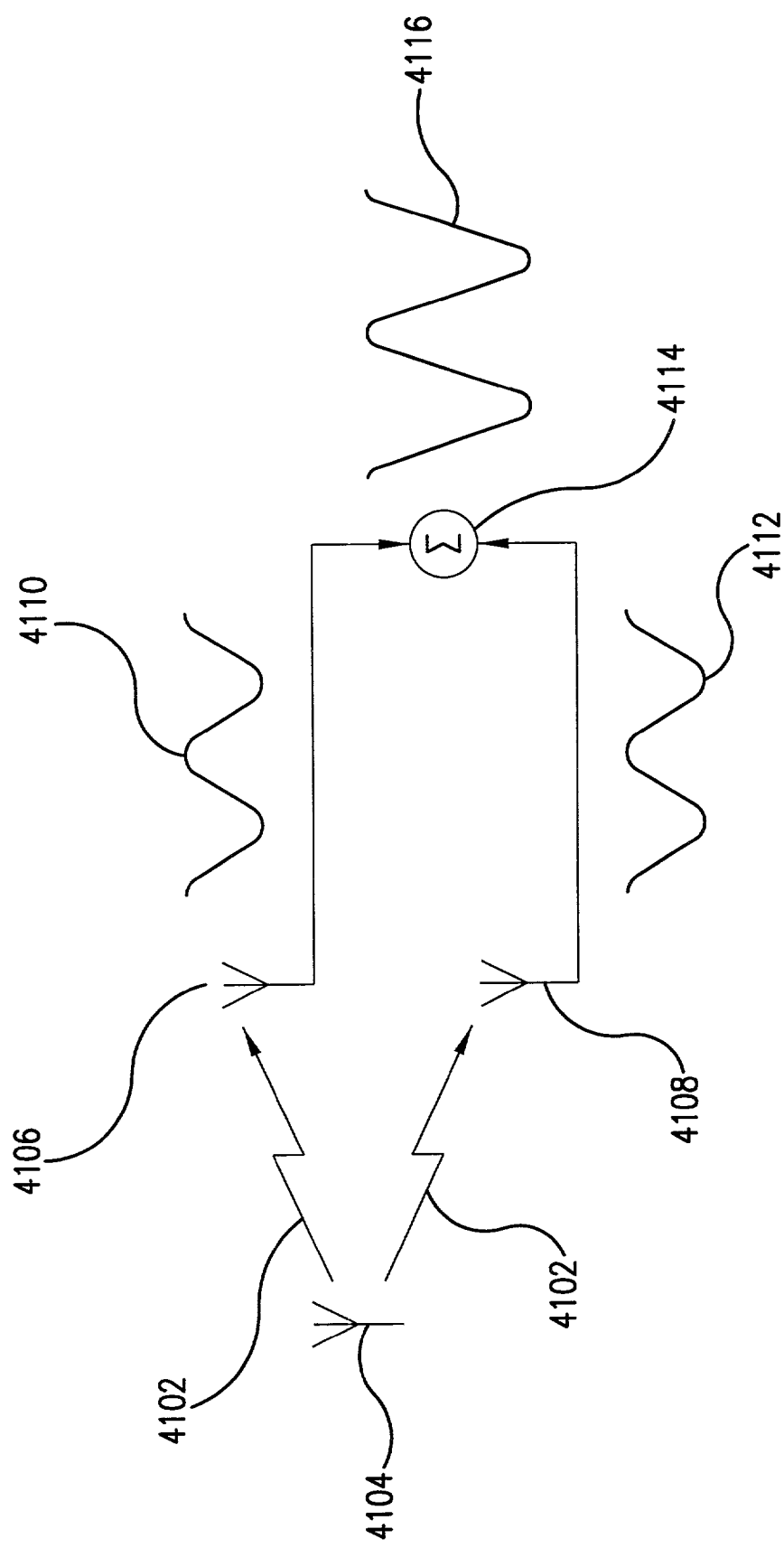
FIGS. 41-43 illustrate various phased array antennas.

As can be seen in FIG. 41, a signal 4102 is being transmitted by an antenna 4104 and received by an antenna 4106 and an antenna 4108. The distance between antenna 4104 and antenna 4106 is the same as the distance between antenna 4104 and antenna 4108. As a result, the output signals 4110 and 4112 of antennas 4106 and 4108, respectfully, are approximately in-phase. When the output signals 4110 and 4112 of antennas 4106 and 4108 are added together by summing unit 4114, the resulting output signal 4116 has a peak amplitude that is equal to the sum of the peak amplitudes of the output signals of the antennas 4106 and 4108.

Figure 42:
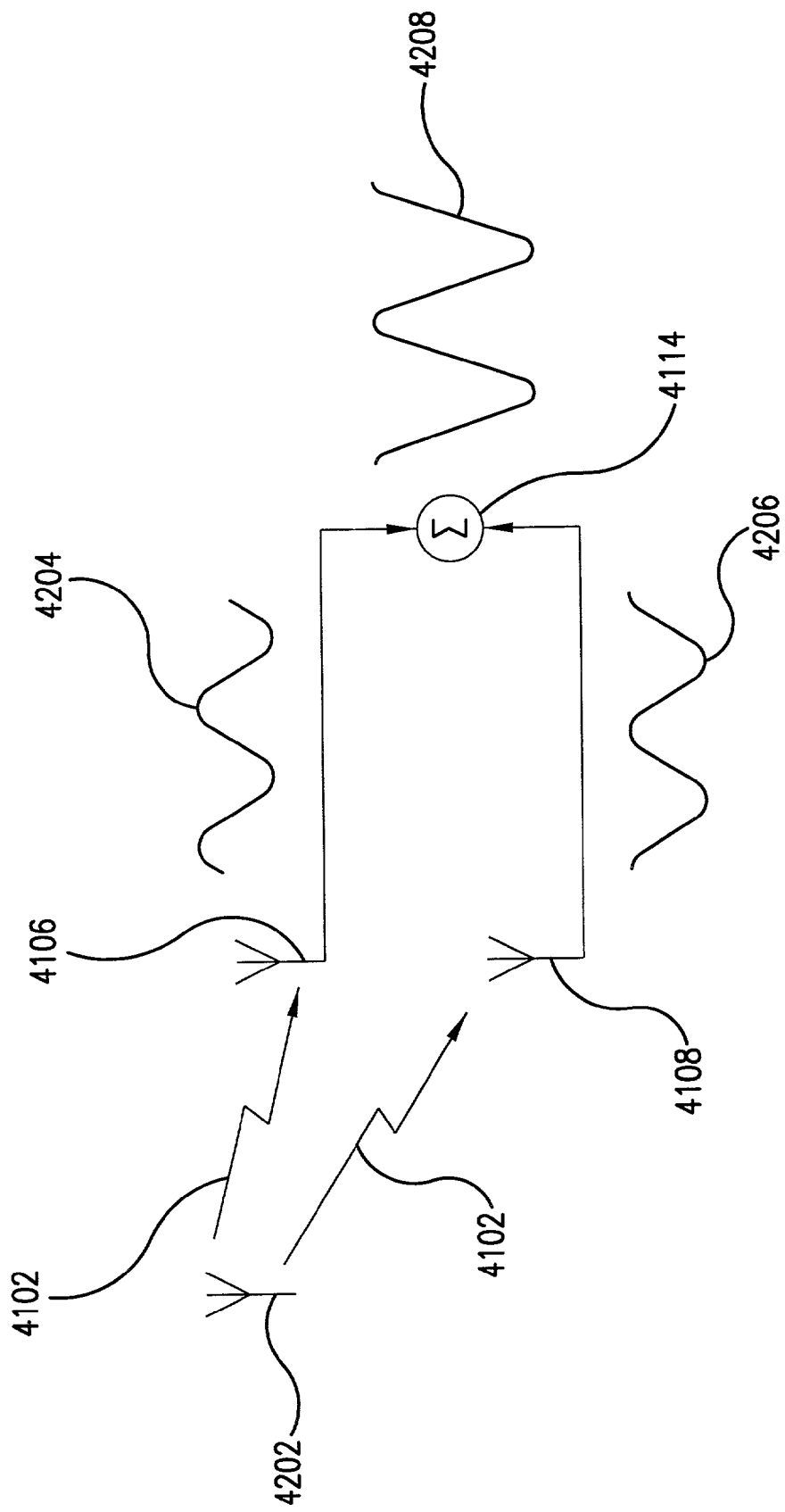

As can be seen in FIG. 42, when the distance between a transmitting antenna 4202 and antennas 4106 and 4108 are not the same, the output signals 4204 and 4206 of antennas 4106 and 4108 are not in-phase. This phase difference is due to the fact that the signal transmitted by antenna 4202 arrives earlier at antenna 4106 than it does at antenna 4108. As a result of the phase difference between the output signals 4204 and 4206, the summer output signal 4208 has a peak amplitude that is less than the sum of the peak amplitudes of the output signals of the antennas 4106 and 4108.

Figure 43:
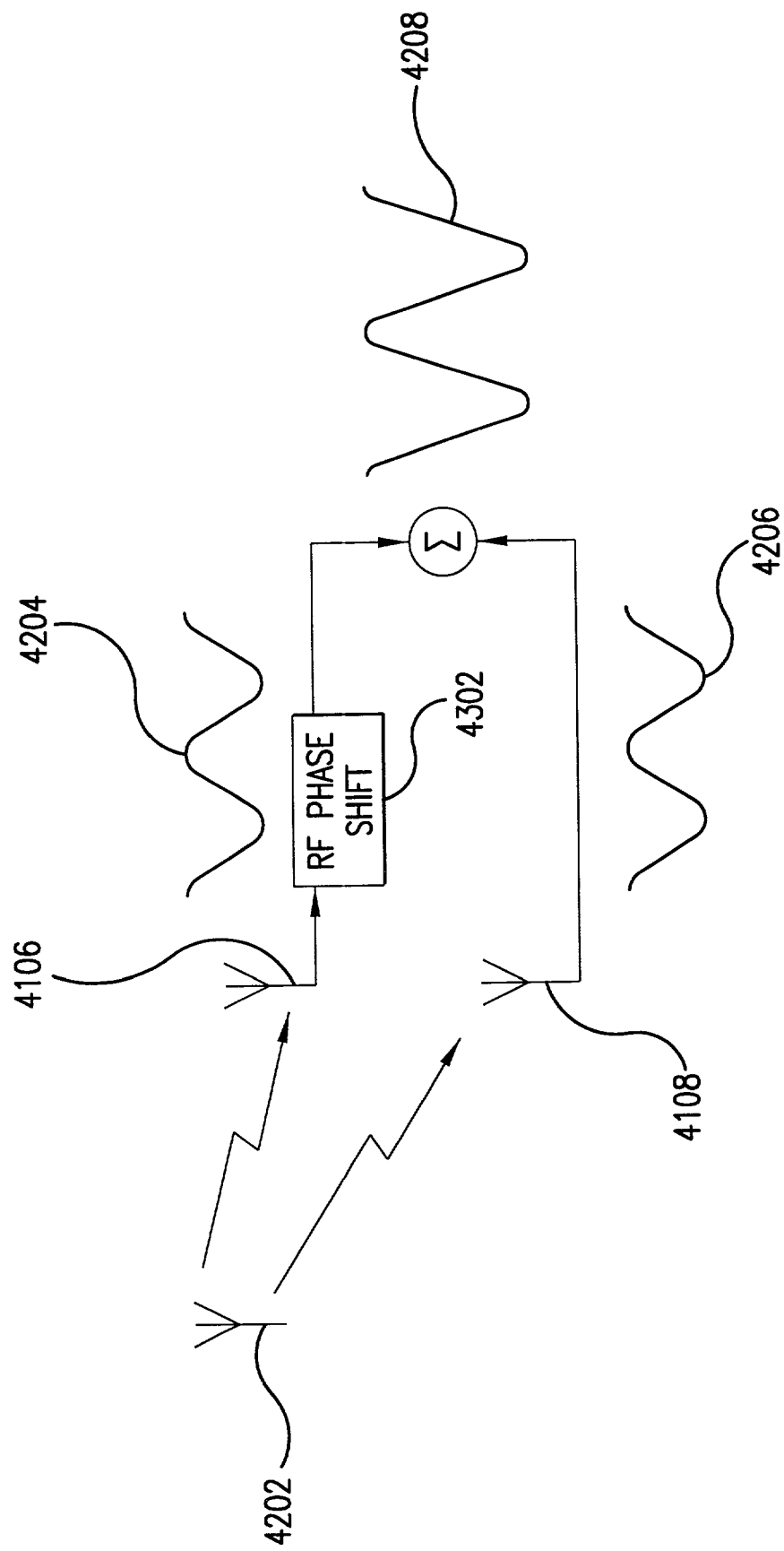

As illustrated in FIG. 43, an RF phase shift module 4302 can be incorporated into an output signal path of antenna 4106. This is done to compensate for the phase shift that is introduced by the path length difference between antenna 4202 and the antennas 4106 and 4108. RF phase shift module 4302 can be used to either advance or delay the phase of the output signal 4204 from antenna 4106 so that it will exactly match the phase of the output signal 4206 from antenna 4108. As discussed above, when the output signals of antennas 4106 and 4108 are exactly in phase, then the amplitude of the output signal 4208 of the summing unit 4114 is at a maximum.

Figure 44B:
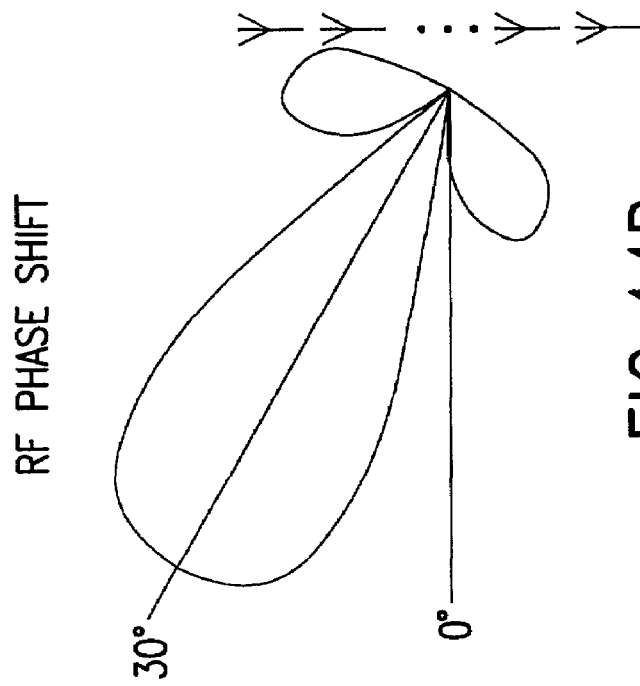
FIGS. 44A-B illustrate the effect of RF phase shifting on the beam of a phased array antenna.
Figure 44A:
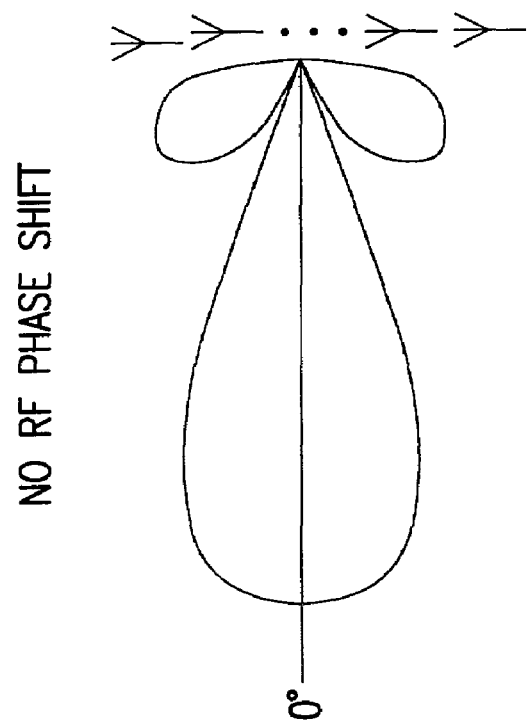

FIGS. 44A-44B further describe adaptive beam forming and beam steering for a phased array antenna. FIG. 44A shows the direction of the lobes of a particular phased array antenna without RF phase shifting. In FIG. 44A, the main lobe of the phased array antenna is at an angle α=0°. FIG. 44B shows how the direction of the lobes of the same phased array antenna can be steered by shifting the phases of the output signals of the individual antenna elements. In FIG. 44B, the main lobe of the phased array antenna has been steered to an angle α=30° by using RF phase shifting. Steering antenna beams by phase shifting the output signals from an antenna element is further described below in terms that will be familiar to persons skilled in the relevant art(s).

Phased array antennas, or antenna arrays, are composed of a multiplicity of antenna elements. Each element has its own radiation pattern. Preferably, the radiation pattern is the same whether the element is receiving or transmitting, which is known as reciprocity to those skilled in the relevant arts. Furthermore, this radiation pattern is known as the element factor. The antenna array, consisting of antenna elements, has a radiation pattern known as the space factor or array factor. The total radiation pattern of an antenna array is the product of the element factor and the array factor.

The element factor is the radiation pattern of an individual antenna element. Radiation patterns are typically computed in two planes known as the principal planes. Propagating electromagnetic fields are composed of electric fields and magnetic fields that are orthogonal to each other. Both the electric fields and the magnetic fields are orthogonal to the direction of propagation of the propagating electromagnetic fields. The plane containing the electric field vector and the direction of propagation is one of the principal planes. The other principal plane is the plane containing the magnetic field vector and the direction of propagation. The principal planes are generally referred to as the E-plane (electric plane) and the H-plane (magnetic plane).

A commonly used antenna element is the half-wave dipole. This antenna element is illustrated in FIG. 45A. As shown in FIG. 45A, the H-plane is represented by the y-z plane. The E-plane is represented by the x-z plane. The H-plane element factor is preferably constant. The E-plane factor for an infinitesimal dipole is:

$$EF(\theta) = \xi \cdot \cos^2(\theta) \qquad \text{Eq. 1}$$

Where $\xi$ is a constant.

Antenna elements are caused to radiate by exciting (or feeding) them with currents (I), having both a magnitude ($I_O$) and phase ($\beta$) where:

$$I = I_O \cdot e^{j \cdot \beta} \qquad \text{Eq. 2}$$

Figure 45B:
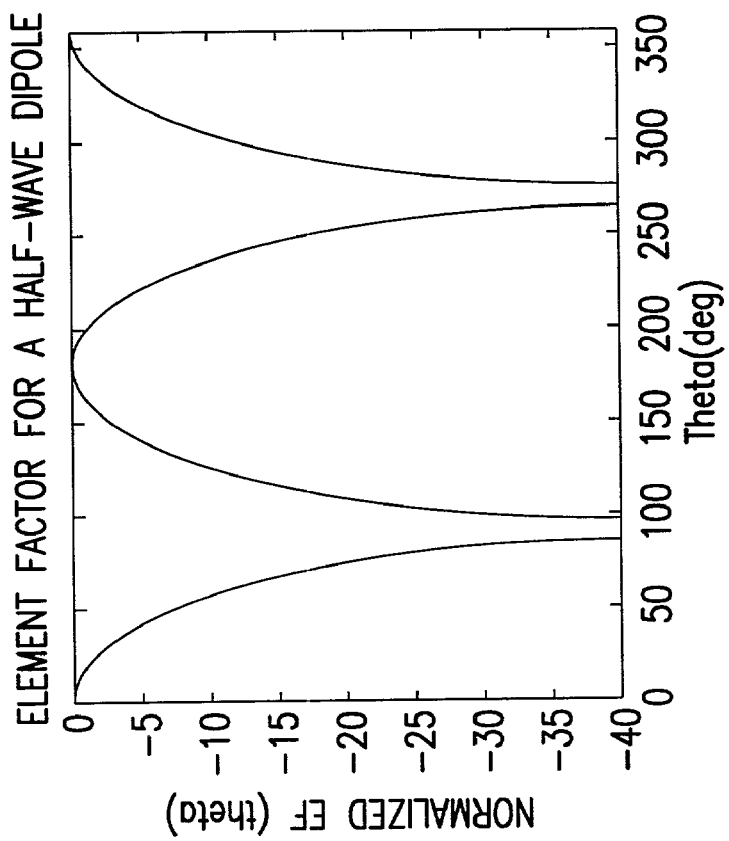
FIG. 45B illustrates an E-plane element factor for a half-wave dipole.
Figure 45A:
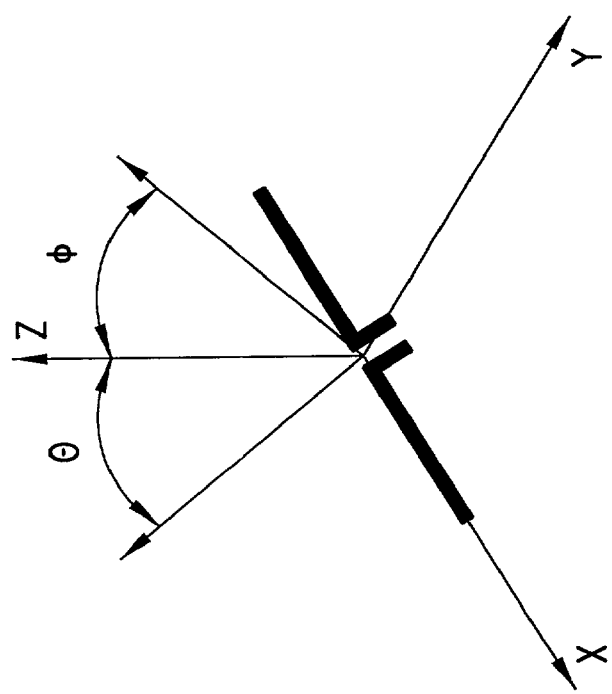
FIG. 45A illustrates a half-wave dipole.

FIG. 45B illustrates the E-plane factor for a half-wave dipole.

Each of the various types of antenna elements has its own unique radiation pattern. These radiation patterns are throughly described in the many references available on antenna theory and design and are known to persons skilled in the relevant art(s).

When multiple identical radiating elements are arranged to form an antenna array, then the array itself has a radiation factor called the array factor. For the purpose of determining the array factor, each of the antenna elements are considered to be point sources. Stated differently, preferably each antenna element is considered to be an infinitesimal, isotropic radiator.

Figure 46:
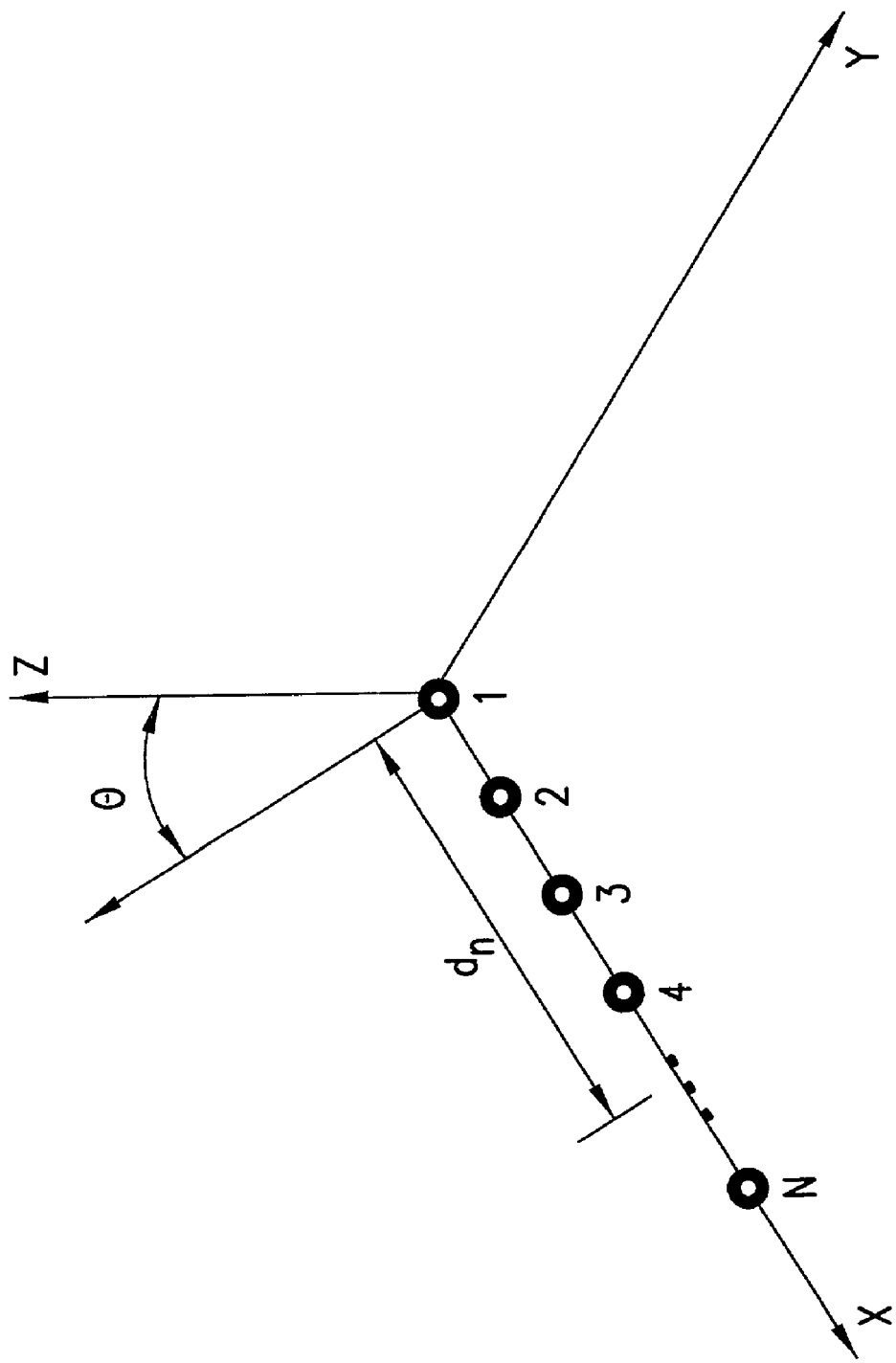
FIG. 46 illustrates an N-element linear antenna array.

FIG. 46 shows an N-element linear array of point sources. Each point source is evenly spaced along the x-axis. The array factor for this linear antenna array is:

$$AF(\theta) = \sum_{n=1}^{N} I_n \cdot e^{j \cdot k \cdot d_x \cdot \cos(\theta)} \qquad \text{Eq. 3}$$

where $d_n$ is the distance to the $n^{th}$ antenna element and $I_n$ n is the excitation current in the $n^{th}$ element.

$I_n$ is of the form:

$$I_n = a_n \cdot e^{j \cdot \beta_n} \qquad \text{Eq. 4}$$

where $a_n$ and $\beta_n$ are the magnitude and phase of the current in the $n^{th}$ antenna element, respectively.

The propagation constant (k) is:

$$k = \frac{2 \cdot \pi \cdot f}{c_0} \qquad \text{Eq. 5}$$

where f is the frequency and $c_0$ is the speed of light in free space.

The array factor in the y-z plane is constant.

Figure 47:
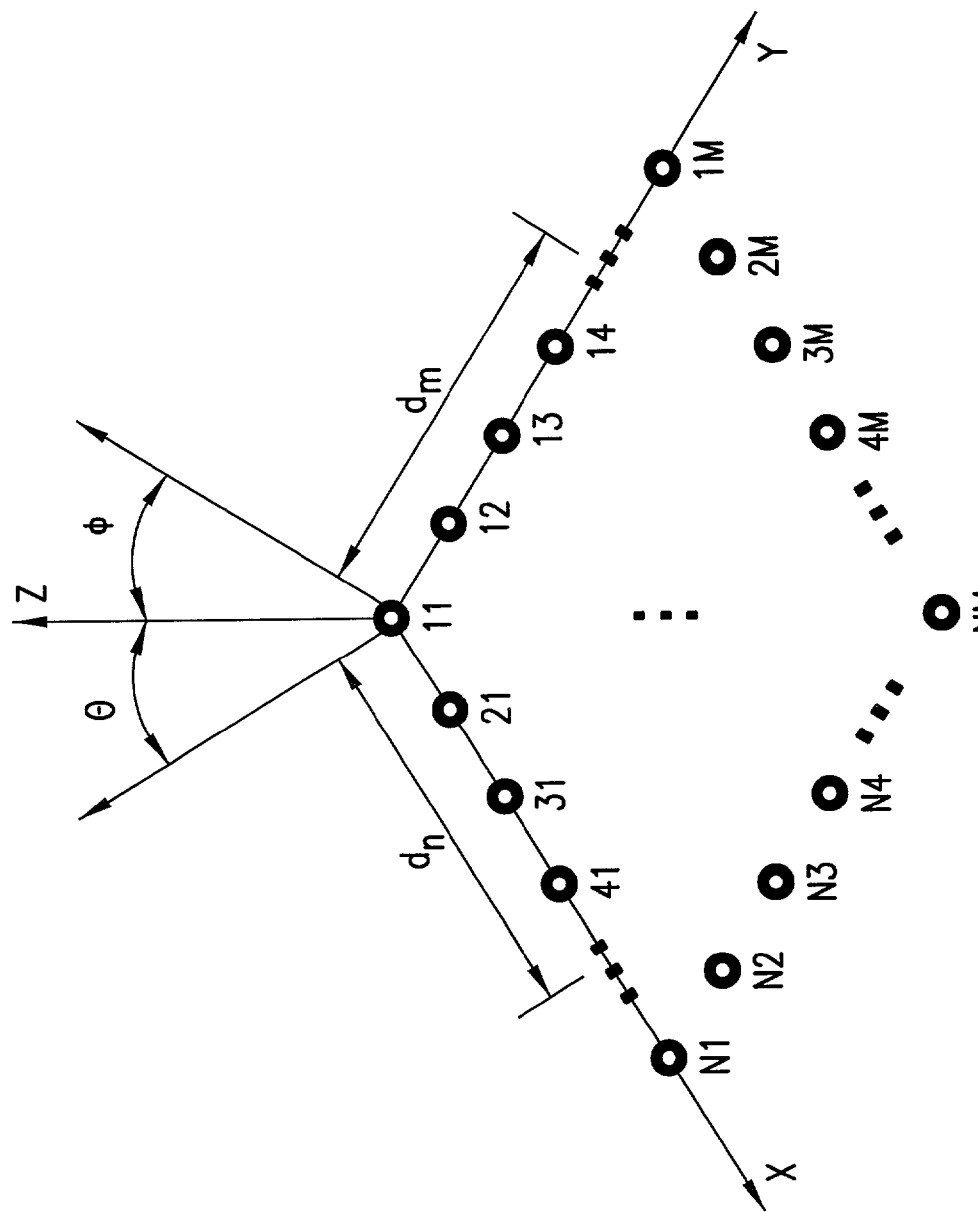
FIG. 47 illustrates an N×M array antenna.

FIG. 47 illustrates an N×M rectangular antenna array. The antenna array in FIG. 47 is shown as having N rows and M columns of antenna elements in the x-y plane. Each of the various types of antenna elements has its own unique radiation pattern. These radiation patterns are throughly described in the many references available on antenna theory and design and are known to persons skilled in the relevant art(s). In the case of the rectangular antenna array, the current exciting the $nm^{th}$ antenna element is:

$$i\ I_{nm} = a_{nm} \cdot e^{j \cdot \beta_{nm}} \qquad \text{Eq. 6}$$

In the case where $a_{nm}$ is constant and equal to $a_0$, and the currents exciting each element of a particular row {N1, N2, N3, ..., NM} are in phase, the array factor in the y-z plane, due to the rows of the array, can be computed by:

$$AF(\phi) = \sum_{m=1}^{M} N \cdot a_0 \cdot e^{j \cdot k \cdot d_m \cdot \cos(\phi)} \qquad \text{Eq. 7}$$

Similarly, the array factor in the x-z plane, due to the columns of the array, can be computed by:

$$AF(\theta) = \sum_{n=1}^{N} M \cdot a_0 \cdot e^{j \cdot k \cdot d_n \cdot \cos(\theta)} \qquad \text{Eq. 8}$$

The total array factor for the rectangular antenna array is given by the product of Eqs. 7 and 8. Thus the total array factor is:

$$AF(\theta, \phi) = \qquad \text{Eq. 9}$$

$$AF(\theta) \cdot AF(\phi) = \left(AF(\theta) = \sum_{n=1}^{N} M \cdot a_0 \cdot e^{j \cdot k \cdot d_n \cdot \cos(\theta)}\right)\left(AF(\phi) = \sum_{m=1}^{M} N \cdot a_0 \cdot e^{j \cdot k \cdot d_m \cdot \cos(\phi)}\right)$$

As stated above, the radiation pattern (RP) of an antenna array is the product of the element factor (EF) and the array factor (AF).

$$RP = EF \cdot AF \qquad \text{Eq. 10}$$

Figure 48:
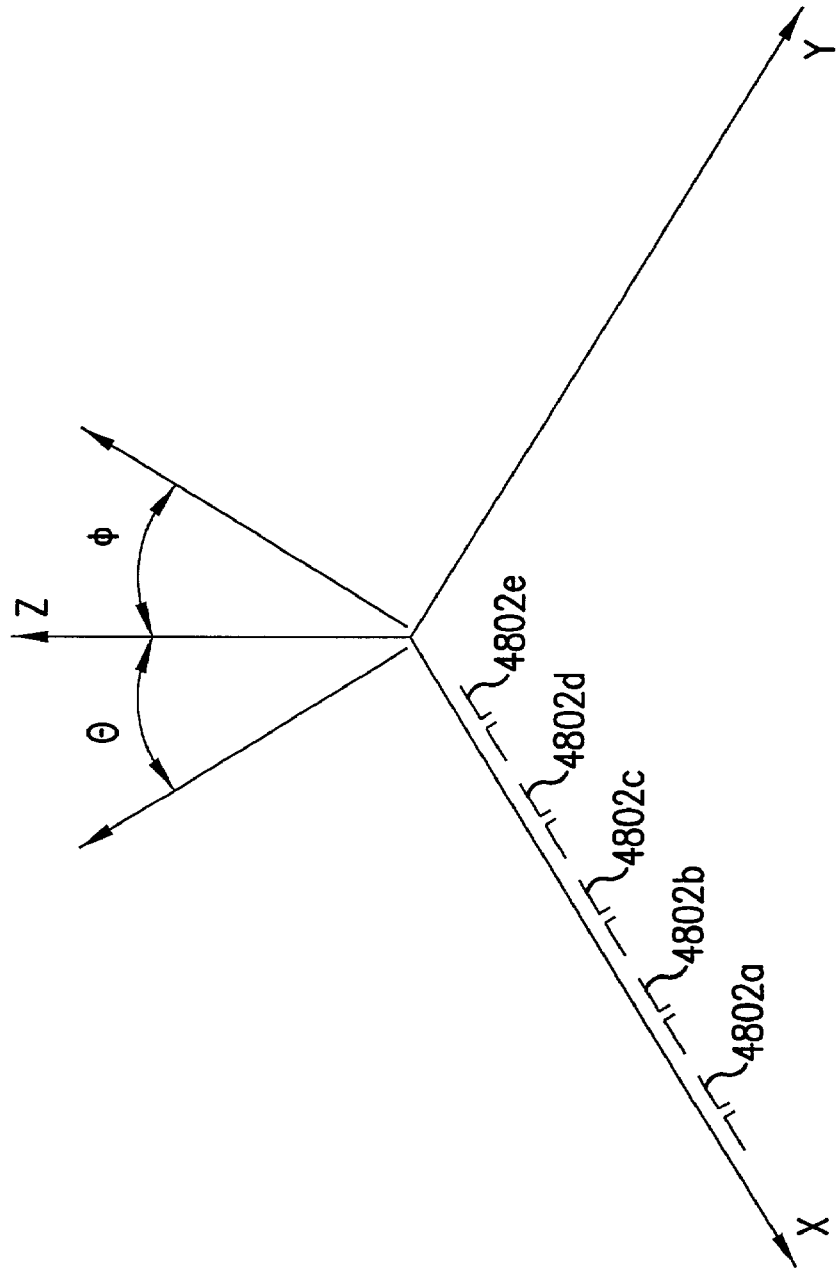
FIG. 48 illustrates a linear array of five half-wave dipoles.
Figure 49B:
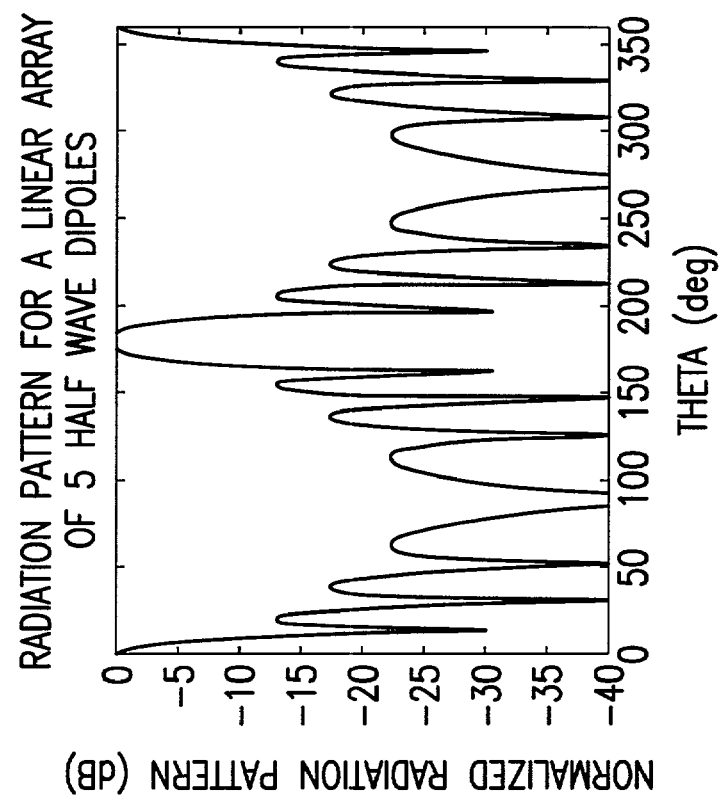
FIG. 49B illustrates the radiation pattern for a linear array.
Figure 49A:
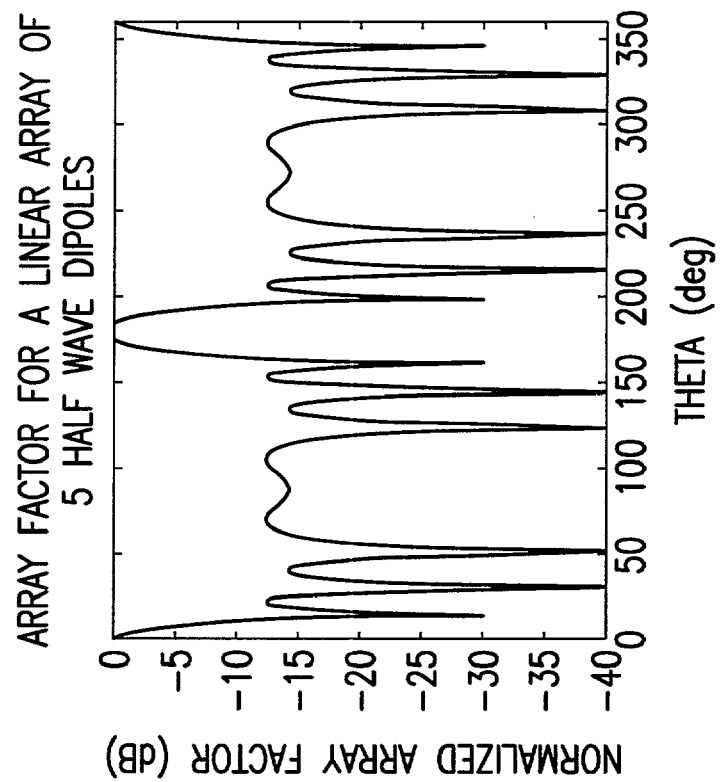
FIG. 49A illustrates the array factor for a linear array.

To illustrate this point, consider the linear array of five half-wave dipoles 4892a-e that are shown in FIG. 48. The element factor for a half-wave dipole is shown in FIG. 45B. The array factor is shown in FIG. 49A. Multiplying the element factor of FIG. 45B and the array factor of FIG. 49A produces the radiation pattern shown in FIG. 49B. Of particular importance is the effect of the element factor on the array factor. The nulls of the element factor cause the grating lobes in the array factor, which can be seen in FIG. 49B at 90 degrees and 270 degrees, to be significantly reduced. As should be apparent to persons skilled in the relevant art(s) given the discussion herein, it follows that the same principles apply to planar arrays.

In deriving Eq. 9, it was assumed that each antenna element was excited by an identical current. That is, it was assumed that the amplitudes and the phases of the currents feeding the antenna elements were identical. Such arrays are known in the relevant art as uniform arrays or arrays with uniform aperture distribution. It is also useful to intelligently alter both the amplitudes and the phases of the currents feeding the antenna elements, however, in order to achieve other array characteristics.

Figures 50A, 50B:
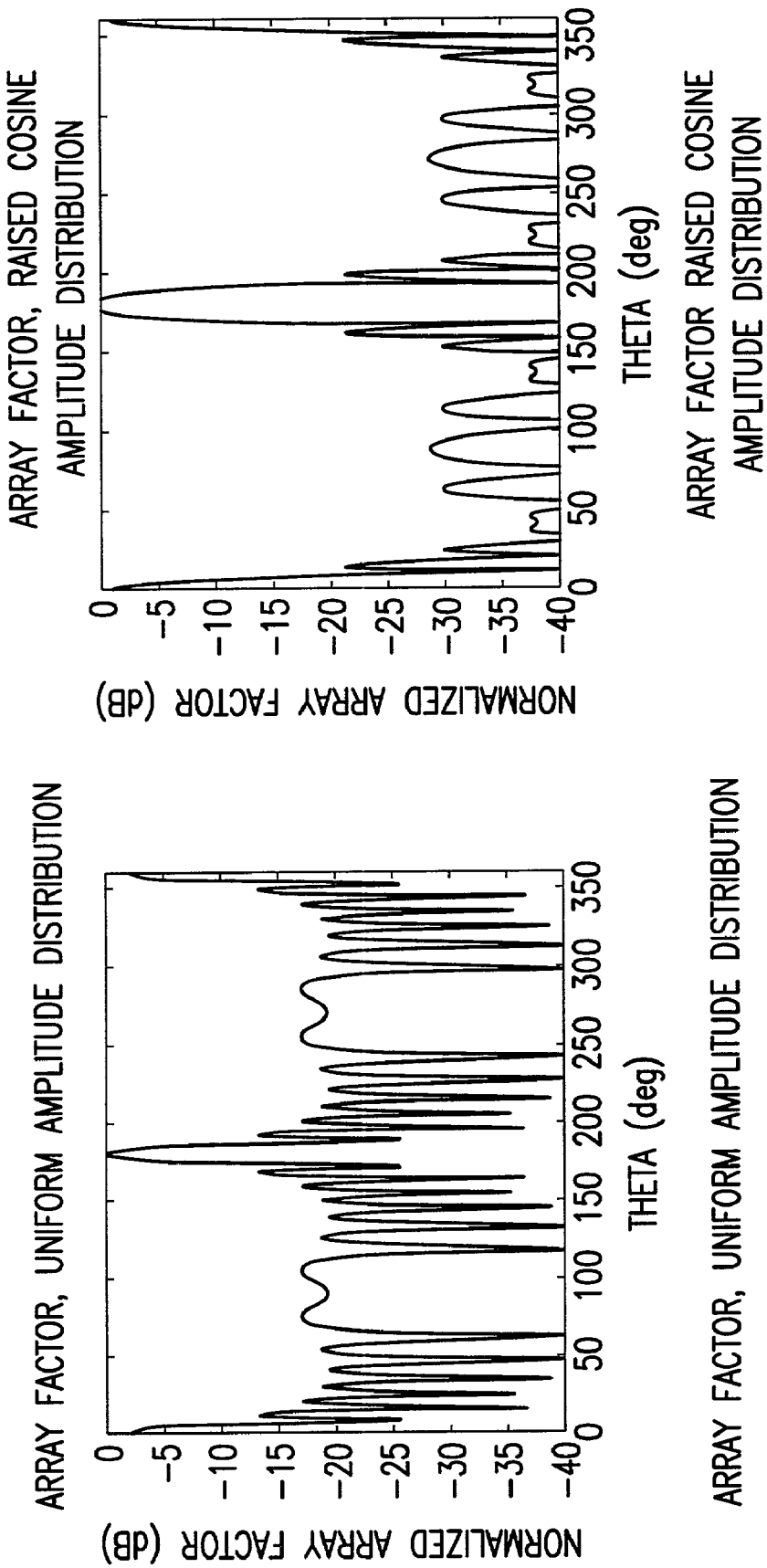
FIG. 50A illustrates an array factor for a uniform amplitude current distribution.
FIG. 50B illustrates an array factor for a raised cosine amplitude current distribution.

When the magnitudes of the currents feeding the antenna elements in the center of the array are greatest and the magnitudes of the currents feeding the elements gradually get smaller toward the edges of the array, the side lobes in the array factor are diminished. This point is illustrated by FIGS. 50A and 50B. FIG. 50A shows an array factor for the case of uniform current amplitude distribution. FIG. 50B shows an array factor where the current amplitude distribution approximates a raised cosine. There are also other types of non-uniform current distributions, for example Taylor, Chebyshev, etc., that each has a slightly different effect on the array factor. Illustrations of these array factors can be found in several of the many references on antenna theory and design.

Figure 51A:
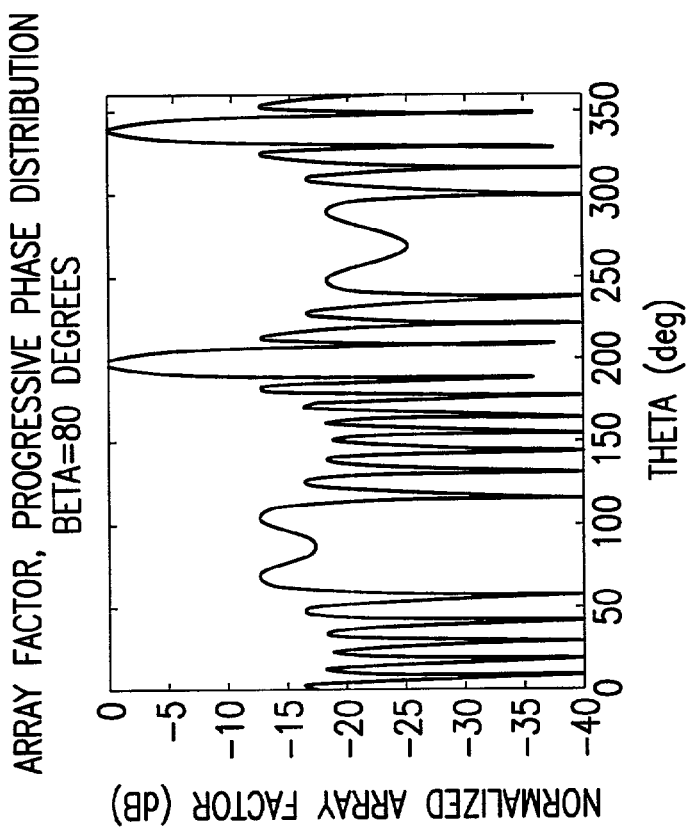
FIG. 51A illustrates an array factor for a uniform phase current distribution.
Figure 51B:
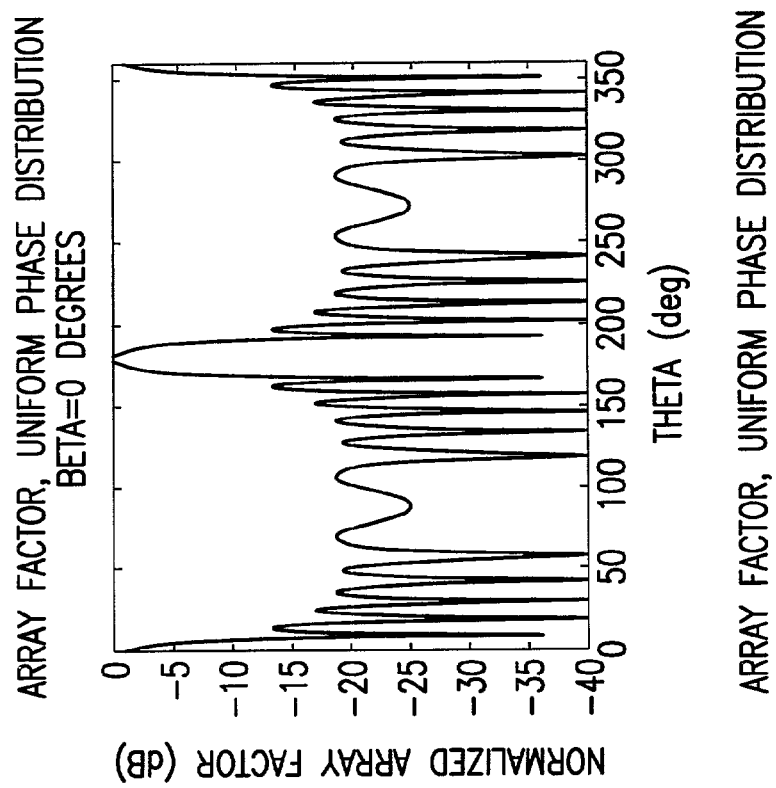
FIG. 51B illustrates an array factor for a progressive phase current distribution.

A different effect is produced in the array factor by a progressive current phase distribution ($\beta$), as illustrated by FIGS. 51A and 51B. A progressive current phase distribution ($\beta$) causes the main lobe or beam of the antenna array to steer or scan to an oblique angle. For example, reconsider the antenna array of FIG. 46, where N equals nine. If $\beta_n$ equals n$\beta$, then the main beam of the array will scan or steer to an angle $\alpha$ according to:

$$\alpha = a\sin\left(\frac{-\beta}{k \cdot d}\right) \qquad \text{Eq. 11}$$

where $\alpha$ is the scan angle relative to the main beam when $\beta$ equals zero, k is the propagation constant, and d is the spacing between the antenna elements. If d equals 0.65$\lambda$ and $\beta$ equals 80 degrees, $\alpha$ equals −20 degrees. This can be seen in FIGS. 51A and 51B, where the main beam has moved from 0 degrees (in FIG. 51A) to 340 degrees (in FIG. 51B). Also note that the second main beam at 180 degrees (in FIG. 51A) has moved to 200 degrees (in FIG. 51B), as would be expected. This concept can be applied to planar arrays as will be apparent to persons skilled in the relevant art(s) given the discussion herein.

7.3.2 UFT Module Transmission Phase Characteristics

As previously described, the UFT module is a very powerful and versatile antenna building block. The UFT module can be utilized in antenna array applications to frequency translate (including down-conversion and up-conversion) and phase shift signals for each individual antenna element in a phased array antenna. Using UFT modules, it is possible to simultaneously frequency translate an antenna signal and scan or steer the antenna beam of a phased array antenna. Furthermore, using UFT modules, it is possible to produce any desired phase or phase distribution in an antenna.

For efficient phased array antenna design, it is useful to quantify phase characteristics for example embodiments of UFT modules. The following discussion provides a method for quantifying the transmission phase characteristics of an example UFT module for a given LO signal amplitude.

Figure 52:
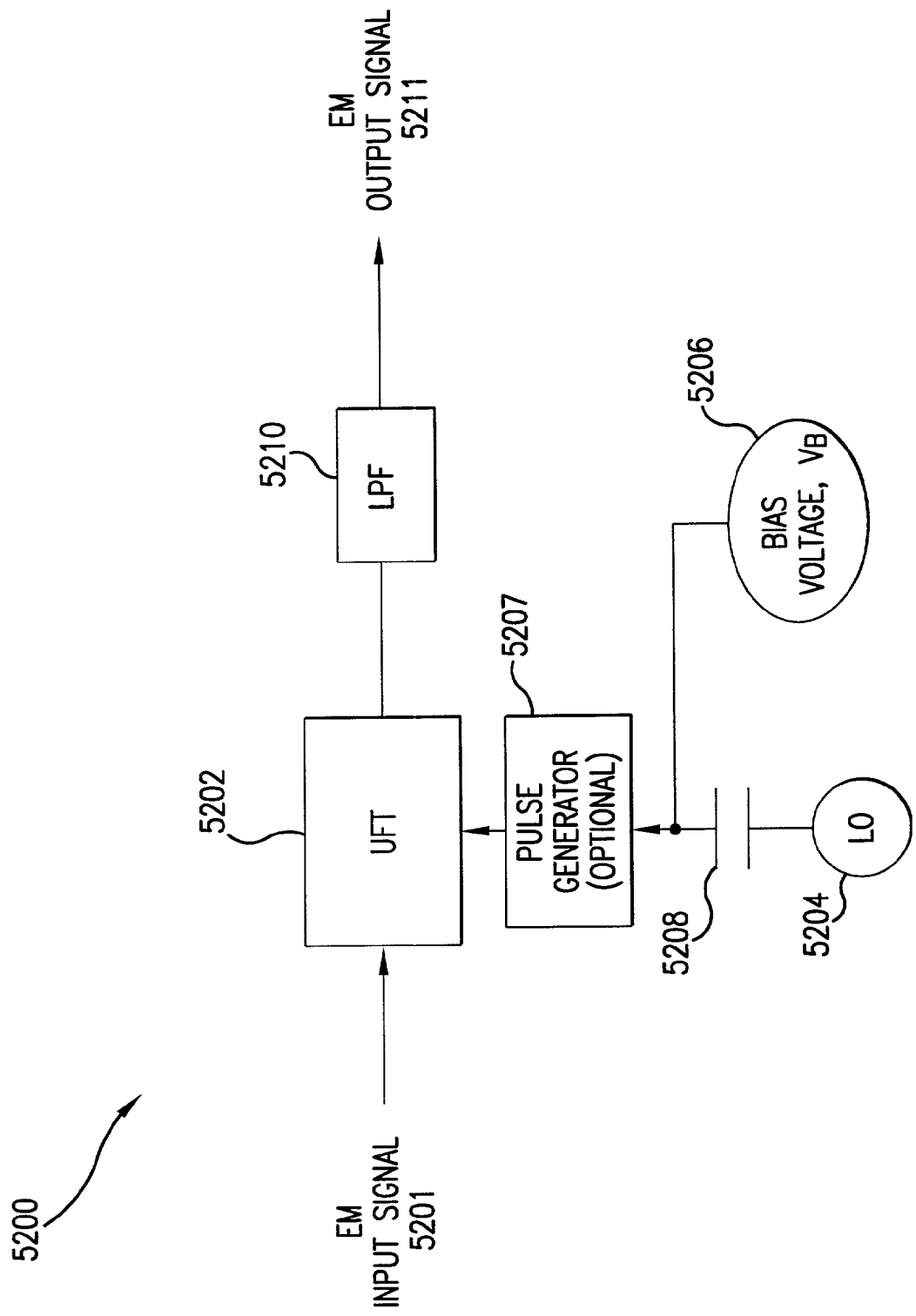
FIG. 52 illustrates an embodiment of a phase shifter according to the present invention.

FIG. 52 is a block diagram of a circuit 5200 that can be used to vary the transmission phase of a EM signal 5201. Circuit 5200 comprises a UFT module 5202, a local oscillator 5204, a optional pulse generator 5207, a bias voltage module 5206, and a low pass filter 5210. Local oscillator 5204 produces a periodic signal, and the amplitude of its output signal is adjustable using the bias voltage module 5206, as described herein in section 7.2.1. Preferably, the output of LO 5204 is sinusoidal, however other waveforms could be used, such as triangle waves, and square waves. A capacitor 5208 is used to isolate local oscillator 5204 from UFT module 5202 and bias voltage module 5206. The output of UFT module is passed through a low pass filter 5210. The supply voltage, Vcc (not shown), of UFT module 5202 is 5 volts DC.

Figure 53:
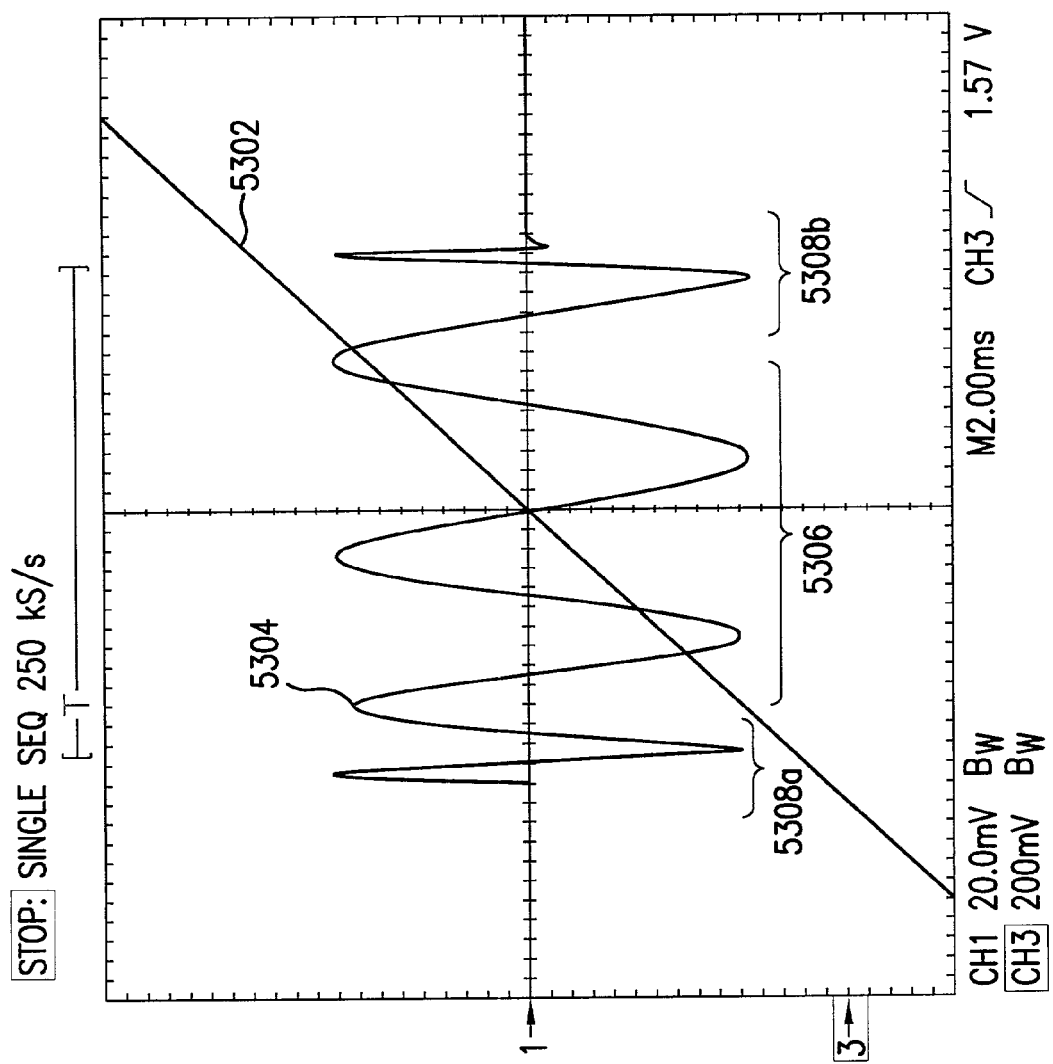
FIG. 53 illustrates the output of a phase shifting circuit according to an embodiment of the present invention.

FIG. 53 illustrates an experimental result of the phase at which the RF input signal 5201 (in FIG. 52) is sampled vs. the bias voltage 5206, where the bias voltage 5206 is steadily increased in a voltage ramp fashion from 0 volts to $V_{cc}$=5 volts. The phase shift (or phase at which the RF is sampled) is represented by a curve 5304, and the bias voltage is represented by a ramp 5302. The phase shift curve 5304 is sinusoidal, with a varying frequency over the life of the sine wave and over the ramp voltage 5302. These experimental results are for an RF input signal 5301 of 915 MHZ, and a LO signal 5204 of 91.5 MHZ, so that the LO signal 5203 is the 10th subharmonic of the RF input signal 5201. The amplitude of the LO signal 5204 is fixed at an amplitude of 1.415 volts peak-to-peak. The phase curve

5304 will be fit with an equation to quantify the phase shift for a given bias voltage, given the frequency and amplitudes that are mentioned herein.

A significant portion of the phase curve 5304 in FIG. 53 can be approximated by the following equation:

$$\phi(v_b) = \alpha \cdot \sin(2 \cdot \pi \cdot f(v_b) \cdot v_b + \phi_0) \qquad \text{Eq. 12}$$

where $$f(v_b) = \rho \cdot v_b + f_0 \qquad \text{Eq. 13}$$

is a linear function of the bias voltage 5302. More specifically, the equations 12 and 13 are a good approximation for the curve 5304 over a middle portion 5306 of the phase curve 5304. However, the approximation is becomes less accurate at the edges 5308a and 5308b of the phase curve 5304.

In order for equations 12 and 13 to be used in a particular application, it is necessary to determine a value for the coefficients $\rho$, $\phi_0$, and $f_0$. The term a is a function of the amplitude of the RF input signal 5301 and can be ignored for phase shift purposes. To determine a value for the other coefficients, it is useful to combine the above equations and rewrite them as:

$$\psi(v_b) = 2 \cdot \pi \cdot \rho \cdot v_b^2 + 2 \cdot \pi \cdot f_0 \cdot v_b + \phi_0 \qquad \text{Eq. 14}$$

where $\psi(v_b)$ is the argument of the sinusoid.

Equation 14 is a second order polynomial in the variable $V_b$, with three degrees of freedom, where $\psi(V_b)$ represents the RF phase when the local oscillator 5204 generates a sinusoidal output. Therefore, if $\psi(v_b)$ is constrained to three known values at three known bias voltages, then the coefficients $\rho$, $\phi_0$, and $f_0$ can be determined by solving the following system of equations:

$$\begin{bmatrix} \frac{\phi_0}{2 \cdot \pi} \\ f_0 \\ \rho \end{bmatrix} = \begin{bmatrix} 1 & v_{b1} & v_{b1}^2 \\ 1 & v_{b2} & v_{b2}^2 \\ 1 & v_{b3} & v_{b3}^2 \end{bmatrix}^{-1} \begin{bmatrix} \psi(v_{b1}) \\ \psi(v_{b2}) \\ \psi(v_{b3}) \end{bmatrix} \cdot \frac{1}{2 \cdot \pi} \qquad \text{Eq. 15}$$

The solution to the above equation is valid for the particular amplitude of the local oscillator signal that was used to generate the sinusoid 5304. Equation 15 can be solved three times for three different LO amplitudes to determine the coefficients $\rho$, $\phi_0$, and $f_0$. By solving Equation 15 three times for three different LO values and using a least squares method for the best data fit, the following three general equations are produced for determining the values of the coefficients $\rho$, $\phi_0$, and $f_0$, given an LO amplitude of $\beta_{LO}$:

$$\phi_0(\beta_{LO}) = 194.23 \cdot \ln(\beta_{LO}) - 138.33 \qquad \text{Eq. 16}$$

$$\pi_0(\beta_{LO}) - 3.591 \cdot \ln(\beta_{LO}) - 2.2856 \qquad \text{Eq. 17}$$

$$f_0(\beta_{LO}) = 67.142 \cdot e^{-1.5393 \cdot \beta_{LO}} \qquad \text{Eq. 18}$$

where $\beta_{LO}$ is the peak-to-peak voltage amplitude of local oscillator 5204 in FIG. 52. Equation 14 quantifies the transmission phase of UFT module 5202 in FIG. 52 for an RF input of 915 MHZ, and a LO of 91.5 MHZ. Thus, for $V_{cc} = 5$ volts, the transmission phase can be calculated using Equations 15-18 for a given amplitude of the local oscillator 5204 and a given bias voltage 5206.

Figure 54:
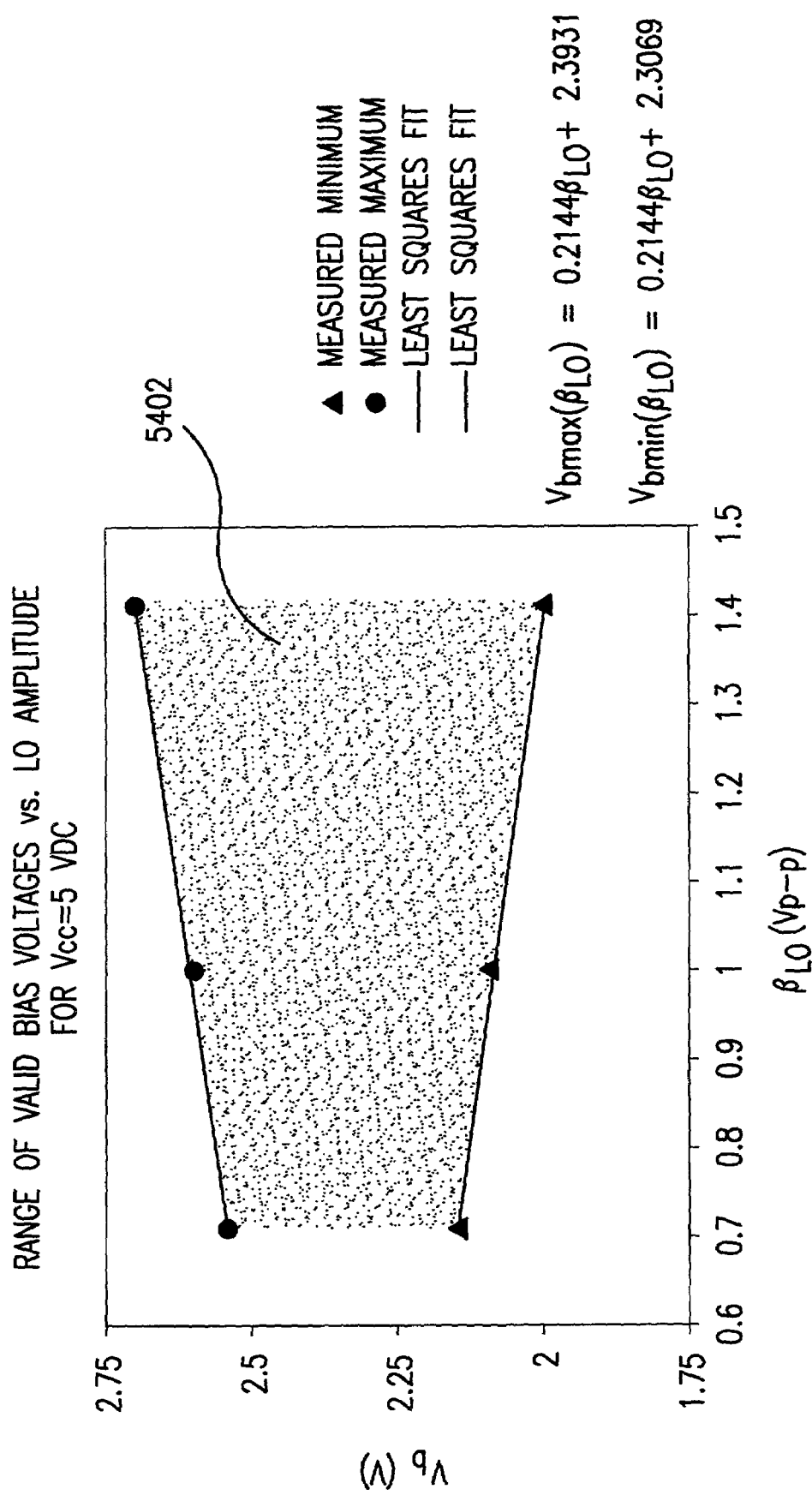
FIG. 54 illustrates the operating parameters of an embodiment of the present invention.

As can be seen in FIG. 53, UFT module 5202 will not produce an output if the bias voltage of bias voltage module 5206 is too low or too high. Thus, the above equations are accurate for a particular range of bias voltages. The accurate operating range of UFT module 5202 is shown in FIG. 54 as a function of the peak-to-peak amplitude of local oscillator 5204. In other words, FIG. 54 plots the available bias voltages for the bias voltage module 5206 vs. LO voltage amplitude for the LO 5204. The area 5402 represents the viable bias voltages for bias voltage module 5206.

7.3.3 Exemplary Two-Element Antenna Design Example using UFT Modules as Phase Shifters The following section describes how to design an example two-element phased array antenna using UFT modules and the equations derived in the previous section. The example is provided for illustration only, and is not meant to be limiting. Given the discussion that follows, it will become apparent to persons skilled in the relevant art(s) how to use the present invention to make phased array antennas having two or more elements. These other phased array embodiments that perform frequency translation and phase shifting are within the scope and spirit of the present invention.

Figure 55:
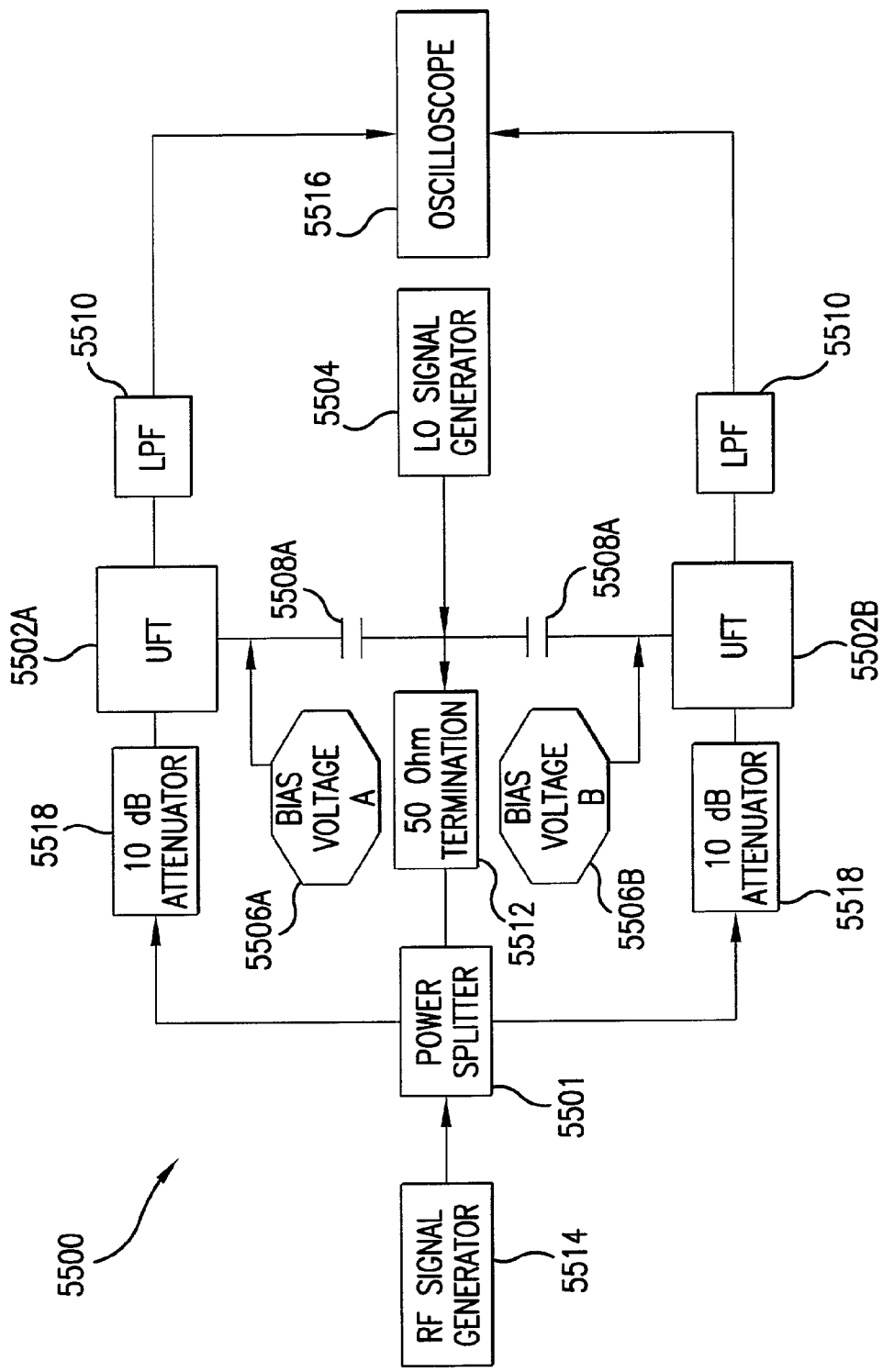
FIG. 55 illustrates an example circuit according to an embodiment of the present invention that can be used to the operating characteristics of the present invention.

FIG. 55 depicts an example circuit 5500 that can be used to illustrate how to make a phased array antenna using the present invention. Circuit 5500 comprises a power splitter 5501, two UFT modules 5502A and 5502B, a local oscillator 5504, and two bias voltage modules 5506A and 5506B. The supply voltage, Vcc (not shown), of UFT modules 5502 is 5 volts DC. Two capacitors 5508 are used to isolate local oscillator 5504 from UFT modules 5502 and bias voltage modules 5206. The output of local oscillator 5504 has a peak-to-peak voltage amplitude of 1.415 $V_{p-p}$, and is connected to a 50 ohm termination 5512. The output of each UFT module 5502 is passed through low pass filters 5510. An RF signal generator 5514 is used to simulate an RF input signal, and the output of UFT modules 5502 are feed to an oscilloscope 5516. Two 10 dB attenuator modules 5518 are used to minimize effects of impedance mismatches, if any, between the power splitter 5501 and the UFT modules 5502.

The desired specifications for the circuit 5500 are as follows:

$V_{cc} = 5$ volts

Sinusoidal LO amplitude = 1.415 $V_{p-p}$ $F_{RF} = 915$ MHZ $F_{IF} = 91.5455$ MHZ Desired Phase Shift = 38 degrees = 0.6632 radians The output phases of the two UFT modules 5502 can be independently set by their respective bias voltage modules 5506. Adjusting the bias voltage of bias voltage module 5506A will either advance or retard the output phase of UFT module 5502A, relative to the output phase of the bias voltage module 5502B. Similarly, adjusting the bias voltage of bias voltage module 5506B will either advance or retard the output phase of UFT module 5502B, relative to output phase of UFT module 5502A.

For this example two-element antenna design, it is desired that the phase difference between the output signals of UFT modules 5502 be 38 degrees or 0.6632 radians. To determine what bias voltage values will produce this desired result, it is necessary to determine the values of $\rho$, $\phi_0$, and $f_0$ using Equations 16-18, given $\beta_{LO} = 1.415$ volts. Using Equations. 16-18, the coefficients $\rho$, $\phi_0$, and $f_0$ are calculated to be the following:

$$\phi_0(\beta_{LO}) = -70.907,$$

$$\rho(\beta_{LO}) = -1.039, \text{ and}$$

$$f_0(\beta_{LO}) = 7.604.$$

Inserting these coefficients back into equation 14, results in:

$$\psi(v_b)=2\cdot\pi\cdot(-1.039)\cdot v_b{}^2+2\cdot\pi\cdot(7.604)\cdot V_b-70.907 \quad \text{Eq. 19}$$

A bias voltage must be chosen that will correspond to a reference phase. For purposes of this example, a reference bias voltage of $V_{cc}/2$ (or 2.5 volts DC) is chosen. The reference phase is determined from equation 19 as follows:

$$\psi(v_b=2.5)=2\cdot\pi\cdot(-1.039)\cdot v_b{}^2+2\cdot\pi\cdot(7.604)\cdot V_b-70.907=7.735$$

radians

To determine what the voltage value of bias voltage module 5506A should be to produce a 38 degree shift from the reference phase, it is necessary to add 0.6632 radians (or 38 degrees) to the reference phase of 7.735 radians, resulting in a desired phase of 8.398 radians. Next, Equation 19 is solved for a $v_b$ that corresponds to 8.398 radians, which results in roots of 2.545 volts and 4.774 volts. Although Eq. 19 has two possible solutions, it can be determined by examining FIG. 54 that 4.774 volts is outside the valid operating range of the UFT modules. Thus, 2.545 volts is the preferable solution for Eq. 19 in the example currently being considered. Setting the output of bias voltage module 5504A to 2.545 volts should produce a 38 degree phase shift in the output of UFT module 5502A with respect to the reference phase of UFT module 5502B.

Figure 56:
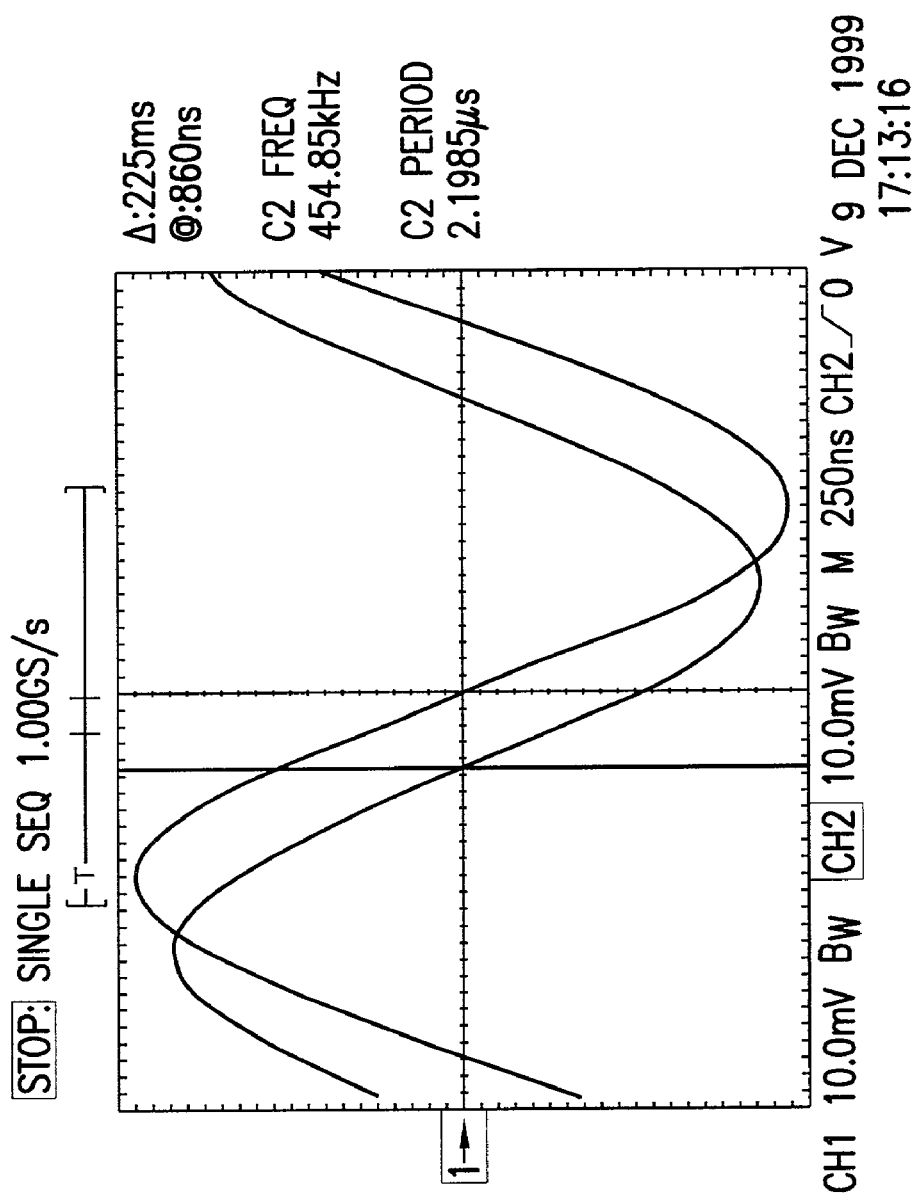
FIG. 56 illustrates the output of a circuit according to an embodiment of the present invention.

FIG. 56 illustrates actual measured phase shift for the circuit 5500 using a voltage of 2.545 volts for the bias voltage 5506A, and a voltage of 2.5 volts for the bias voltage 5506B. As shown, the output of UFT module 5502A leads the output of UFT module 5502B by about 225 nanoseconds, and the period of the signals is about 2.1985 microseconds. The actual difference in relative phase, therefore, is about 36.84 degrees, which is within 1.2 degrees of the desired value. Therefore, the calculated phase shift is very close to the actual measured phase shift of example circuit 5500.

If the circuit 5500 were used to construct an actual two-element phased array antenna, with the antenna elements spaced about 0.64λ apart, then according to Eq. 11, the main beam of the antenna array would scan to −9.34 degrees.

The above antenna design was done for a specific set of design conditions, and was illustrated for example purposes only. The present invention is not limited to the design example that was presented. Other antenna designs could be realized as will be apparent to persons skilled in the relevant art(s) given the discussion herein. These other antenna designs are within the scope and spirit of the present invention.

Figure 57A:
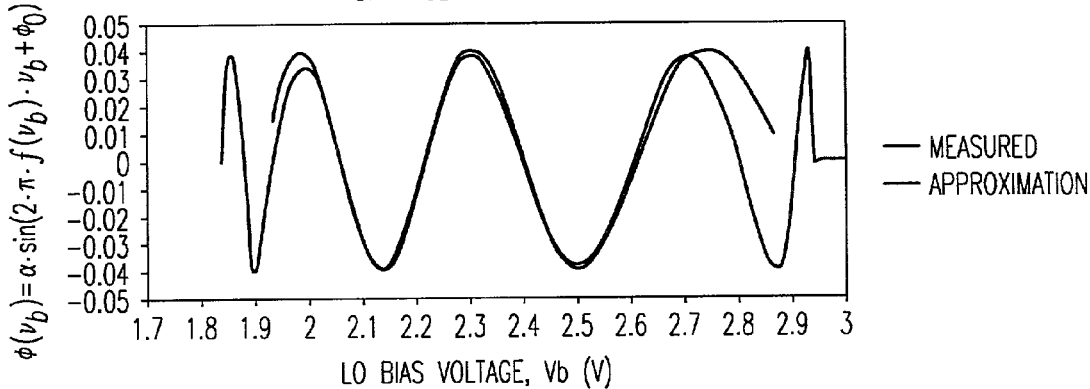
FIGS. 57A-C and 58A-C illustrate the curve fitting used to derive the equations that describe phase characterization of a UFT module according to embodiments of the present invention.
Figure 57B:
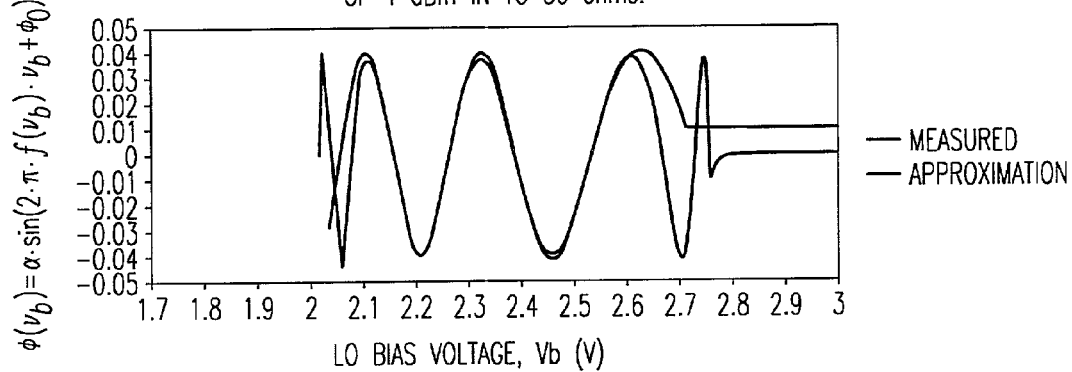
Figure 57C:
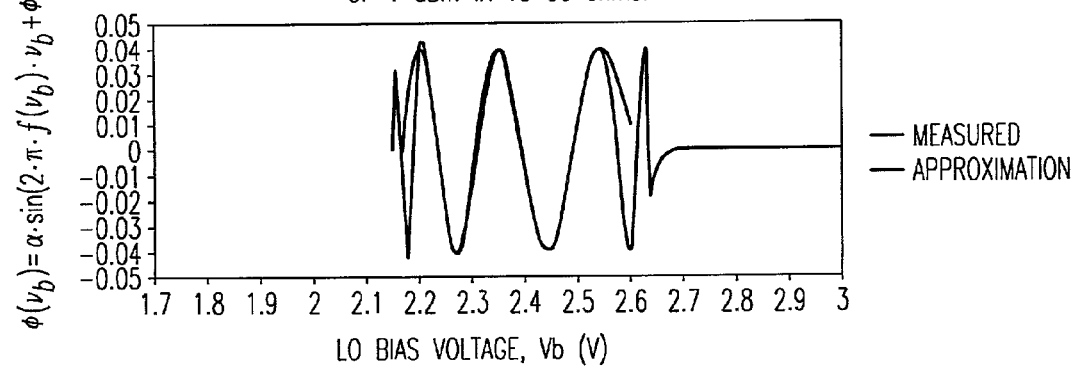
Figure 58A:
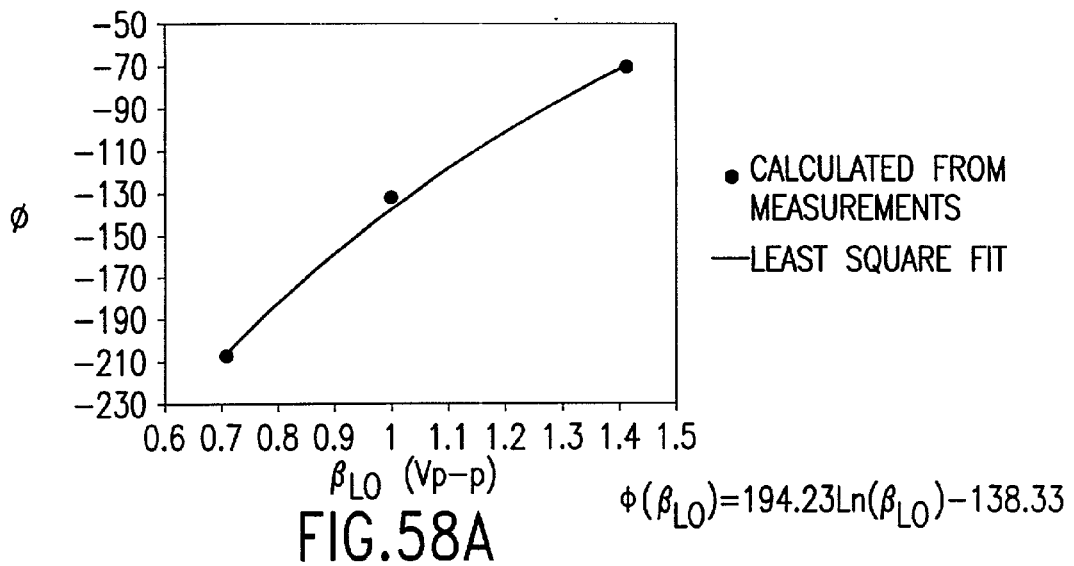
Figure 58B:
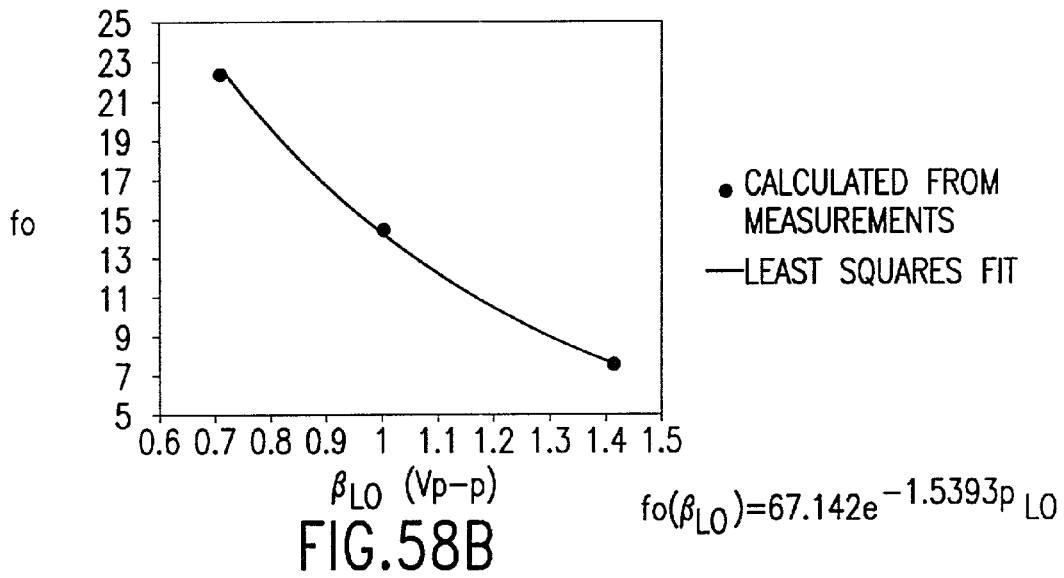
Figure 58C:
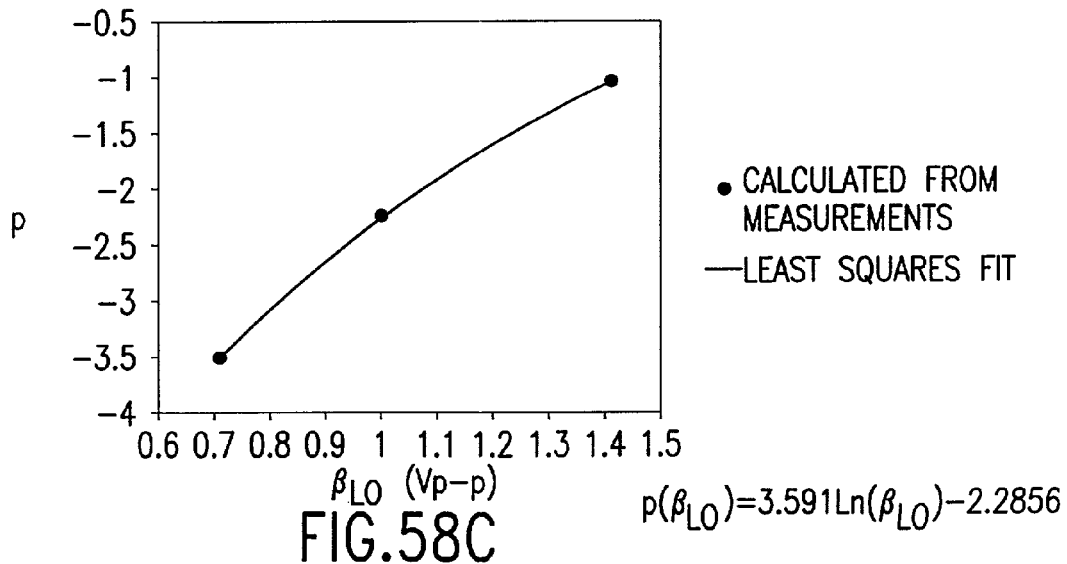

Furthermore, the design method described above and herein will work even if a different harmonic is used to down-convert the input RF signal, and even if a different power supply voltage is used. Adapting the above example to a different set of design conditions involves calculating the appropriate values for the coefficients π, $\phi_0$, and $f_0$, as taught herein. Thus, the method and equations described herein teach persons skilled in the relevant art(s) how to design and implement many different embodiments of the present invention. FIGS. 57A-C illustrate various measured and approximated phase functions (based on equations 14-18) for various peak-to-peak LO amplitudes. As discussed above, the approximation is best in the middle of the phase curves, but falls off at the edges. FIGS. 58A-C illustrate the curve fitting used to determine the variables ρ, $\phi_0$, and $f_0$, vs. LO signal amplitude for the phase functions in FIGS. 57A-C.

Furthermore, the design methods and techniques described herein are not the only way to design phased antennas using UFT-based phase shifters. There are other design methods and techniques that will be apparent to those skilled in the arts based on the discussions herein. These other design methods and techniques are within the scope of the present invention.

Furthermore, the design method (or parts thereof) described herein can be programmed in a processor, or digital computer. In other words, the equations described above could be programmed in a digital computer. Therefore, given an input that represents a desired antenna beam angle, a computer performs the calculations in equations 14-18 to determine the bias voltage that will produce the element phase shift necessary to steer the antenna beam to the desired angle. As such, referring back to circuit 5200 (FIG. 52), the bias voltage 5206 can be controlled by a controller/processor 5212, as shown in FIG. 119.

Figure 59:
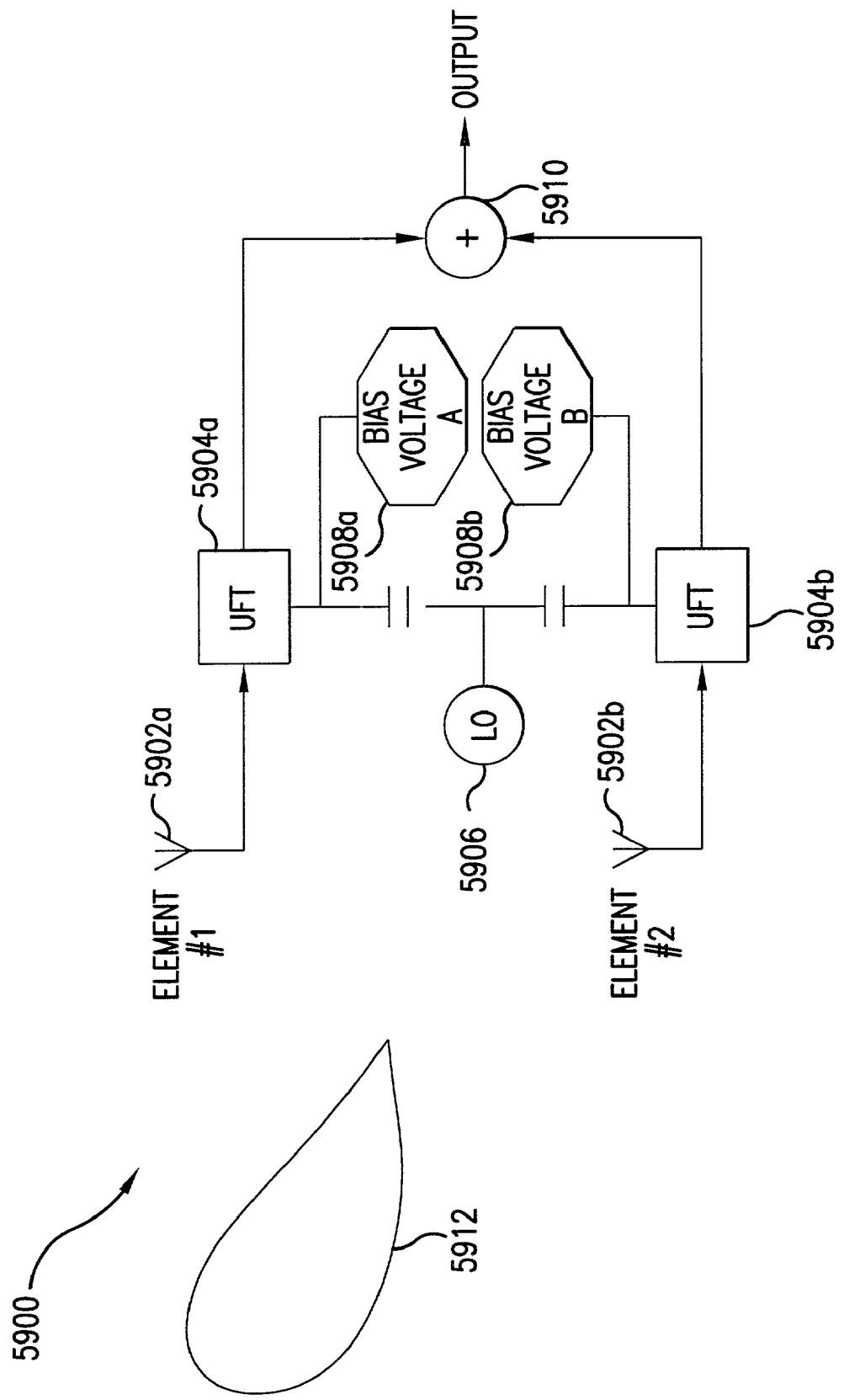
FIG. 59 illustrates a phased array antenna embodiment of the present invention.

FIG. 59 illustrates an example two-element receive antenna array 5900 having a corresponding main beam 5912 according to the present invention. Antenna array 5900 comprises two antenna elements 5902, UFT modules 5904, a local oscillator module 5906, two bias voltage modules 5908, and a summing module 5910. Based on the discussion above, the UFT modules 5904 can be utilized to down-convert the signals received by the antennas 5902. Additionally and based on the discussions above, the UFT modules 5904 can be used to introduce a relative phase-shift in the signals received by the antennas 5902, where the relative phase shift is controlled by the relative bias voltage that is produced by the bias voltage modules 5908. As such, a change in the relative bias voltage that controls the UFT modules 5904 causes the antenna main beam 5912 to steer off boresight to a desired angle.

7.3.4 Phased Array Antenna Embodiments including 2-D Antenna Arrays

As described herein, UFT modules can be utilized in antenna array applications to frequency translate (including down-conversion and up-conversion) and phase shift signals for each individual antenna element in a phased array antenna. When the phase of the excitation current of each of the antenna elements in an antenna array is intelligently altered, the main beam of the antenna array is electronically steered.

Figure 60:
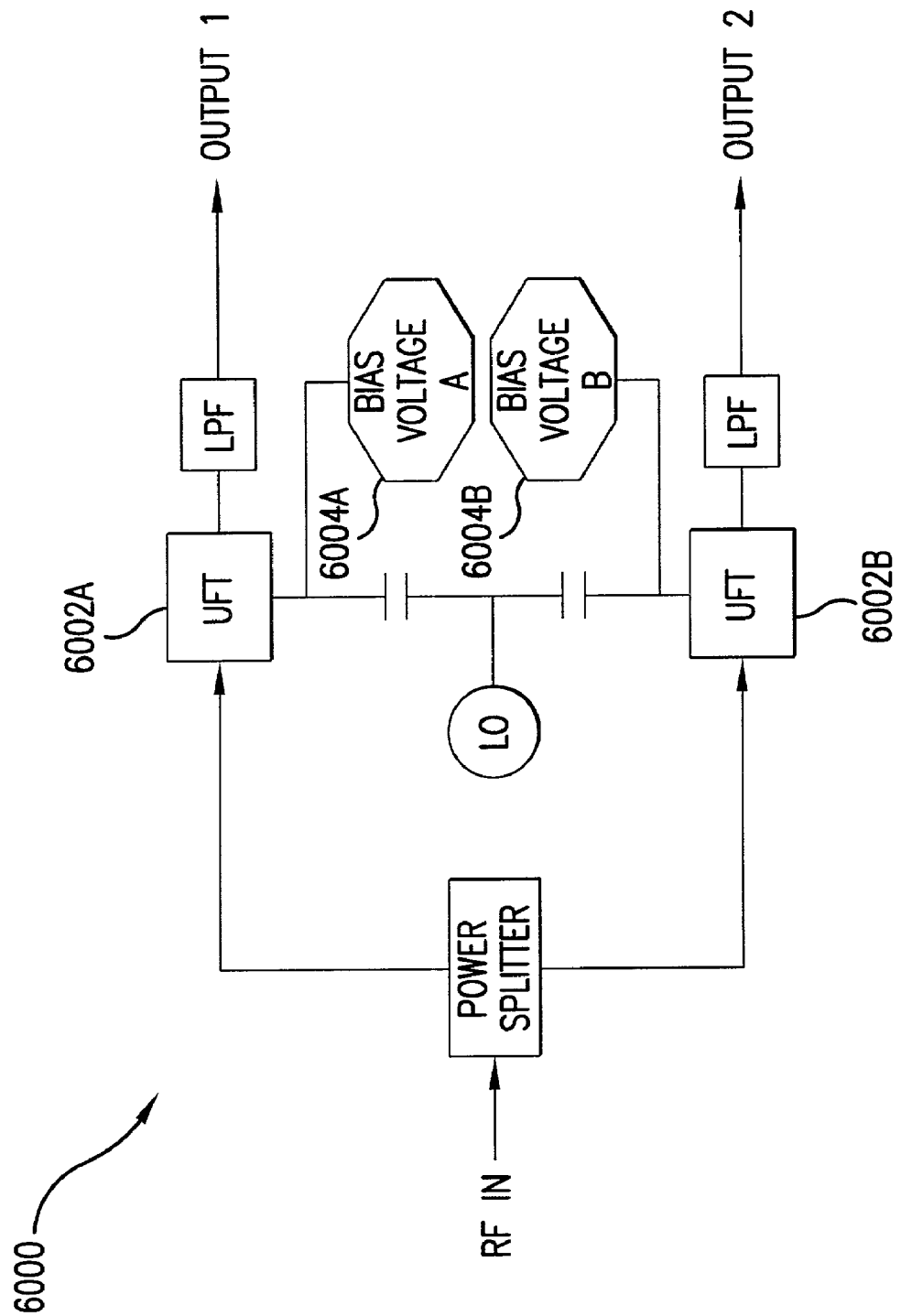
FIG. 60 illustrates an antenna circuit according to an embodiment of the present invention.
Figure 61A:
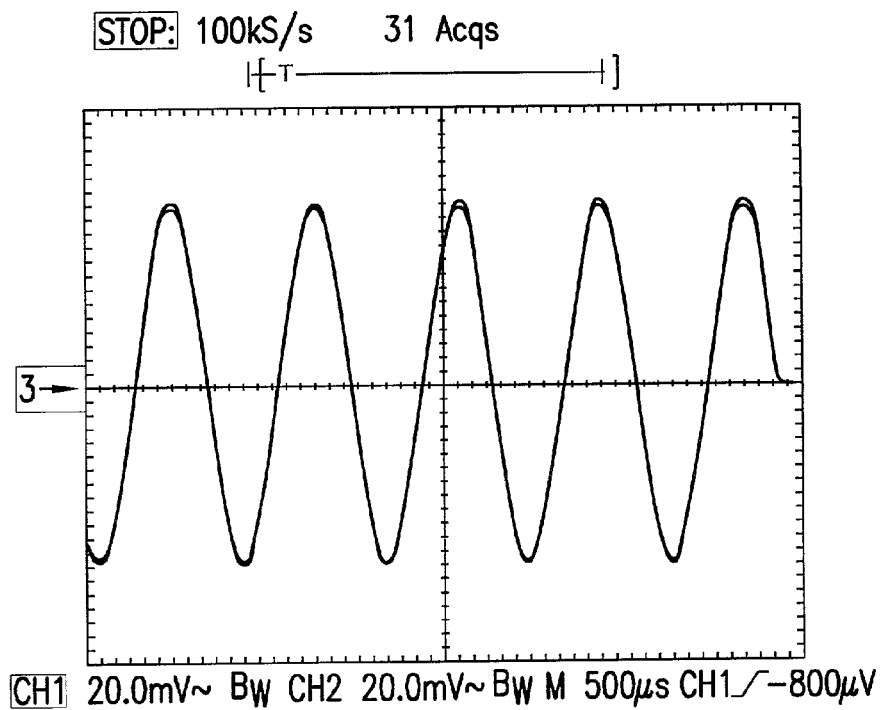
FIGS. 61A-B illustrate the output of an antenna circuit according to an embodiment of the present invention.
Figure 61B:
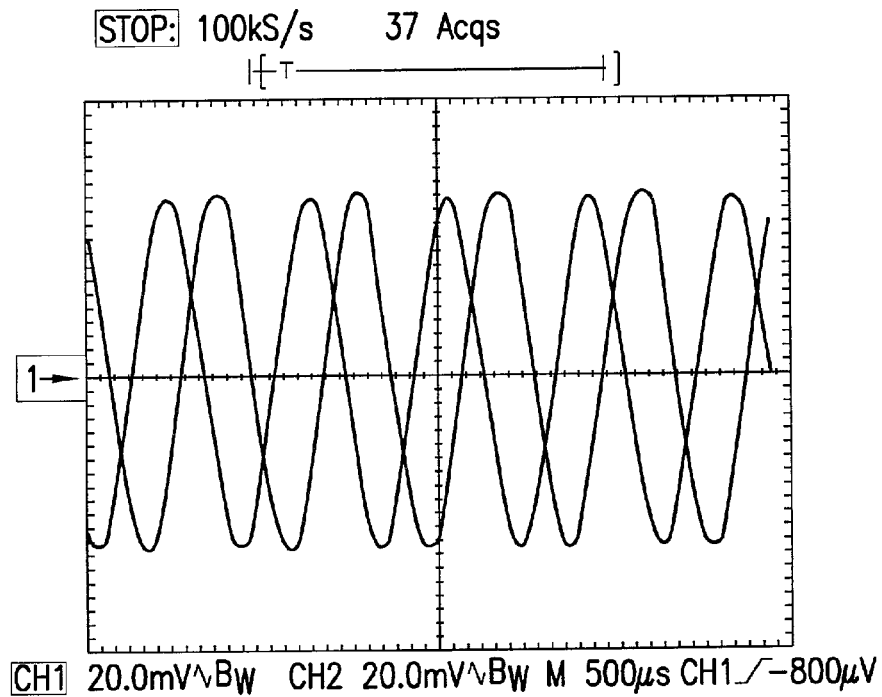

FIG. 60 illustrates an embodiment 6 of the present invention that comprises two UFT modules 6002A and 6002B. In this embodiment, the output phases of the UFT modules 6002A and 6002B are individually adjusted by changing the bias voltage applied to the local oscillator port or clock port of UFT modules 6002A and 6002B, using bias voltage modules 6004A and 6004B. As shown in FIG. 61A, when the output voltages of bias voltage modules 6004A and 6004B are equal, the output signals of UFT modules 6002A and 6002B are in phase. When the output voltages of bias voltage modules 6004A and 6004B are not equal, the output signals of UFT modules 6002A and 6002B are phase-shifted with respect to each other, as shown in FIG. 61B.

Figure 62:
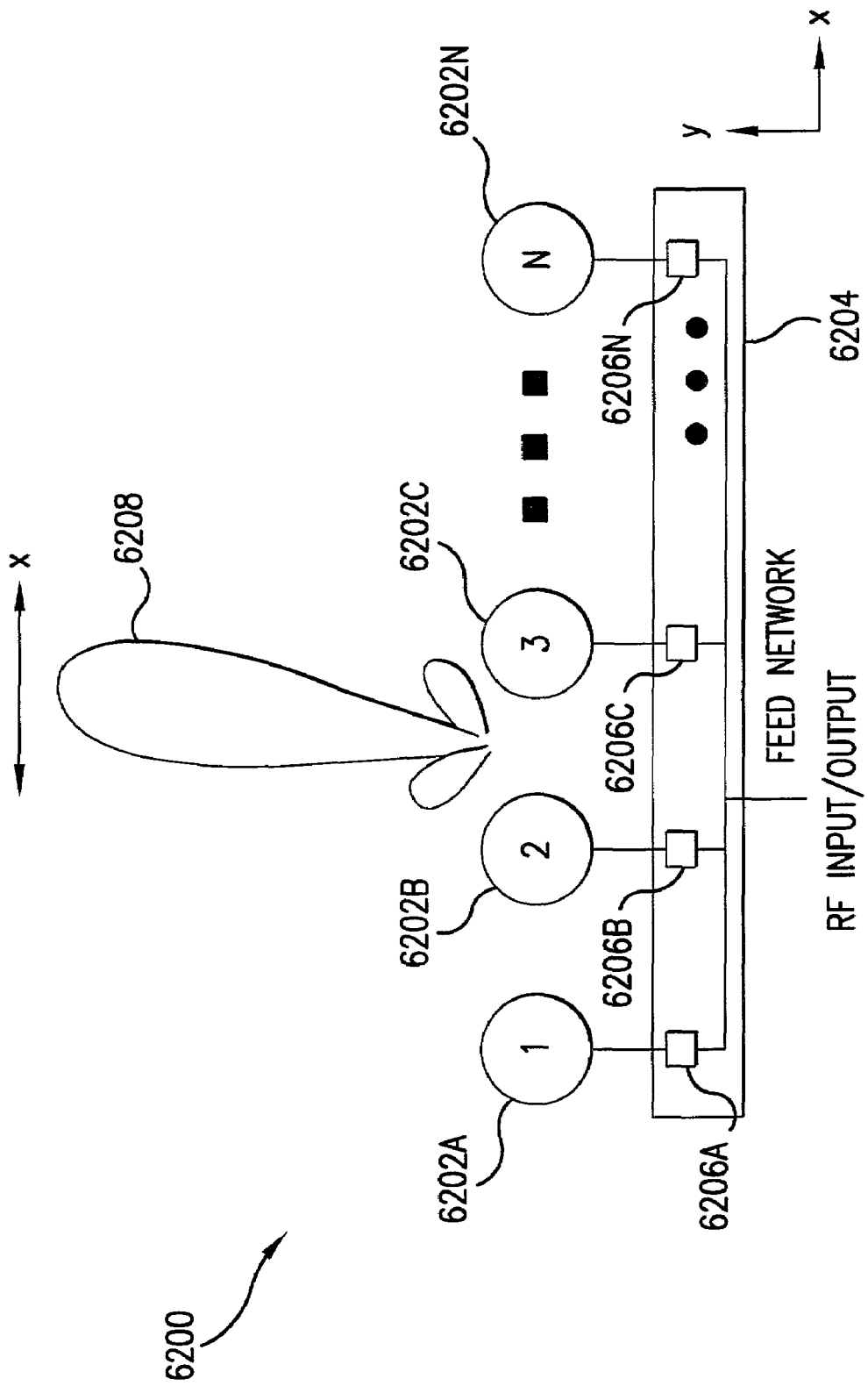
FIG. 62 illustrates a linear array according to an embodiment of the present invention.

The present invention can also be used to implement a linear phased array antenna 6200 that comprise N radiating antenna elements 6202A-N, as illustrated in FIG. 62. In an embodiment of the present invention, feed network 6204 of linear phased array antenna 6200 comprises N feed circuits 6206A-N. Each feed circuit 6206 is similar to circuit 5200 in FIG. 52 (or any of the other frequency translation/phase-shifter circuits discussed herein), which performs integrated down-conversion and phase shifting using a UFT module. As such, the phase of each element 6202 is controlled by the relative bias voltage 5206 as described in detail above. In other words, the phase of each element 6202 is varied by changing the corresponding bias voltage 5206 in circuit 5200. By changing the phase of each element 6202, a corresponding main beam 6208 is scanned or steered in the x-plane, which contains the array itself. Scanning of the antenna beam 6208 is further illustrated in FIGS. 63A and 63B that are described below.

Figure 63A:
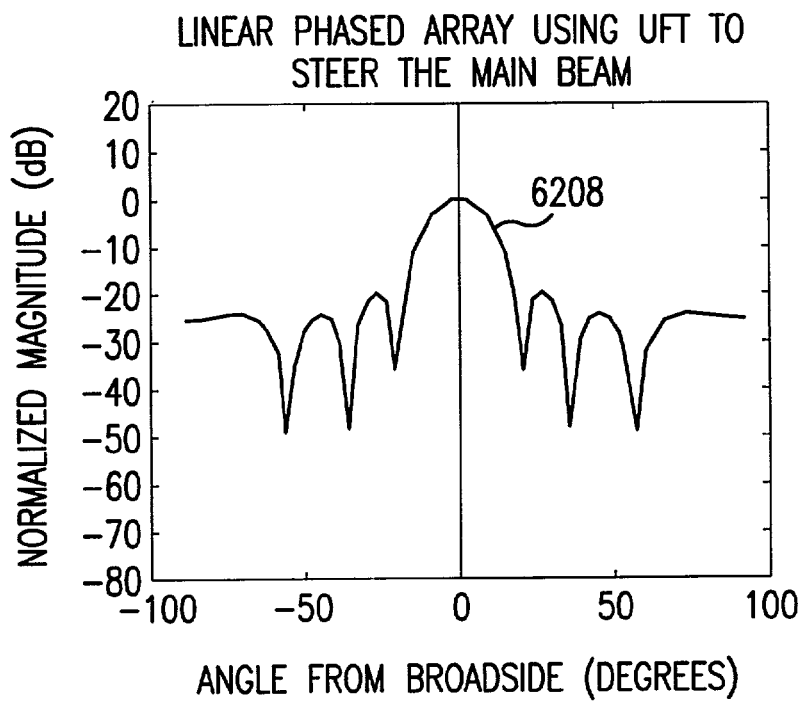
FIGS. 63A-B illustrate the output of a linear array according to an embodiment of the present invention.

FIG. 63A illustrates the radiation pattern for a linear phased array antenna 6200 for the case where N equals six and the output of each feed circuit 6206A-N is in phase. As can be seen in FIG. 63A, the main beam 6208 of the linear phased array antenna 6200 is at an angle of zero degrees, or broadside to the array, when the outputs of the feed circuits 6206 are in phase.

Figure 63B:
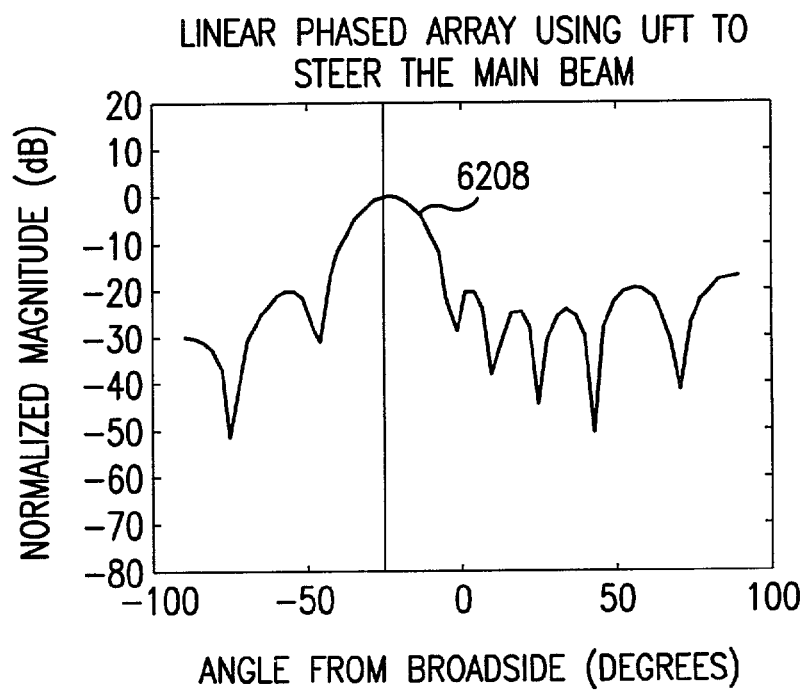

FIG. 63B shows the radiation pattern for a linear phased array antenna 6200 for the case where N equals six and the output of feed circuits 6206 are incrementally shifted, resulting in a main beam 6208 that is scanned off boresight, to approximately −20 degrees.

As would be apparent to persons skilled in the relevant art(s) given the discussion herein, embodiments of linear phased array antenna 6200 are contemplated wherein the number of radiating antenna elements and feed circuits are more than 6, and wherein the number of radiating antenna elements and feed circuit are less than 6.

Embodiments of linear phased array antenna 6200 are also contemplated that use feed circuits other than one similar to circuit 5200. Any of the various methods and circuits described herein to vary the output phase of a UFT module, and their equivalents, can be used to implement the feed circuits 6502 in the linear phased array antenna 6200. These embodiments include the frequency translator/phase shifter modules 2602, 3304, and 3604 that are shown in FIGS. 26A, 33A, and 36, respectively. Additionally down-converter/phase shifter modules 3104 (FIG. 31A), 3404 (FIG. 34A), and 3704 (FIG. 37) can be used as feed elements for phased arrays that are operating in receive mode. Additionally, up-converter/phase-shifter 3204 (FIG. 32A), 3404 (FIG. 34A), and 3804 (FIG. 38) can be used as feed elements for phased arrays that are operating in transmit mode.

Figure 64:
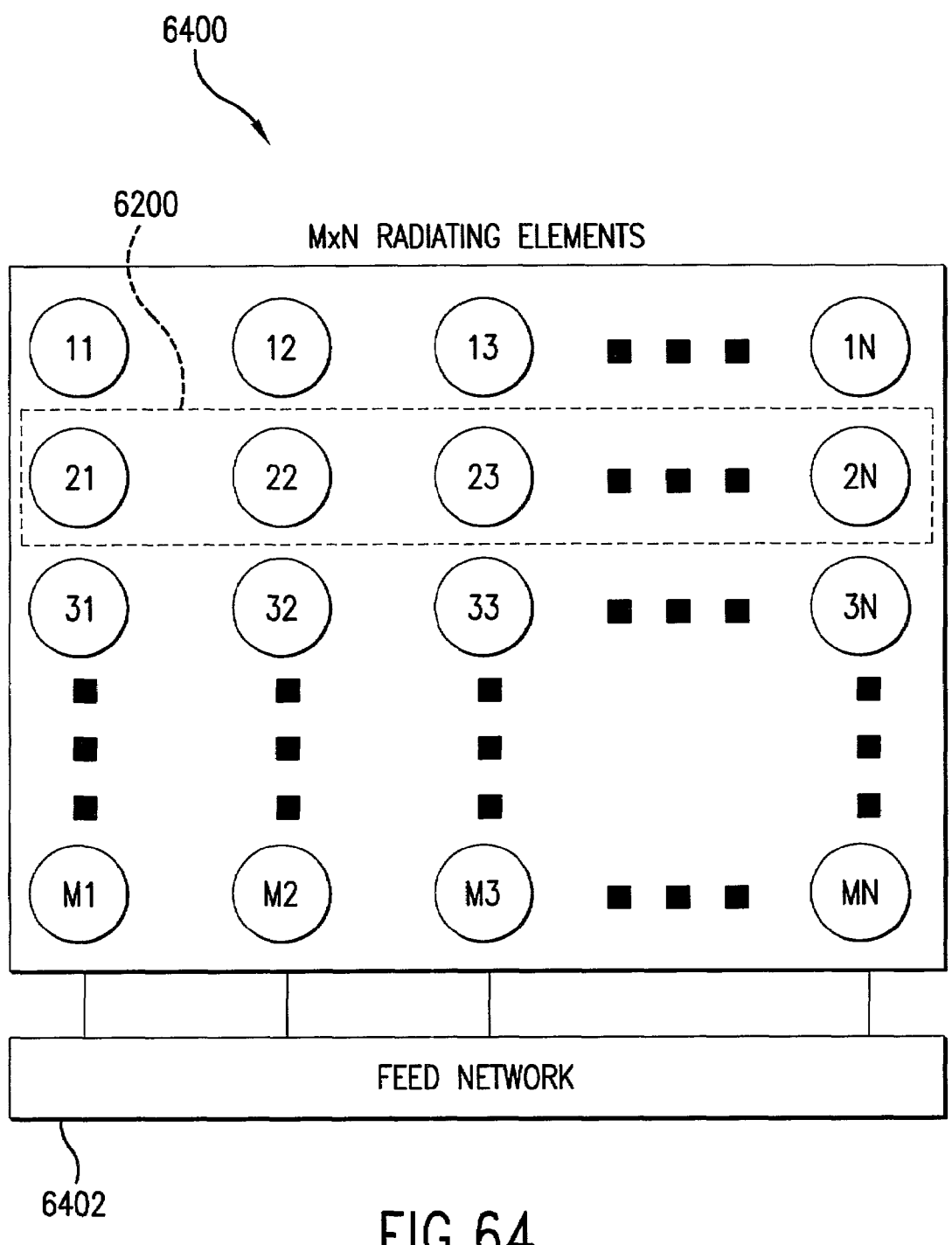
FIGS. 64 illustrates a two dimensional linear array according to embodiments of the invention.
Figure 65A:
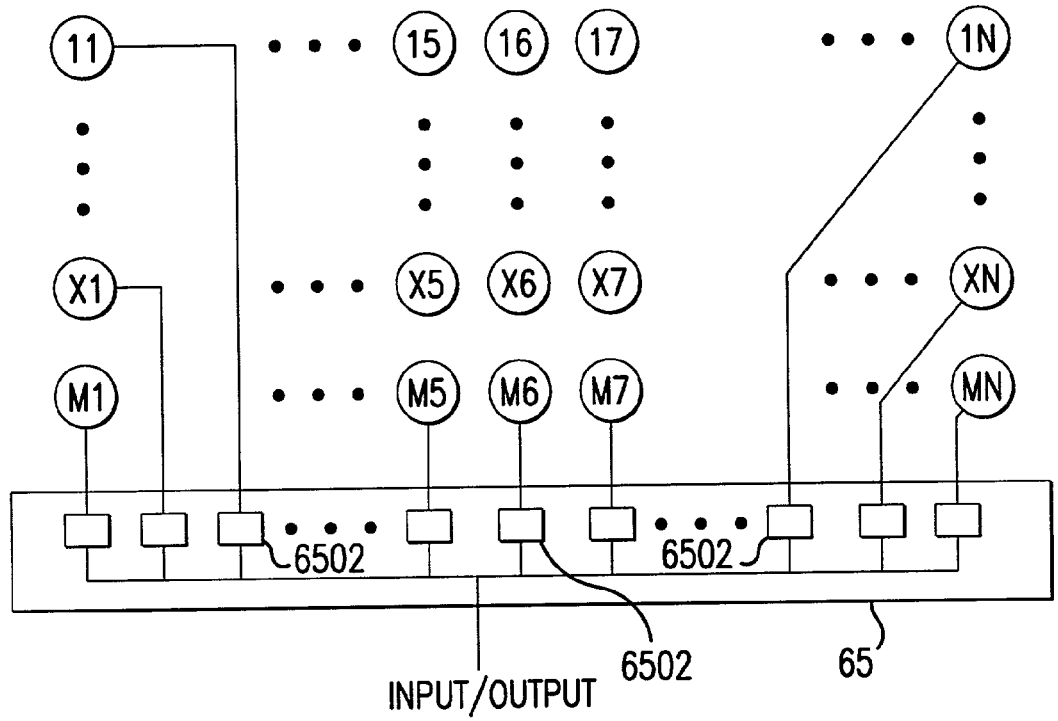
FIG. 65A-B illustrate various 2-D phased array antennas with difference feed structures according to embodiments of the present invention.
Figure 65B:
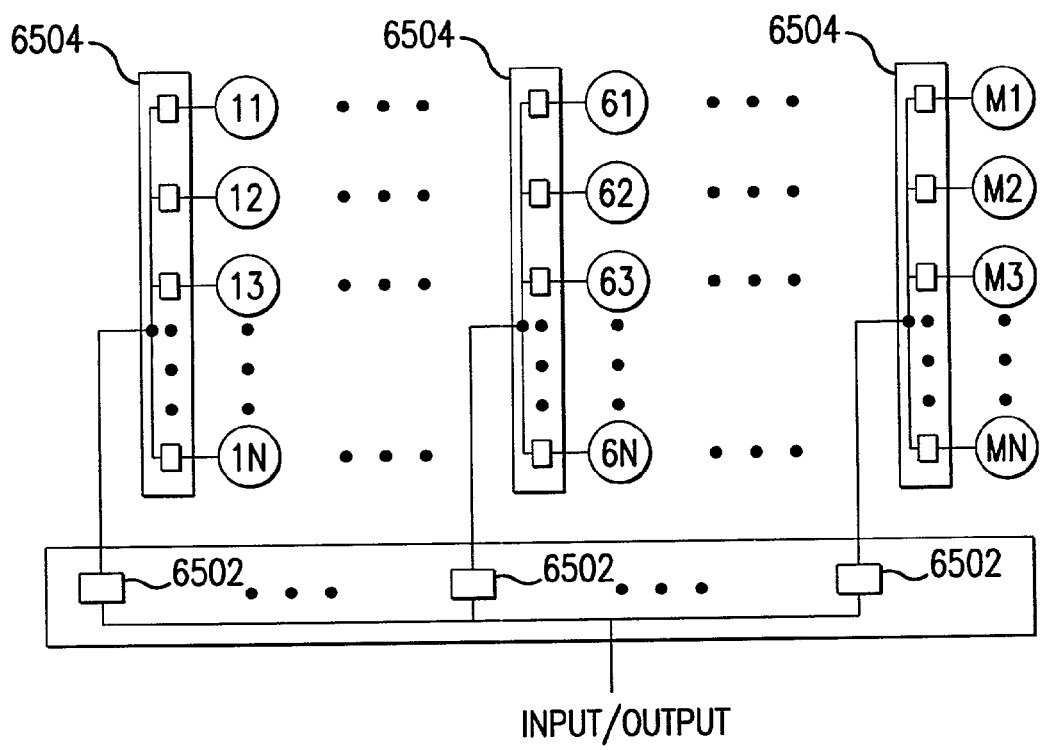

FIG. 64 illustrates an M×N antenna array 6400 embodiment of the present invention. This embodiment of the present invention can be implemented using M linear phased array antennas similar to linear phased array antenna 6200. Feed network 6402 can be implemented by controlling M×N individual feed circuit 6502 that operate in parallel, as shown in FIG. 65A. Alternatively, feed network 6402 can be implemented by controlling M input feeds circuit 6502 to N feed networks 6504 similar to feed network 6204, as shown in FIG. 65B. The feed network shown in FIG. 65A allows greater control of the individual excitation currents for each of the radiating antenna elements while the feed circuit shown in FIG. 65B is simpler to implement. In embodiments, the feed circuits 6502 are implemented according to the feed circuit 5200 that is shown in FIG. 52.

Figure 66A:
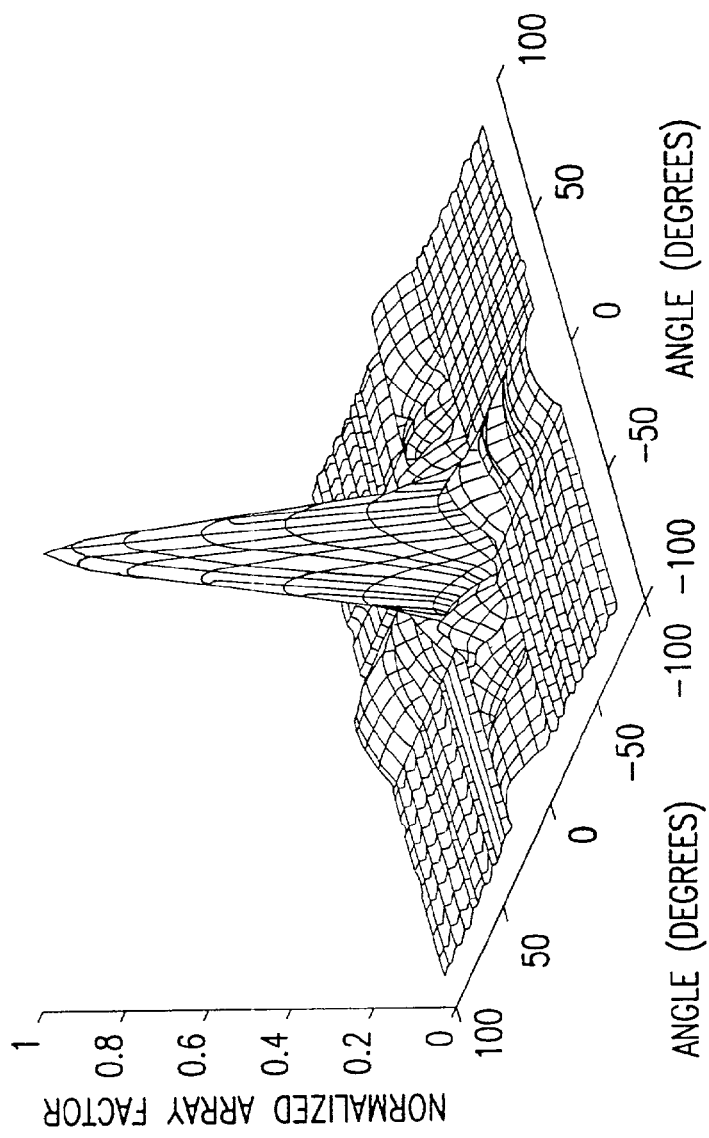
FIG. 66A-B illustrate the output of a 2-D phased array antenna according to an embodiment of the present invention.
Figure 66B:
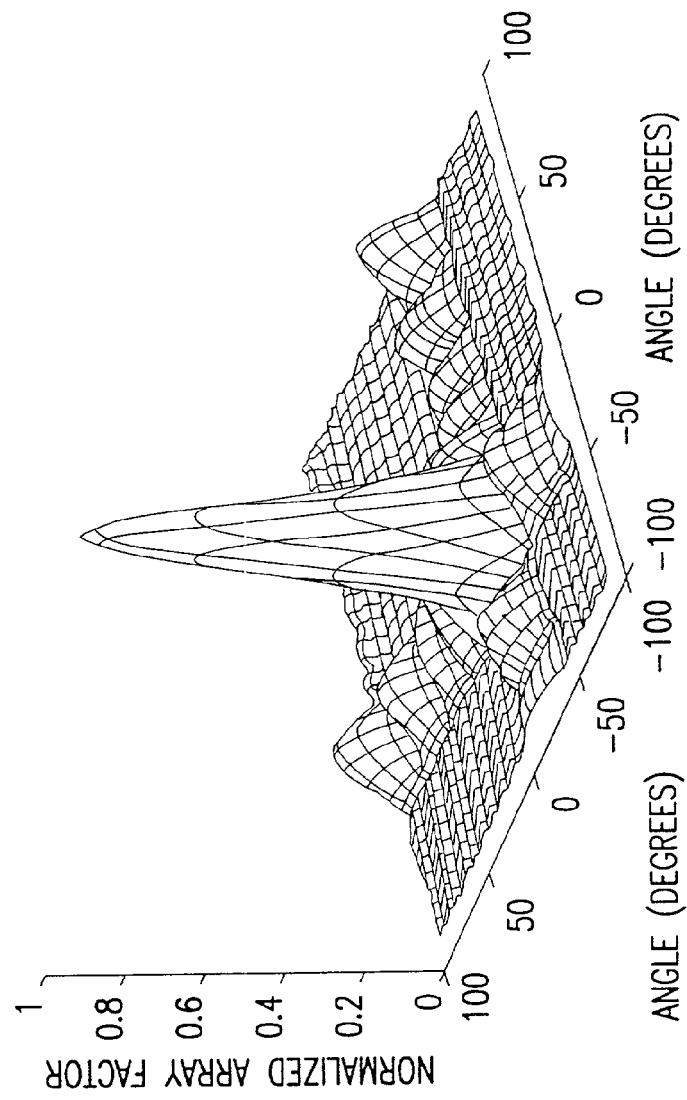

FIGS. 66A and 66B show an example radiation pattern for a 6×6 antenna array similar to array 6400. FIG. 66A shows the radiation pattern for the case where the signals fed to all of the radiating elements are in-phase. FIG. 66B shows the radiation pattern for a case were the main beam of the antenna array has been scanned or steered by intelligently varying the excitation currents to the radiating elements of the antenna array.

As would be apparent to persons skilled in the relevant art(s) given the discussion herein, embodiments of M×N array antenna 6400 are contemplated wherein the number of radiating antenna elements and feed circuits is more than 36 and wherein the number of radiating antenna elements and feed circuits is less than 36. Any of the various methods and circuits described herein to vary the output phase of a UFT module, and their equivalents, can be used to implement the feed circuits 6502 M×N array antenna 6400. These embodiments include the frequency translator/phase shifter modules 2602, 3304, and 3604 that are shown in FIGS. 26, 33, and 26 respectively.

As described herein, UFT modules can be used for both down-conversion and up-conversion of electromagnetic energy signals. For example, RF signals can be down-converted to IF signals or baseband signals. Additionally, baseband signals or IF signals can be up-converted to RF signals. Thus the present invention can be applied to produce either a receiving antenna array or a transmitting antenna array. As such, the feed circuits 6502 can be implemented with down-converter/phase shifter modules 3104, 3404, and 3704 that are shown in FIGS. 31, 34, and 27, respectively, for phased arrays that are operating in receive mode. Additionally, the feed circuits 6502 can be implemented as up-converter/phase-shifter modules 3204, 3505, and 3804 that are shown in FIGS. 32, 35, and 38, respectively, for phased arrays that are operating in transmit mode.

Figure 67A:
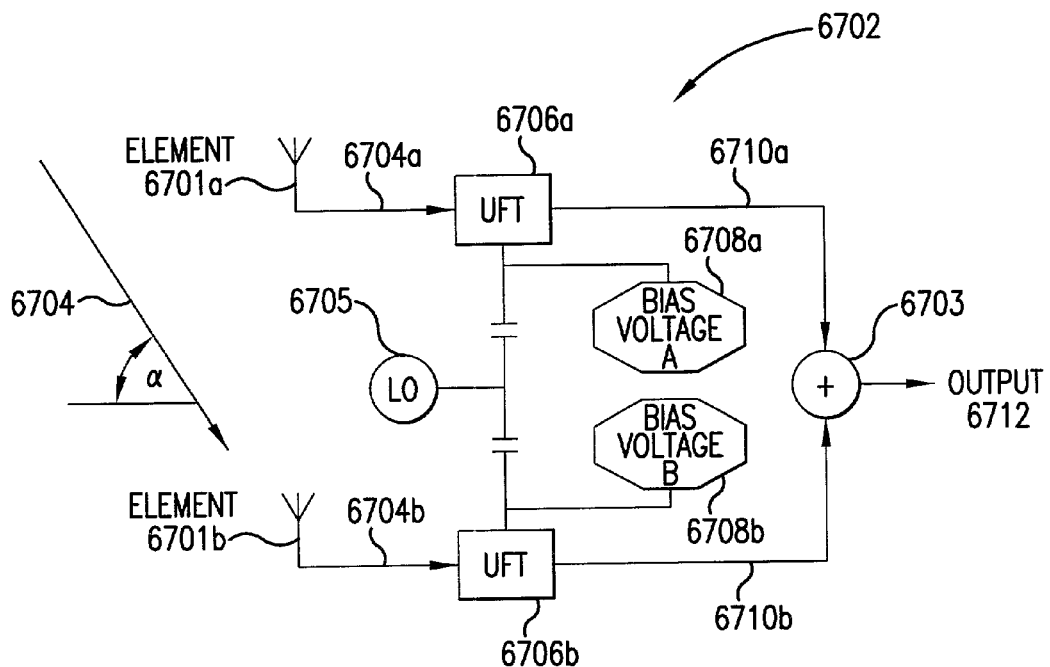
FIGS. 67A-B illustrate various antenna circuits according to embodiments of the present invention.

FIG. 67A shows an embodiment of a two-element receiving antenna array 6702. Receive antenna array 6702 includes: elements 6701a, b; UFT modules 6706a, b; bias voltage modules 6708a, b; LO 6705, and summer 6703. Antenna elements 6701a, b receive the signal 6704 at an angle a at two locations as shown, resulting in received signals 6704a, b that are phase shifted with respect to each other. UFT modules 6706a, b down-convert and phase shift the signals 6704a, b, where the relative phase introduced by each UFT module 6706 is dependant on the corresponding bias voltage module 6708, as described above. Therefore, any relative phase shift between the signals 6704a and 6704b (as a result of the angle of arrival) can be compensated for by adjusting the relative bias voltages 6708a and 6708b. In other words, UFT module 6706b (or the UFT module 6706a) can be biased to implement a relative phase shift during down-conversion that compensates for any phase shift between the signals 6704a and 6704b. Therefore, the resulting down-converted signals 6710a and 6710b are in-phase when added together by the summer 6703, and the output signal 6712 is enhanced to a maximum value. When the output signal 6712 is at a maximum then the main beam of the antenna 6702 is steered to the angle α, so as to be aligned with the incoming signal 6704.

Figure 67B:
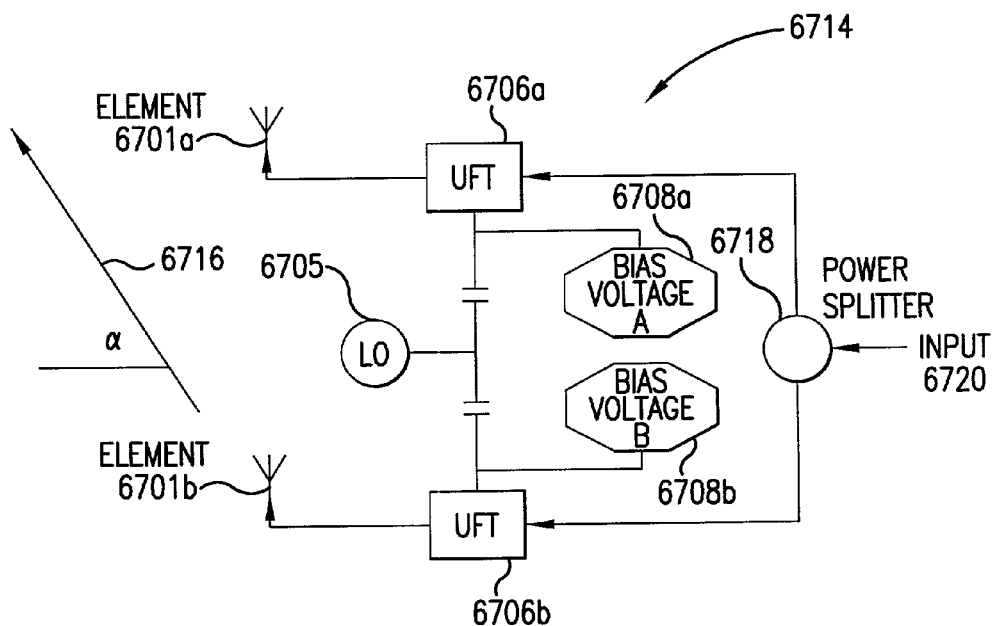

FIG. 67B shows an embodiment for a two-element transmitting antenna array 6714 that is the reciprocal of the receive antenna 6702. Antenna array 6714 up-converts and transmits an input signal 6720, resulting in a transmitted signal 6716 that is transmitted at an angle α, as shown. Because of the principle of reciprocity, a receiving antenna array can also be used as a transmitting antenna with minor adjustments, as would be known to persons skilled in the relevant art(s). As shown, the difference between receive array 6702 and transmit array 6714 is that the summing module 6703 (in receive array 6702) has been replaced by a power splitter module 6718 (in transmit array 6714), where the power splitter 6718 receives the baseband input 6720. In embodiments, the power splitter 6718 and the summer 6703 can be the same component. In other embodiments, they can be different components.

Figure 67C:
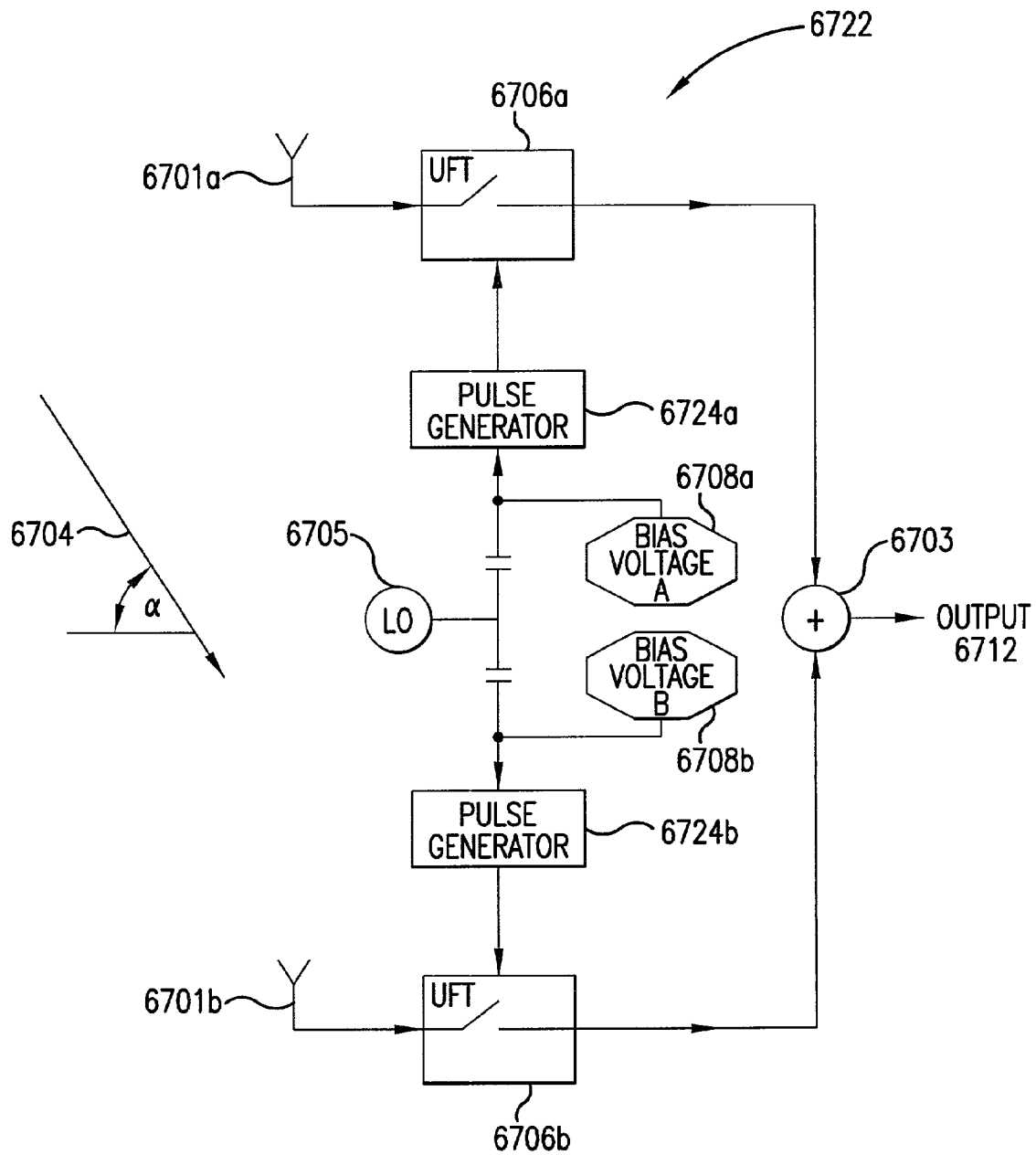
FIG. 67C illustrates receive antenna 6722 having pulse generators 6724 to control the UFT modules 6706 an embodiment of the present invention.
Figure 67D:
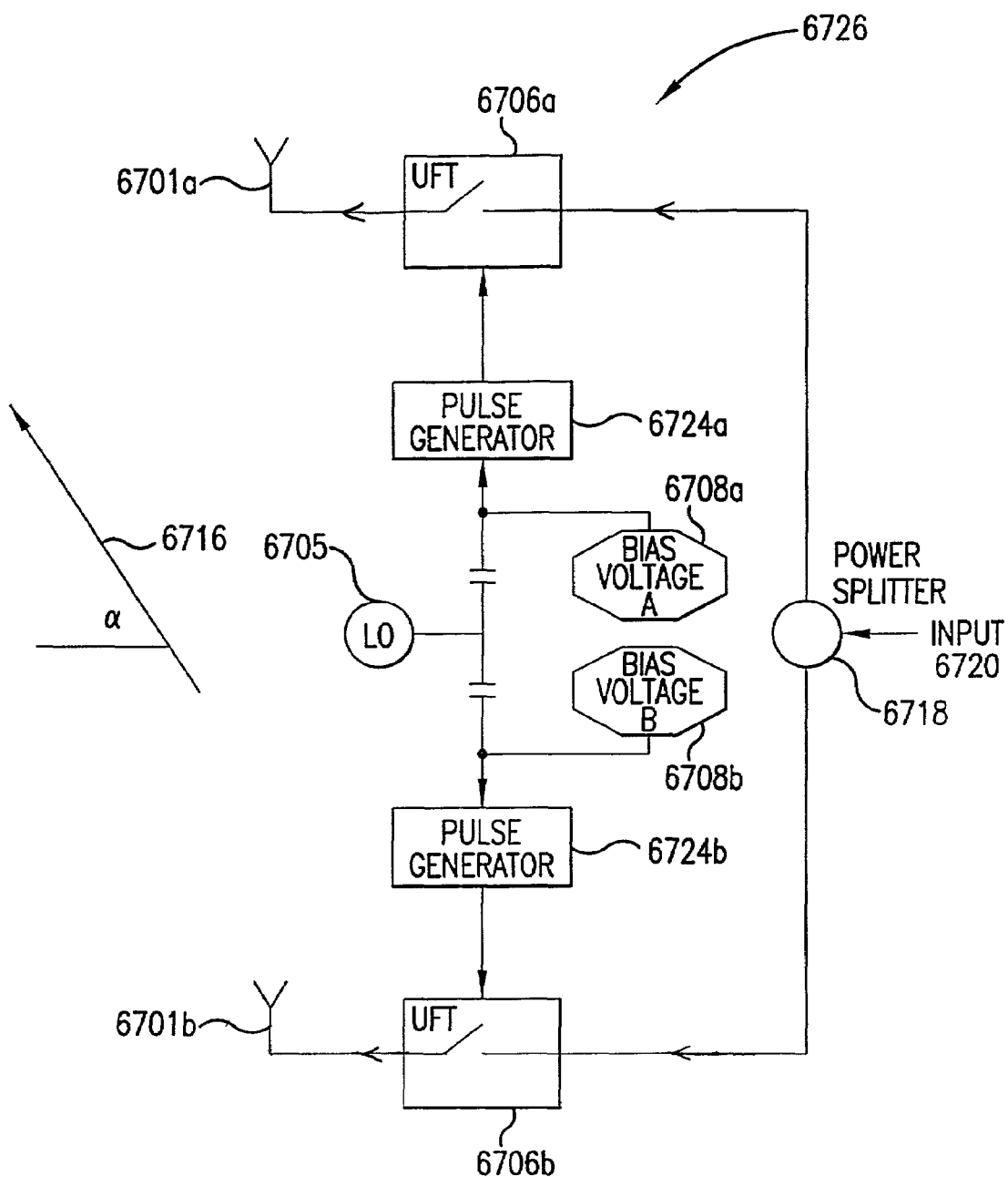
FIG. 67D illustrates transmit antenna 6726 having pulse generators 6724 to control the UFT modules 6706 an embodiment of the present invention.

In sections 7.2.1-7.2.3, the frequency translation/phase-shifting embodiments of the invention incorporate a pulse generator in addition to a UFT module. In section 7.2.4, the frequency translation/phase-shifter embodiments of the invention do not include a pulse generator. Antenna configurations 6702 (FIG. 67A) and 6714 (FIG. 67B) do not explicitly illustrate a pulse generator, for ease of illustration. However, in embodiments, pulse generator(s) could be incorporated with the UFT modules in antenna configurations 6702 and 6714 to control switching of the UFT module(s) (as seen in FIGS. 67C and 67D). More generally, all of the antenna configurations described herein can utilize any of the frequency translation/phase-shifter embodiments described herein (and their equivalents), including frequency translation/phase-shifter embodiments that incorporate (and do not incorporate) pulse generators.

FIG. 67C illustrates receive antenna 6722 having pulse generators 6724a and 6724b to control the UFT modules 6706a and 6706b, respectively.

FIG. 67D illustrates transmit antenna 6726 having pulse generators 6724a and 6724b to control the UFT modules 6706a and 6706b, respectively.

Figure 68A:
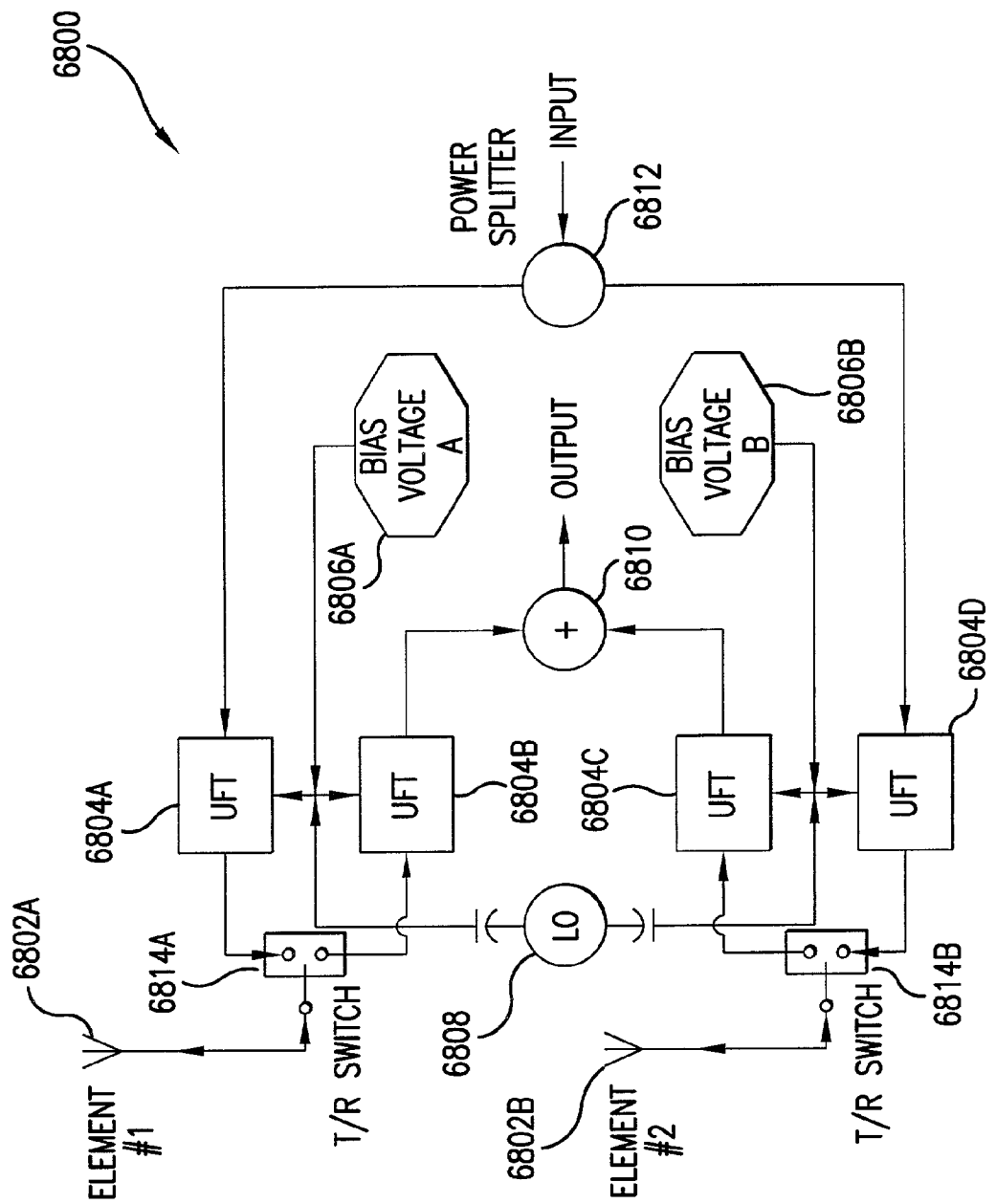
FIGS. 68A-B illustrate antenna circuits that can be used for both transmit and receive, according to an embodiment of the present invention.

FIG. 68A depicts a transmit/receive antenna array 6800 according to an embodiment of the present invention that has a steerable main beam. Antenna array 6800 is capable of both receiving and transmitting electromagnetic signals. Antenna array 6800 comprises two antenna elements 6802A and 6802B, four UFT modules 6804A-D, two bias voltage modules 6806A and 6806B, a local oscillator module 6808, a summing module 6810, and a power splitter module 6812. Antenna elements 6802 are selectively coupled to UFT modules 6804 using T/R switches 6814.

In receive mode, switches 6814A and 6814B are positioned so that the antenna elements 6802A and 6802B are connected to the UFT modules 6804B and 6804C, respectively. When in this configuration, antenna array 6800 functions similar to antenna array 6702.

In transmit mode, switches 6814A and 6814B are positioned so that the antenna element 6802A and antenna element 6802B are connected to the UFT module 6804A and the UFT module 6804D, respectively. When in this configuration, antenna array 6800 functions similar to antenna array 6714.

Figure 68B:
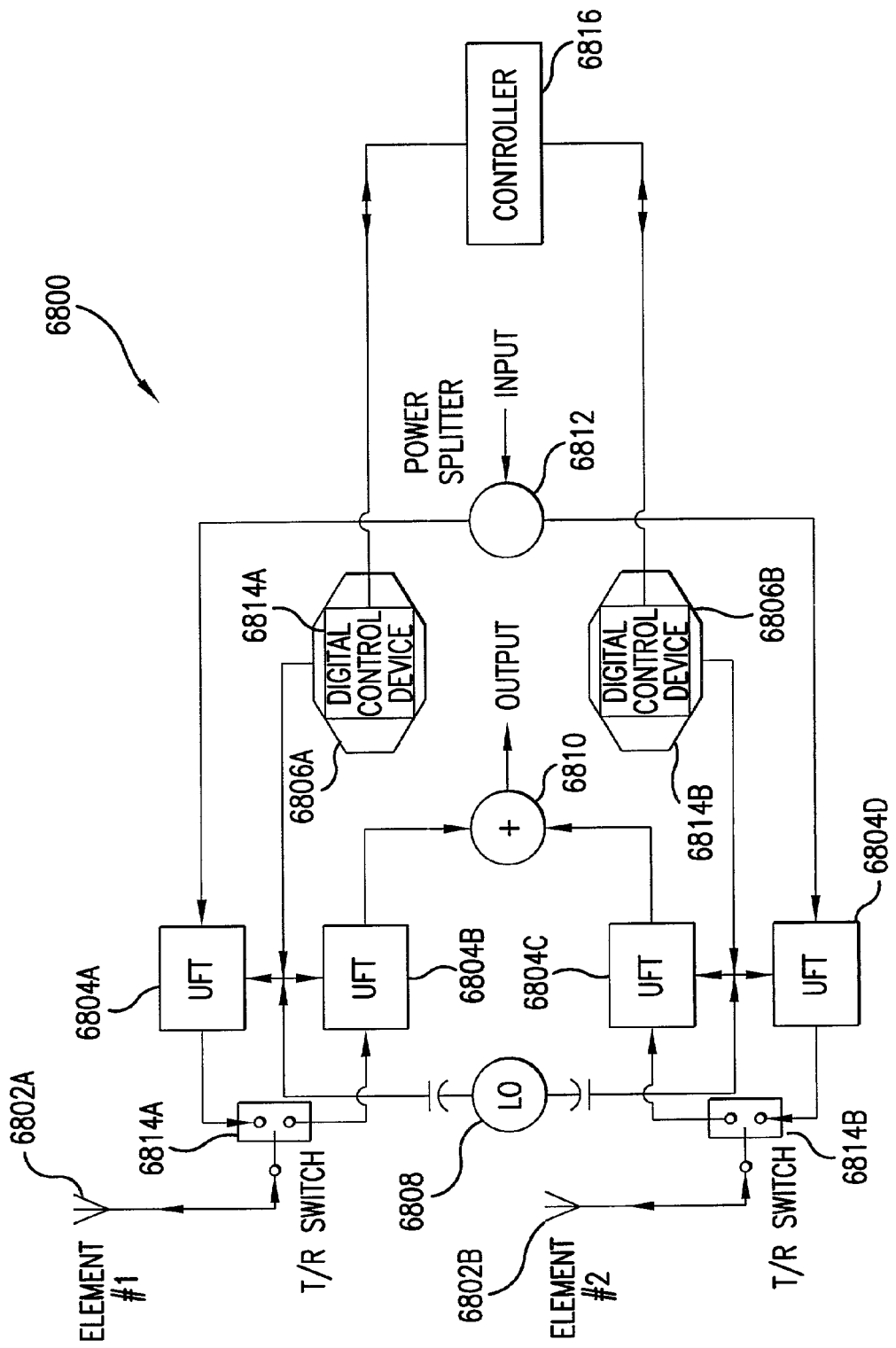

Bias voltage modules 6806 are preferably digital control devices. Digital control devices provide an appropriate bias voltage based on a digital input, and can be computer controlled. FIG. 68B illustrates digital control devices 6814 that are controlled by a controller 6816. In embodiments, the digital control devices 6814 include but are not limited to: digitally controlled voltage supplies, digital-to-analog converters, and other devices and equivalents that are known to those skilled in the arts based on the discussion herein. In embodiments, the controller 6816 is a programable computer/processor, including a microprocessor.

Figure 68C:
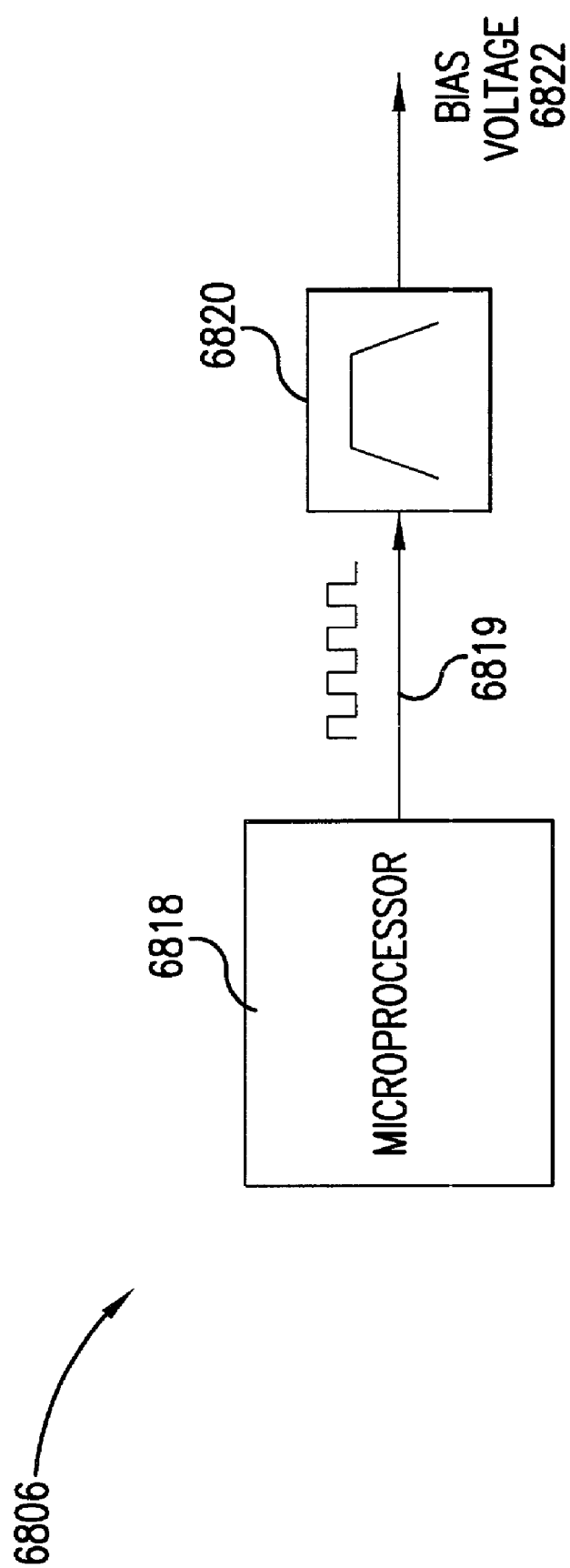
FIG. 68C illustrates an exemplary digital control device, according to an embodiment of the present invention.

In alternate embodiments, the digital control device 6806 is a microprocessor 6818 and a low pass filter 6820, as shown in FIG. 68C. The microprocessor 6818 is programed to generate a square wave that is filtered by the low pass filter 6820. The result is a bias voltage 6822 having an amplitude that varies according to the duty cycle of the square wave 6819. More specifically, the amplitude rises or falls in proportion to the duty cycle. As such, the duty cycle can be used to vary the amplitude of the bias voltage 6822, and therefore level shift the appropriate LO signal.

By using digital control devices 6814 in array 6800, any phase discrepancy between the transmit and receive paths can be electronically tunned out. This can occur because phase control is achieved by simply controlling the voltage at the UFT module's local oscillator or clock input port. Thus, manual phase alignment is eliminated. Additionally, the local oscillator 6808 is isolated from the RF signal so that phase control is implemented using the large magnitude signal LO signal, instead of the smaller magnitude RF signal. In other words, the phase control is done at the LO signal input, and is independent of RF signal amplitude. This eliminates the need to create wide dynamic range, low noise phase shifting circuitry. Furthermore, digital control devices 6814 allow the main antenna beam to be steered instantaneously, as desired. Other advantages of antenna array 6800 will be apparent to persons skilled in the relevant art(s) given the description herein.

As would be apparent to persons skilled in the relevant art(s) given the discussion herein, embodiments of array antenna 6800 are contemplated wherein the number of antenna elements and feed circuits is more than two. Furthermore, any of the various methods and circuits described herein that vary the output phase of a UFT module, can be used to implement array antenna 6800. This includes the frequency translator/phase shifter modules 2602, 3304, and 3604 that are shown in FIGS. 26A, 33A, and 36, respectively. Additionally, the down-converter/phase shifter modules 3104, 3404, and 3704 that are shown in FIGS. 31A, 34A, and 37, respectively, could be utilized in the receive mode. Additionally, the up-converter/phase-shifter modules 3204, 3504, and 3804 that are shown in FIGS. 32A, 35A, and 38, respectively, could be utilized in the transmit mode.

Figure 69:
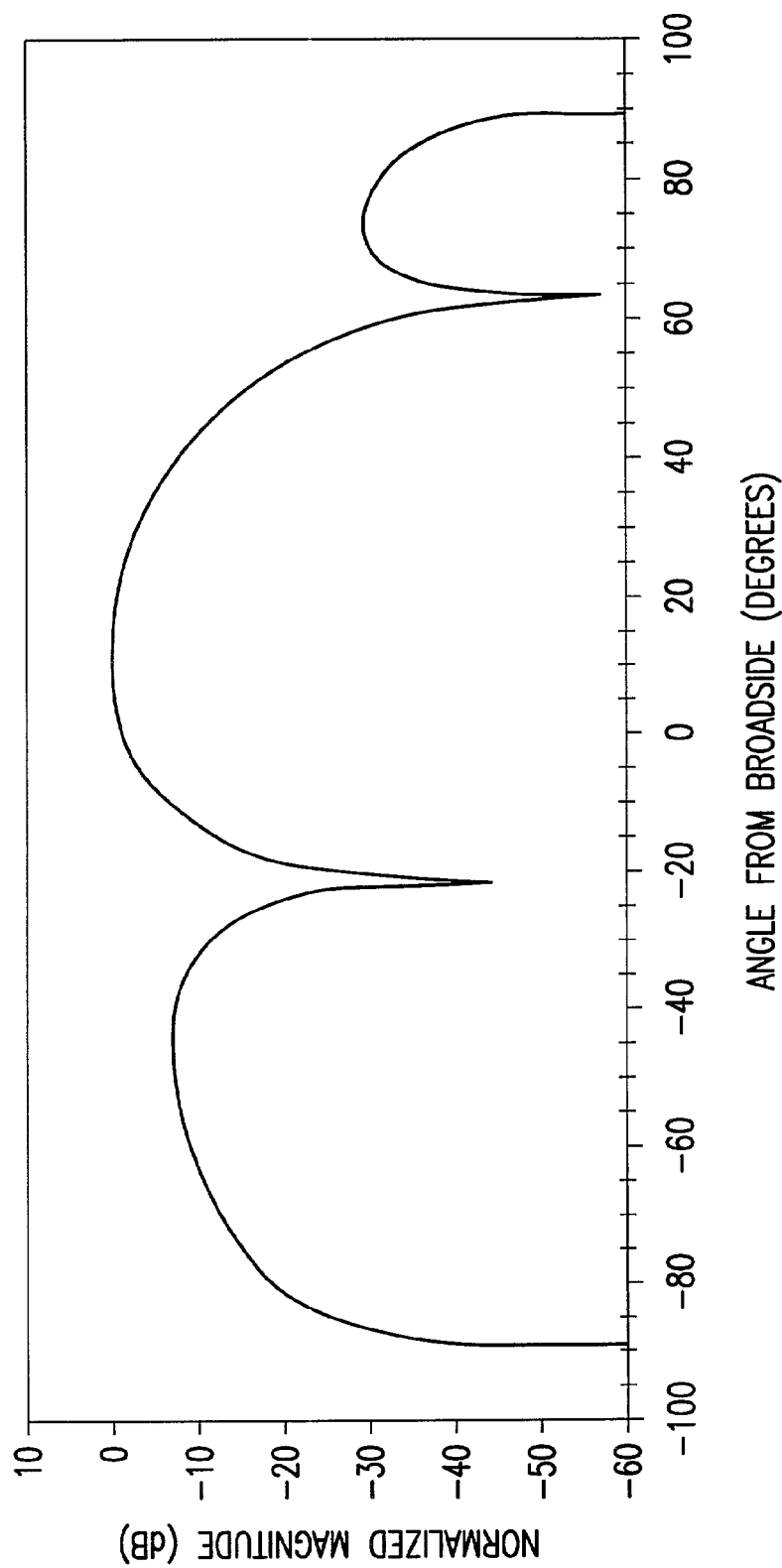
FIG. 69 illustrates the output of an antenna circuit with the main beam steered off boresight, according to an embodiment of the present invention.

FIG. 69 depicts an exemplary radiation pattern for an example two-element antenna array according to the present invention. As can be seen in FIG. 69, the radiation pattern of an antenna array comprises both lobes and nulls. A lobe is shown in FIG. 69 at about 15 degrees and a null is shown at about −20 degrees. When the radiation pattern of an antenna array is steered, both the lobes and the nulls are steered. Thus, it is possible to align a receiving null with transmissions originating from an undesirable direction such as a multipath direction or the direction of a jamming transmitter. Conversely, transmitting nulls can be aligned with directions that may interfere with other receivers. In FIG. 69, the main beam of the antenna has been steered to 15 degrees, the desired signal's direction, while a null has been steered to −20 degrees, the direction of an undesired signal's origin.

7.3.5 Generating Elliptical and Circular Polarization Using UFT Modules

Figure 70:
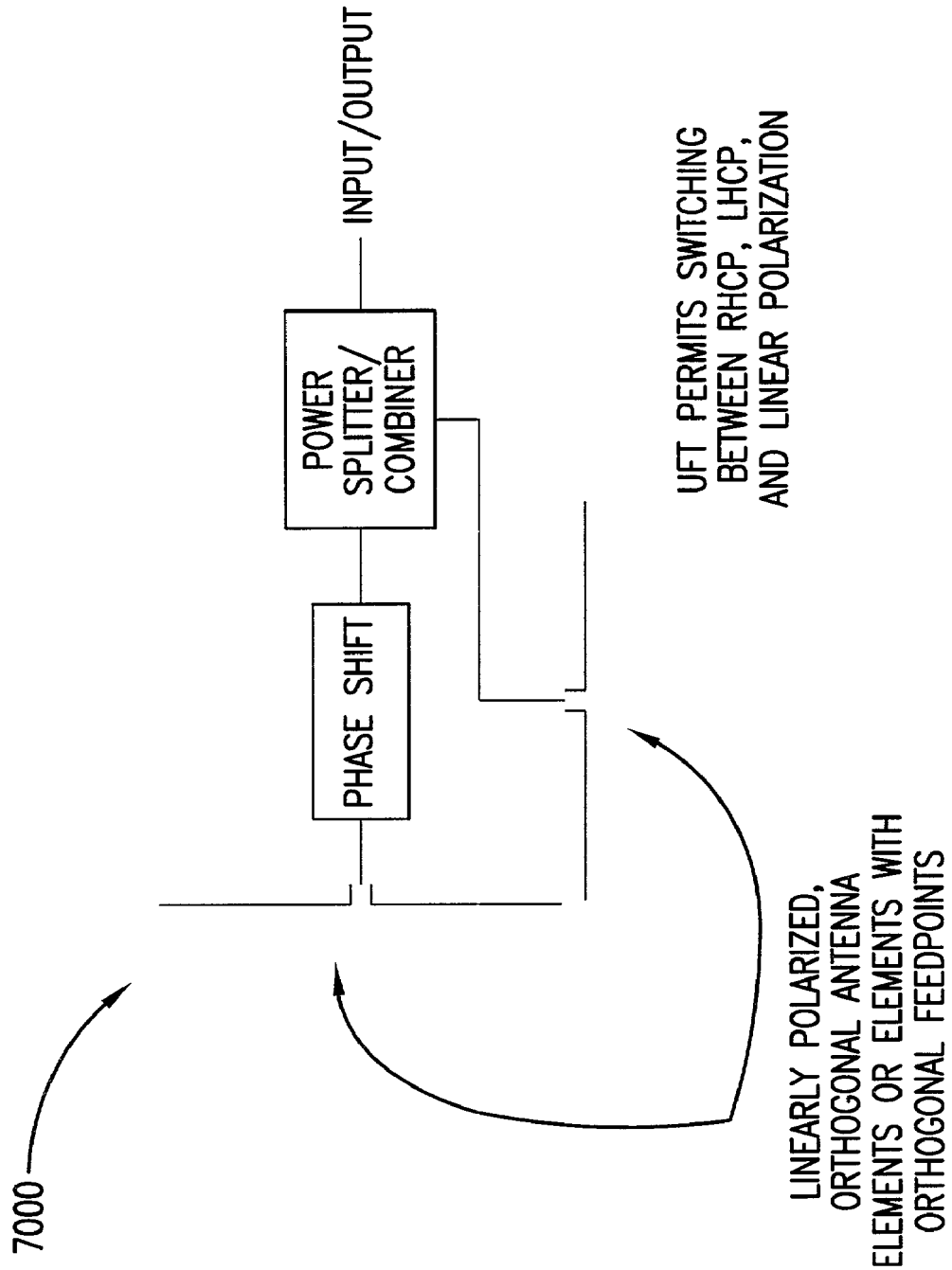
FIGS. 70-71 illustrate antenna circuits that are capable of producing linear and circular polarization, according to an embodiment of the present invention.

The present invention is very versatile. For example, by properly orienting the antenna elements of antenna array 6800, the present invention can be used make an antenna 7000 that can transmit and receive circularly polarized waves. Circularly polarized waves are used in many communication systems. Furthermore, because the present inventions is so versatile, the same topology that is used to transmit/receive circularly polarized waves can also be used to transmit/receive linear polarized waves. As can be seen in FIG. 70, antenna 7000 uses linearly polarized, orthogonal antenna elements or elements with orthogonal feed points in order to transmit and receive circularly polarized waves. Antenna 7000 is capable of transmitting and receiving right-hand circularly polarized waves, left-hand circularly polarized waves, and linearly polarized waves.

Figure 71:
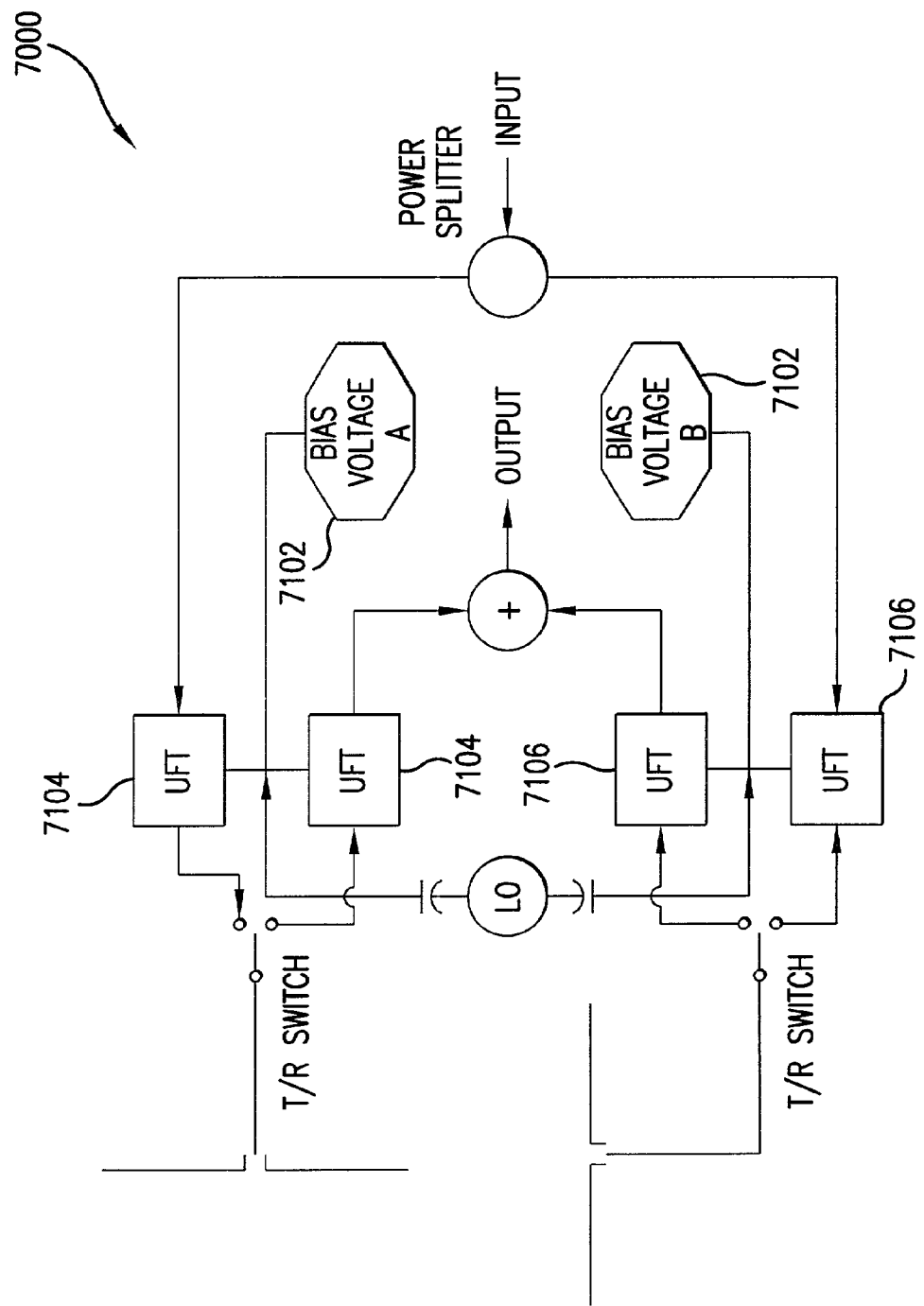

FIG. 71 is a more detailed diagram of antenna 7000 according to an embodiment of the present invention. The circuitry of antenna 7000 is similar to the circuitry described above for antenna array 6800. In order to transmit and receive circularly polarized waves, bias voltages modules 7102 of antenna 7000 are set so that a 90 degree phase shift is maintained between UFT modules 7104 and 7106. The determination of the bias voltage according to embodiments of the invention for a given phase shift is described herein.

As would be apparent to persons skilled in the relevant art(s) given the discussion herein, other embodiments of antenna 7000 are contemplated, which use the various methods and circuits described herein, and their equivalents, to vary the output phases of the UFT modules.

Figure 72:
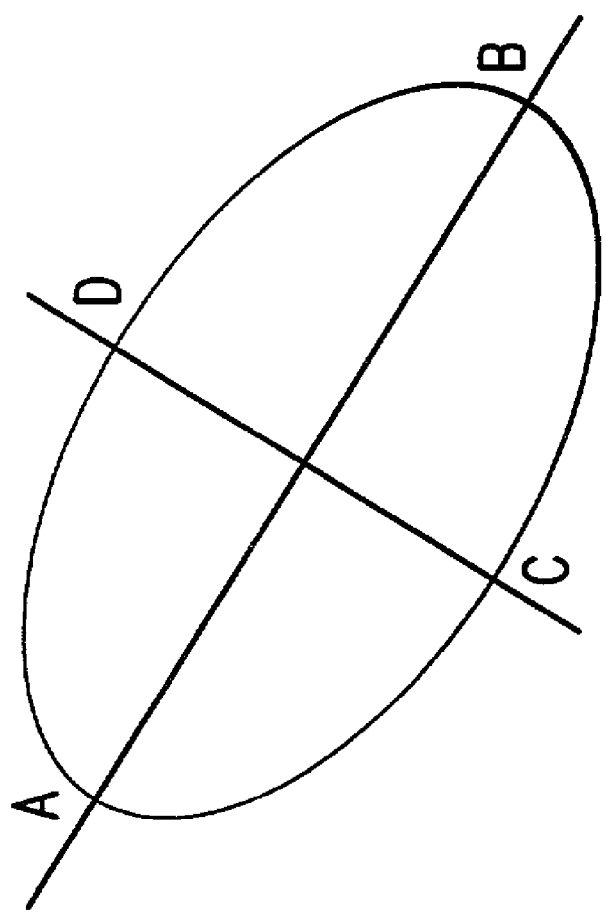
FIG. 72 illustrates an elliptically polarized wave.

As will be known to persons skilled in the relevant art(s), differences in the circuitry of an antenna may cause polarized waves to be produced that are not purely circular. Such waves are called elliptically polarized waves. FIG. 72 shows an ellipse that can be thought of as representing an elliptically polarized wave. A truly circular polarized wave has an axial ratio equal to one. Referring to FIG. 72, axial ratio means the ratio of the length of line segment AB to the length of line segment CD.

$$\text{Axial Ratio} = \frac{AB}{CD}$$

Figure 73:
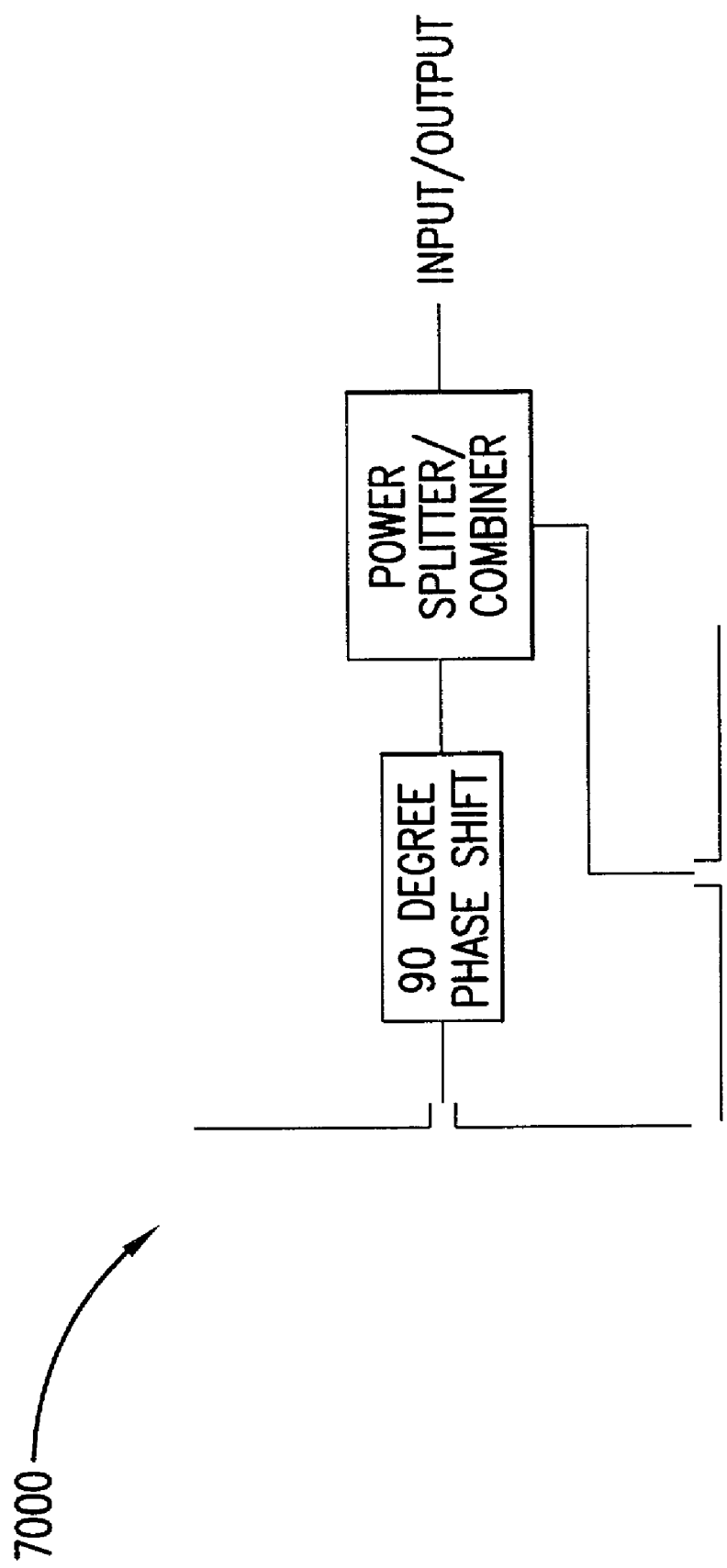
FIG. 73 illustrates an antenna circuit that can generate linear or elliptical polarization, according to an embodiment of the present invention.

The circuitry of antenna 7000 can compensate for any phase errors in the feed network of antenna 7000, as illustrated in FIG. 73, thereby eliminating or significantly reducing the effect of the phase errors that can cause elliptically polarized waves to be produced. As will be apparent to persons skilled in the relevant art(s) given the description herein, the output phase of the UFT modules of antenna 7000 can be adjusted to compensate for any errors by simply adjusting the output of the bias voltage modules.

7.3.6 Intelligent Adaptive Beam Forming using UFT Modules

Figure 74:
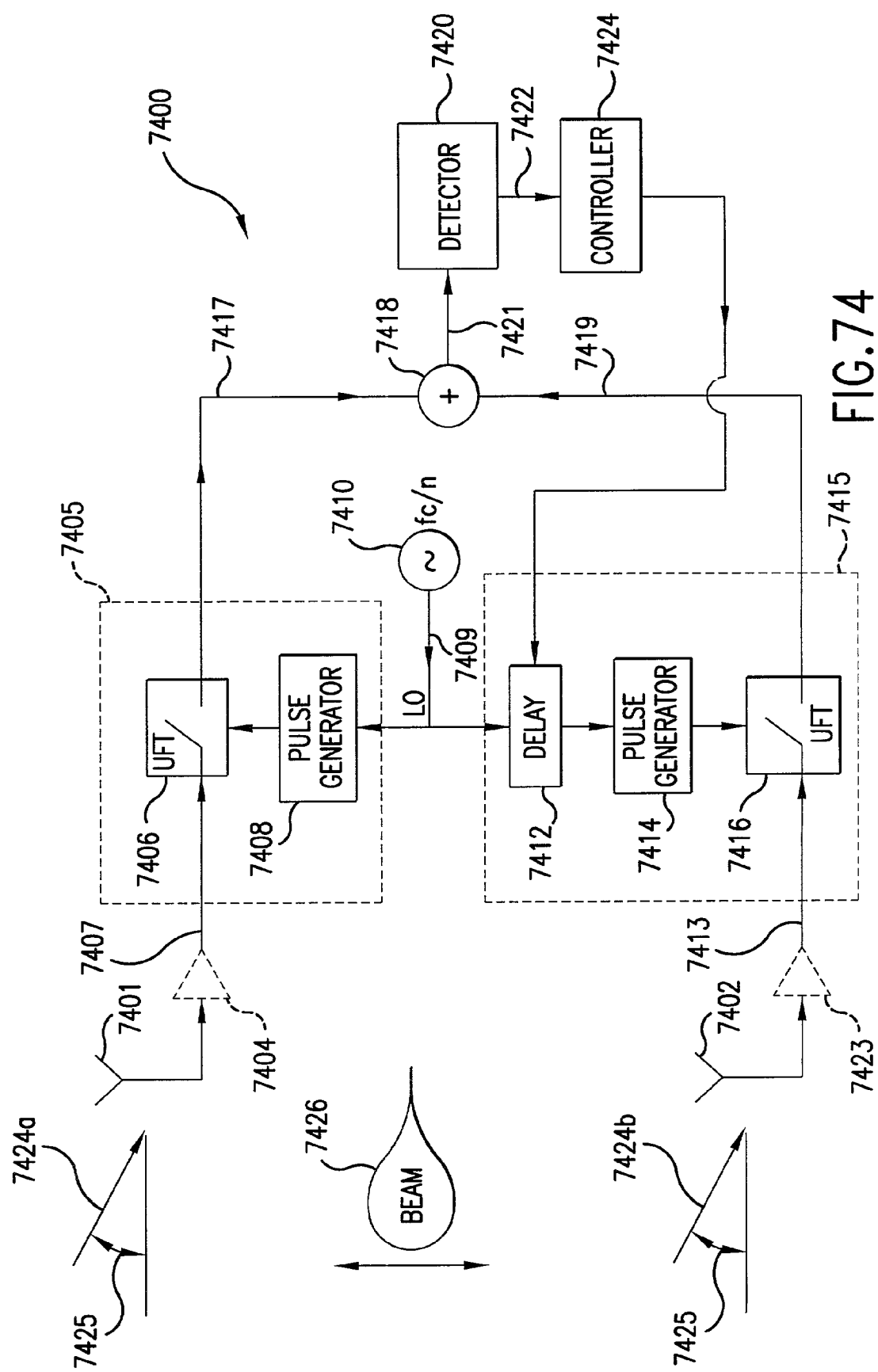
FIG. 74 illustrates a phased array antenna system with adaptive beam forming, according to embodiments of the present invention.

FIG. 74 illustrates a phased array system 7400 that has adaptive beam forming according to an embodiment of the invention. Antenna 7400 is capable of steering the corresponding antenna beam 7426 toward an incoming signal so that better signal reception is achieved. Phased array system 7400 is depicted as a two element antenna system, however n-number of elements could be used. Furthermore, multiple dimensional arrays could be implemented. For example, arrays having M×N antenna elements can be implemented as will be understood by those skilled in the relevant arts.

Phased array system 7400 includes: antenna elements 7401, 7402; optional amplifiers 7404, 7423; down-converter 7405 having pulse generator 7408 and UFT modules 7406; down converter/phase shifter 7415 having delay element 7412, pulse generator 7414, and UFT module 7416; oscillator 7410; summer 7418; detector 7420; and controller 7424. The operation of the adaptive beam forming properties for the phased array system 7400 are described in receive/down-conversion mode. However, the discussion is applicable to up-conversion as will be understood by those skilled in the relevant arts.

Antenna elements 7401 and 7402 receive a signal 7424 that has an angle of arrival angle 7425. The signal 7424 is assumed to be a plane wave and is received by both antenna elements 7401 and 7402. The signal 7424 is optionally amplified by amplifiers 7404 and 7423 to generate signals 7407 and 7413, respectively.

Down-converter 7405 down-converts the signal 7407 according to a LO signal 7409 that drives the pulse generator 7408, resulting in a down-converted signal 7417. Down-conversion using a UFT module that is driven by a pulse generator has been described herein, to which the reader is referred for more details.

Down-converter/phase shifter 7415 down-converts and phase shifts the signal 7413 according to the LO signal 7409 that drives the delay element 7412, resulting in an IF signal 7419. Down-conversion and phase shifting using a UFT module has been described herein, to which the reader is referred for more detail. As described herein, the delay element 7412 implements a desired phase shift in the IF signal 7419 by shifting the pulses that are generated by the pulse generator 7414. The delay element 7412 can be implemented using any one of the delay configurations/approaches that were discussed earlier herein including: changing the DC bias of the local oscillator (LO) signal 7409, delaying the LO signal 7409, and changing the shape of the LO signal 7409, as well as others that will be apparent based on the teachings herein.

Summer 7418 sums the two IF signals 7417 and 7419, resulting in a combined signal 7421.

Detector 7420 detects the signal 7421, resulting in a detected output signal 7422. The detector 7420 produces a maximum signal strength for output signal 7422 when the antenna beam 7426 is aligned with the incoming signal 7424, which occurs at an angle 7425 as shown. If the antenna beam 7426 is not aligned with the incoming signal 7424, then the detector 7420 will not produce a maximum signal. This is further represented by FIG. 75, and is discussed below.

Figure 75:
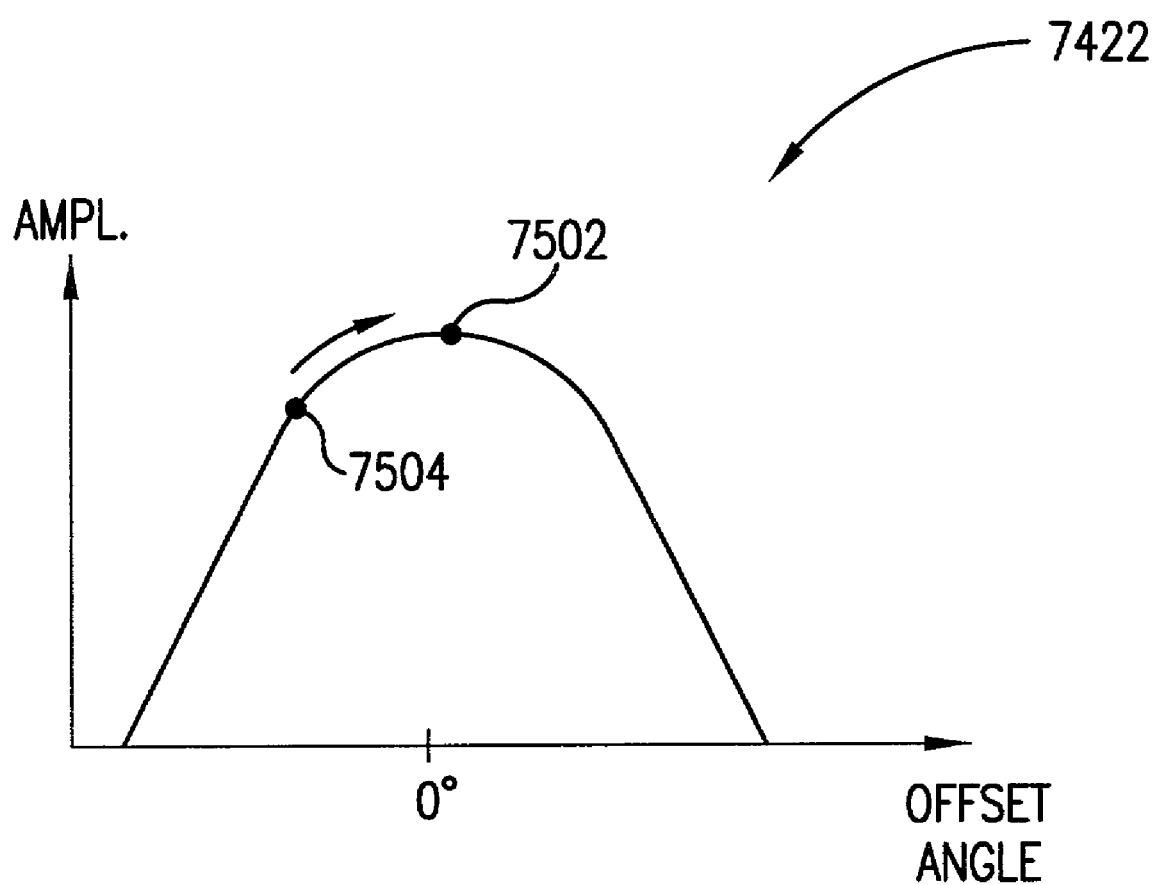
FIG. 75 illustrates a response curve for antenna system 7400 in FIG. 74, according to embodiments of the present invention.

FIG. 75 illustrates the amplitude of the detected output signal 7422 vs. relative beam angle. When the antenna beam is pointed directly at the incoming signal 7424 so that the relative beam angle (between the antenna beam and the incident signal) is 0 degrees, then the detector 7420 produces a maximum signal. Maximum signal strength is represented by peak 7502 in FIG. 75. However, if the antenna beam not aligned with the incoming signal 7424, then the signal strength falls off, as represented by amplitude 7504.

During operation, it may be necessary to align the beam 7426 with the angle of the incoming signal 7424, in order to produce the peak signal amplitude. For example, if the antenna beam 7426 is at boresight and the incident signal is arriving at angle of 7425, then the antenna beam 7426 should be steered toward the incident signal to produce the maximum signal strength. In order to do so, the controller 7424 adjusts the delay 7412 of the down-converter/phase shifter 7415 to implement a phase between the antenna elements 7401 and 7402, and thereby steer the antenna beam to the proper angle. However, the controller 7424 cannot tell which way to steer the beam given only on the detected signal 7422. In other words, the controller 7424 cannot tell what side of the peak 7502, the antenna beam 7426 is located. Therefore, in one embodiment, a feedback based trial and error methodology is used. More specifically, the controller 7424 increments the delay 7412 so that the beam 7426 is steered in one direction or other. If the amplitude of detected signal 7422 increases and moves toward the peak 7502 (in FIG. 75), then the antenna beam 7426 is being steered in the right direction toward the incoming signal. If the amplitude of the detected signal 7422 drops in amplitude and moves away from the peak 7502, then the antenna beam is being steered in the wrong direction, and the direction of beam steer should be reversed.

Figure 76:
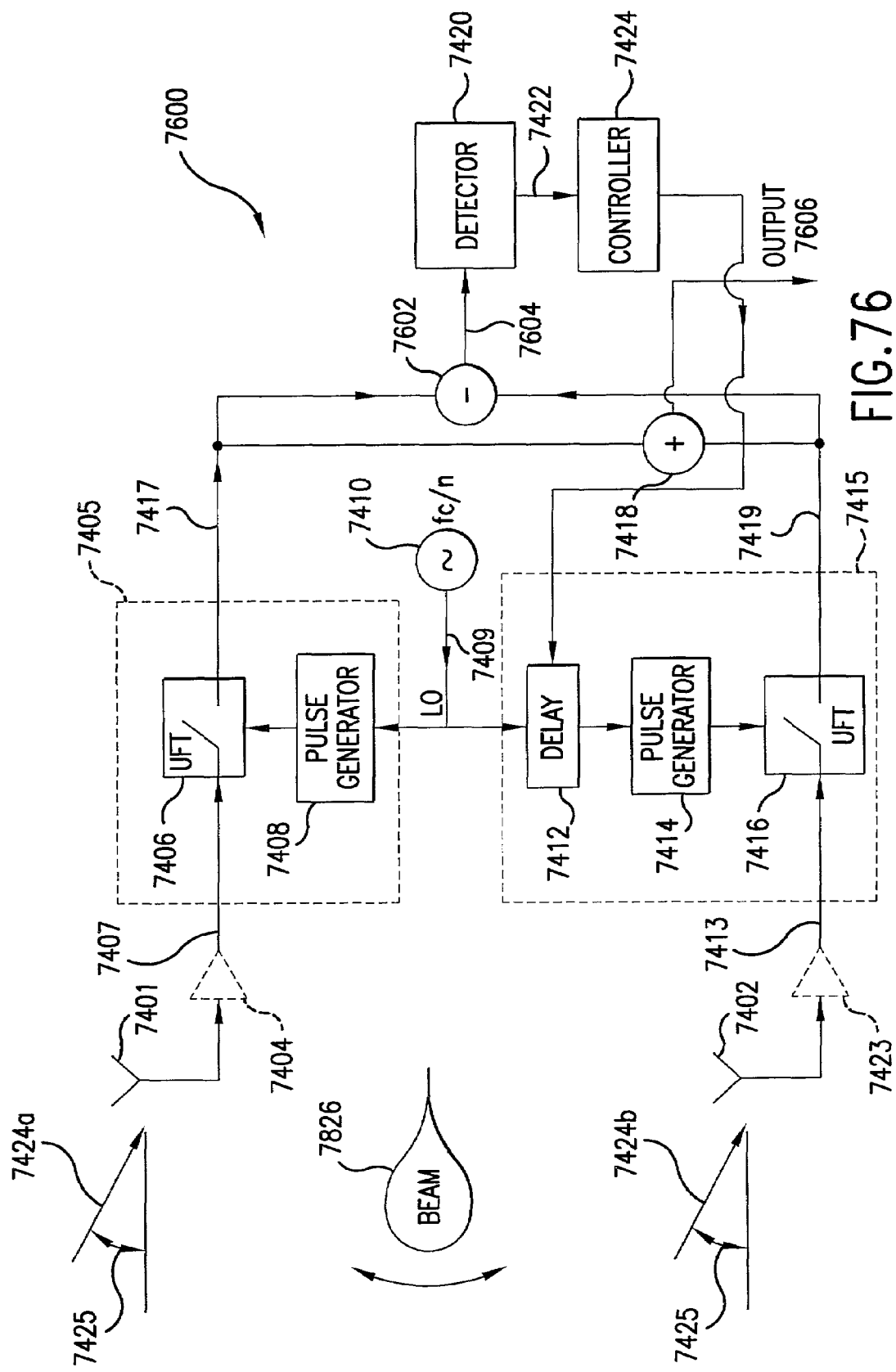
FIG. 76 illustrates a phased array antenna with adaptive beam forming, according to embodiments of the present invention.

FIG. 76 illustrates an example antenna system 7600 that has an improved control system over that of antenna system 7600. Antenna system 7600 has an improved control system because a sum channel and a difference channel are utilized. The sum channel is implemented by the summer 7418 and sums the down-converted signals 7417 and 7419, as in FIG. 74, to generate an output signal 7606. The difference channel is implemented by a subtractor 7602 that subtracts the down-converted signals 7417 and 7419 from each other, resulting in a difference signal 7604 that is used to peak up the antenna beam 7426 with the incident signal 7624. The utilization of a difference channel (in addition to) a sum channel improves the control system because the sign of the difference signal 7604 indicates which way the beam should be steered once the system is calibrated. Hence, the controller 7424 can adjust the delay of the delay module 7412 to implement the requisite phase shift and steer the antenna beam to a desired angle, without using trial and error.

Figure 77:
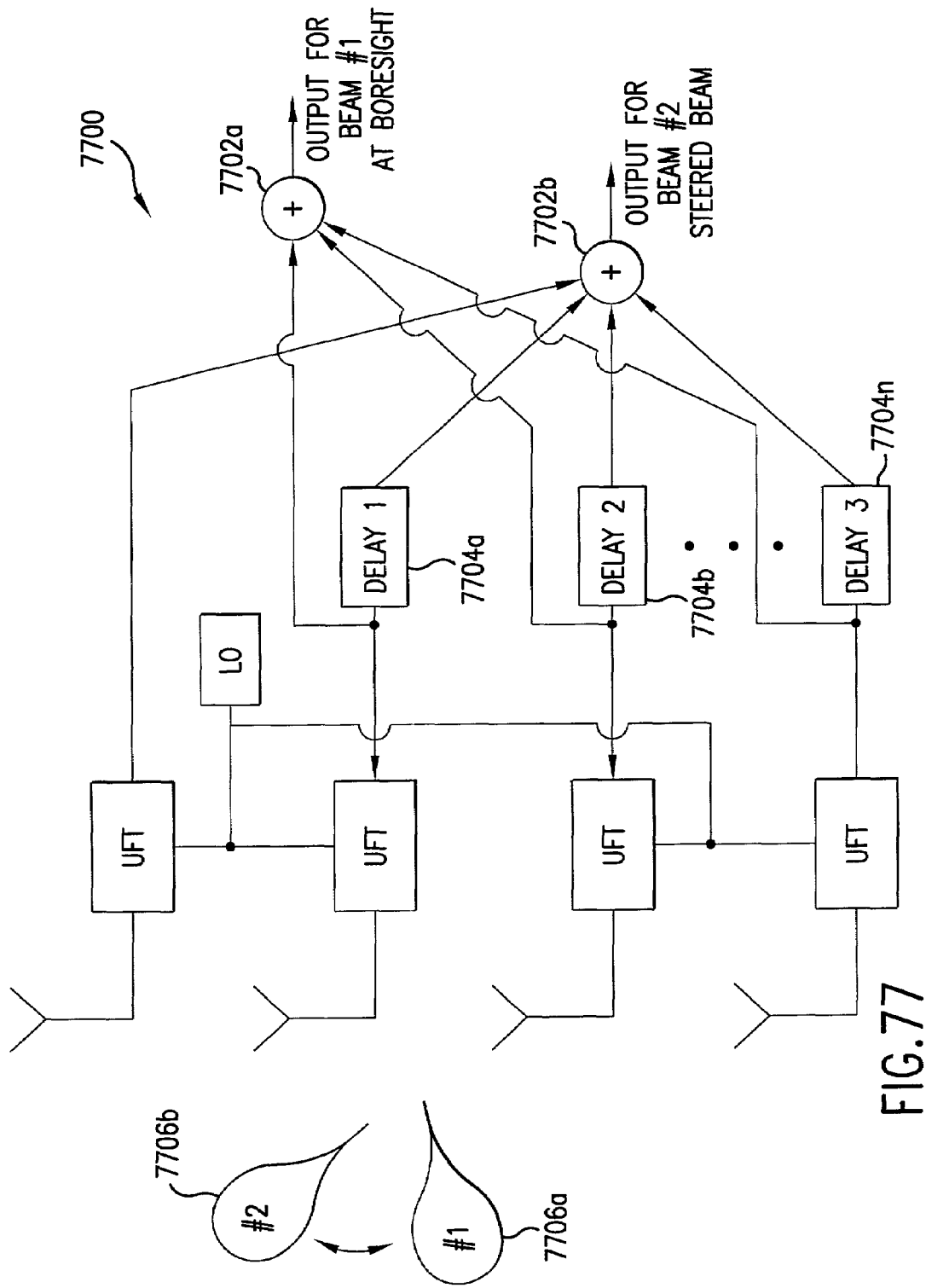
FIG. 77 illustrates a phased array antenna system 7700 that can generate multiple antenna beams, according to embodiments of the present invention.

FIG. 77 illustrates an example phased array antenna system 7700 where two antenna beams are generated simultaneously. Beam 4406a is at boresight, and beam 7706b is steered off at an angle as determined by the delays 7704a-n. The output for the beam 4406a is taken from the summer 7702a, and the output for the beam 7706b is taken from the summer 7702b. The antenna system 7700 can be expanded to any number of antenna beams that are generated simultaneously by adding additional UFT modules, delays 7704, and summers 7702.

The control systems/methodologies discussed herein, as well as others that will be apparent based on the teachings herein, can be used with any of the embodiments discussed herein, and their equivalents.

7.3.7 Example Antenna Applications using UFT Modules for Integrated Frequency Translation and Phase Shifting This section describes several antenna applications of the present invention.

As described herein, the UFT module can be configured to perform frequency translation and phase shifting in an integrated manner. This makes the UFT module a very powerful and versatile antenna building block. As described herein, it is possible to make adaptable antennas or antennas with steerable beams.

One application for the present invention, i.e., the antenna embodiments described above, is to track a moving transmitter such as a cell phone user. This embodiment of the present invention is illustrated in FIGS. 80A and 80B. In FIG. 80A, a cell phone user is depicted close to a cell phone tower that has an steerable antenna array mounted on it. The steerable antenna array is one of the antenna embodiments of the present invention described above. Since the cell phone user is close to the cell phone tower, a control loop in the circuitry of the antenna intelligently adjusts the output phases of the UFT modules to steer the beam of the antenna towards the cell phone user. As can be seen in FIG. 80A, the main beam of the antenna is pointed downward towards the cell phone user. In FIG. 80B, the cell phone user has moved away from the cell phone tower. In this instance, the main beam of the antenna is shown as having been steered upward to track the cell phone user as he moved away from the tower.

As would be apparent to persons skilled in the relevant art(s), the antenna of FIGS. 80A and 80B is highly desirable because it can track a cell phone user. Because the antenna's beam tracks the cell phone user, the cell phone can transmit a lower power signal than would be required if the antenna's beam did not track the cell phone user. Furthermore, the nulls of the antenna's beam prevent other transmitters in the area from interfering with the antenna's reception of the tracked cell phone user. Also, this embodiment of the invention makes it possible to determine the general position/location of the cell phone user.

As will be known to persons skilled in the relevant art(s), the antenna embodiment of the present invention can significantly increase the capacity of a cellular system. FIGS. 81-83 show a hypothetical typical sector loading for two cell phone towers in Salt Lake City, Utah. These two cell phone towers are designated as the North Tower and the South Tower. As depicted in FIGS. 81-83, the North Tower and the South Tower each mount three antennas which are not adaptable. These antennas are each capable of transmitting and receiving cell phone signals in only one of the areas identified as sectors A, B, and C. Since the antennas depicted in FIGS. 81-83 are not adaptable, the width of the sectors A, B, and C are fixed. The maximum number of cell phone calls that can be simultaneously handled by each antenna is 160.

FIG. 81 shows the sector loading for the North Tower and the South Tower at about 7:00 AM. As can be see in FIG. 81, sector B of the South Tower is operating at its capacity of 160 calls while sectors A and C are operating at about 80 calls each. Any users trying to initiate a call in sector C of the South Tower will not be able to get through. Sector B of the North Tower is also operating near its total capacity of 160 calls, while sector A of the North Tower is handling only about 20 calls.

FIG. 82 shows the loading on the North Tower and South Tower at about 1:00 PM. FIG. 82 illustrates the fact that the antenna for sector A of the North Tower is now the antenna that is handling the largest number of cell phone calls. As can be seen by comparing FIGS. 81 and 82, the loading of the sectors changes significantly between 7:00 AM and 1:00 PM.

FIG. 83 shows the loading on the North Tower and the South Tower at about 5:00 PM. As can be seen in FIG. 83, sector B of both the North Tower and the South Tower are operating at capacity, while the other sectors are operating below their capacity.

In order to increase the capacity of the cellular system depicted in FIGS. 81-83, it is highly desirable to be able to change the width of sectors A, B, and C of the North and South Towers in response to the instantaneous loading of the sectors. Ideally, the width of the various sectors should be adjusted so that each sector contained about the same number of active cell phone users. This would ensure that there was additional capacity in every sector so that a new user in any sector could initiate a call. As would be apparent to a person skilled in the relevant art(s) given the description herein, it is possible to implement such a cellular system by using the antenna embodiment of the present invention, as described herein.

Figure 85:
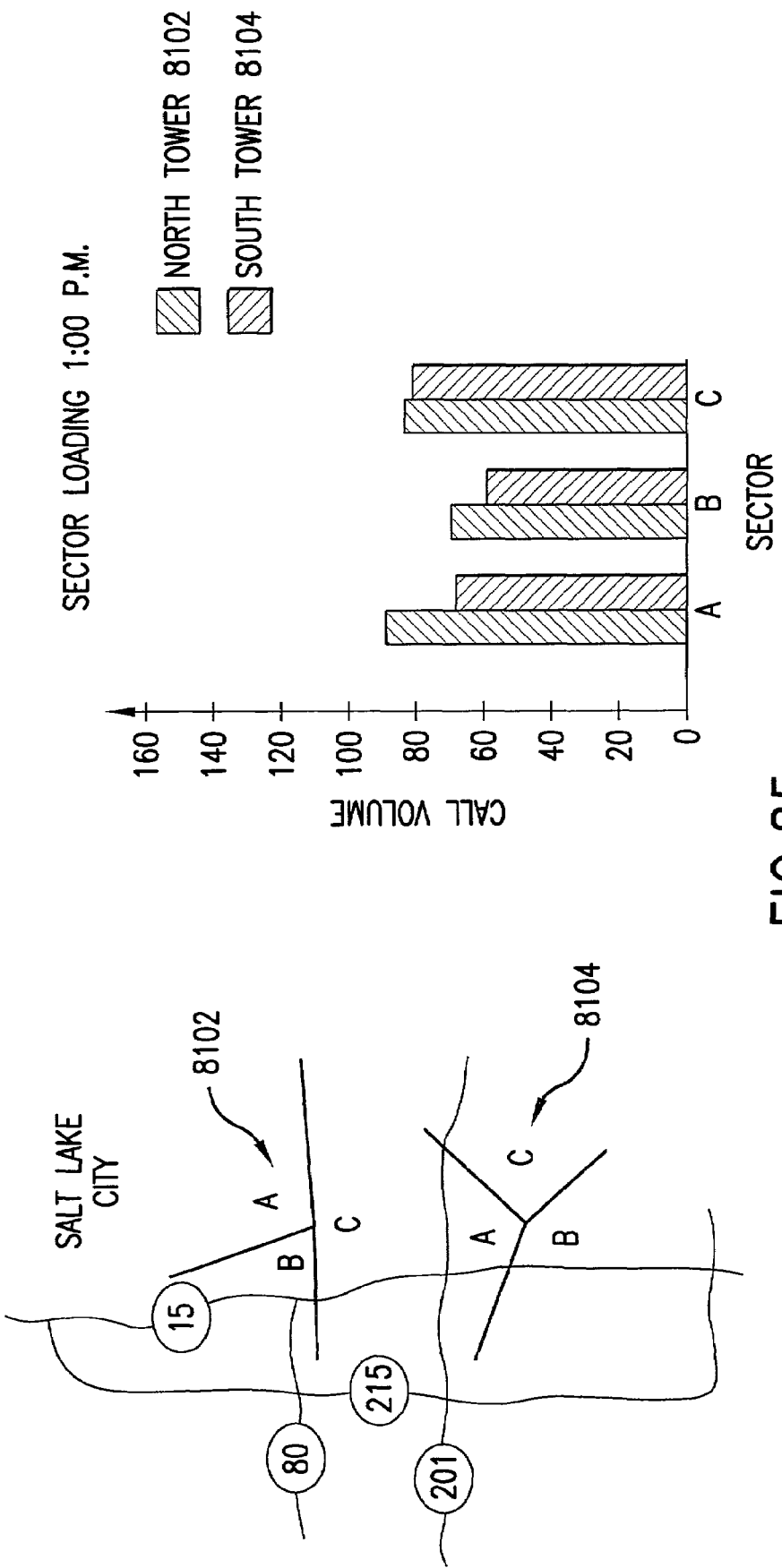

FIG. 84 shows how a cellular system using the present invention would adjust the sector coverage of its antennas in response to the cell phone activity depicted in FIG. 81. As can be seen in FIG. 84, the width of sectors A and C of both the North Tower and the South Tower have been increased while the width of sectors B have been decreased. This change in the width of the sectors has balanced the loading of all the sectors, thereby ensuring that a new user in any sector can initiate a call. FIGS. 85 and 86 also show how a cellular system using the present invention would adjust the sector coverage of its antennas in response to the cell phone activity depicted in FIGS. 82 and 83, respectively. This embodiment of the present invention is show more clearly in FIGS. 87A and 87B.

Figure 87A:
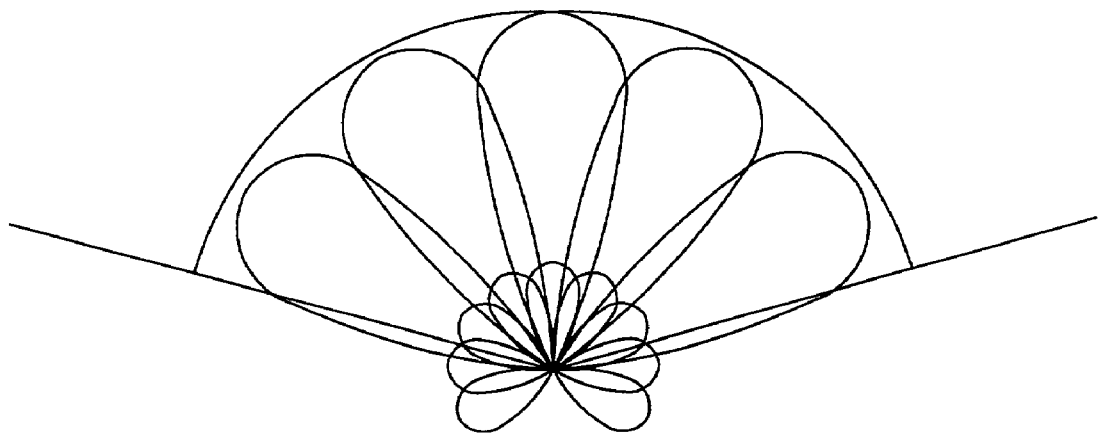
FIGS. 87A-B illustrate a multiple beam antenna embodiment of the present invention.
Figure 87B:
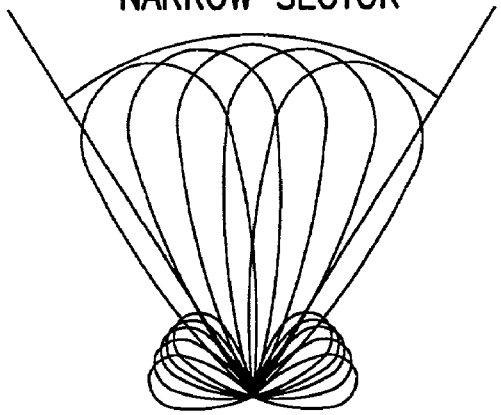

Using antenna embodiments of the present invention and known signal processing techniques, it is possible to produce an antenna that has, for example and without limitation, five steerable main beams. FIGS. 87A and 87B illustrate how an antenna having five main beams can be steered to achieve different effective array beam widths. In FIG. 87A, the five main beams are steered so that there is not much overlap in the beams. This radiation pattern of the antenna provides a wide sector of coverage. In FIG. 87B, however, the five main beams have been steered so that there is a significant amount of overlap in the beams. This radiation pattern of the antenna provides a narrow sector of coverage. As can be seen in FIGS. 87A and 87B, the antenna embodiments of the present invention are well suited to the cell phone application described above with regard to FIGS. 81-86. It is noted that the invention is not limited to the embodiments shown in FIGS. 87A-87B.

Figure 88:
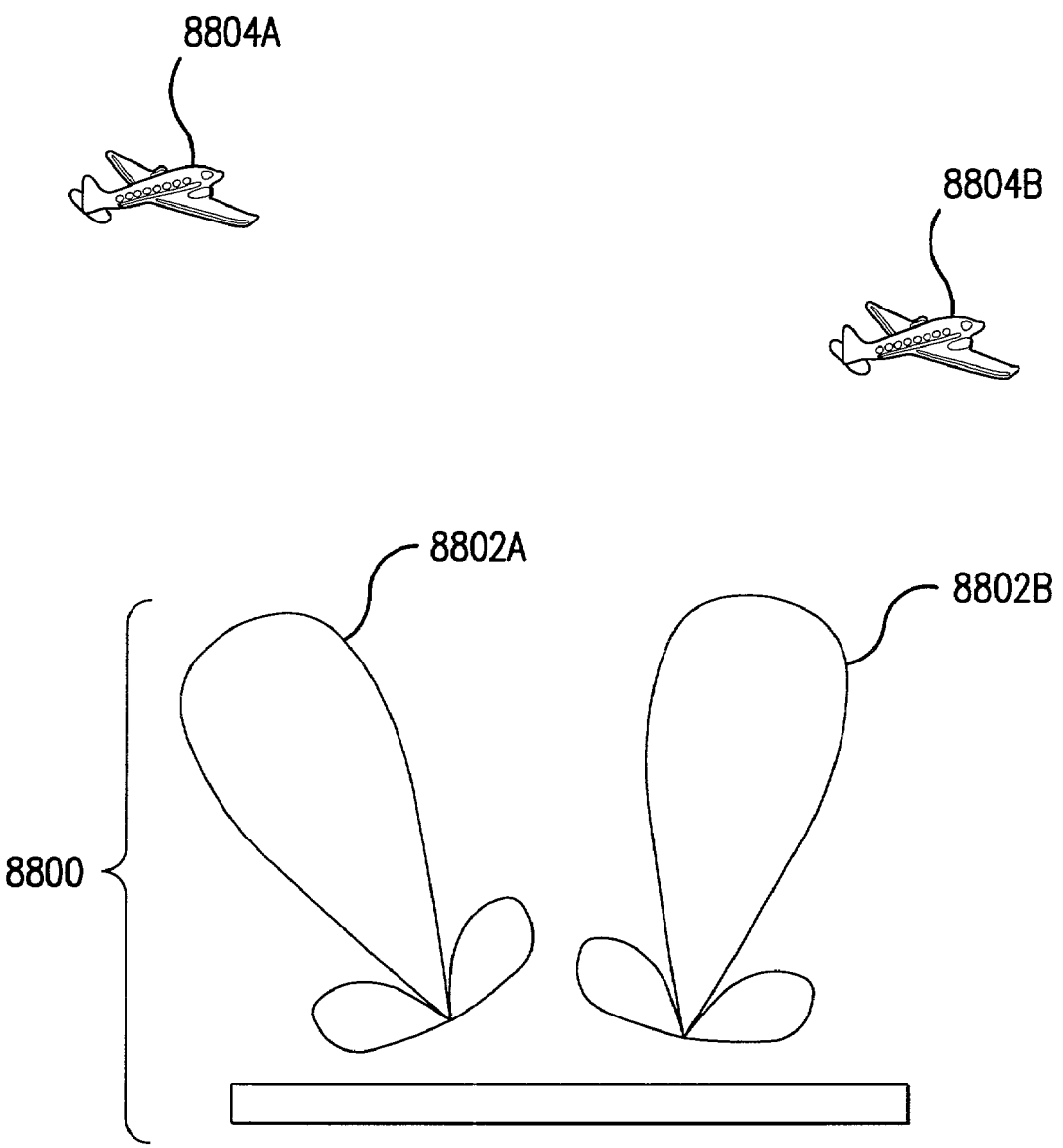
FIGS. 88 illustrates a multiple beam antenna embodiment of the present invention.

FIG. 88 shows an antenna embodiment 8800 of the present invention being used to simultaneously track multiple moving transmitters, such as those on an airplane. Using signal processing techniques, antenna embodiments of the present invention can be made, which have many main beams that can be simultaneously and independently pointed in different directions. In this embodiment, and others, signal processing techniques and control loops are used to adjust the phase of UFT modules in order to steer in the main beams of an antenna. FIG. 88 depicts antenna 8800 as having two main beams 8802A and 8802B. Main beam 8802A is used to track a transmitter on airplane 8804A, while main beam 8802B is used to simultaneously track a transmitter on airplane 8804B. As would be apparent to persons skilled in the relevant art(s) given the discussion herein, embodiments of antenna 8800 are contemplated that have more than two main beams.

Figure 89:
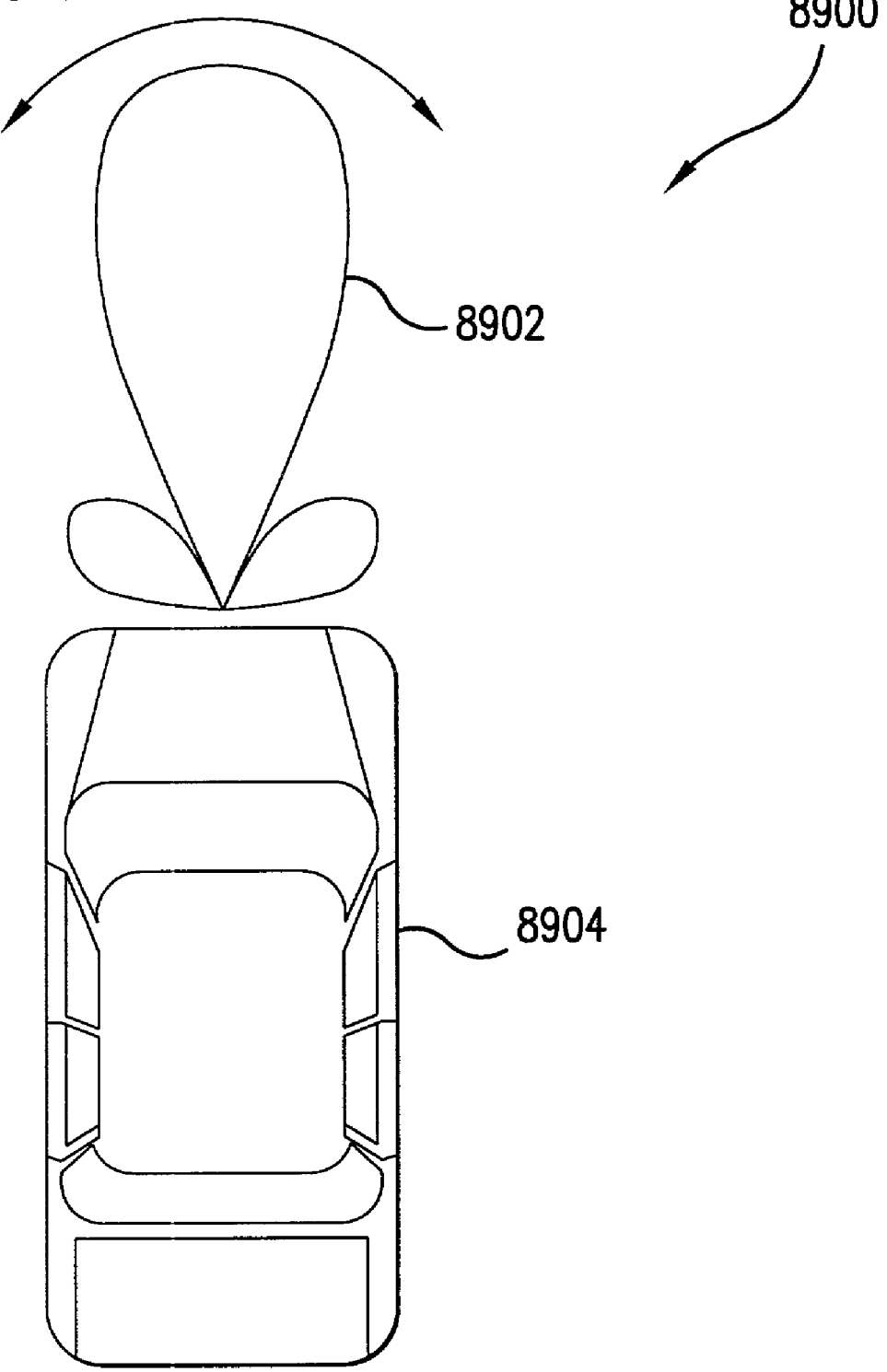
FIG. 89 illustrates a collision avoidance system according to an embodiment of the present invention.

FIG. 89 shows a steerable antenna array according to the present invention being used as a collision avoidance system 8900. In this embodiment of the invention, an antenna beam 8902 is used to scan for objects in front of a vehicle 8904 to look for objects that may block the path of vehicle 8904. When an object that could block the path of vehicle 8904 is detected by collision avoidance system 8900, vehicle 8904 is automatically stopped by collision avoidance system 8900 (or some other action is taken.)

Figure 90A:
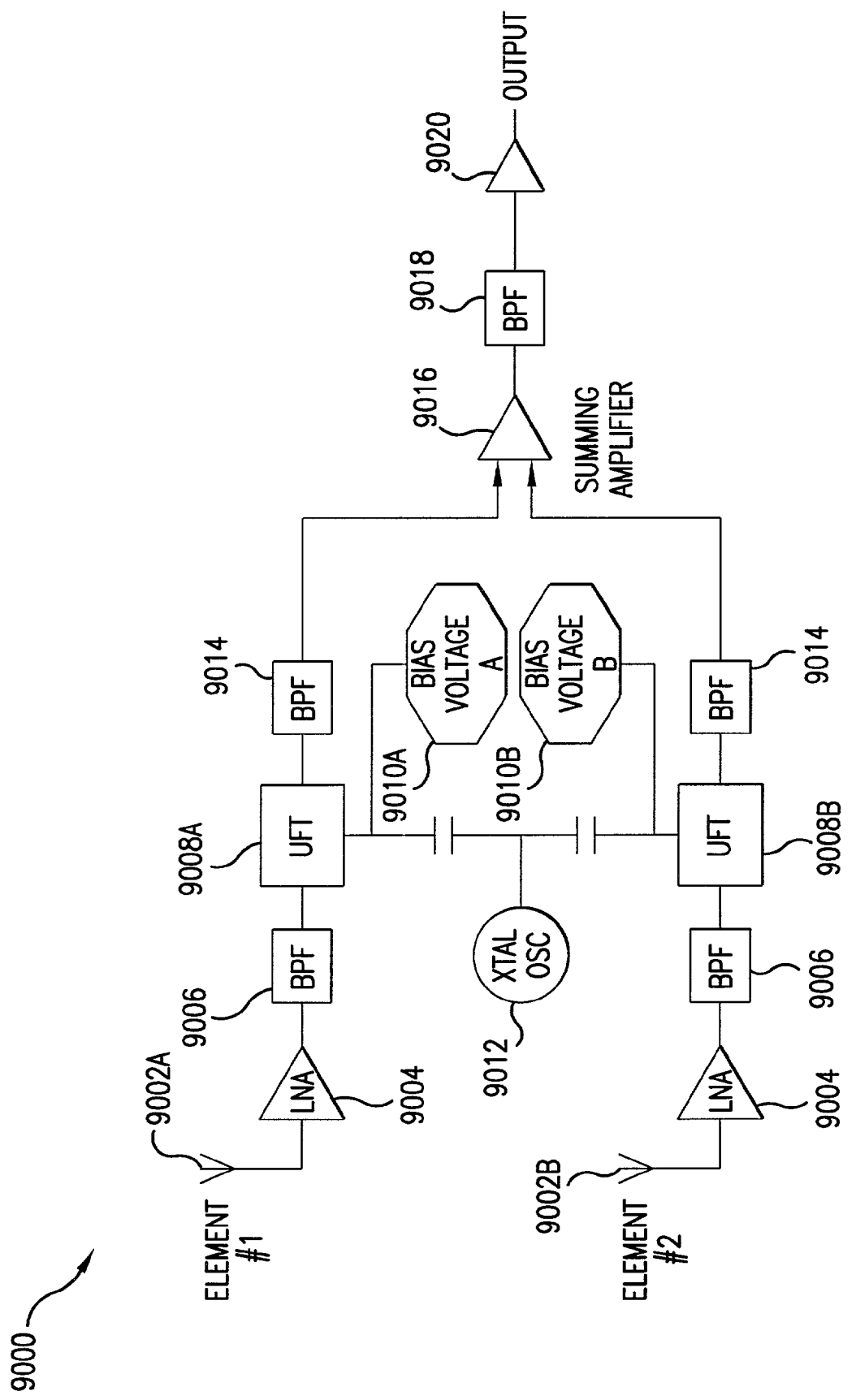
FIGS. 90A-B illustrate an array antenna according to an embodiment of the present invention.
Figure 90B:
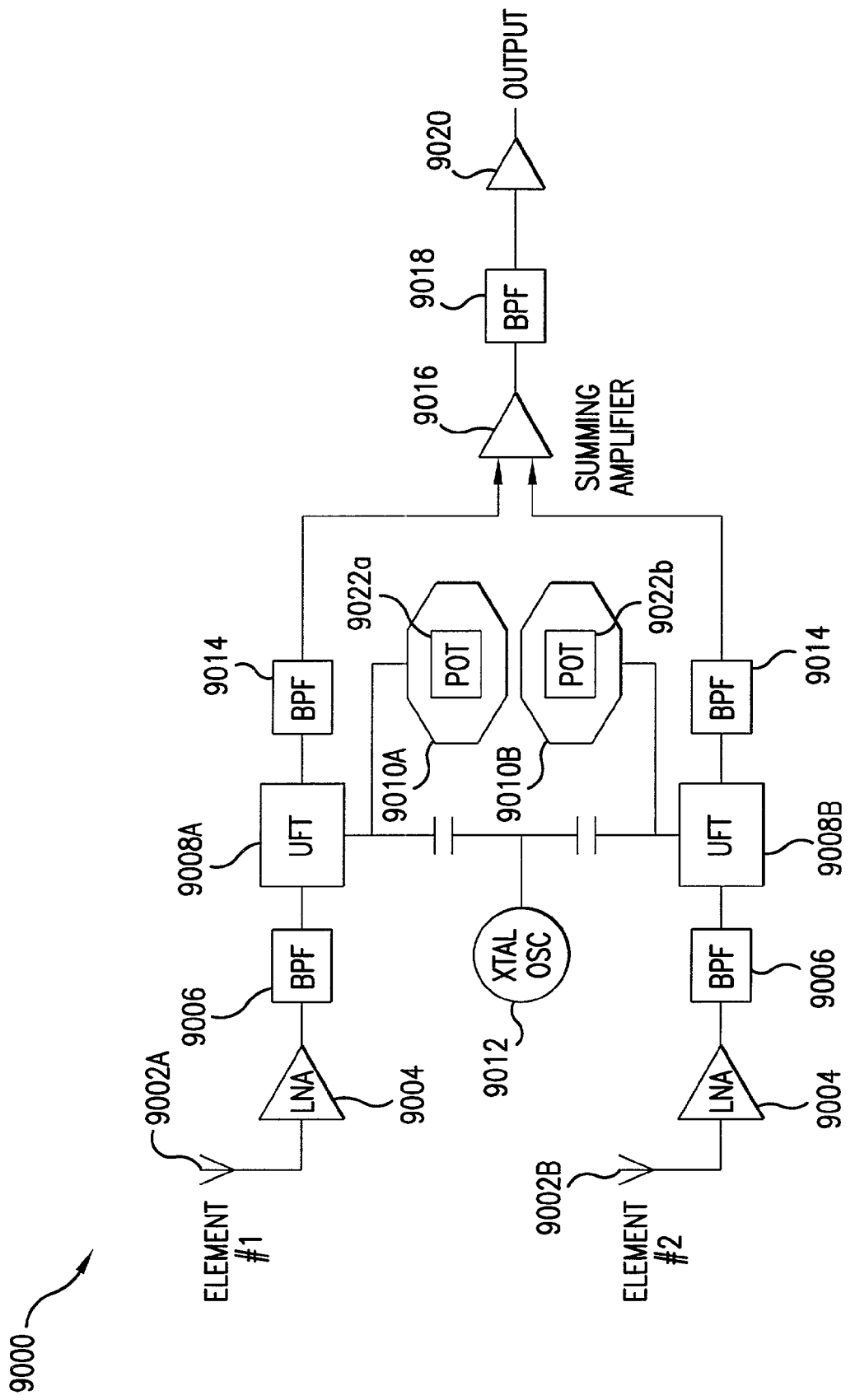

FIG. 90 depicts a two element phased array antenna 9000 that can be used to down-convert a 915 MHZ carrier to 455 kHz. Phased array antenna 9 comprises two antenna elements 9002A and 9002B, two UFT modules 9008A and 9008B, two bias voltage modules 9010A and 9010B, a crystal oscillator 9012 and a summing amplifier 9016. A signal received by antenna element 9002A is feed through a low noise amplifier 9004 and a band pass filter 9006 to UFT module 9008A. A signal received by antenna element 9002B is fed through a low noise amplifier 9004 and a band pass filter 9006 to UFT module 9008B. Crystal oscillator 9012 produces a frequency of 91.5455 MHZ. Thus, as described herein, the $10^{th}$ harmonic of the LO is used to down-convert the received signal. The down-converted signals from both UFT modules 9008A and 9008B are feed through bandpass filters 9014 to summing amplifier 9016. Summing amplifier 9016 combines the output signals from UFT modules 9008A and 9008B. The output of summing amplifier 9016 is feed through a band pass filter 9018 to an isolation/buffer amplifier 9020. The output of isolation/buffer amplifier 9020 is the desired down-converted signal. In an embodiment of the phased array antenna 9, bias voltage modules 9010A and 9010B are pulse width modulated using field programmable gate arrays that have been lowpass filtered. A low cost embodiment of phased array antenna 9000 can be implemented using potentiometers for bias control modules 9010A and 9010B. This is illustrated in FIG. 90B with potentiometers 9022a and 9022b.

Figure 91B:
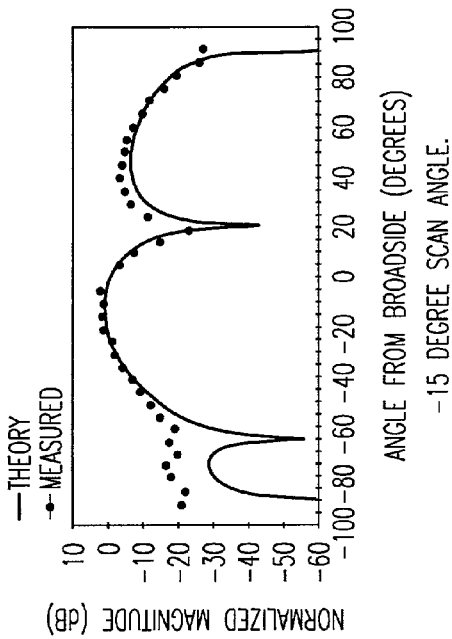
FIGS. 91A-D illustrate the output of an antenna embodiment of the present invention.
Figure 91D:
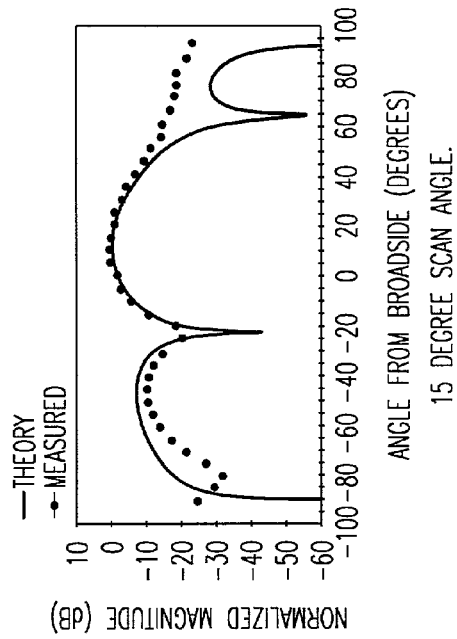
Figure 91A:
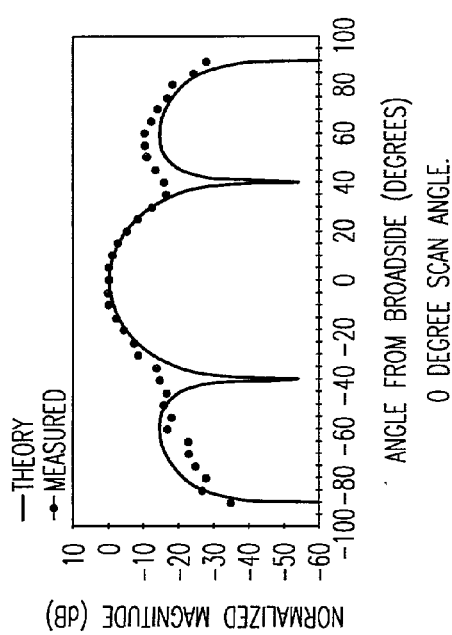
Figure 91C:
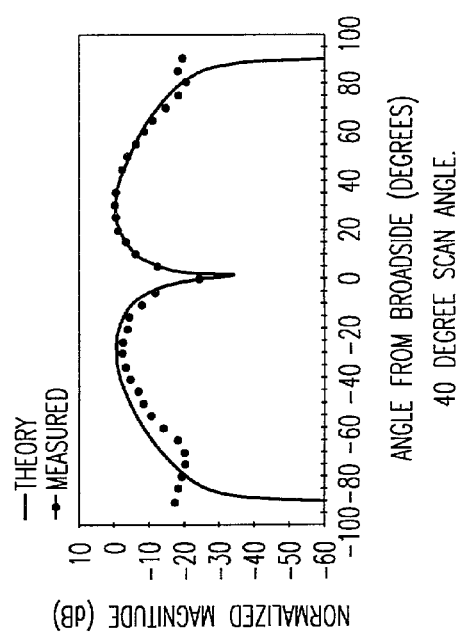

Based on the design methods described herein, the radiation pattern for phased array antenna 9000 was calculated and compared against measured results obtained using an outdoor antenna range. FIGS. 91A-D illustrate the measured vs. predicted performance of the antenna 9000, at various scan angles. FIG. 91A shows the calculated and measured radiation pattern for phased array antenna 9000, using commercial potentiometers for bias control modules 9010A and 9010B, at a 0 degree scan angle. FIG. 91B shows the calculated and measured radiation pattern for phased array antenna 9000 at a −15 degree scan angle. As can be seen in these figures, there is good agreement between the calculated and measured values. FIG. 91C shows the calculated and measured radiation pattern for phased array antenna 9000 at a 40 degree scan angle. Finally, FIG. 91D shows the calculated and measured radiation pattern for phased array antenna 9000 at a 15 degree scan angle. The results illustrated in FIGS. 91A-D demonstrate that the phased array antennas of the present invention perform according to the teaching contained herein.

8.0 CONCLUSION

Example implementations of the systems and components of the invention have been described herein. As noted elsewhere, these example implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments.

What is claimed is:

1. A method of steering an antenna beam and frequency translating an electromagnetic (EM) signal that corresponds to said antenna beam, the method comprising the steps of:
   (1) receiving a first EM signal and a second EM signal;
   (2) generating a local oscillator (LO) signal;
   (3) generating a first control signal based on said local oscillator signal, comprising the steps of
      (a) level shifting said local oscillator signal by a first voltage resulting in a first biased LO signal, and
      (b) triggering a first pulse generator based on said first biased LO signal, to generate said first control signal;
   (4) sampling said first EM signal according to said first control signal to generate a first down-converted signal, and sampling said second EM signal according to a second control signal to generate a second down-converted signal, wherein said second control is phase shifted with respect to said first control signal and thereby said second down-converted signal is phase-shifted with respect to said first down-converted signal.

2. The method of claim 1, wherein said first control signal includes a first plurality of pulses having pulse widths.

3. The method of claim 1, wherein said second control signal includes a second plurality of pulses having pulse widths.

4. The method of claim 3, wherein said second plurality of pulses are phase shifted relative to said first plurality of pulses.

5. The method of claim 1, further comprising the step of:
   (5) adding said first down-converted signal and said second down-converted signal to generate a combined down-converted signal.

6. The method of claim 1, further comprising the step of:
(5) adjusting said phase shift between said first control signal and said second control, and thereby steering the antenna beam of the antenna system.

7. The method of claim 1, wherein said first pulse generator triggers and generates a pulse of said first control signal when said first biased LO signal exceeds a threshold of said first pulse generator.

8. The method of claim 1, further comprising the step of:
(5) generating said second control signal based on said local oscillator signal, comprising the steps of
 (a) level shifting said local oscillator signal by a second voltage resulting in a second biased LO signal; and
 (b) triggering a second pulse generator based on said second biased LO signal, to generate said second control signal.

9. The method of claim 8, further comprising the step of:
(6) adjusting said second voltage relative to said first voltage, and thereby steering the antenna beam of the antenna system.

10. The method of claim 8, wherein said second pulse generator triggers and generates a pulse of said second control signal when said second biased LO signal exceeds a threshold of said second pulse generator.

11. The method of claim 8, wherein said second voltage is different from said first voltage.

12. A method of steering an antenna beam and frequency translating an electromagnetic (EM) signal that corresponds to said antenna beam, the method comprising the steps of:
(1) receiving a first EM signal and a second EM signal;
(2) generating a local oscillator (LO) signal;
(3) generating a first control signal based on said local oscillator signal, comprising the steps of
 (a) delaying said local oscillator signal by a first delay resulting in a first delayed LO signal, and
 (b) triggering a first pulse generator based on said first delayed LO signal, to generate said first control signal;
(4) sampling said first EM signal according to said first control signal to generate a first down-converted signal and sampling said second EM signal according to a second control signal to generate a second down-converted signal, wherein said second control signal is phase shifted with respect to said first control signal, and thereby said second down-converted signal is phase-shifted with respect to said first down-converted signal.

13. The method of claim 12, wherein said first pulse generator triggers and generates a pulse of said first control signal when said first delayed LO signal exceeds a threshold of said first pulse generator.

14. The method of claim 13, further comprising the step of:
(5) generating said second control signal based on said local oscillator signal, comprising the steps of
 (a) delaying said local oscillator signal by a second delay resulting in a second delayed LO signal; and
 (b) triggering a second pulse generator based on said second delayed LO signal, to generate said second control signal.

15. The method of claim 14, further comprising the step of:
(6) adjusting said second delay relative to said first delay, and thereby steering the antenna beam of the antenna system.

16. The method of claim 14, wherein said second delay is different from said first delay.

17. A method of steering an antenna beam and frequency translating a baseband signal that is transmitted by the antenna system, the method comprising the steps of:
(1) receiving the baseband signal;
(2) splitting the baseband signal into at least two component signals, including a first baseband component and a second baseband component;
(3) sampling the first baseband component according to a first control signal to generate a first harmonically rich signal, and sampling a second baseband component according to a second control signal to generate a second harmonically rich signal, wherein said second control signal is phase shifted with respect to said first control signal, and thereby said second harmonically rich signal is phase-shifted with respect to said first harmonically rich signal; and
(4) transmitting a desired harmonic image from said first harmonically rich signal using a first antenna element, and transmitting a desired harmonic image from said second harmonically rich signal using a second antenna element.

18. The method of claim 17, wherein said first harmonically rich signal includes a first plurality of harmonic images that are each representative of the baseband signal, and wherein said second harmonically rich signal includes a second plurality of harmonic images that are each representative of the baseband signal, wherein second plurality of harmonic images is phase shifted with respect to said first plurality of harmonic images.

19. The method of claim 17, wherein step (4) comprises the steps of:
(a) filtering said desired harmonic image from said first plurality of harmonic images; and
(b) filtering said desired harmonic image from said second plurality of harmonic images.

20. The method of claim 17, further comprising the step of:
(5) generating a local oscillator (LO) signal.

21. The method of claim 20, further comprising the steps of:
(6) generating said first control signal based on said local oscillator signal, including the steps of
 (a) level shifting said local oscillator signal by a first voltage, resulting in a first biased LO signal, and
 (b) triggering a first pulse generator based on said first biased LO signal to generate said first control signal.

22. The method of claim 21, wherein said first pulse generator triggers and generates a pulse of said first control signal when said first biased LO signal exceeds a threshold of said first pulse generator.

23. The method of claim 21, further comprising the step of:
(7) generating said second control signal based on said local oscillator signal, comprising the steps of
 (a) level shifting said local oscillator signal by a second voltage resulting in a second biased LO signal; and
 (b) triggering a second pulse generator based on said second biased LO signal, to generate said second control signal.

24. The method of claim 23, wherein said second pulse generator triggers and generates a pulse of said second control signal when said second biased LO signal exceeds a threshold of said second pulse generator.

25. The method of claim 23, wherein said second voltage is different from said first voltage.

26. The method of claim 23, further comprising the step of adjusting said second bias voltage relative to said first bias voltage, and thereby adjusting said phase shift between said first and second control signals, and thereby steering the antenna beam of said phased array antenna.

27. The method of claim 20, further comprising the steps of:
(6) generating said first control signal based on said local oscillator signal, comprising the steps of
   (a) delaying said local oscillator signal by a first delay resulting in a first delayed LO signal; and
   (b) triggering a first pulse generator based on said first delayed LO signal, to generate said first control signal.

28. The method of claim 27, wherein said first pulse generator triggers and generates a pulse of said first control signal when said first delayed LO signal exceeds a threshold of said first pulse generator.

29. The method of claim 27, further comprising the step of:
(7) generating said second control signal based on said local oscillator signal, comprising the steps of
   (a) delaying said local oscillator signal by a second delay resulting in a second delayed LO signal; and
   (b) triggering a second pulse generator based on said second delayed LO signal, to generate said second control signal.

30. The method of claim 29, wherein said second delay is different from said first delay.

31. The method of claim 29, further comprising the step of adjusting said second delay relative to said first delay, and thereby adjusting said phase shift between said first and second control signals, and thereby steering the antenna beam of the phased array antenna.

32. The method of claim 17, further comprising the step of:
(5) adjusting said phase shift between said first control signal and said second control, and thereby steering the antenna beam of the antenna system.

33. A method of steering an antenna beam and frequency translating an EM signal that corresponds to said antenna beam, the method comprising the steps of:
(1) receiving a first EM signal and a second EM signal;
(2) generating a first control signal and a second control signal;
(3) phase shifting said second control signal relative to said first control signal;
(4) sampling said first EM signal according to said first control signal to generate a first down-converted signal, and sampling said second EM signal according to said second control signal to generate a second down-converted signal;
(5) combining said first down-converted signal and said second down-converted signal, resulting in a combined down-converted signal; and
(6) adjusting said phase shift between said first control signal and said second control signal and thereby steering the antenna beam.

* * * * *

UNITED STATES PATENT AND TRADEMARK OFFICE
CERTIFICATE OF CORRECTION

| | | |
|---|---|---|
| PATENT NO. | : 7,379,515 B2 | Page 1 of 2 |
| APPLICATION NO. | : 09/796824 | |
| DATED | : May 27, 2008 | |
| INVENTOR(S) | : Martin R. Johnson | |

It is certified that error appears in the above-identified patent and that said Letters Patent is hereby corrected as shown below:

Title page, item (*), Notice section, please replace "873 days" with --837 days--.

Title page, item (56), U.S. PATENT DOCUMENTS section please replace "5,317,799 A" with --5,319,799 A--.

Title page, item (56), FOREIGN PATENT DOCUMENTS section please replace "EP 0 643 477 42" with --EP 0 643 477 A2--.

Title page, item (56), OTHER PUBLICATIONS section please add --English Translation of German Patent Publication No. DE 196 48 915 A1, 10 pages--.

Column 42, line 67, please replace "$Freq_{iput}$=frequency of the EM input signal" with --$Freq_{input}$=frequency of the EM input signal--.

Column 56, line 47, please replace " i $I_{nm}=a_{nm} \cdot e^{j \beta nm}$ " with -- $I_{nm}=a_{nm} \cdot e^{j \beta nm}$ --.

Column 59, line 51, please replace " $\varphi_0(\beta_{LO})=194.23 \cdot 1n(\beta_{LO})-138.33$ " with -- $\varphi_0(\beta_{LO})=194.23 \cdot \ln(\beta_{LO})-138.33$ --.

Column 59, line 53, please replace " $\pi_0(\beta_{LO})-3.591 \cdot 1n(\beta_{LO})-2.2856$ " with -- $\rho_0(\beta_{LO})=3.591 \cdot \ln(\beta_{LO})- 2.2856$ --.

Column 61, line 2, please replace " $\psi(v_b)=2 \cdot \pi \cdot (-1.039) \cdot v_b^2 + 2 \cdot \pi \cdot (7.604) \cdot V_b - 70.907$ " with -- $\psi(v_b)=2 \cdot \pi \cdot (- 1.039) \cdot v_b^2 + 2 \cdot \pi \cdot (7.604) \cdot v_b - 70.907$ --.

CERTIFICATE OF CORRECTION (continued)
U.S. Pat. No. 7,379,515 B2

Column 61, lines 8-9, please replace " $\psi(v_b=2.5)=2\cdot\pi\cdot(-1.039)\cdot v_b^2+2\cdot\pi\cdot(7.604)\cdot V_b-70.907$ " with -- $\psi(v_b=2.5)=2\cdot\pi\cdot(-1.039)\cdot v_b^2+2\cdot\pi\cdot(7.604)\cdot v_b-70.907$ --.

Signed and Sealed this

Fifth Day of January, 2010

David J. Kappos
*Director of the United States Patent and Trademark Office*